US012534486B2

(12) United States Patent
Kang et al.

(10) Patent No.: US 12,534,486 B2
(45) Date of Patent: Jan. 27, 2026

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Byungjoon Kang, Seoul (KR); Sangdong Kim, Seongnam-si (KR); Kum Hee Lee, Suwon-si (KR); Banglin Lee, Suwon-si (KR); Hwayoung Cho, Hwaseong-si (KR); Byoungki Choi, Hwaseong-si (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 950 days.

(21) Appl. No.: 17/693,737

(22) Filed: Mar. 14, 2022

(65) Prior Publication Data

US 2022/0306667 A1 Sep. 29, 2022

(30) Foreign Application Priority Data

Mar. 15, 2021 (KR) ........................ 10-2021-0033629

(51) Int. Cl.
*C07F 19/00* (2006.01)
*C07F 15/00* (2006.01)
(Continued)

(52) U.S. Cl.
CPC ....... *C07F 15/0033* (2013.01); *H10K 85/342* (2023.02); *H10K 50/11* (2023.02); *H10K 2101/30* (2023.02); *H10K 2101/40* (2023.02)

(58) Field of Classification Search
None
See application file for complete search history.

(56) References Cited

U.S. PATENT DOCUMENTS

2010/0270916 A1 10/2010 Xia et al.
2014/0131676 A1 5/2014 Beers et al.
(Continued)

FOREIGN PATENT DOCUMENTS

CN 111662335 A 9/2020
CN 114315909 A 4/2022
(Continued)

OTHER PUBLICATIONS

Machine translation of KR-2018-0020878, translation generated Apr. 2025, 38 pages. (Year: 2025).*

Extended European Search Report mailed Aug. 9, 2022 of EP Patent Application No. 22161706.1.

Office Action issued Aug. 15, 2025 of CN Patent Application No. 202210251124.1.

(Continued)

*Primary Examiner* — Robert S Loewe
(74) *Attorney, Agent, or Firm* — CANTOR COLBURN LLP

(57) ABSTRACT

An organometallic compound represented by Formula 1:

Formula 1

$$M(L_1)_{n1}(L_2)_{n2}$$

wherein M is a transition metal, $L_1$ is a ligand represented by Formula 2-1, $L_2$ is a ligand represented by Formula 2-2, n1 and n2 are each independently 1 or 2, a sum of n1 and n2 is 2 or 3, and $L_1$ and $L_2$ are different from each other:

Formula 2-1

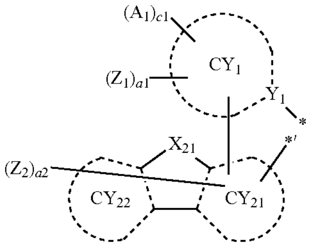

Formula 2-2

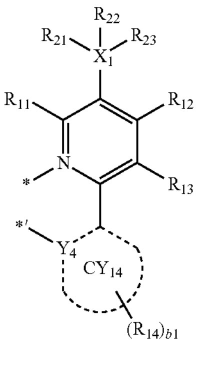

Formula 3

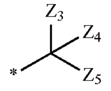

wherein $Y_1$, $Y_4$, $X_1$, $X_{21}$, ring $CY_1$, ring $CY_{21}$, ring $CY_{22}$, ring $CY_{14}$, $A_1$, a1, a2, b1, c1, $R_{11}$ to $R_{14}$, $R_{21}$ to $R_{23}$, and $Z_1$ to $Z_5$ are as defined in the specification, * and *' in Formulae 2-1 and 2-2 each indicates a binding site to M, and * in Formula 3 indicates a binding site to ring $CY_1$ in Formula 2-1.

20 Claims, 1 Drawing Sheet

(51) Int. Cl.

| | |
|---|---|
| ***H10K 85/30*** | (2023.01) |
| *H10K 50/11* | (2023.01) |
| *H10K 101/30* | (2023.01) |
| *H10K 101/40* | (2023.01) |

(56) References Cited

U.S. PATENT DOCUMENTS

| | | | | |
|---|---|---|---|---|
| 2017/0373259 | A1 | 12/2017 | Su et al. | |
| 2018/0282356 | A1 | 10/2018 | Ji et al. | |
| 2020/0212318 | A1 | 7/2020 | Kim et al. | |
| 2020/0287144 | A1 | 9/2020 | Hwang et al. | |
| 2021/0193940 | A1 | 6/2021 | Kyuyoung et al. | |
| 2021/0217969 | A1* | 7/2021 | Tsai | C09K 11/06 |
| 2021/0403496 | A1* | 12/2021 | Cai | H10K 85/654 |
| 2022/0002329 | A1* | 1/2022 | Cai | H10K 85/342 |
| 2022/0102652 | A1 | 3/2022 | Lee et al. | |
| 2022/0162244 | A1* | 5/2022 | Sang | H10K 85/342 |
| 2022/0199919 | A1* | 6/2022 | Choung | C07F 15/0033 |
| 2022/0259237 | A1 | 8/2022 | Lee et al. | |
| 2022/0306667 | A1* | 9/2022 | Kang | C07F 15/0033 |

FOREIGN PATENT DOCUMENTS

| | | | |
|---|---|---|---|
| EP | 3912983 | A1 | 11/2021 |
| EP | 3943499 | A2 | 1/2022 |
| EP | 3974494 | A1 | 3/2022 |
| KR | 20140060241 | A | 5/2014 |
| KR | 1020150045295 | A | 4/2015 |
| KR | 1020160064955 | A | 6/2016 |
| KR | 20170142949 | A | 12/2017 |
| KR | 1020180020878 | A | 2/2018 |
| KR | 1020190088025 | A | 7/2019 |
| KR | 20190106807 | A | 9/2019 |
| KR | 1020190130514 | A | 11/2019 |
| KR | 1020200107830 | A | 9/2020 |
| KR | 1020210144587 | A | 11/2021 |
| KR | 1020220115516 | A | 8/2022 |
| WO | 2015056993 | A1 | 4/2015 |
| WO | 2019221484 | A1 | 11/2019 |

OTHER PUBLICATIONS

Office Action issued Jun. 27, 2025 of KR Patent Application No. 10-2021-0033629.

* cited by examiner

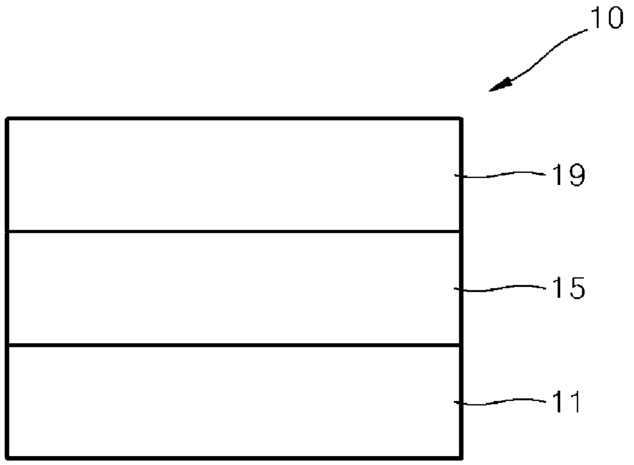
10
19
15
11

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application is based on and claims priority to Korean Patent Application No. 10-2021-0033629, filed on Mar. 15, 2021, in the Korean Intellectual Property Office, and all benefits accruing therefrom under 35 U.S.C. § 119, the entire content of which is incorporated by reference herein.

BACKGROUND

1. Field

One or more embodiments relate to an organometallic compound, an organic light-emitting device including the same, and an electronic apparatus including the organic light-emitting device.

2. Description of the Related Art

Organic light-emitting devices (OLEDs) are self-emissive devices, which have improved characteristics in terms of viewing angles, response time, brightness, driving voltage, and response speed, and produce full-color images.

In an example, an organic light-emitting device includes an anode, a cathode, and an organic layer located between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. The excitons may transition from an excited state to a ground state, thus generating light.

SUMMARY

One or more embodiments relate to an organometallic compound, an organic light-emitting device including the same, and an electronic apparatus including the organic light-emitting device.

Additional aspects will be set forth in part in the description which follows and, in part, will be apparent from the description, or may be learned by practice of the presented embodiments of the disclosure.

According to an aspect, an organometallic compound represented by Formula 1 is provided:

Formula 1

$$M(L_1)_{n1}(L_2)_{n2}$$

wherein, in Formula 1,

M is a transition metal, $L_1$ is a ligand represented by Formula 2-1, $L_2$ is a ligand represented by Formula 2-2, n1 and n2 are each independently 1 or 2, wherein, when n1 is 2, each $L_1$ is identical to or different from another, and when n2 is 2, each $L_2$ is identical to or different from another, a sum of n1 and n2 is 2 or 3, $L_1$ and $L_2$ are different from each other, Formula 2-1

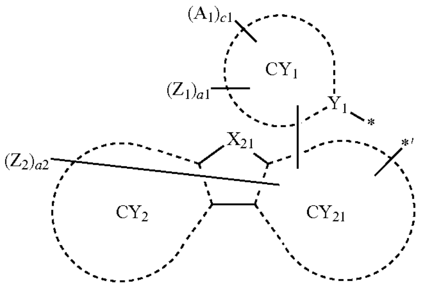

Formula 2-2

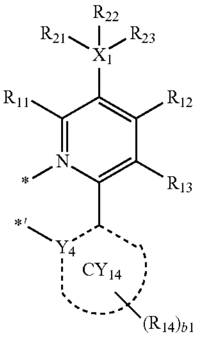

Formula 3

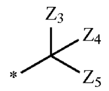

wherein, in Formulae 2-1, 2-2, and 3, $Y_1$ and $Y_4$ are each independently C or N, $X_1$ is Si or Ge, $X_{21}$ is O, S, S(=O), $N(Z_{29})$, $C(Z_{29})(Z_{30})$, or $Si(Z_{29})(Z_{30})$, ring $CY_1$, ring $CY_{21}$, ring $CY_{22}$, and ring $CY_{14}$ are each independently a $C_5$-$C_{30}$ carbocyclic group or a $C_1$-$C_{30}$ heterocyclic group, $A_1$ is a group represented by Formula 3, and $A_1$ is not —$CD_3$, c1 is an integer from 1 to 20, $R_{21}$ to $R_{23}$ are each independently a $C_1$-$C_{60}$ alkyl group or a $C_6$-$C_{60}$ aryl group, unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_3$-$C_{10}$ cycloalkyl group, a phenyl group, or a combination thereof, $Z_1$ to $Z_5$, $R_{11}$ to $R_{14}$, $Z_{29}$, and $Z_{30}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, provided that at least one of $Z_3$ to $Z_5$ of Formula 3 is deuterium or a deuterated group, provided that in Formula 2-2, $R_{12}$ is hydrogen, deuterium, a methyl group, or a deuterated methyl group; or $R_{12}$ and $R_{13}$ are linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, a1, a2, and b1 are each independently an integer from 0 to 20, and when a1 is 2 or more, two or more of $Z_1$(s) are identical to or different from each other, when a2 is 2 or more, two or more of $Z_2$(s) are identical to or different from each other, and when b1 is 2 or more, two or more of $R_{14}$(s) are identical to or different from each other, two or more of $R_{21}$ to $R_{23}$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $Z_1$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $Z_2$(s) are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $Z_3$ to $Z_5$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_{14}$(s) are optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $Z_1$, $Z_2$ and $R_{11}$ to $R_{14}$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $R_{10a}$ is as defined in connection with $R_{14}$,

* and *' in Formulae 2-1 and 2-2 each indicates a binding site to M in Formula 1,

* in Formula 3 indicates a binding site to ring $CY_1$ in Formula 2-1, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_6o$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or a combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

According to another aspect, provided is an organic light-emitting device including a first electrode, a second electrode, and an organic layer located between the first electrode and the second electrode and including an emission layer, and wherein the organic layer includes at least one organometallic compound represented by Formula 1.

The organometallic compound may be included in the emission layer of the organic layer, and the organometallic compound included in the emission layer may act as a dopant.

Another aspect provides an electronic apparatus including the organic light-emitting device.

BRIEF DESCRIPTION OF THE DRAWING

The above and other aspects, features, and advantages of certain exemplary embodiments of the disclosure will be more apparent from the following detailed description taken in conjunction with the FIGURE, which is a schematic view of an organic light-emitting device according to one or more embodiments.

DETAILED DESCRIPTION

Reference will now be made in further detail to exemplary embodiments, examples of which are illustrated in the accompanying drawing, wherein like reference numerals refer to like elements throughout. In this regard, the present exemplary embodiments may have different forms and should not be construed as being limited to the descriptions set forth herein. Accordingly, the exemplary embodiments are merely described in detail below, by referring to the FIGURE, to explain aspects.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Hereinafter, a work function or a highest occupied molecular orbital (HOMO) energy level is expressed as an absolute value from a vacuum level. In addition, when the work function or the HOMO energy level is referred to be "deep," "high" or "large," the work function or the HOMO energy level has a large absolute value based on "0 eV" of the vacuum level, while when the work function or the HOMO energy level is referred to be "shallow," "low," or "small," the work function or HOMO energy level has a small absolute value based on "0 eV" of the vacuum level.

The organometallic compound is represented by Formula 1:

Formula 1

$$M(L_1)_{n1}(L_2)_{n2}$$

M in Formula 1 is a transition metal.

For example, M may be a Period 1 transition metal of the Periodic Table of the Elements, a Period 2 transition metal of the Periodic Table of the Elements, or a Period 3 transition metal of the Periodic Table of the Elements.

In one or more embodiments, M may be iridium (Ir), platinum (Pt), osmium (Os), titanium (Ti), zirconium (Zr), hafnium (Hf), europium (Eu), terbium (Tb), thulium (Tm), or rhodium (Rh).

In one or more embodiments, M may be Ir, Pt, Os, or Rh.

$L_1$ in Formula 1 is a ligand represented by Formula 2-1, and n1 in Formula 1 indicates the number of $L_1$ in Formula 1 and is 1 or 2. When n1 is 2, two $L_1$(s) are identical to or different from each other.

$L_2$ in Formula 1 is a ligand represented by Formula 2-2, and n2 in Formula 1 indicates the number of $L_2$ in Formula 1 and is 1 or 2. When n2 is 2, two $L_2$(s) are identical to or different from each other.

Formula 2-1

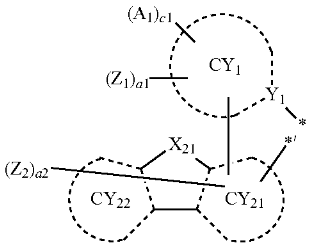

Formula 2-2

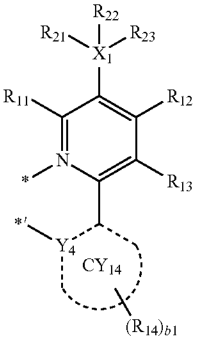

Formulae 2-1 and 2-2 are as described herein.

$L_1$ and $L_2$ in Formula 1 are different from each other. That is, the organometallic compound represented by Formula 1 is a heteroleptic complex.

The sum of n1 and n2 is 2 or 3.

In one or more embodiments, M may be Ir, and the sum of n1 and n2 may be 3; or M may be Pt, and the sum of n1 and n2 may be 2.

$Y_1$ and $Y_4$ in Formula 2-2 are each independently C or N.

For example, $Y_1$ in Formula 2-1 may be N, and $Y_4$ in Formula 2-2 may be C.

$X_1$ in Formula 2-2 is Si or Ge.

$X_{21}$ in Formula 2-1 is O, S, S(=O), $N(Z_{29})$, $C(Z_{29})(Z_{30})$, or $Si(Z_{29})(Z_{30})$. $Z_{29}$ and $Z_{30}$ are each as described in the present specification.

For example, $X_{21}$ in Formula 2-1 may be O or S.

In one or more embodiments, $X_{21}$ in Formula 2-1 may be O.

In one or more embodiments, $X_{21}$ in Formula 2-1 may be S.

Ring $CY_1$, ring $CY_{21}$, ring $CY_{22}$, and ring $CY_{14}$ in Formulae 2-1 and 2-2 are each independently a $C_5$-$C_{30}$ carbocyclic group or a $C_1$-$C_{30}$ heterocyclic group.

For example, ring $CY_1$, ring $CY_{21}$, ring $CY_{22}$, and ring $CY_{14}$ in Formulae 1-1 and 1-2 may each independently be i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other, the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a phenyl group, a pyridine group, a pyrimidine group, a pyrazine group, a pyridazine group, or a triazine group.

In one or more embodiments, ring $CY_1$, ring $CY_{21}$, ring $CY_{22}$, and ring $CY_{14}$ in Formulae 2-1 and 2-2 may each independently be a cyclopentane group, a cyclohexane group, a cycloheptane group, a cyclopentene group, a cyclohexene group, a cycloheptene group, a phenyl group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, a norbornene group, a phenyl group condensed with an adamantane group, a phenyl group condensed with a norbornane group, a pyridine group condensed with an adamantane group, or a pyridine group condensed with a norbornane group.

In one or more embodiments, ring $CY_1$, ring $CY_{21}$, ring $CY_{22}$, and ring $CY_{14}$ in Formulae 2-1 and 2-2 may each independently be a phenyl group, a naphthalene group, a 1, 2, 3, 4-tetrahydronaphthalene group, a phenanthrene group, an anthracene group, a pyridine group, a pyrimidine group, a pyrazine group, a triazine group, a benzofuran group, a benzothiophene group, a fluorene group, a carbazole group, a dibenzofuran group, a dibenzothiophene group, a dibenzosilole group, an azafluorene group, an azacarbazole group, an azadibenzofuran group, an azadibenzothiophene group, an azadibenzosilole group, a quinoline group, an isoquinoline group, a quinoxaline group, a quinazoline group, a benzoquinoline group, a benzoisoquinoline group, a benzoquinoxaline group, or a benzoquinazoline group.

In one or more embodiments, ring $CY_1$ in Formula 2-1 may be a pyridine group, a 5,6,7,8-tetrahydroisoquinoline group, or a 5,6,7,8-tetrahydroquinoline group.

In one or more embodiments, ring $CY_{21}$ in Formula 2-1 may be a phenyl group, a naphthalene group, a 1,2,3,4-tetrahydronaphthalene group, a pyridine group, or a pyrimidine group.

In one or more embodiments, ring $CY_{22}$ in Formula 2-1 may be a phenyl group, a naphthalene group, a 1,2,3,4-tetrahydronaphthalene group, a phenanthrene group, an anthracene group, a pyridine group, a pyrimidine group, a benzofuran group, a benzothiophene group, a dibenzofuran group, a dibenzothiophene group, an azadibenzofuran group, an azadibenzothiophene group, a quinoline group, an isoquinoline group, a quinoxaline group, a quinazoline group, a benzoquinoline group, a benzoisoquinoline group, a benzoquinoxaline group, or a benzoquinazoline group.

In one or more embodiments, ring $CY_{14}$ in Formulae 2-2 may be a phenyl group, a naphthalene group, a 1,2,3,4-tetrahydronaphthalene group, a dibenzothiophene group, a dibenzofuran group, or a pyridine group.

M of Formula 1 may be bonded to carbon of ring $CY_{21}$ of Formula 2-1.

$A_1$ in Formula 2-1 is a group represented by Formula 3, provided that $A_1$ is not —$CD_3$:

Formula 3

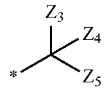

That is, a case in which all of $Z_3$ to $Z_5$ in Formula 3 are deuterium simultaneously, is excluded. In other words, at least one of $Z_3$ to $Z_5$ is not deuterium.

Details for Formula 3 are as described herein.

c1 in Formula 2-1 indicates the number of $A_1$(s), and is an integer from 1 to 20, for example, 1, 2, or 3. When c1 is 2 or more, two or more of $A_1$(s) are identical to or different from each other. In one or more embodiments, c1 may be 1.

$R_{21}$ to $R_{23}$ in Formula 2-2 are each independently a $C_1$-$C_{60}$ alkyl group or a $C_6$-$C_{60}$ aryl group, unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_3$-$C_{10}$ cycloalkyl group, a phenyl group, or a combination thereof.

For example, $R_{21}$ to $R_{23}$ in Formula 2-2 may each independently be a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a biphenyl group, or a naphthyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_3$-$C_{10}$ cycloalkyl group, a phenyl group, or a combination thereof.

In one or more embodiments, $R_{21}$ to $R_{23}$ in Formula 2-2 may each independently be —$CH_3$, —$CH_2CH_3$, —$CD_3$, —$CD_2H$, —$CDH_2$, —$CH_2CD_3$, or —$CD_2CH_3$.

In one or more embodiments, $R_{21}$ to $R_{23}$ in Formula 2-2 may be identical to each other.

In one or more embodiments, two or more of $R_{21}$ to $R_{23}$ in Formula 2-2 may be different from each other.

$Z_1$ to $Z_5$, $R_{11}$ to $R_{14}$, $Z_{29}$, and $Z_{30}$ in Formulae 2-1, 2-2, and 3 are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, provided that at least one of $Z_3$ to $Z_5$ of Formula 3 is deuterium or a deuterated group, and provided that in Formula 2-2, $R_{12}$ is hydrogen, deuterium, a methyl group, or a deuterated methyl group, or $R_{12}$ and $R_{13}$ are linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$. $Q_1$ to Qg are as described in the present specification.

For example, $Z_1$, $Z_2$, $R_{11}$, $R_{13}$, $R_{14}$, $Z_{29}$, and $Z_{30}$ in Formulae 2-1 and 2-2 may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkoxy group, a $C_1$-$C_{20}$ alkylthio group, or a $C_2$-$C_{20}$ alkenyl group;

a $C_1$-$C_{20}$ alkyl group, a $C_1$-$C_{20}$ alkoxy group, a $C_1$-$C_{20}$ alkylthio group, or a $C_2$-$C_{20}$ alkenyl group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopropyl group, a cyclobutyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopropyl group, a ($C_1$-$C_{20}$ alkyl)cyclobutyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornanyl group, a ($C_1$-$C_{20}$ alkyl) norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl) bicyclo[1.1.1]pentyl group, a ($C_1$-$C_{20}$ alkyl) bicyclo[2.1.1]hexyl group, a ($C_1$-$C_{20}$ alkyl) bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or a combination thereof;

a cyclopropyl group, a cyclobutyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group or an azadibenzothiophenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a cyclopropyl group, a cyclobutyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopropyl group, a ($C_1$-$C_{20}$ alkyl)cyclobutyl group, a ($C_1$-$C_{20}$ alkyl) cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornanyl group, a ($C_1$-$C_{20}$ alkyl) norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl) bicyclo[1.1.1]pentyl group, a ($C_1$-$C_{20}$ alkyl) bicyclo[2.1.1]hexyl group, a ($C_1$-$C_{20}$ alkyl) bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or —$Si(Q_3)(Q_4)(Q_5)$, or —$Ge(Q_3)(Q_4)(Q_5)$.

a1, a2 and b1 in Formulae 2-1 and 2-2 indicate the number of $Z_1$(s), the number of $Z_2$(s), and the number of $R_{14}$(s), respectively, and are each independently an integer from 0 to 20. When a1 is 2 or more, two or more of $Z_1$(s) are identical to or different from each other, when a2 is 2 or more, two or more of $Z_2$(s) are identical to or different from each other, and when b1 is 2 or more, two or more of $R_{14}$(s) are identical to or different from each other. For example, a1, a2, and b1 may each independently be an integer from 0 to 10. In one or more embodiments, a1, a2, and b1 may each independently be 0, 1, or 2.

In one or more embodiments, $Z_1$ to $Z_5$, $R_{11}$, $R_{13}$, $R_{14}$, $Z_{29}$ and $Z_{30}$ in Formulae 2-1 and 2-2 may each independently be:

hydrogen, deuterium, —F, or a cyano group;

a $C_1$-$C_{20}$ alkyl group, a $C_1$-$C_{20}$ alkoxy group, a $C_1$-$C_{20}$ alkylthio group, a $C_2$-$C_{20}$ alkenyl group, a phenyl group, a naphthyl group, a pyridinyl group, a dibenzofuranyl group, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl) biphenyl group, —$Si(Q_{33})(Q_{34})(Q_{35})$, —$Ge(Q_{33})(Q_{34})(Q_{35})$, or a combination thereof; or —$Si(Q_3)(Q_4)(Q_5)$ or —$Ge(Q_3)(Q_4)(Q_5)$.

In one or more embodiments, $R_{12}$ in Formula 2-2 may be hydrogen, deuterium, a methyl group, —$CDH_2$, —$CD_2H$, or —$CD_3$.

In one or more embodiments, $R_{12}$ in Formula 2-2 may be hydrogen or a methyl group.

In one or more embodiments, in relation to Formula 3, i) $Z_3$ may be deuterium or a deuterated group, and each of $Z_4$ and $Z_5$ may be a deuterium-free group;

ii) each of $Z_3$ and $Z_4$ may be deuterium or a deuterated group, and $Z_5$ may be a deuterium-free group; or iii) each of $Z_3$ to $Z_5$ may be deuterium or a deuterated group, provided that a case in which all of $Z_3$ to $Z_5$ are deuterium simultaneously, may be excluded. In other words, each of $Z_3$ to $Z_5$ is deuterium or a deuterated group, provided that at least one of $Z_3$ to $Z_5$ is not deuterium.

In one or more embodiments, at least one of $Z_3$ to $Z_5$ of Formula 3 may each independently be:

deuterium; or a deuterated $C_1$-$C_{20}$ alkyl group, a deuterated $C_1$-$C_{20}$ alkoxy group, a deuterated $C_1$-$C_{20}$ alkylthio group, a deuterated $C_2$-$C_{20}$ alkenyl group, a deuterated phenyl group, a deuterated naphthyl group, a deuterated pyridinyl group, a deuterated dibenzofuranyl group, or a deuterated dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl) biphenyl group, —$Si(Q_{33})(Q_{34})(Q_{35})$, —$Ge(Q_{33})(Q_{34})(Q_{35})$, or a combination thereof; or —$Si(Q_3)(Q_4)(Q_5)$ or —$Ge(Q_3)(Q_4)(Q_5)$.

In one or more embodiments, $Z_3$ and $Z_4$ in Formula 3 may each independently be:

deuterium; or a deuterated $C_1$-$C_{20}$ alkyl group, a deuterated $C_1$-$C_{20}$ alkoxy group, a deuterated $C_1$-$C_{20}$ alkylthio group, a deuterated $C_2$-$C_{20}$ alkenyl group, a deuterated phenyl group, a deuterated naphthyl group, a deuterated pyridinyl group, a deuterated dibenzofuranyl group, or a deuterated dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl) biphenyl group, —Si($Q_{33}$)($Q_{34}$)($Q_{35}$), —Ge($Q_{33}$)($Q_{34}$)($Q_{35}$), or a combination thereof, and $Z_5$ may be:

—F or a cyano group;

a $C_1$-$C_{20}$ alkyl group, a $C_1$-$C_{20}$ alkoxy group, a $C_1$-$C_{20}$ alkylthio group, a $C_2$-$C_{20}$ alkenyl group, a phenyl group, a naphthyl group, a pyridinyl group, a dibenzofuranyl group, or a dibenzothiophenyl group, each unsubstituted or substituted with at least one of —F, a cyano group, a $C_1$-$C_{20}$ alkyl group, a fluorinated $C_1$-$C_{20}$ alkyl group, a $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a fluorinated phenyl group, a ($C_1$-$C_{20}$ alkyl)phenyl group, a biphenyl group, a fluorinated biphenyl group, a ($C_1$-$C_{20}$ alkyl) biphenyl group, —Si($Q_{33}$)($Q_{34}$)($Q_{35}$), —Ge($Q_{33}$)($Q_{34}$)($Q_{35}$) (where each of $Q_{33}$ to $Q_{35}$ may not include deuterium), or a combination thereof; or —Si($Q_3$)($Q_4$)($Q_5$) or —Ge($Q_3$)($Q_4$)($Q_5$) (wherein each of $Q_3$ to $Q_5$ may not include deuterium).

In one or more embodiments, the organometallic compound represented by Formula 1 may satisfy at least one of Condition (1) to Condition (3):

Condition (1)

$Z_1$ in Formula 2-1 is not hydrogen, and a1 is an integer from 1 to 20

Condition (2)

$R_{14}$ in Formula 2-2 is not hydrogen, and b1 is an integer from 1 to 20

Condition (3)

in Formula 2-1, $Z_2$ is not hydrogen and a2 is an integer from 1 to 6.

In one or more embodiments, the organometallic compound represented by Formula 1 may include at least one fluoro group (—F), at least one cyano group (—CN), or a combination thereof.

In one or more embodiments, the organometallic compound represented by Formula 1 may satisfy at least one of Condition A to Condition H:

Condition A $Z_1$ in Formula 2-1 is not hydrogen, a1 is an integer from 1 to 20, and at least one of $Z_1$(s) in the number of a1 includes deuterium Condition B $Z_2$ in Formula 2-1 is not hydrogen, a2 is an integer from 1 to 6, and at least one of $Z_2$(s) in the number of 2 includes deuterium Condition C $Z_2$ in Formula 2-1 is not hydrogen, a2 is an integer from 1 to 6, and at least one of $Z_2$(s) in the number of 2 includes a fluoro group (—F)

Condition D $Z_2$ in Formula 2-1 is not hydrogen, a2 is an integer from 1 to 6, and at least one of $Z_2$(s) in the number of 2 includes a cyano group (—CN)

Condition E $Z_2$ in Formula 2-1 is not hydrogen, a2 is an integer from 1 to 6, and at least one of $Z_2$(s) in the number of a2 is a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group Condition F at least one of $R_{21}$ to $R_{23}$ in Formula 2-2 includes deuterium Condition G $R_{14}$ in Formula 2-2 is not hydrogen, b1 is an integer from 1 to 20, and at least one of $R_{14}$(s) in the number of b1 includes deuterium Condition H $R_{14}$ in Formula 2-2 is not hydrogen, b1 is an integer from 1 to 20, and at least one of $R_{14}$(s) in the number of b1 includes a fluoro group (—F)

In one or more embodiments, in relation to Formula 2-1, $Z_2$ may not be hydrogen, a2 may be an integer from 1 to 3, and at least one of $Z_2$(s) in the number of a2 may each independently be a substituted or unsubstituted $C_1$-$C_{60}$ alkyl group, a substituted or unsubstituted $C_1$-$C_{60}$ alkoxy group, a substituted or unsubstituted $C_1$-$C_{60}$ alkylthio group, a substituted or unsubstituted $C_2$-$C_{20}$ alkenyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

In one or more embodiments, in relation to Formula 2-1, $Z_2$ is not hydrogen, a2 is an integer from 1 to 3, and at least one of $Z_2$(s) in the number of a2 is a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, $Z_1$, $Z_2$, $R_{11}$, $R_{13}$, $R_{14}$, $Z_{29}$, and $Z_{30}$ in Formulae 2-1 and 2-2 may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, —$OCH_3$, —$OCDH_2$, —$OCD_2H$, —$OCD_3$, —$SCH_3$, —$SCDH_2$, —$SCD_2H$, —$SCD_3$, a $C_2$-$C_{10}$ alkenyl group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-233, a group represented by one of Formulae 9-201 to 9-233 in which at least one hydrogen is substituted with deuterium, a group represented by one of Formulae 9-201 to 9-233 in which at least one hydrogen is substituted with —F, a group represented by one of Formulae 10-1 to 10-132, a group represented by one of Formulae 10-1 to 10-132 in which at least one hydrogen is substituted with deuterium, a group represented by one of Formulae 10-1 to 10-132 in which at least one hydrogen is substituted with —F, a group represented by one of Formulae 10-201 to 10-353, a group represented by one of Formulae 10-201 to 10-353 in which at least one hydrogen is substituted with deuterium, a group represented by one of Formulae 10-201 to 10-353 in which at least one hydrogen is substituted with —F, —Si($Q_3$)($Q_4$)($Q_5$), or —Ge($Q_3$)($Q_4$)($Q_5$).

In one or more embodiments, in relation to Formula 3, $Z_3$ may be deuterium, —$CD_3$, —$CD_2H$, —$CDH_2$, —$OCDH_2$, —$OCD_2H$, —$OCD_3$, —$SCDH_2$, —$SCD_2H$, —$SCD_3$, a group represented by one of Formulae 9-1 to 9-39 in which at least one hydrogen is substituted with deuterium, a group represented by one of Formulae 9-201 to 9-233 in which at least one hydrogen is substituted with deuterium, a group represented by one of Formulae 10-1 to 10-132 in which at least one hydrogen is substituted with deuterium, or a group represented by one of Formulae 10-201 to 10-353 in which at least one hydrogen is substituted with deuterium, and each of $Z_4$ and $Z_5$ may be hydrogen, —F, a cyano group, —$CH_3$, —$CF_3$, —$CF_2H$, —$CFH_2$, —$OCH_3$, —$SCH_3$, a $C_2$-$C_{10}$ alkenyl group, a group represented by one of Formulae 9-1 to 9-39, a group represented by one of Formulae 9-1 to 9-39 in which at least one hydrogen is substituted with —F, a group represented by one of Formulae 9-201 to 9-233, a group represented by one of Formulae 9-201 to 9-233 in which at least one hydrogen is substituted with —F, a group represented by one of Formulae 10-1 to 10-132, a group represented by one of Formulae 10-1 to 10-132 in which at least one hydrogen is substituted with —F, a group represented by one of Formulae 10-201 to 10-353, a group represented by one of Formulae 10-201 to 10-353 in which at least one hydrogen is substituted with —F, —Si($Q_3$)($Q_4$)(Q), or —Ge($Q_3$)($Q_4$)($Q_5$).

In one or more embodiments, in relation to Formula 3, $Z_3$ and ZA may be each independently be deuterium, —$CD_3$, —$CD_2H$, —$CDH_2$, —$OCDH_2$, —$OCD_2H$, —$OCD_3$, —$SCDH_2$, —$SCD_2H$, —$SCD_3$, a group represented by one of Formulae 9-1 to 9-39 in which at least one hydrogen is substituted with deuterium, a group represented by one of Formulae 9-201 to 9-233 in which at least one hydrogen is substituted with deuterium, a group represented by one of Formulae 10-1 to 10-132 in which at least one hydrogen is substituted with deuterium, or a group represented by one of Formulae 10-201 to 10-353 in which at least one hydrogen is substituted with deuterium, and $Z_5$ may be hydrogen, —F, a cyano group, —$CH_3$, —$CF_3$, —$CF_2H$, —$CFH_2$, —$OCH_3$, —$SCH_3$, a $C_2$-$C_{10}$ alkenyl group, a group represented by one of Formulae 9-1 to 9-39, a group represented by one of Formulae 9-1 to 9-39 in which at least one hydrogen is substituted with —F, a group represented by one of Formulae 9-201 to 9-233, a group represented by one of Formulae 9-201 to 9-233 in which at least one hydrogen is substituted with —F, a group represented by one of Formulae 10-1 to 10-132, a group represented by one of Formulae 10-1 to 10-132 in which at least one hydrogen is substituted with —F, a group represented by one of Formulae 10-201 to 10-353, a group represented by one of Formulae 10-201 to 10-353 in which at least one hydrogen is substituted with —F, —Si($Q_3$)($Q_4$)($Q_5$), or —Ge($Q_3$)($Q_4$)($Q_5$).

In one or more embodiments, $Z_3$ to $Z_5$ in Formula 3 may each independently be deuterium, —$CD_3$, —$CD_2H$, —$CDH_2$, —$OCDH_2$, —$OCD_2H$, —$OCD_3$, —$SCDH_2$, —$SCD_2H$, —$SCD_3$, a group represented by one of Formulae 9-1 to 9-39 in which at least one hydrogen is substituted with deuterium, a group represented by one of Formulae 9-201 to 9-233 in which at least one hydrogen is substituted with deuterium, a group represented by one of Formulae 10-1 to 10-132 in which at least one hydrogen is substituted with deuterium, or a group represented by one of Formulae 10-201 to 10-353 in which at least one hydrogen is substituted with deuterium, provided that a case in which all of $Z_3$ to $Z_5$ are deuterium simultaneously, may be excluded:

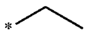
9-1

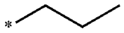
9-2

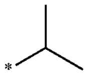
9-3

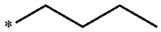
9-4

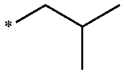
9-5

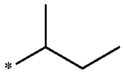
9-6

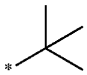
9-7

9-8

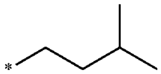
9-9

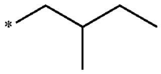
9-10

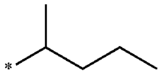
9-11

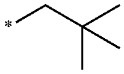
9-12

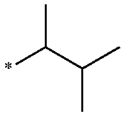
9-13

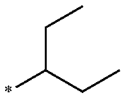
9-14

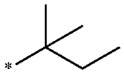
9-15

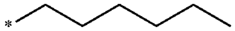
9-16

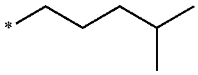
9-17

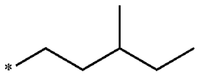
9-18

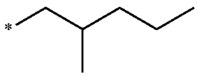
9-19

-continued
9-20
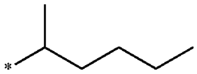
9-21
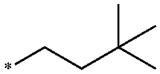
9-22
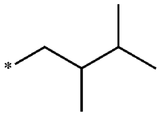
9-23
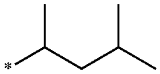
9-24
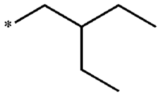
9-25
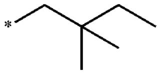
9-26
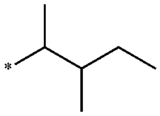
9-27
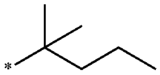
9-28
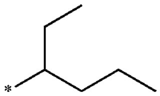
9-29
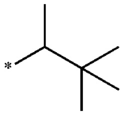
9-30
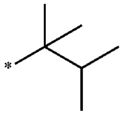
9-31
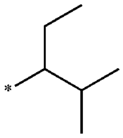
9-32
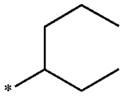
9-33
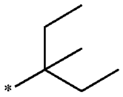
-continued
9-34
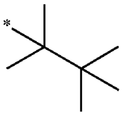
9-35
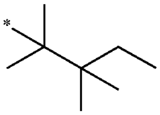
9-36
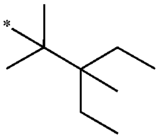
9-37
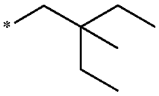
9-38
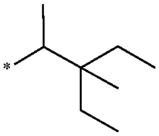
9-39
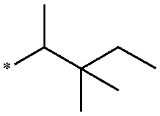
9-201
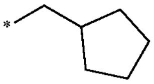
9-202
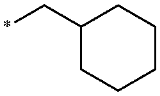
9-203
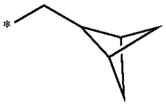
9-204
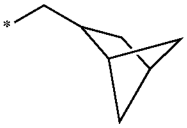
9-205
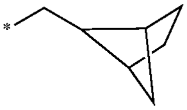
9-206
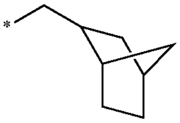

-continued
9-207
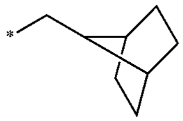
9-208
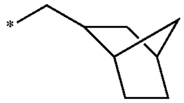
9-209
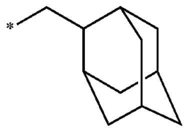
9-210
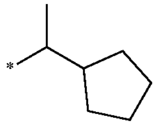
9-211
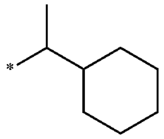
9-212
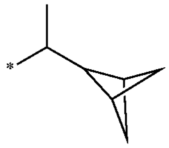
9-213
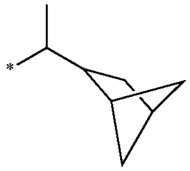
9-214
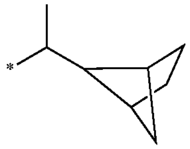
9-215
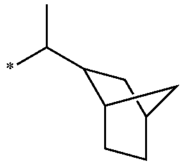
9-216
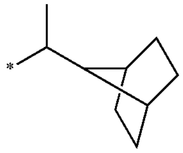
-continued
9-217
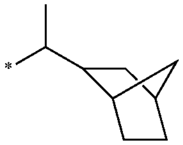
9-218
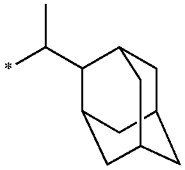
9-219
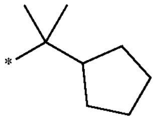
9-220
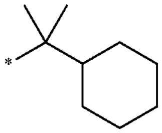
9-221
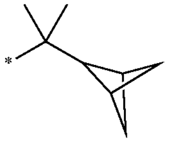
9-222
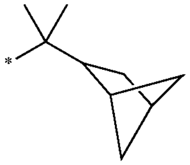
9-223
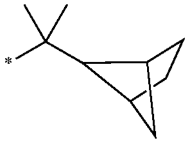
9-224
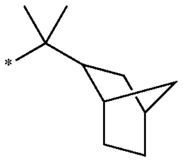
9-225
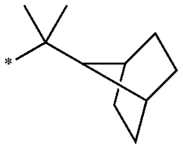
9-226
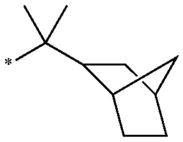

-continued
9-227
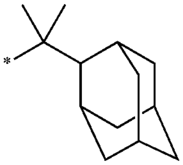
9-228
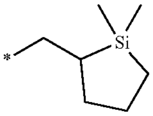
9-229
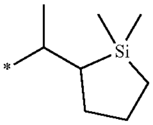
9-230
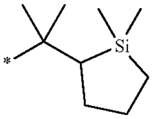
9-231
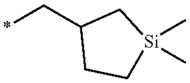
9-232
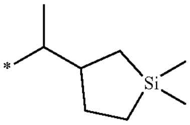
9-233
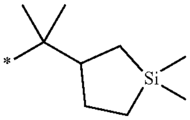
10-1
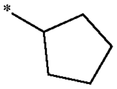
10-2
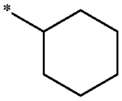
10-3
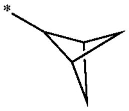
10-4
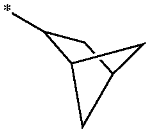
10-5
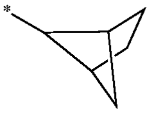
-continued
10-6
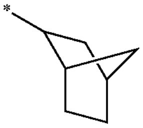
10-7
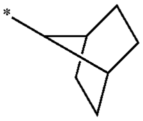
10-8
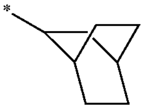
10-9
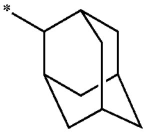
10-10
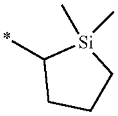
10-11
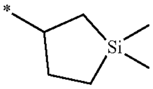
10-12
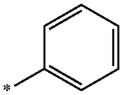
10-13
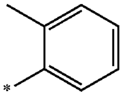
10-14
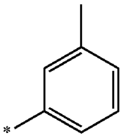
10-15
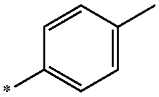
10-16
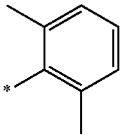
10-17
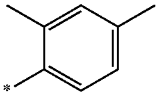

-continued
10-18
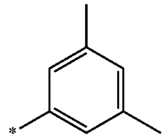
10-19
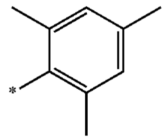
10-20
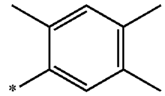
10-21
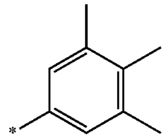
10-22
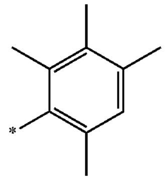
10-23
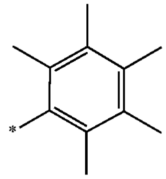
10-24
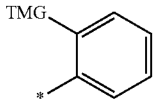
10-25
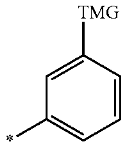
10-26
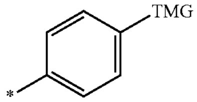
10-27
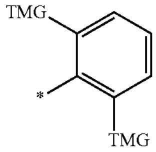
10-28
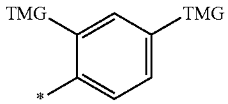
-continued
10-29
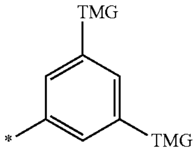
10-30
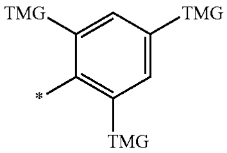
10-31
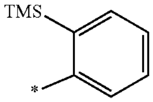
10-32
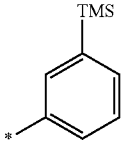
10-33
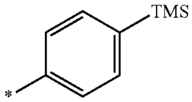
10-34
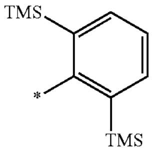
10-35
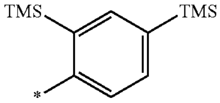
10-36
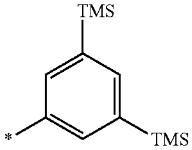
10-37
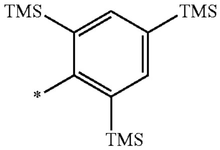
10-38
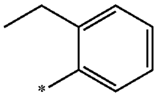
10-39
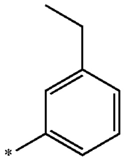

-continued
10-40
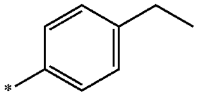
10-41
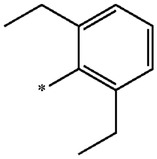
10-42
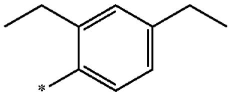
10-43
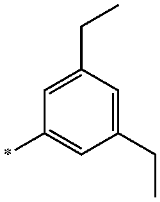
10-44
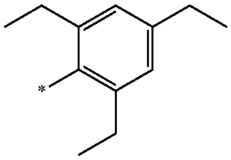
10-45
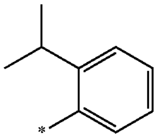
10-46
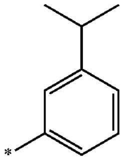
10-47
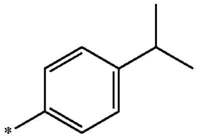
10-48
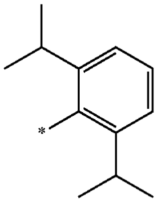
10-49
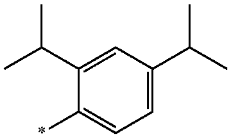
-continued
10-50
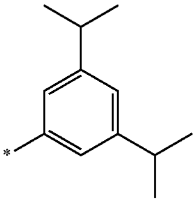
10-51
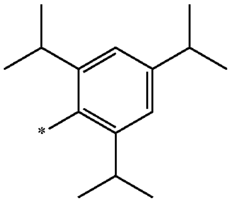
10-52
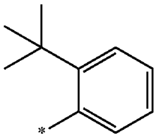
10-53
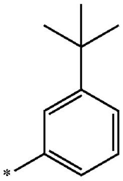
10-54
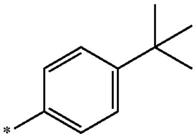
10-55
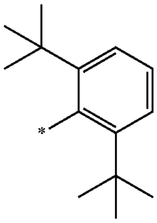
10-56
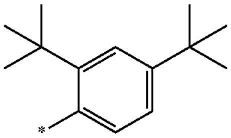
10-57
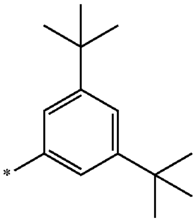

-continued
10-58
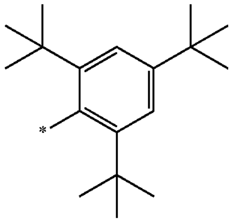
10-59
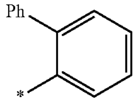
10-60
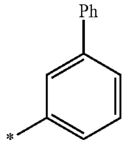
10-61
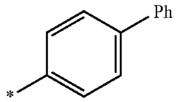
10-62
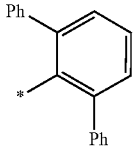
10-63
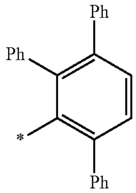
10-64
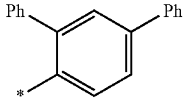
10-65
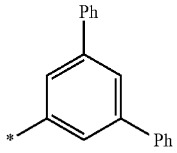
10-66
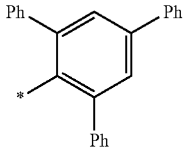
10-67
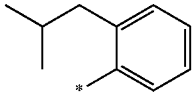
-continued
10-68
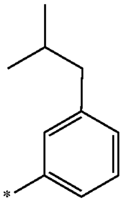
10-69
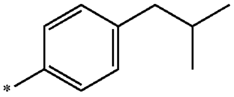
10-70
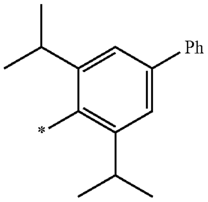
10-71
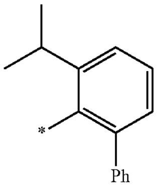
10-72
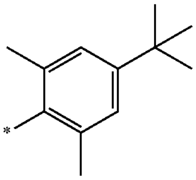
10-73
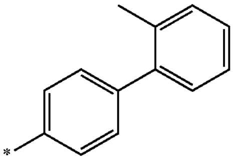
10-74
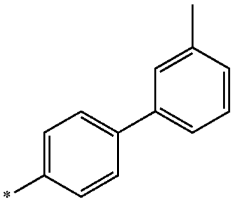
10-75
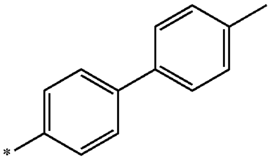

-continued
10-76
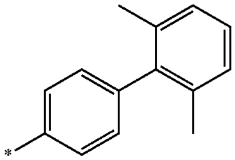
10-77
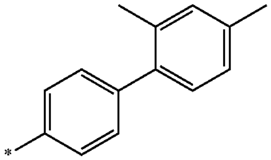
10-78
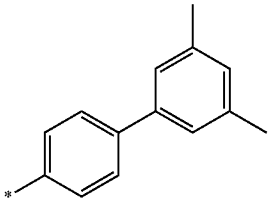
10-79
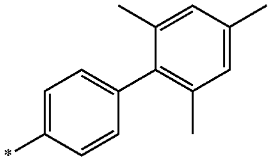
10-80
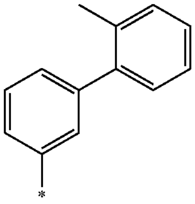
10-81
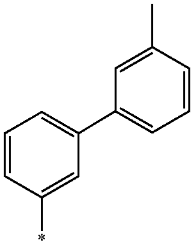
10-82
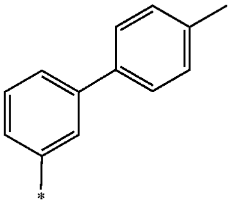
10-83
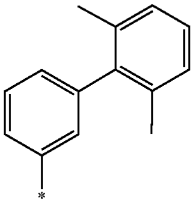
-continued
10-84
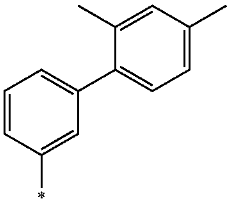
10-85
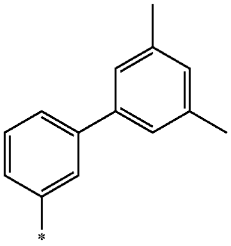
10-86
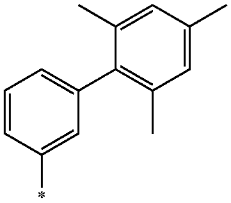
10-87
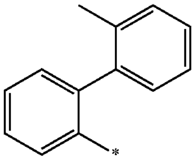
10-88
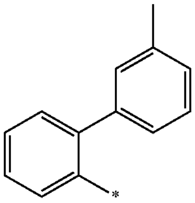
10-89
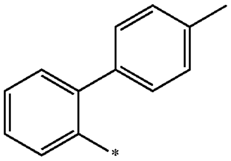
10-90
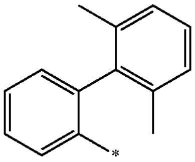
10-91
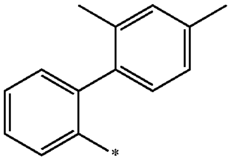

-continued
10-92
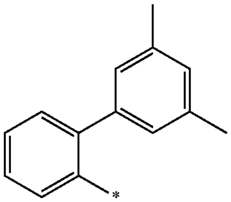
10-93
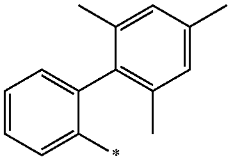
10-94
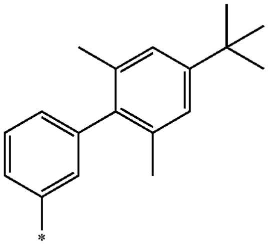
10-95
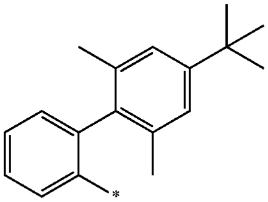
10-96
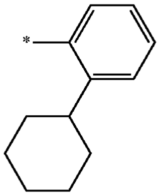
10-97
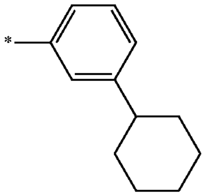
10-98
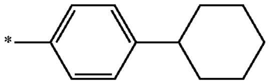
10-99
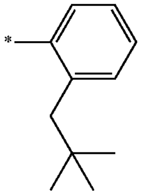
-continued
10-100
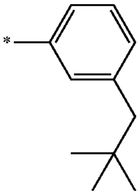
10-101
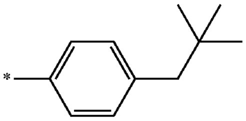
10-102
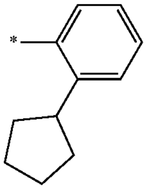
10-103
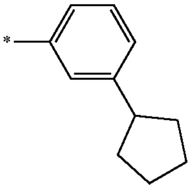
10-104
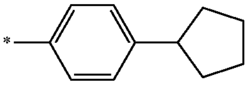
10-105
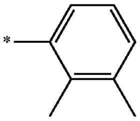
10-106
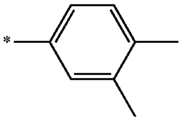
10-107
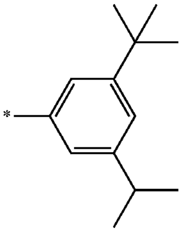
10-108
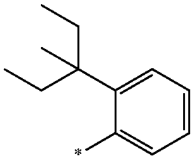

-continued
10-109
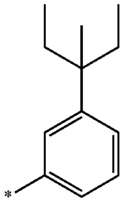
10-110
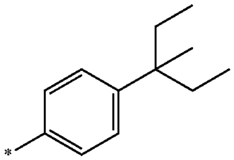
10-111
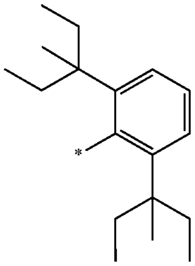
10-112
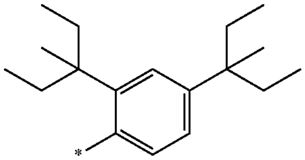
10-113
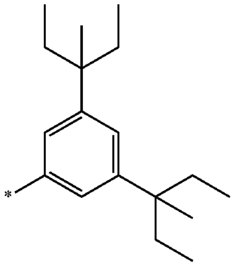
10-114
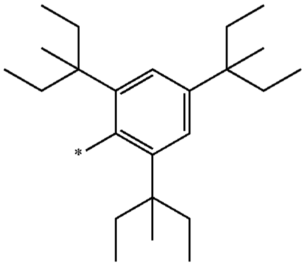
10-115
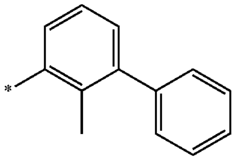
-continued
10-116
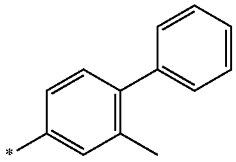
10-117
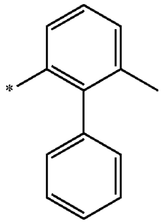
10-118
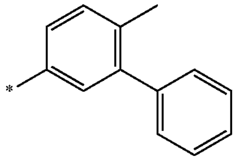
10-119
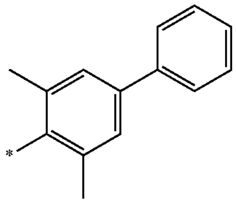
10-120
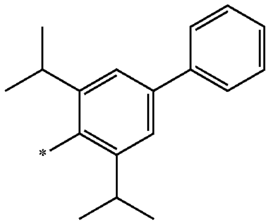
10-121
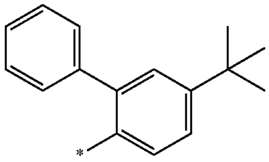
10-122
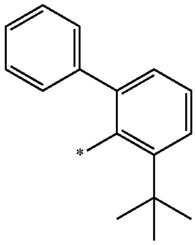

-continued
10-123
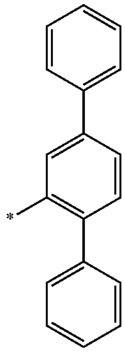
10-124
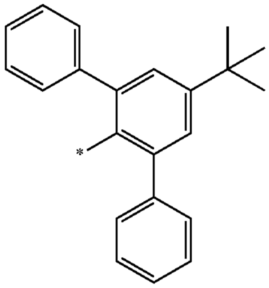
10-125
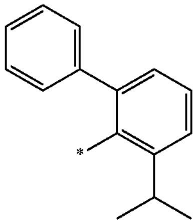
10-126
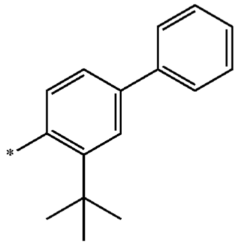
10-127
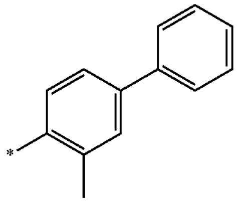
10-128
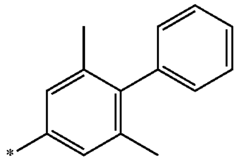
-continued
10-129
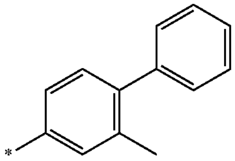
10-130
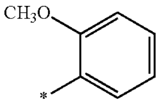
10-131
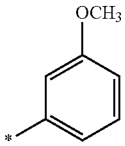
10-132
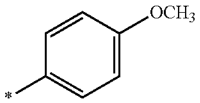
10-201
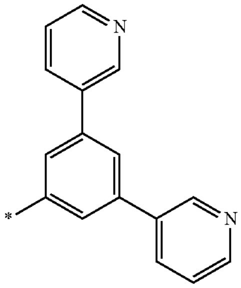
10-202
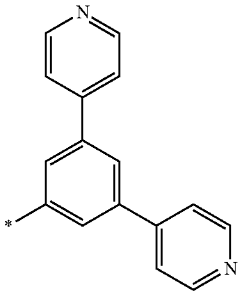
10-203
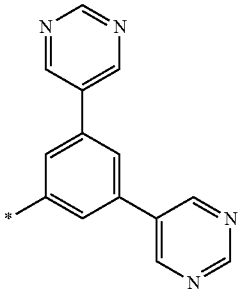

-continued
10-204
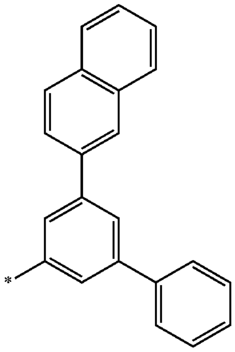
10-205
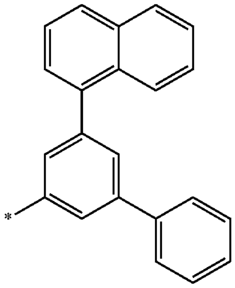
10-206
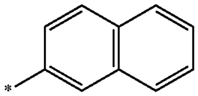
10-207
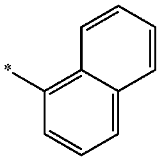
10-208
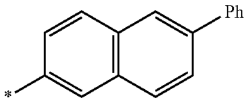
10-209
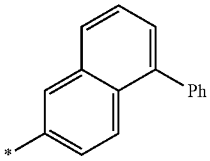
10-210
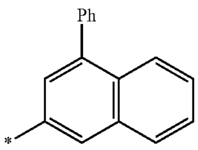
10-211
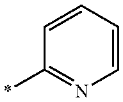
10-212
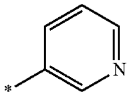
-continued
10-213
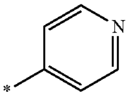
10-214
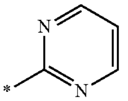
10-215
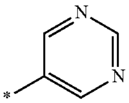
10-216
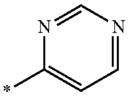
10-217
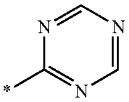
10-218
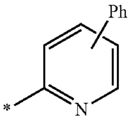
10-219
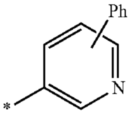
10-220
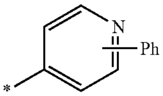
10-221
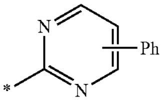
10-222
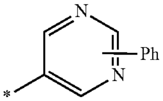
10-223
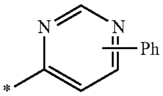
10-224
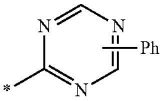
10-225
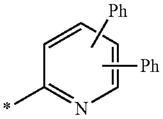

-continued
10-226
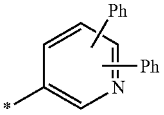
10-227
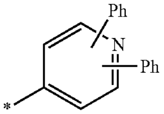
10-228
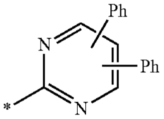
10-229
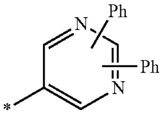
10-230
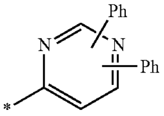
10-231
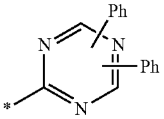
10-232
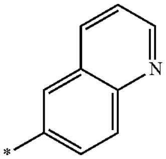
10-233
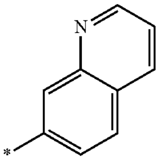
10-234
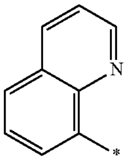
10-235
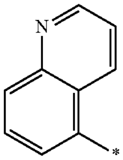
-continued
10-236
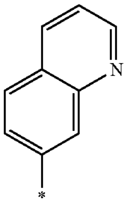
10-237
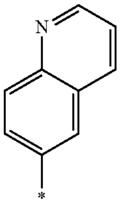
10-238
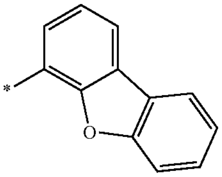
10-239
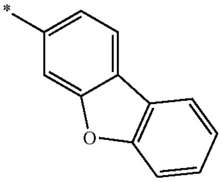
10-240
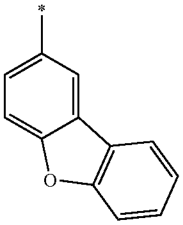
10-241
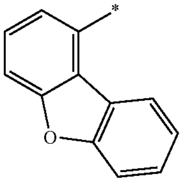
10-242
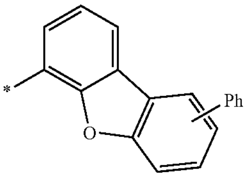
10-243
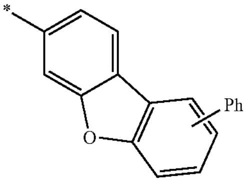

-continued
10-244
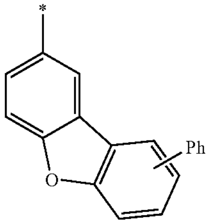
10-245
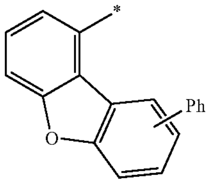
10-246
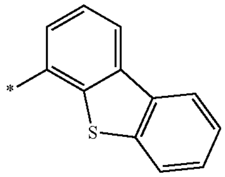
10-247
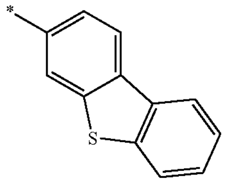
10-248
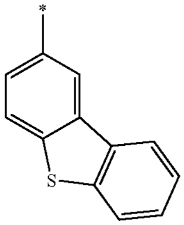
10-249
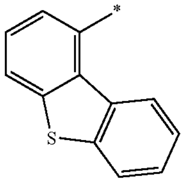
10-250
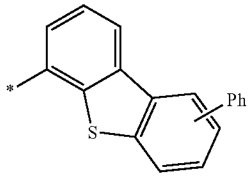
10-251
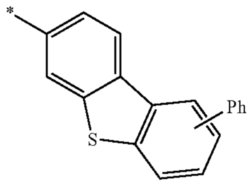
-continued
10-252
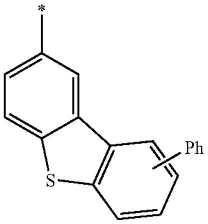
10-253
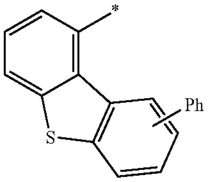
10-254
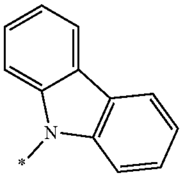
10-255
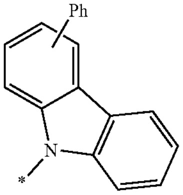
10-256
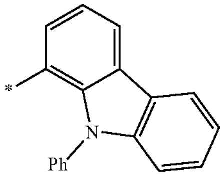
10-257
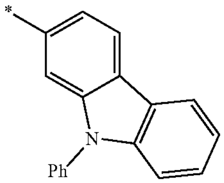
10-258
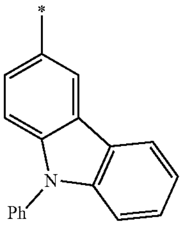
10-259
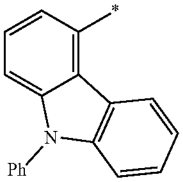

-continued
10-260
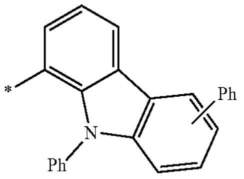
10-261
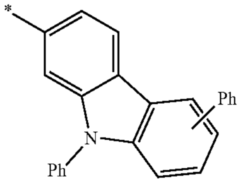
10-262
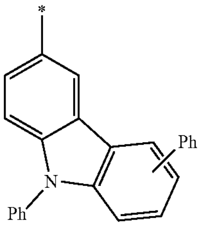
10-263
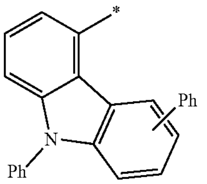
10-264
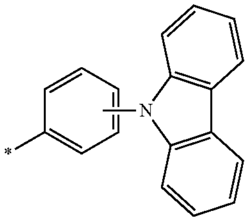
10-265
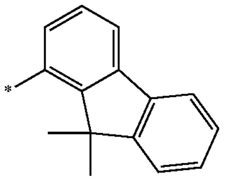
10-266
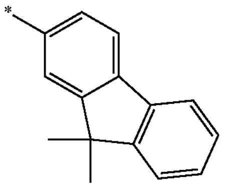
-continued
10-267
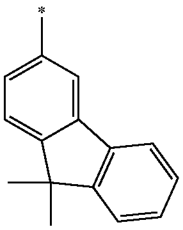
10-268
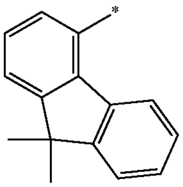
10-269
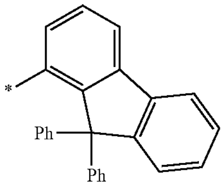
10-270
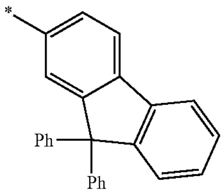
10-271
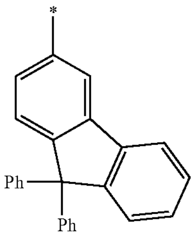
10-272
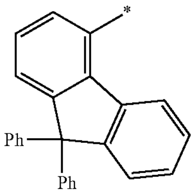
10-273
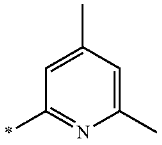
10-274
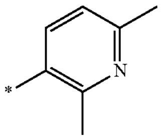

-continued
10-275
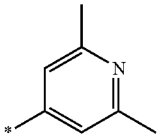
10-276
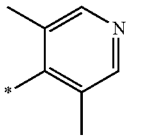
10-277
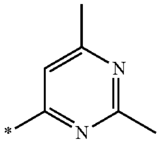
10-278
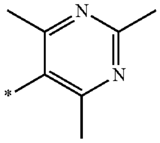
10-279
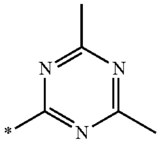
10-280
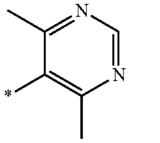
10-281
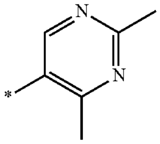
10-282
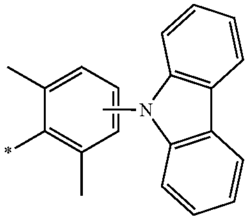
10-283
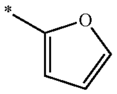
10-284
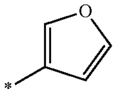
10-285
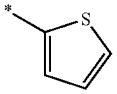
-continued
10-286
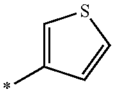
10-287
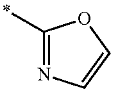
10-288
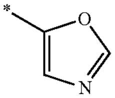
10-289
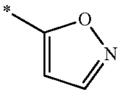
10-290
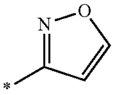
10-291
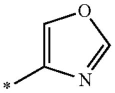
10-292
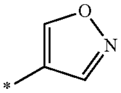
10-293
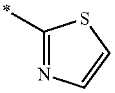
10-294
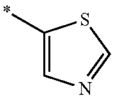
10-295
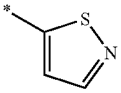
10-296
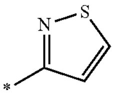
10-297
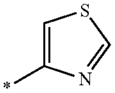
10-298
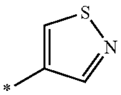
10-299
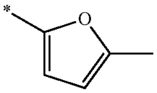
10-300
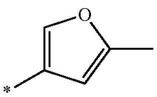

-continued
10-301
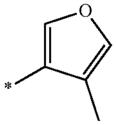
10-302
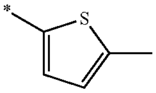
10-303
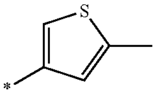
10-304
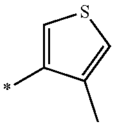
10-305
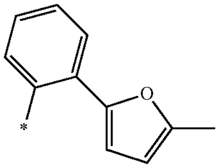
10-306
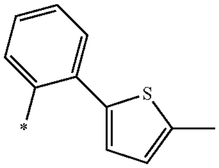
10-307
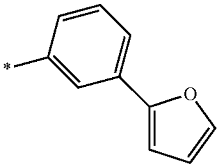
10-308
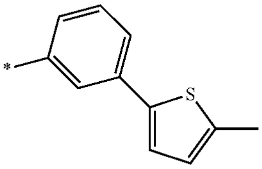
10-309
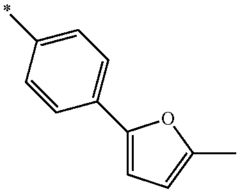
10-310
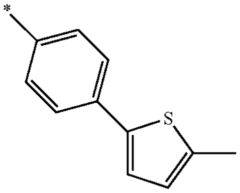
-continued
10-311
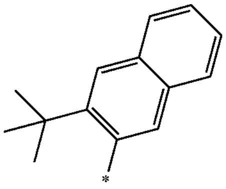
10-312
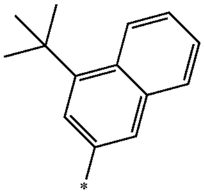
10-313
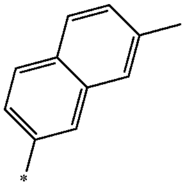
10-314
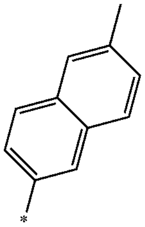
10-315
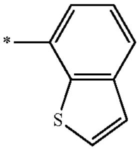
10-316
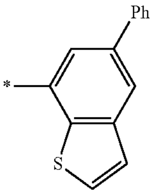
10-317
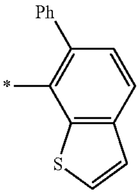
10-318
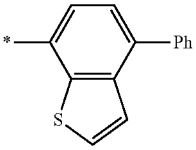

-continued
10-319
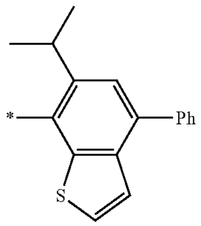
10-320
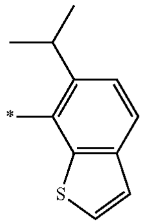
10-321
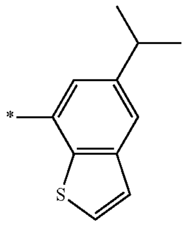
10-322
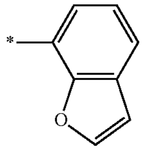
10-323
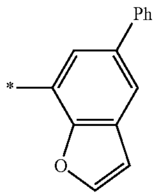
10-324
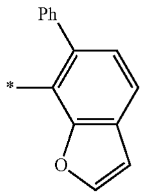
10-325
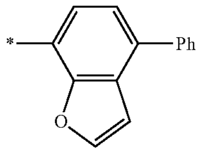
-continued
10-326
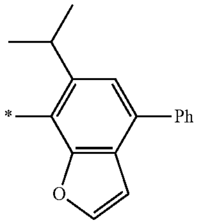
10-327
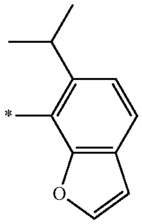
10-328
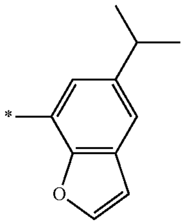
10-329
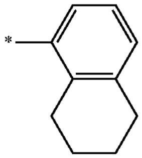
10-330
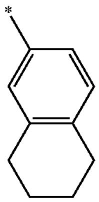
10-331
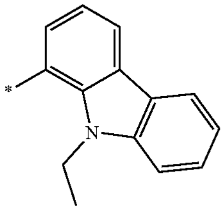
10-332
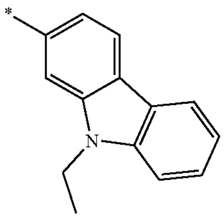

-continued
10-333
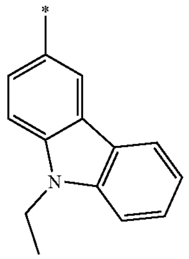
10-334
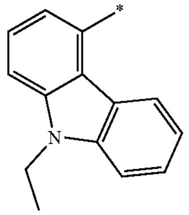
10-335
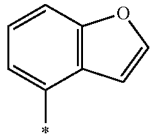
10-336
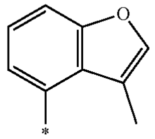
10-337
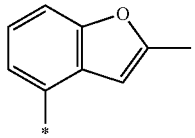
10-338
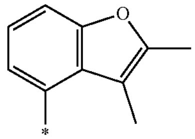
10-339
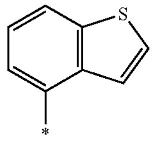
10-340
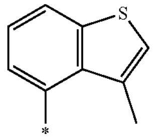
10-341
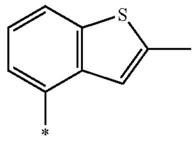
-continued
10-342
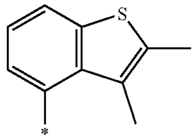
10-343
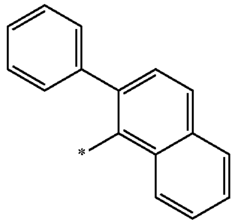
10-344
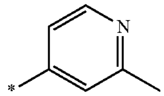
10-345
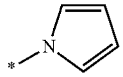
10-346
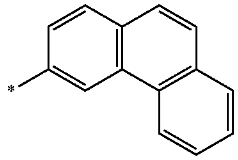
10-347
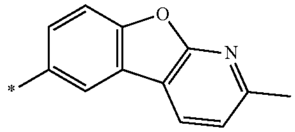
10-348
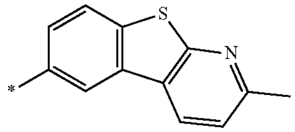
10-349
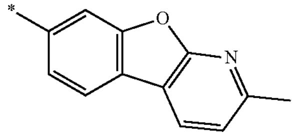
10-350
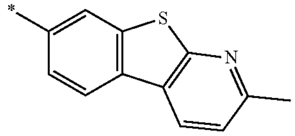
10-351
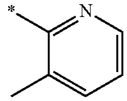
10-352
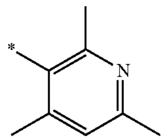

-continued 10-353

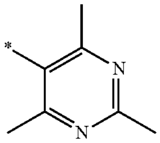

In Formulae 9-1 to 9-39, 9-201 to 9-233, 10-1 to 10-132, and 10-201 to 10-353, * indicates a binding site to a neighboring atom, "Ph" is a phenyl group, "TMS" is a trimethylsilyl group, "TMG" is a trimethylgermyl group, and "Ome" is a methoxy group.

The "group represented by one of Formulae 9-1 to 9-39 in which at least one hydrogen is substituted with deuterium" and the "group represented by one of Formulae 9-201 to 9-233 in which at least one hydrogen is substituted with deuterium" may be, for example, a group represented by one of Formulae 9-501 to 9-514 or 9-601 to 9-635:

9-501

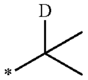

9-502

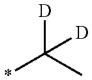

9-503

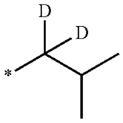

9-504

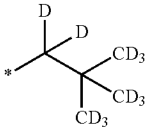

9-505

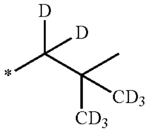

9-506

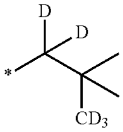

9-507

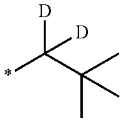

9-508

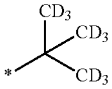

9-509

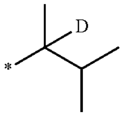

-continued 9-510

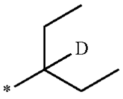

9-511

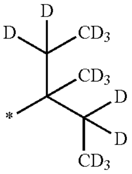

9-512

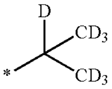

9-513

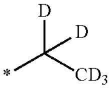

9-514

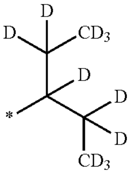

9-601

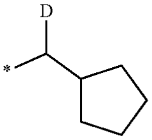

9-602

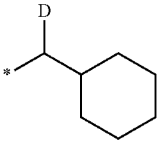

9-603

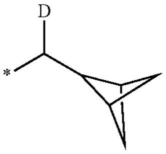

9-604

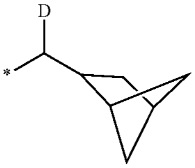

9-605

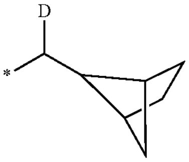

-continued
9-606
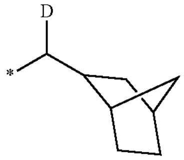
9-607
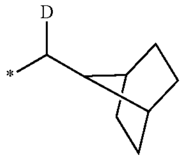
9-608
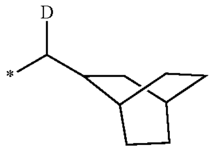
9-609
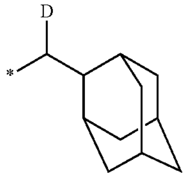
9-610
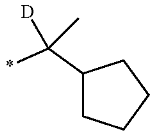
9-611
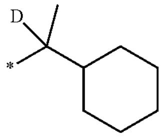
9-612
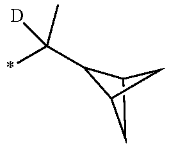
9-613
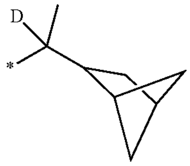
9-614
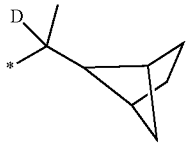
-continued
9-615
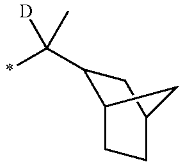
9-616
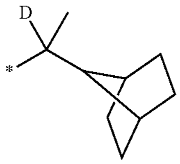
9-617
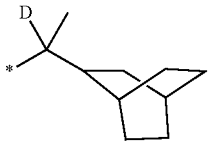
9-618
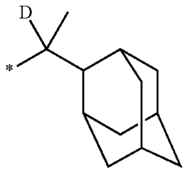
9-619
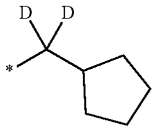
9-620
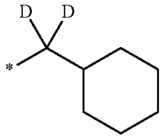
9-621
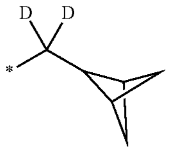
9-622
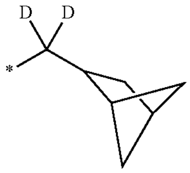
9-623
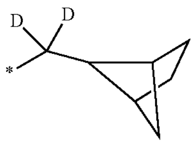

-continued 9-624

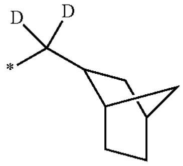

9-625

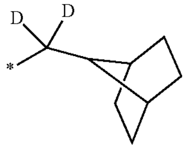

9-626

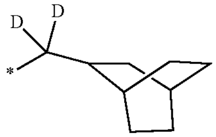

9-627

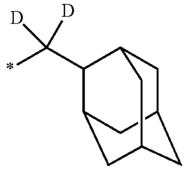

9-628

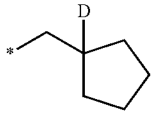

9-629

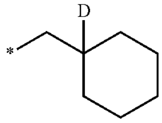

9-630

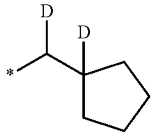

9-631

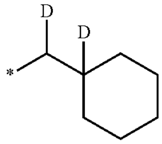

9-632

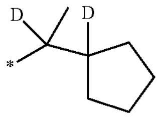

9-633

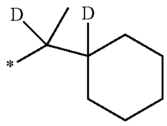

9-634

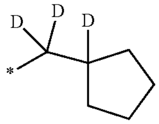

-continued 9-635

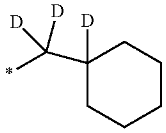

In one or more embodiments, $A_1$ in Formula 2-1 may be a group represented by one of Formulae 9-501 to 9-514 or 9-601 to 9-635.

The "group represented by one of Formulae 9-1 to 9-39 in which at least one hydrogen is substituted with —F" and the "group represented by one of Formulae 9-201 to 9-233 in which at least one hydrogen is substituted with —F" may each be, for example, a group represented by one of Formulae 9-701 to 9-710:

9-701

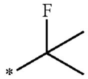

9-702

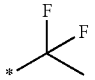

9-703

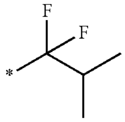

9-704

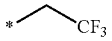

9-705

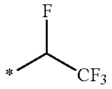

9-706

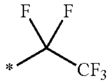

9-707

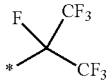

9-708

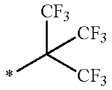

9-709

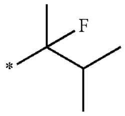

9-710

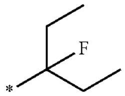

The "group represented by one of Formulae 10-1 to 10-132 in which at least one hydrogen is substituted with deuterium" and "the group represented by one of Formulae 10-201 to 10-353 in which at least one hydrogen is substituted with deuterium" may be, for example, a group represented by one of Formulae 10-501 to 10-553:

10-501
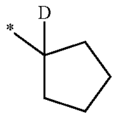
10-502
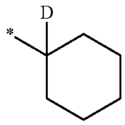
10-503
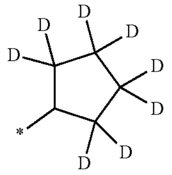
10-504
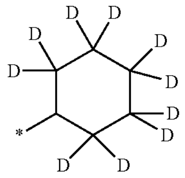
10-505
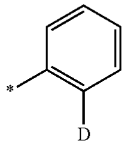
10-506
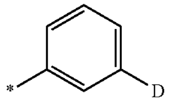
10-507
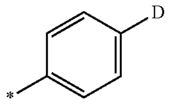
10-508
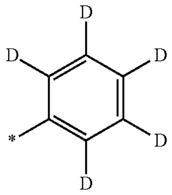
10-509
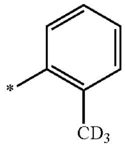
10-510
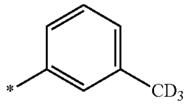
10-511
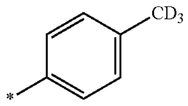
-continued
10-512
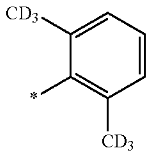
10-513
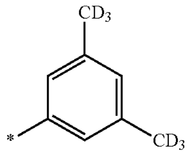
10-514
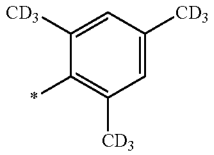
10-515
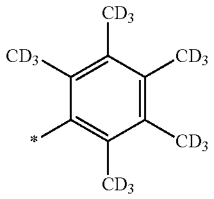
10-516
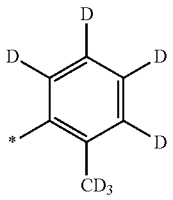
10-517
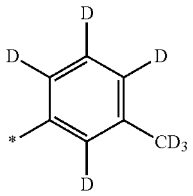
10-518
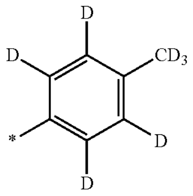
10-519
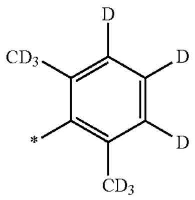

-continued
10-520
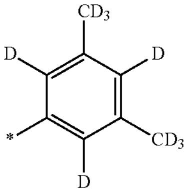
10-521
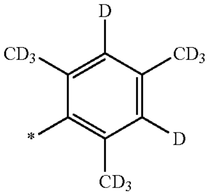
10-522
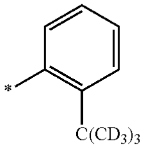
10-523
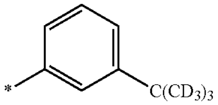
10-524
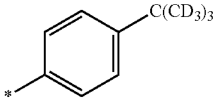
10-525
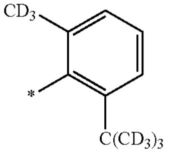
10-526
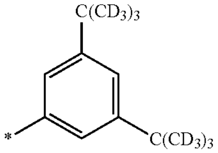
10-527
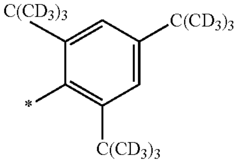
10-528
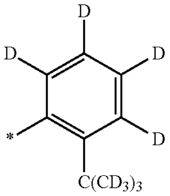
-continued
10-529
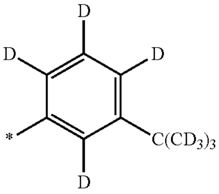
10-530
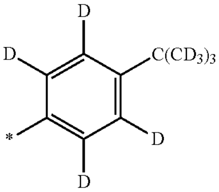
10-531
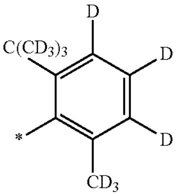
10-532
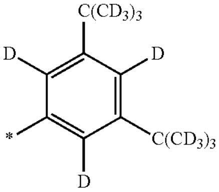
10-533
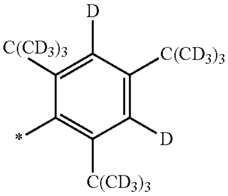
10-534
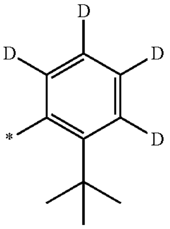
10-535
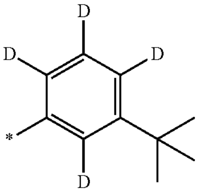

-continued
10-536
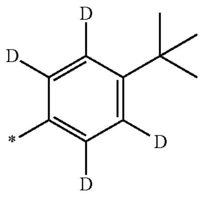
10-537
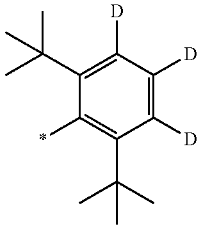
10-538
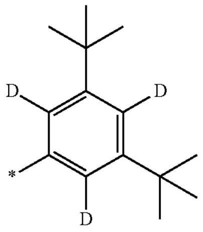
10-540
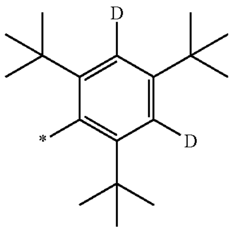
10-541
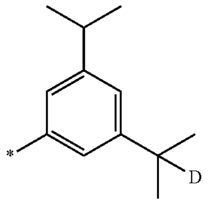
10-542
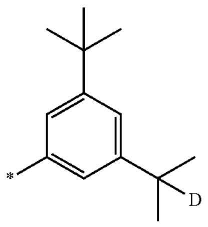
10-543
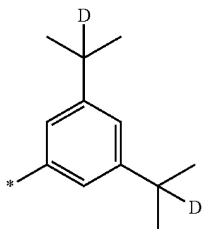
-continued
10-544
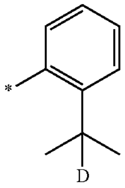
10-545
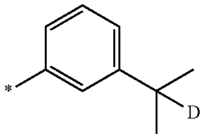
10-546
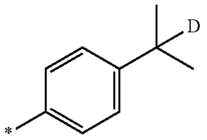
10-547
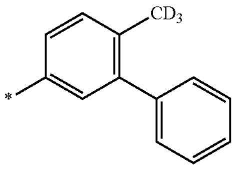
10-548
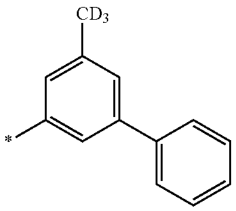
10-549
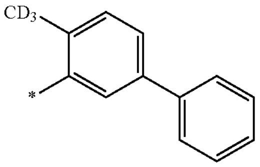
10-550
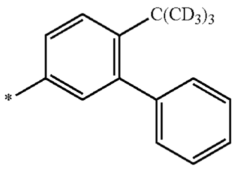
10-551
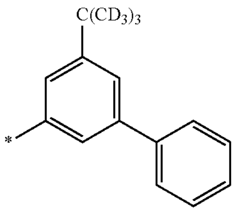
10-552
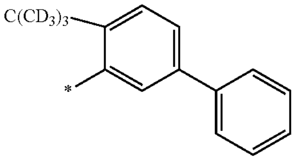

-continued
10-553
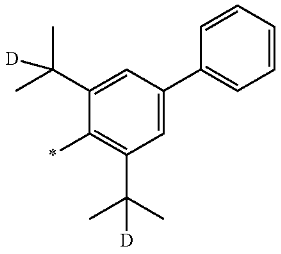
The “group represented by one of Formulae 10-1 to 10-132 in which at least one hydrogen is substituted with —F” and the “group represented by one of Formulae 10-201 to 10-353 in which at least one hydrogen is substituted with —F” may be, for example, a group represented by one of Formulae 10-601 to 10-620:
10-601
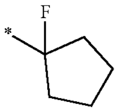
10-602
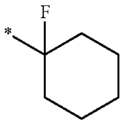
10-603
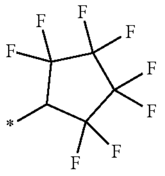
10-604
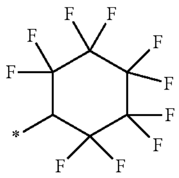
10-605
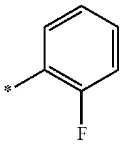
10-606
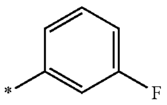
10-607
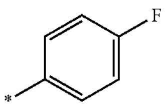
-continued
10-608
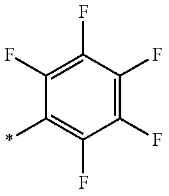
10-609
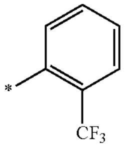
10-610
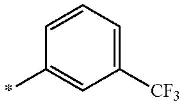
10-611
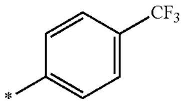
10-612
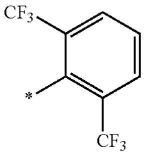
10-613
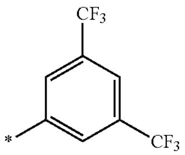
10-614
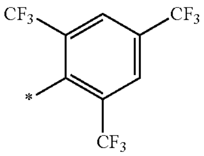
10-615
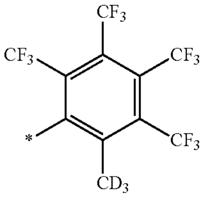
10-616
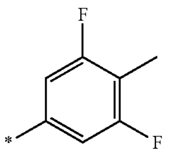
10-617
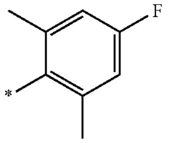

-continued

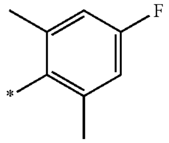

10-618

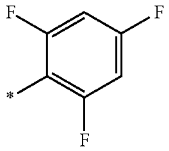

10-619

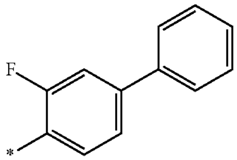

10-620

In relation to Formulae 2-1 and 2-2, i) two or more of $R_{21}$ to $R_{23}$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, ii) two or more of a plurality of $Z_1$(s) are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, iii) two or more of a plurality of $Z_2$(s) are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, iv) two or more of $Z_3$ to $Z_5$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$ (for example, see Compound 161, etc.), v) two or more of a plurality of $R_{14}$(s) are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, and vi) two or more of a plurality of $Z_1$, $Z_2$, and $R_{11}$ to $R_{14}$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

Two or more of $Z_3$ to $Z_5$ of Formula 3 are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$ (for example, a cyclopropane group, a cyclobutane group, a cyclopentane group, a cyclohexane group, or the like, each unsubstituted or substituted with at least one R 10*a*) (for example, see Compound 161, or the like).

$R_{10a}$ is as described in connection with $R_{14}$.

* and *' in Formulae 2-1 and 2-2 each indicates a binding site to M in Formula 1.

* in Formula 3 is a binding site to ring $CY_1$ in Formula 2-1.

In one or more embodiments, a group represented by

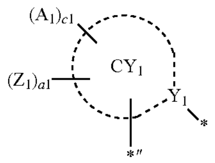

in Formula 2-1 may be a group represented by one of Formulae $CY_1$-1 to $CY_1$-10:

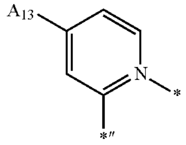

CY1-1

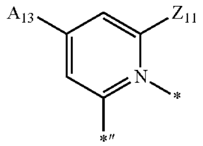

CY1-2

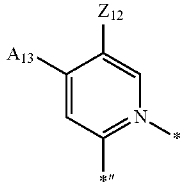

CY1-3

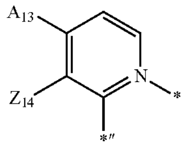

CY1-4

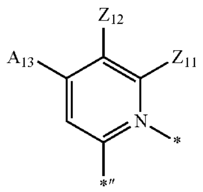

CY1-5

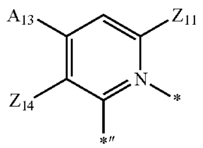

CY1-6

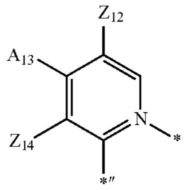

CY1-7

-continued

CY1-8

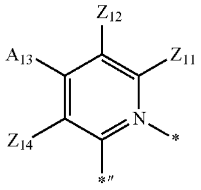

CY1-9

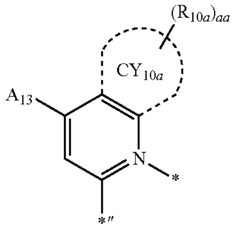

CY1-10

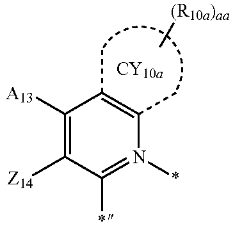

wherein, in Formulae CY1-1 to CY1-10, $Z_{11}$, $Z_{12}$ and $Z_{14}$ are as described in connection with $Z_1$, and each of $Z_{11}$, $Z_{12}$, and $Z_{14}$ may not be hydrogen, $A_{13}$ is as described in connection with $A_1$, ring $CY_{10a}$ may be a $C_5$-$C_{30}$ carbocyclic group or a $C_1$-$C_{30}$ heterocyclic group, $R_{10a}$ may be understood by referring to the description of $R_{10a}$ provided herein, aa may be an integer from 0 to 10,

* indicates a binding site to M in Formula 1, and

*" indicates a binding site to ring $CY_{21}$ in Formula 2-1.

In one or more embodiments, a group represented by

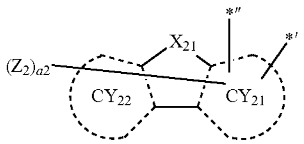

in Formula 2-1 may be a group represented by one of Formulae CY2-1 to CY2-6:

CY2-1

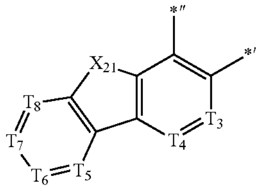

-continued

CY2-2

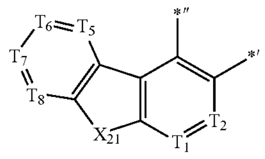

CY2-3

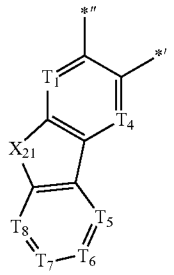

CY2-4

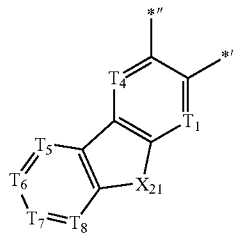

CY2-5

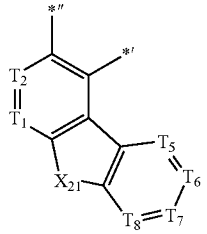

CY2-6

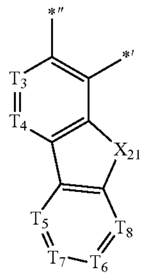

wherein, in Formulae CY2-1 to CY2-6, $T_1$ to $T_8$ may each independently be C or N, $X_{21}$ is as described in the present specification,

*" indicates a binding site to ring $CY_1$ in Formula 2-1, and

*' indicates a binding site to M in Formula 1.

For example, a) $T_1$ to $T_8$ of Formulae CY2-1 to CY2-6 may each be C, and/or b) at least one of $T_3$ to $T_8$ of Formulae CY2-1 and CY2-6 (for example, one or two of $T_3$ to $T_8$) may be N, and/or c) at least one of $T_1$, $T_2$ and $T_5$ to $T_8$ of Formulae CY2-2 and CY2-5 (for example, one or two of $T_1$, $T_2$, and $T_5$ to $T_8$) may be N, and/or d) at least one of $T_1$ and $T_4$ to $T_8$ of Formulae CY2-3 and CY2-4 (for example, one or two of $T_1$ and $T_4$ to $T_8$) may be N.

In one or more embodiments,

1) $T_1$ to $T_8$ in Formulae CY2-1 to CY2-6 may be C;

2) in relation to Formula CY2-1, one of $T_3$ to $T_8$ may be N, and the others of $T_3$ to $T_8$ which are not N, may be C;

3) in relation to Formula CY2-1, $T_3$ and $T_8$ may be N, and $T_4$ to $T_7$ may each be C;

4) in relation to Formula CY2-1, $T_6$ and $T_8$ may be N, and $T_3$ to $T_5$ and $T_7$ may each be C;

5) in relation to Formula CY2-2, one of $T_1$, $T_2$ and $T_8$ may be N, and the others of $T_1$, $T_2$ and $T_5$ to $T_8$ which are not N, may be C;

6) in relation to Formula CY2-2, $T_1$ and $T_8$ may be N, and $T_2$ and $T_5$ to $T_7$ may each be C;

7) in relation to Formula CY2-2, $T_2$ and $T_8$ may each be N, and each of $T_1$ and $T_5$ to $T_7$ may be C;

8) in relation to Formulae CY2-3 and CY2-4, one of $T_1$, $T_4$ and $T_8$ may be N, and the others of $T_1$, $T_4$ and $T_5$ to $T_8$, which are not N, may be C;

9) in relation to Formulae CY2-3 and CY2-4, $T_1$ and $T_8$ may be N, and $T_4$ and $T_5$ to $T_7$ may be C;

10) in relation to Formula CY2-3 and CY2-4, $T_4$ and $T_8$ may be N, and $T_1$ and $T_5$ to $T_7$ may each be C;

11) in relation to Formula CY2-5, one of $T_1$ and $T_8$ may be N, and the others of $T_1$, $T_2$ and $T_5$ to $T_8$ which are not N, may be C;

12) in relation to Formula CY2-5, $T_1$ and $T_8$ may be N, and $T_2$ and $T_5$ to $T_7$ may each be C;

13) in relation to Formula CY2-6, one of $T_4$ and $T_8$ may be N, and the others of $T_3$ to $T_8$ which are not N, may be C; or 14) in relation to Formula CY2-6, $T_4$ and $T_8$ may each be N, and $T_3$ and $T_5$ to $T_7$ may each be C.

In one or more embodiments, a group represented by

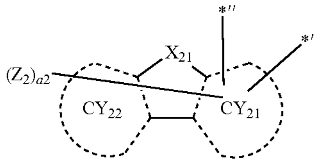

in Formula 2-1 may be a group represented by one of Formulae CY2-1001 to CY2-1141, CY2-2001 to CY2-2092, CY2-3001 to CY2-3092, CY2-4001 to CY2-4092, CY2-5001 to CY2-5065, or CY2-6001 to CY2-6065:

CY2-1001

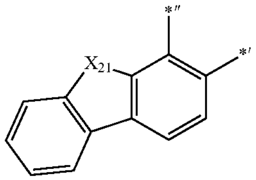

CY2-1002

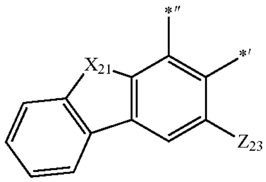

-continued

CY2-1003

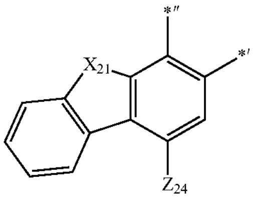

CY2-1004

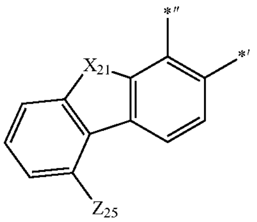

CY2-1005

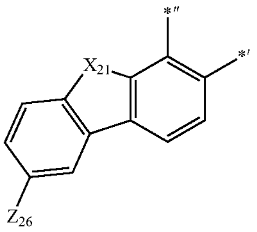

CY2-1006

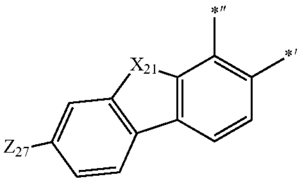

CY2-1007

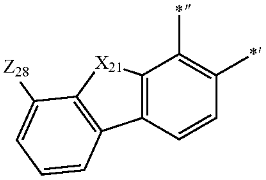

CY2-1008

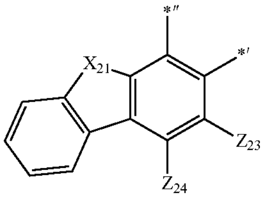

CY2-1009

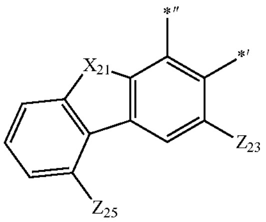

-continued
CY2-1010
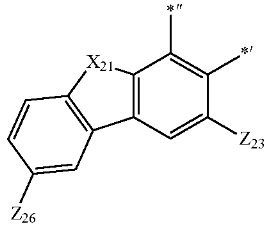
CY2-1011
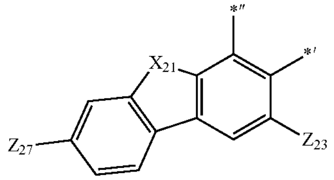
CY2-1012
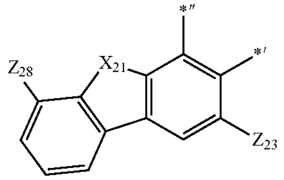
CY2-1013
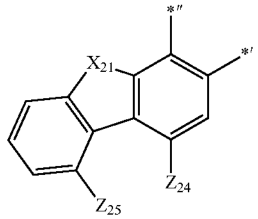
CY2-1014
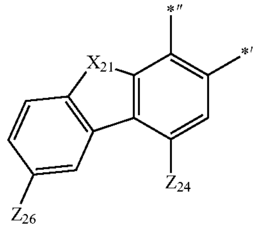
CY2-1015
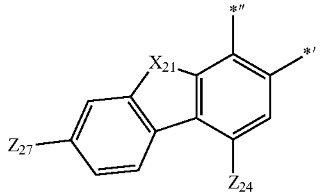
CY2-1016
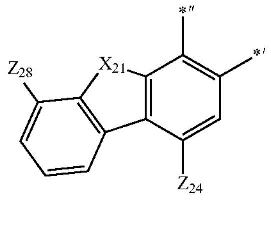
-continued
CY2-1017
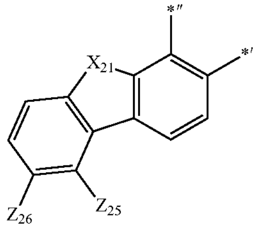
CY2-1018
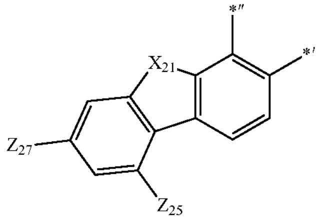
CY2-1019
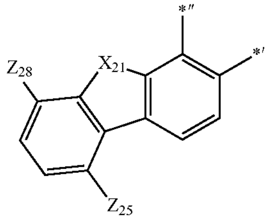
CY2-1020
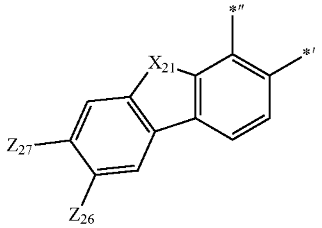
CY2-1021
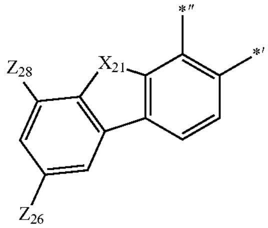
CY2-1022
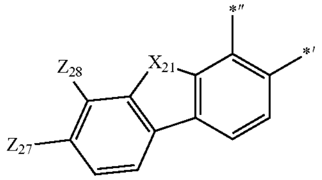
CY2-1023
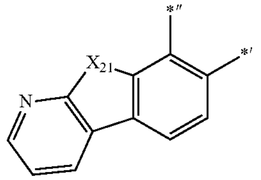

-continued
CY2-1024
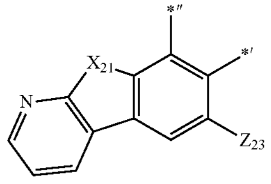
CY2-1025
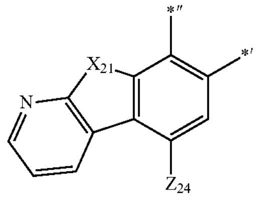
CY2-1026
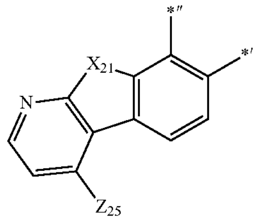
CY2-1027
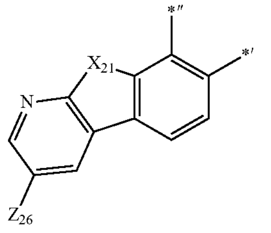
CY2-1028
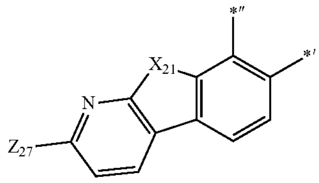
CY2-1029
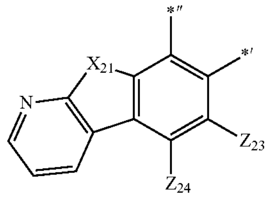
CY2-1030
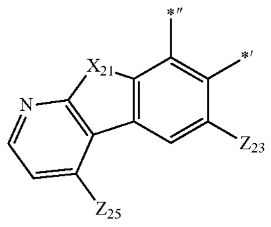
-continued
CY2-1031
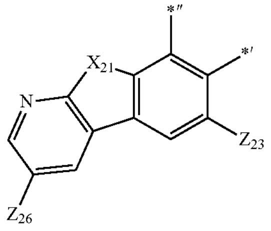
CY2-1032
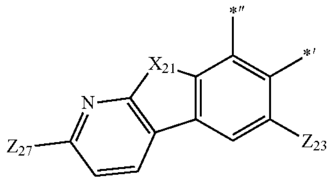
CY2-1033
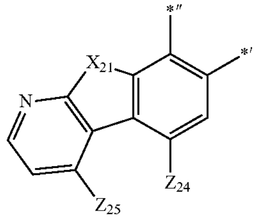
CY2-1034
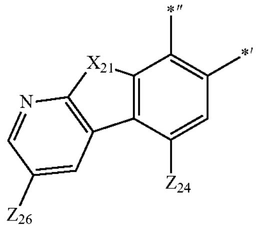
CY2-1035
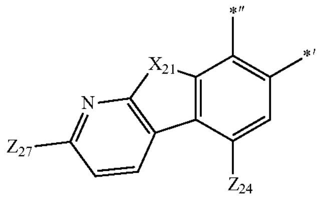
CY2-1036
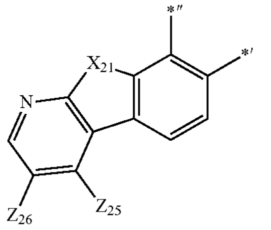
CY2-1037
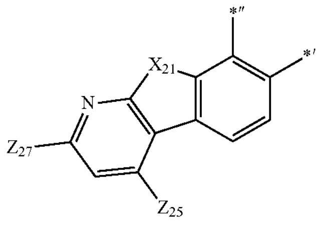

-continued
CY2-1038
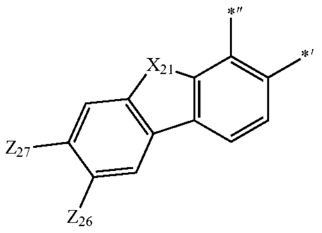
CY2-1039
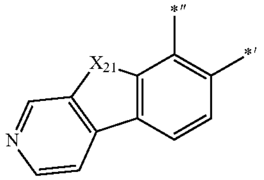
CY2-1040
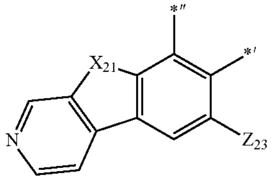
CY2-1041
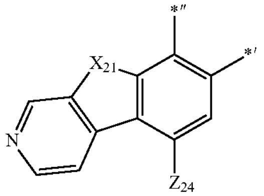
CY2-1042
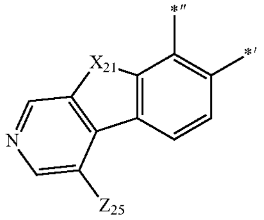
CY2-1043
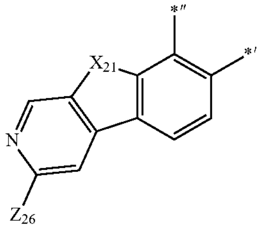
CY2-1044
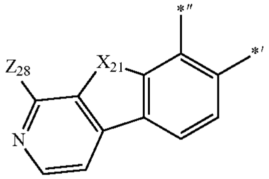
-continued
CY2-1045
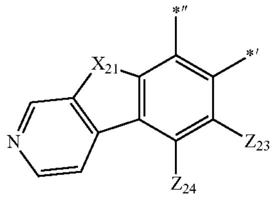
CY2-1046
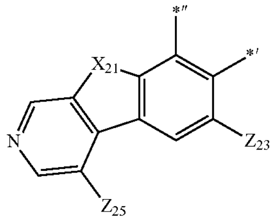
CY2-1047
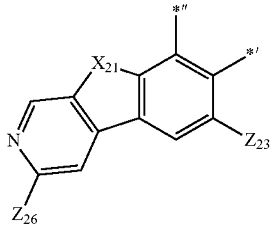
CY2-1048
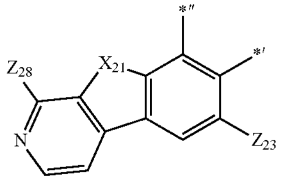
CY2-1049
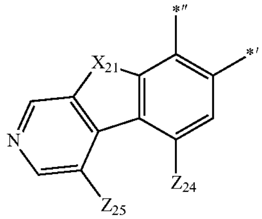
CY2-1050
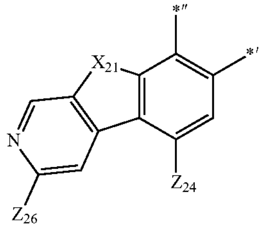
CY2-1051
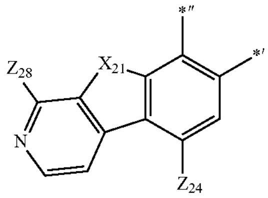

-continued
CY2-1052
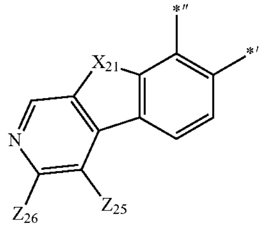
CY2-1053
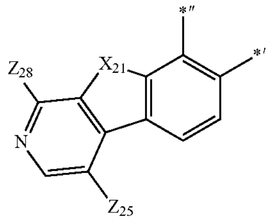
CY2-1054
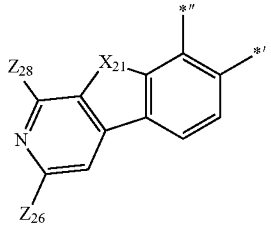
CY2-1055
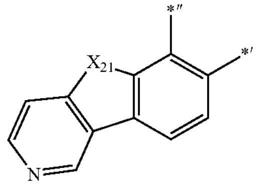
CY2-1056
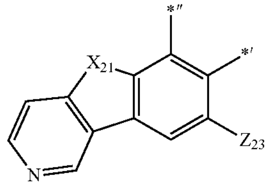
CY2-1057
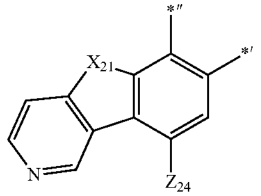
CY2-1058
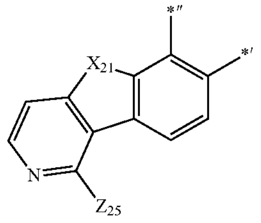
-continued
CY2-1059
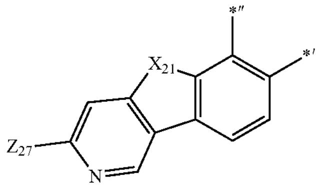
CY2-1060
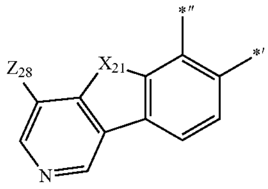
CY2-1061
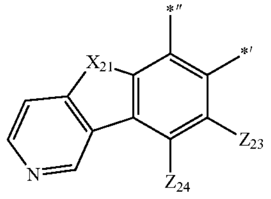
CY2-1062
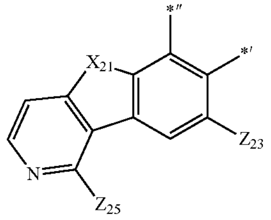
CY2-1063
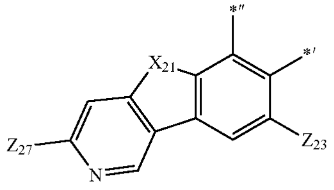
CY2-1064
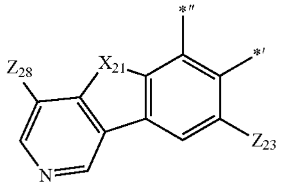
CY2-1065
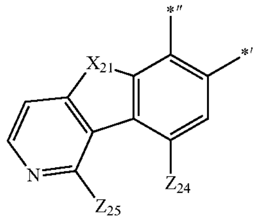

-continued
CY2-1066
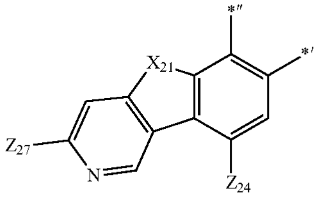
CY2-1067
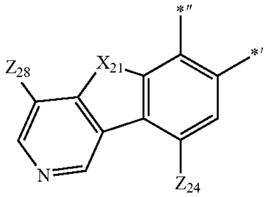
CY2-1068
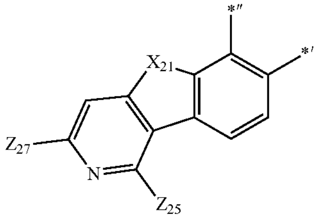
CY2-1069
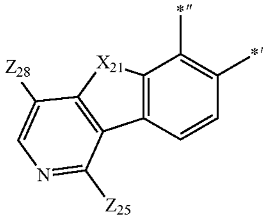
CY2-1070
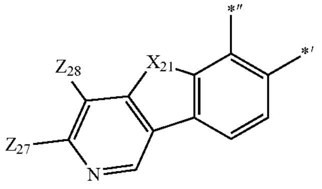
CY2-1071
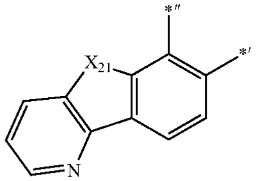
CY2-1072
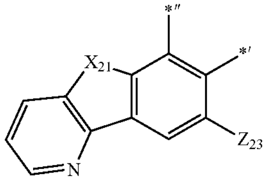
-continued
CY2-1073
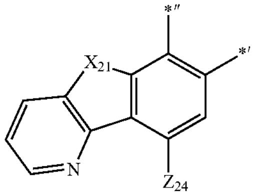
CY2-1074
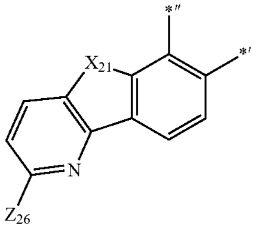
CY2-1075
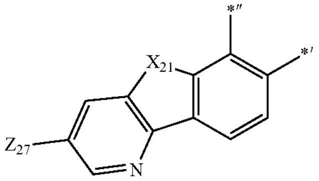
CY2-1076
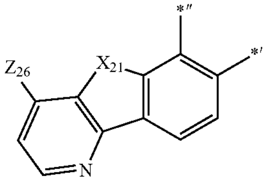
CY2-1077
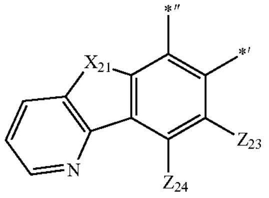
CY2-1078
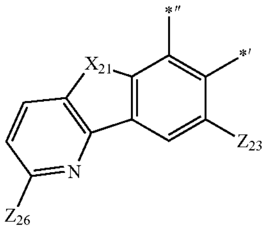
CY2-1079
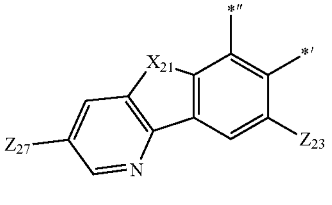

-continued
CY2-1080
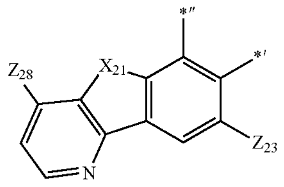
CY2-1081
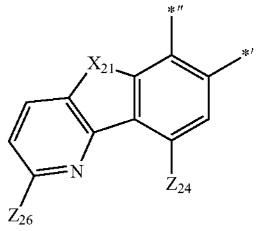
CY2-1082
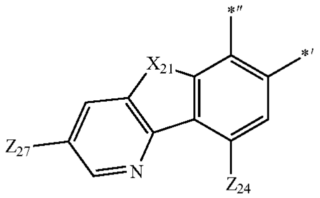
CY2-1083
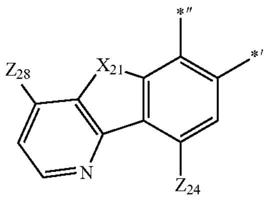
CY2-1084
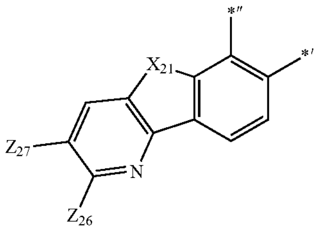
CY2-1085
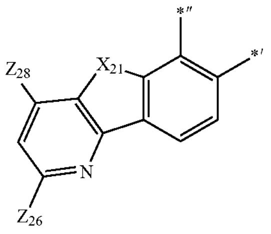
CY2-1086
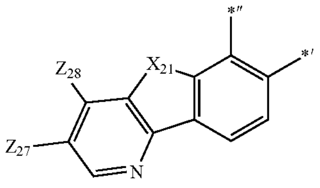
-continued
CY2-1087
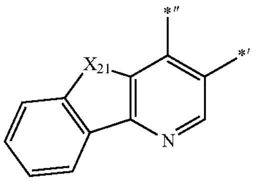
CY2-1088
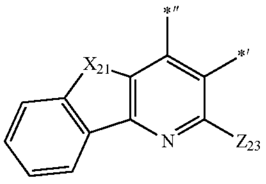
CY2-1089
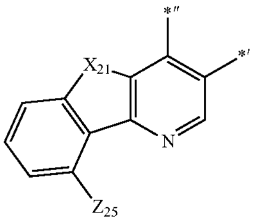
CY2-1090
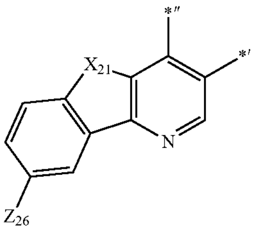
CY2-1091
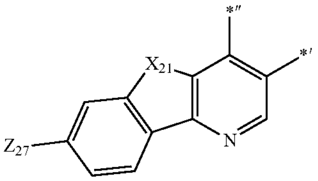
CY2-1092
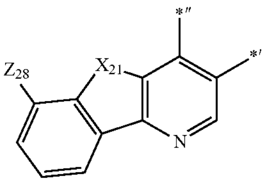
CY2-1093
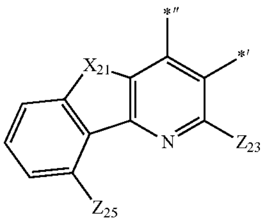

-continued
CY2-1094
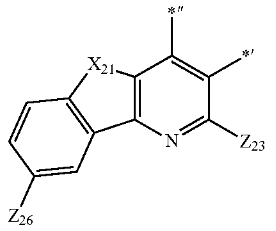
CY2-1095
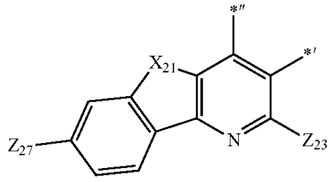
CY2-1096
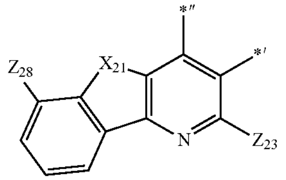
CY2-1097
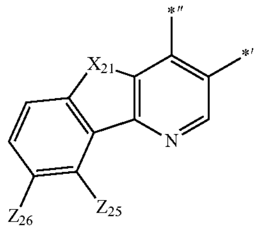
CY2-1098
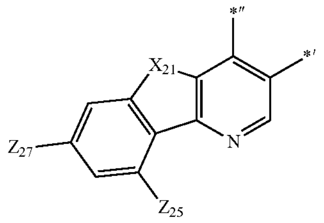
CY2-1099
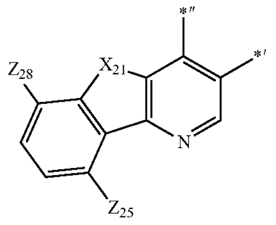
CY2-1100
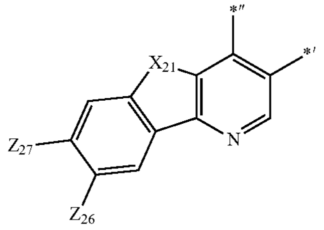
-continued
CY2-1101
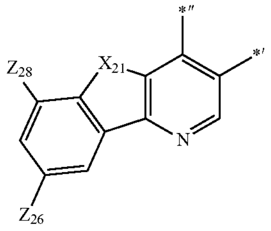
CY2-1102
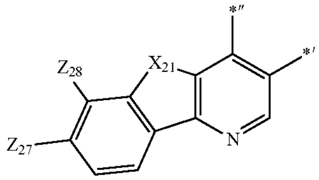
CY2-1103
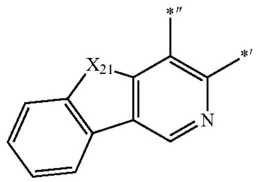
CY2-1104
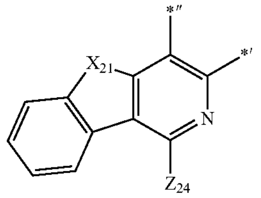
CY2-1105
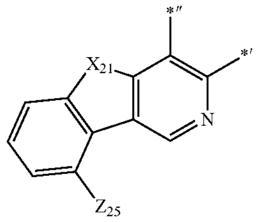
CY2-1106
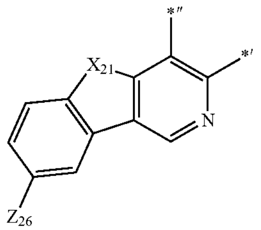
CY2-1107
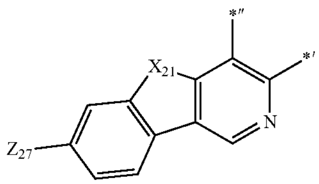

-continued
CY2-1108
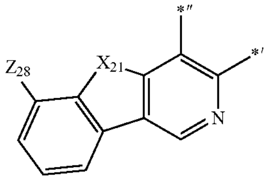
CY2-1109
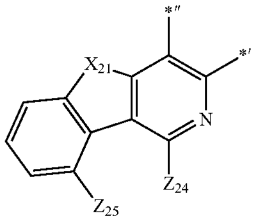
CY2-1110
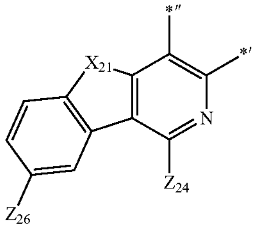
CY2-1111
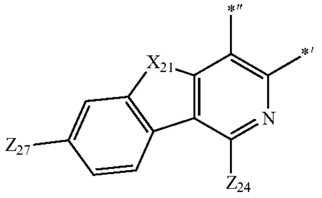
CY2-1112
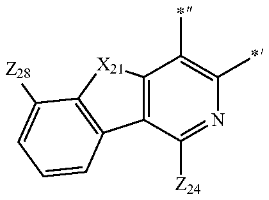
CY2-1113
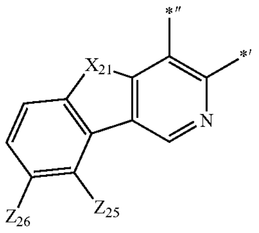
CY2-1114
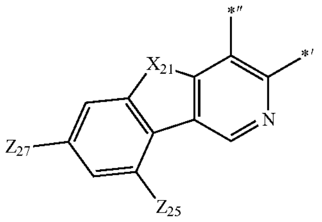
-continued
CY2-1115
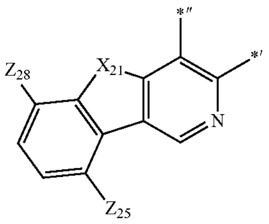
CY2-1116
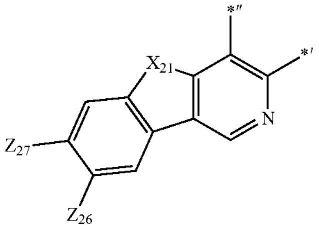
CY2-1117
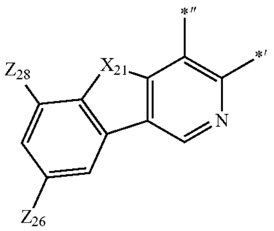
CY2-1118
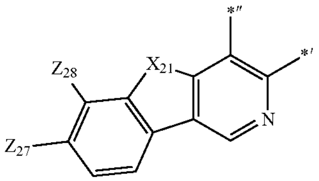
CY2-1119
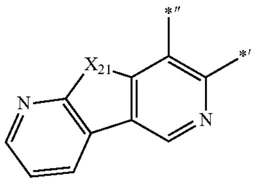
CY2-1120
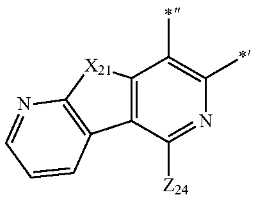
CY2-1121
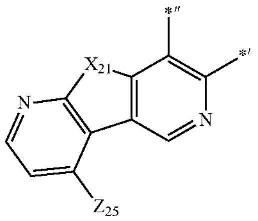

-continued
CY2-1122
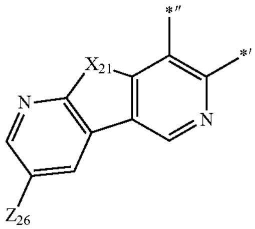
CY2-1123
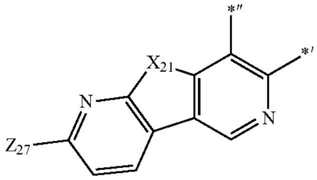
CY2-1124
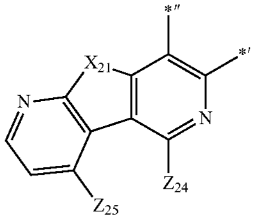
CY2-1125
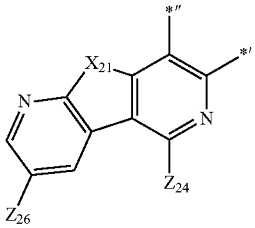
CY2-1126
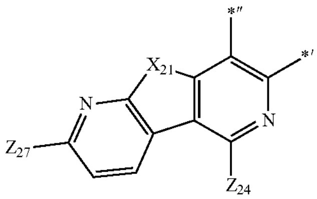
CY2-1127
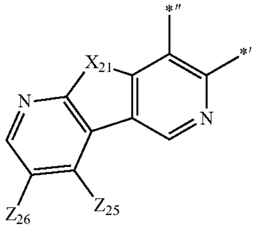
CY2-1128
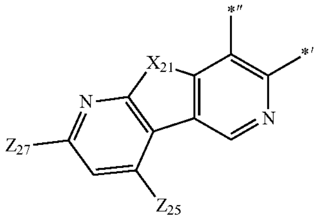
-continued
CY2-1129
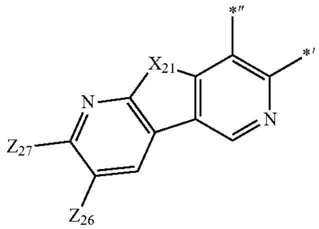
CY2-1130
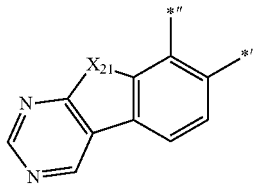
CY2-1131
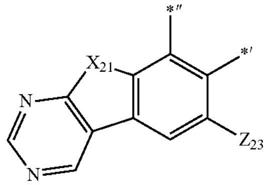
CY2-1132
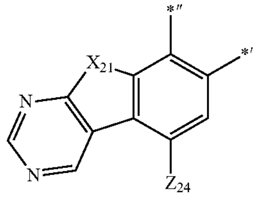
CY2-1133
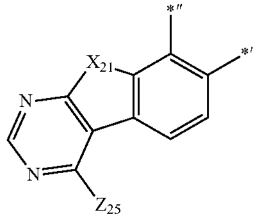
CY2-1134
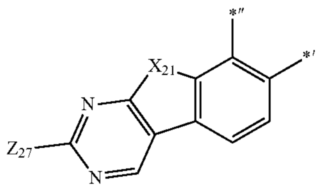
CY2-1135
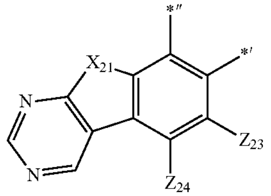

-continued
CY2-1136
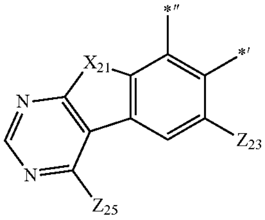
CY2-1137
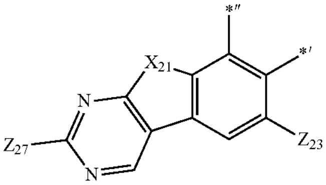
CY2-1138
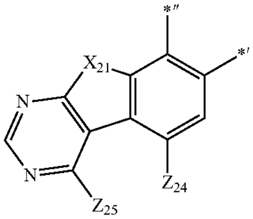
CY2-1139
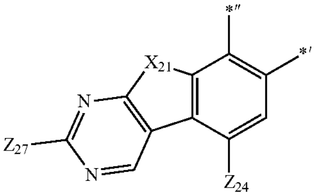
CY2-1140
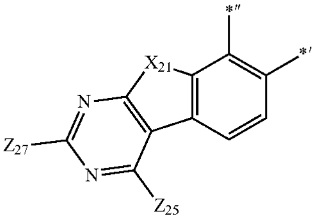
CY2-1141
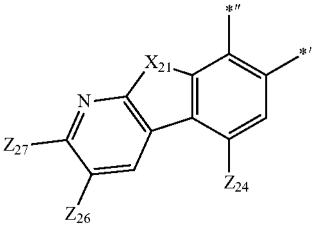
CY2-2001
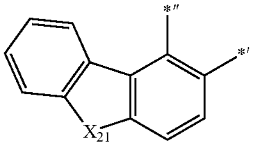
-continued
CY2-2002
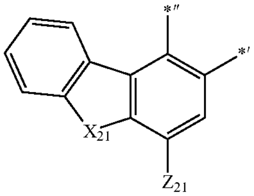
CY2-2003
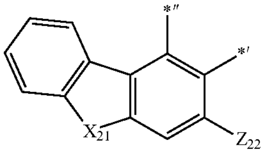
CY2-2004
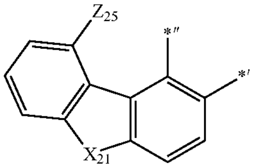
CY2-2005
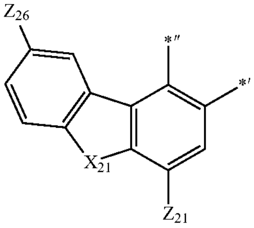
CY2-2006
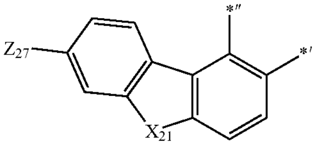
CY2-2207
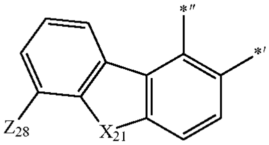
CY2-2008
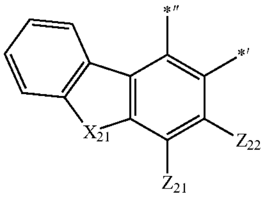
CY2-2009
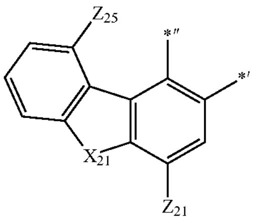

-continued
CY2-2010
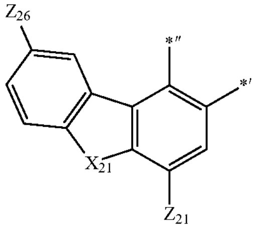
CY2-2011
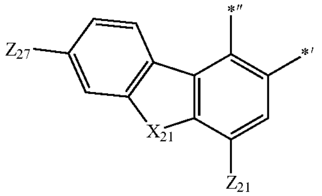
CY2-2012
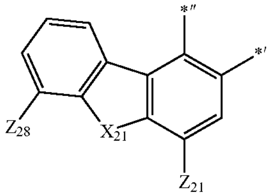
CY2-2013
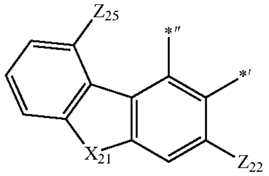
CY2-2014
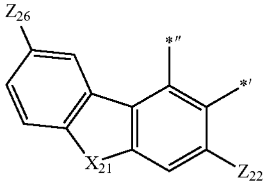
CY2-2015
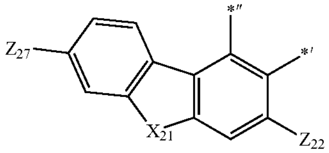
CY2-2016
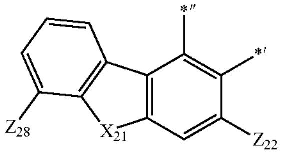
CY2-2017
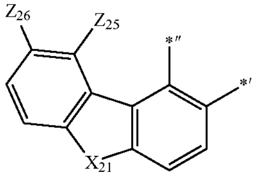
-continued
CY2-2018
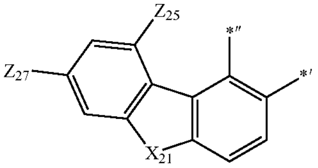
CY2-2019
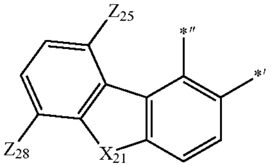
CY2-2020
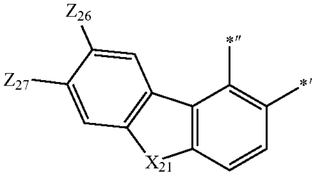
CY2-2021
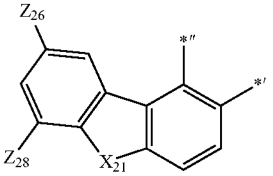
CY2-2022
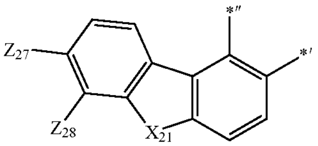
CY2-2023
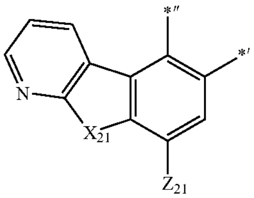
CY2-2024
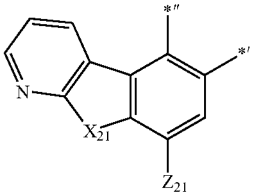
CY2-2025
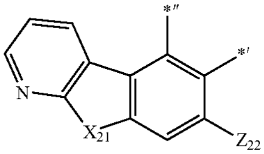

-continued
CY2-2026
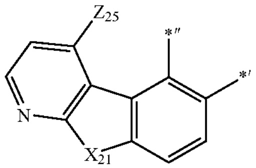
CY2-2027
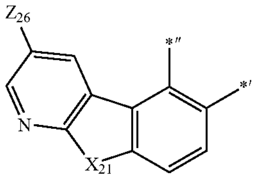
CY2-2028
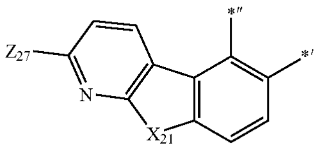
CY2-2029
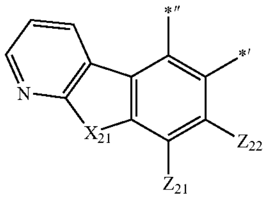
CY2-2030
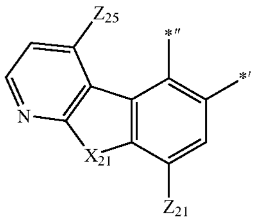
CY2-2031
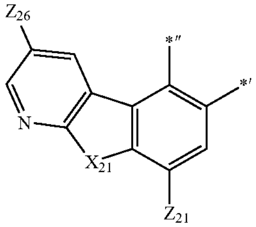
CY2-2032
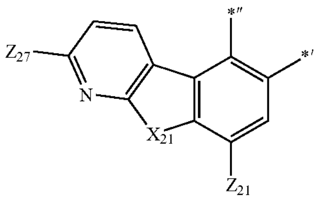
CY2-2033
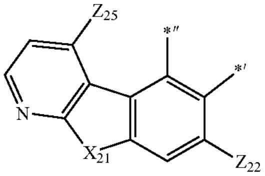
CY2-2034
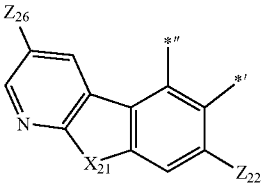
CY2-2035
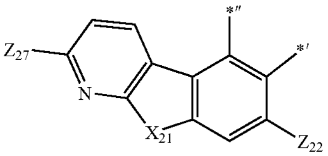
CY2-2036
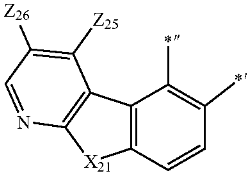
CY2-2037
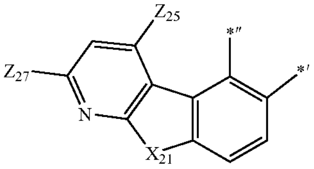
CY2-2038
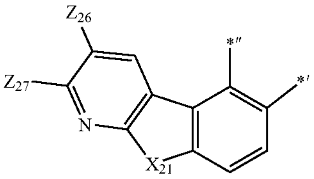
CY2-2039
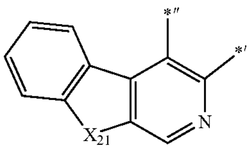
CY2-2040
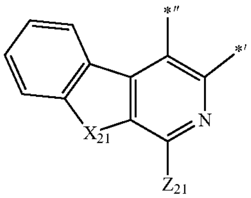

-continued
CY2-2041
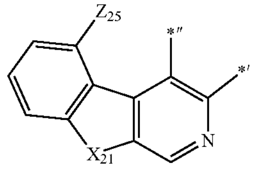
CY2-2042
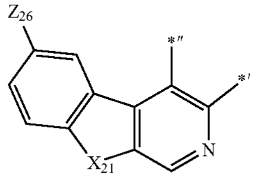
CY2-2043
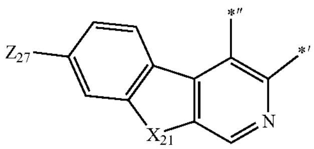
CY2-2044
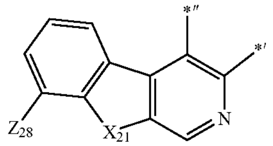
CY2-2045
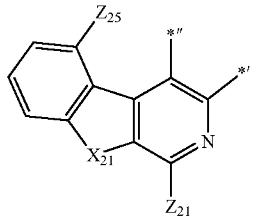
CY2-2046
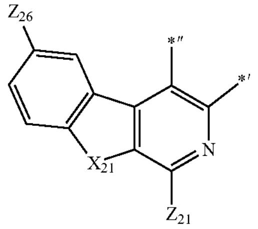
CY2-2047
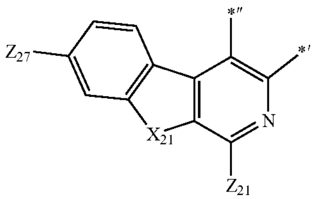
CY2-2048
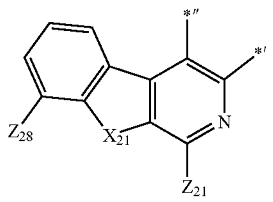
-continued
CY2-2049
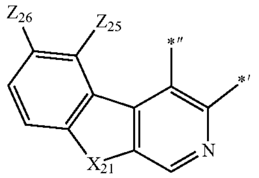
CY2-2050
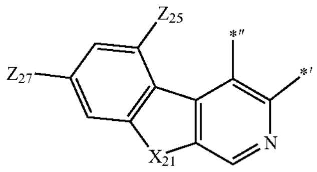
CY2-2051
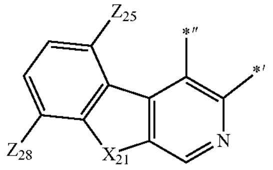
CY2-2052
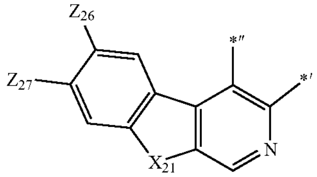
CY2-2053
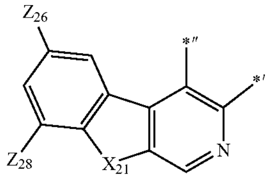
CY2-2054
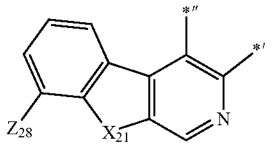
CY2-2055
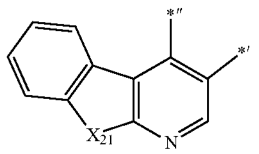
CY2-2056
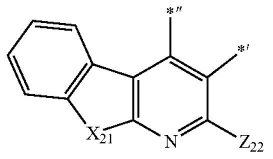
CY2-2057
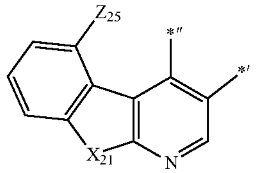

-continued
CY2-2058
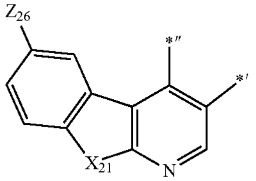
CY2-2059
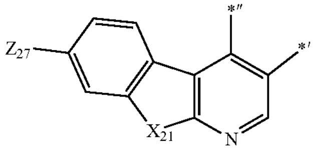
CY2-2060
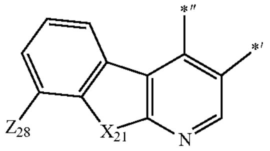
CY2-2061
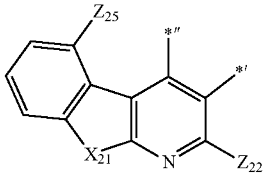
CY2-2062
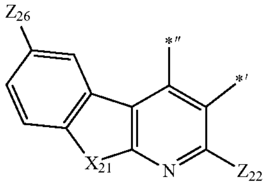
CY2-2063
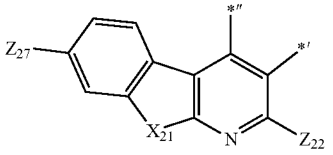
CY2-2064
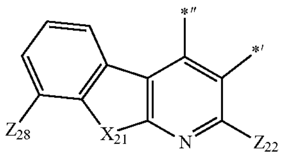
CY2-2065
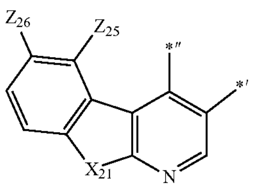
CY2-2066
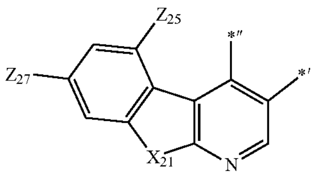
-continued
CY2-2067
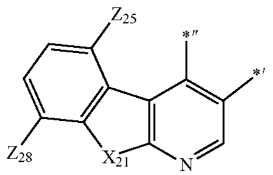
CY2-2068
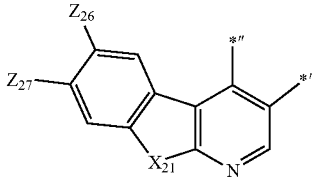
CY2-2069
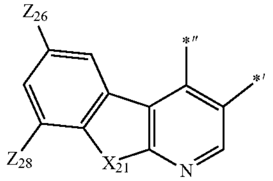
CY2-2070
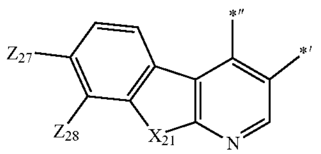
CY2-2071
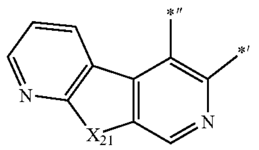
CY2-2072
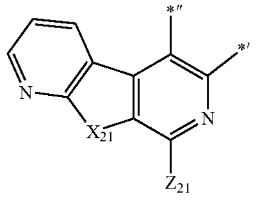
CY2-2073
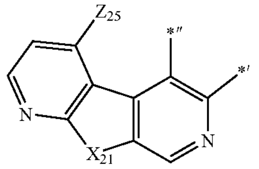
CY2-2074
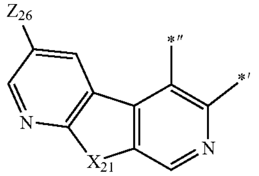
CY2-2075
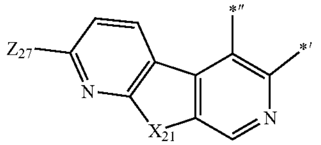

-continued
CY2-2076
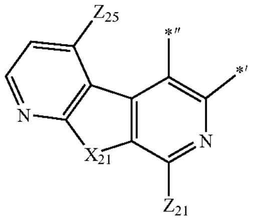
CY2-2077
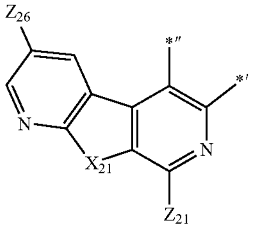
CYS-2078
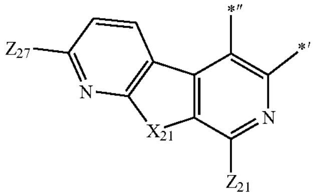
CY2-2079
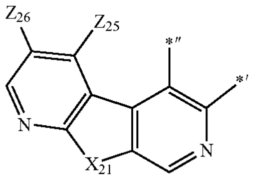
CY2-2080
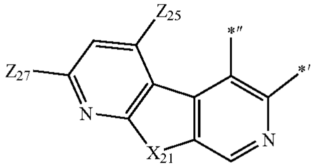
CY2-2081
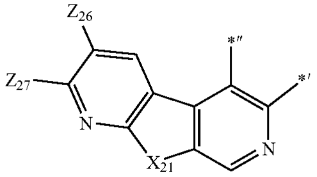
CY2-2082
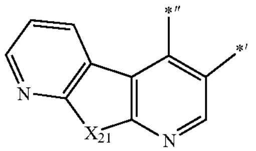
CY2-2083
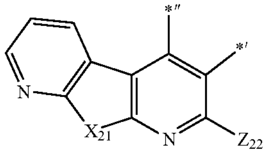
-continued
CY2-2084
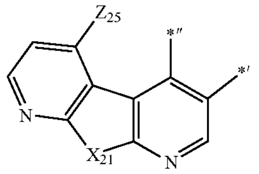
CY2-2085
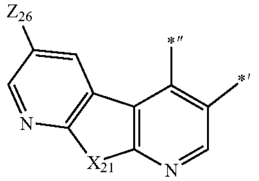
CY2-2086
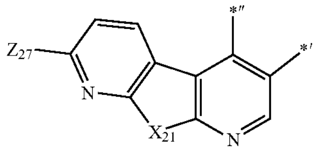
CY2-2087
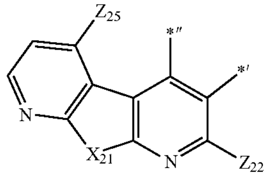
CY2-2088
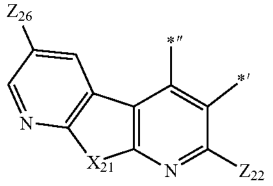
CY2-2089
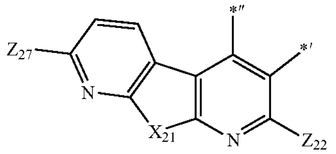
CY2-2090
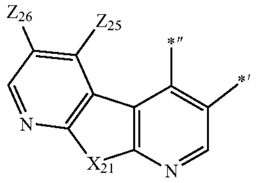
CY2-2091
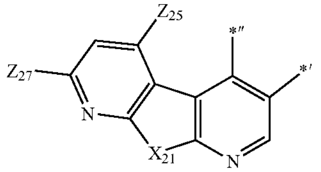

-continued
CY2-2092
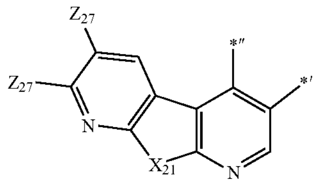
CY2-3001
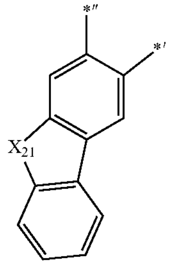
CY2-3002
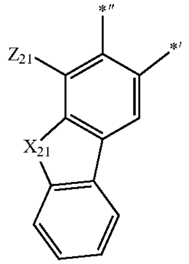
CY2-3003
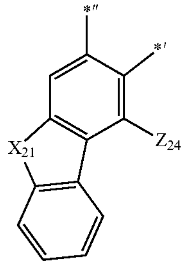
CY2-3004
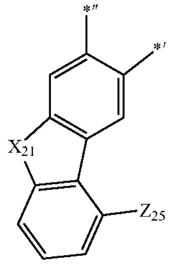
CY2-3005
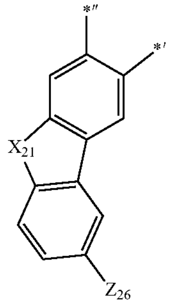
-continued
CY2-3006
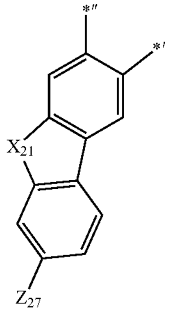
CY2-3007
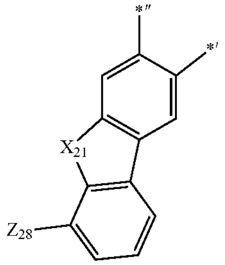
CY2-3008
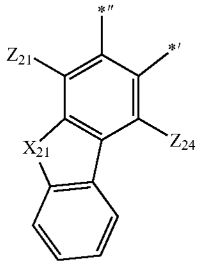
CY2-3009
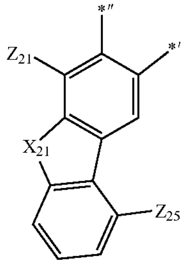
CY2-3010
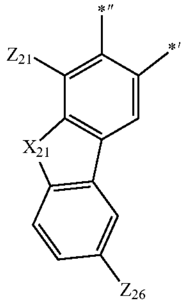

-continued
CY2-3011
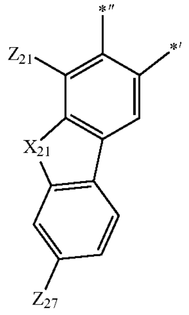
CY2-3012
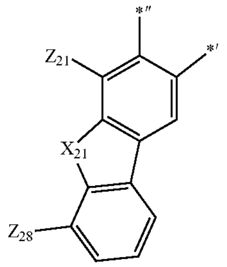
CY2-3013
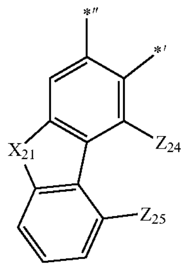
CY2-3014
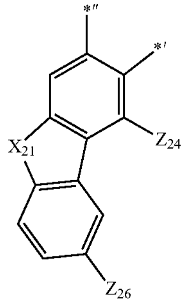
CY2-3015
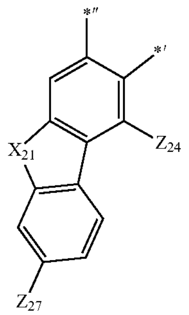
-continued
CY2-3016
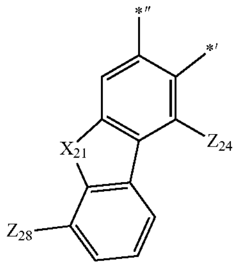
CY2-3017
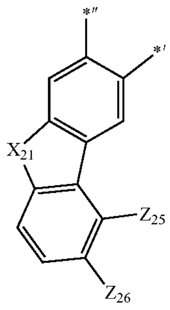
CY2-3018
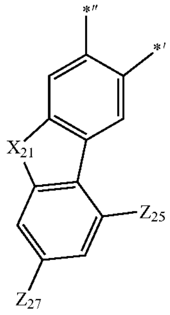
CY2-3019
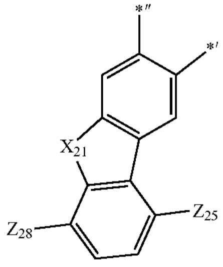
CY2-3020
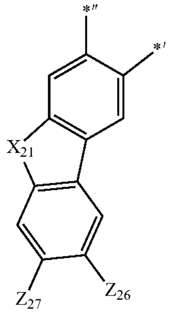

-continued
CY2-3021
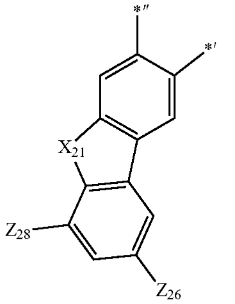
CY2-3022
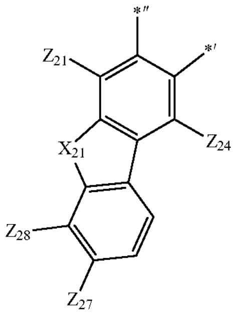
CY2-3023
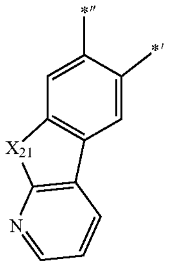
CY2-3024
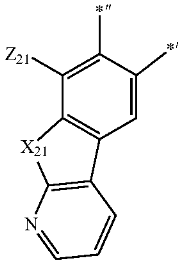
CY2-3025
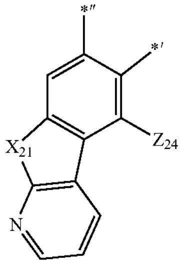
-continued
CY2-3026
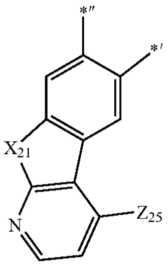
CY2-3027
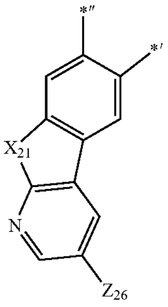
CY2-3028
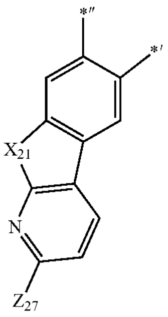
CY2-3029
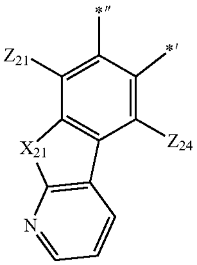
CY2-3030
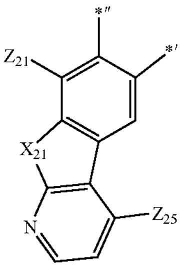

-continued
CY2-3031
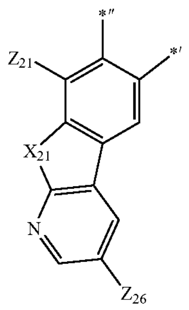
CY2-3032
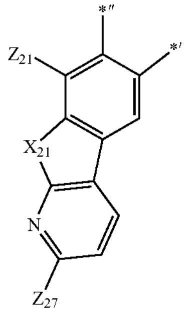
CY2-3033
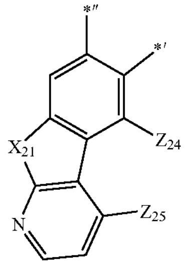
CY2-3034
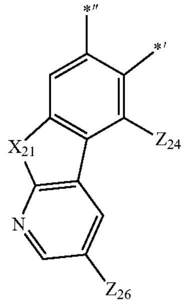
CY2-3035
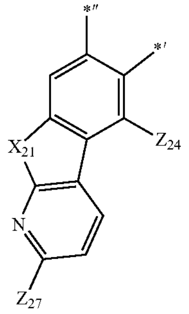
-continued
CY2-3036
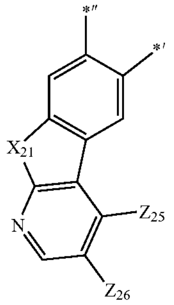
CY2-3037
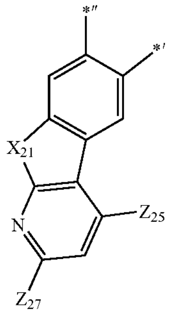
CY2-3038
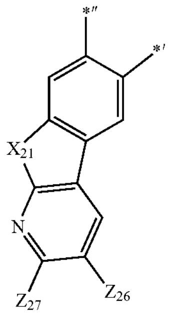
CY2-3039
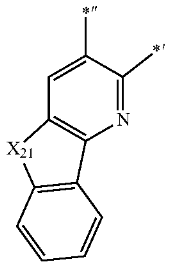
CY2-3040
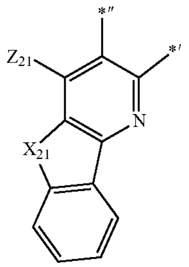

-continued
CY2-3041
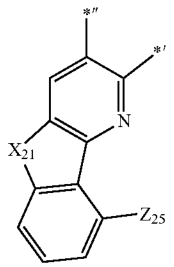
CY2-3042
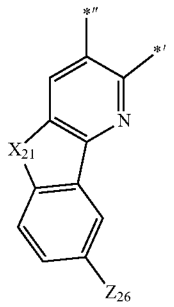
CY2-3043
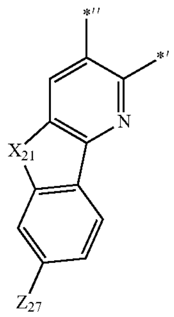
CY2-3044
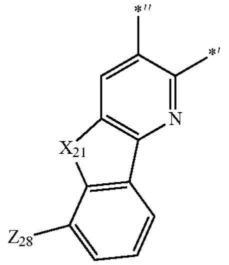
CY2-3045
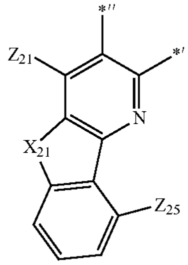
-continued
CY2-3046
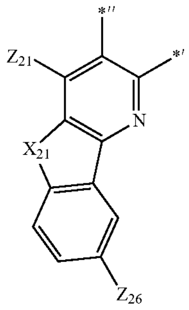
CY2-3047
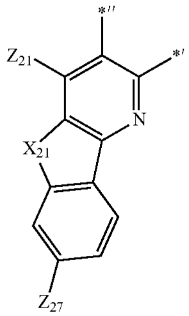
CY2-3048
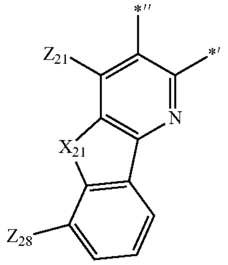
CY-3049
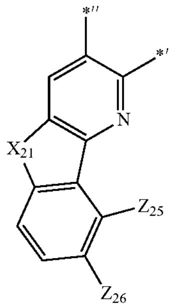
CY2-3050
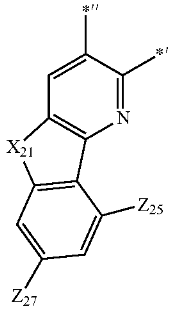

-continued
CY2-3051
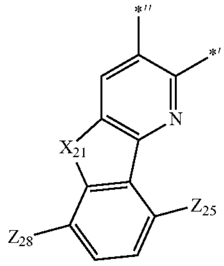
CY2-3052
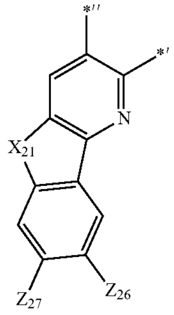
CY2-3053
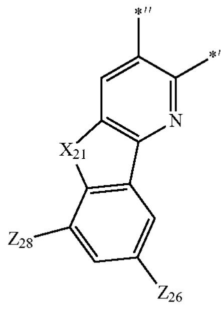
CY2-3054
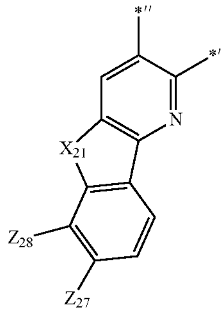
CY2-3055
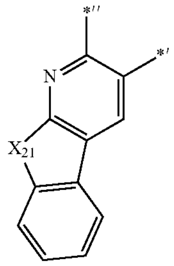
-continued
CY2-3056
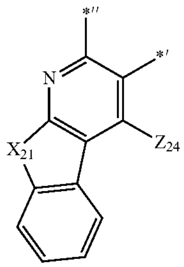
CY2-3057
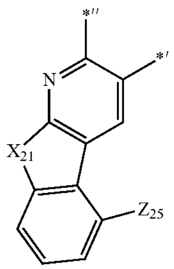
CY2-3058
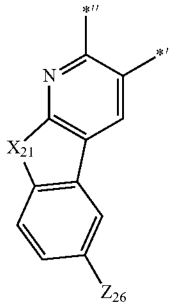
CY2-3059
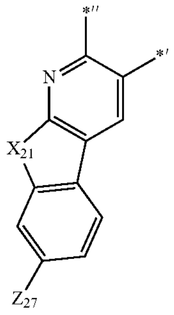
CY2-3060
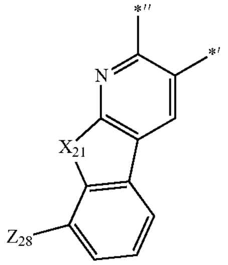

-continued
CY2-3061
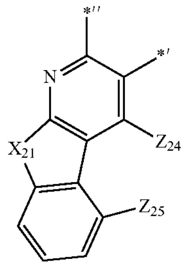
CY2-3062
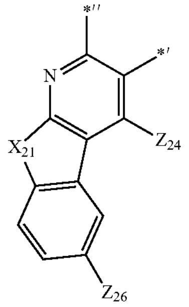
CY2-3063
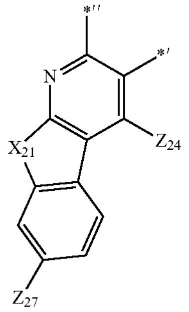
CY2-3064
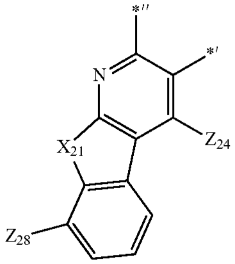
CY2-3065
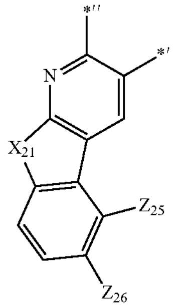
-continued
CY2-3066
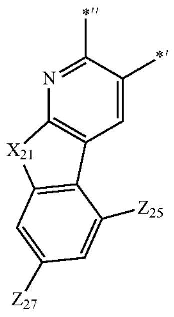
CY2-3067
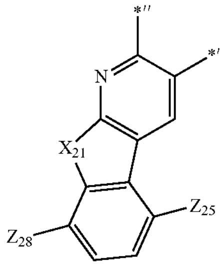
CY2-3068
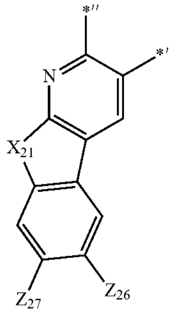
CY2-3069
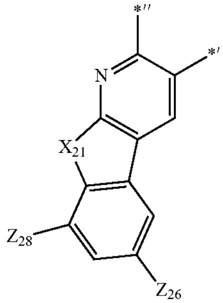
CY2-3070
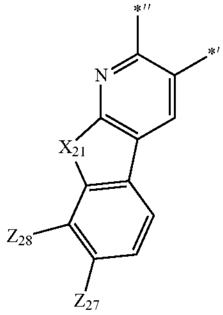

-continued
CY2-3071
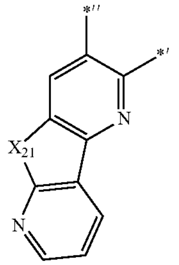
CY2-3072
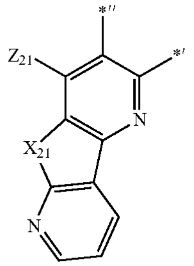
CY2-3073
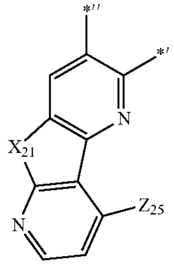
CY2-3074
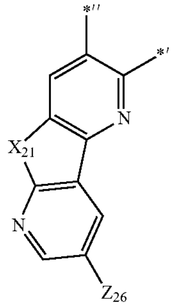
CY2-3075
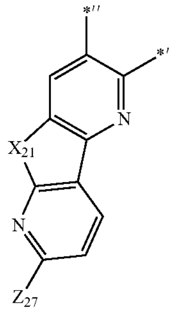
-continued
CY2-3076
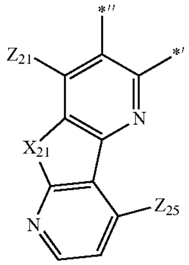
CY2-3077
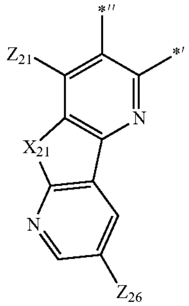
CY2-3078
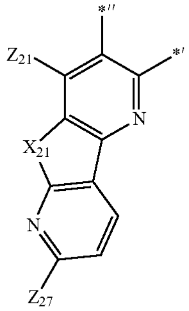
CY2-3079
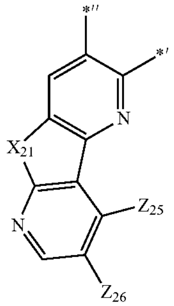
CY2-3080
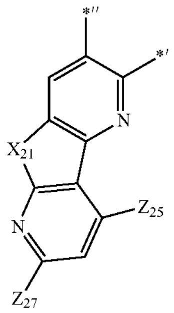

-continued
CY2-3081
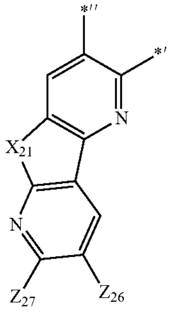
CY2-3082
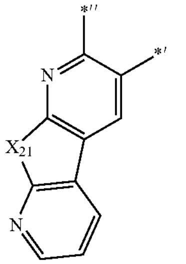
CY2-3083
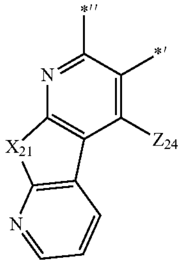
CY2-3084
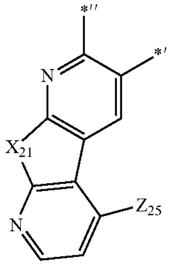
CY2-3085
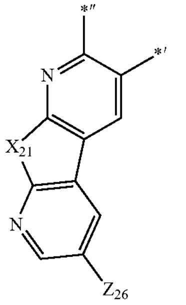
-continued
CY2-3086
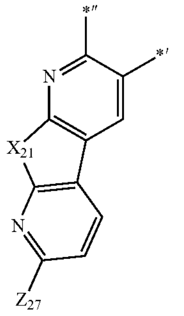
CY2-3087
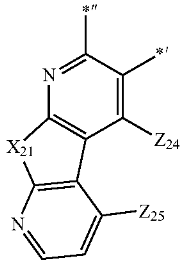
CY2-3088
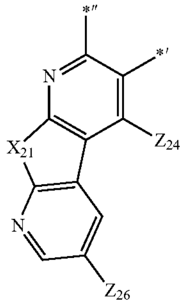
CY2-3089
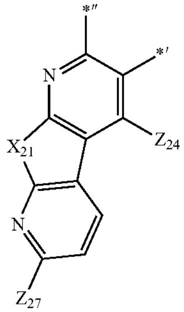
CY2-3090
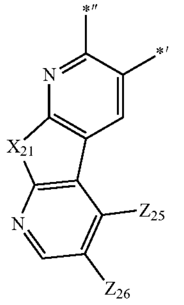

-continued
CY2-3091
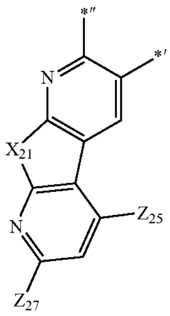
CY2-3092
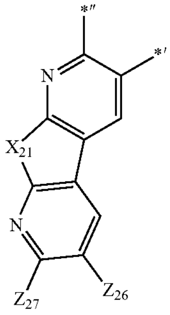
CY2-4001
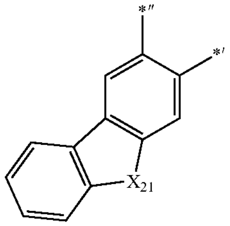
CY2-4002
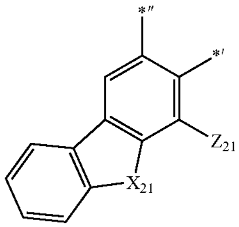
CY2-4003
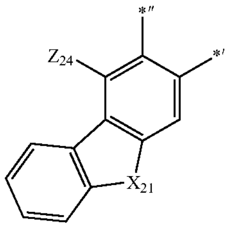
CY2-4004
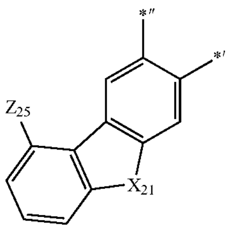
-continued
CY2-4005
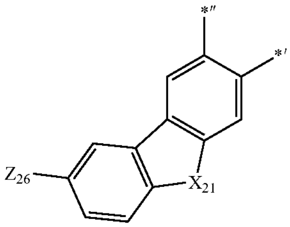
CY2-4006
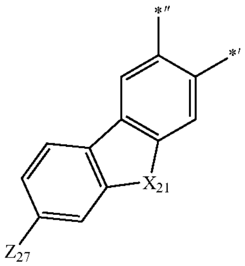
CY2-4007
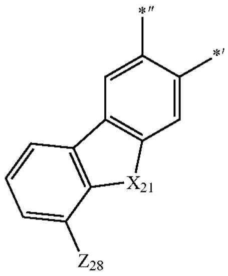
CY2-4008
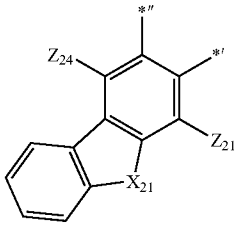
CY2-4009
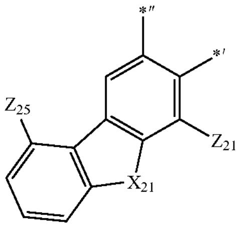
CY2-4010
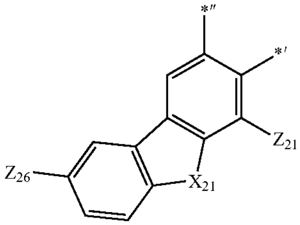

-continued
CY2-4011
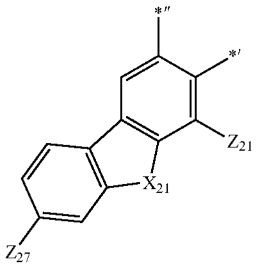
CY2-4012
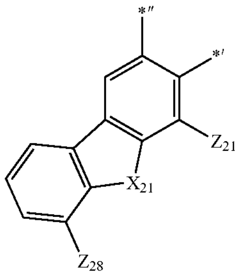
CY2-4013
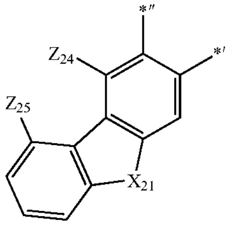
CY2-4014
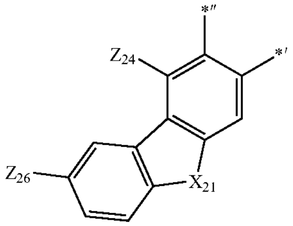
CY2-4015
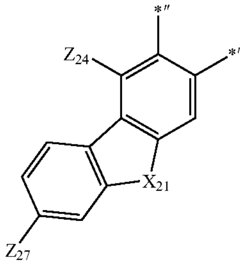
CY2-4016
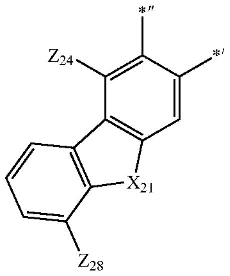
-continued
CY2-4017
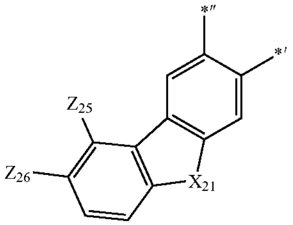
CY2-4018
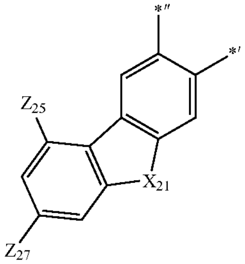
CY2-4019
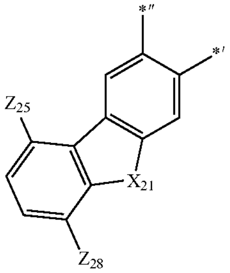
CY2-4020
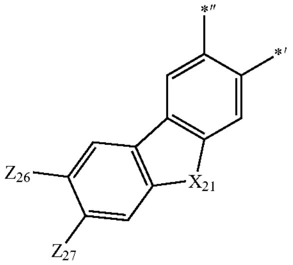
CY2-4021
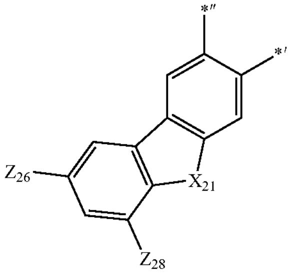
CY2-4022
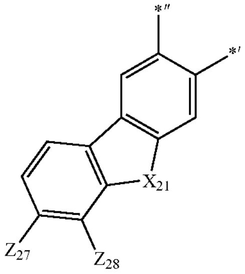

-continued
CY2-4023
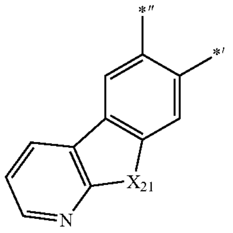
CY2-4024
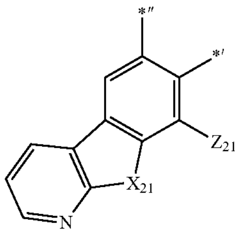
CY-4025
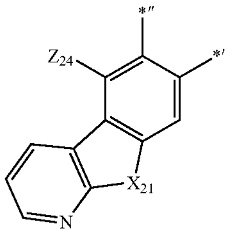
CY2-4026
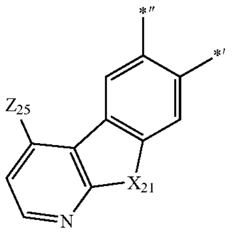
CY2-4027
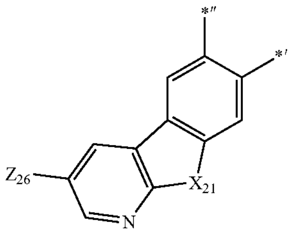
CY2-4028
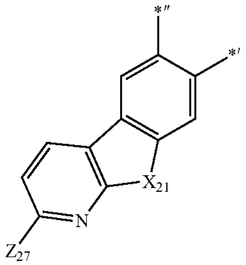
-continued
CY2-4029
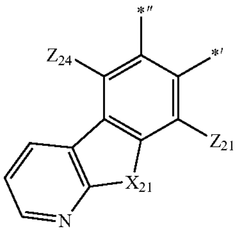
CY2-4030
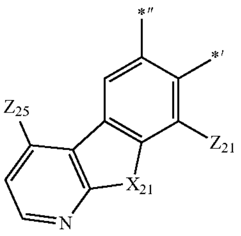
CY2-4031
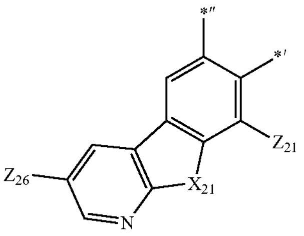
CY2-4032
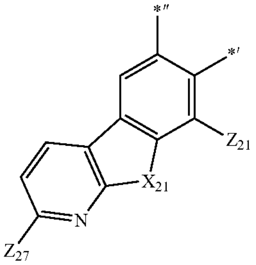
CY2-4033
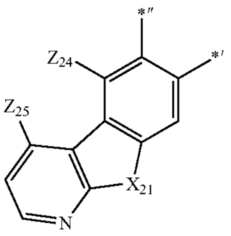
CY2-4034
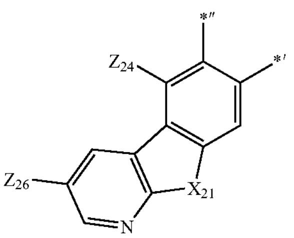

-continued
CY2-4035
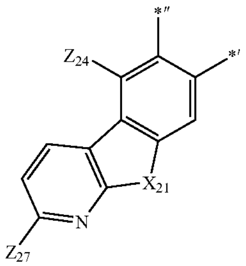
CY2-4036
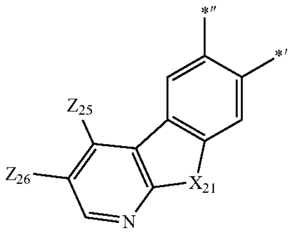
CY2-4037
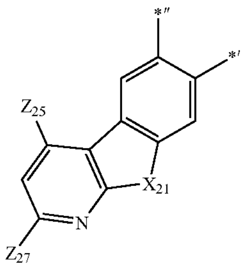
CY2-4038
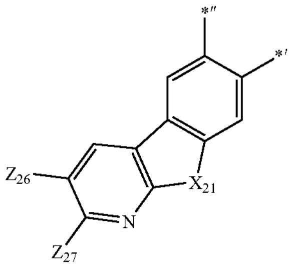
CY2-4039
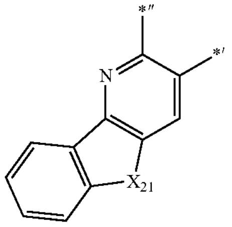
CY2-4040
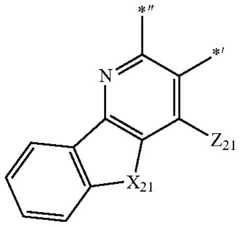
-continued
CY2-4041
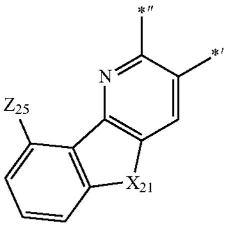
CY2-4042
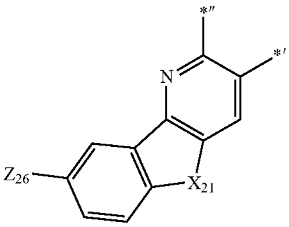
CY2-4043
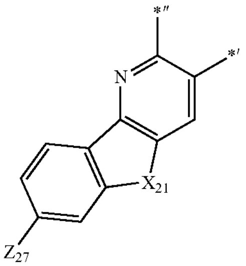
CY2-4044
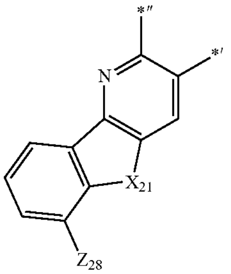
CY2-4045
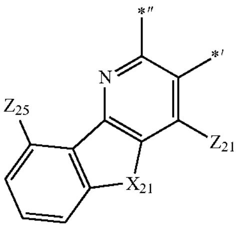
CY2-4046
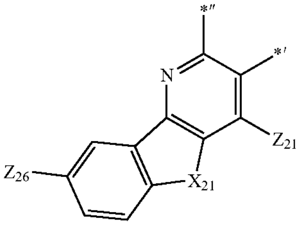

-continued
CY2-4047
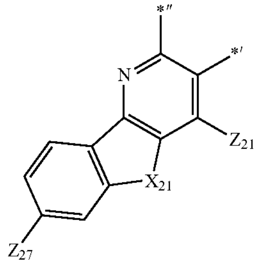
CY2-4048
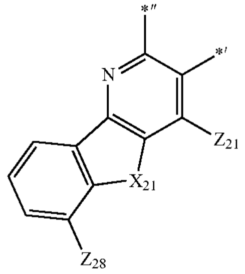
CY2-4049
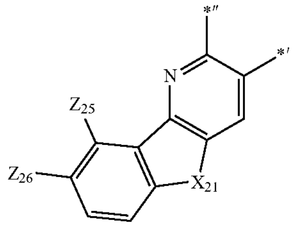
CY2-4050
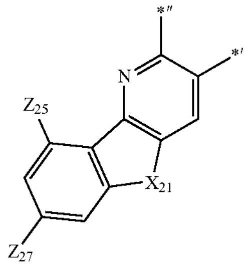
CY2-4051
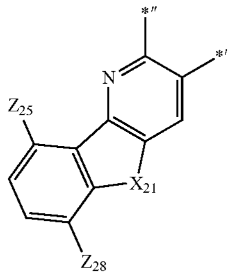
CY2-4052
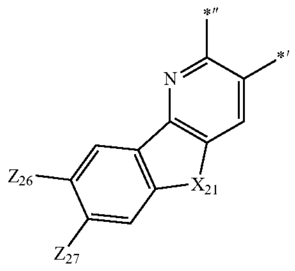
-continued
CY2-4053
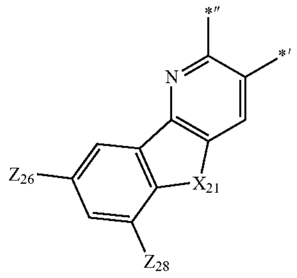
CY2-4054
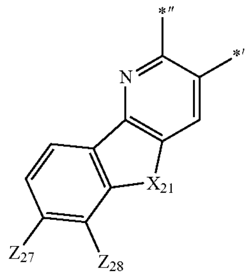
CY2-4055
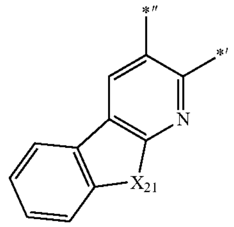
CY2-4056
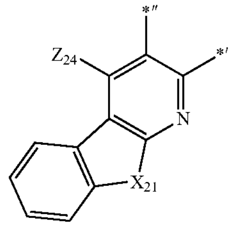
CY2-4057
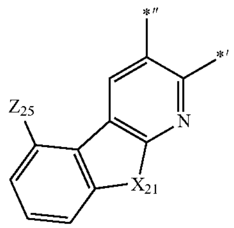
CY2-4058
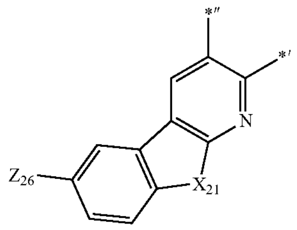

-continued
CY2-4059
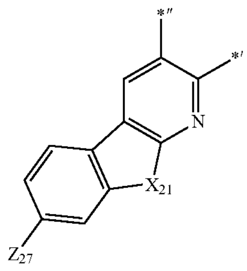
CY2-4060
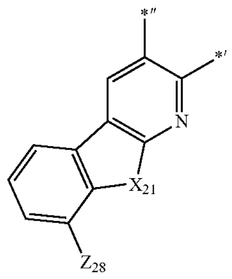
CY2-4061
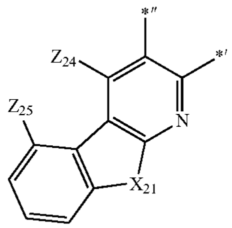
CY2-4062
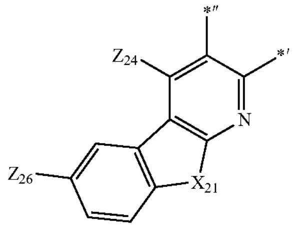
CY2-4063
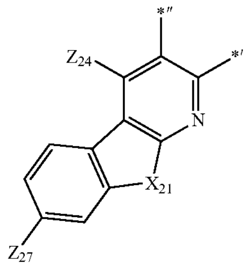
CY2-4064
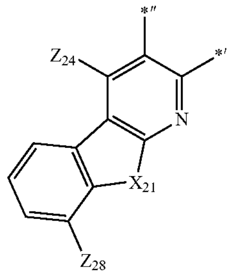
-continued
CY2-4065
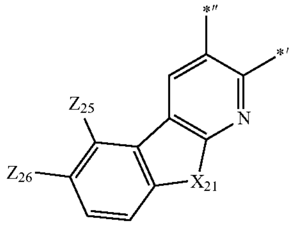
CY2-4066
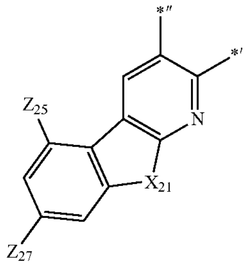
CY2-4067
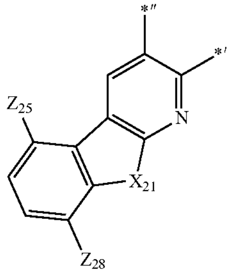
CY2-4068
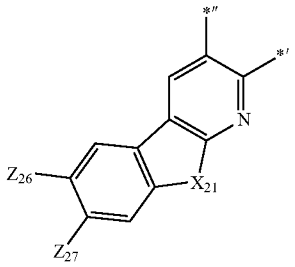
CY2-4069
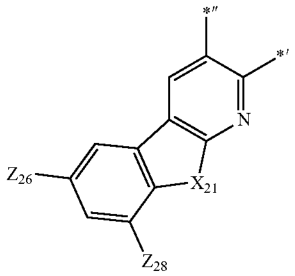
CY2-4070
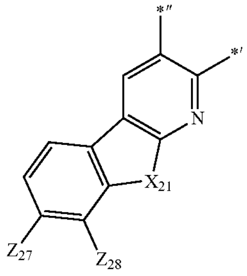

-continued
CY2-4071
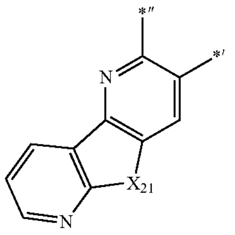
CY2-4072
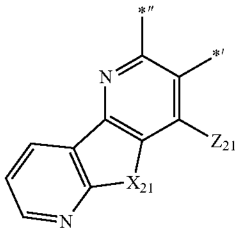
CY2-4073
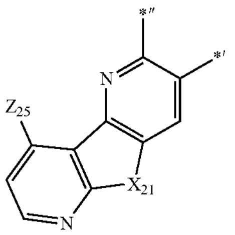
CY2-4074
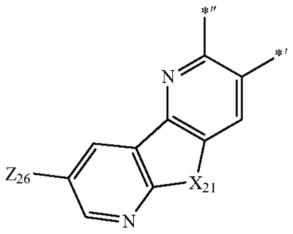
CY2-4075
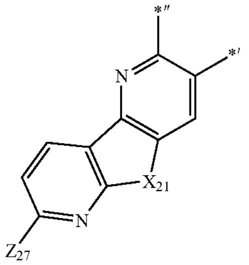
CY2-4076
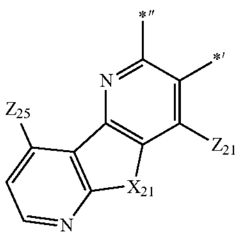
-continued
CY2-4077
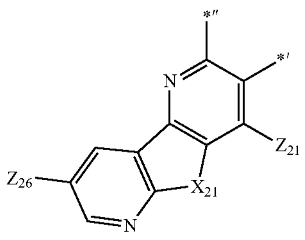
CY2-4078
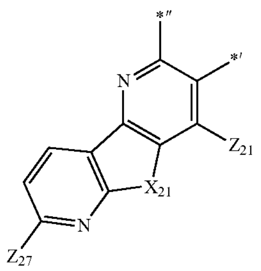
CY2-4079
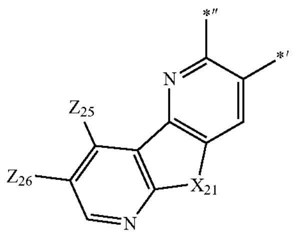
CY2-4080
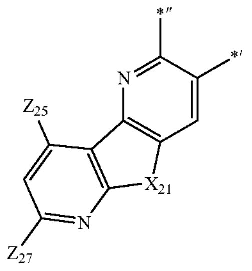
CY2-4081
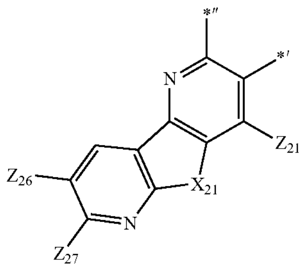
CY2-4082
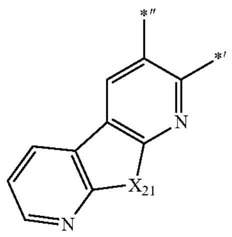

-continued
CY2-4083
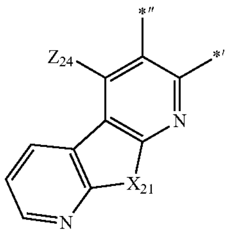
CY2-4084
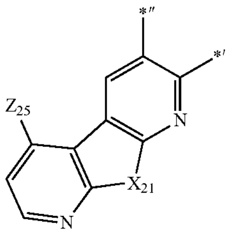
CY2-4085
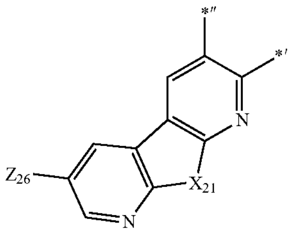
CY2-4086
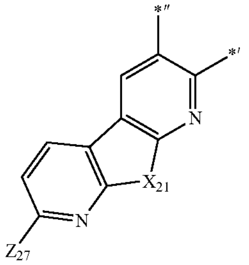
CY2-4087
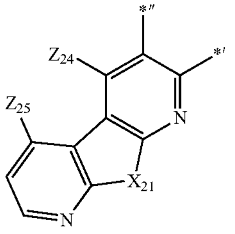
CY2-4088
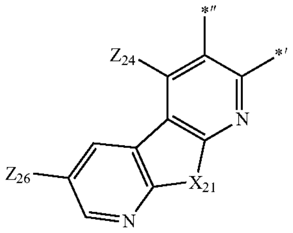
-continued
CY2-4089
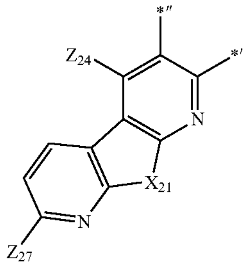
CY2-4090
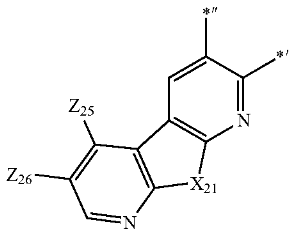
CY2-4091
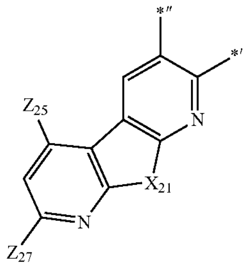
CY2-4092
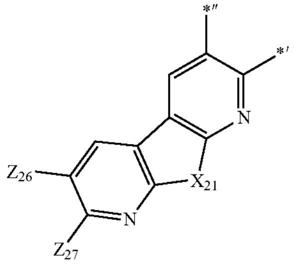
CY2-5001
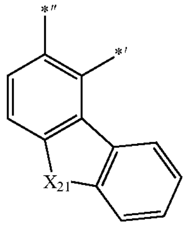
CY2-5002
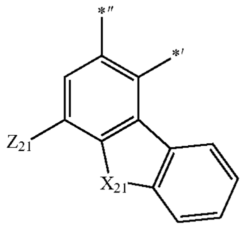

-continued
CY2-5003
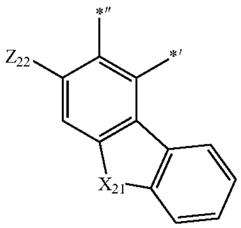
CY2-5004
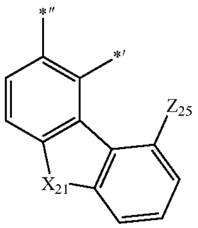
CY2-5005
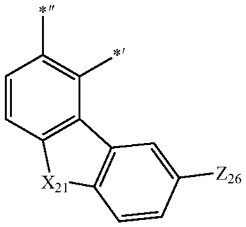
CY2-5006
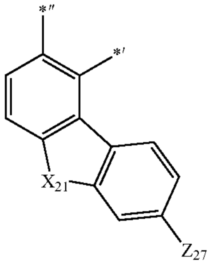
CY2-5007
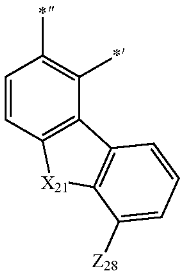
CY2-5008
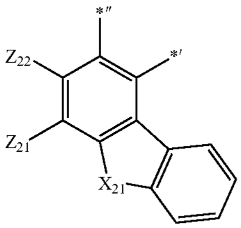
-continued
CY2-5009
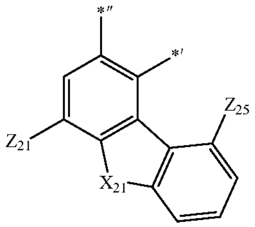
CY2-5010
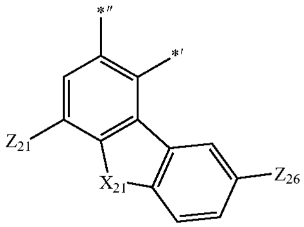
CY2-5011
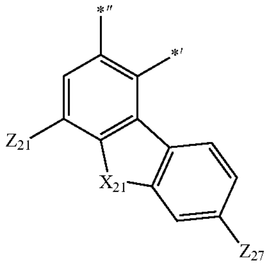
CY2-5012
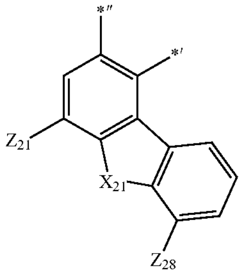
CY2-5013
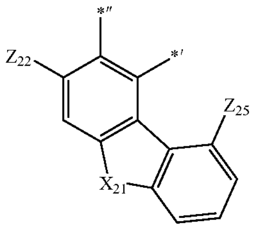
CY2-5014
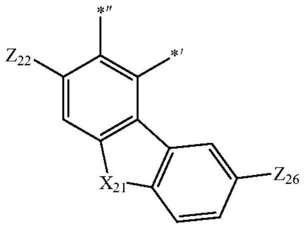

-continued
CY2-5015
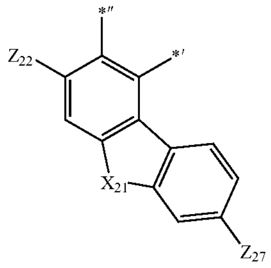
CY2-5016
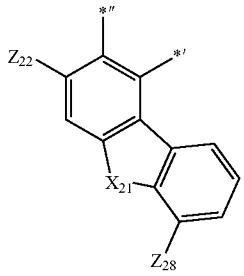
CY2-5017
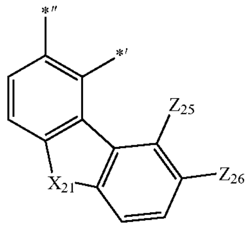
CY2-5018
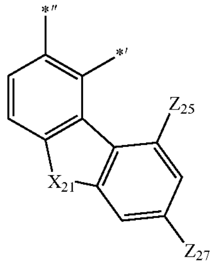
CY2-5019
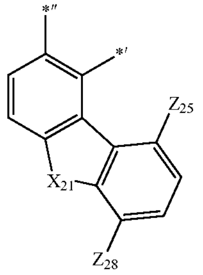
-continued
CY2-5020
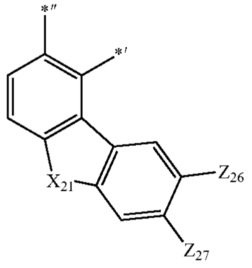
CY2-5021
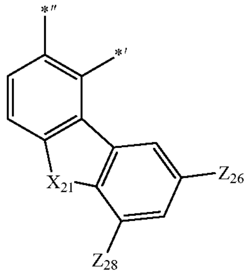
CY2-5022
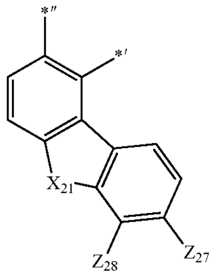
CY2-5023
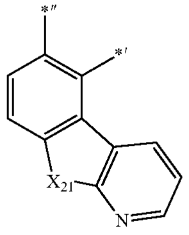
CY2-5024
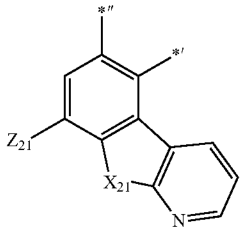
CY2-5025
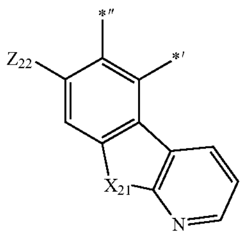

-continued
CY2-5026
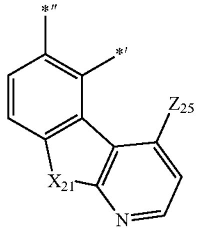
CY2-5027
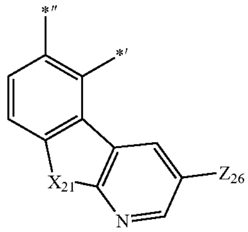
CY2-5028
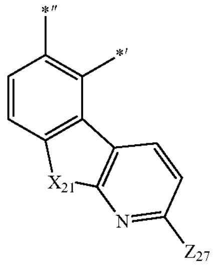
CY2-5029
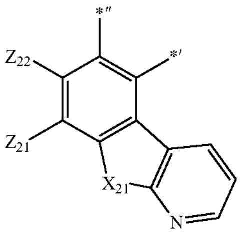
CY2-5030
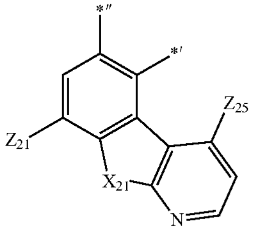
CY2-5031
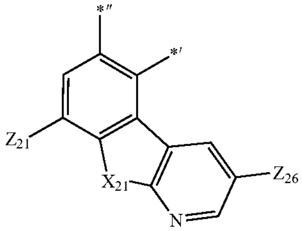
-continued
CY2-5032
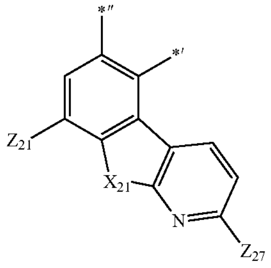
CY2-5033
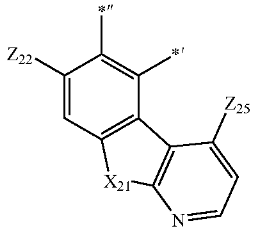
CY2-5034
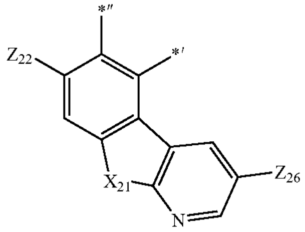
CY2-5035
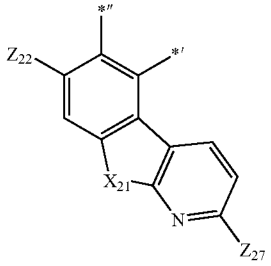
CY2-5036
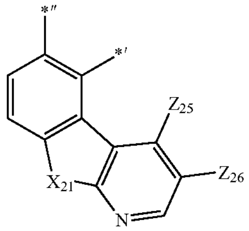
CY2-5037
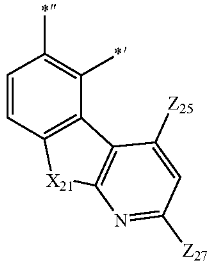

-continued
CY2-5038
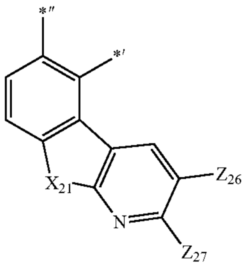
CY2-5039
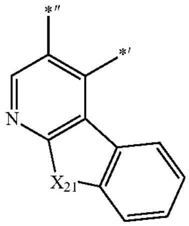
CY2-5040
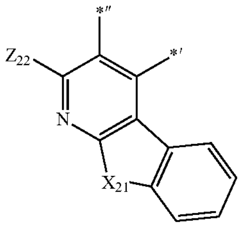
CY2-5041
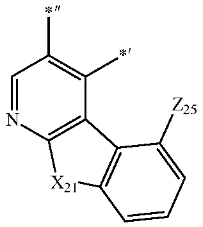
CY2-5042
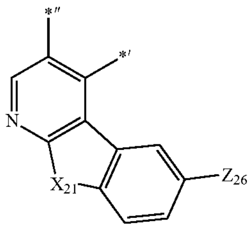
CY2-5043
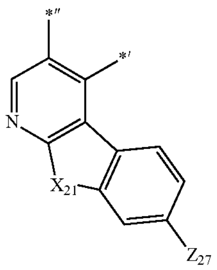
-continued
CY2-5044
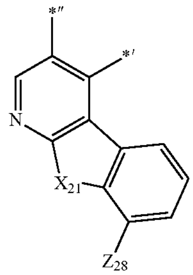
CY2-5045
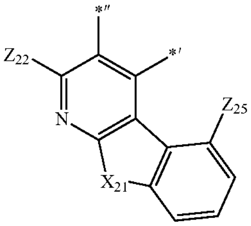
CY2-5046
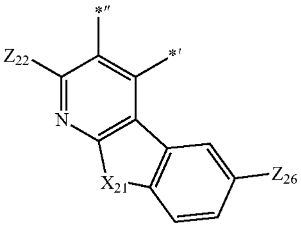
CY2-5047
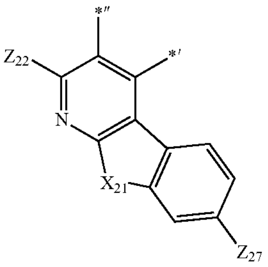
CY2-5048
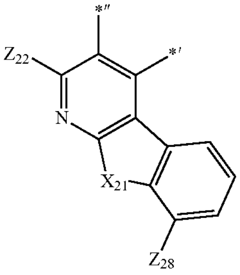
CY2-5049
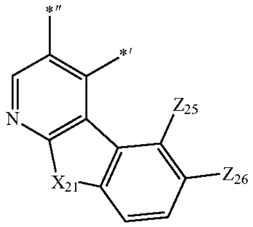

-continued
CY2-5050
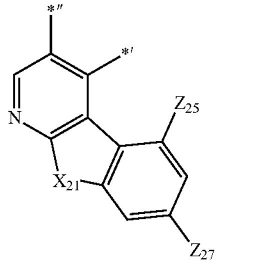
CY2-5051
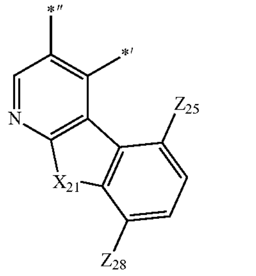
CY2-5052
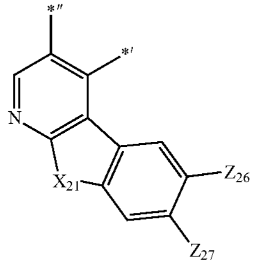
CY2-5053
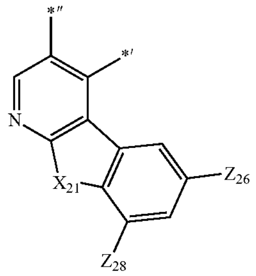
CY2-5054
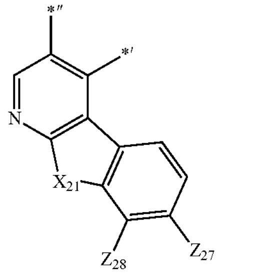
CY2-5055
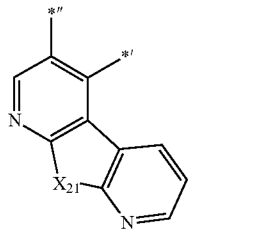
-continued
CY2-5056
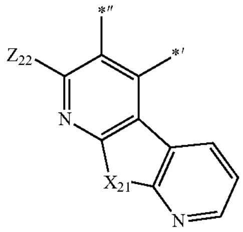
CY2-5057
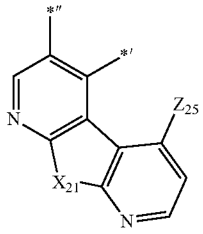
CY2-5058
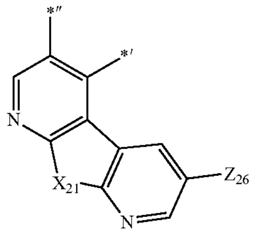
CY2-5059
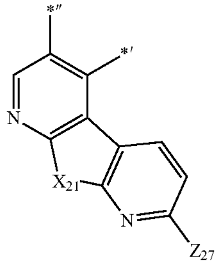
CY2-5060
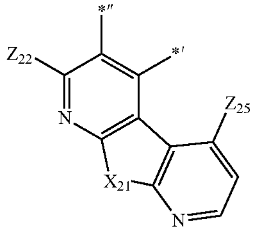
CY2-5061
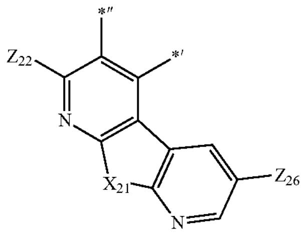

-continued
CY2-5062
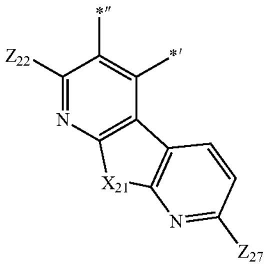
CY2-5063
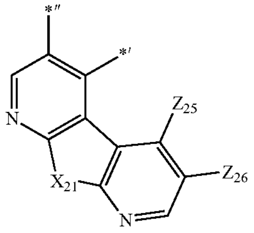
CY2-5064
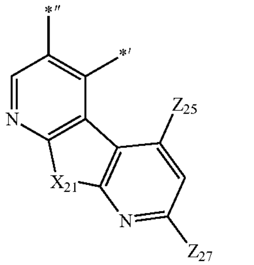
CY2-5065
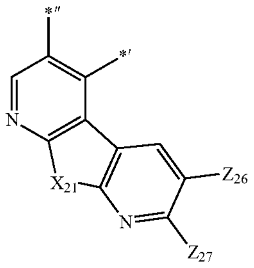
CY2-6001
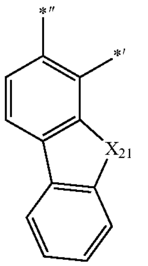
CY2-6002
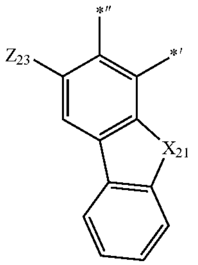
-continued
CY2-6003
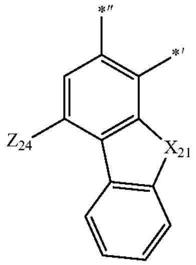
CY2-6004
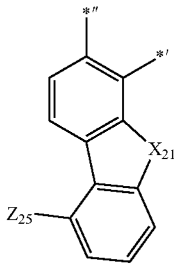
CY2-6005
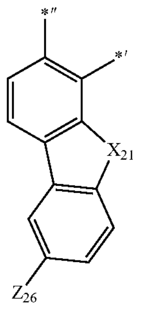
CY2-6006
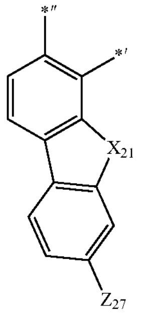
CY2-6007
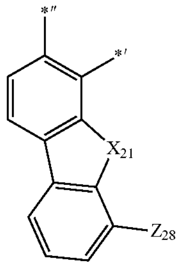

-continued
CY2-6008
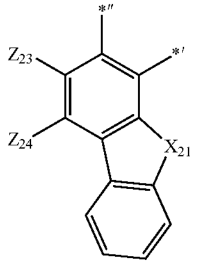
CY2-6009
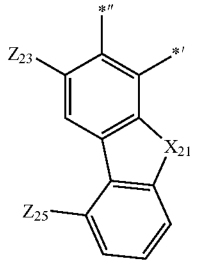
CY2-6010
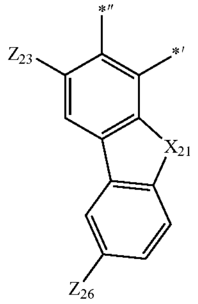
CY2-6011
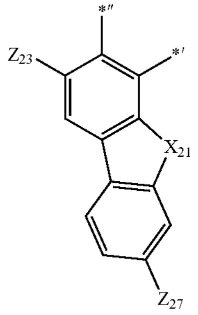
CY2-6012
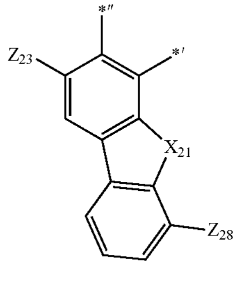
-continued
CY2-6013
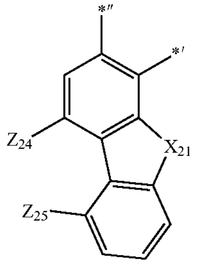
CY2-6014
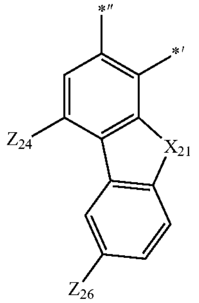
CY2-6015
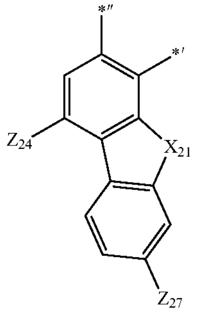
CY2-6016
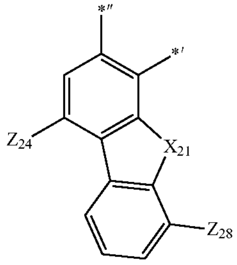
CY2-6017
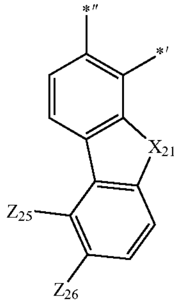

-continued
CY2-6018
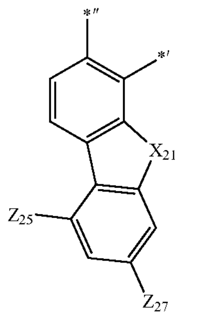
CY2-6019
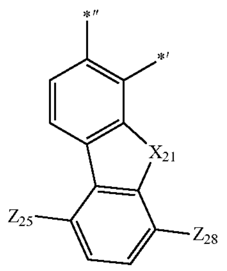
CY2-6020
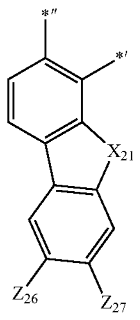
CY2-6021
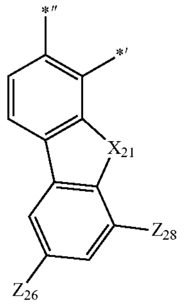
CY2-6022
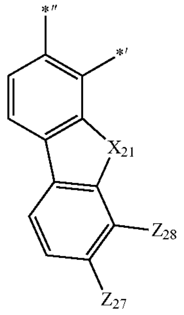
-continued
CY2-6023
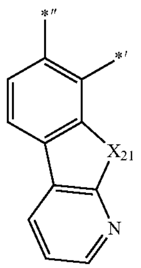
CY2-6024
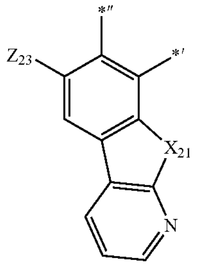
CY2-6025
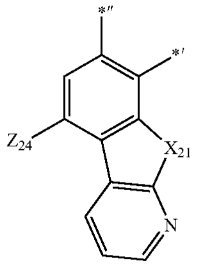
CY2-6026
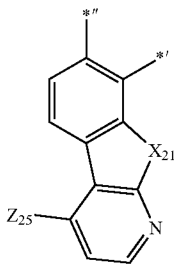
CY2-6027
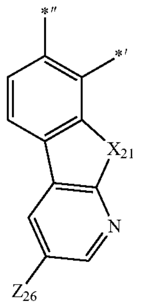

-continued
CY2-6028
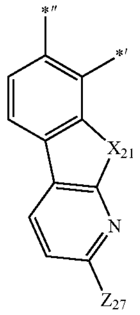
CY2-6029
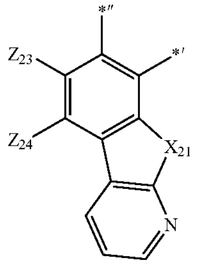
CY2-6030
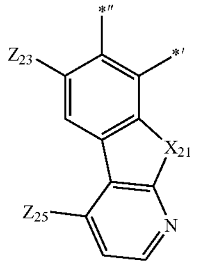
CY2-6031
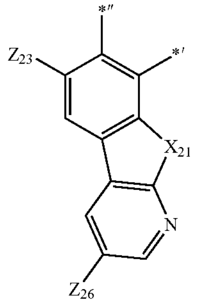
CY2-6032
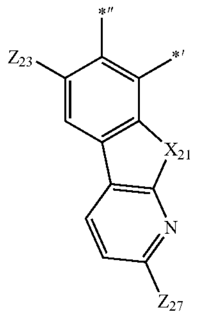
-continued
CY2-6033
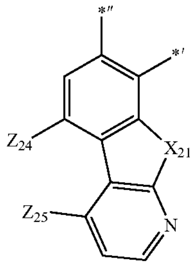
CY2-6034
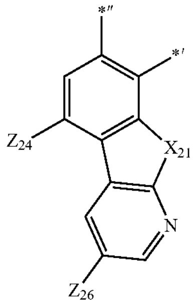
CY2-6035
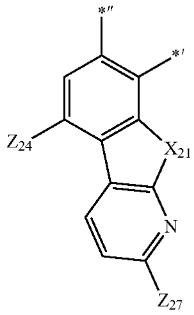
CY2-6036
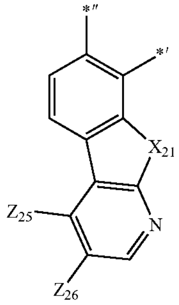
CY2-6037
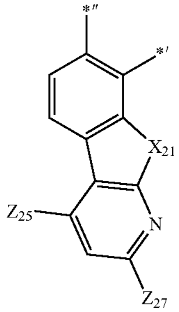

-continued
CY2-6038
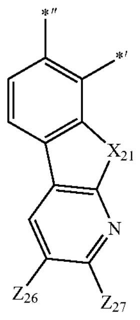
CY2-6039
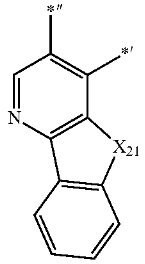
CY2-6040
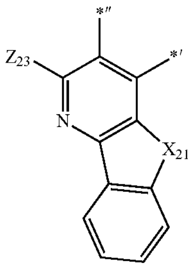
CY2-6041
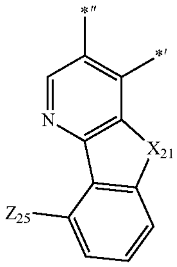
CY2-6042
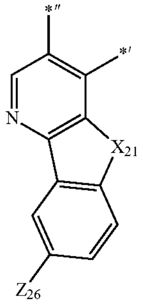
-continued
CY2-6043
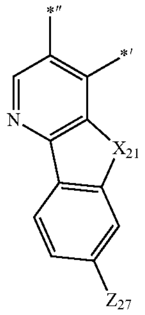
CY2-6044
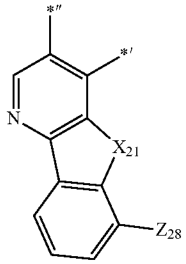
CY2-6045
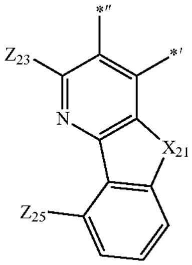
CY2-6046
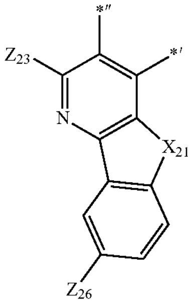
CY2-6047
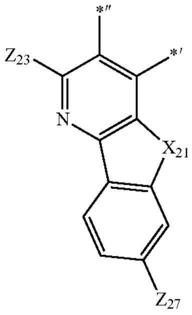

-continued
CY2-6048
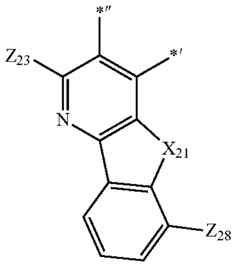
CY2-6049
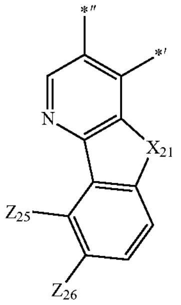
CY2-6050
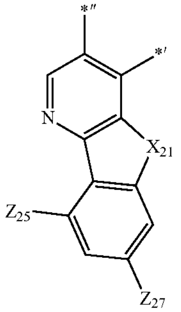
CY2-6051
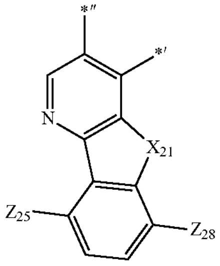
CY2-6052
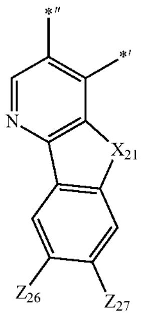
-continued
CY2-6053
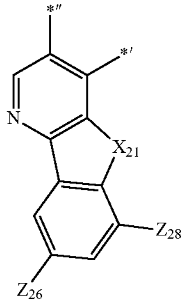
CY2-6054
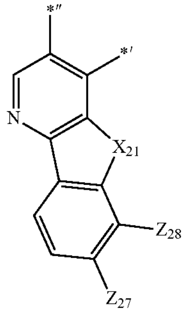
CY2-6055
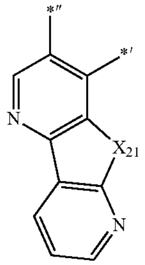
CY2-6056
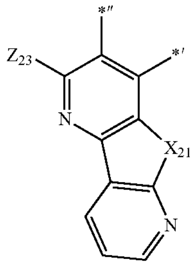
CY2-6057
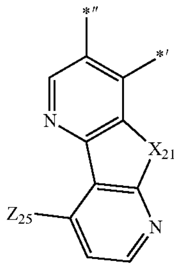

-continued

CY2-6058

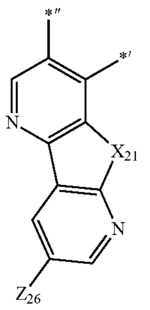

CY2-6059

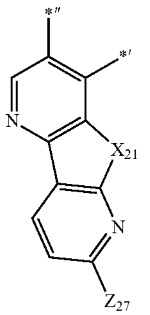

CY2-6060

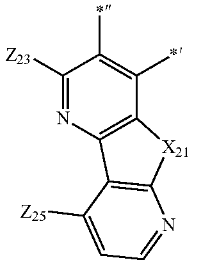

CY2-6061

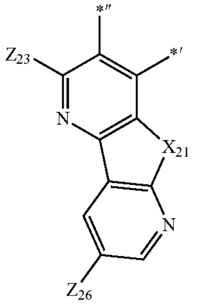

CY2-6062

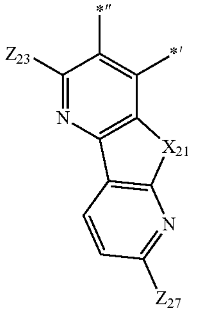

-continued

CY2-6063

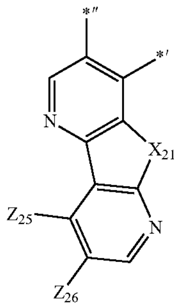

CY2-6064

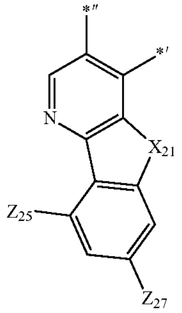

CY2-6065

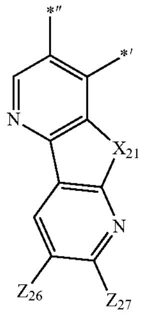

wherein, in Formulae CY2-1001 to CY2-1141, CY2-2001 to CY2-2092, CY2-3001 to CY2-3092, CY2-4001 to CY2-4092, CY2-5001 to CY2-5065, and CY2-6001 to CY2-6065, $X_{21}$ is as described in the present specification, $Z_{21}$ to $Z_{28}$ are as described in connection with $Z_2$, and each of $Z_{21}$ to $Z_{28}$ is not hydrogen,

*" indicates a binding site to ring $CY_1$ in Formula 2-1, and

*" indicates a binding site to M in Formula 1.

In one or more embodiments, a group represented by

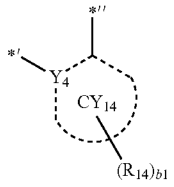

in Formula 2-2 may be a group represented by one of Formulae CY14-1 to CY14-64:
CY14-1
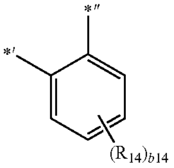
CY14-2
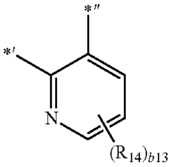
CY14-3
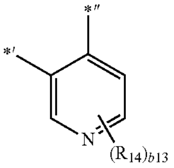
CY14-4
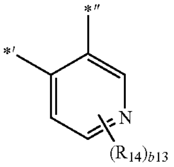
CY-14-5
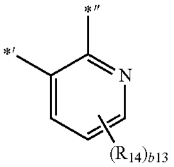
CY14-6
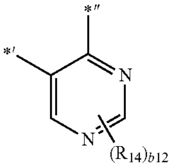
CY14-7
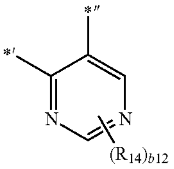
CY14-8
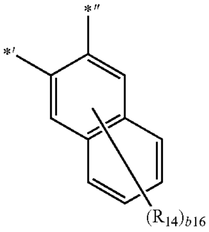
-continued
CY14-9
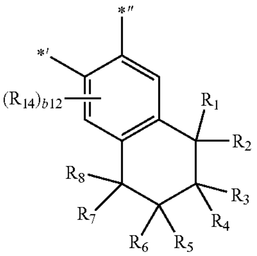
CD14-10
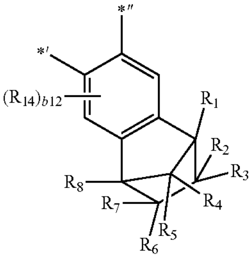
CY14-11
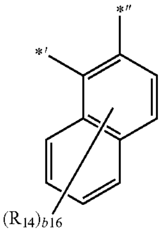
CY14-12
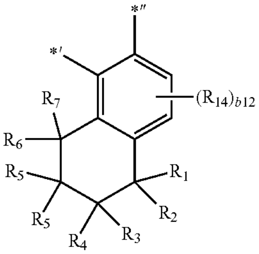
CY14-13
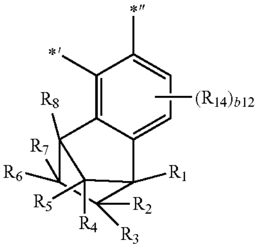
CY14-14
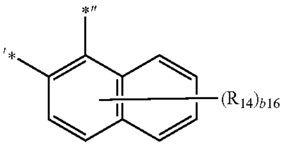

-continued
CY14-15
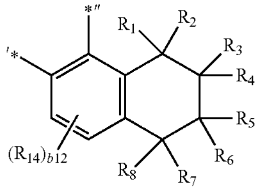
CY14-16
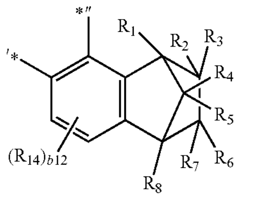
CY14-17
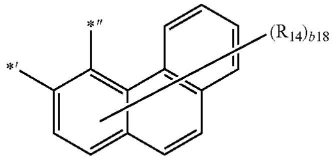
CY14-18
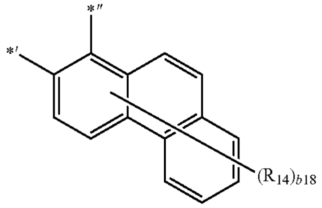
CY14-19
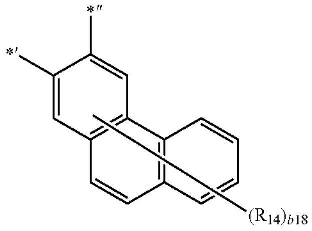
CY14-20
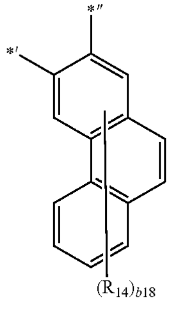
CY14-21
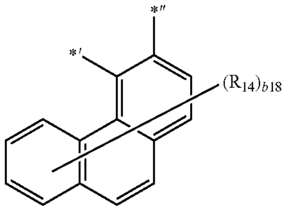
-continued
CY14-22
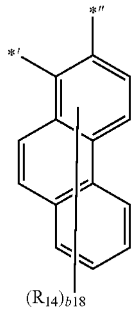
CY14-23
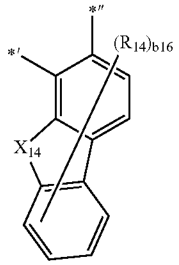
CY14-24
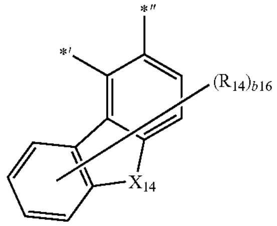
CY14-25
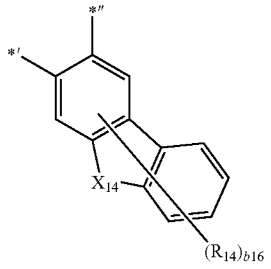
CY14-26
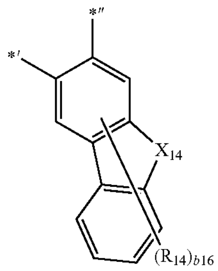
CY14-27
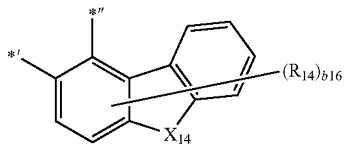

-continued
CY14-28
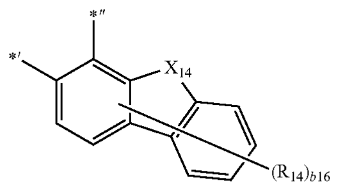
CY14-29
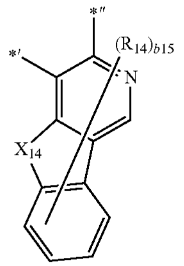
CY14-30
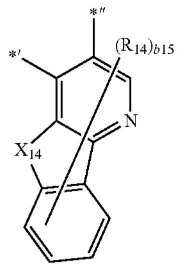
CY14-31
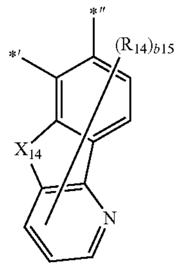
CY14-32
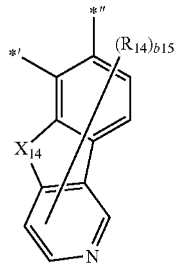
CY14-33
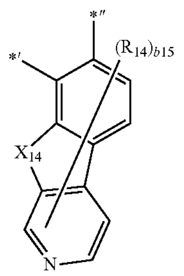
-continued
CY14-34
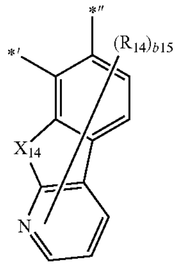
CY14-35
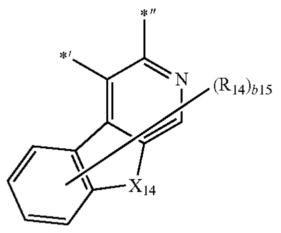
CY14-36
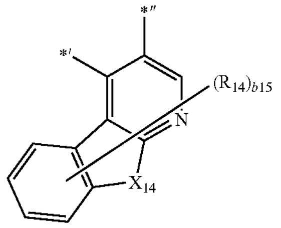
CY14-37
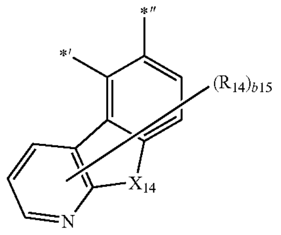
CY14-38
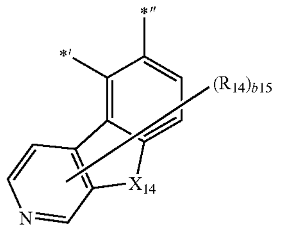
CY14-39
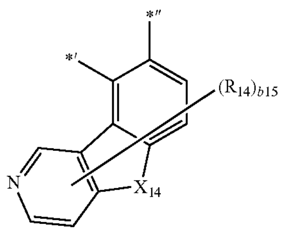

-continued
CY14-40
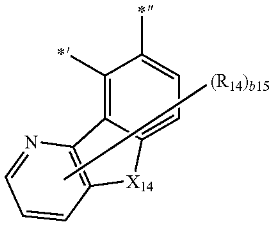
CY14-41
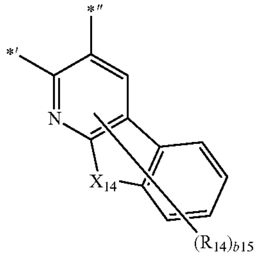
CY14-42
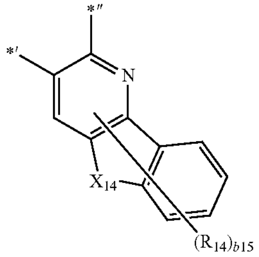
CY14-43
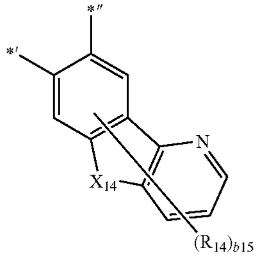
CY14-44
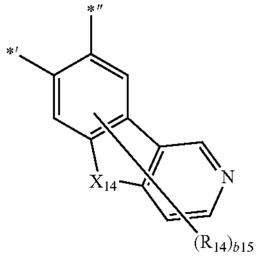
CY14-45
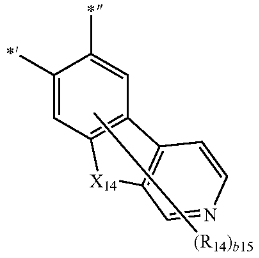
-continued
CY14-46
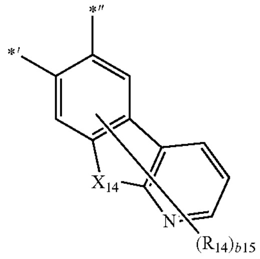
CY14-47
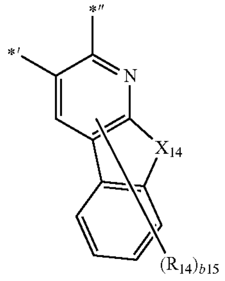
CY14-48
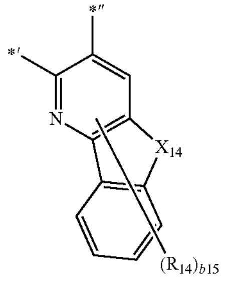
CY14-49
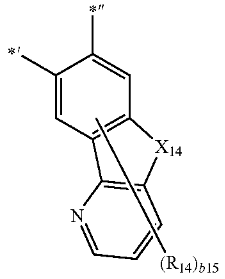
CY14-50
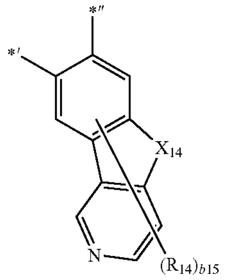

-continued

CY14-51

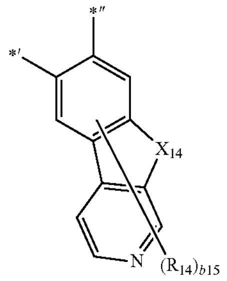

CY14-52

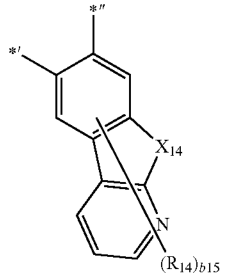

CY14-53

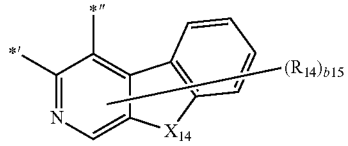

CY14-54

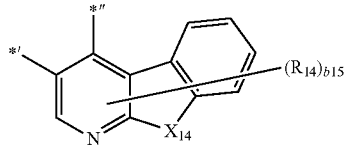

CY14-55

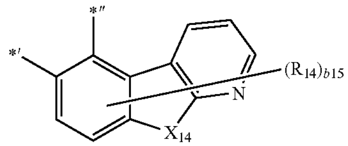

CY14-56

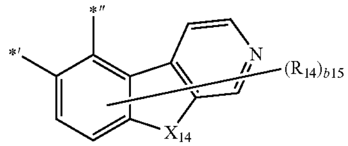

CY14-57

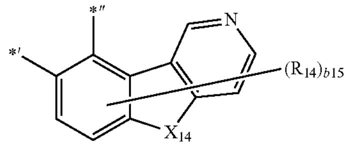

CY14-58

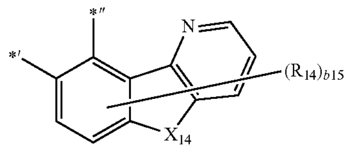

-continued

CY14-59

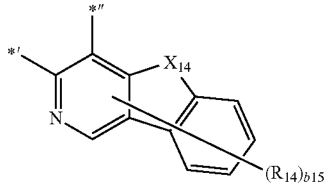

CY14-60

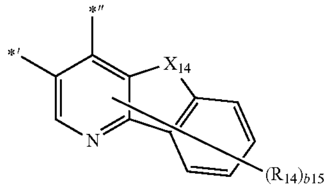

CY14-61

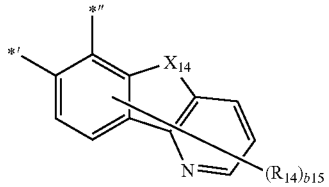

CY14-62

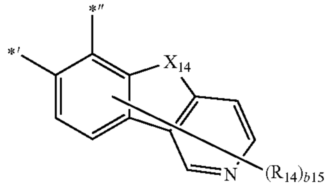

CY14-63

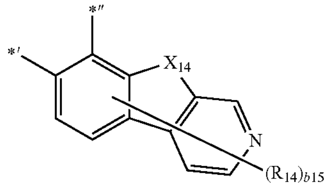

CY14-64

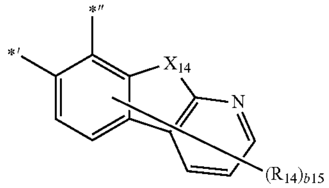

wherein, in Formulae CY14-1 to CY14-64, $R_{14}$ are as described in the present specification, and $X_{14}$ may be $C(R_1)(R_2)$, $N(R_1)$, O, S, or $Si(R_1)(R_2)$, $R_1$ to $R_8$ are as described in connection with $R_{14}$, b18 may be an integer from 0 to 8, b16 may be an integer from 0 to 6, b15 may be an integer from 0 to 5, b14 may be an integer from 0 to 4, b13 may be an integer from 0 to 3, b12 may be an integer from 0 to 2,

*" indicates a binding site to a carbon atom of a neighboring pyridine ring in Formula 2-2, and

*" indicates a binding site to M in Formula 1.

In one or more embodiments, a group represented by
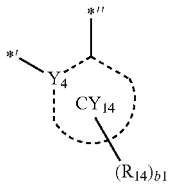
in Formula 2-2 may be a group represented by one of Formulae CY14(1) to CY14(63):
CY14(1)
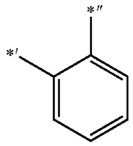
CY14(2)
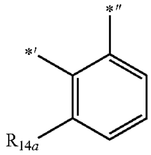
CY14(3)
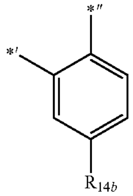
CY14(4)
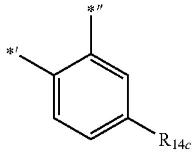
CY14(5)
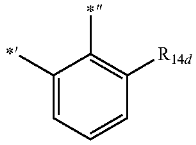
CY14(6)
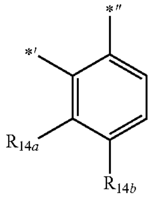
CY14(7)
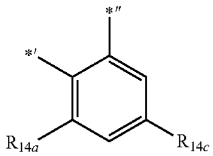
-continued
CY14(8)
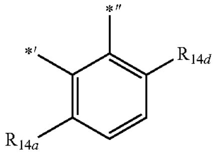
CY14(9)
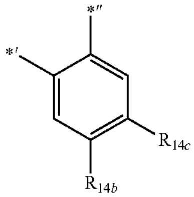
CY14(10)
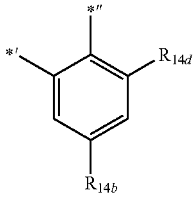
CY14(11)
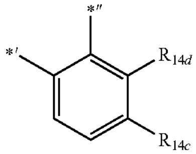
CY14(12)
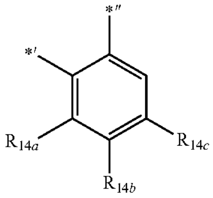
CY14(13)
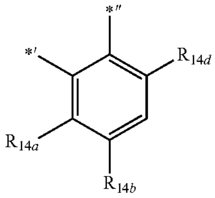
CY14(14)
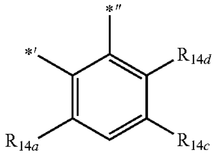
CY14(15)
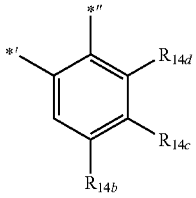

-continued
CY14(16)
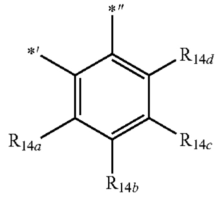
CY14(17)
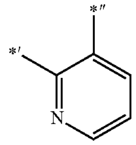
CY14(18)
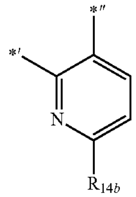
CY14(19)
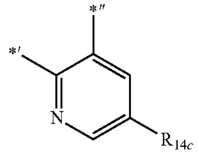
CY14(20)
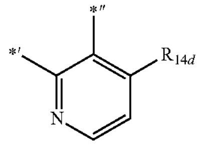
CY14(21)
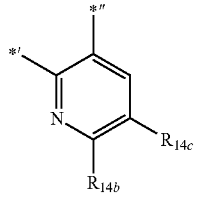
CY14(22)
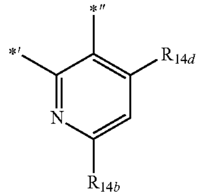
CY14(23)
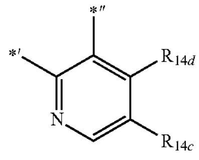
-continued
CY14(24)
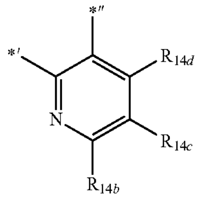
CY14(25)
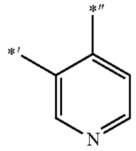
CY14(26)
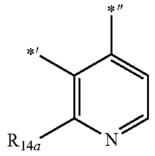
CY14(27)
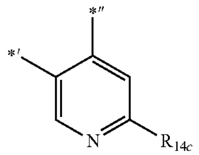
CY14(28)
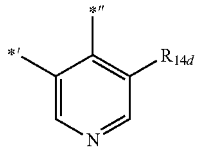
CY14(29)
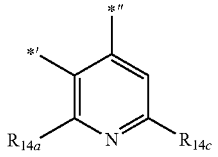
CY14(30)
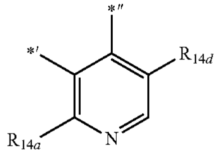
CY14(31)
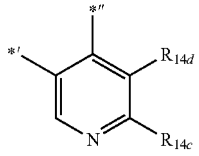
CY14(32)
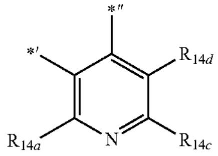

-continued
CY14(33)
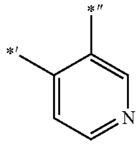
CY14(34)
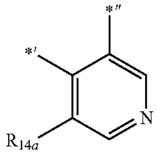
CY14(35)
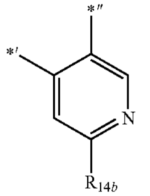
CY14(36)
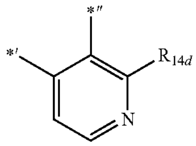
CY14(37)
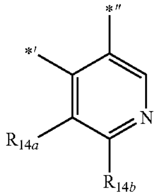
CY14(38)
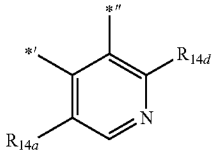
CY14(39)
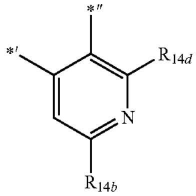
CY14(40)
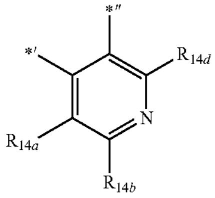
CY14(41)
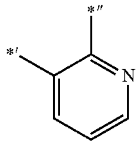
-continued
CY14(42)
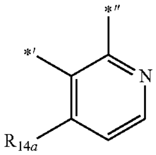
CY14(43)
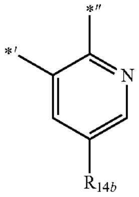
CY14(44)
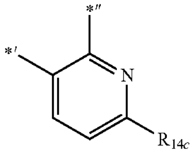
CY14(45)
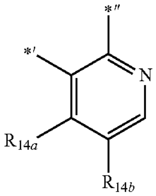
CY14(46)
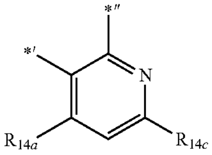
CY14(47)
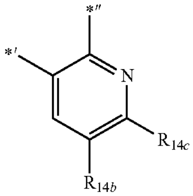
CY14(48)
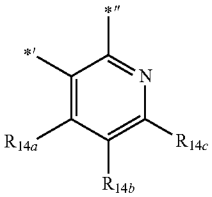
CY14(49)
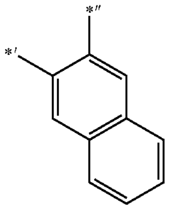

-continued
CY14(50)
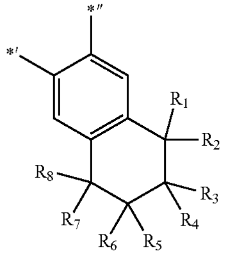
CY14(51)
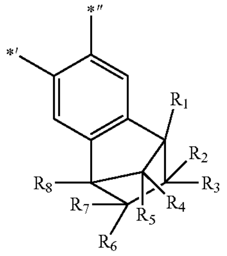
CY14(52)
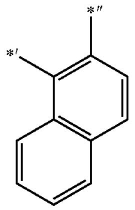
CY14(53)
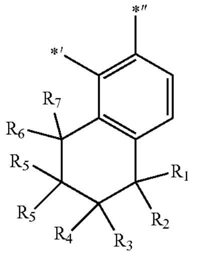
CY14(54)
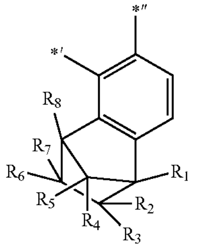
CY14(55)
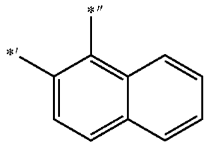
CY14(56)
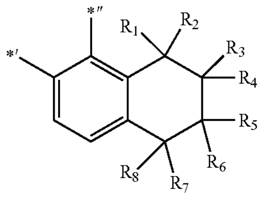
-continued
CY14(57)
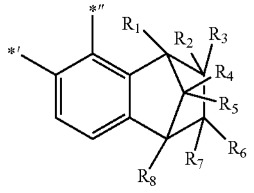
CY14(58)
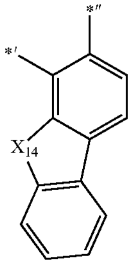
CY14(59)
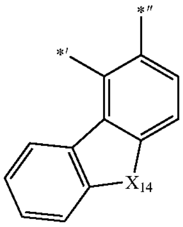
CY14(60)
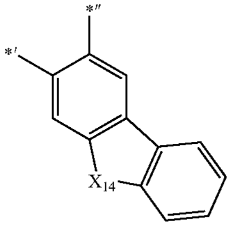
CY14(61)
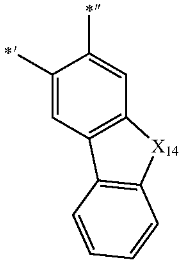
CY14(62)
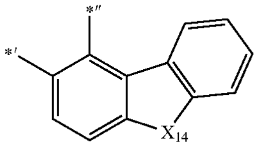
CY14(63)
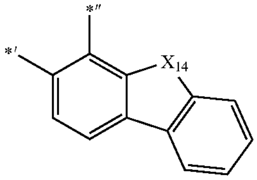
wherein, in Formulae $CY_{14}(1)$ to $CY_{14}(63)$,
$R_{14a}$ to $R_{14d}$ are each as described in connection with $R_{14}$, and each of $R_{14a}$ to $R_{14d}$ is not hydrogen, $X_{14}$ may be $C(R_1)(R_2)$, $N(R_1)$, O, S, or $Si(R_1)(R_2)$, $R_1$ to $R_8$ are as described in connection with $R_{14}$,

*'' indicates a binding site to a carbon atom of a neighboring pyridine ring in Formula 2-2, and

*''' indicates a binding site to M in Formula 1.

In one or more embodiments, the organometallic compound may be represented by Formula 1A:

Formula 1A

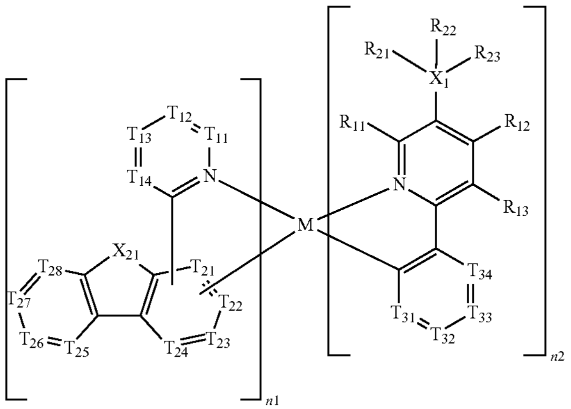

wherein, in Formula 1A,

M, n1, n2, $X_1$, $X_{21}$, $R_{21}$ to $R_{23}$, and $R_{11}$ to $R_{13}$ are each as described in the present specification, $T_{11}$ may be N, $C(A_{11})$, or $C(Z_{11})$, $T_{12}$ may be N, $C(A_{12})$, or $C(Z_{12})$, $T_{13}$ may be N, $C(A_{13})$, or $C(Z_{13})$, $T_{14}$ may be N, $C(A_{14})$, or $C(Z_{14})$, $Z_{11}$ to $Z_{14}$ are as described in connection with $Z_1$, and $A_{11}$ to $A_{14}$ are as described in connection with $A_1$. In one or more exemplary embodiments, i) $T_{11}$ may be $C(A_{11})$, or ii) $T_{12}$ may be $C(A_{12})$, or iii) $T_{13}$ may be $C(A_{13})$, or iv) $T_{14}$ may be $C(A_{14})$, $T_{21}$ may be N, $C(Z_{21})$, carbon bonded to a neighboring 6-membered ring (i.e., the ring containing N and $T_{12}$ to $T_{14}$), or carbon bonded to M in Formula 1, $T_{22}$ may be N, $C(Z_{22})$, carbon bonded to a neighboring 6-membered ring, or carbon bonded to M in Formula 1, $T_{23}$ may be N, $C(Z_{23})$, carbon bonded to a neighboring 6-membered ring, or carbon bonded to M in Formula 1, $T_{24}$ may be N, $C(Z_{24})$, carbon bonded to a neighboring 6-membered ring, or carbon bonded to M in Formula 1, $T_{25}$ may be N or $C(Z_{25})$, $T_{26}$ may be N or $C(Z_{26})$, $T_{27}$ may be N or $C(Z_{27})$, $T_{28}$ may be N or $C(Z_{28})$, and one of $T_{21}$ to $T_{24}$ is carbon bonded to M in Formula 1, one of the others of $T_{21}$ to $T_{24}$ which are not bonded to M, may be carbon bonded to a neighboring 6-membered ring, and $Z_{21}$ to $Z_{24}$ are as described in connection with $Z_2$, i) $R_{12}$ may be hydrogen, deuterium, a methyl group, or deuterated methyl group, or ii) $R_{12}$ and $R_{13}$ may optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $T_{31}$ may be N or $C(R_{14a})$, $T_{32}$ may be N or $C(R_{14b})$, $T_{33}$ may be N or $C(R_{14}c)$, $T_{34}$ may be N or $C(R_{14d})$, and $R_{14a}$ to $R_{14d}$ are as described in connection with $R_{14}$, two or more of $Z_{11}$ to $Z_{14}$ may optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $Z_{21}$ to $Z_{28}$ may optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_{14a}$ to $R_{14d}$ may optionally be linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, and $R_{10a}$ is as described in connection with $R_{14}$.

Further description of Formula 1A is as described in connection with Formula 1.

For example, $T_{13}$ in Formula 1A may be $C(A_{13})$.

In one or more embodiments, the organometallic compound may be one of Compounds 1 to 1204:

1

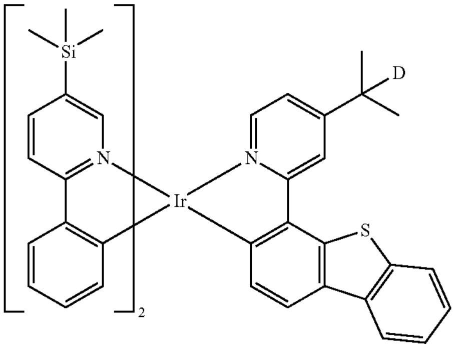

2

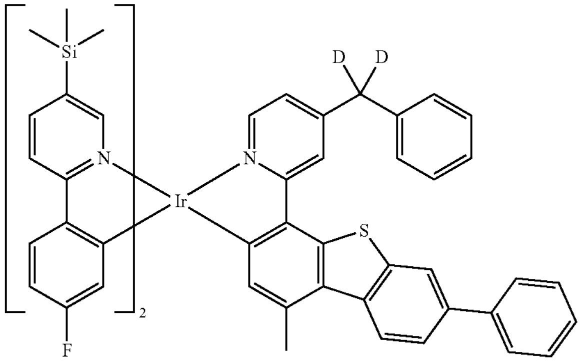

3

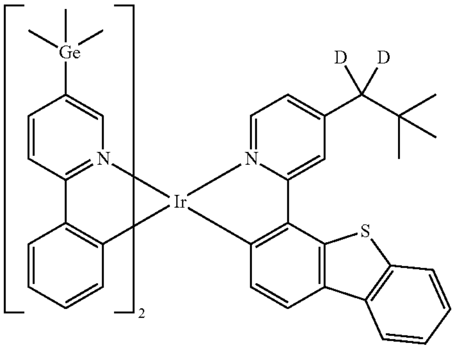

-continued
4
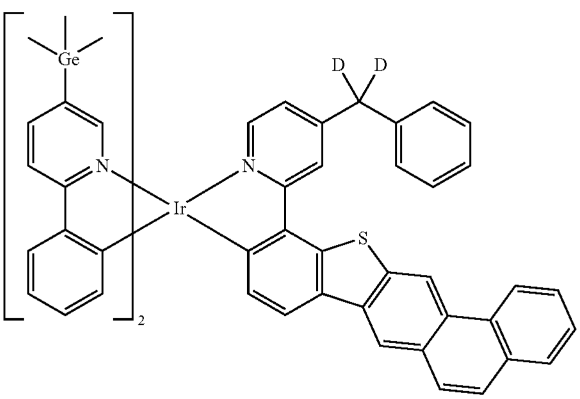
5
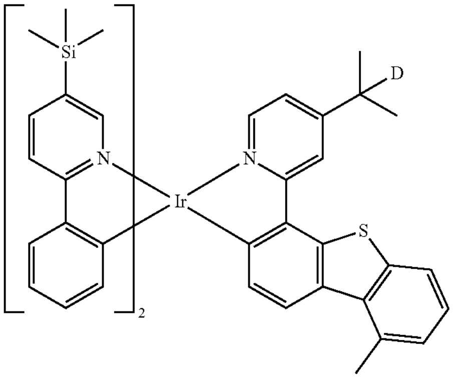
6
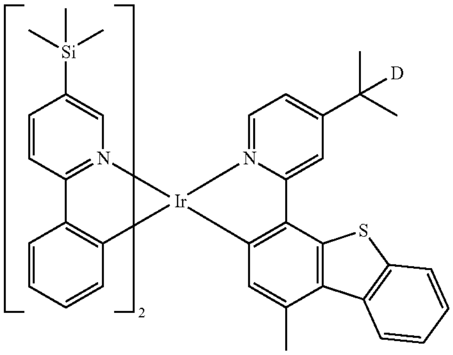
7
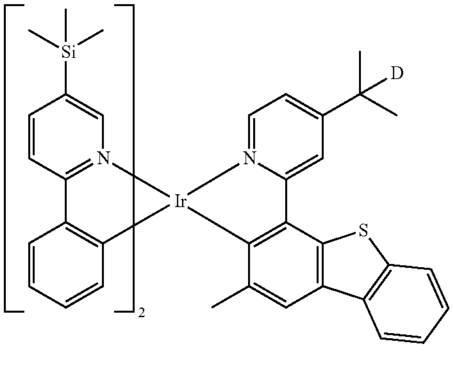
-continued
8
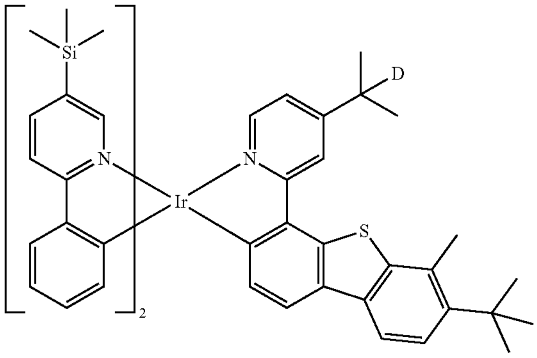
9
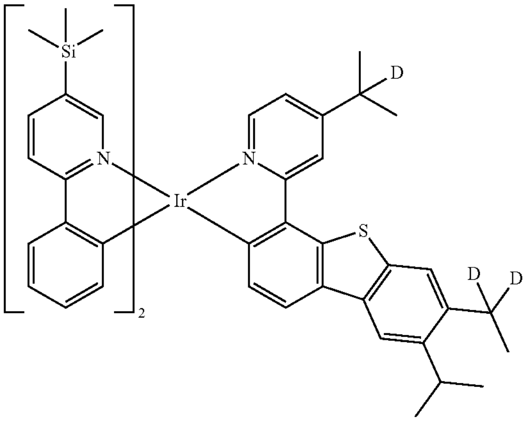
10
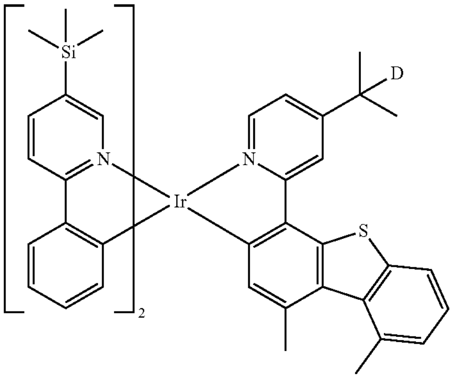
11
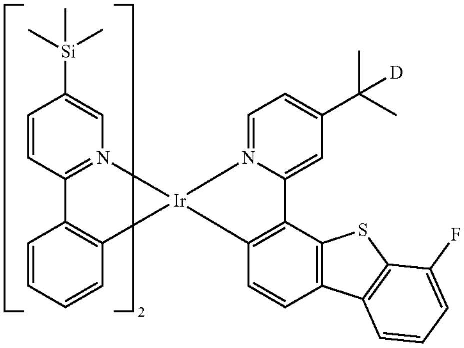

-continued
12
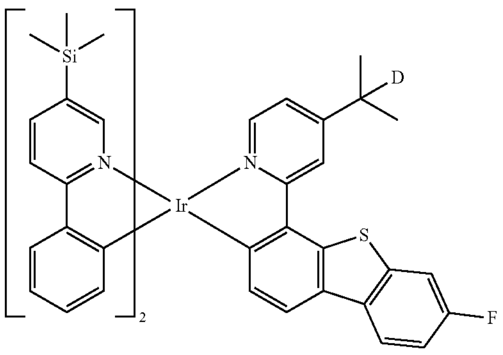
13
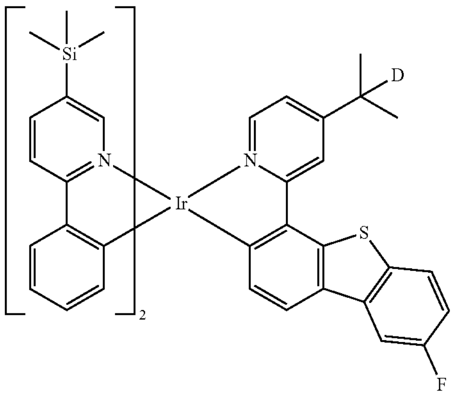
14
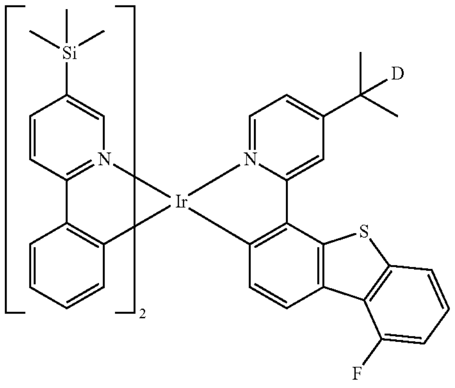
15
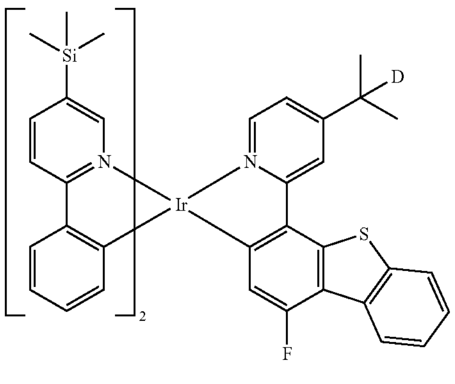
-continued
16
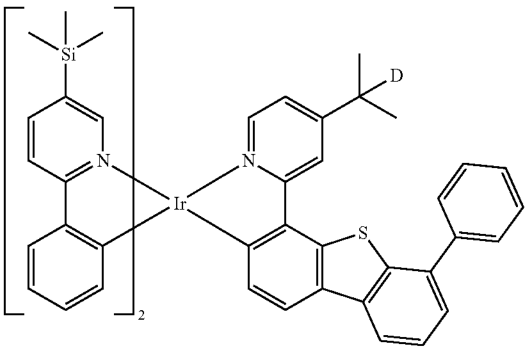
17
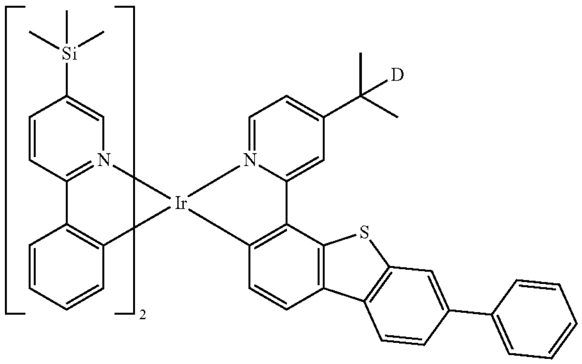
18
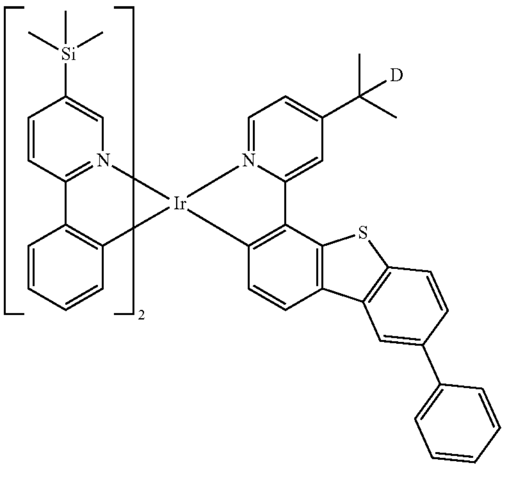

-continued
19
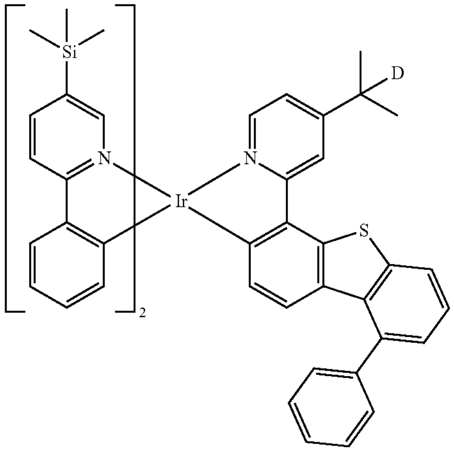
20
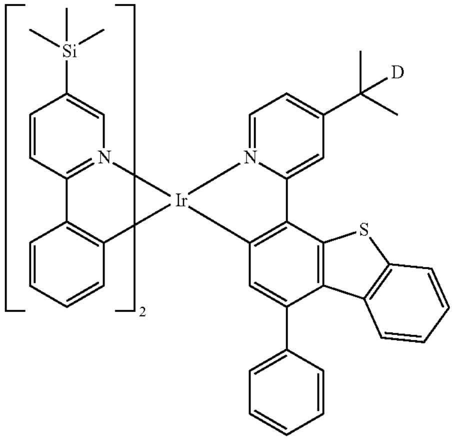
21
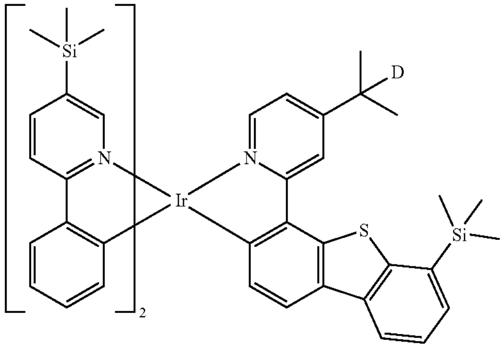
22
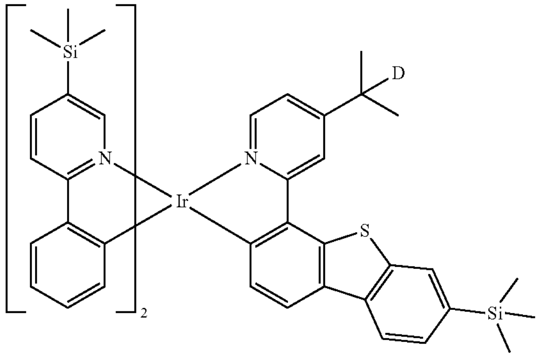
-continued
23
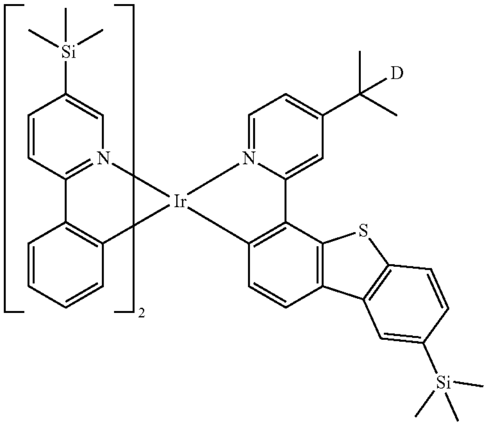
24
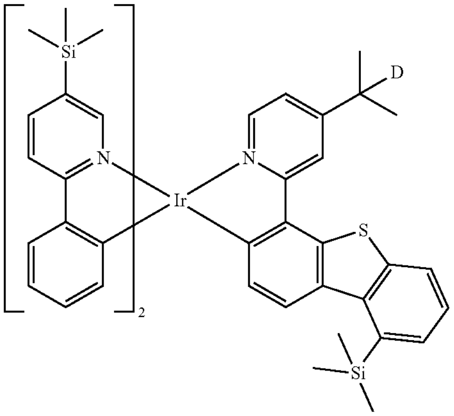
25
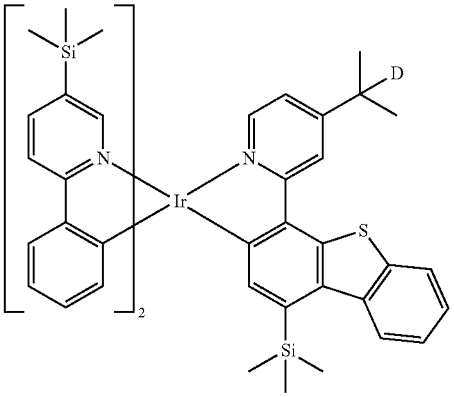
26
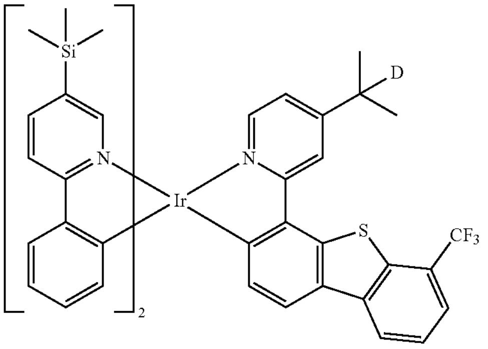

-continued
27
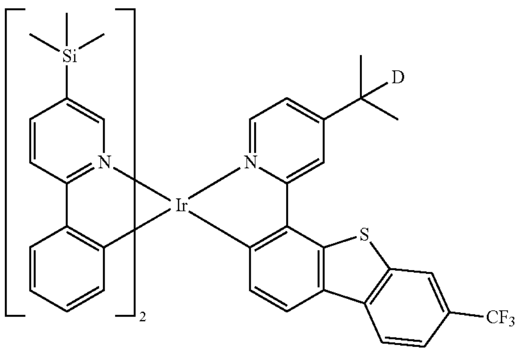
28
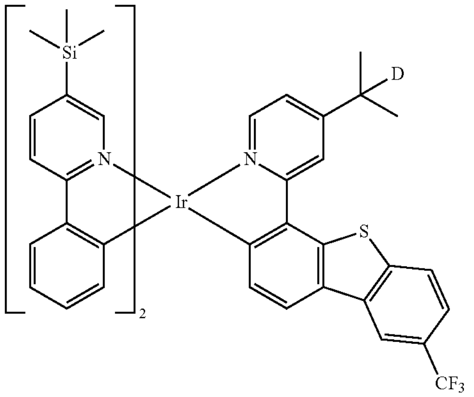
29
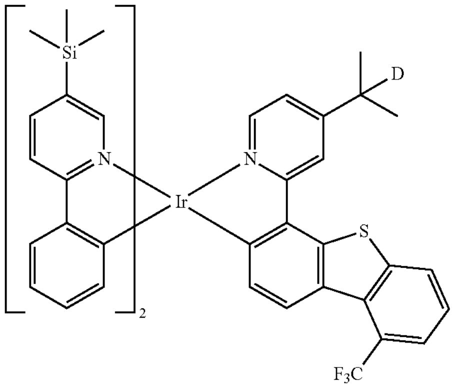
30
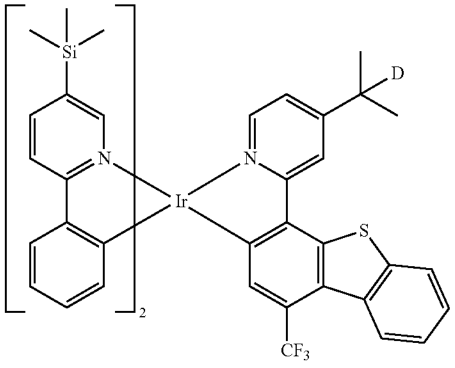
-continued
31
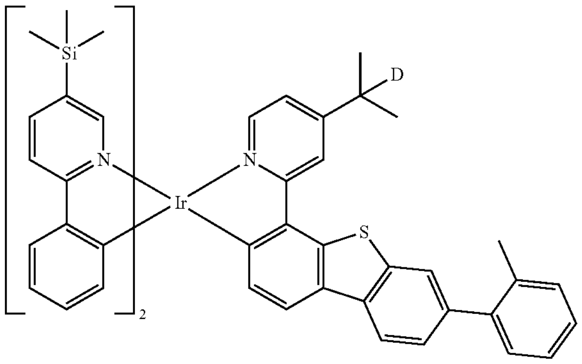
32
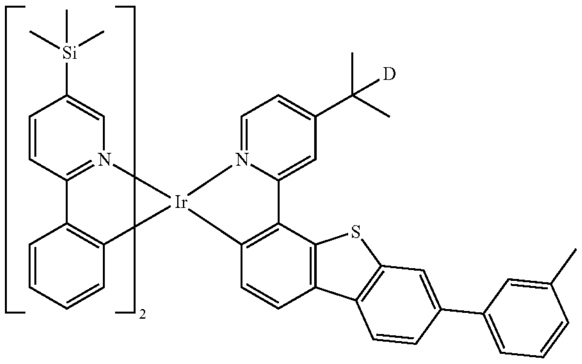
33
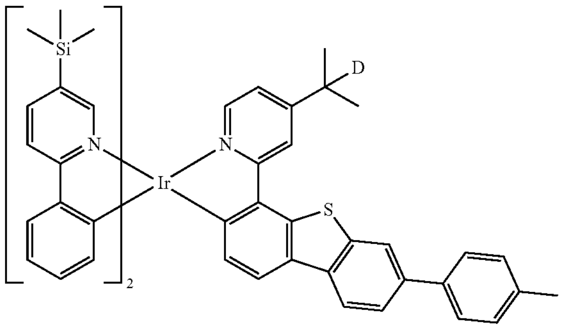
34
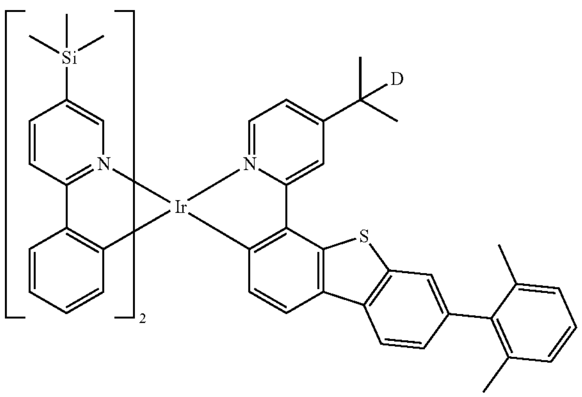

-continued
35
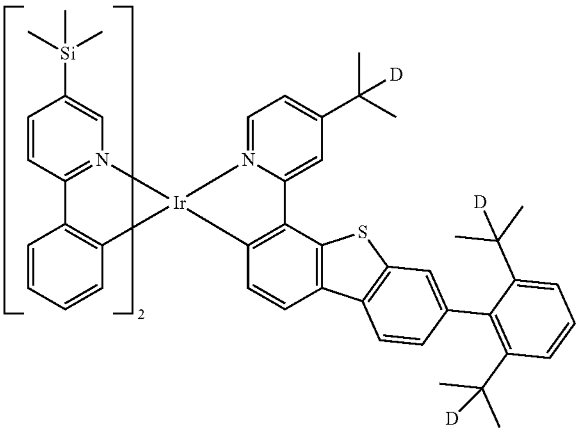
36
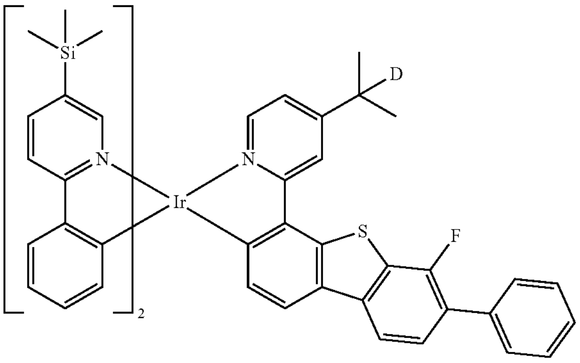
37
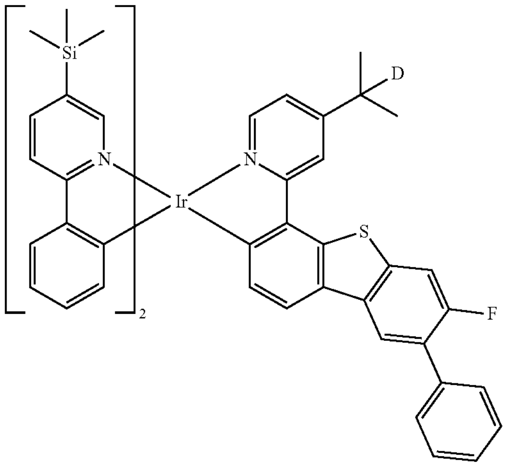
-continued
38
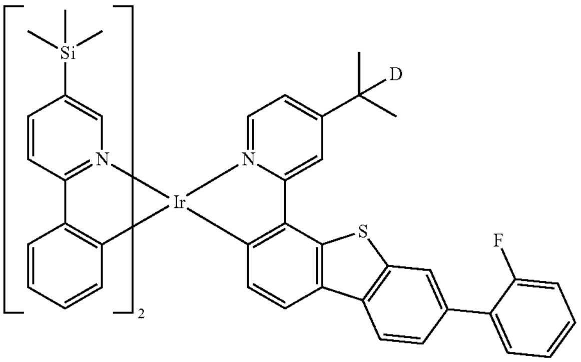
39
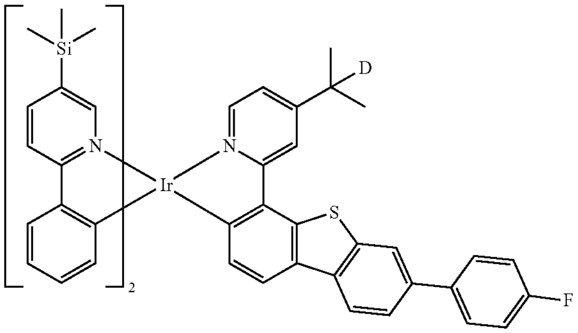
40
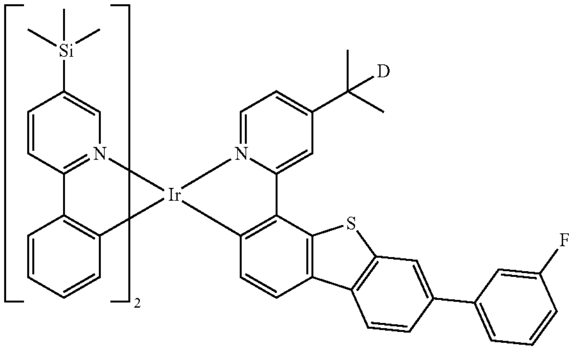
41
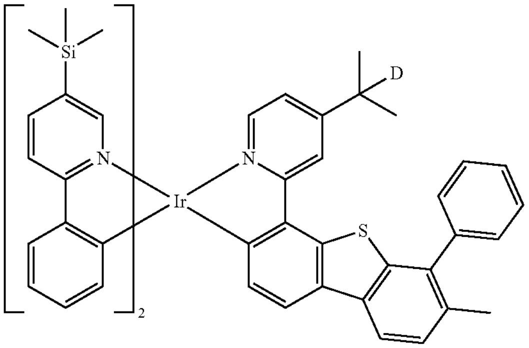

-continued
42
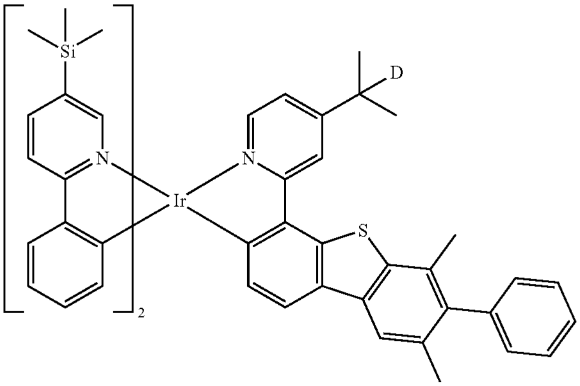
43
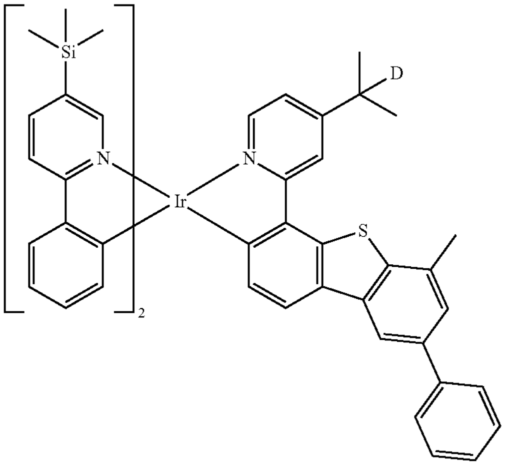
44
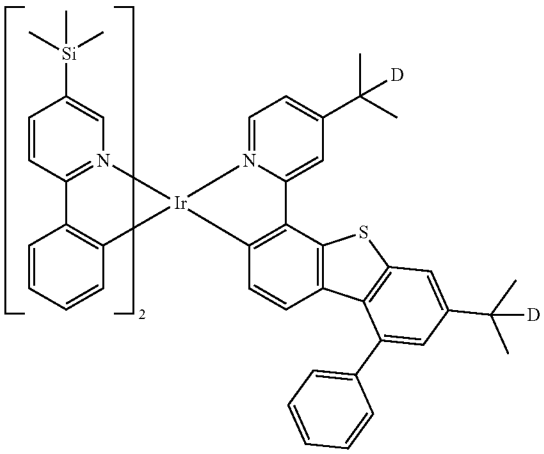
-continued
45
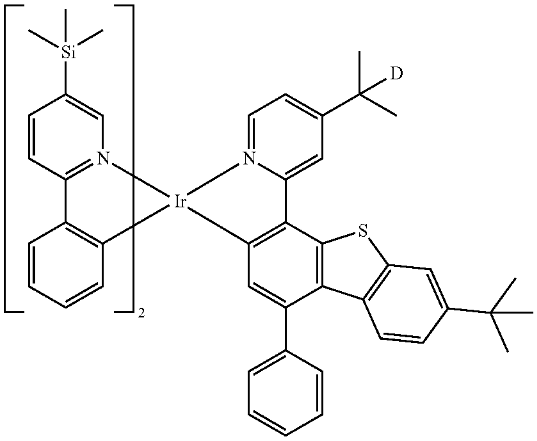
46
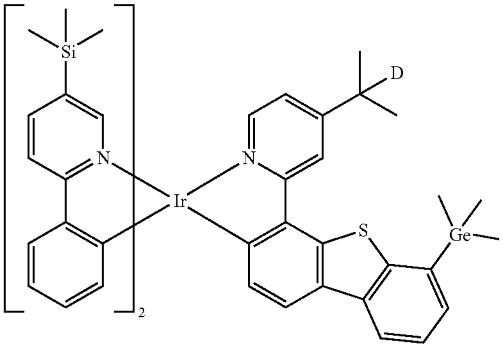
47
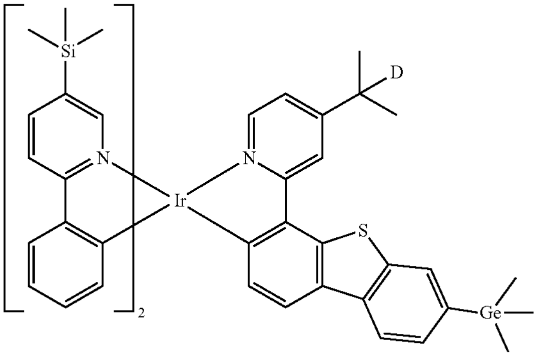
48
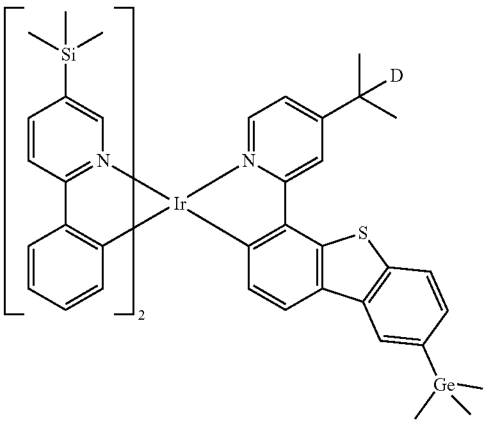

-continued
49
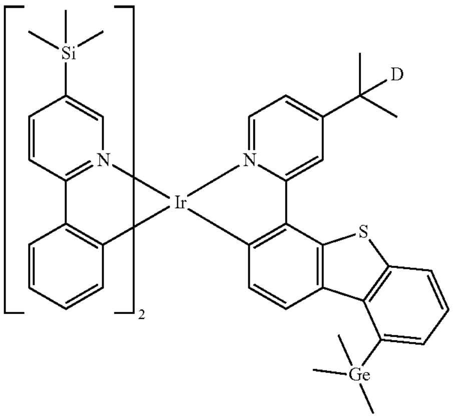
50
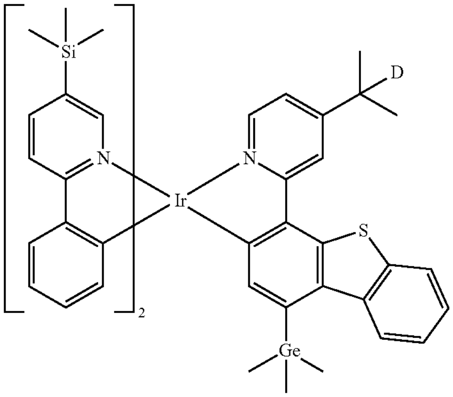
51
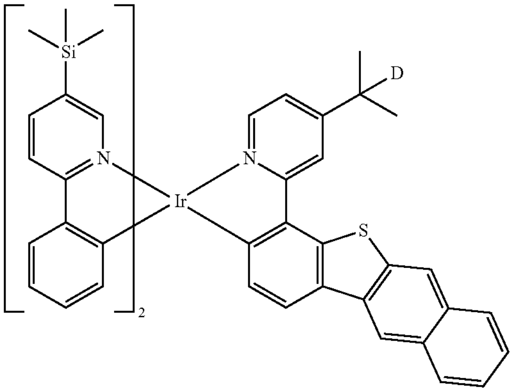
52
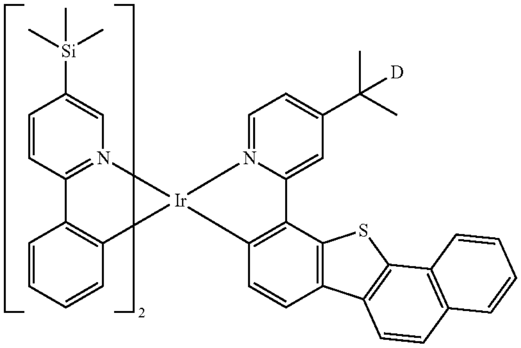
-continued
53
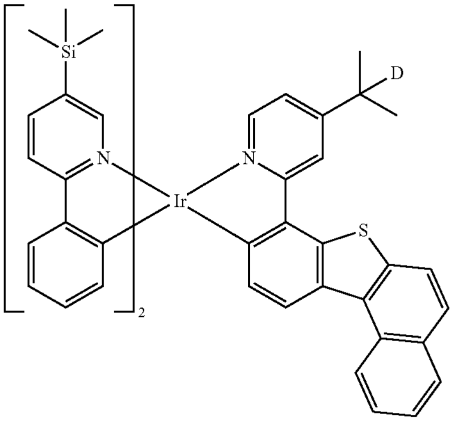
54
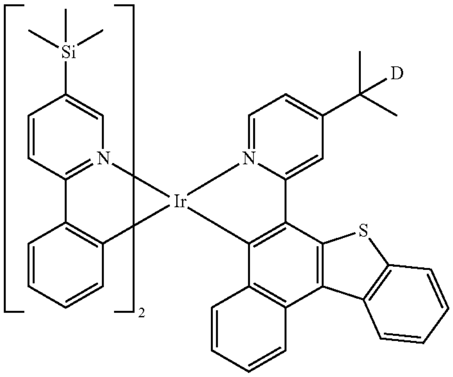
55
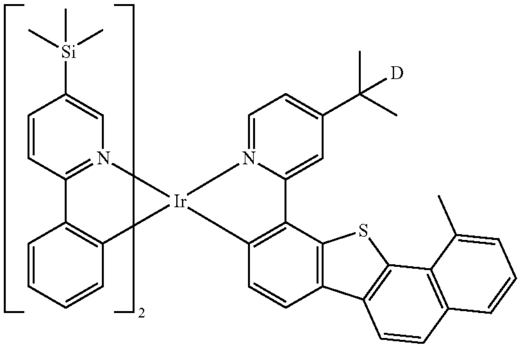
56
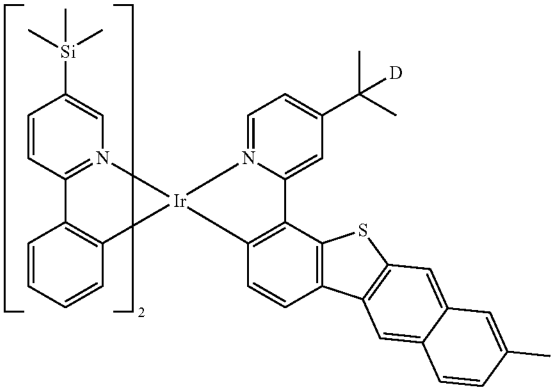

-continued
57
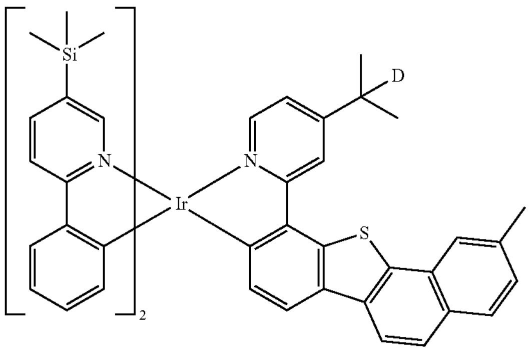
58
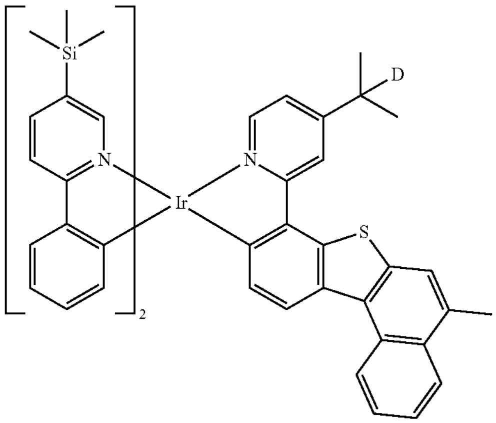
59
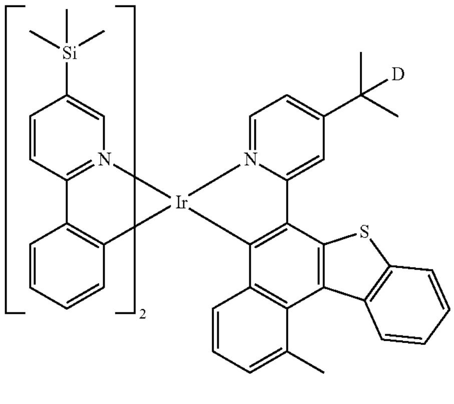
60
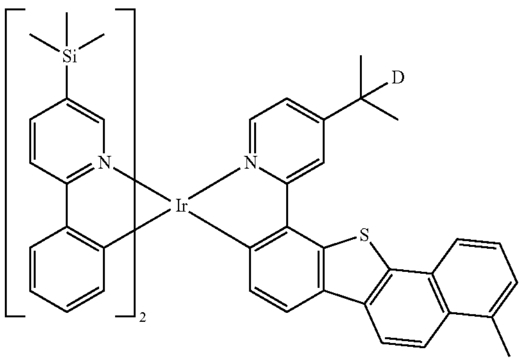
-continued
61
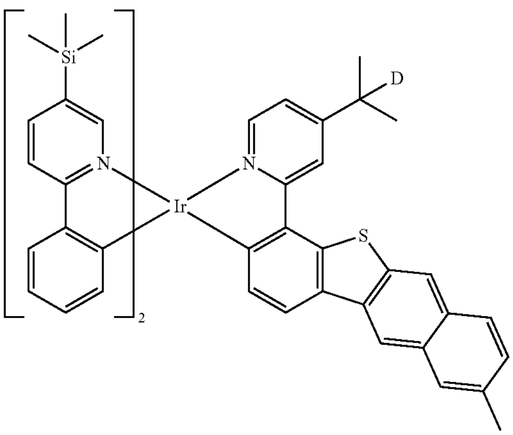
62
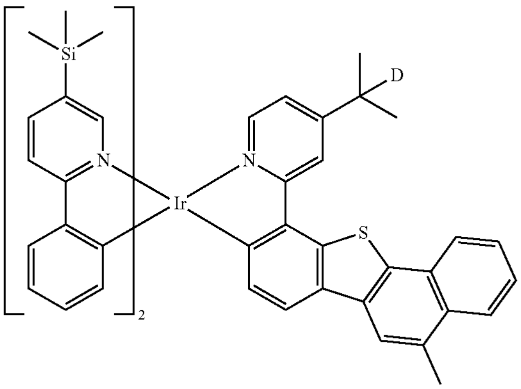
63
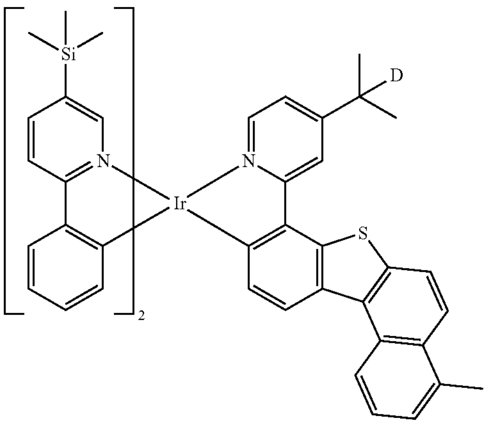

-continued
64
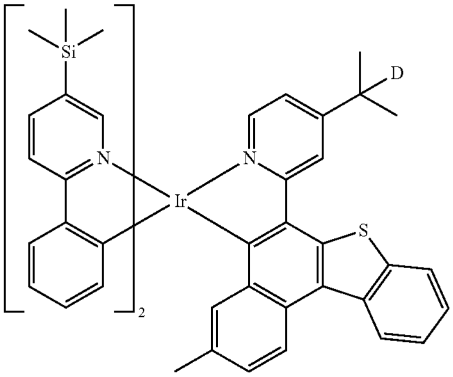
65
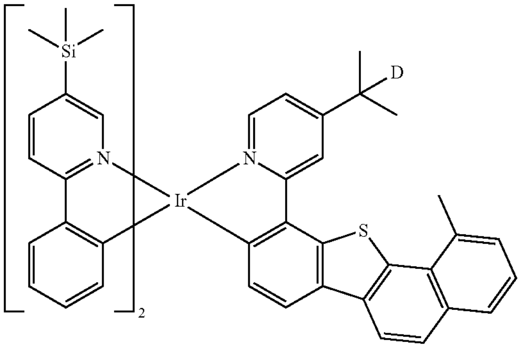
66
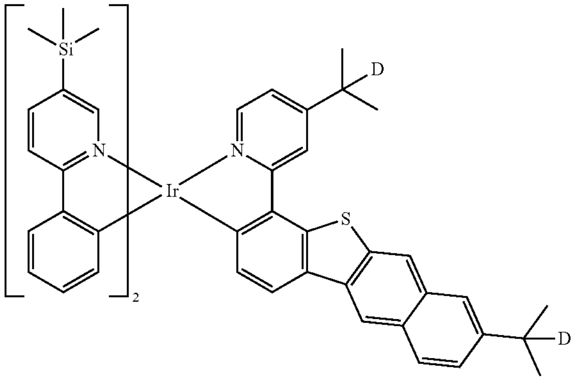
67
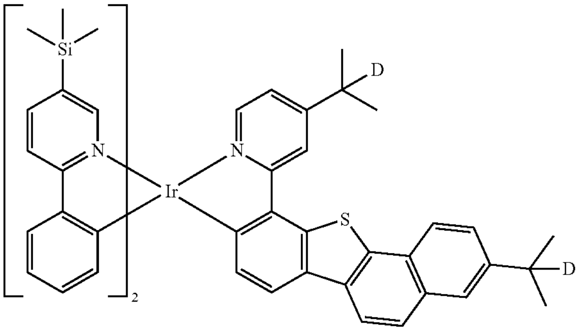
-continued
68
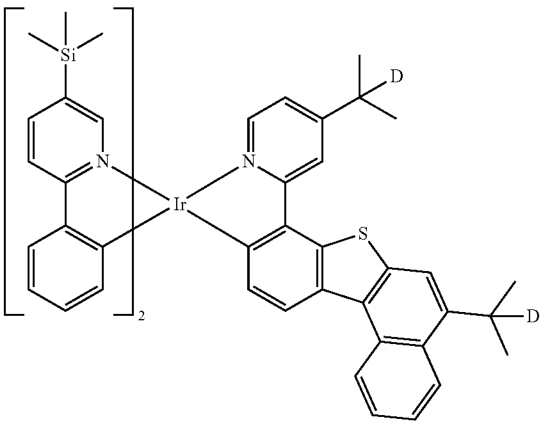
69
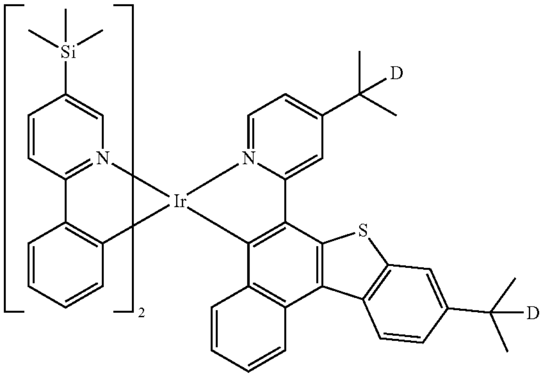
70
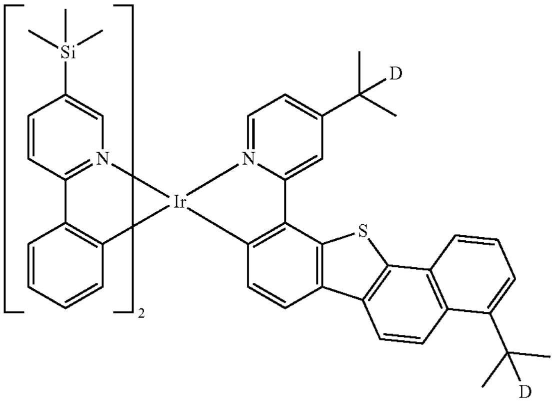

-continued
71
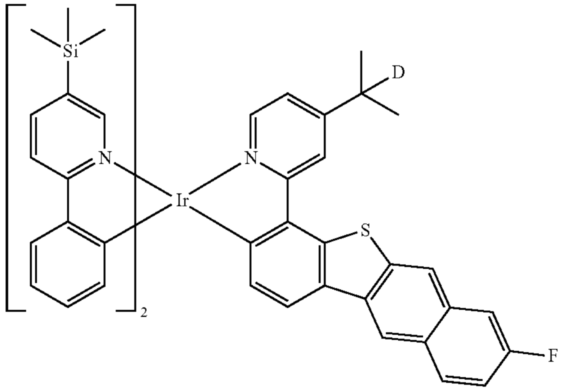
72
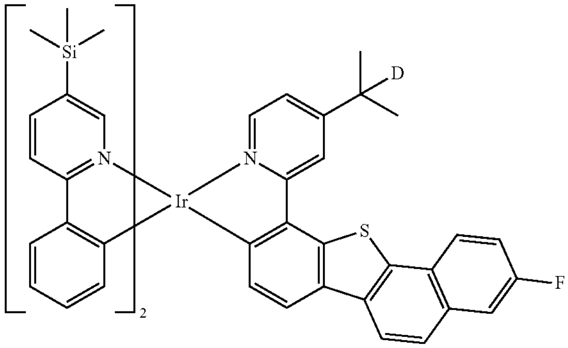
73
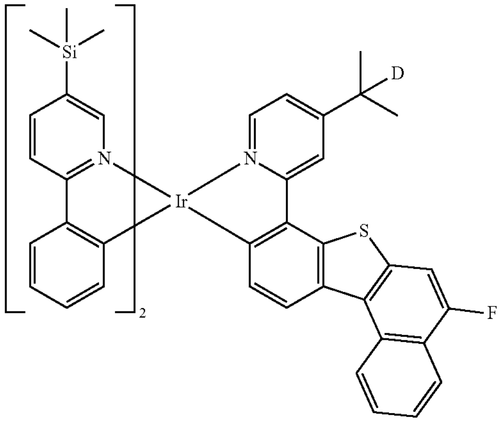
74
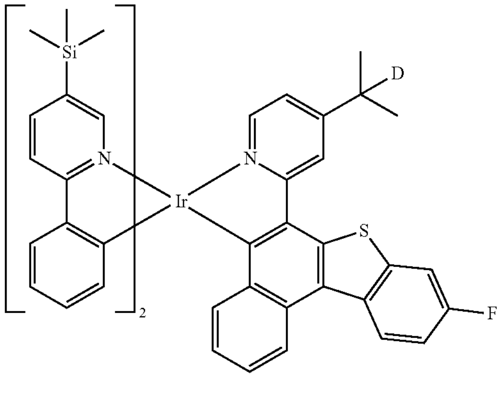
-continued
75
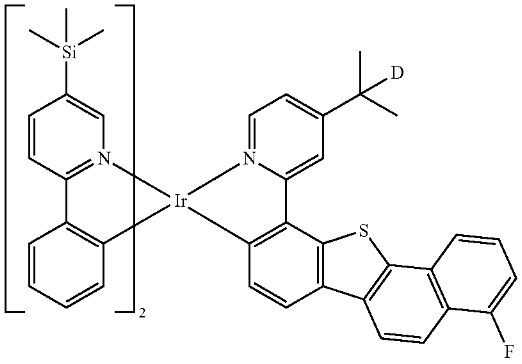
76
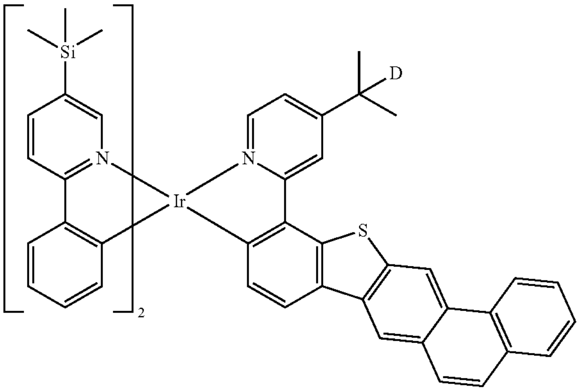
77
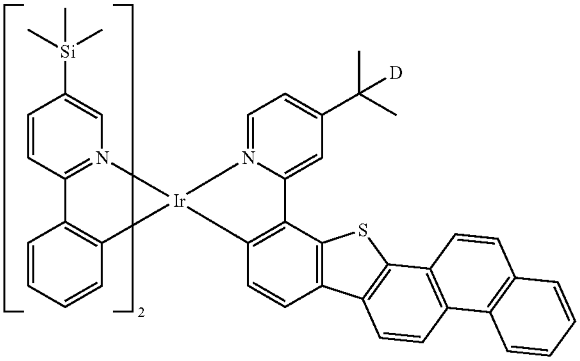
78
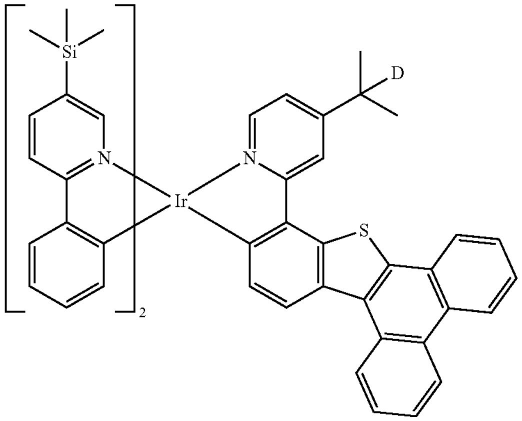

-continued
79
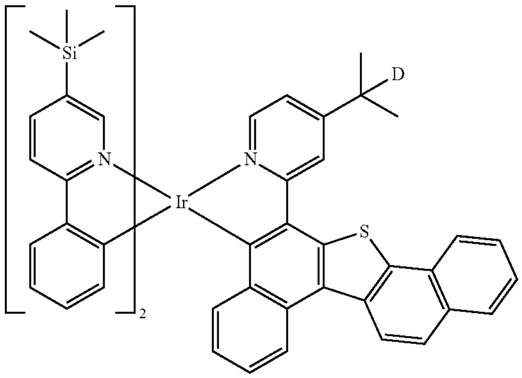
80
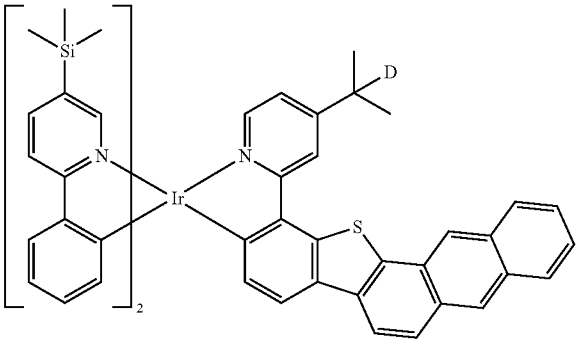
81
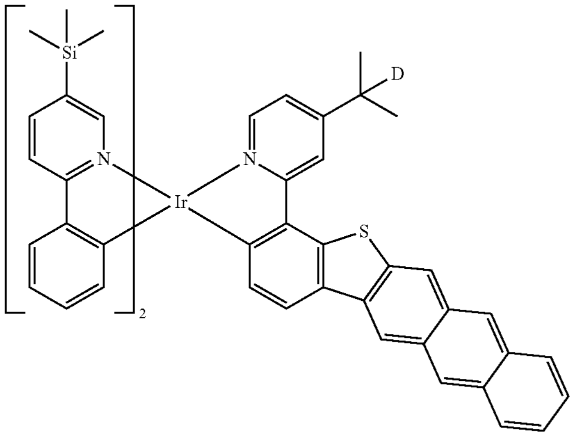
82
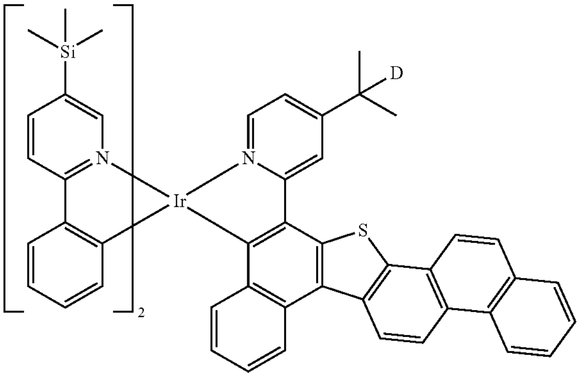
-continued
83
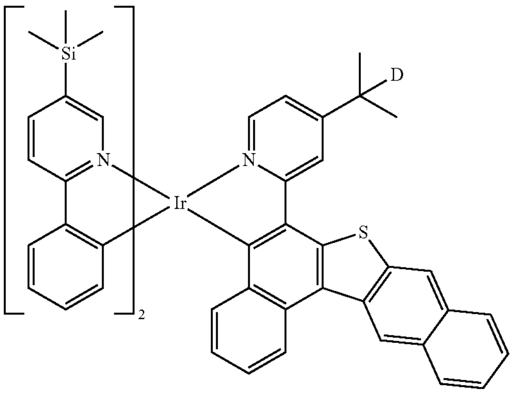
84
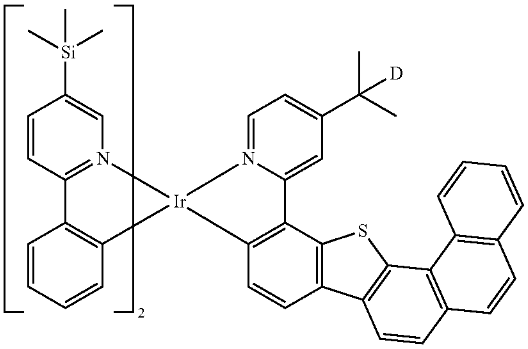
85
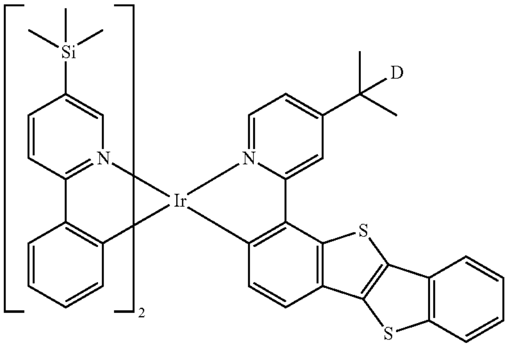
86
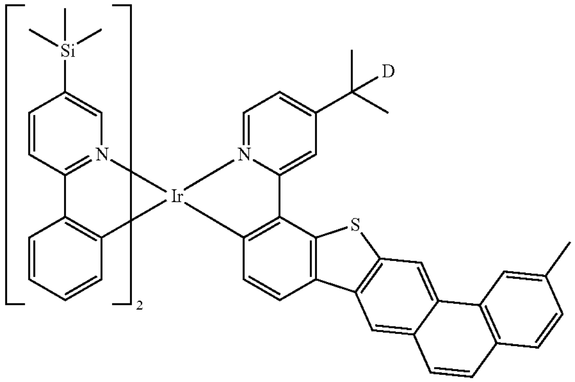

-continued
87
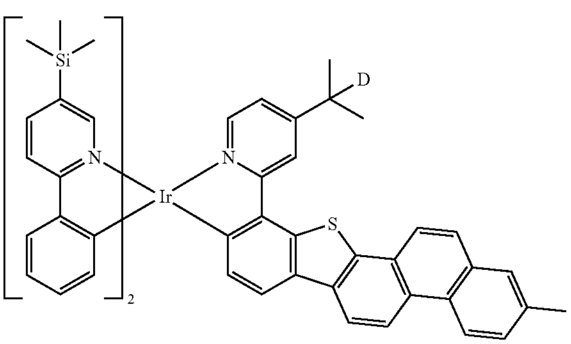
88
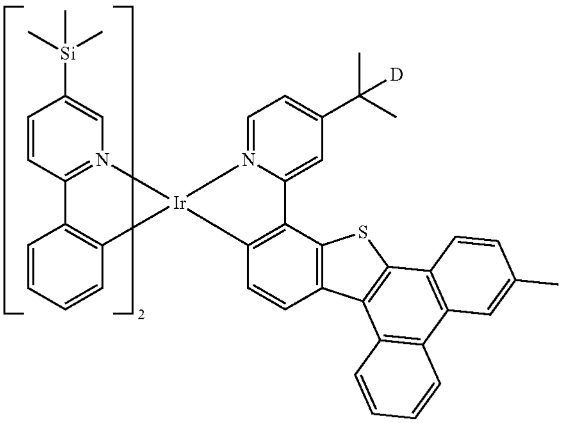
89
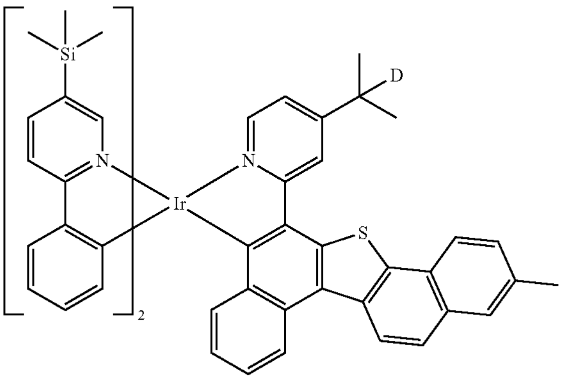
90
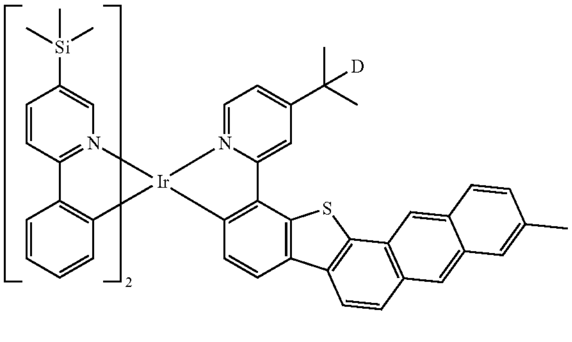
-continued
91
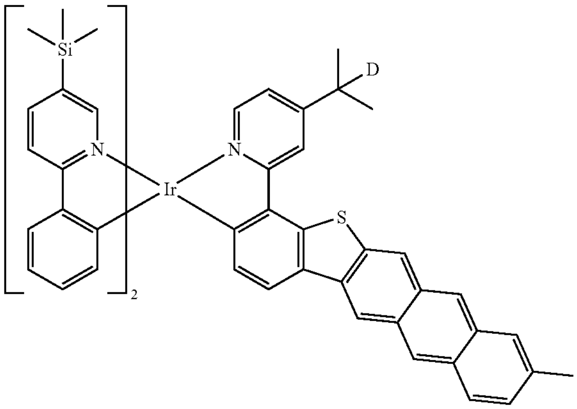
92
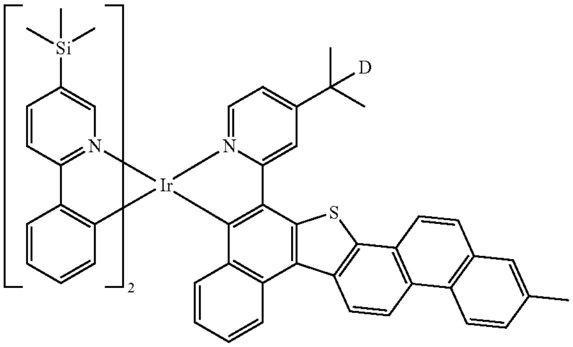
93
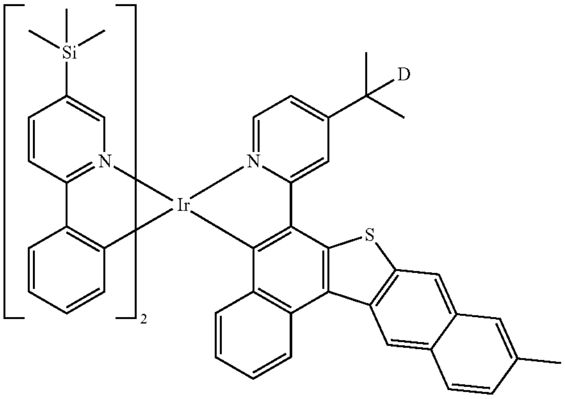
94
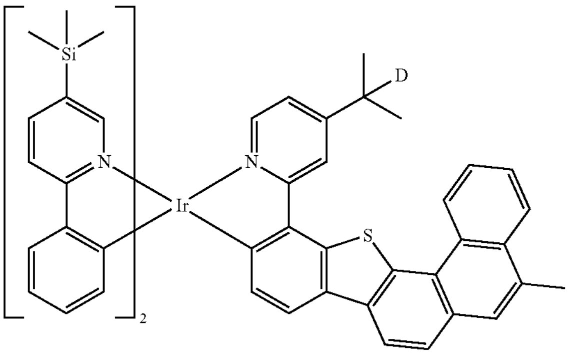

-continued
95
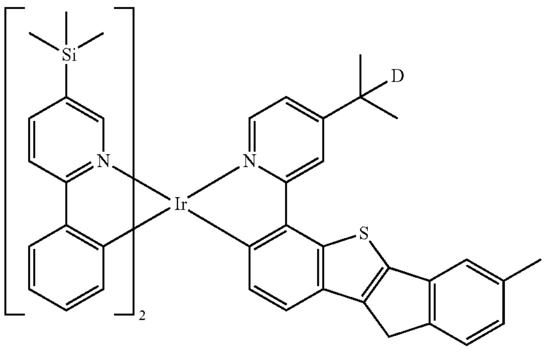
96
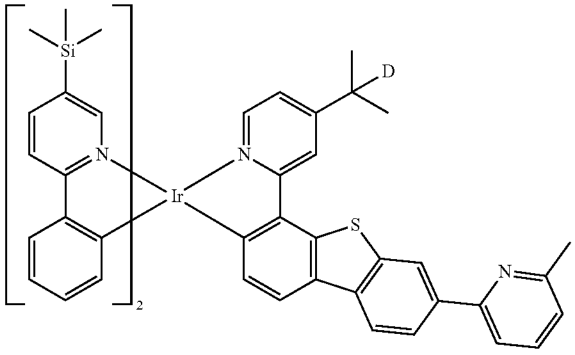
97
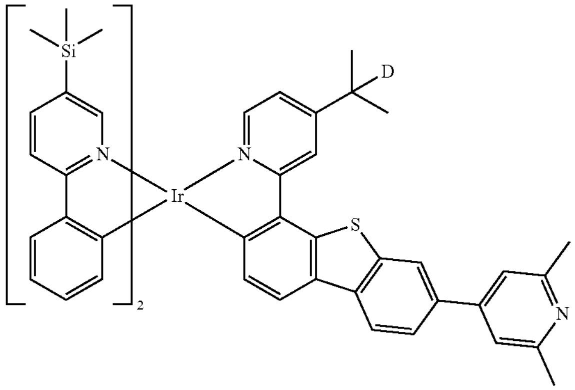
98
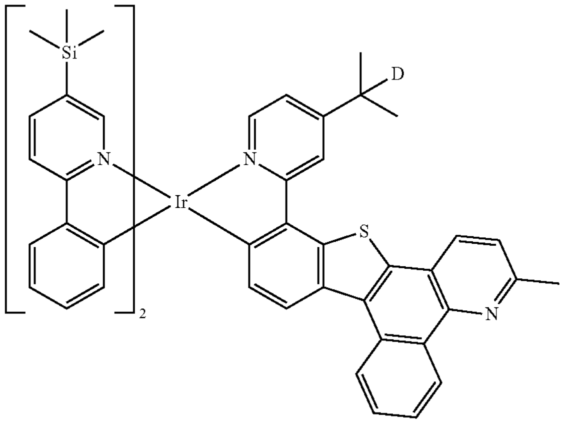
-continued
99
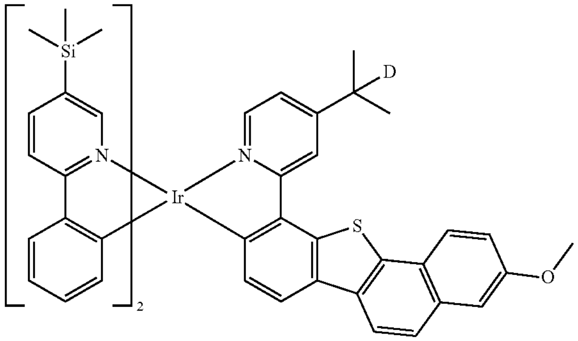
100
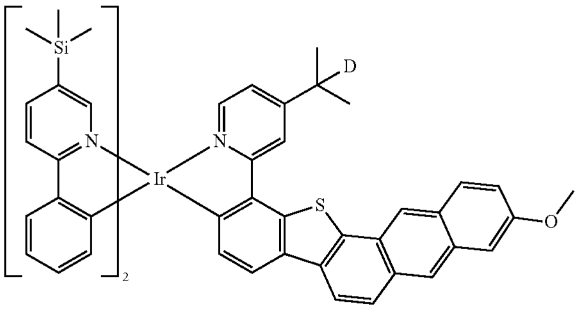
101
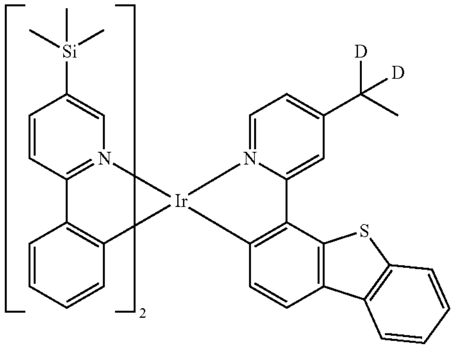
102
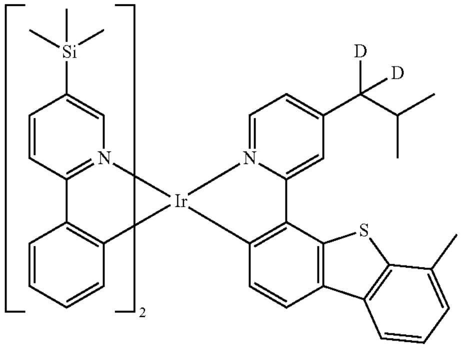

103
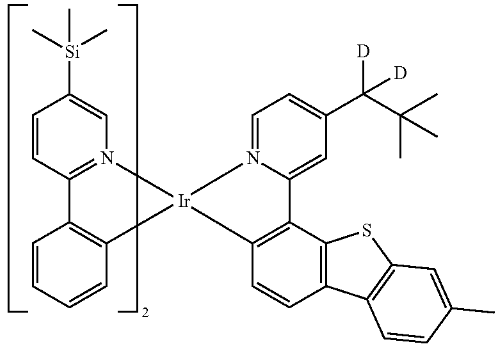
104
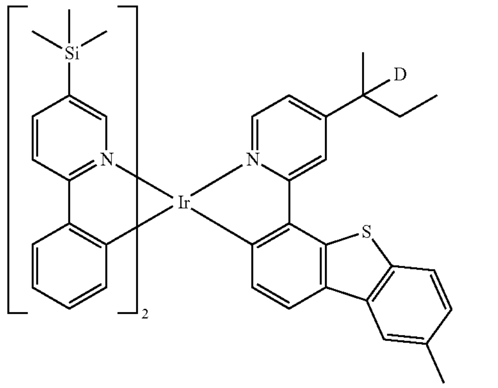
105
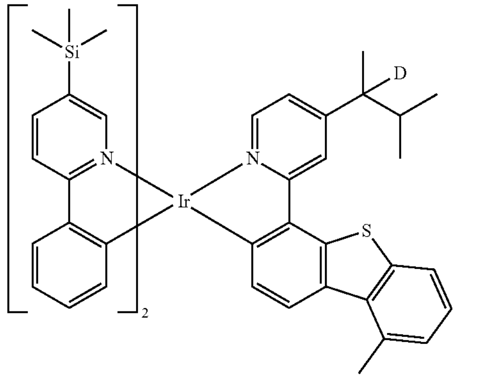
106
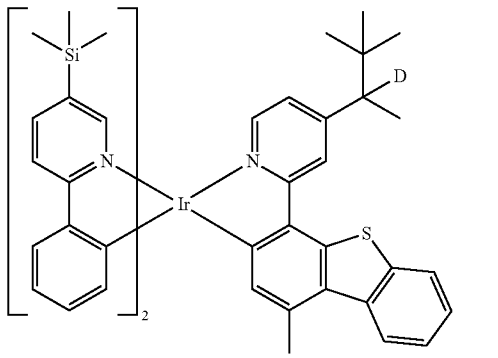
107
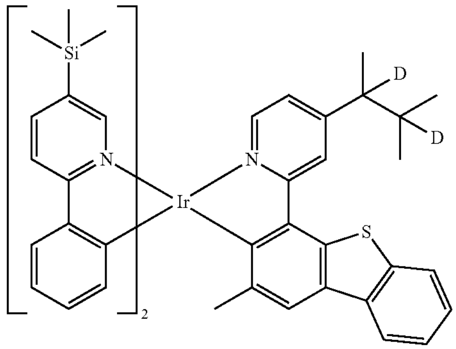
108
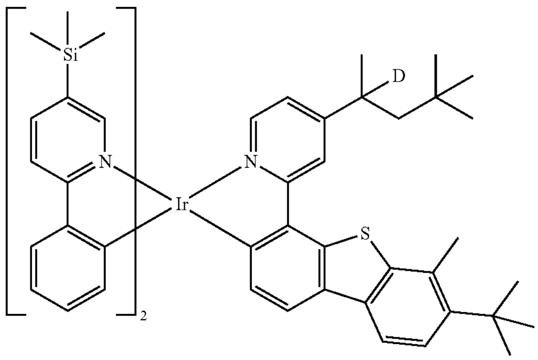
109
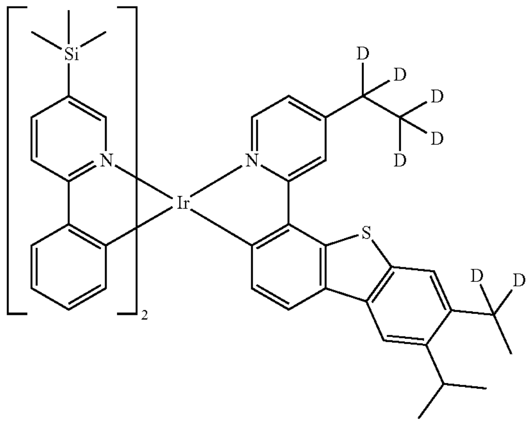
110
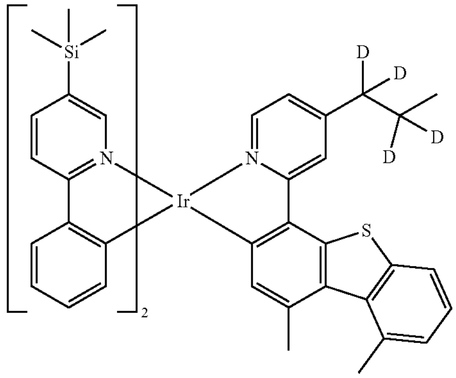

-continued
111
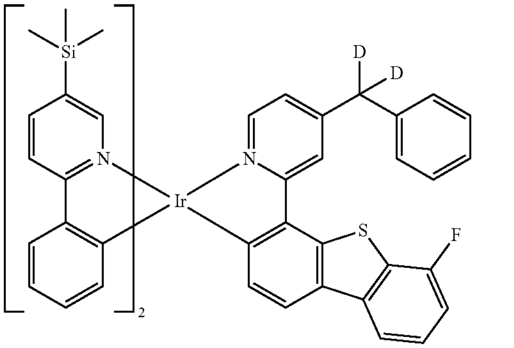
112
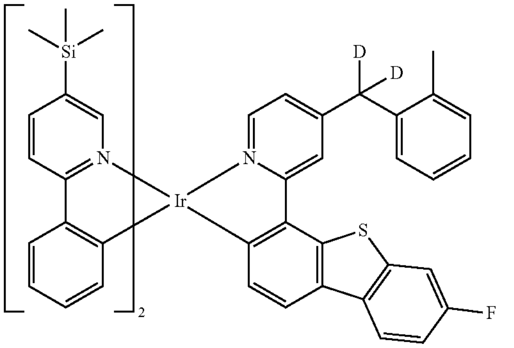
113
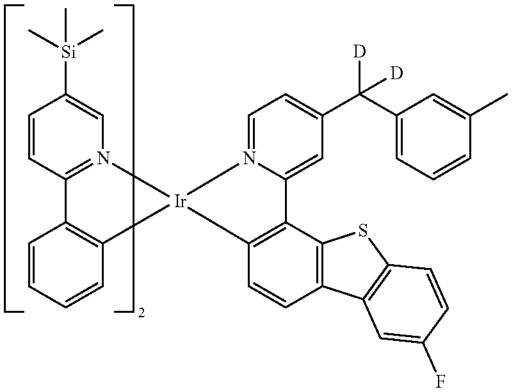
114
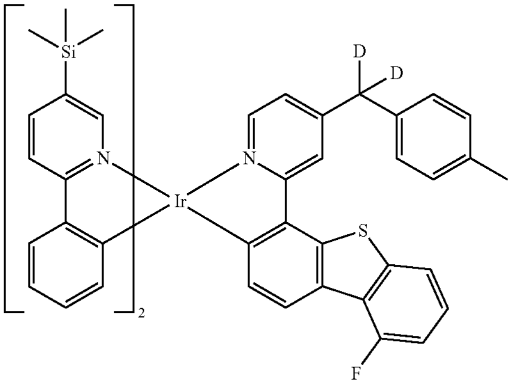
-continued
115
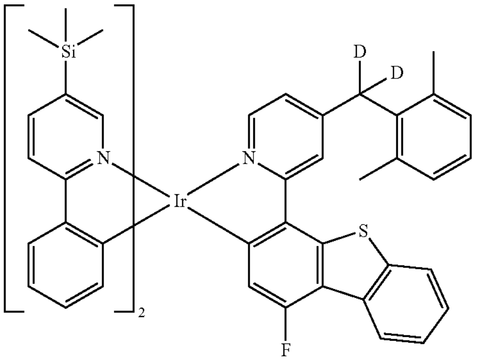
116
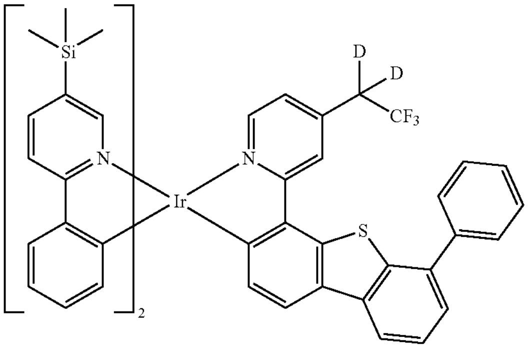
117
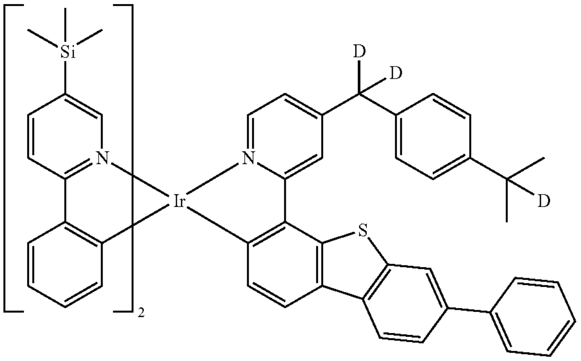
118
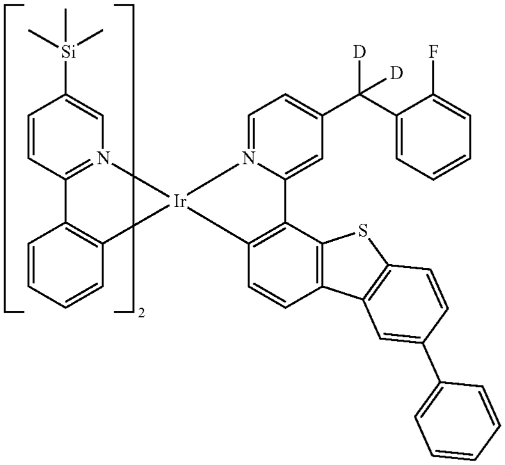

-continued
119
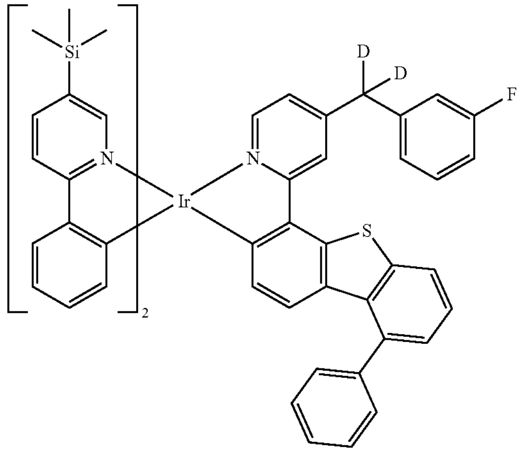
120
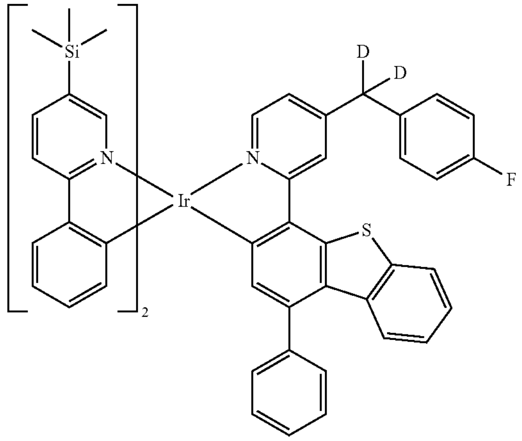
121
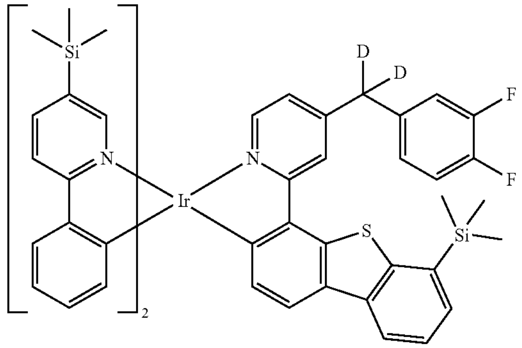
-continued
122
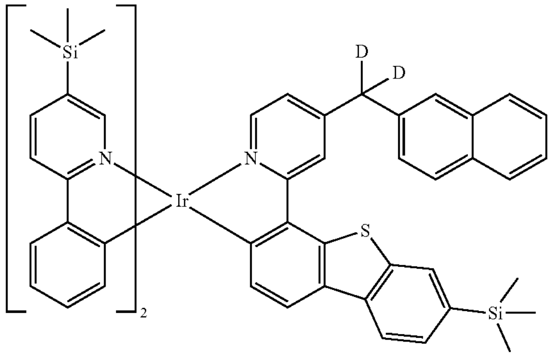
123
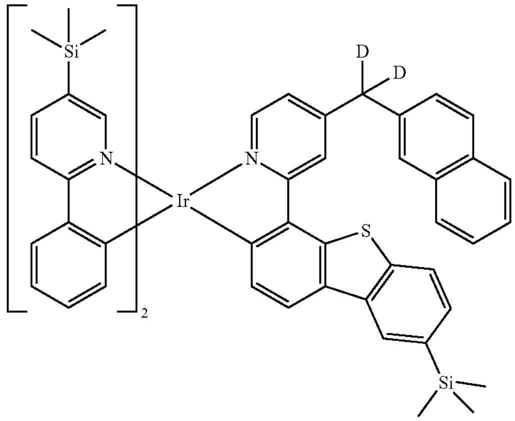
124
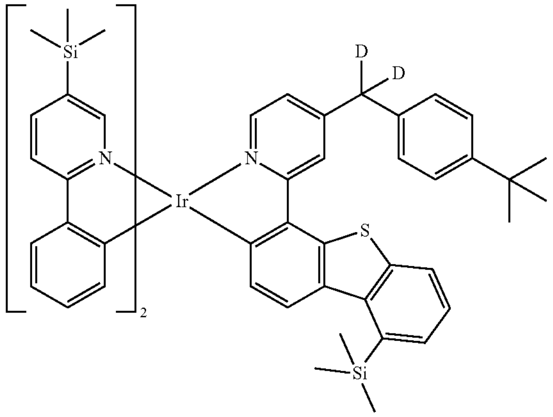

-continued
125
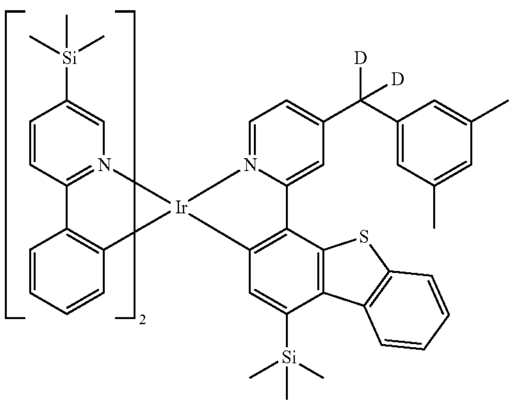
126
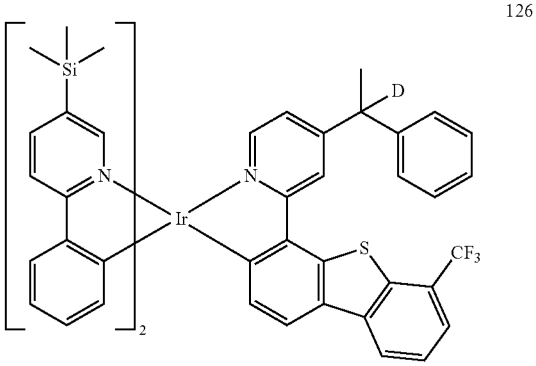
127
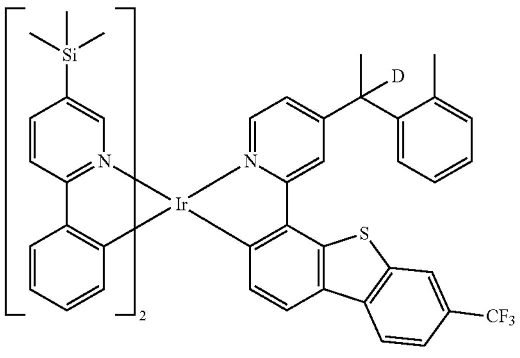
128
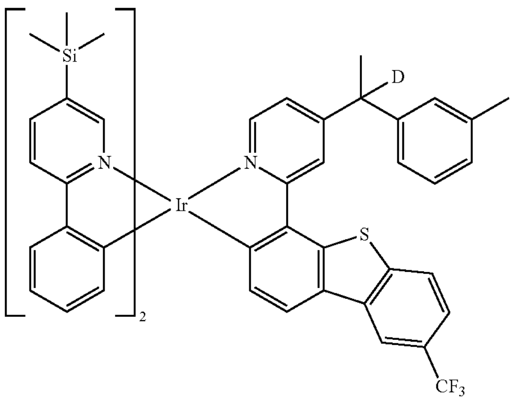
-continued
129
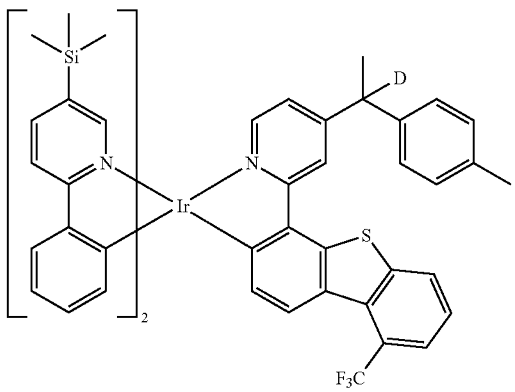
130
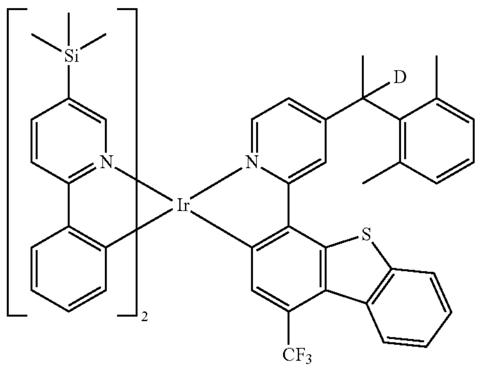
131
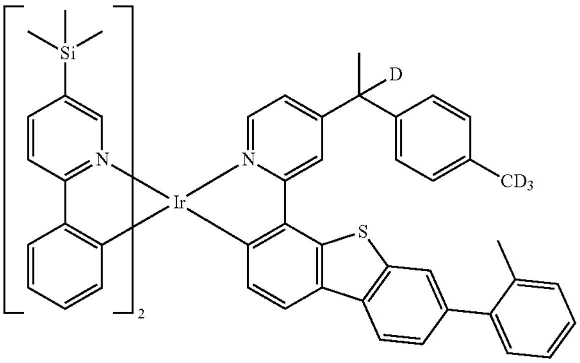
132
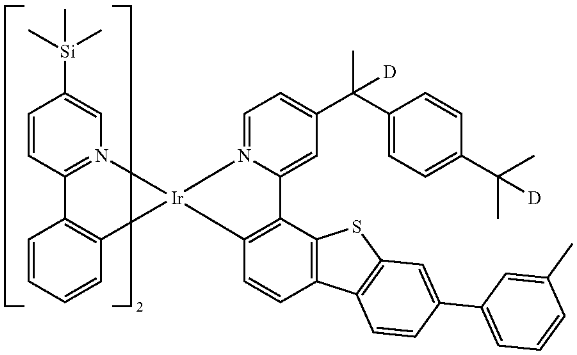

-continued
133
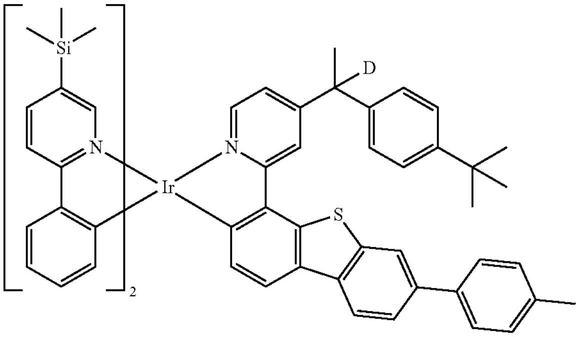
134
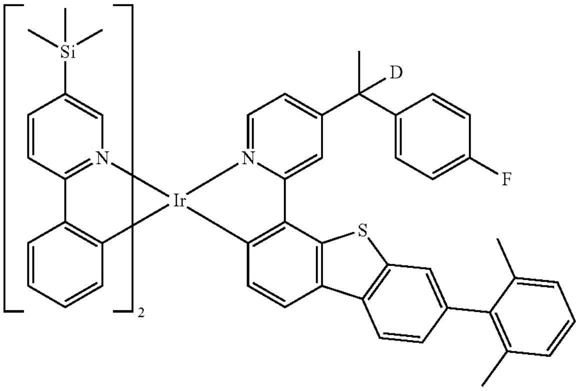
135
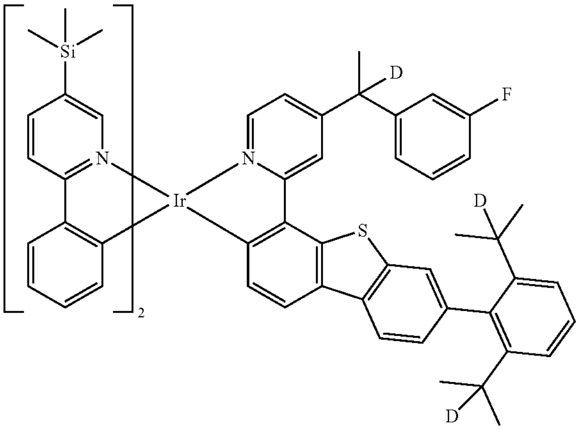
136
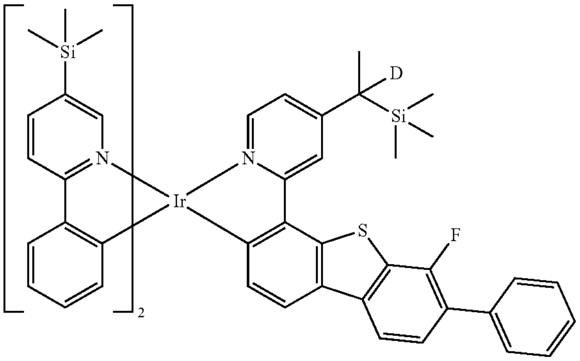
137
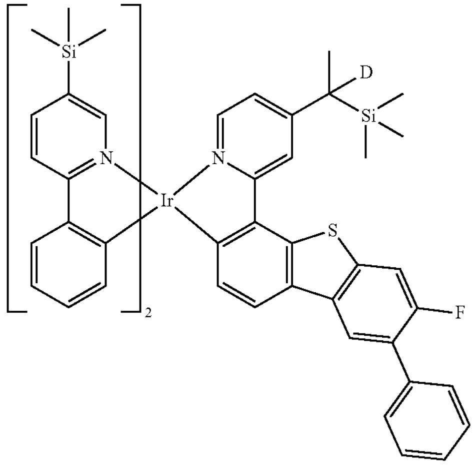
138
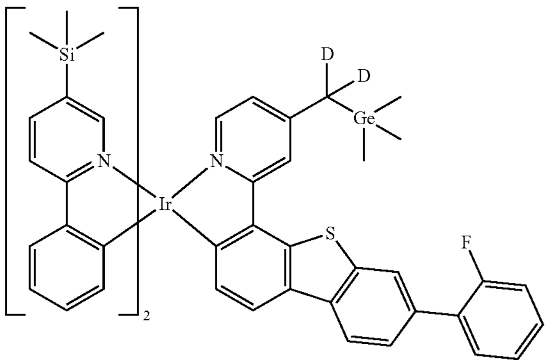
139
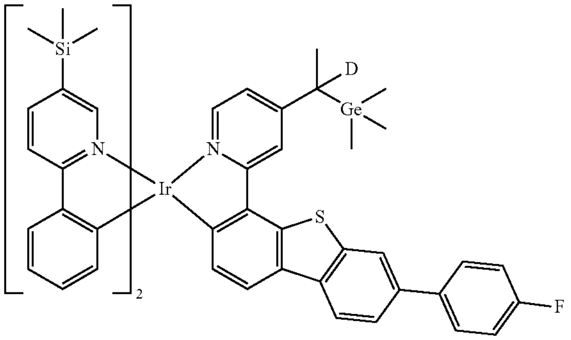
140
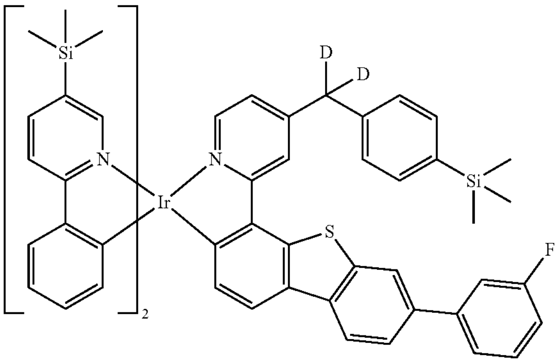

-continued
141
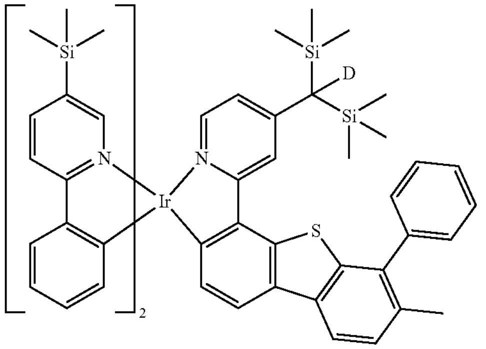
142
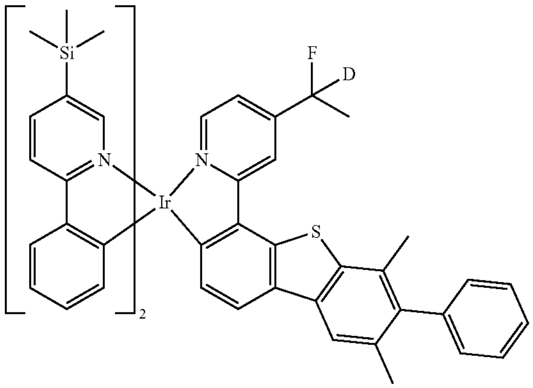
143
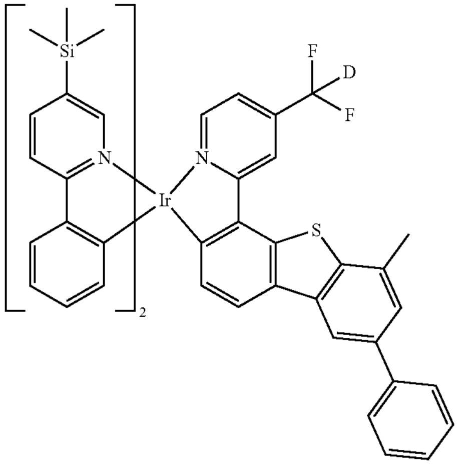
-continued
144
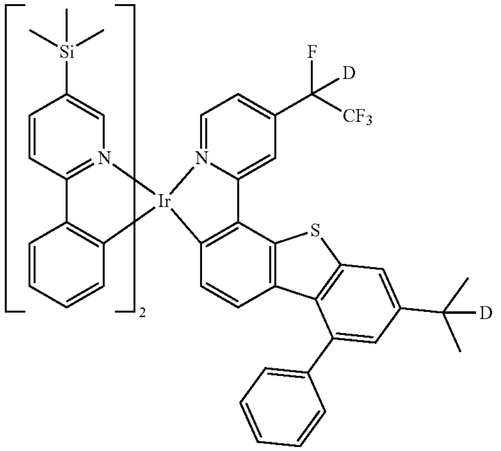
145
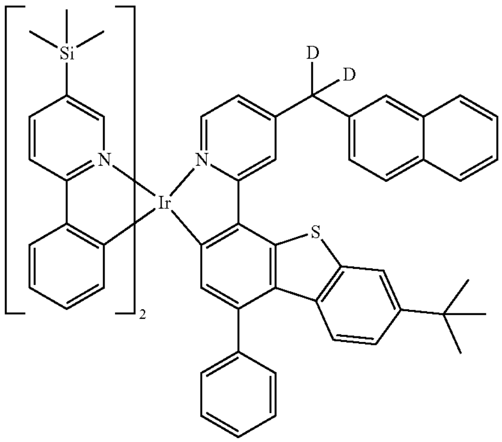
146
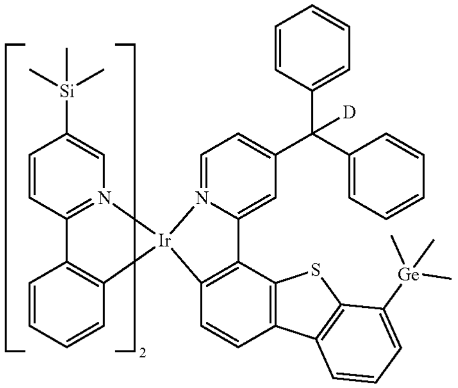

-continued
147
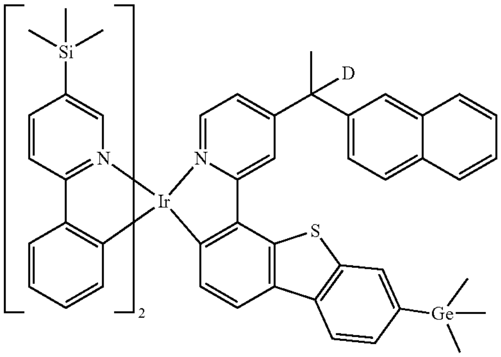
148
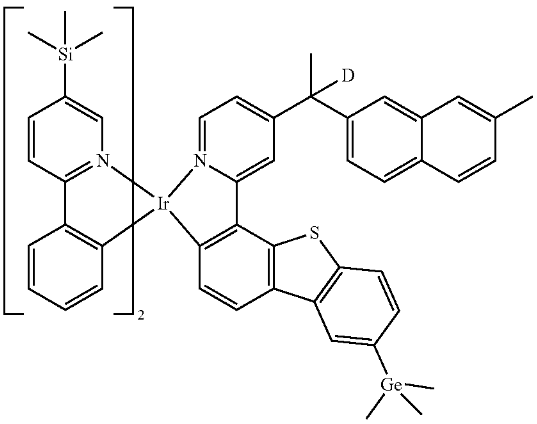
149
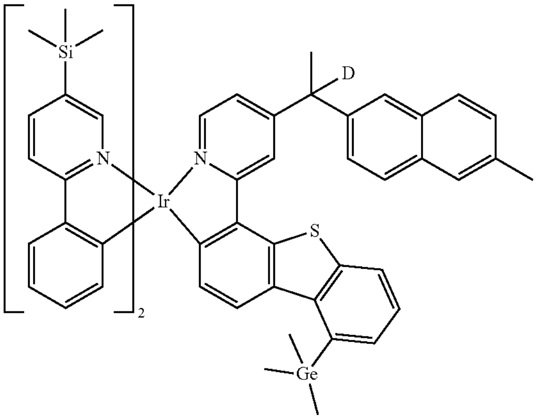
-continued
150
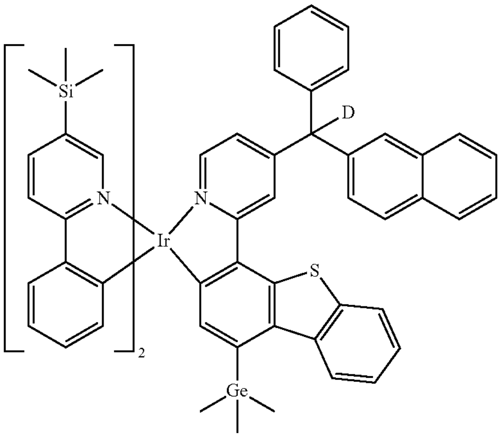
151
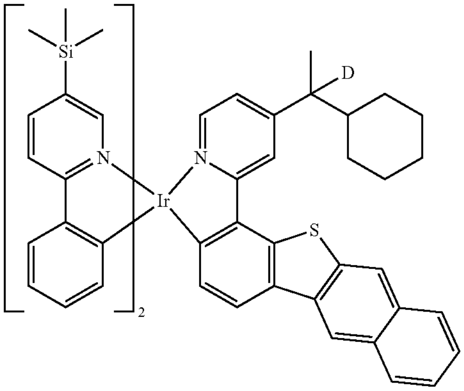
152
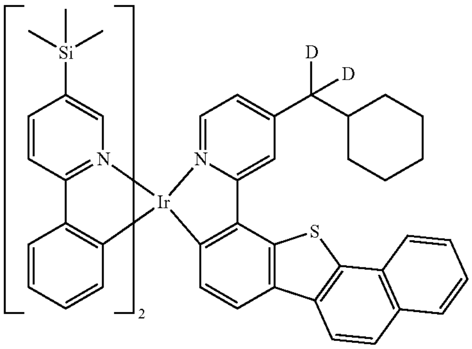
153
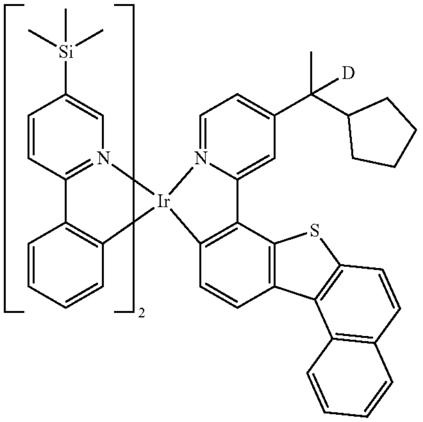

-continued
154
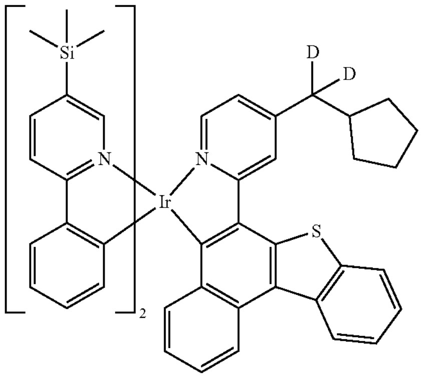
155
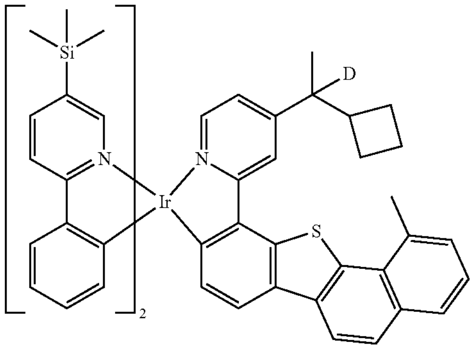
156
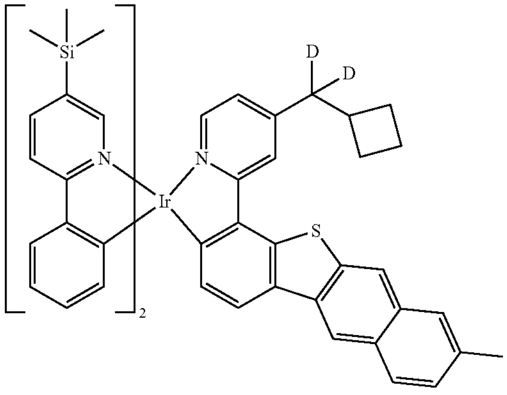
157
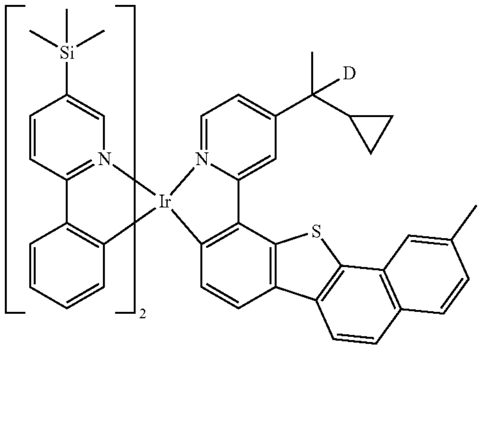
-continued
158
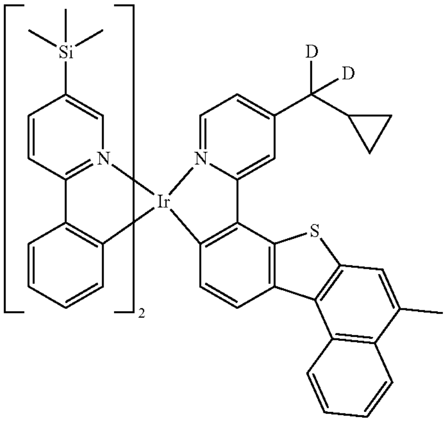
159
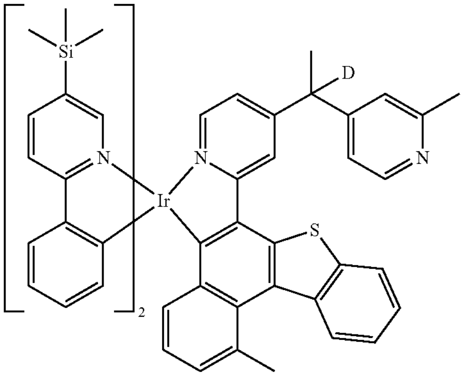
160
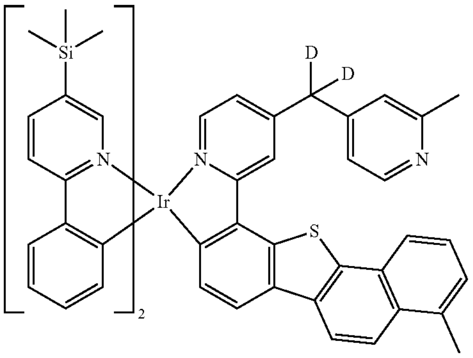
161
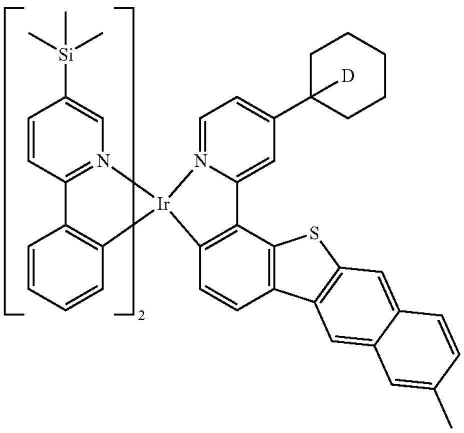

162
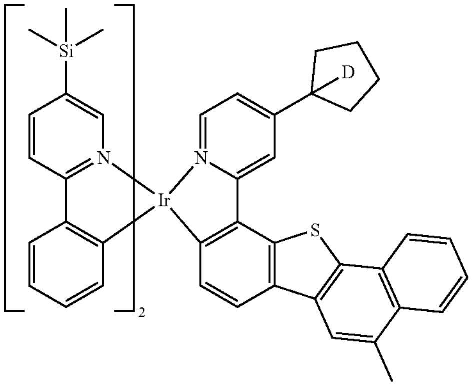
163
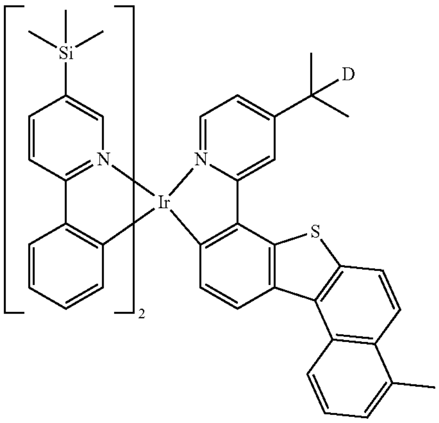
164
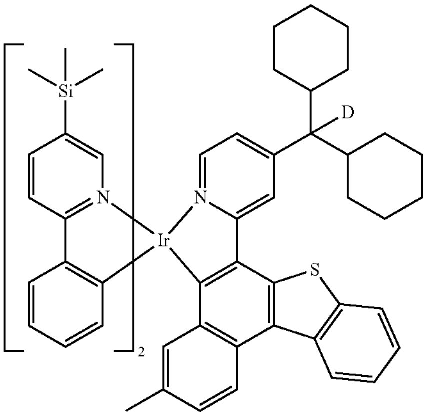
165
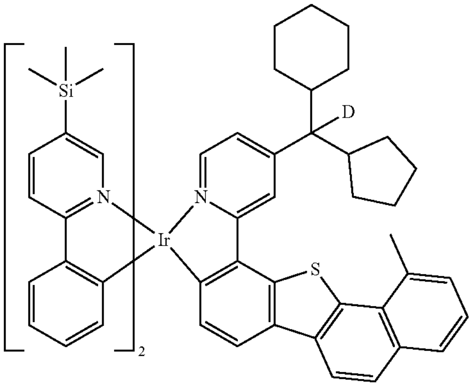
166
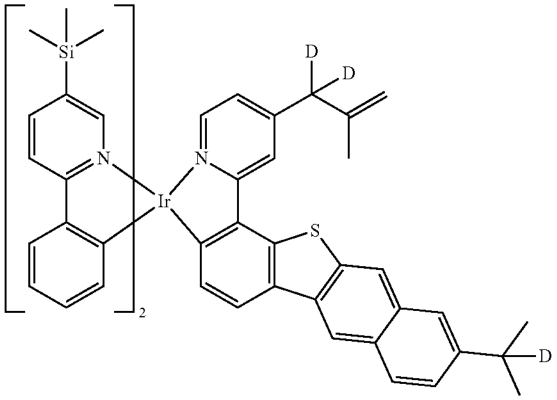
167
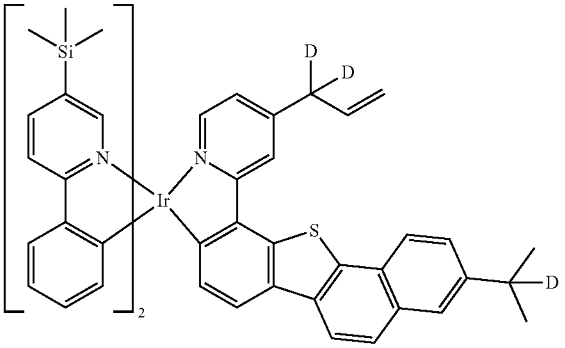
168
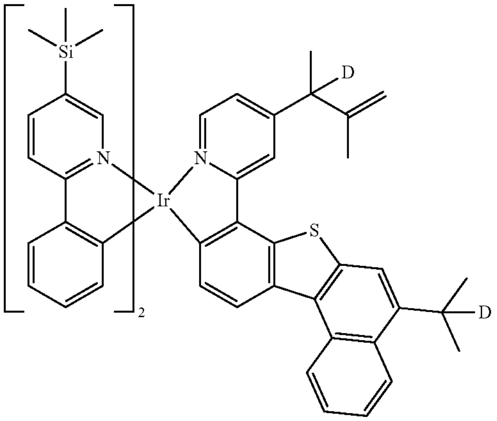
169
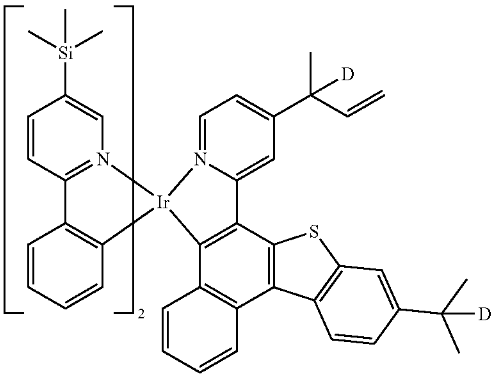

-continued
170
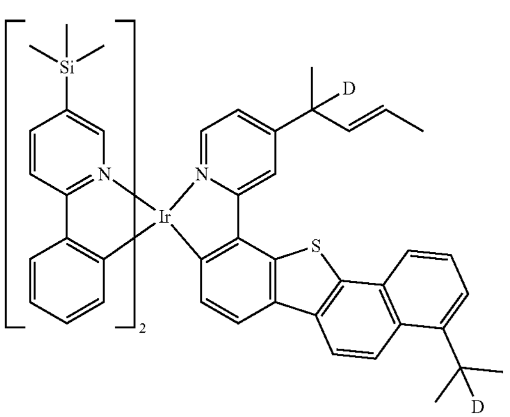
171
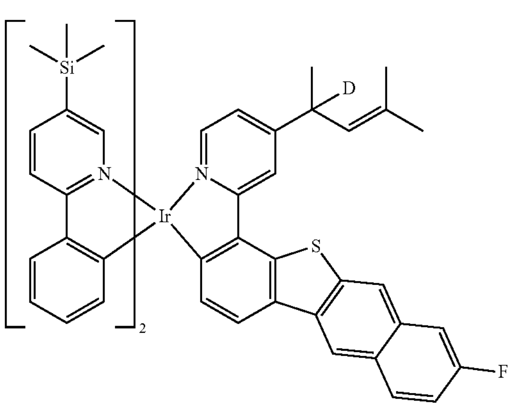
172
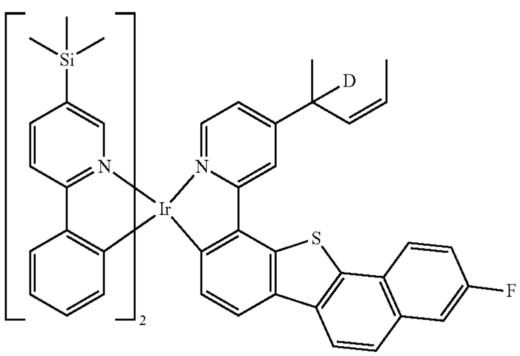
173
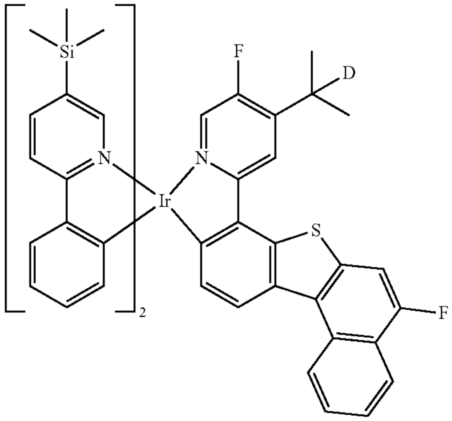
-continued
174
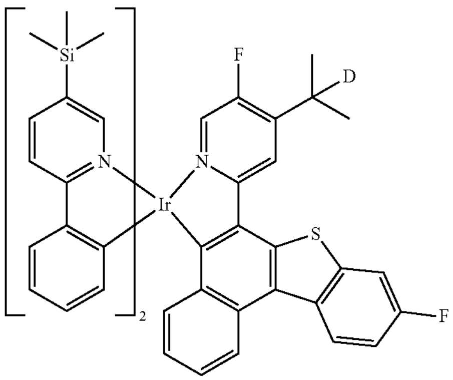
175
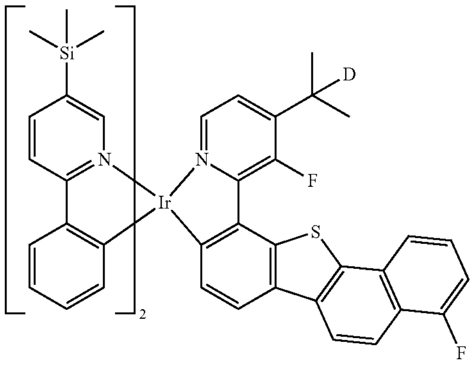
176
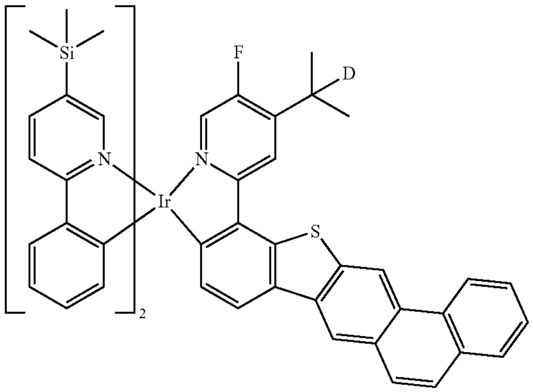
177
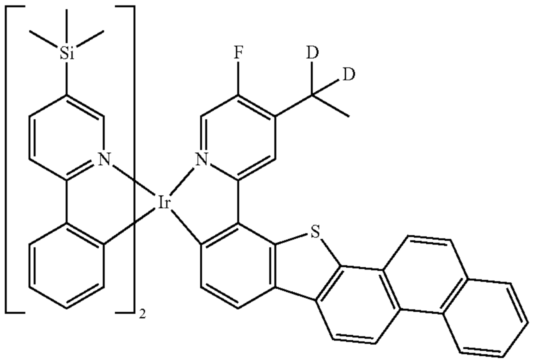

-continued
178
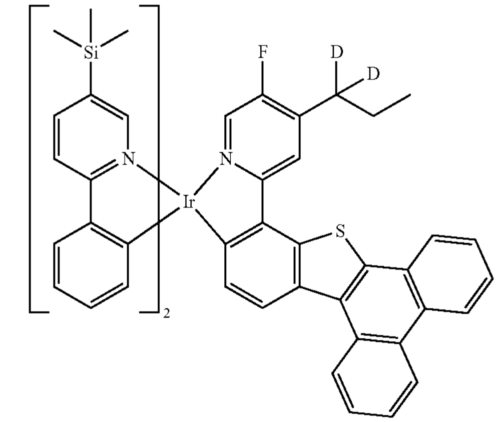
179
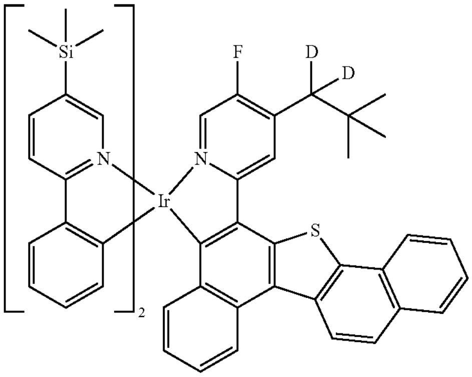
180
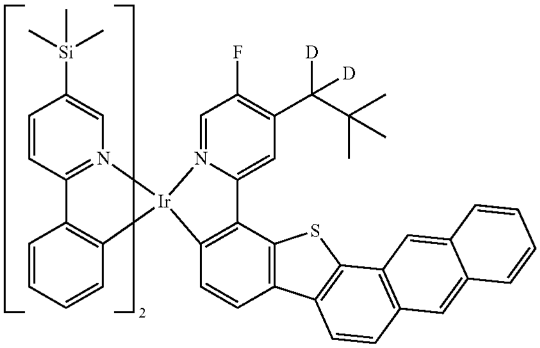
181
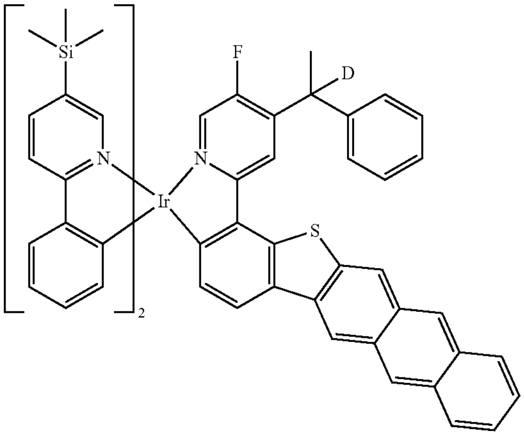
-continued
182
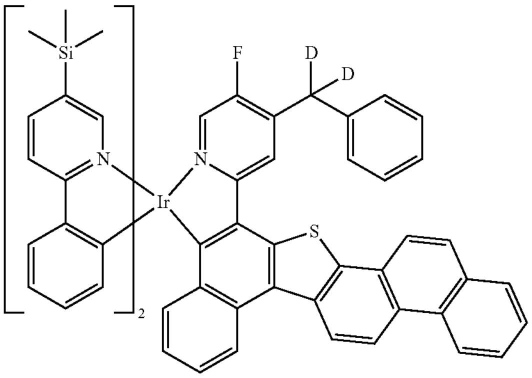
183
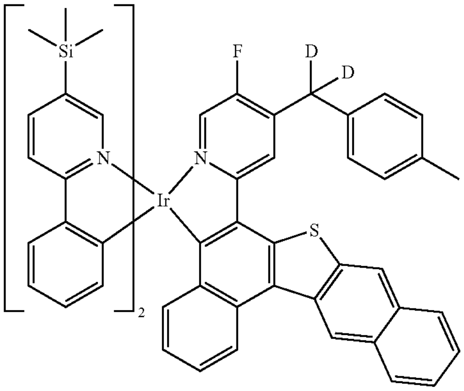
184
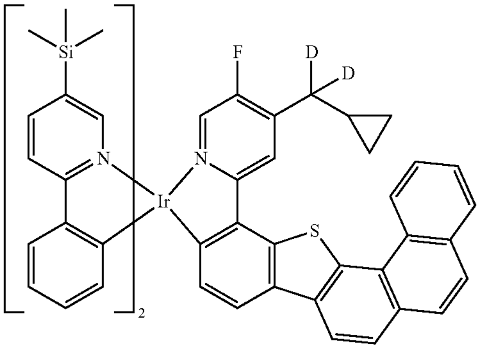
185
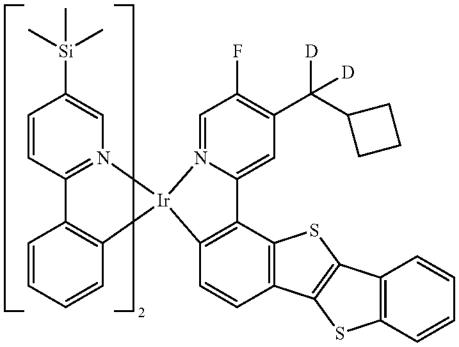

186
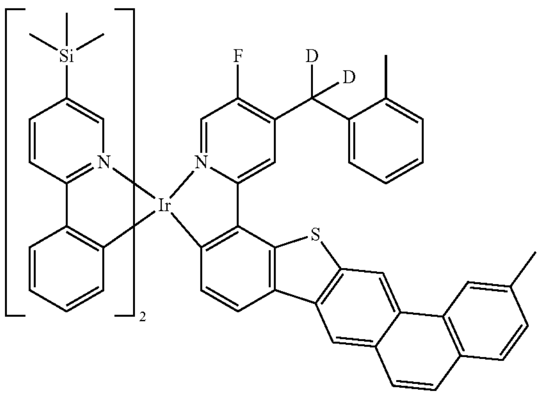
187
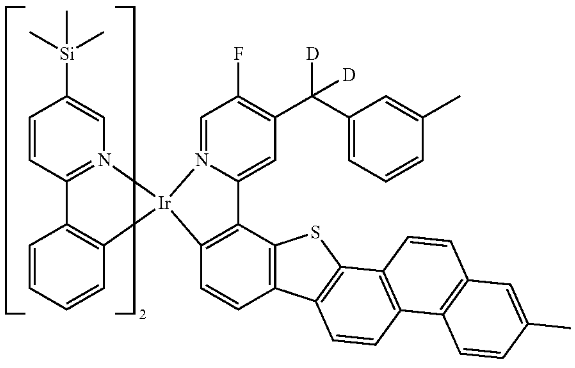
188
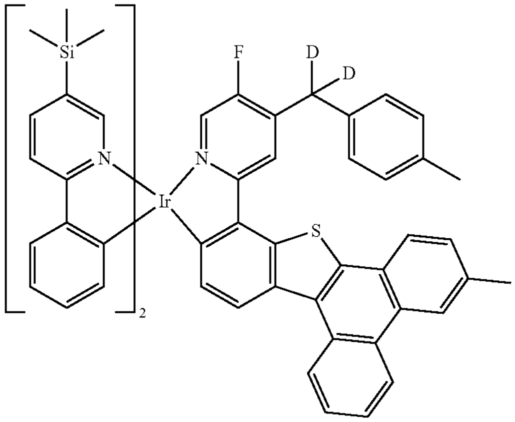
189
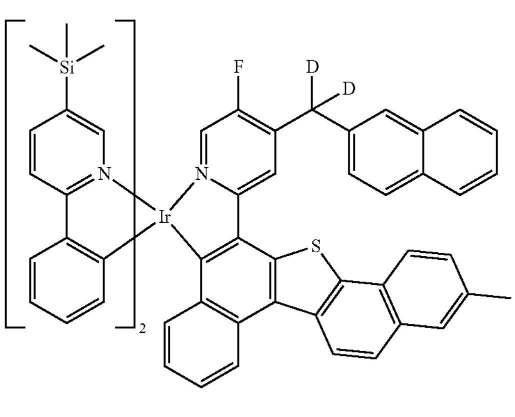
190
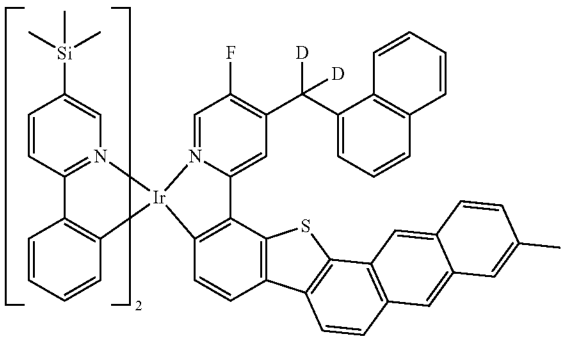
191
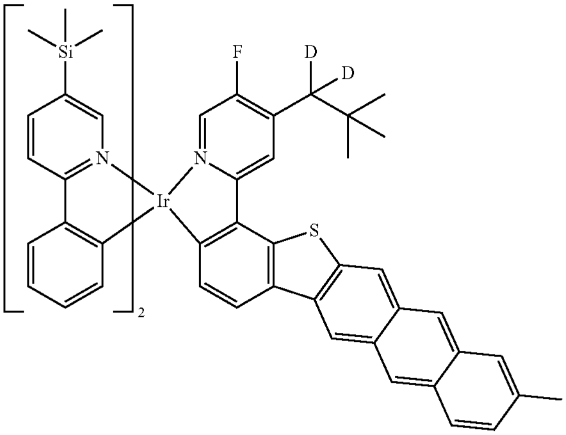
192
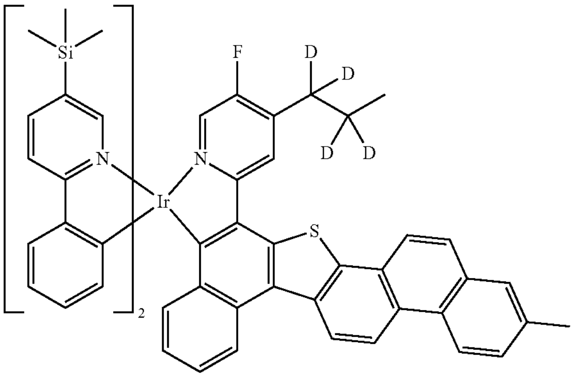
193
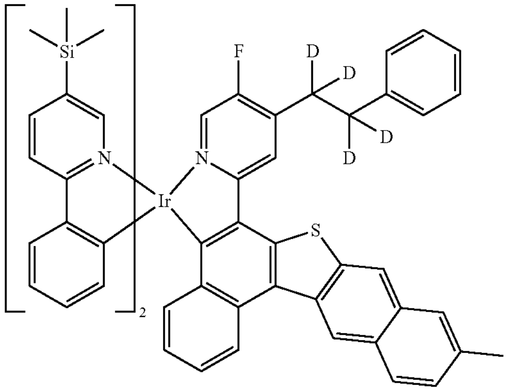

-continued
194
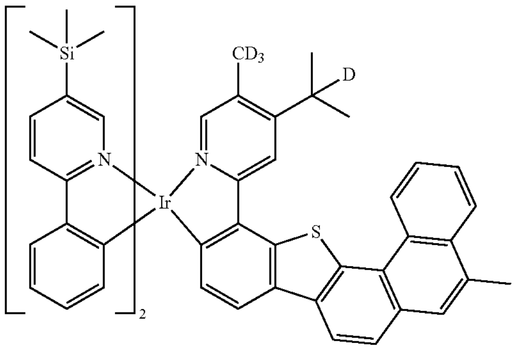
195
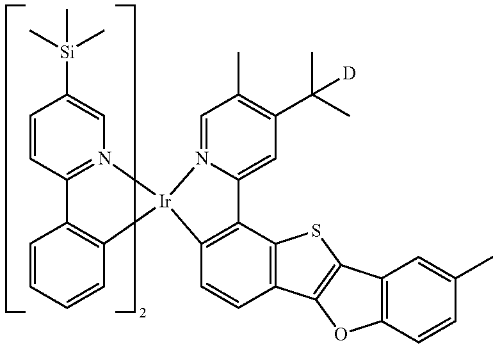
196
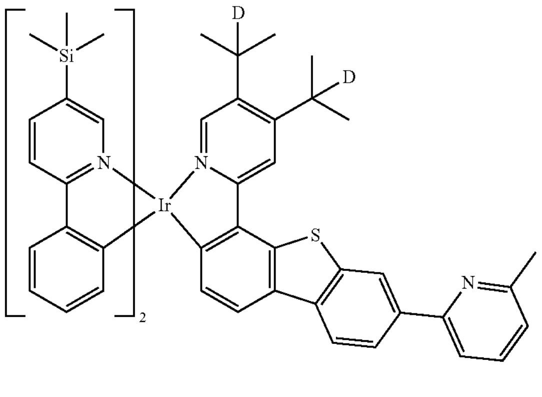
197
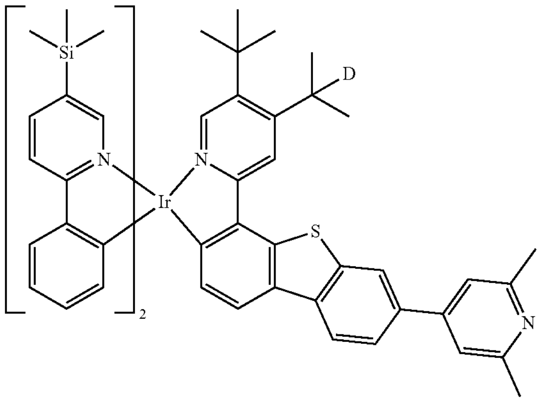
-continued
198
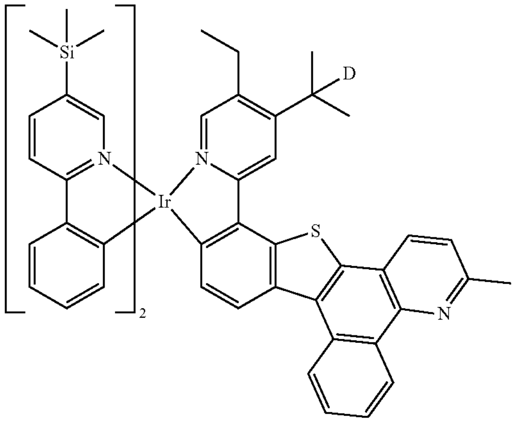
199
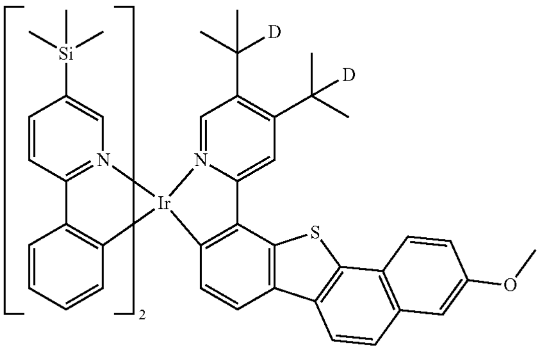
200
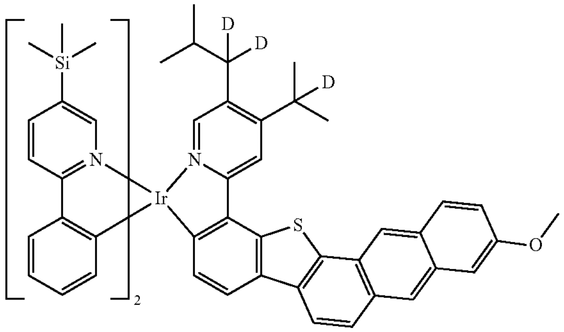
201
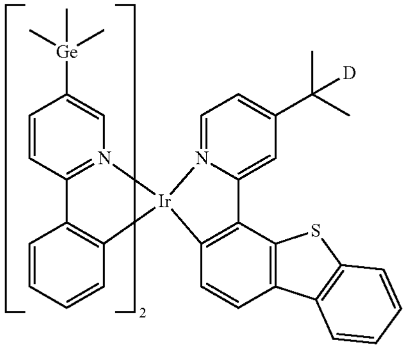

-continued
202
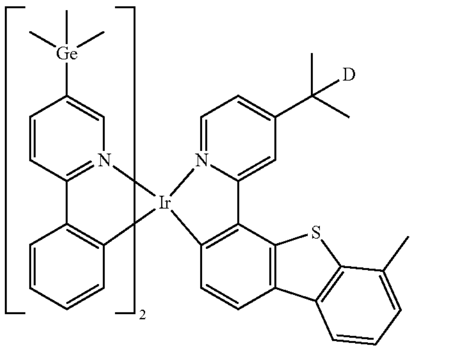
203
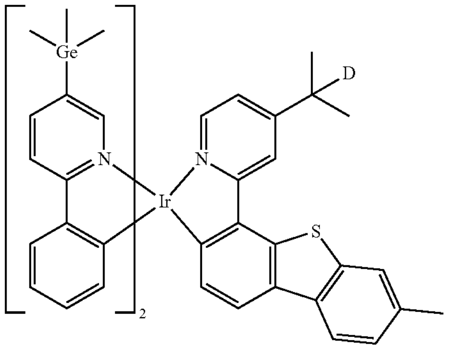
204
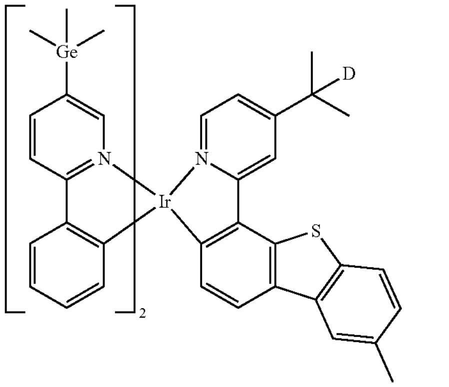
205
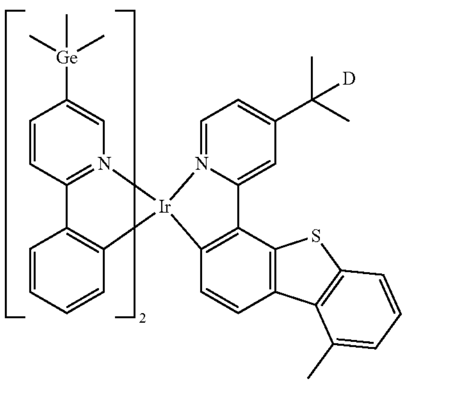
-continued
206
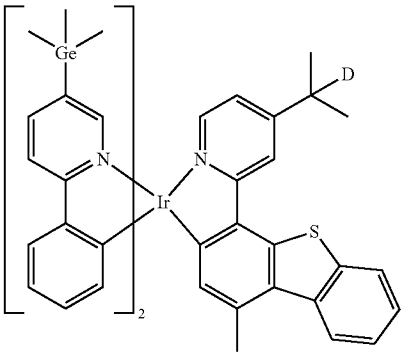
207
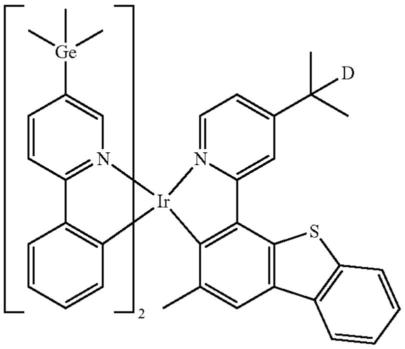
208
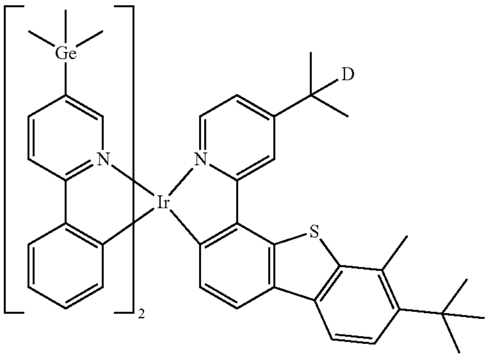
209
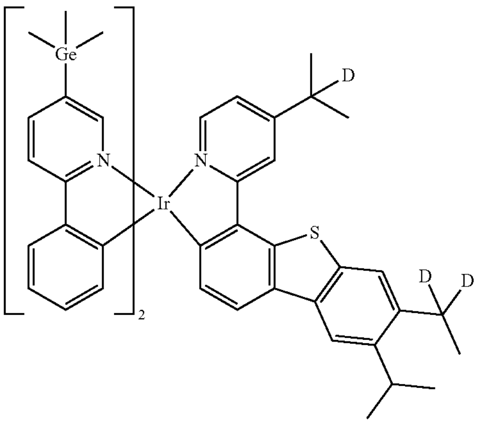

-continued
210
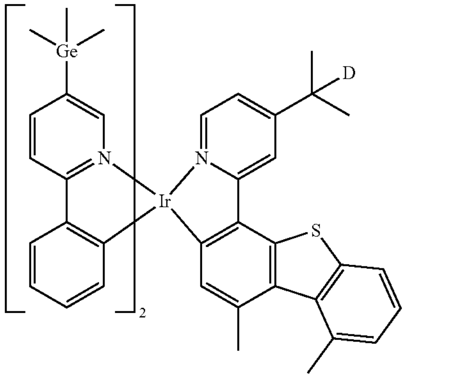
211
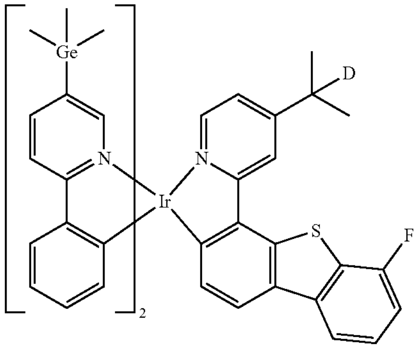
212
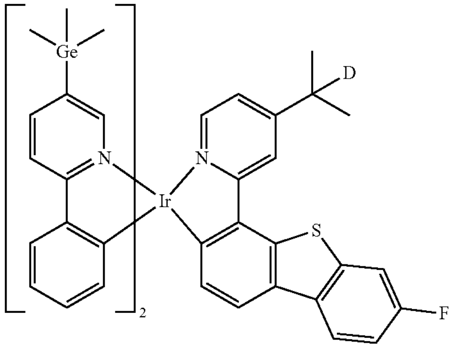
213
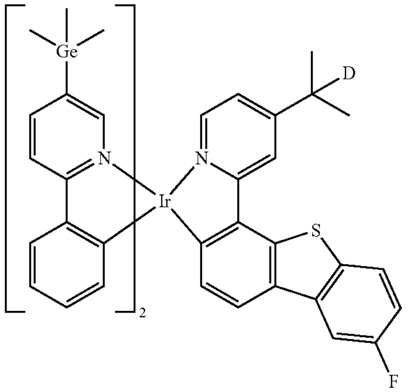
-continued
214
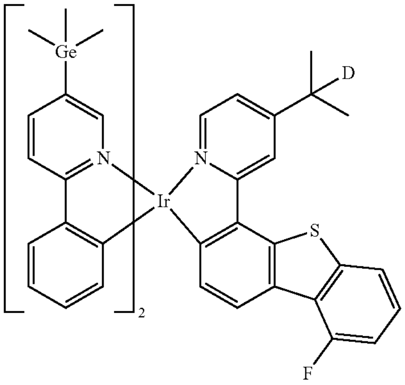
215
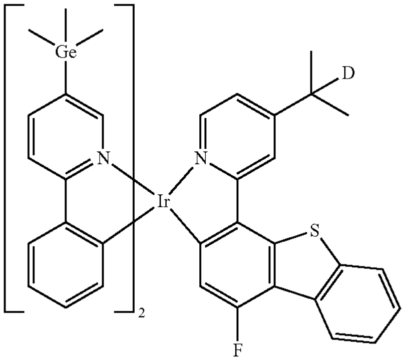
216
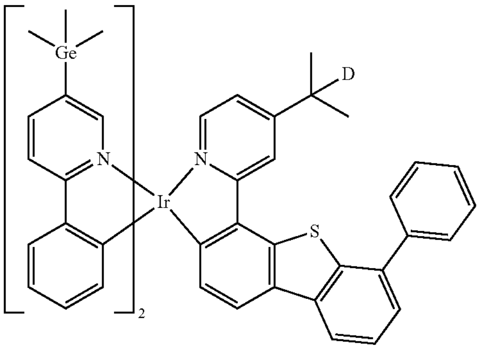
217
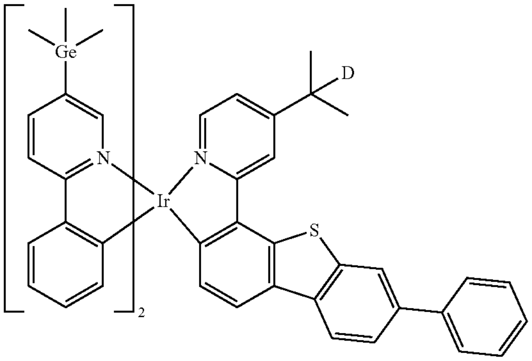

-continued
218
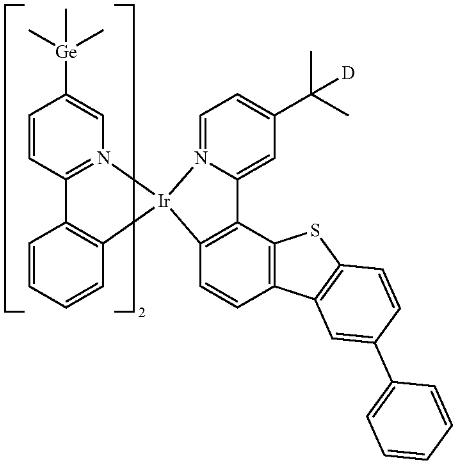
219
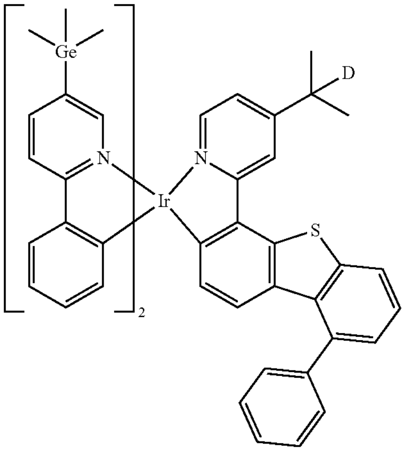
220
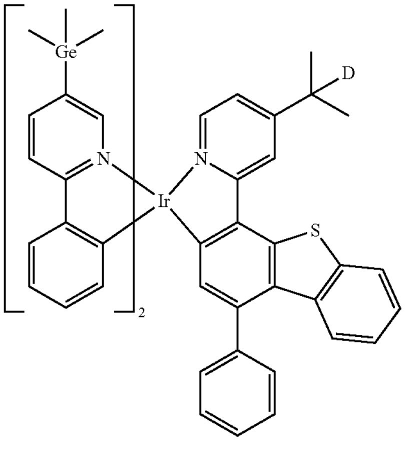
-continued
221
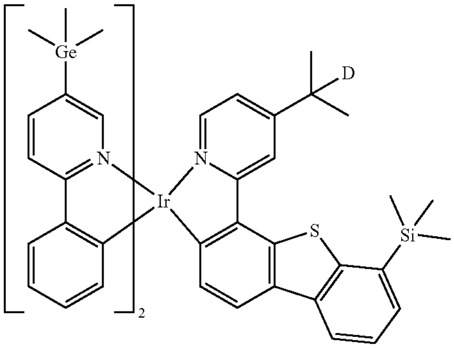
222
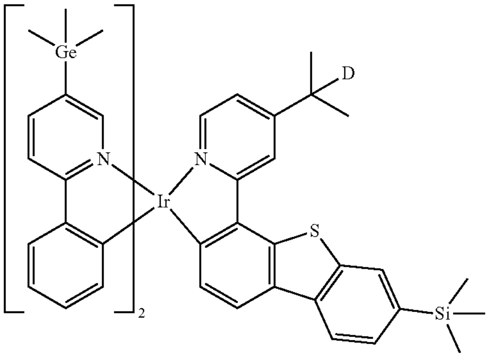
223
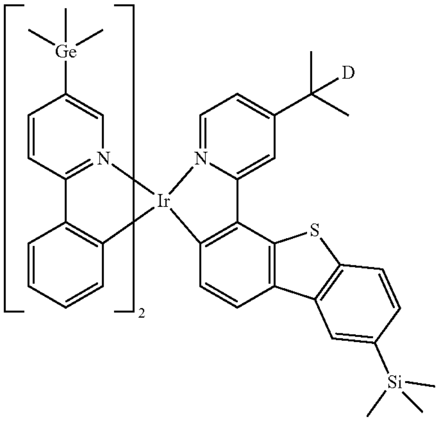
224
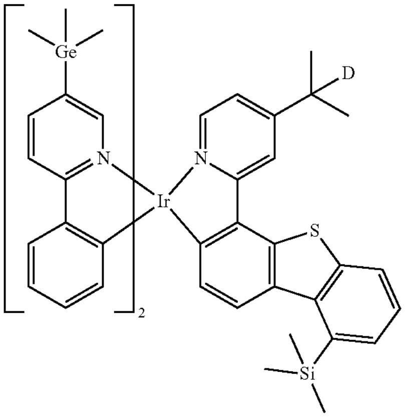

-continued
225
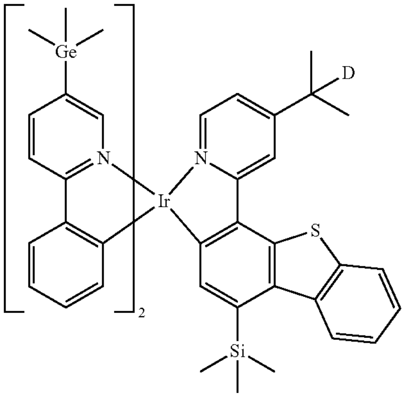
226
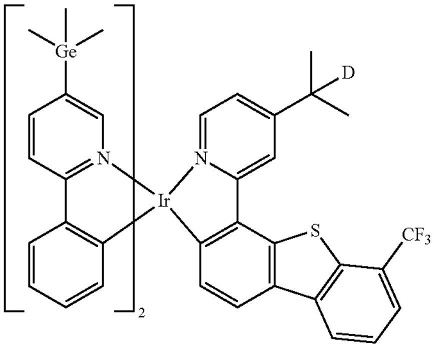
227
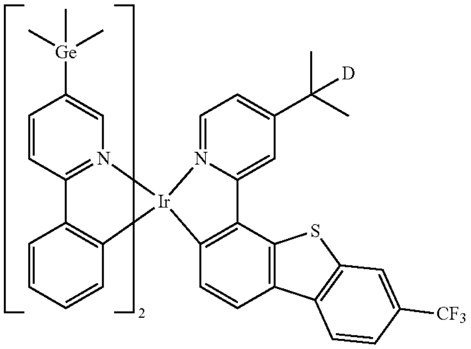
228
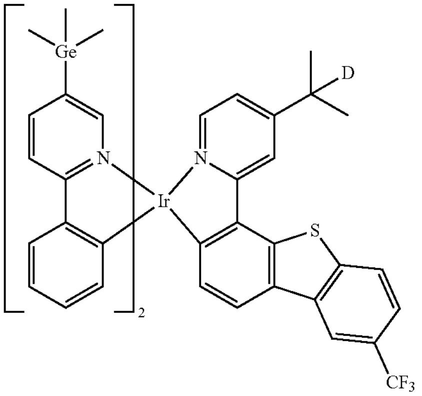
-continued
229
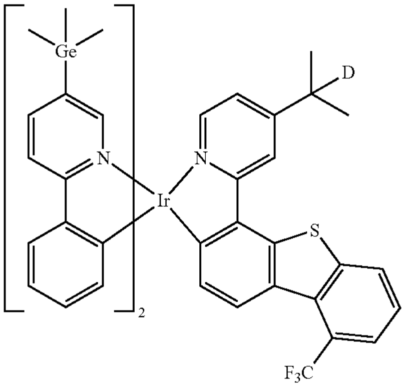
230
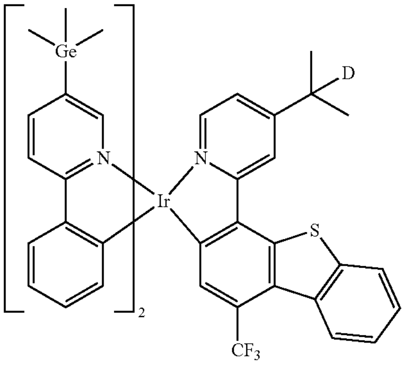
231
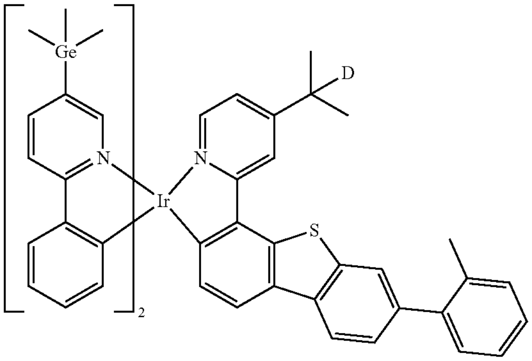
232
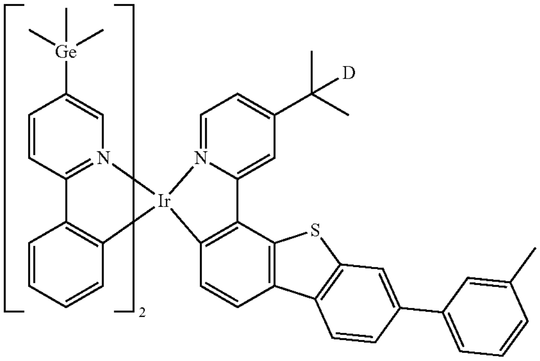

-continued
233
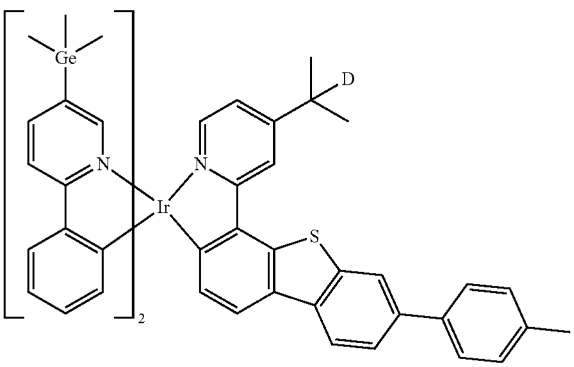
234
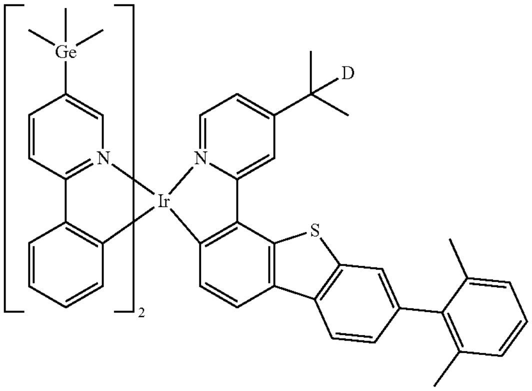
235
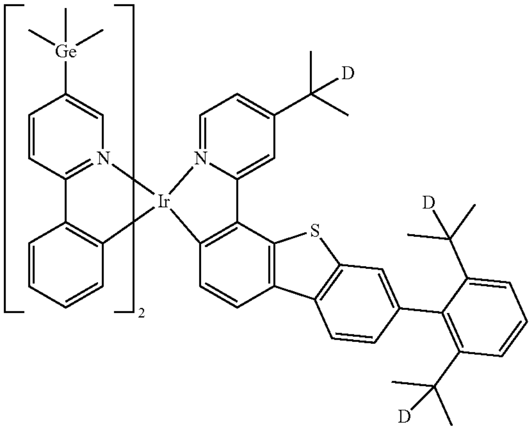
236
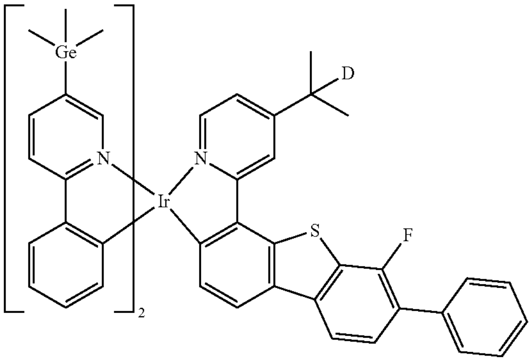
-continued
237
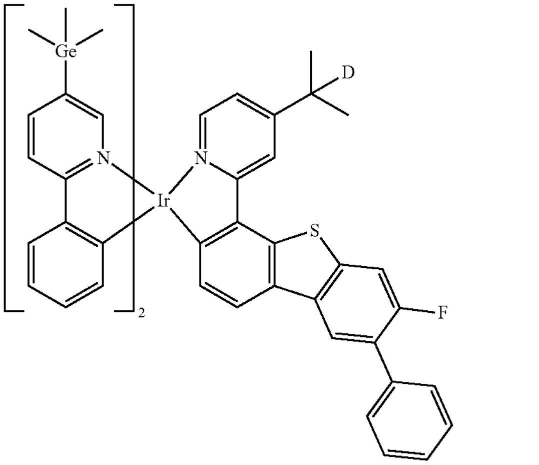
238
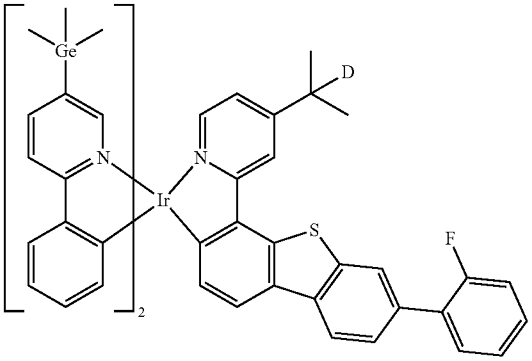
239
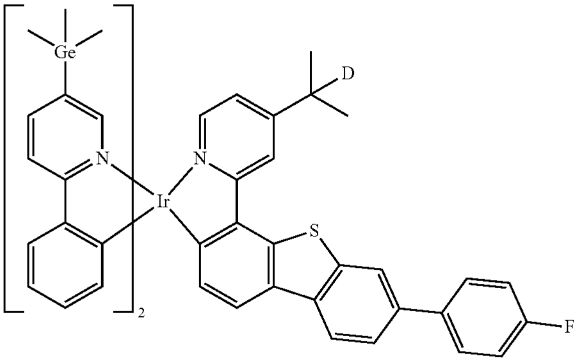
240
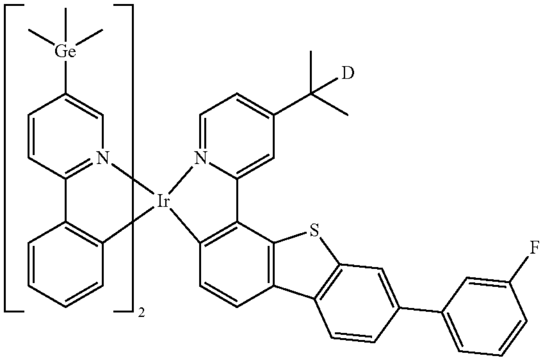

-continued
241
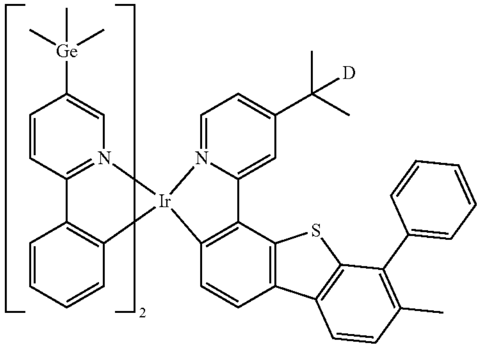
242
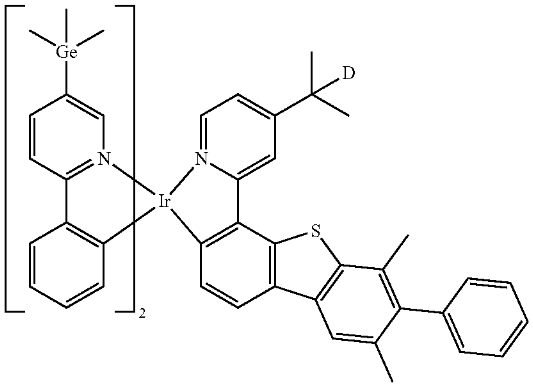
243
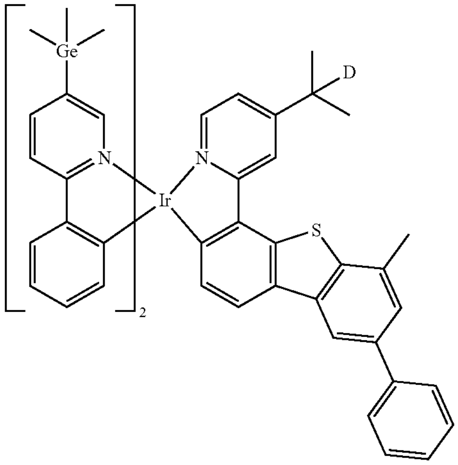
-continued
244
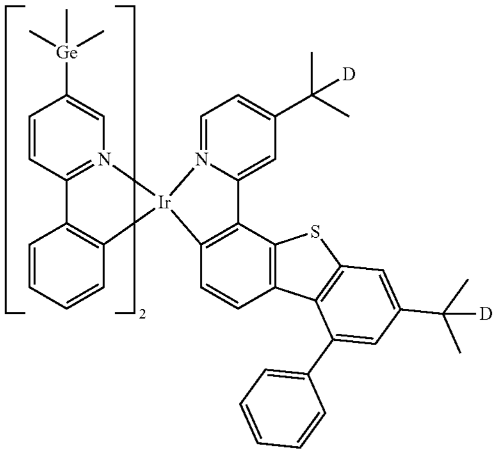
245
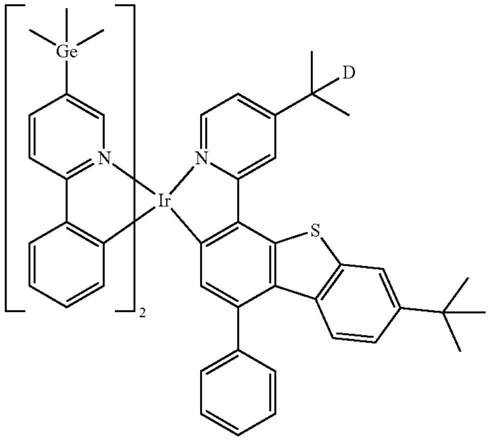
246
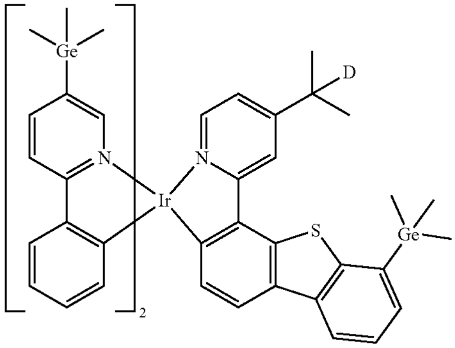

-continued
247
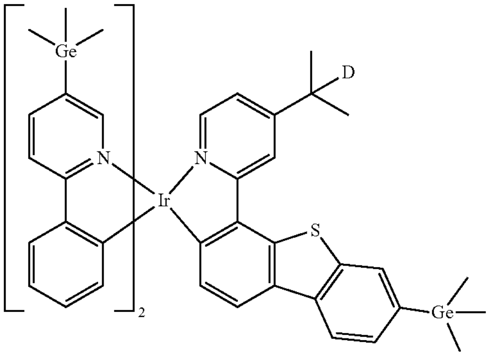
248
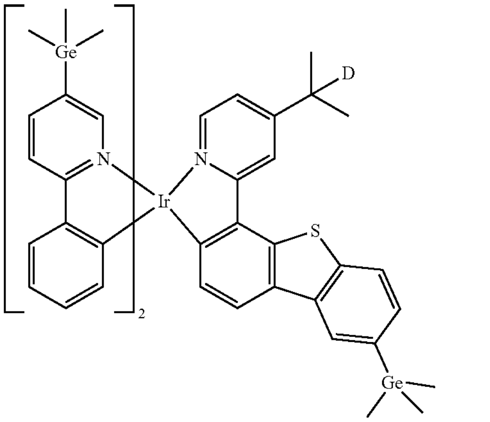
249
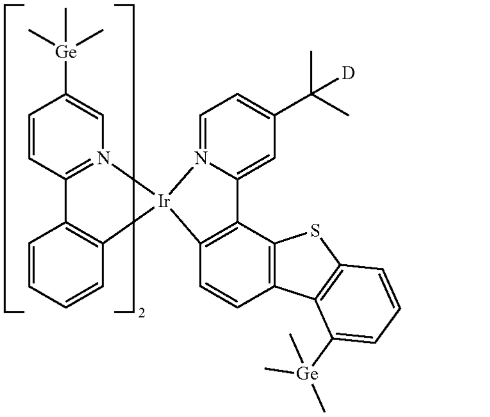
250
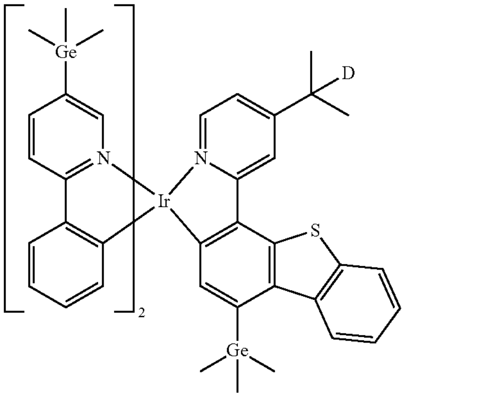
-continued
251
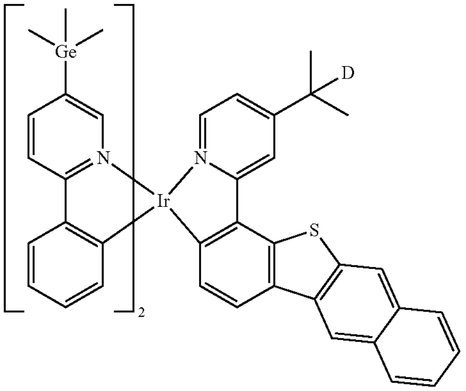
252
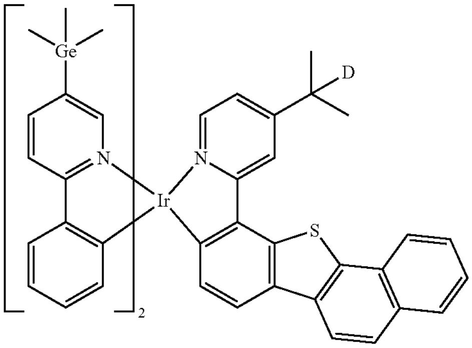
253
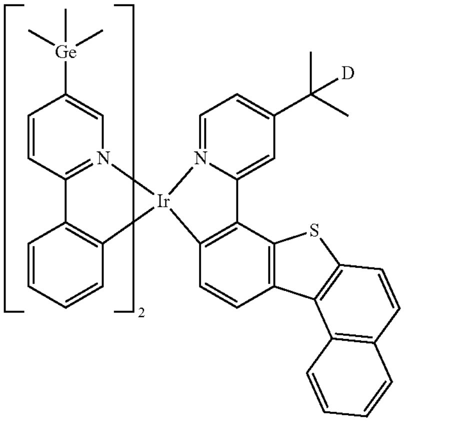
254
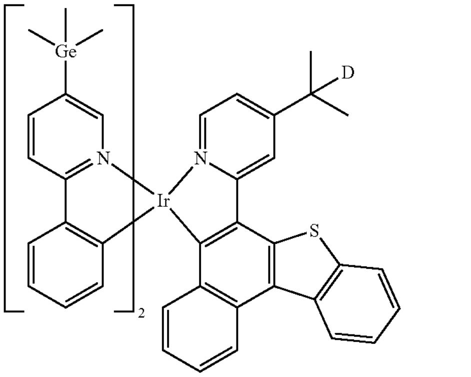

-continued
255
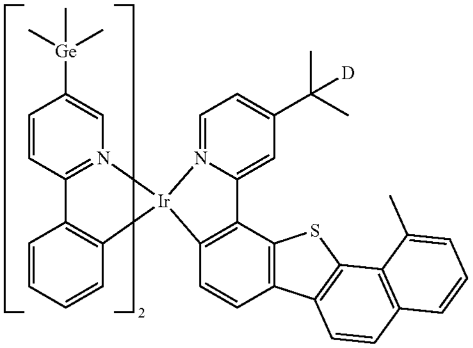
256
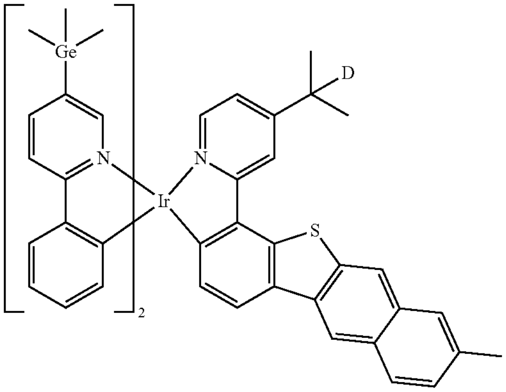
257
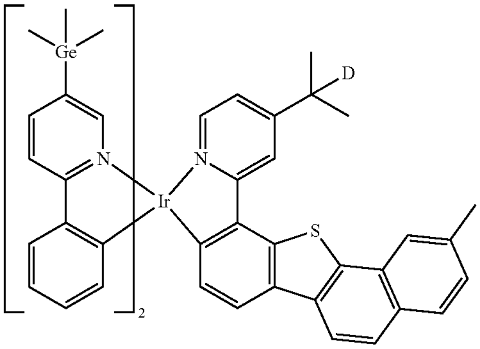
258
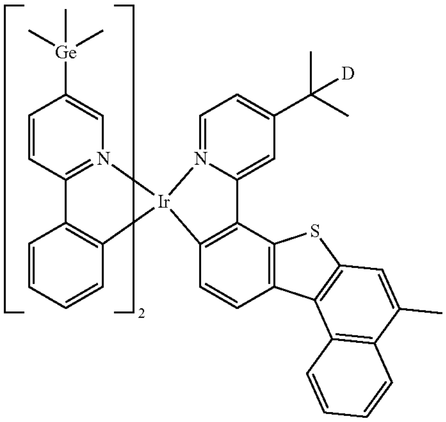
-continued
259
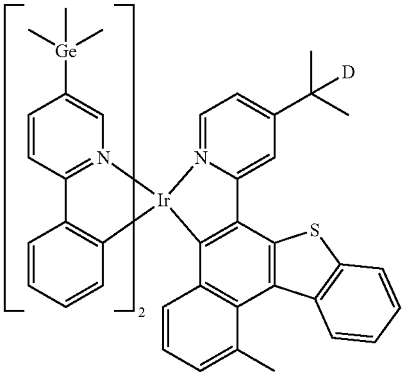
260
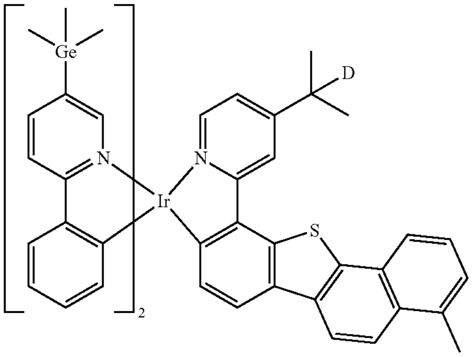
261
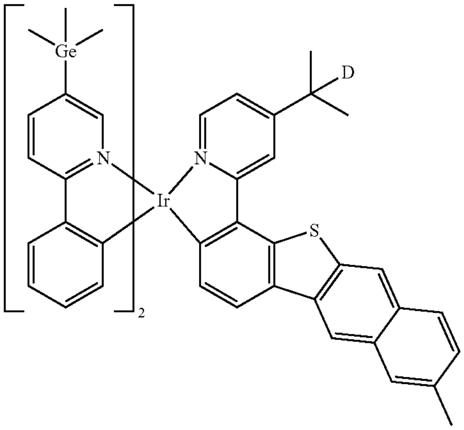
262
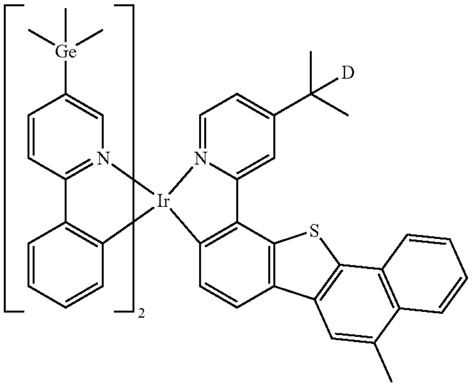

-continued
263
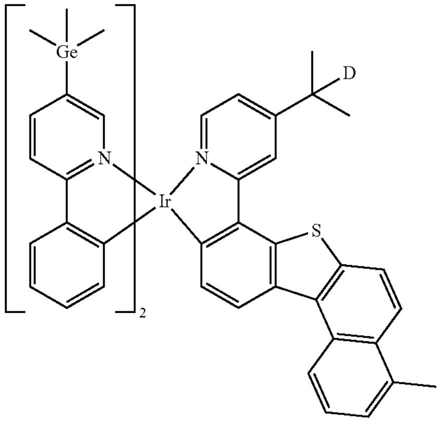
264
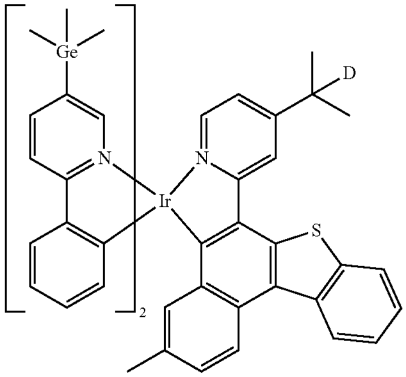
265
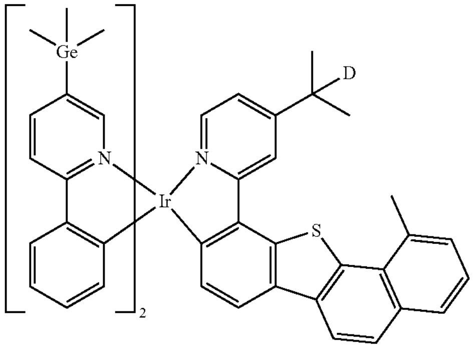
266
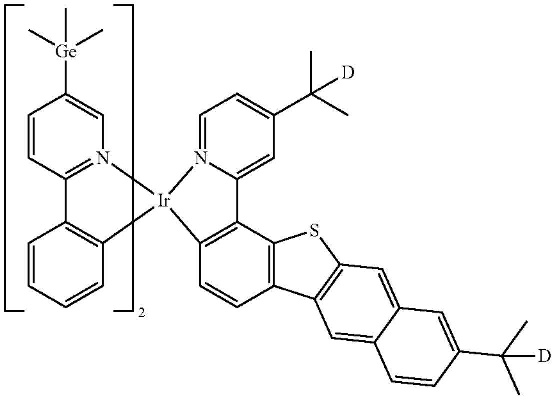
-continued
267
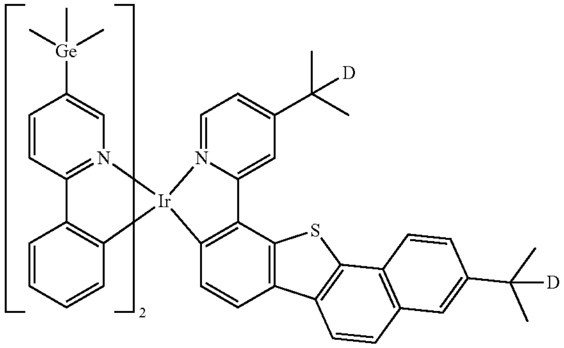
268
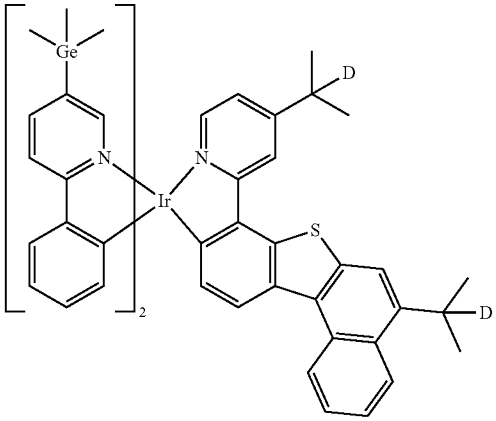
269
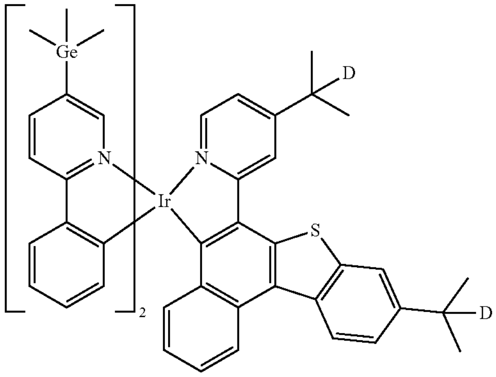
270
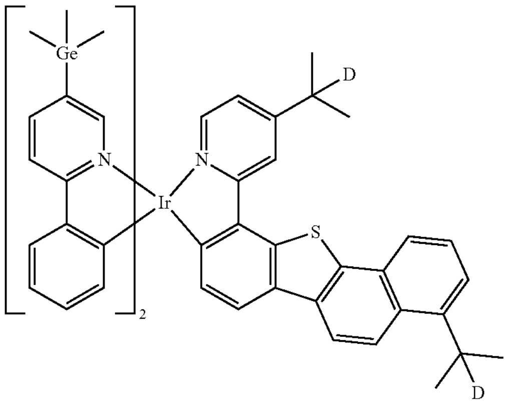

-continued
271
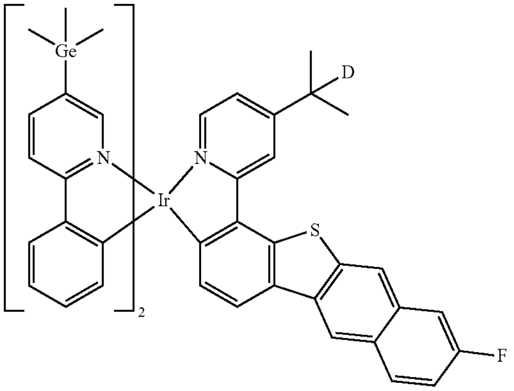
272
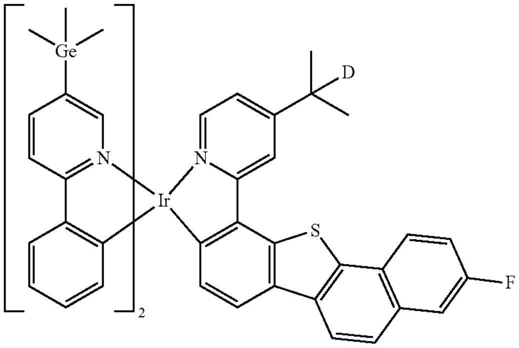
273
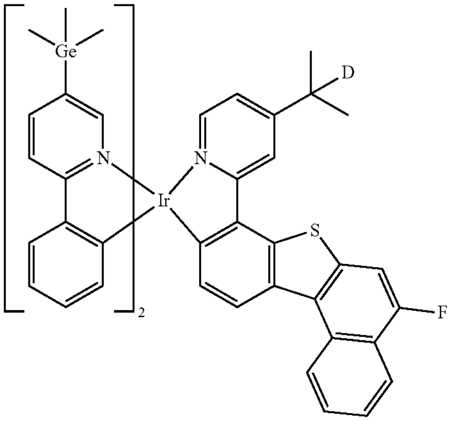
274
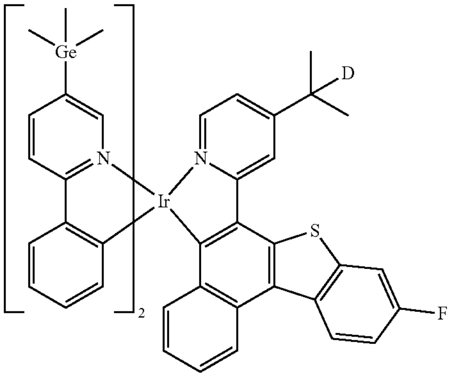
-continued
275
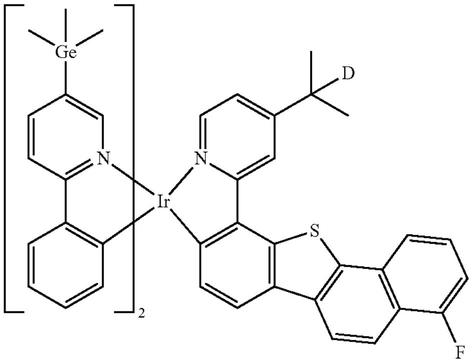
276
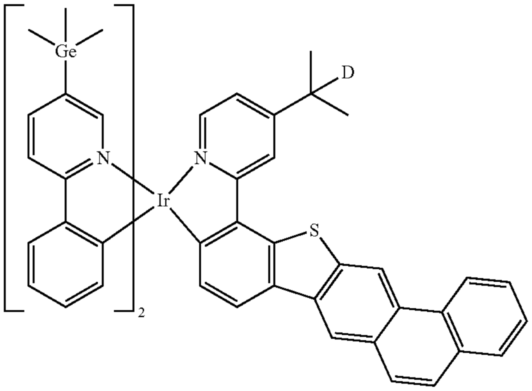
277
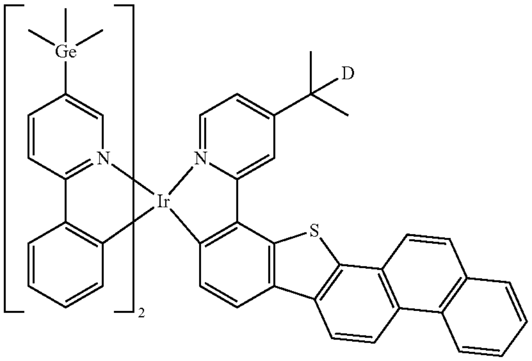
278
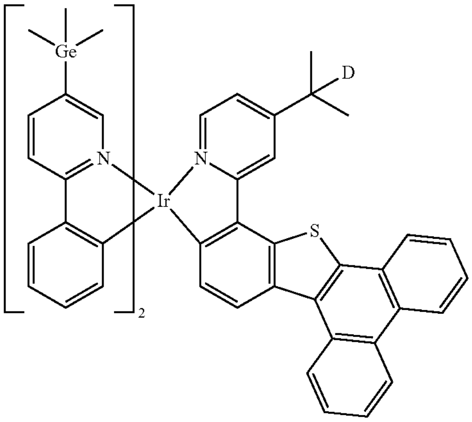

-continued
279
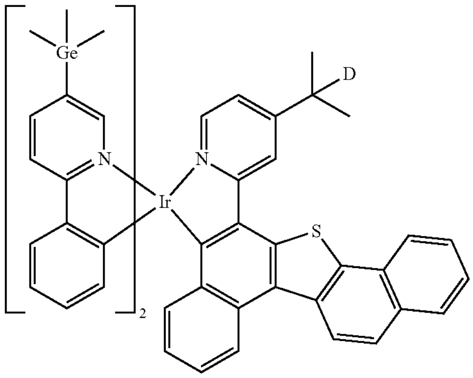
280
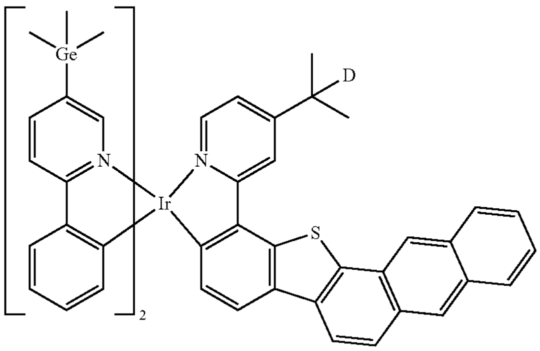
281
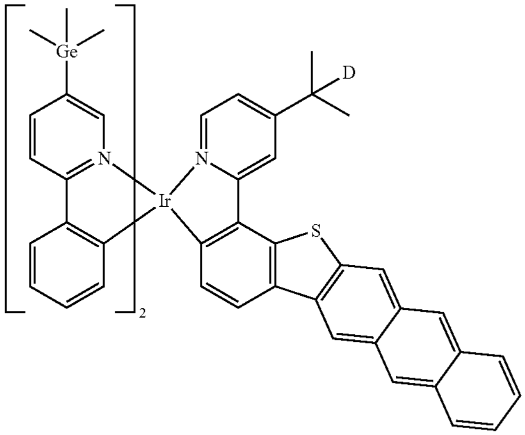
282
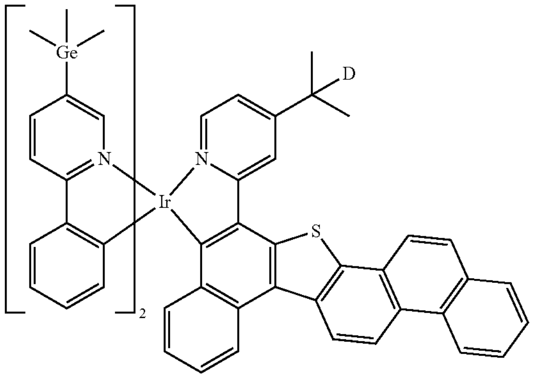
-continued
283
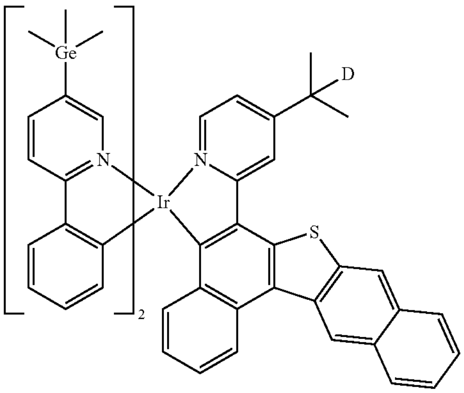
284
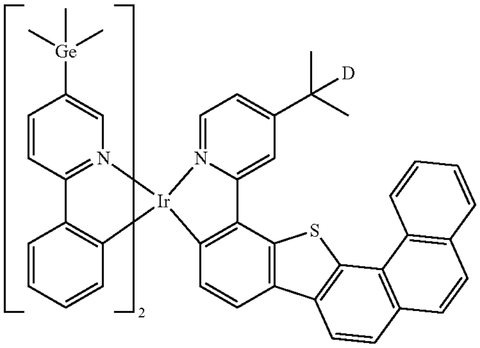
285
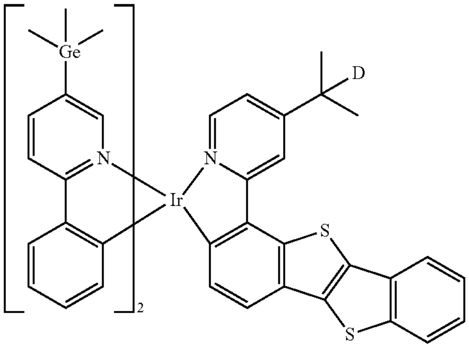
286
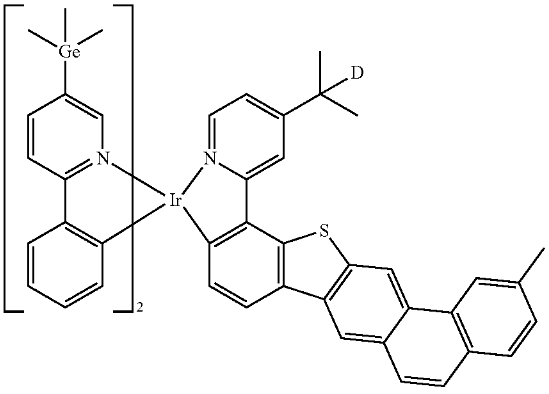

-continued
287
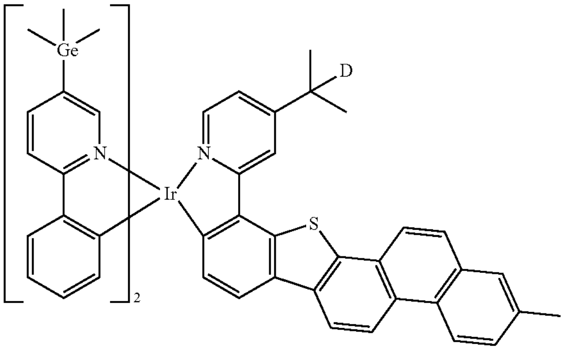
288
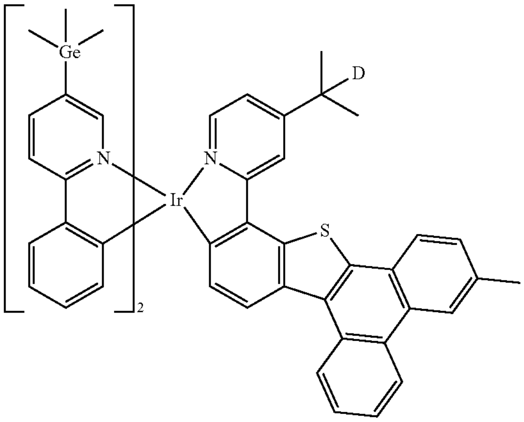
289
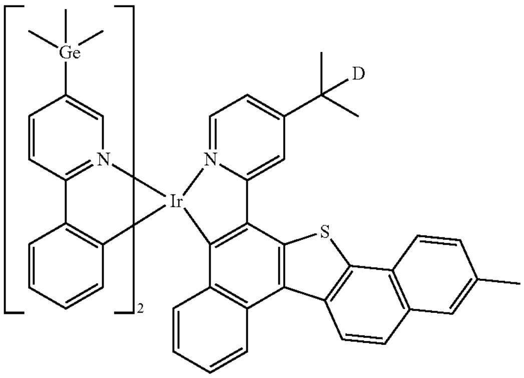
290
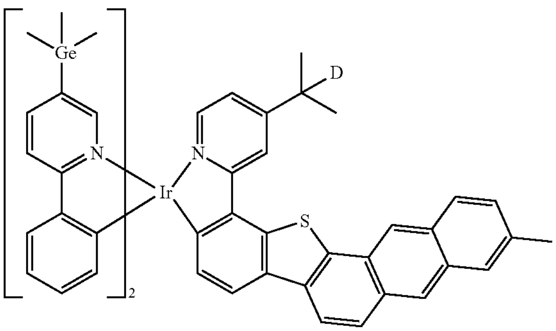
-continued
291
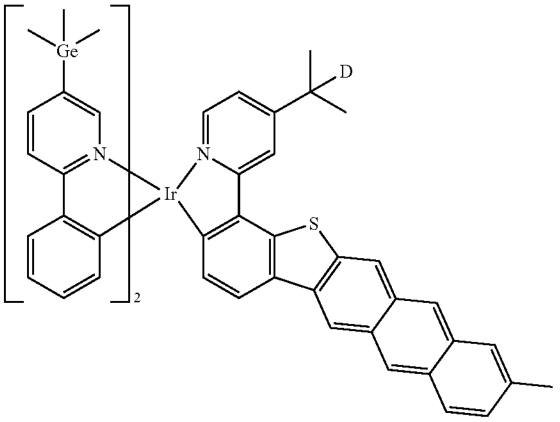
292
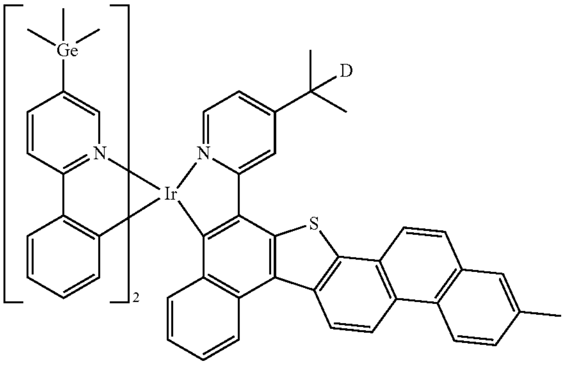
293
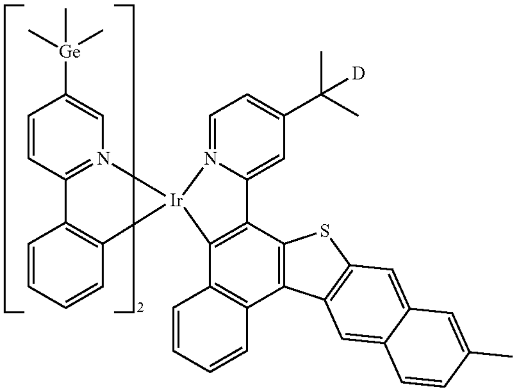
294
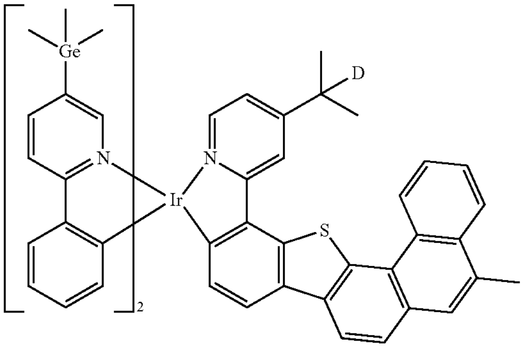

-continued
295
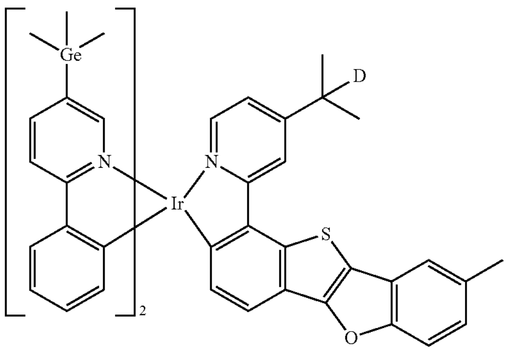
296
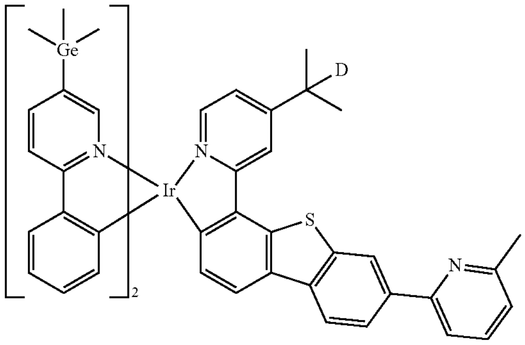
297
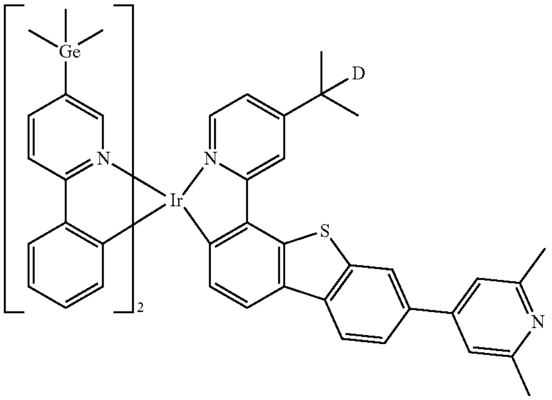
298
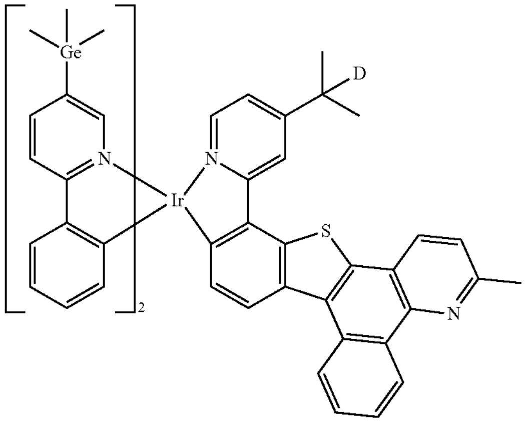
-continued
299
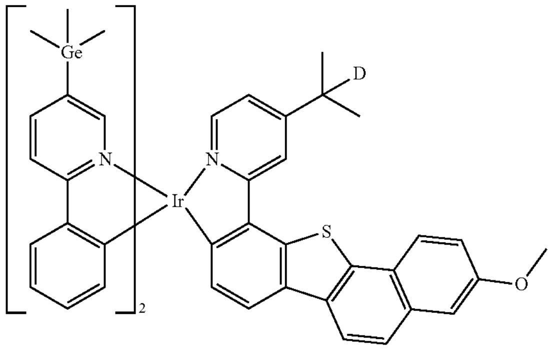
300
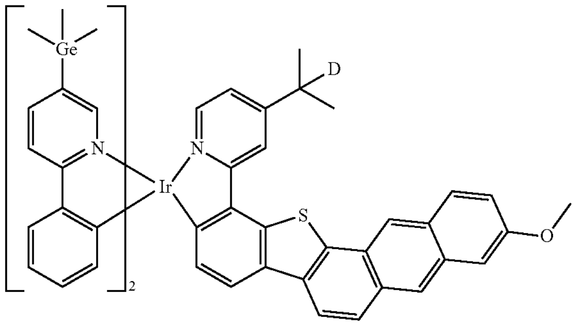
301
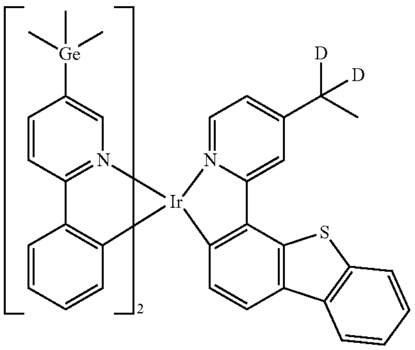
302
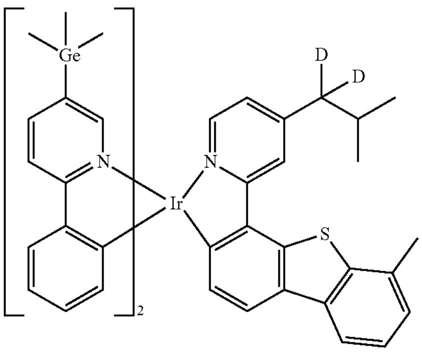

-continued
303
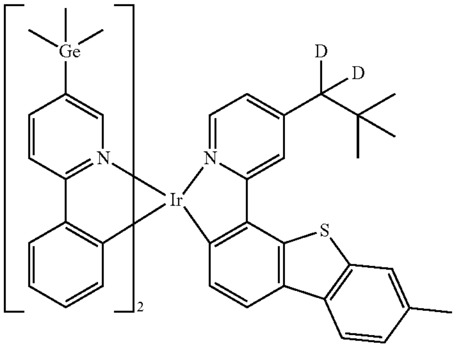
304
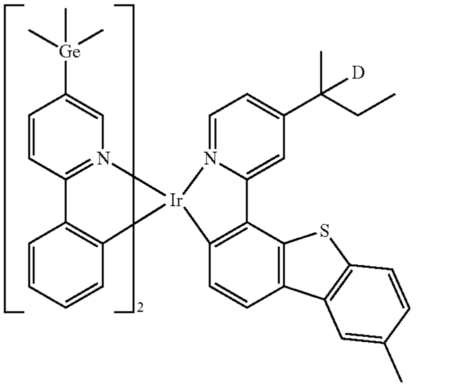
305
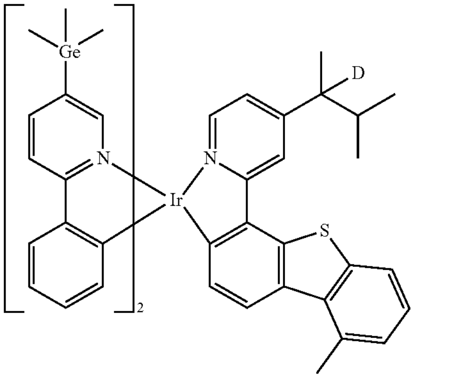
306
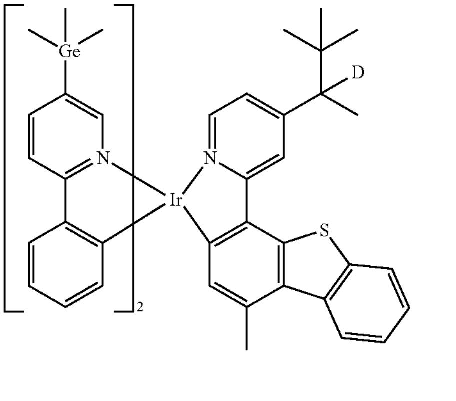
-continued
307
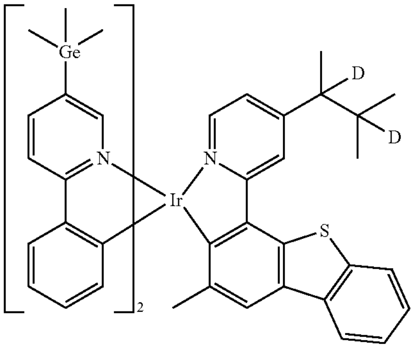
308
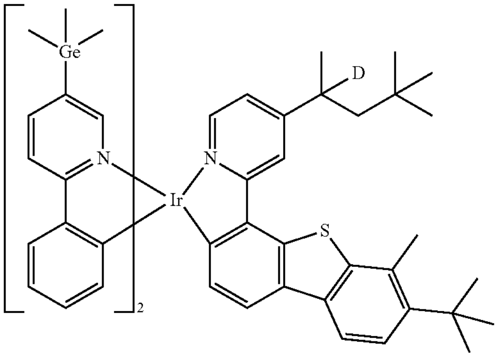
309
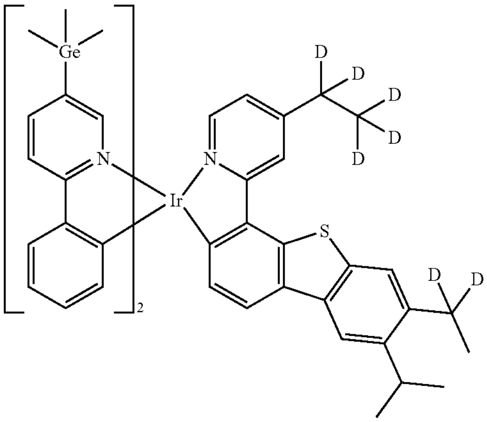
310
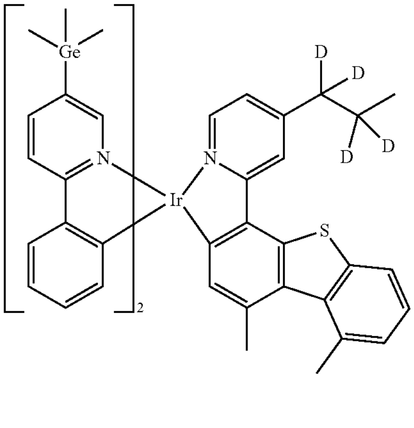

-continued
311
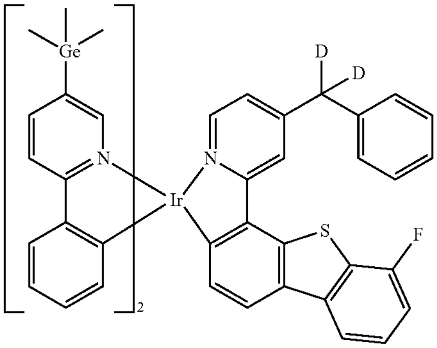
312
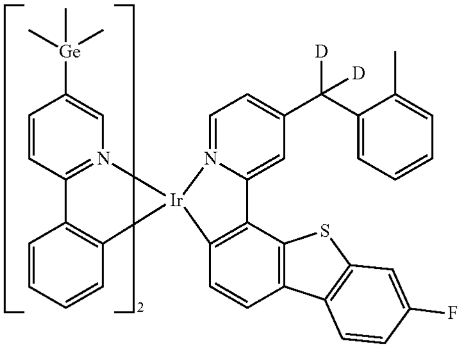
313
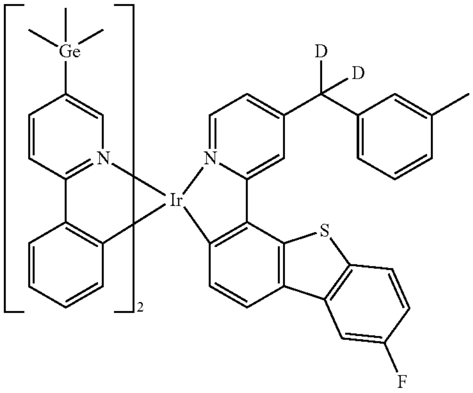
314
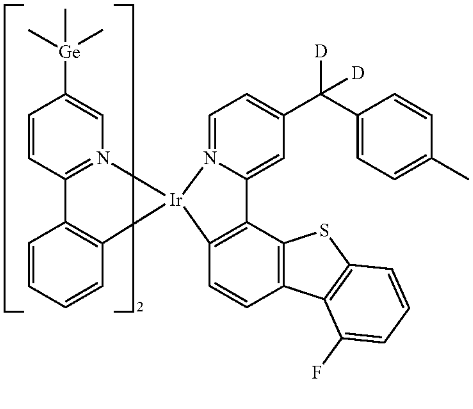
-continued
315
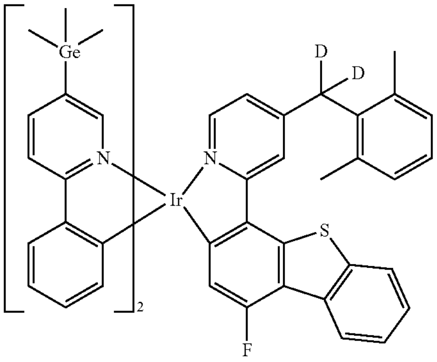
316
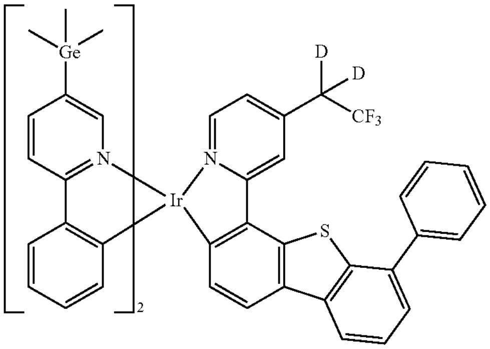
317
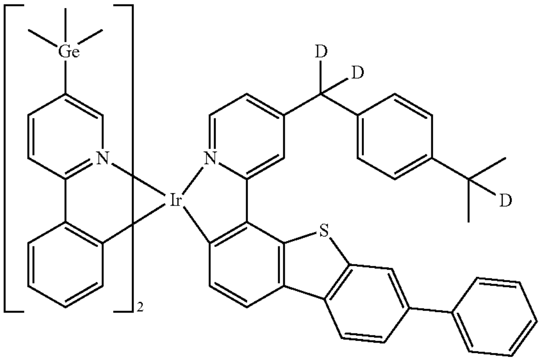
318
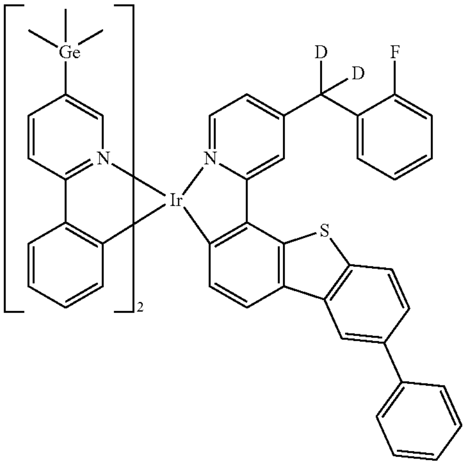

-continued
319
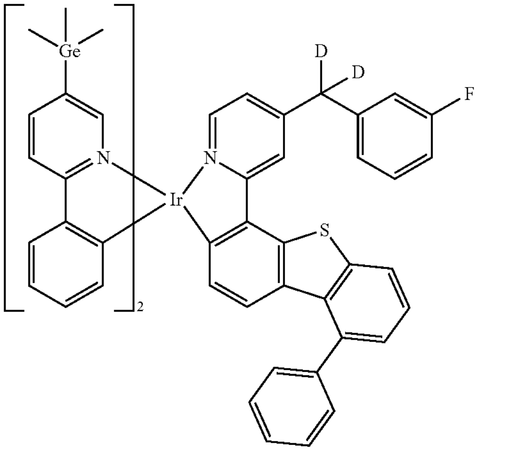
320
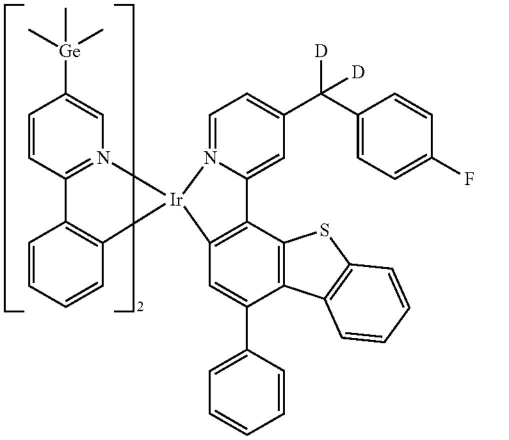
321
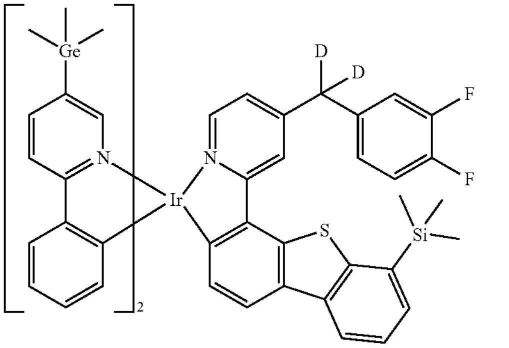
322
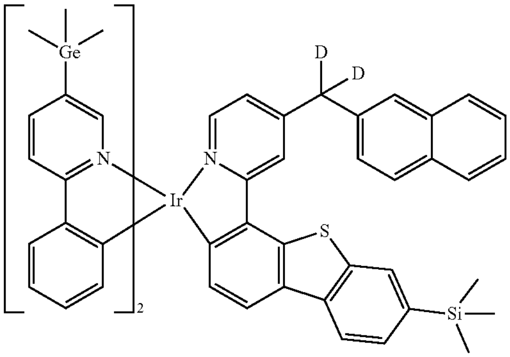
-continued
323
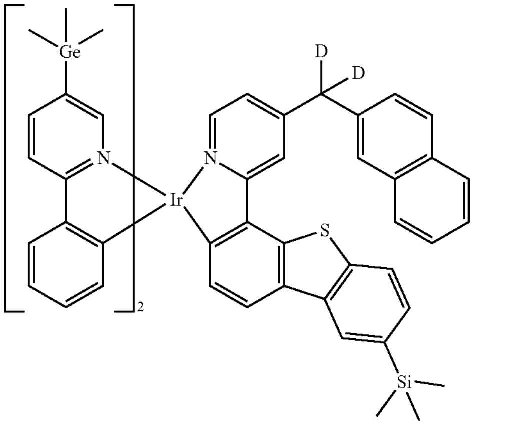
324
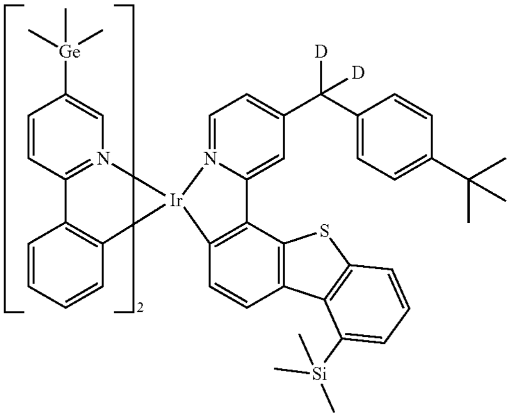
325
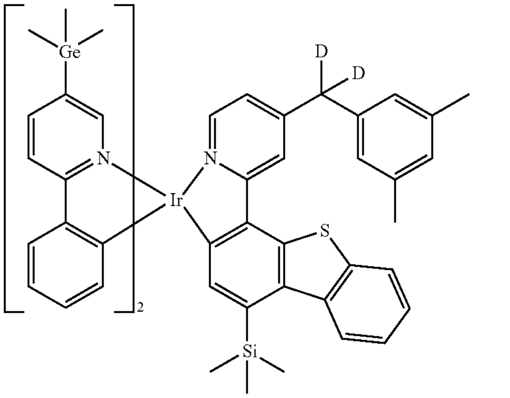
326
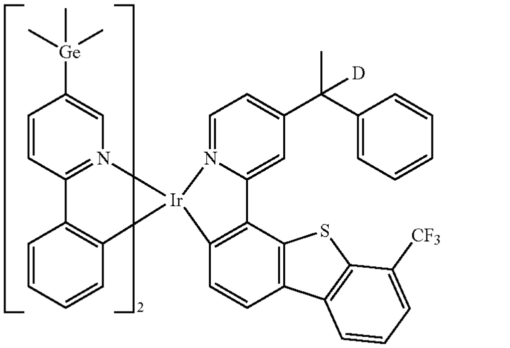

-continued
327
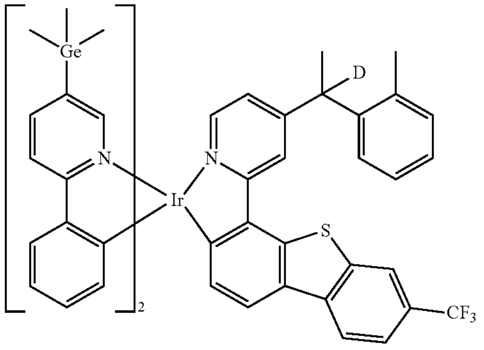
328
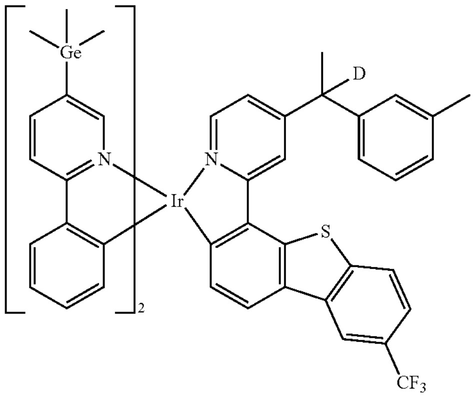
329
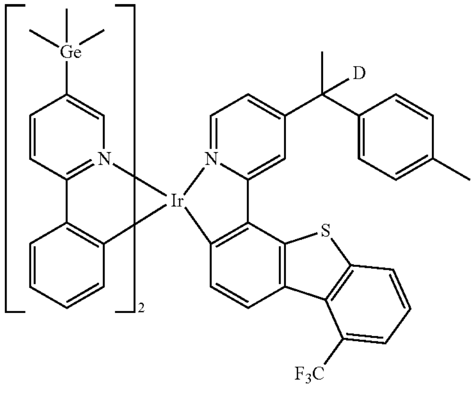
330
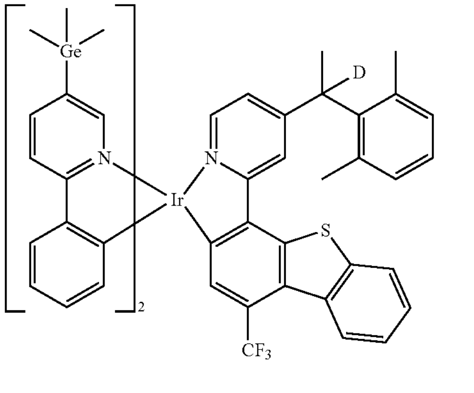
-continued
331
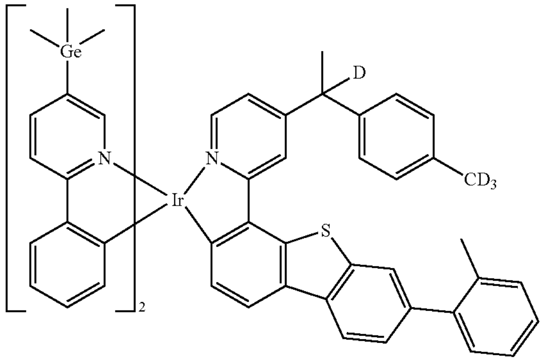
332
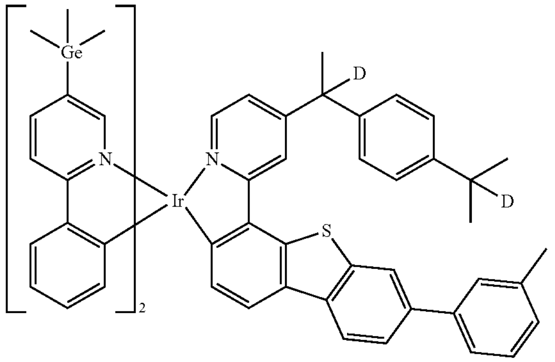
333
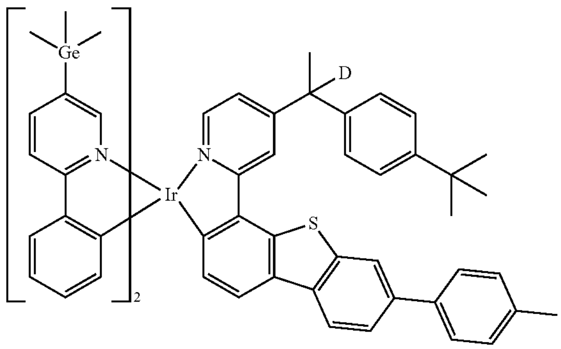
334
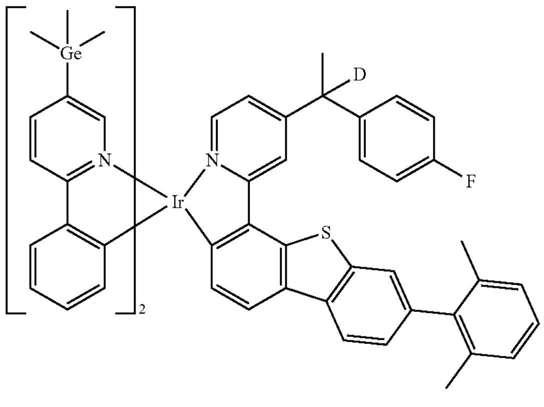

-continued
335
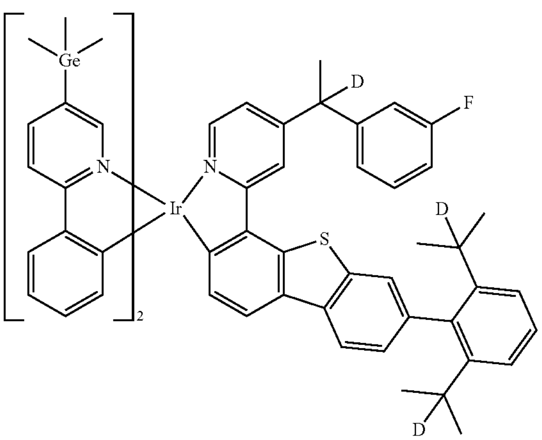
336
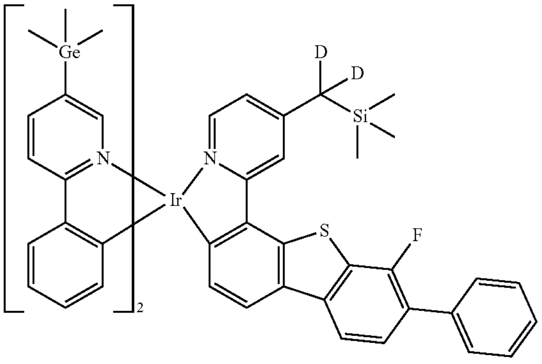
337
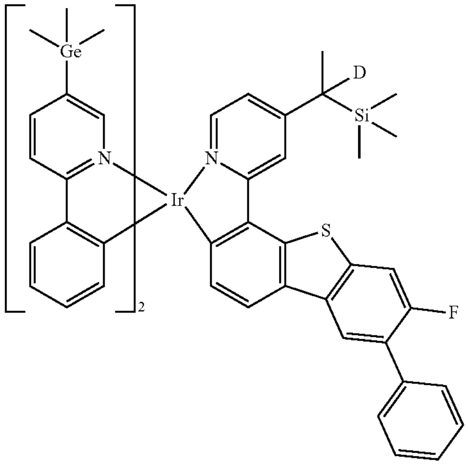
-continued
338
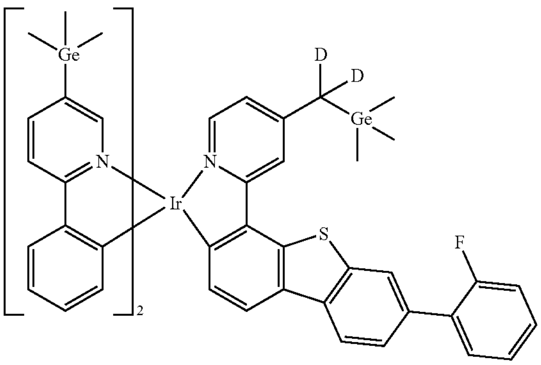
339
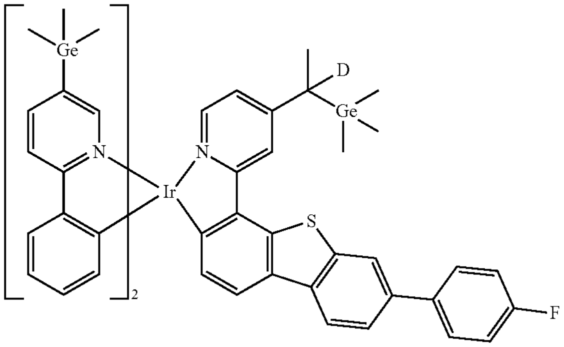
340
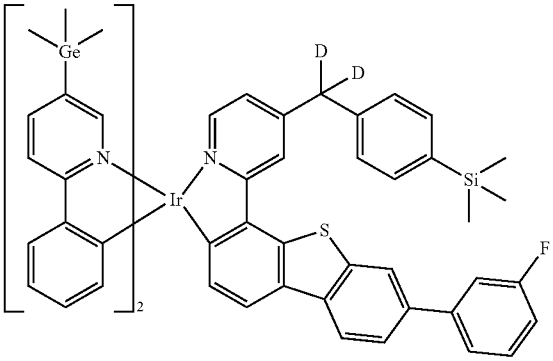
341
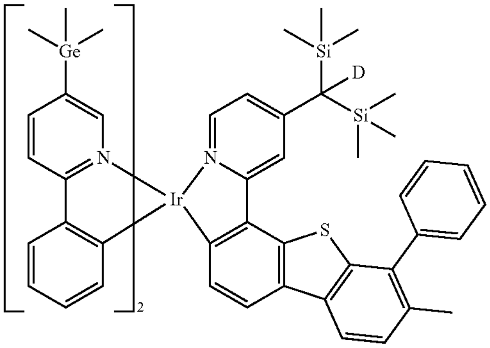

-continued
342
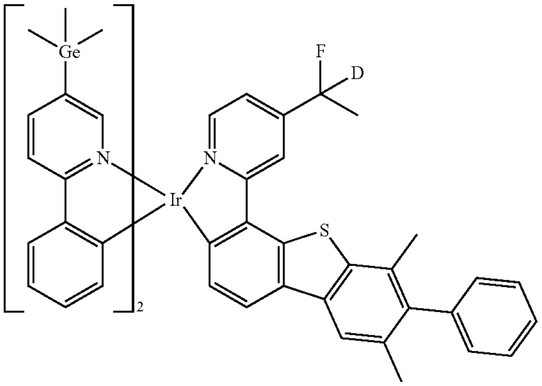
343
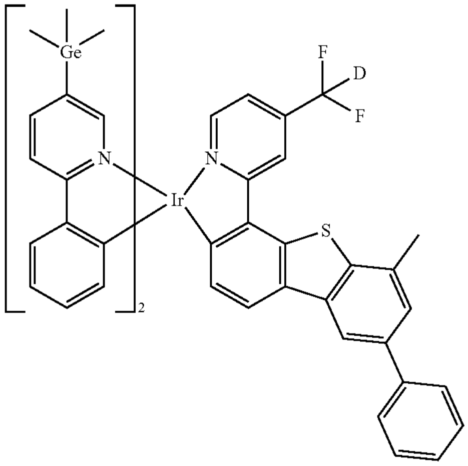
344
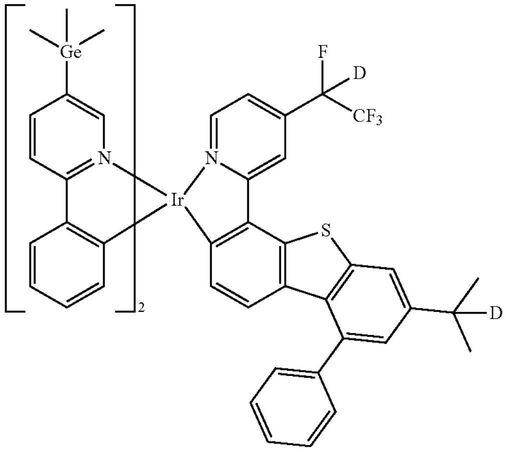
-continued
345
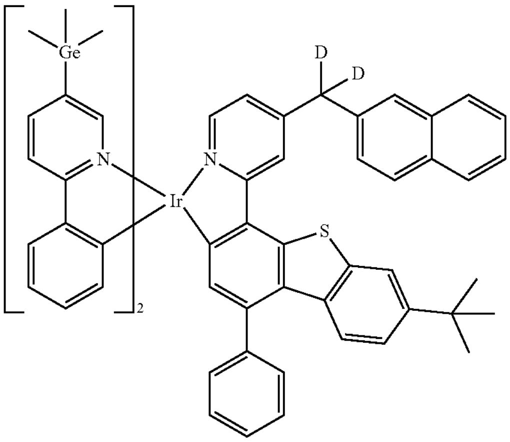
346
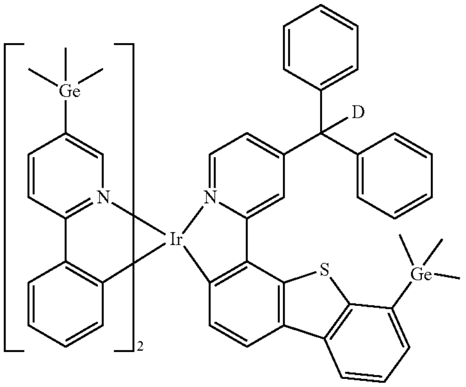
347
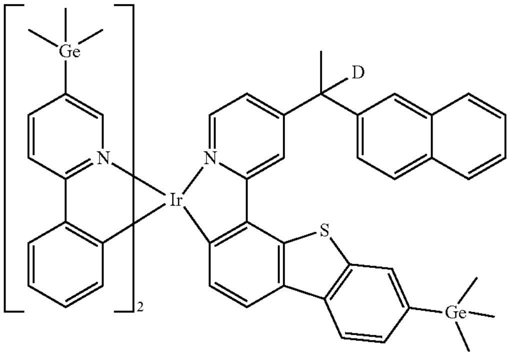

-continued
348
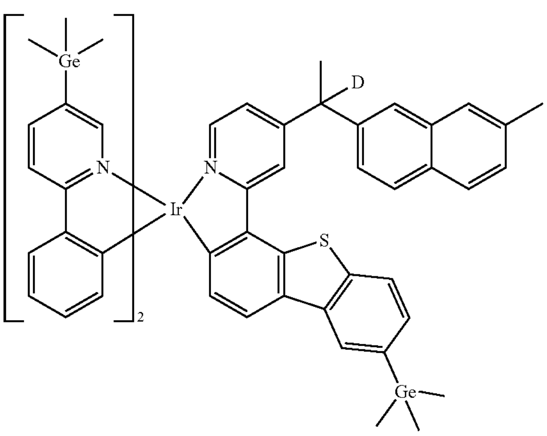
349
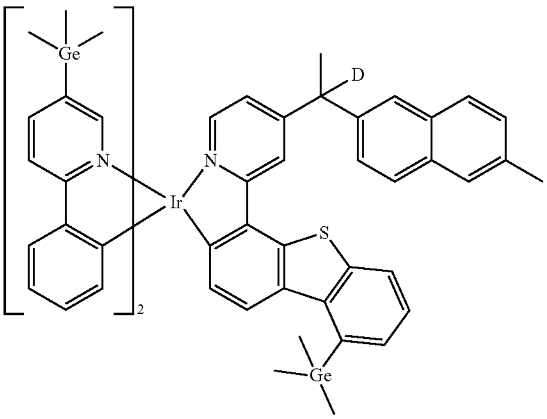
350
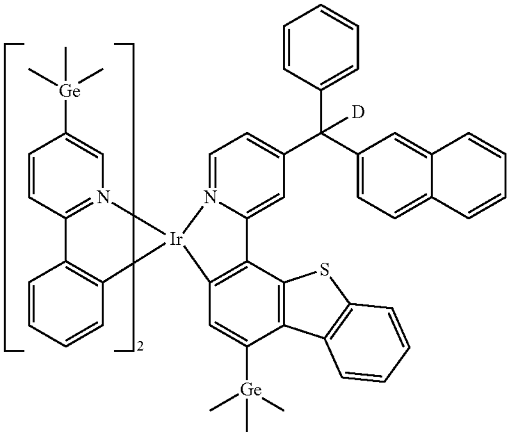
-continued
351
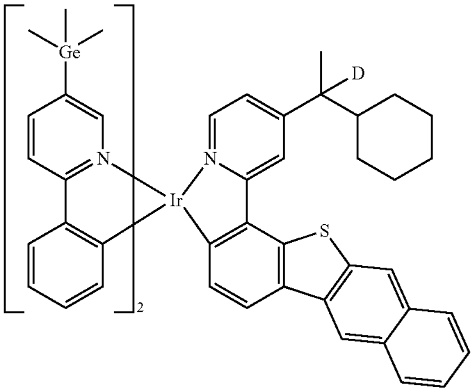
352
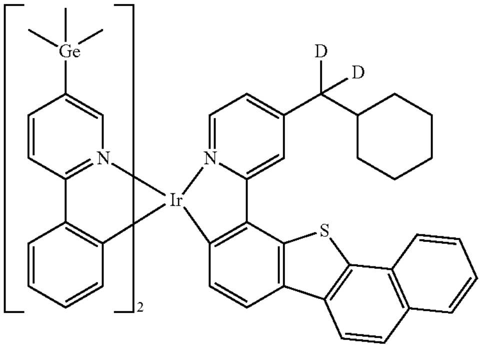
353
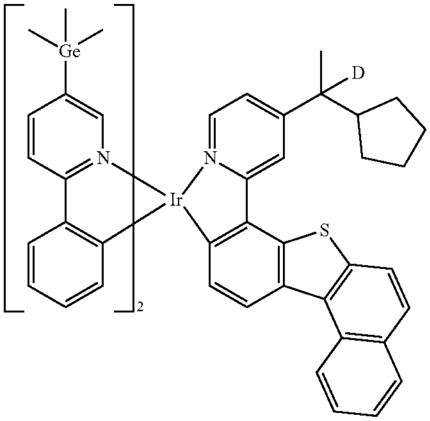
354
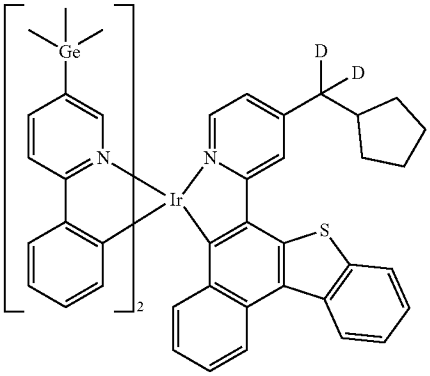

-continued
355
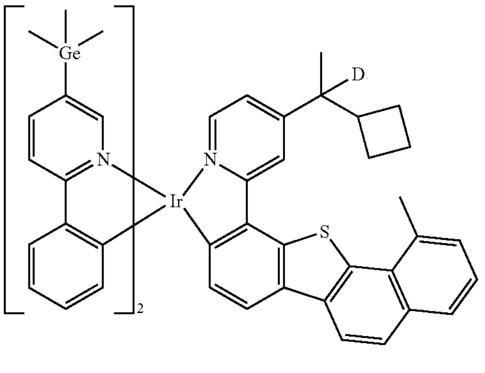
356
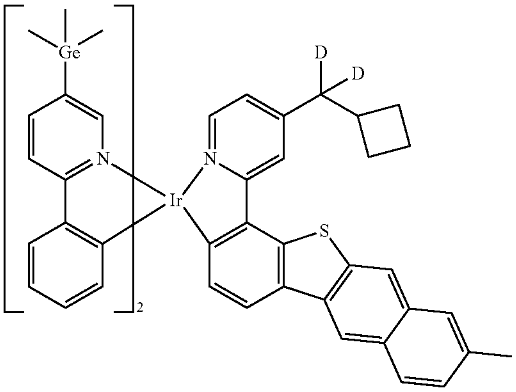
357
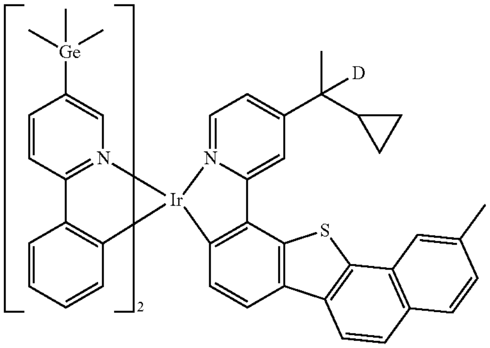
358
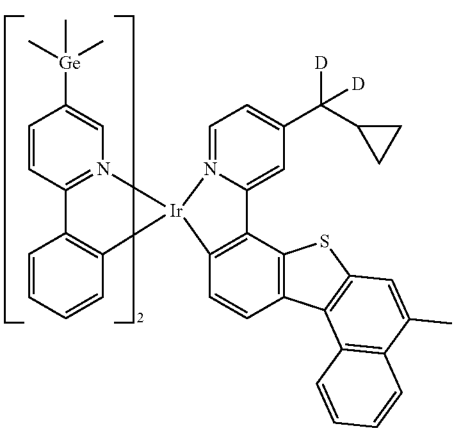
-continued
359
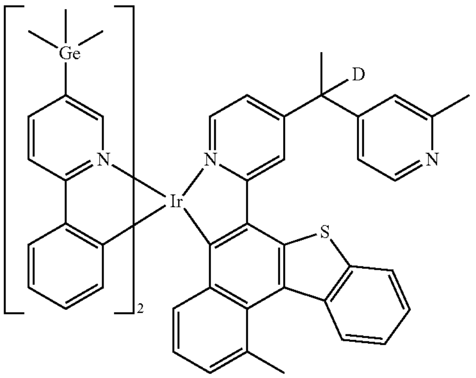
360
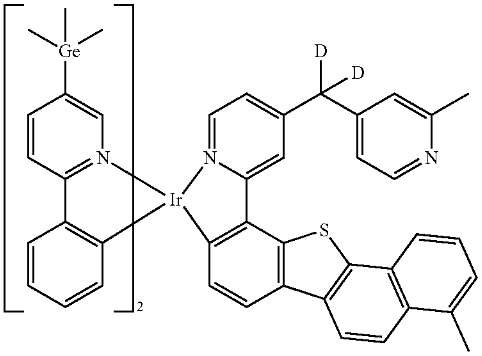
361
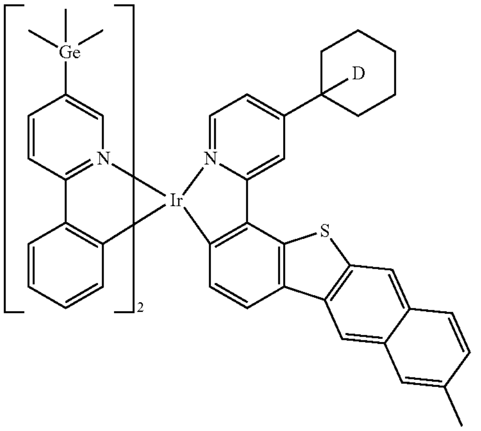
362
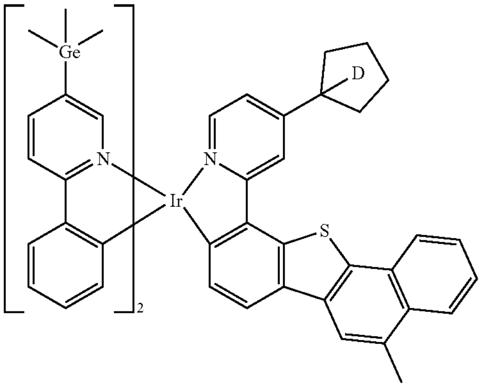

-continued
363
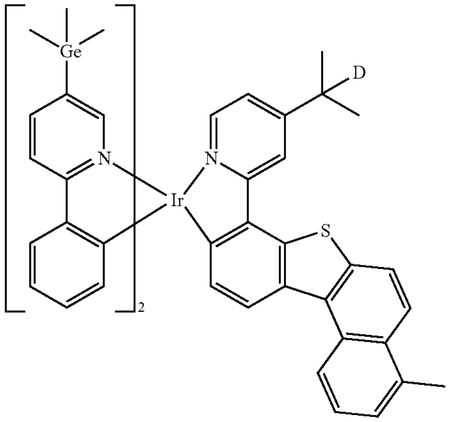
364
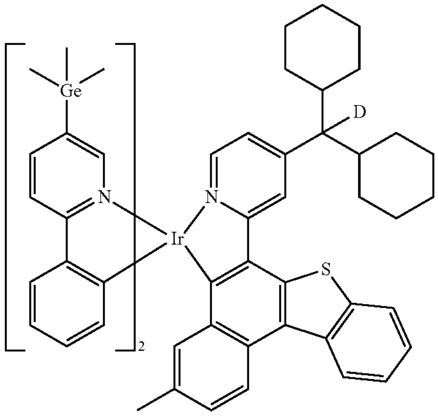
365
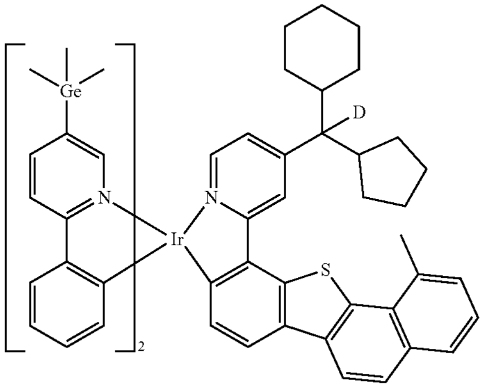
366
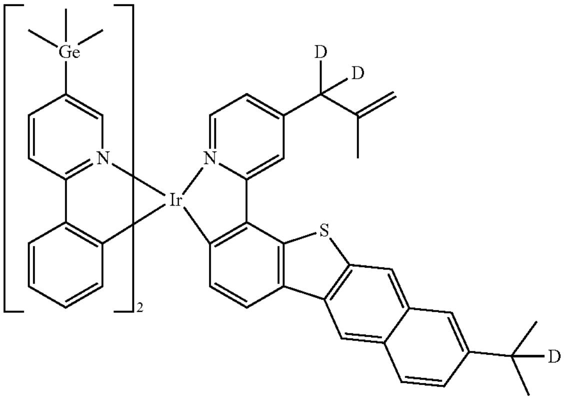
-continued
367
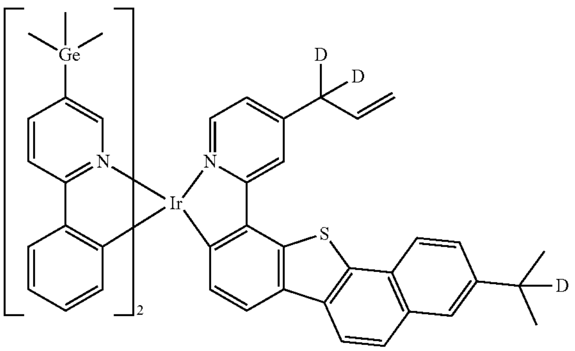
368
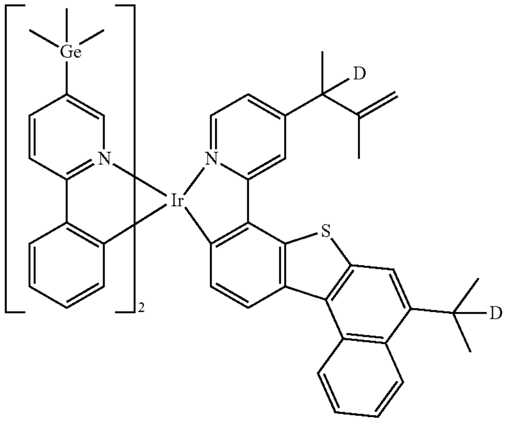
369
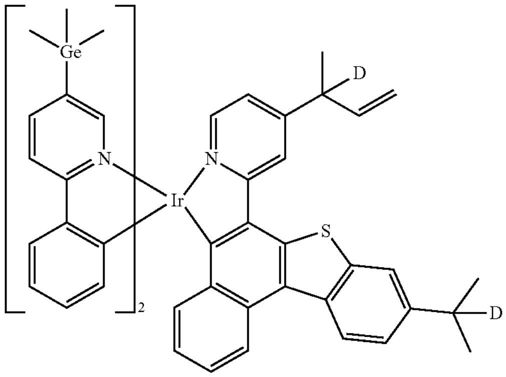
370
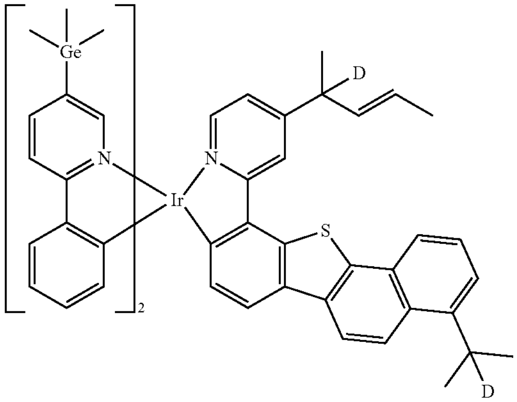

-continued
371
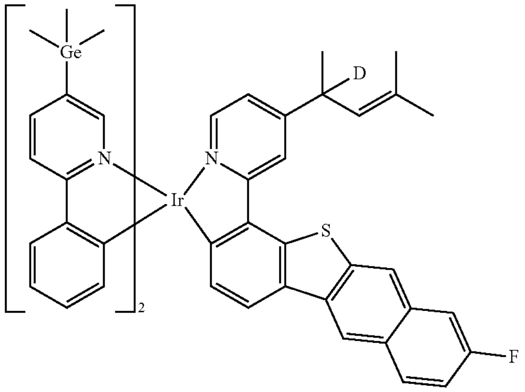
372
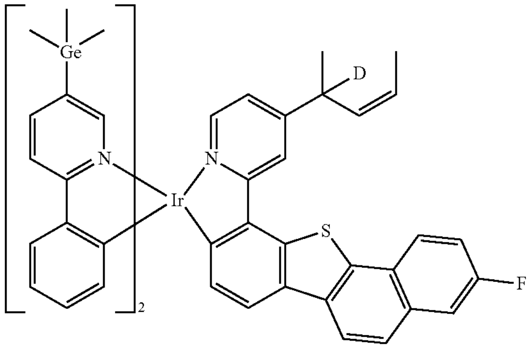
373
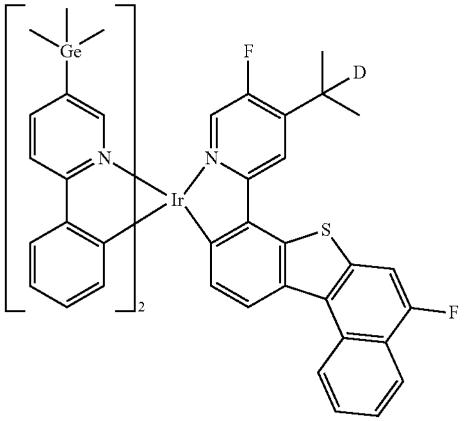
374
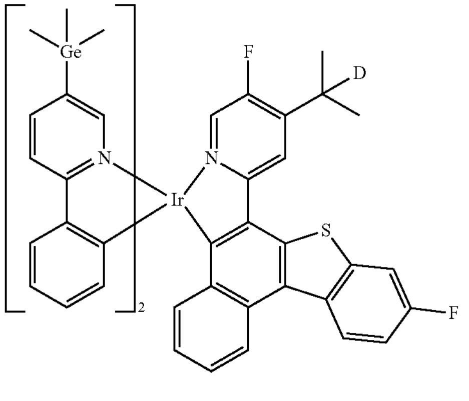
-continued
375
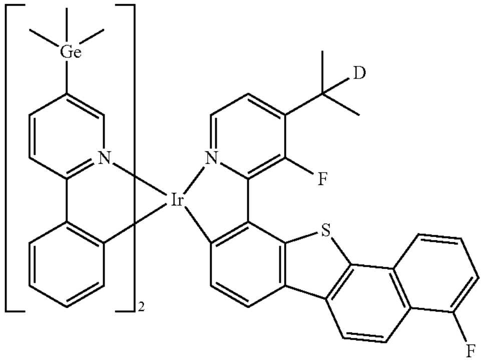
376
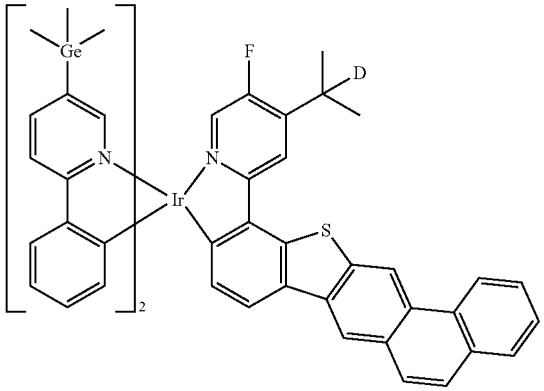
377
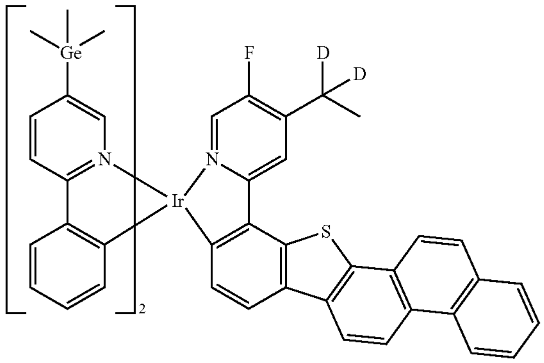
378
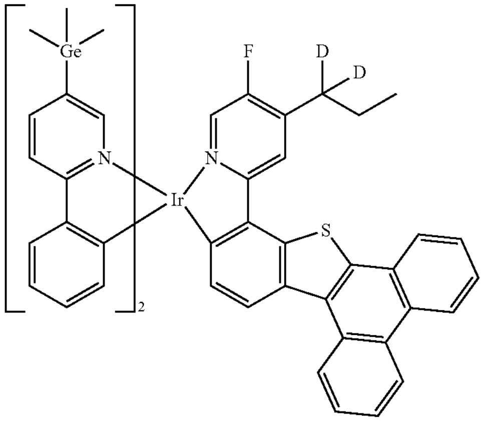

-continued
379
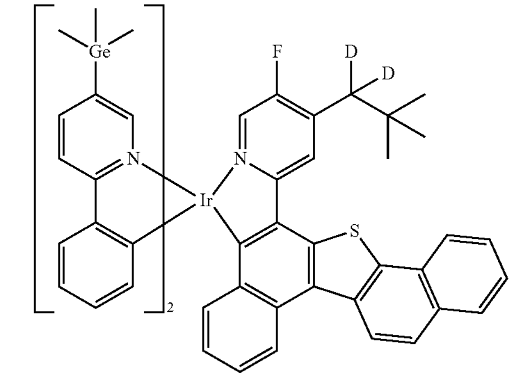
380
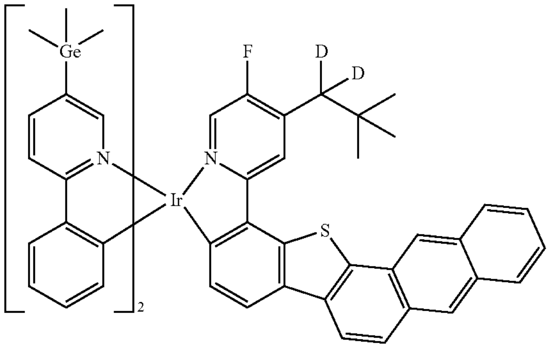
381
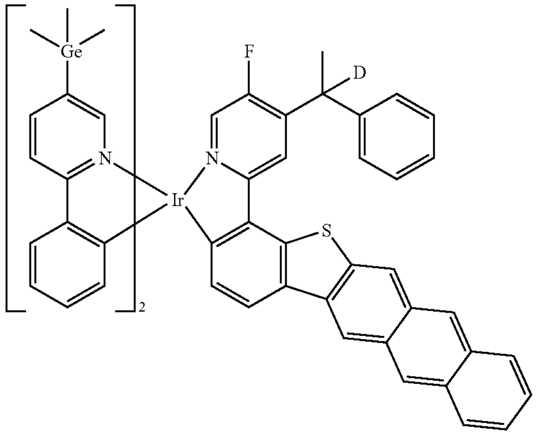
382
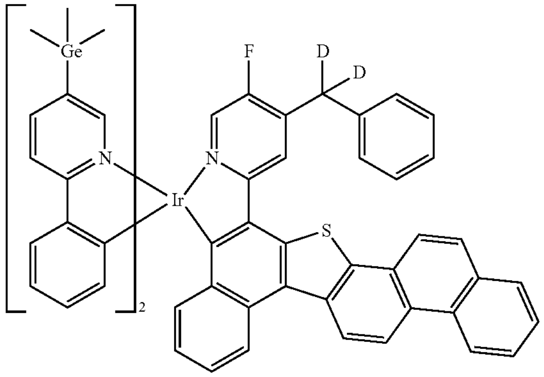
-continued
383
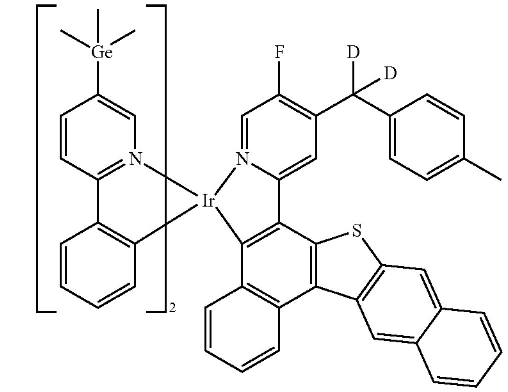
384
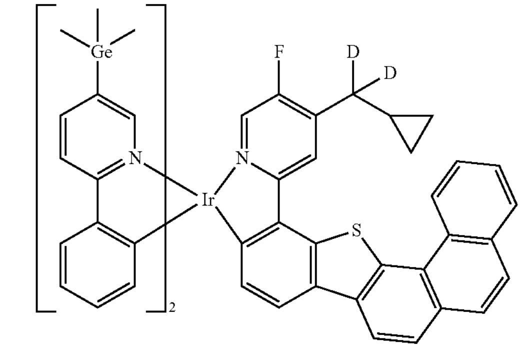
385
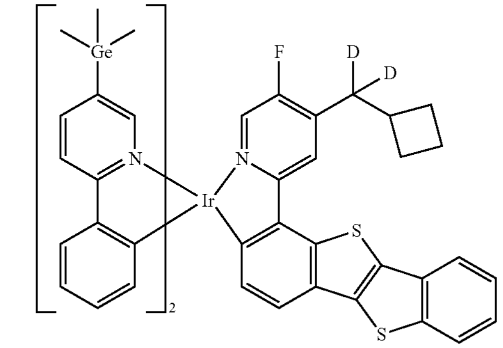
386
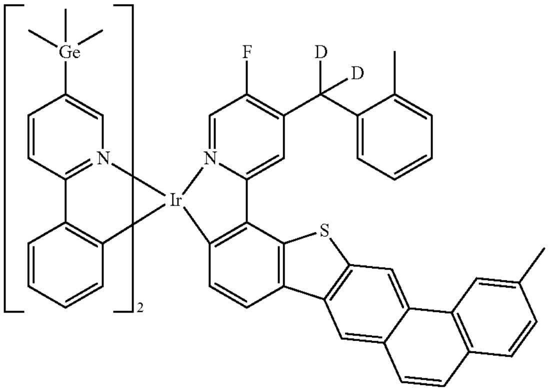

-continued
387
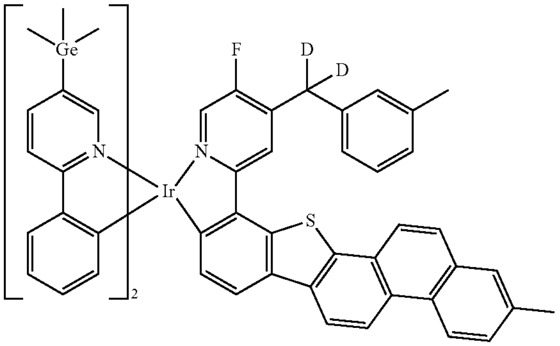
388
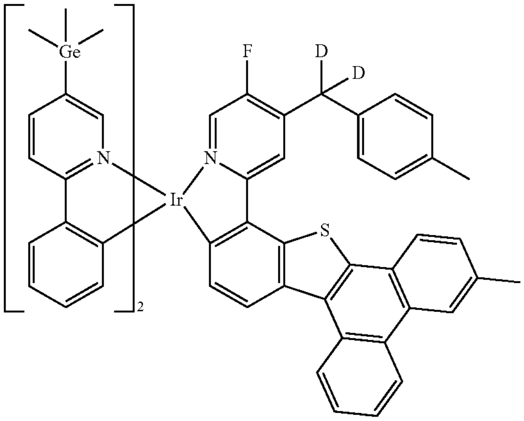
389
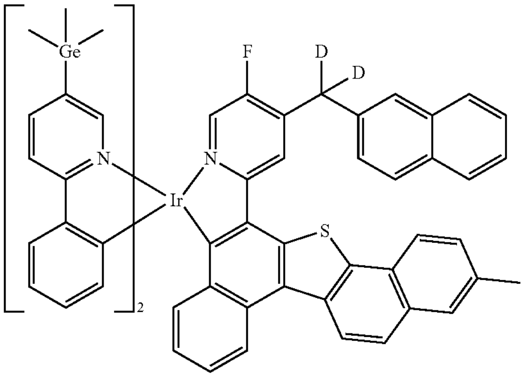
390
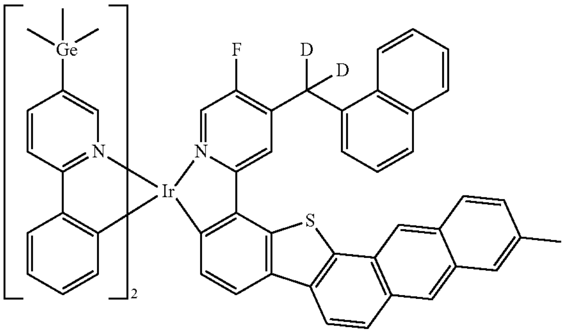
-continued
391
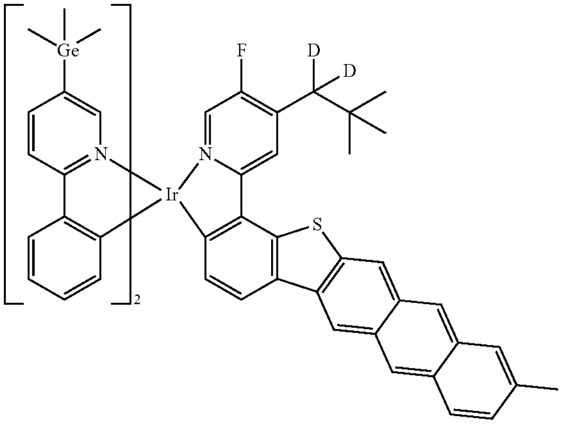
392
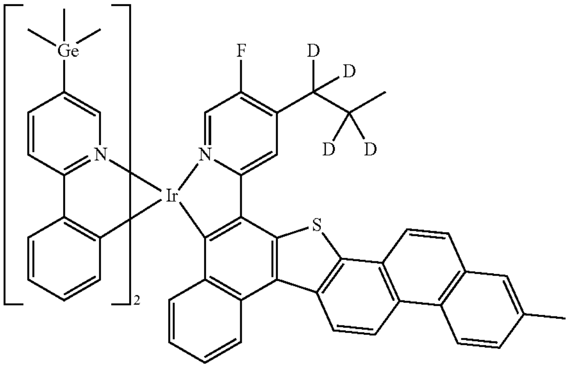
393
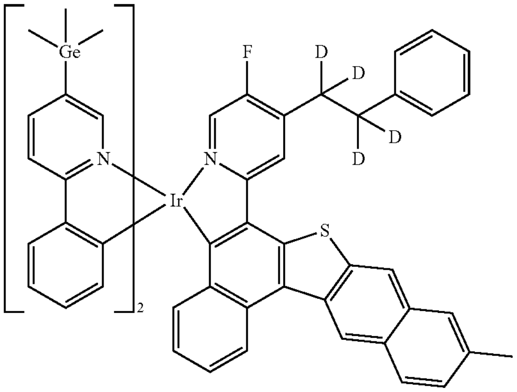
394
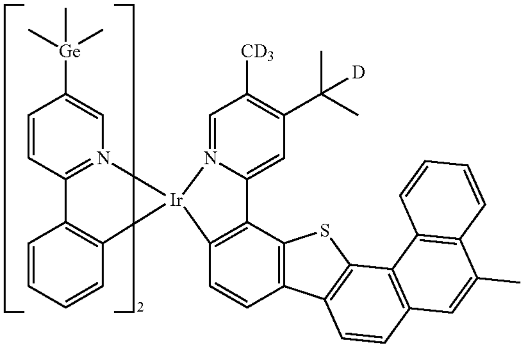

-continued
395
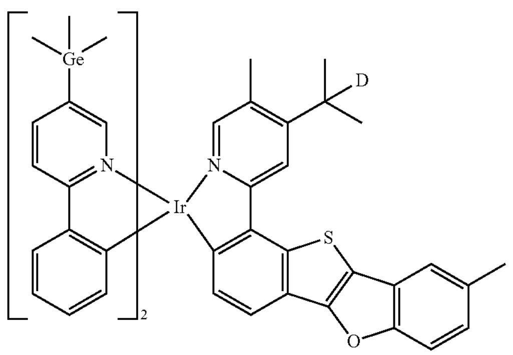
396
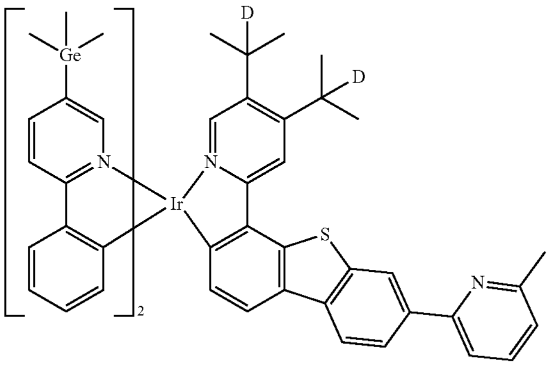
397
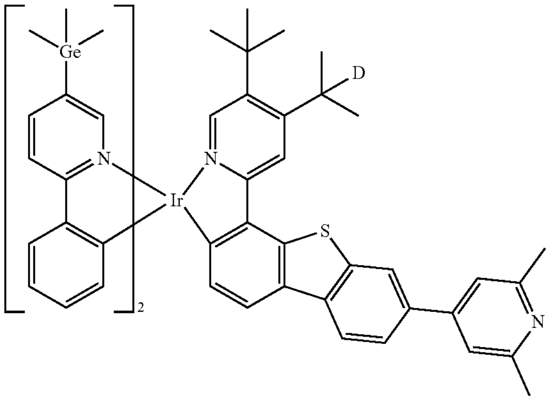
398
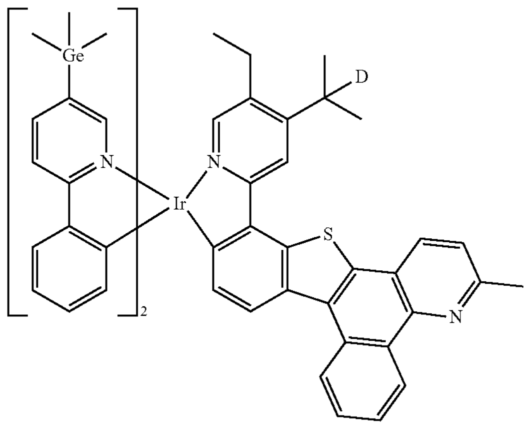
-continued
399
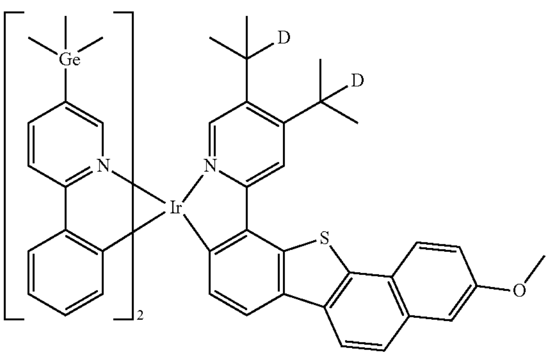
400
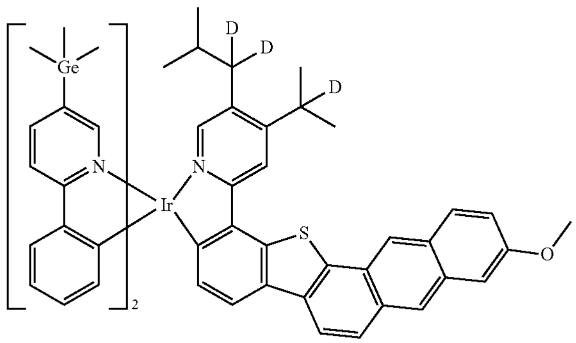
401
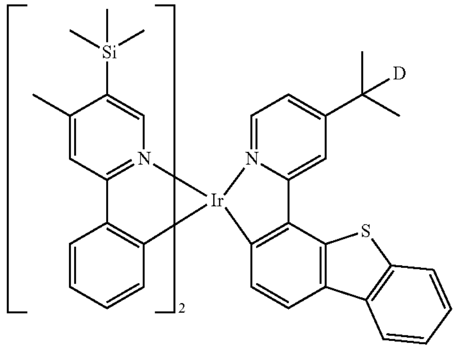
402
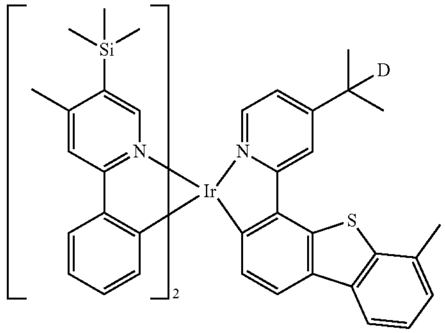

-continued
403
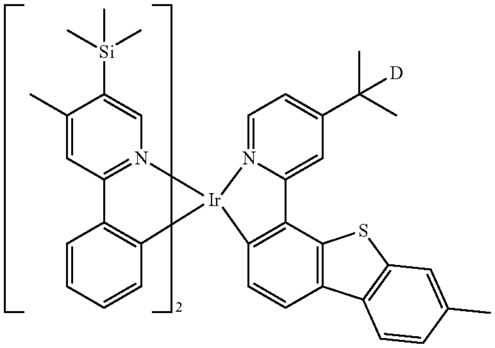
404
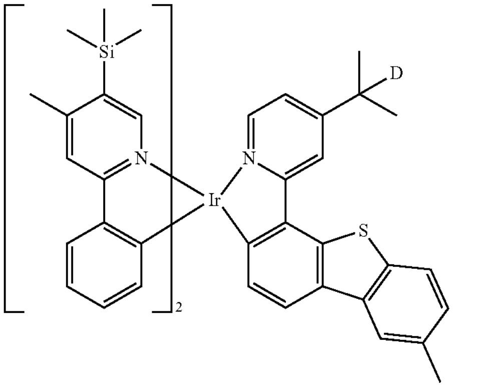
405
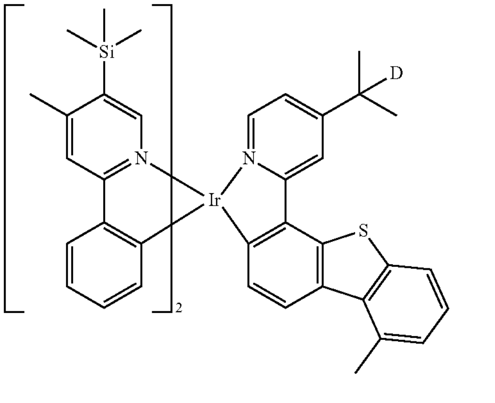
406
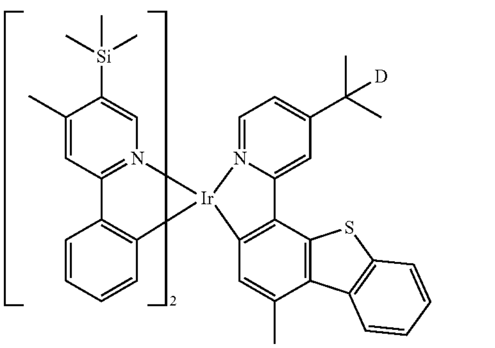
-continued
407
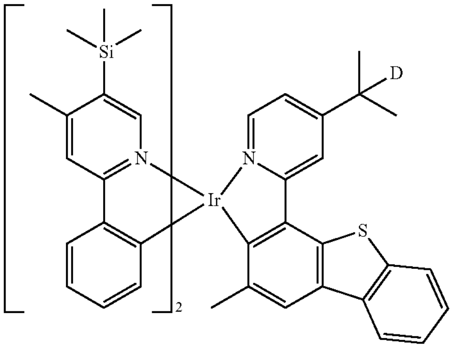
408
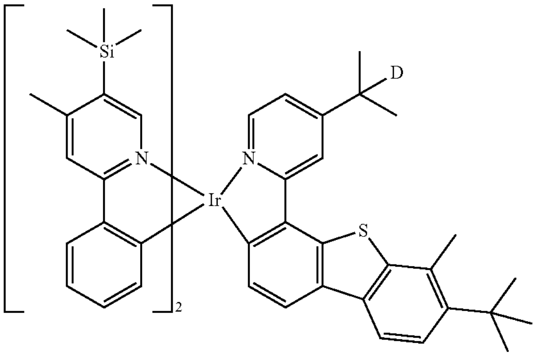
409
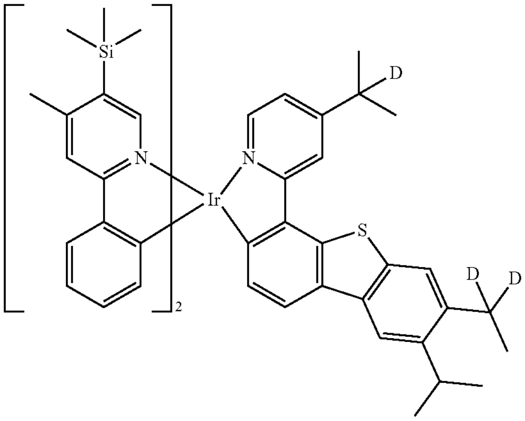
410
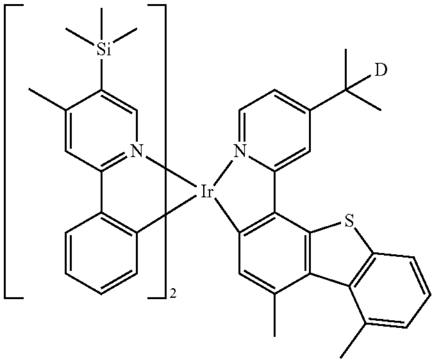

-continued
411
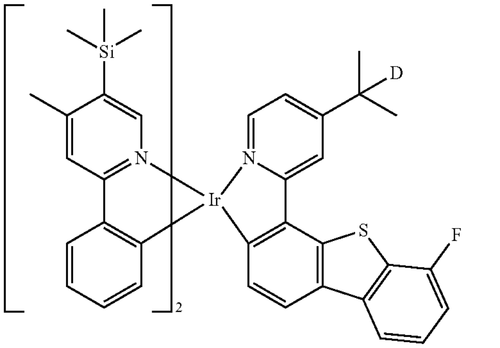
412
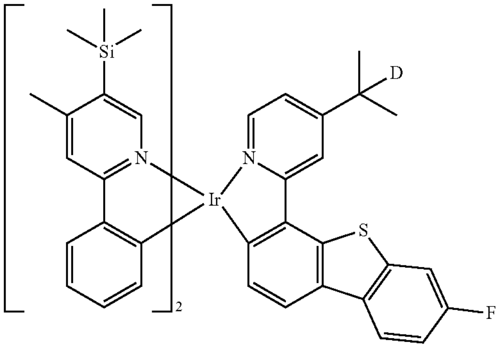
413
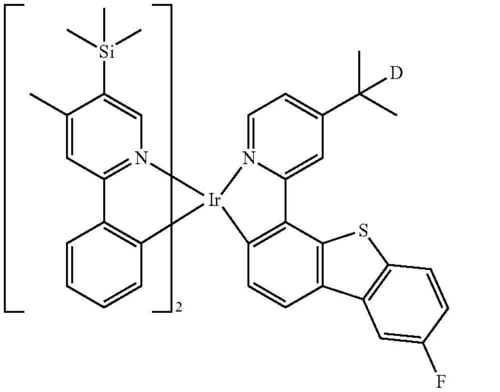
414
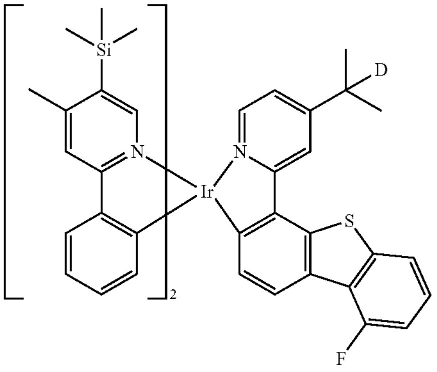
-continued
415
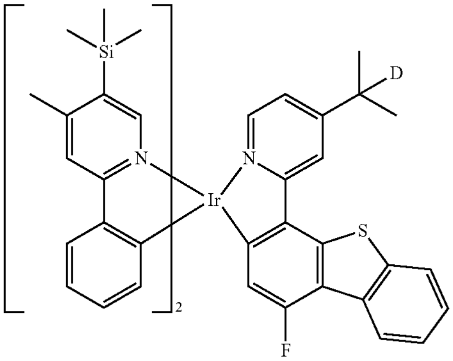
416
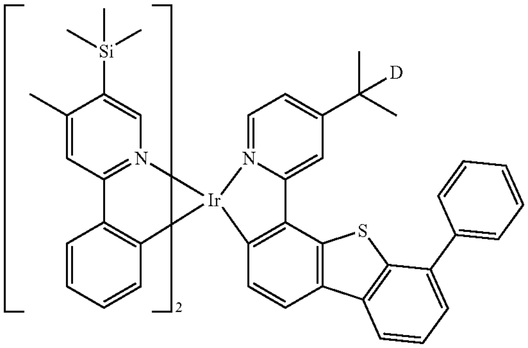
417
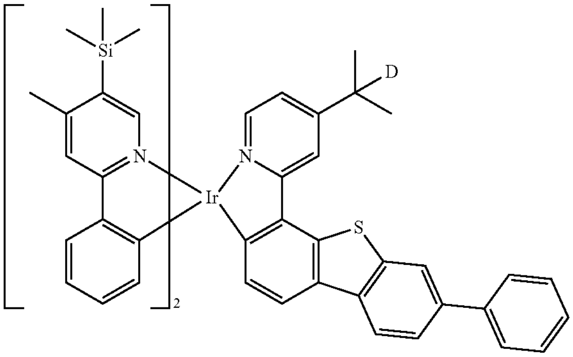
418
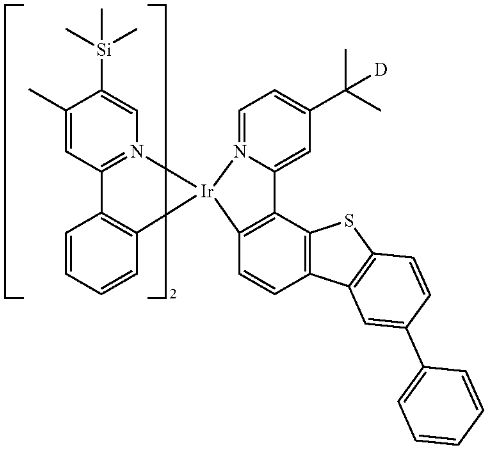

-continued
419
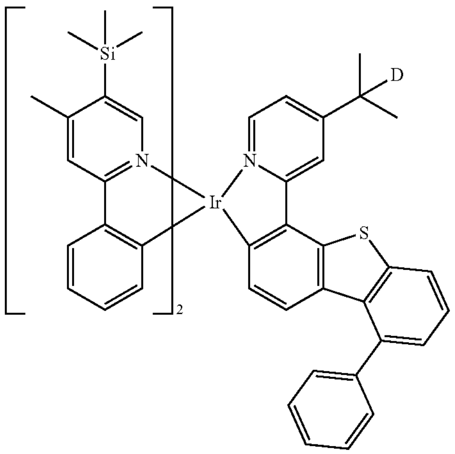
420
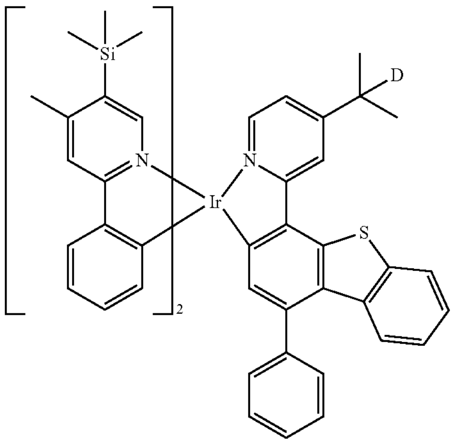
421
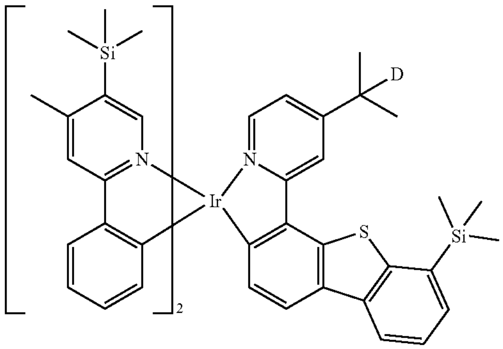
422
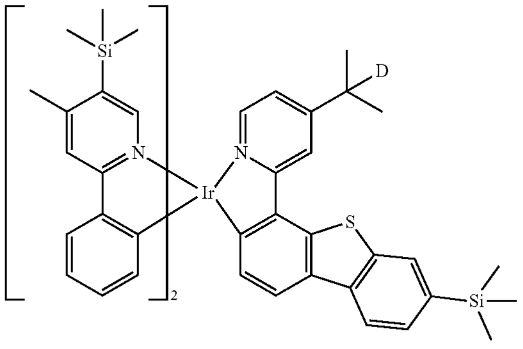
-continued
423
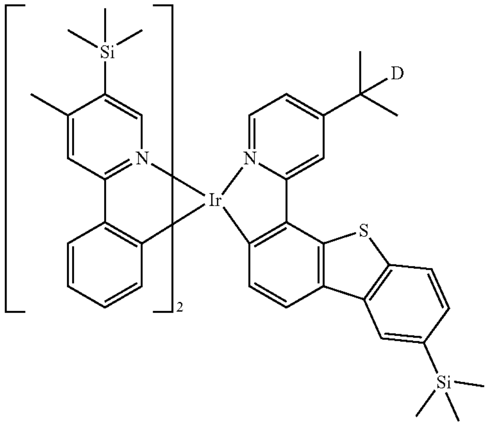
424
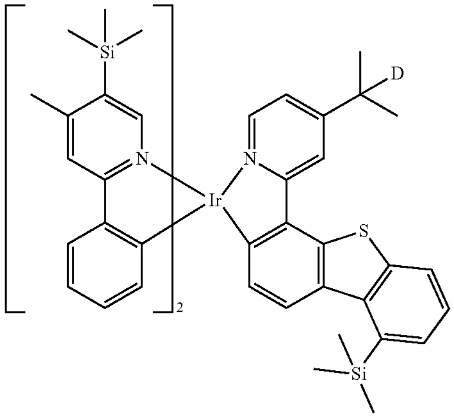
425
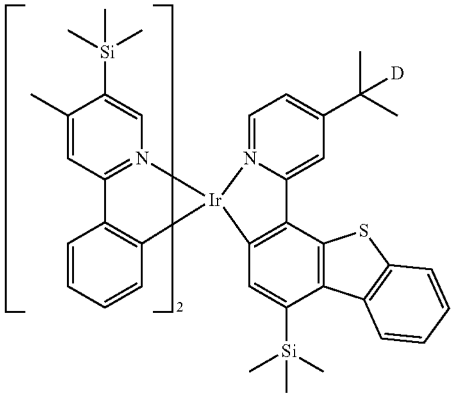
426
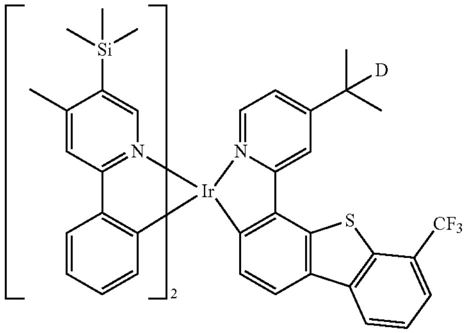

-continued
427
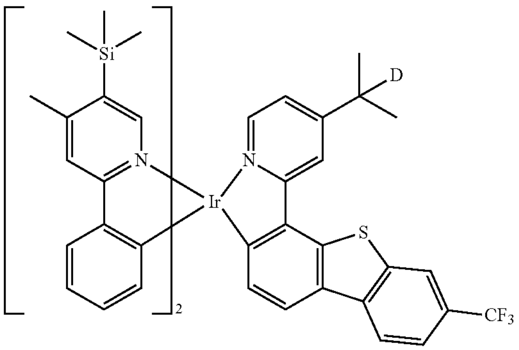
428
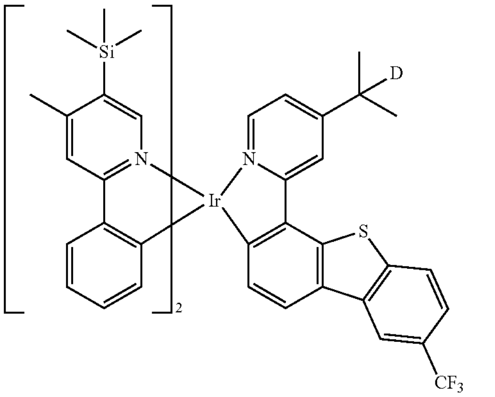
429
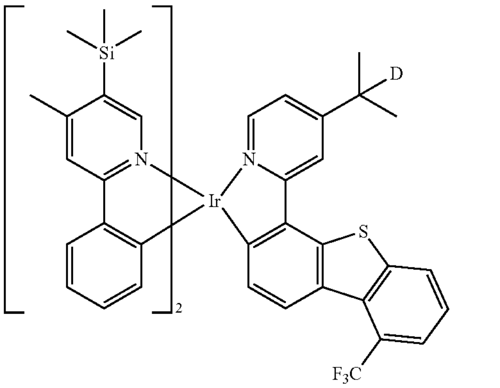
430
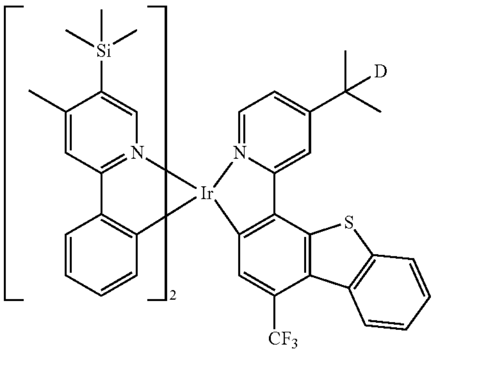
-continued
431
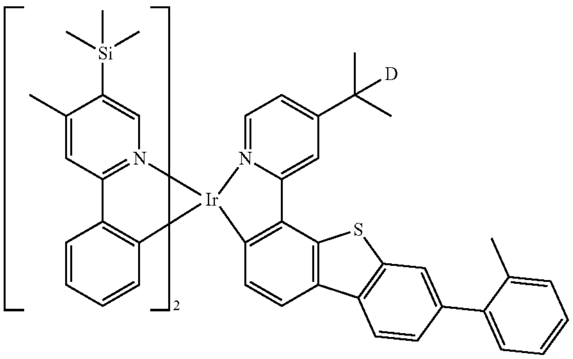
432
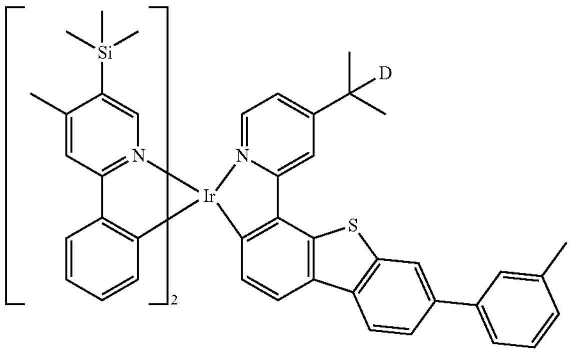
433
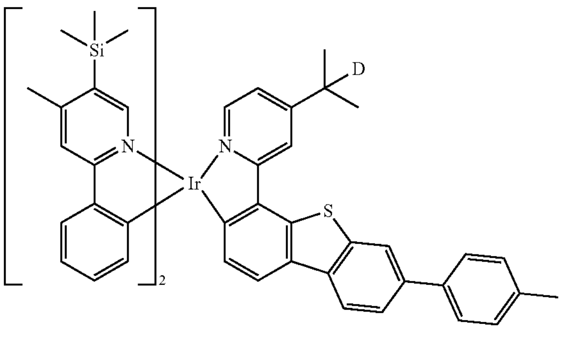
434
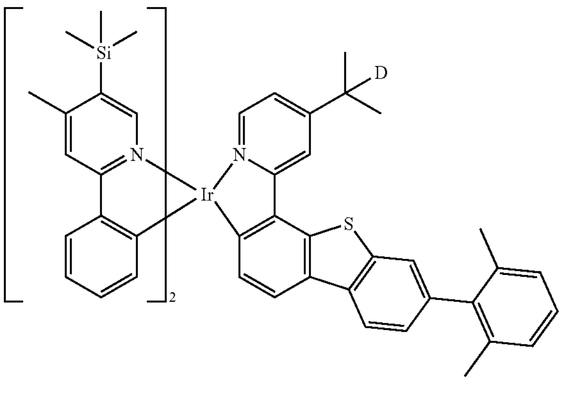

-continued
435
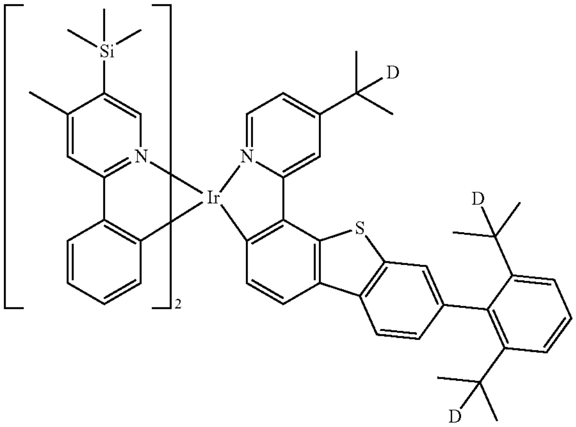
436
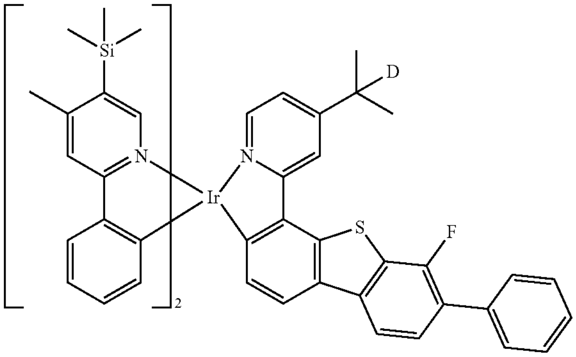
437
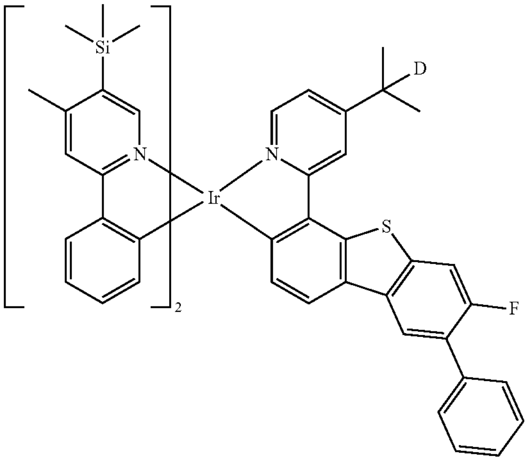
-continued
438
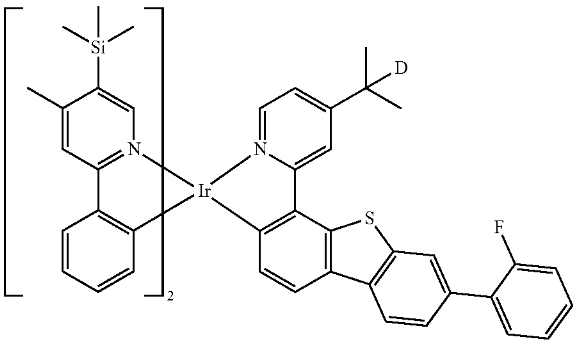
439
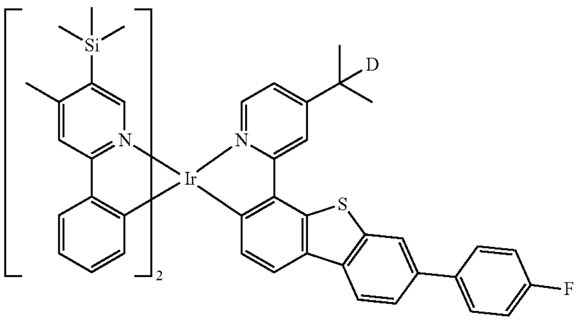
440
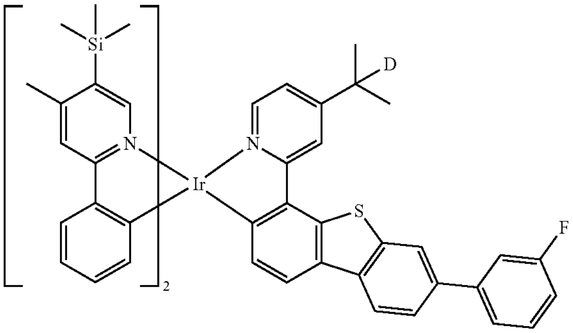
441
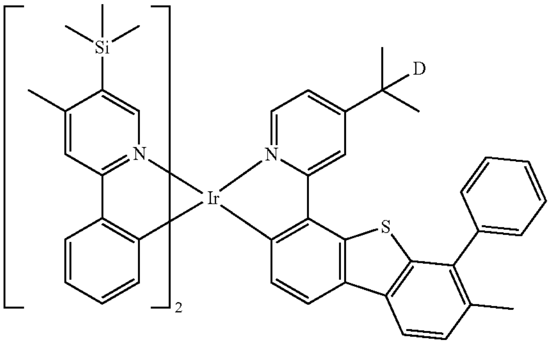

-continued
442
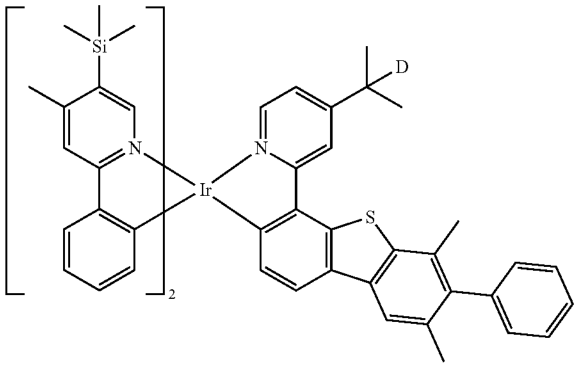
443
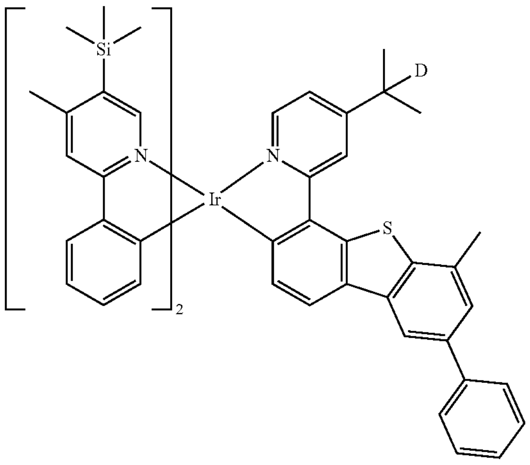
444
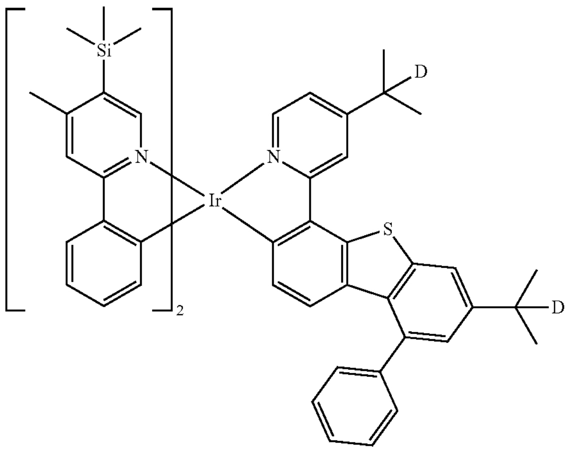
-continued
445
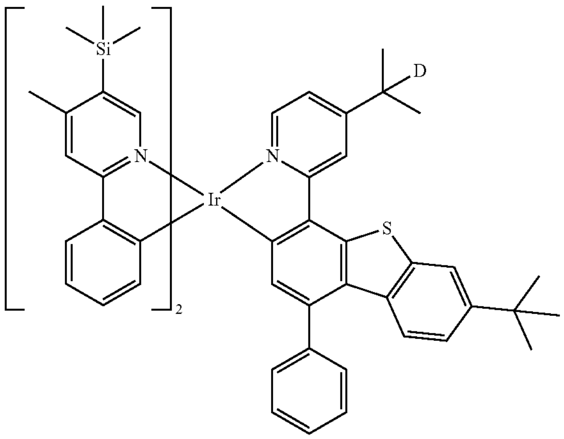
446
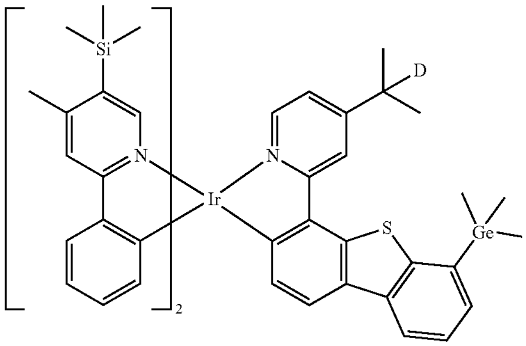
447
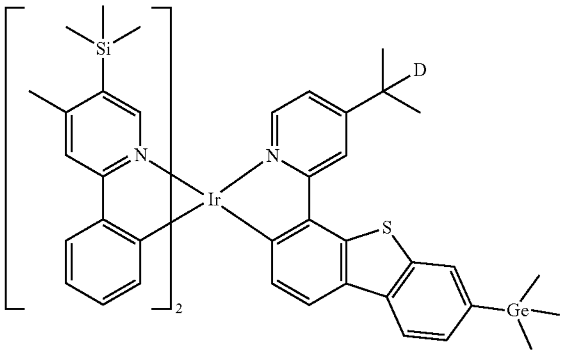
448
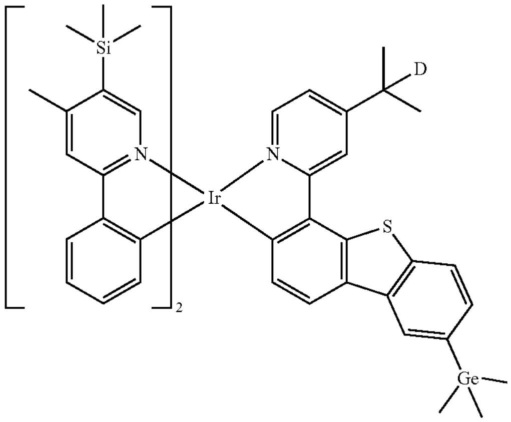

-continued
449
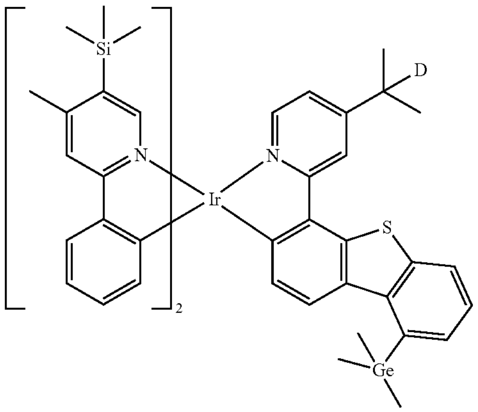
450
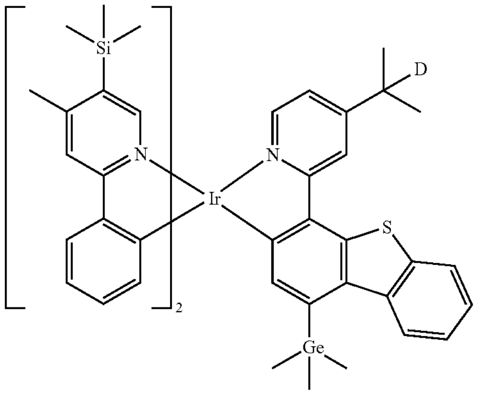
451
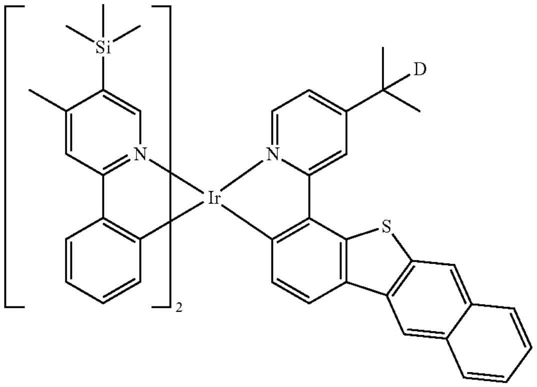
452
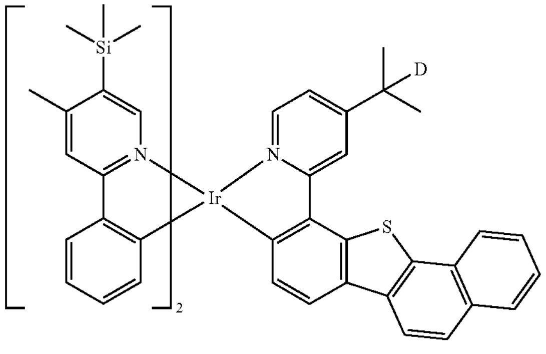
-continued
453
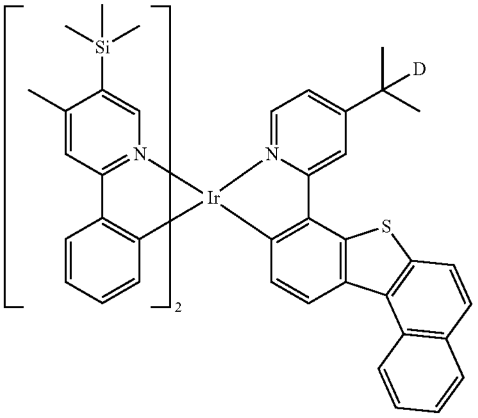
454
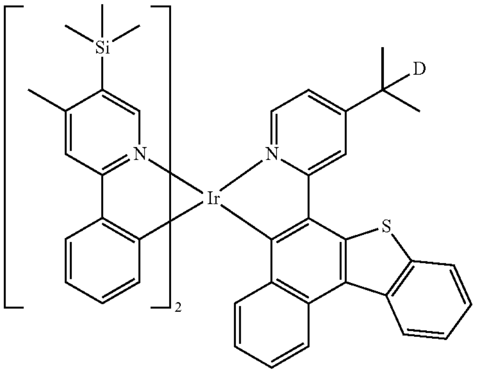
455
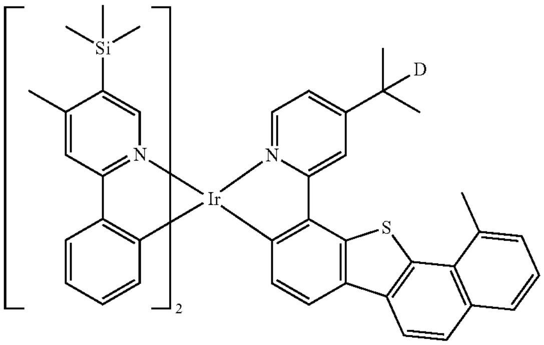
456
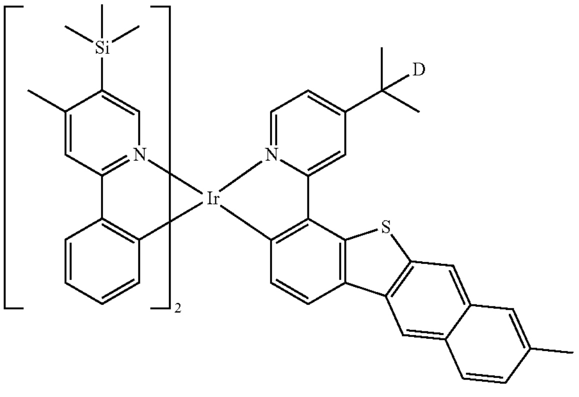

-continued
457
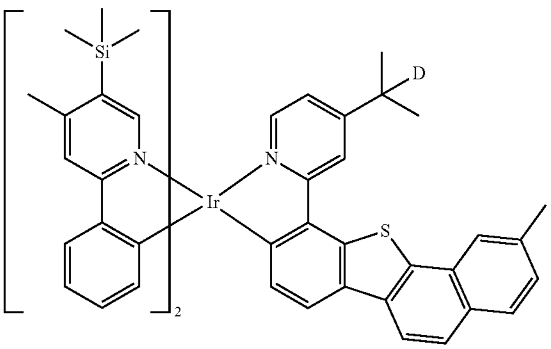
458
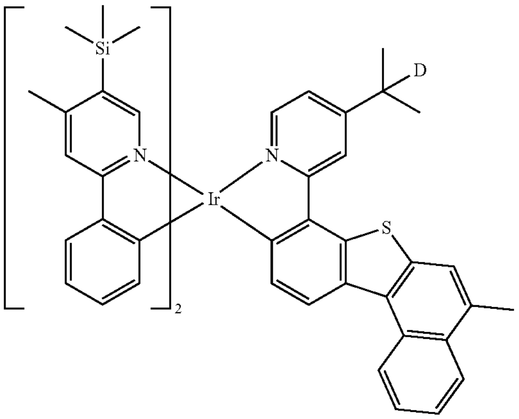
459
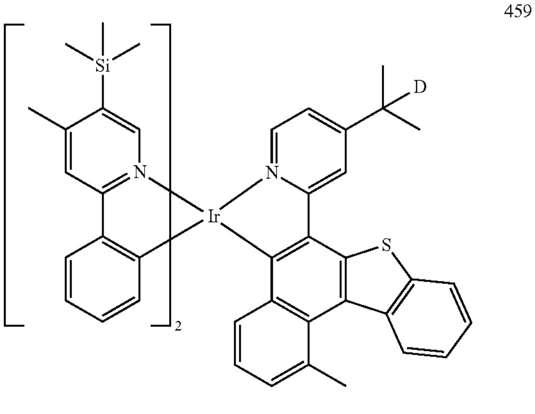
460
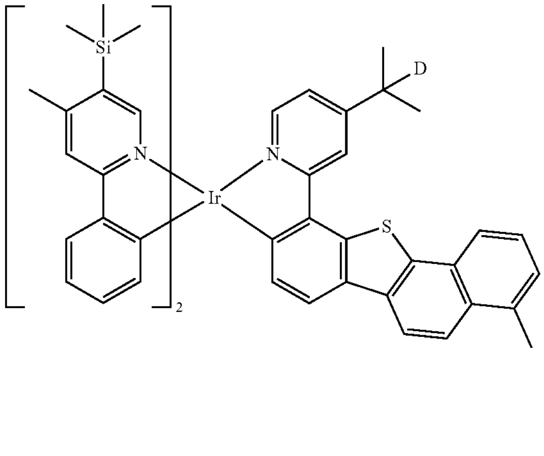
-continued
461
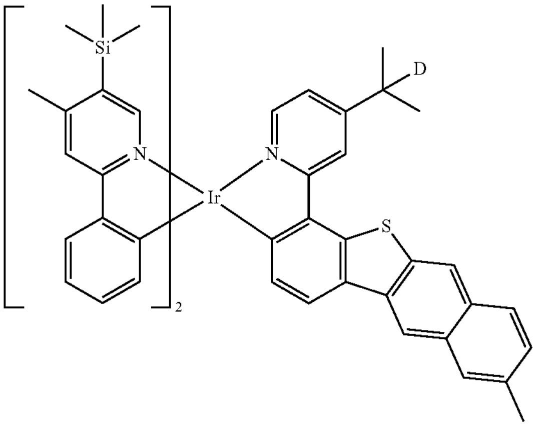
462
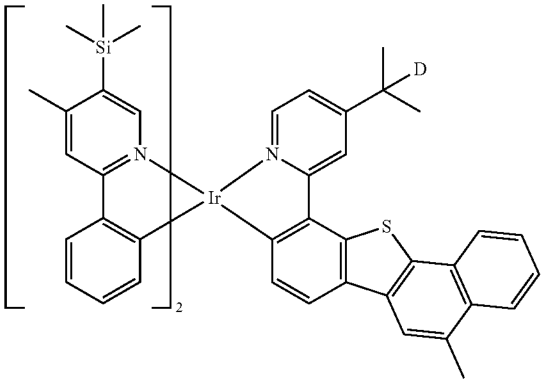
463
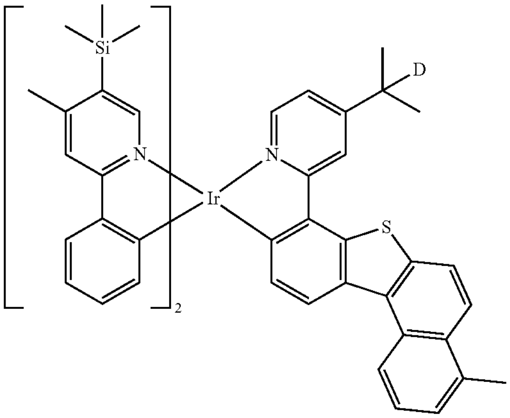

-continued
464
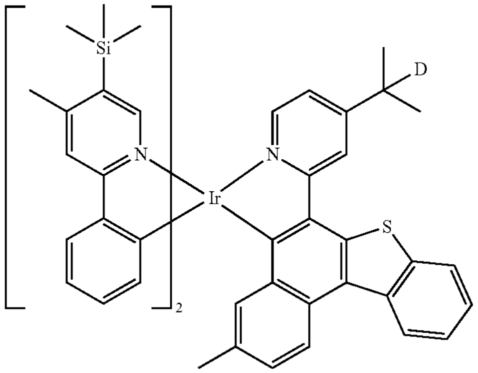
465
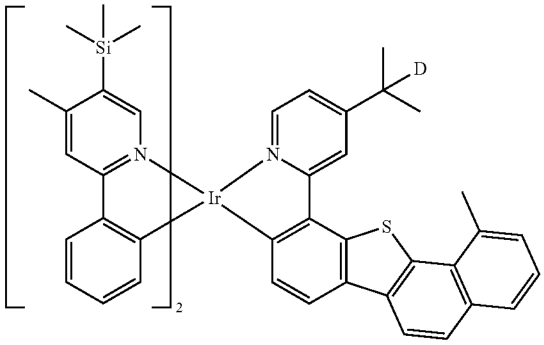
466
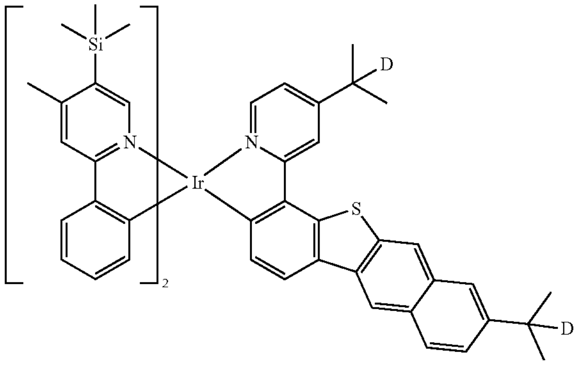
467
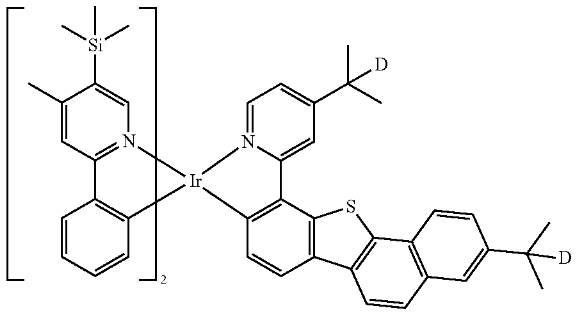
-continued
468
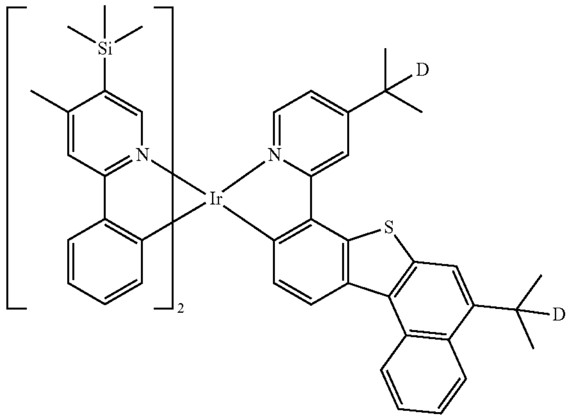
469
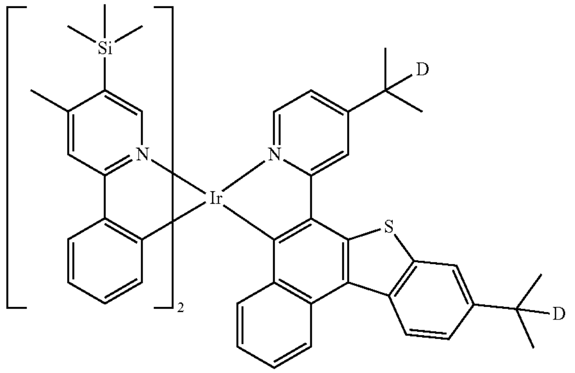
470
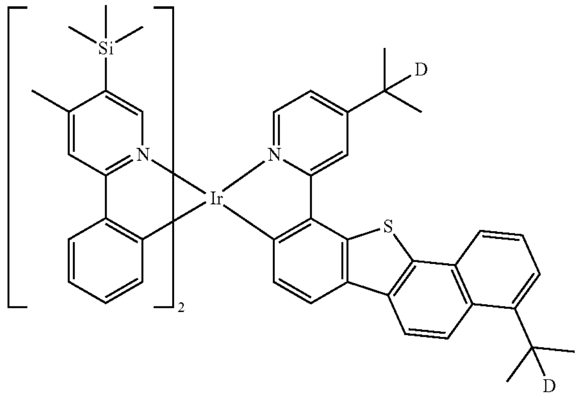
471
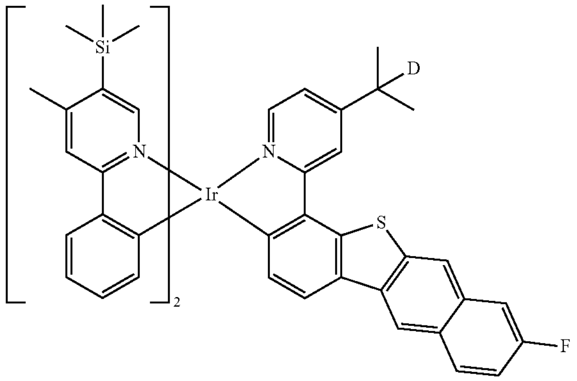

-continued
472
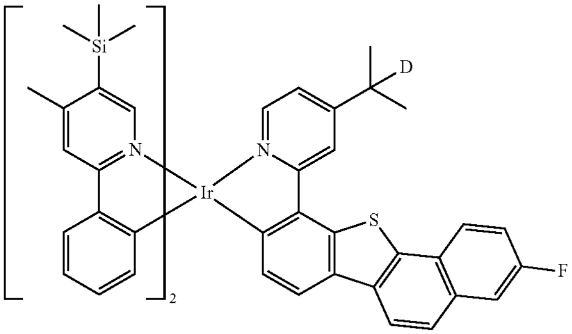
473
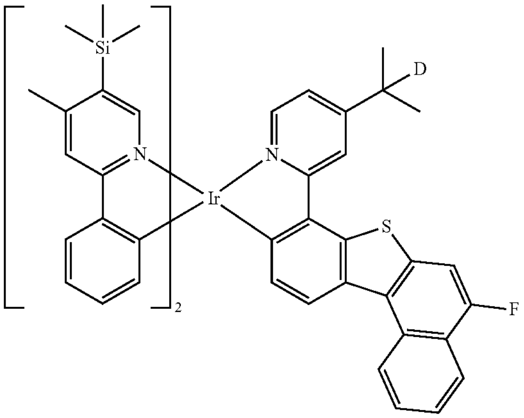
474
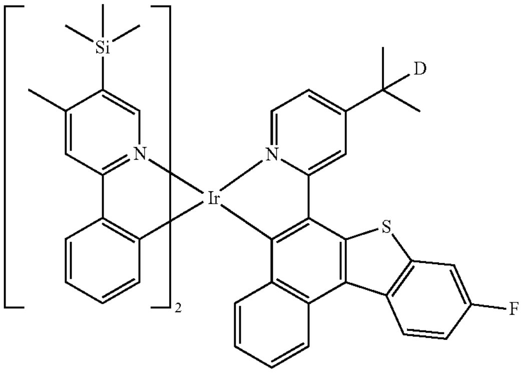
475
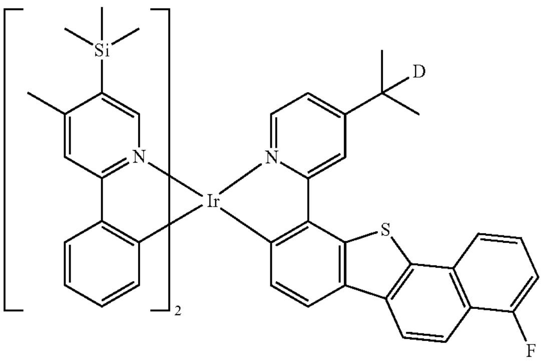
-continued
476
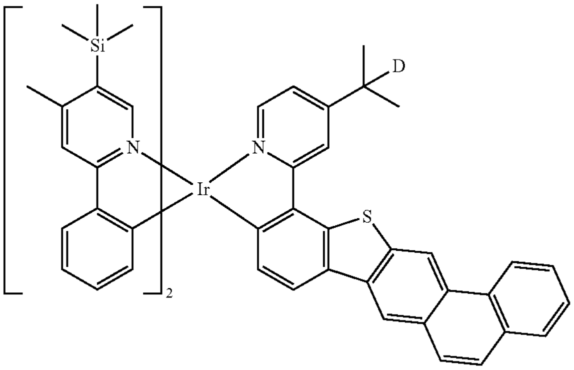
477
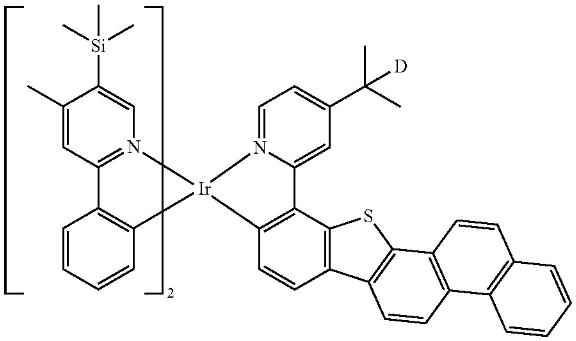
478
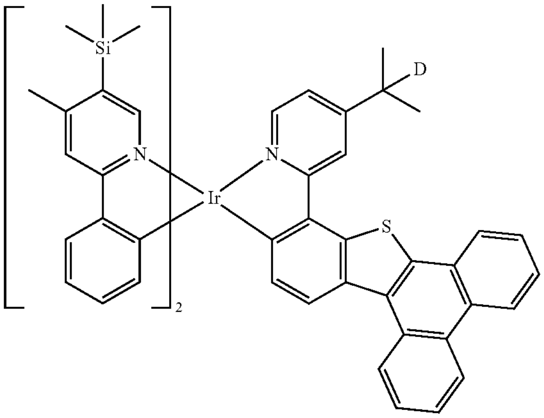
479
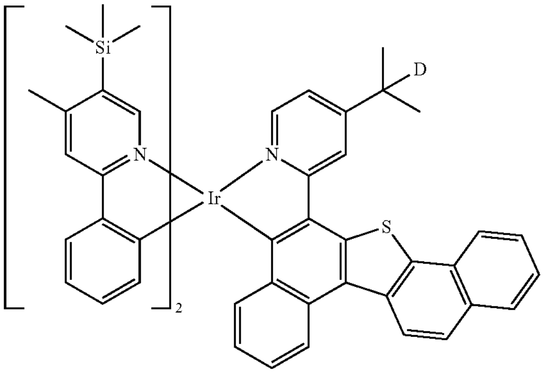

480
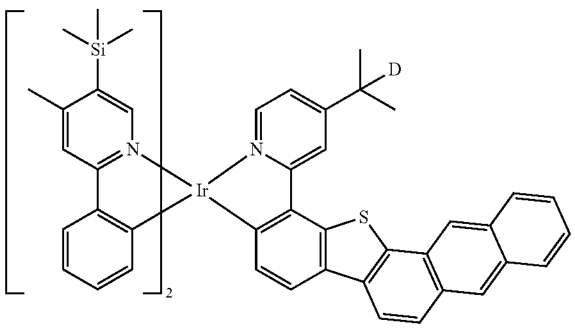
481
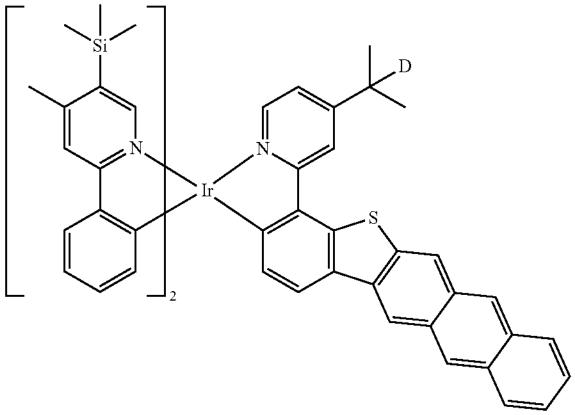
482
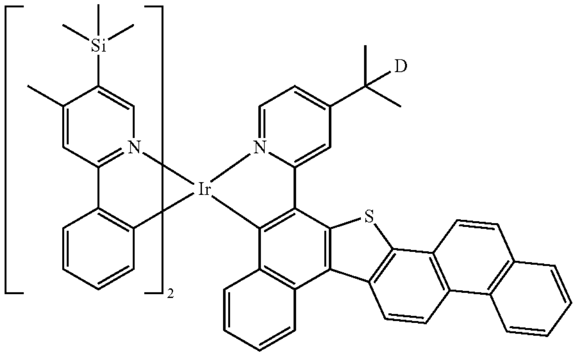
483
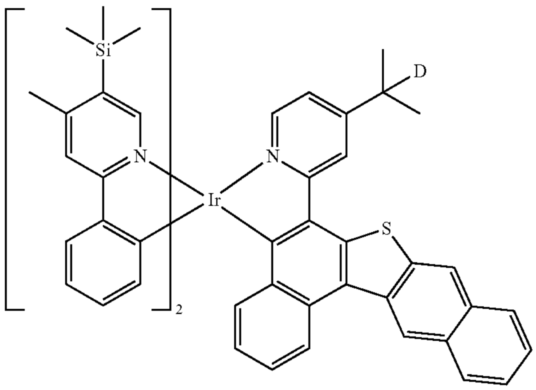
484
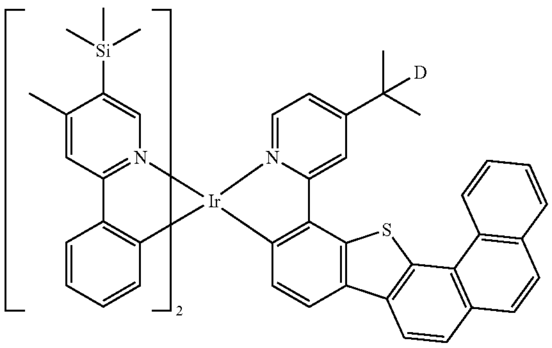
485
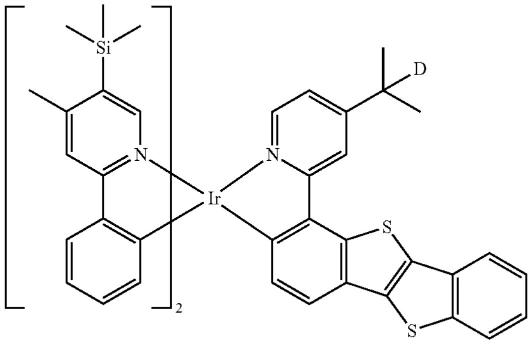
486
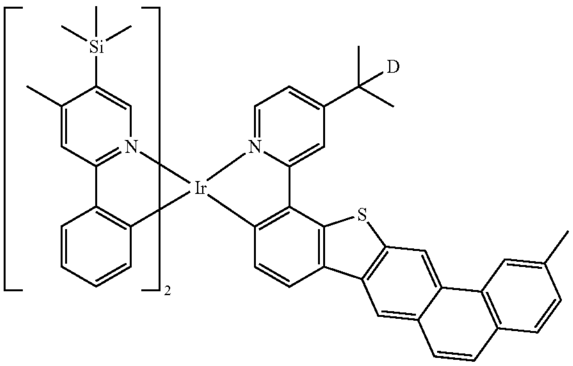
487
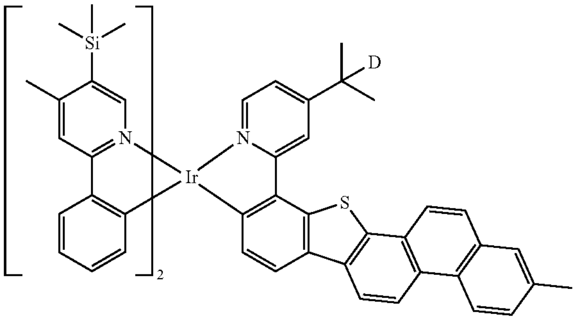

-continued
488
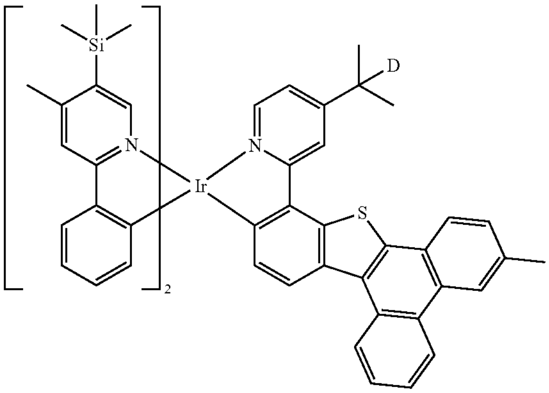
489
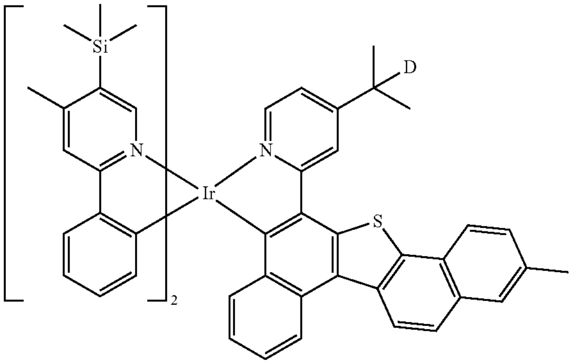
490
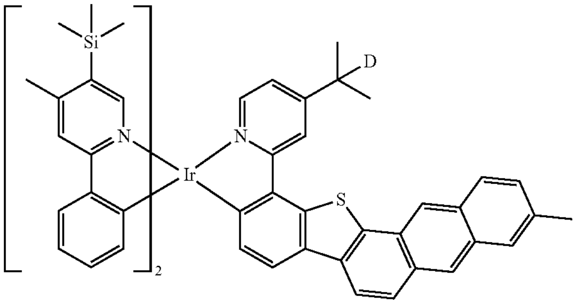
491
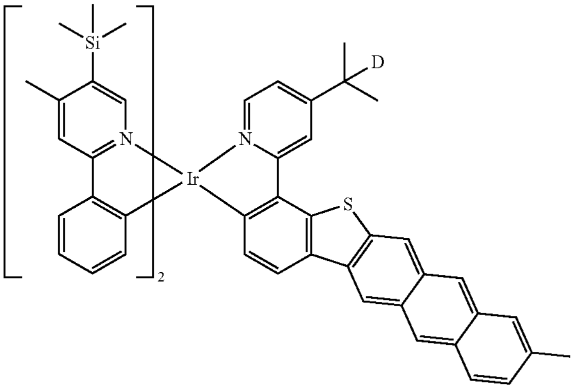
-continued
492
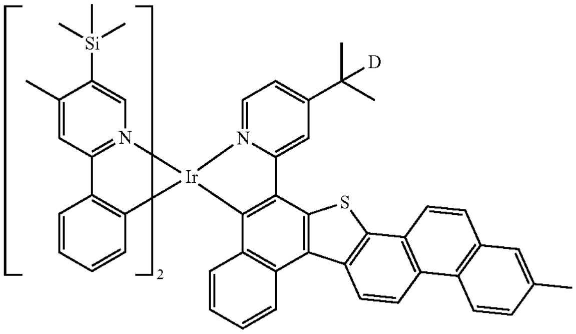
493
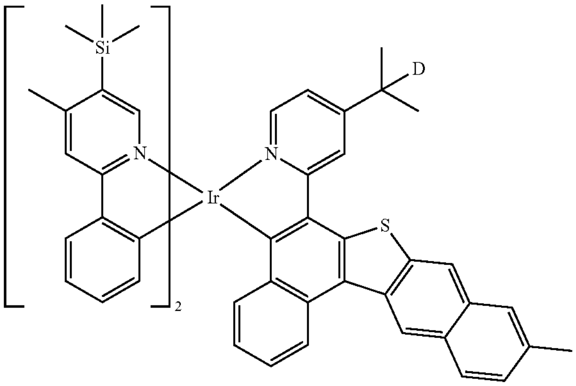
494
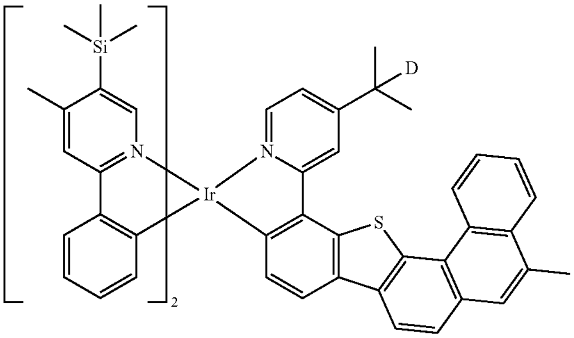
495
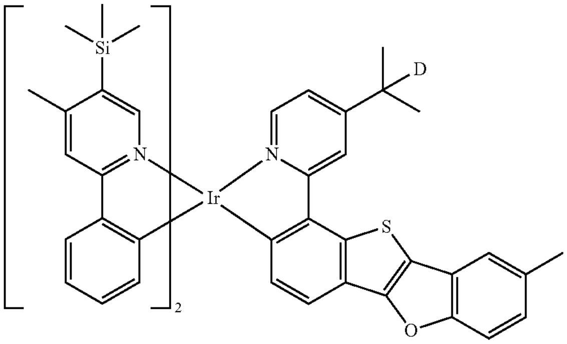

-continued
496
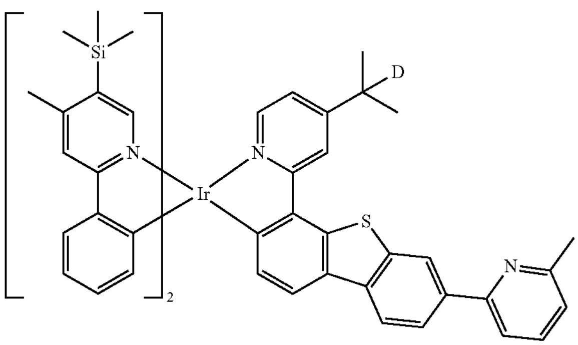
497
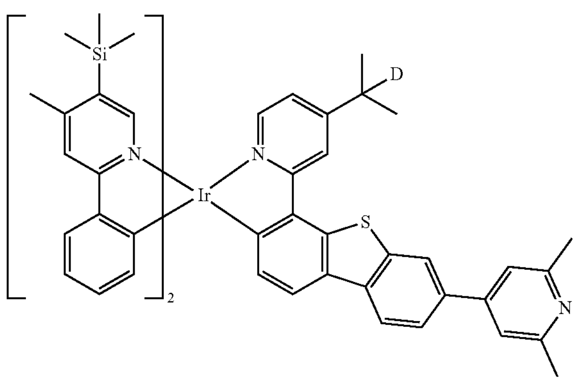
498
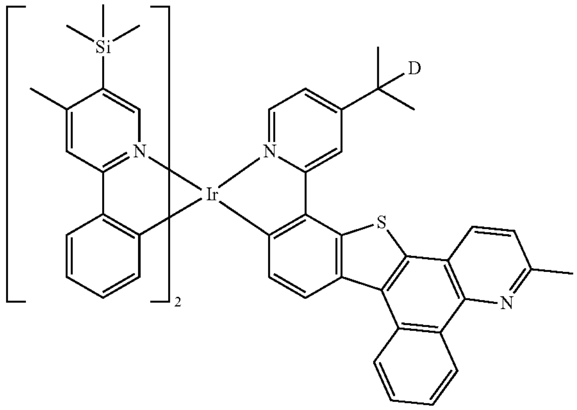
499
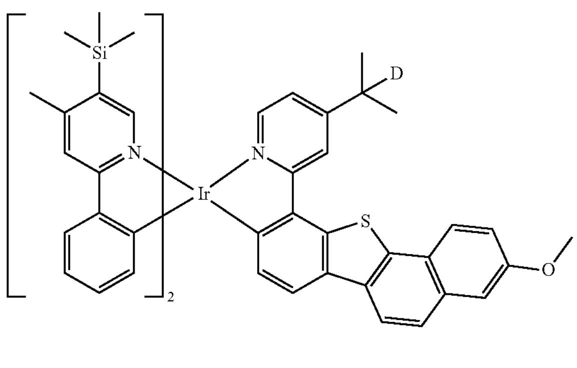
-continued
500
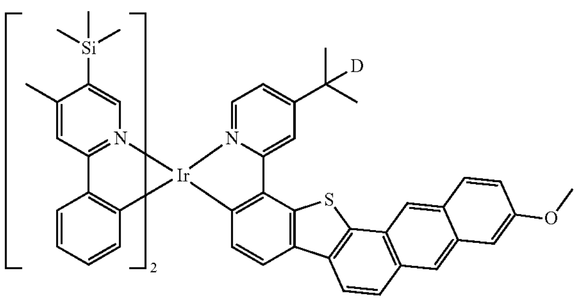
501
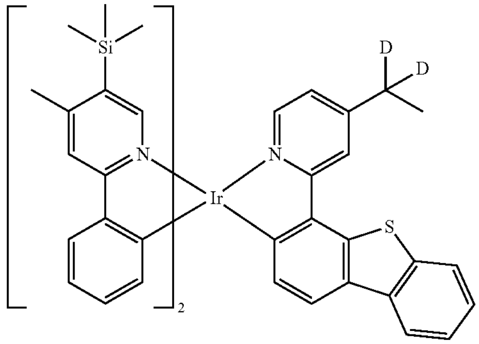
502
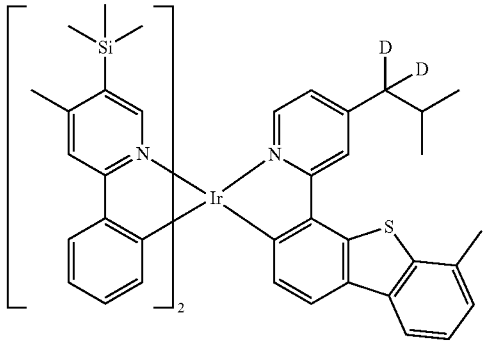
503
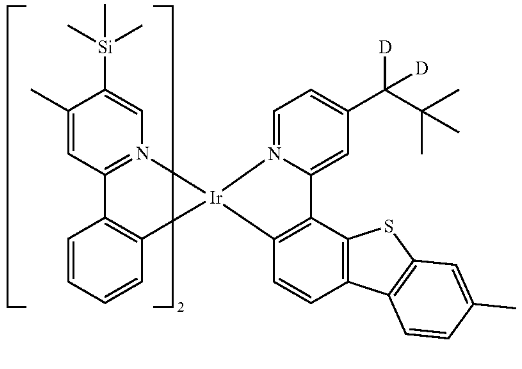

-continued
504
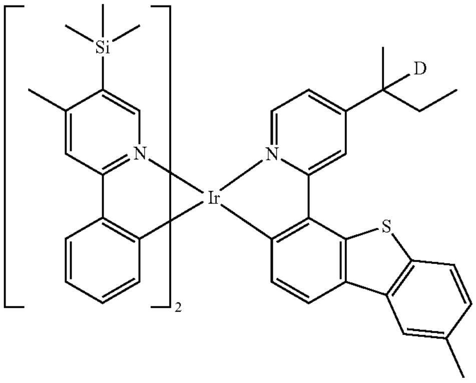
505
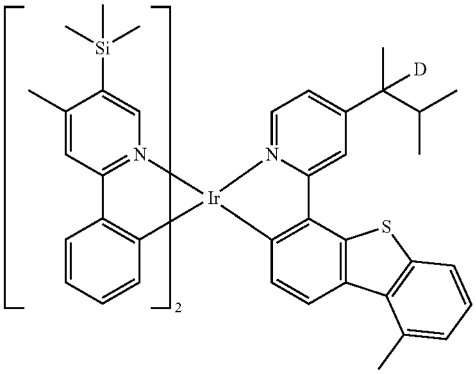
506
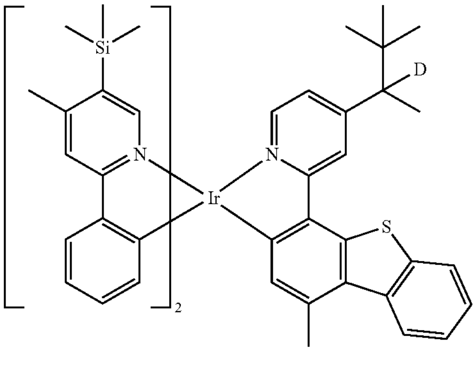
507
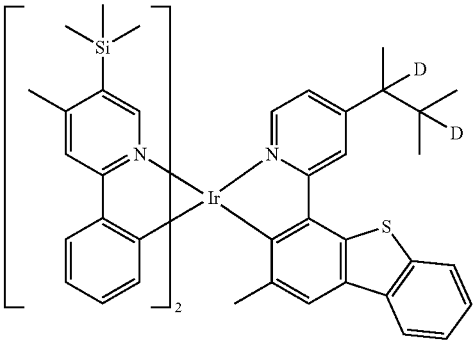
-continued
508
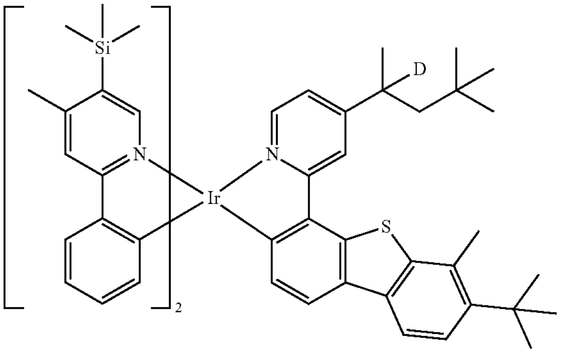
509
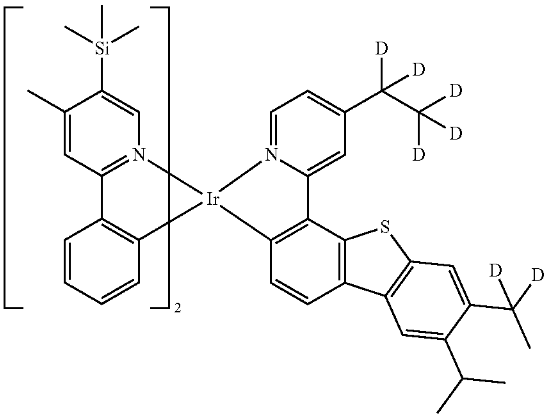
510
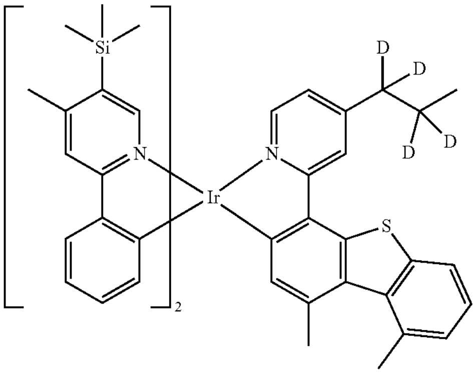
511
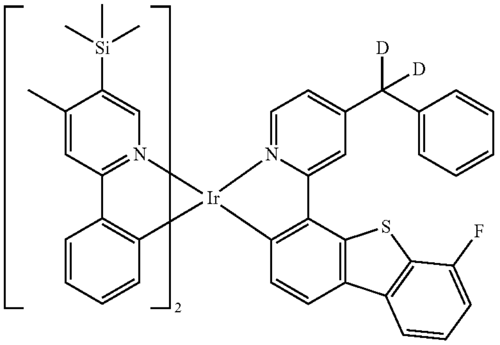

512
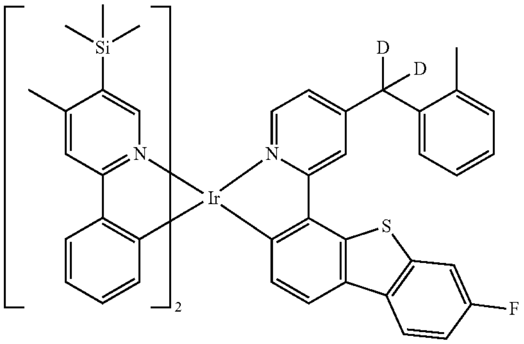
513
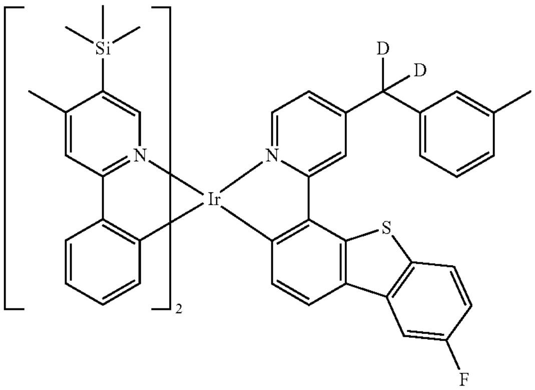
514
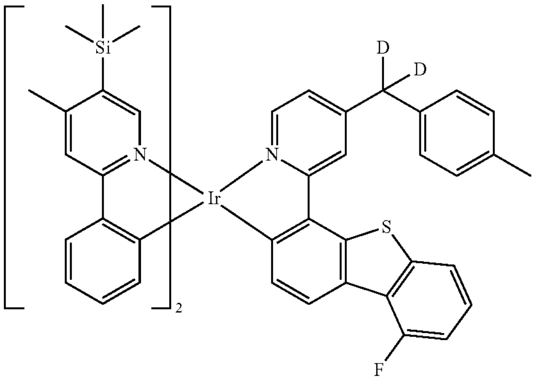
515
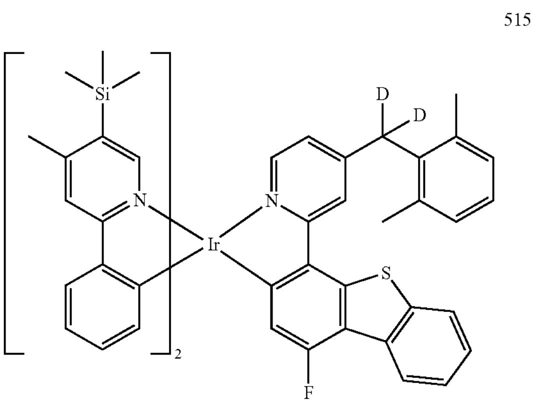
516
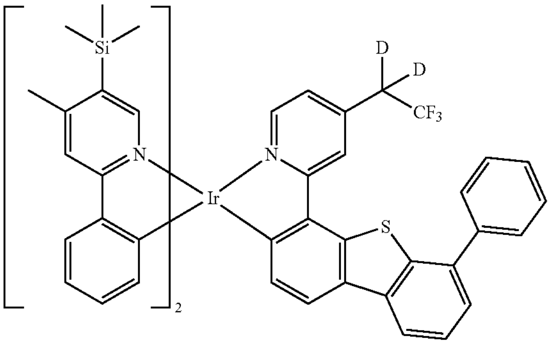
517
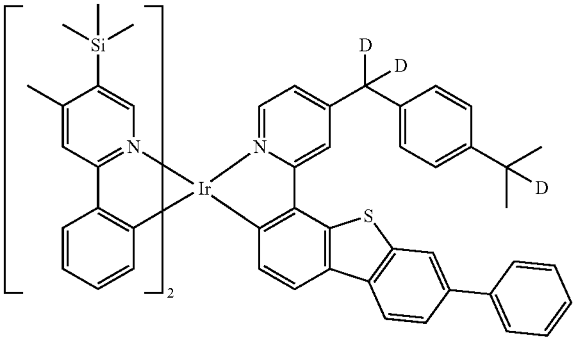
518
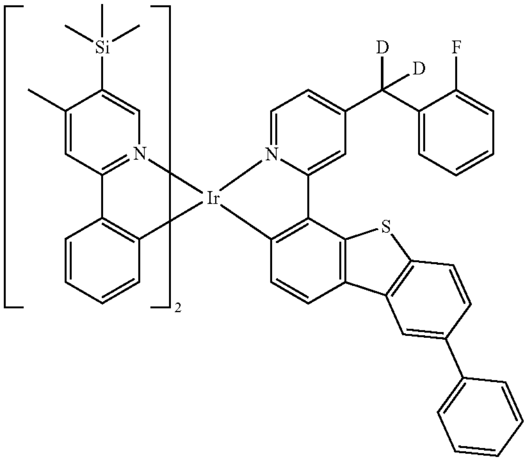

519
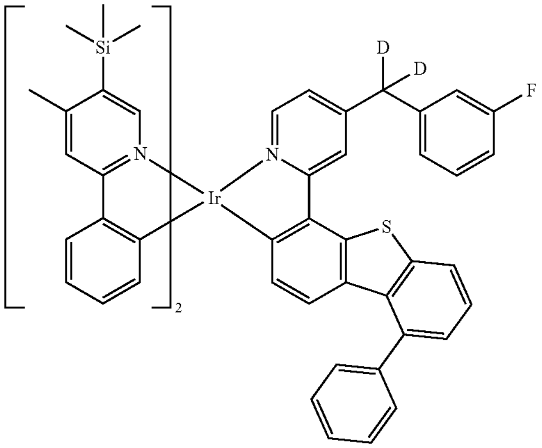
520
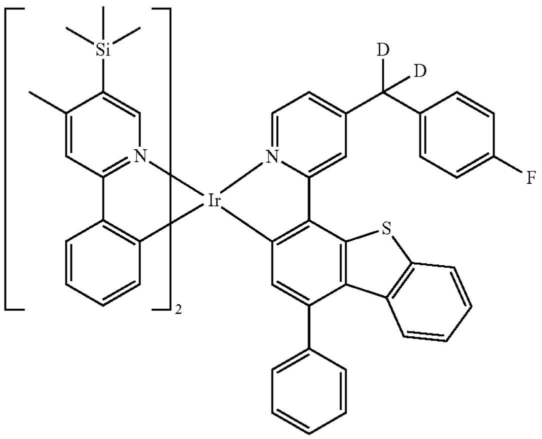
521
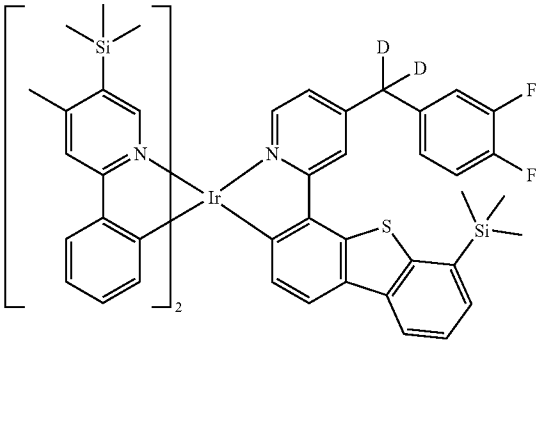
522
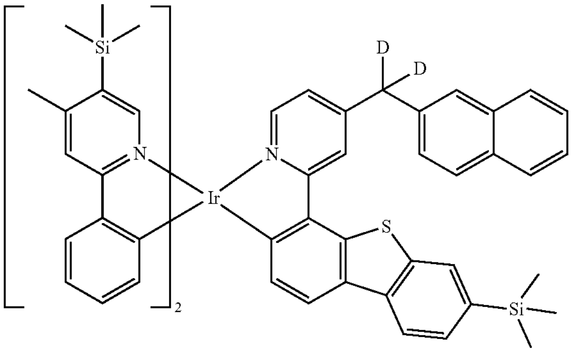
523
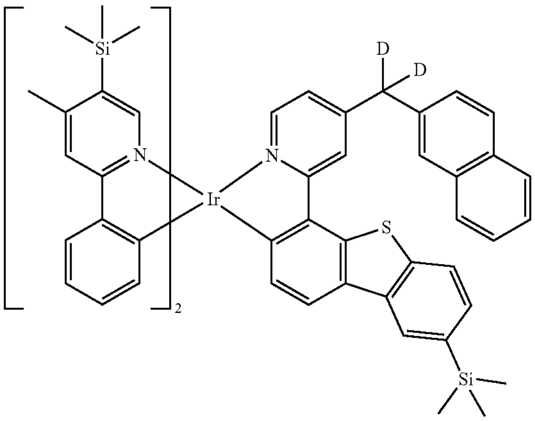
524
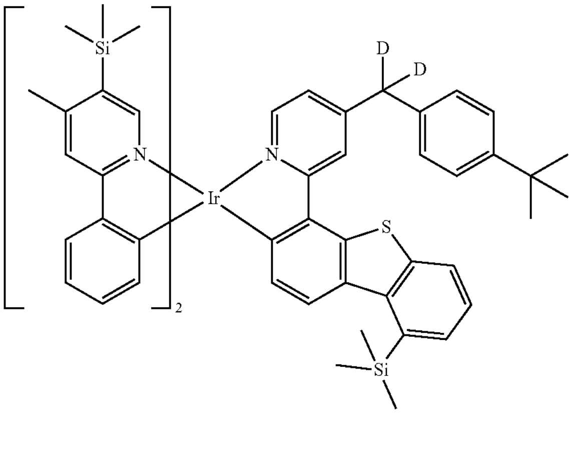

-continued
525
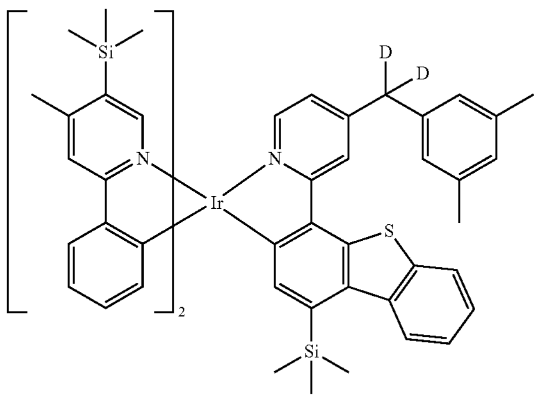
526
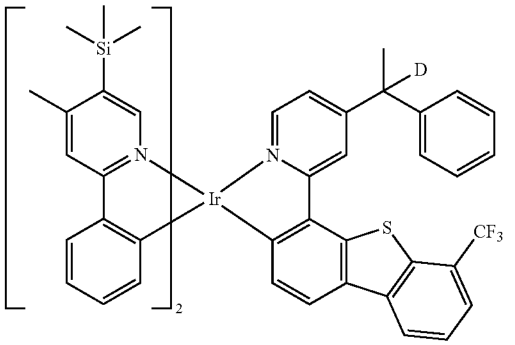
527
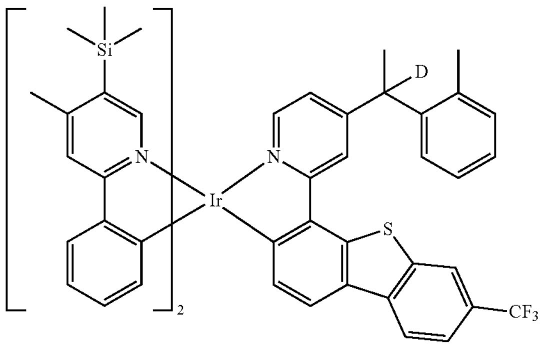
528
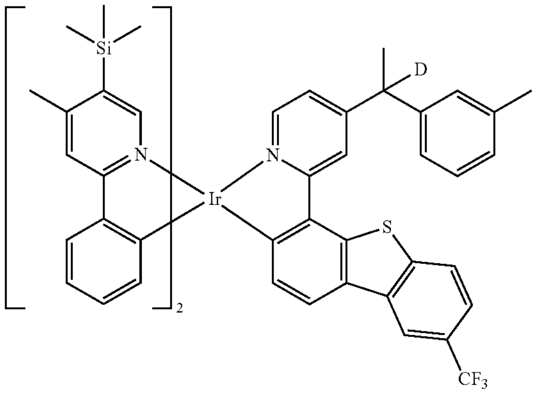
-continued
529
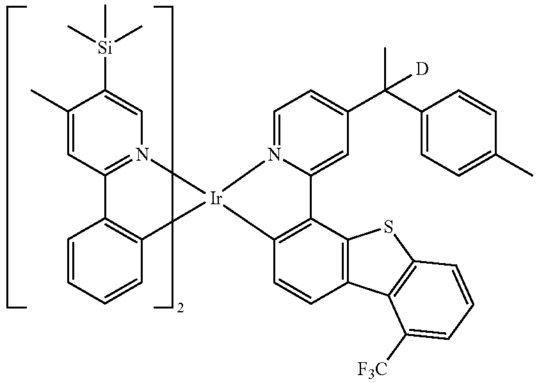
530
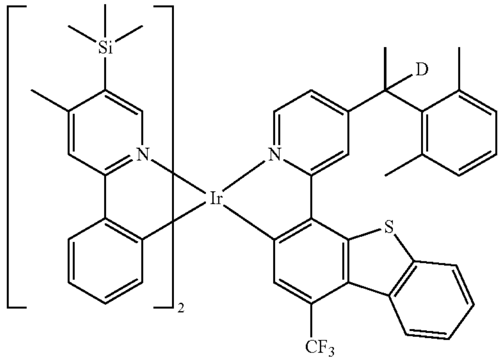
531
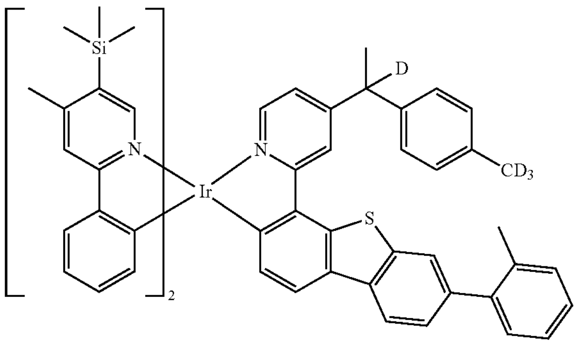
532
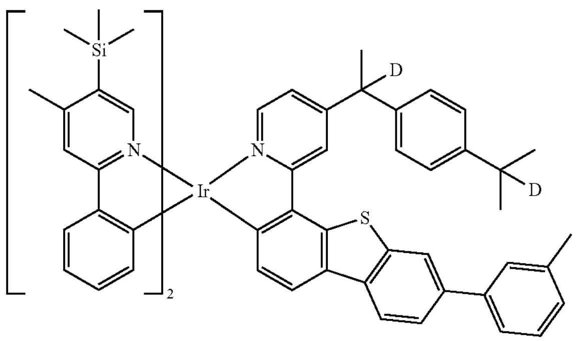

-continued
533
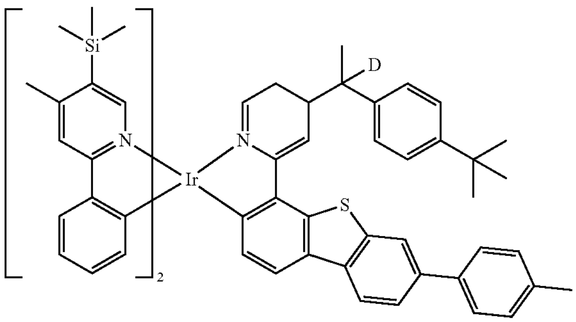
534
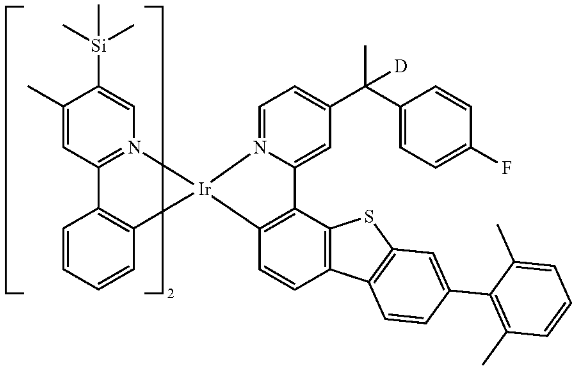
535
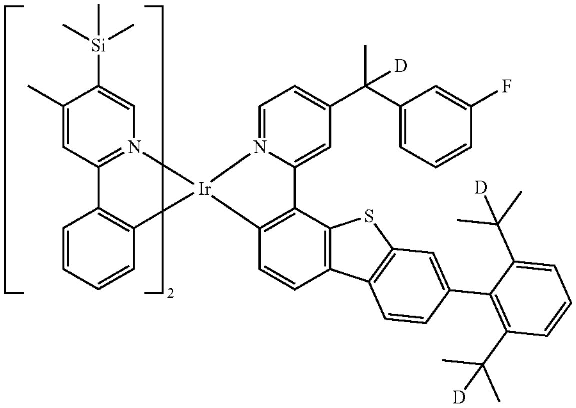
536
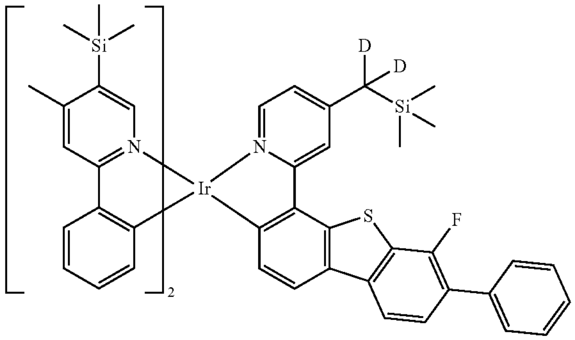
537
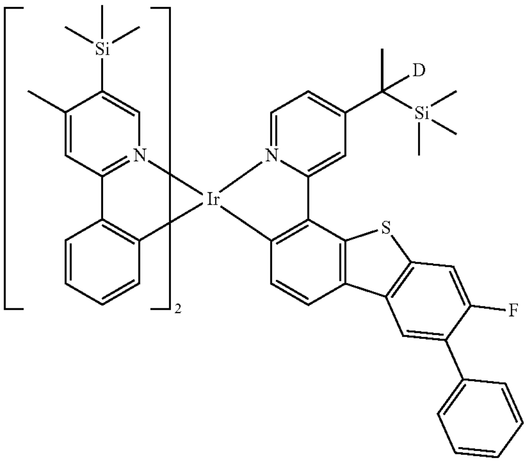
538
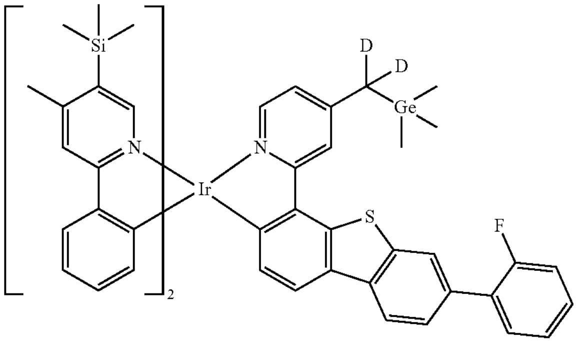
539
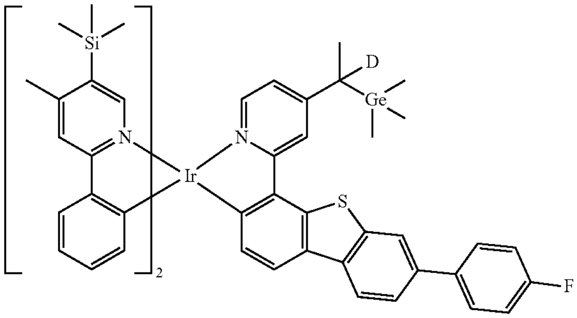
540
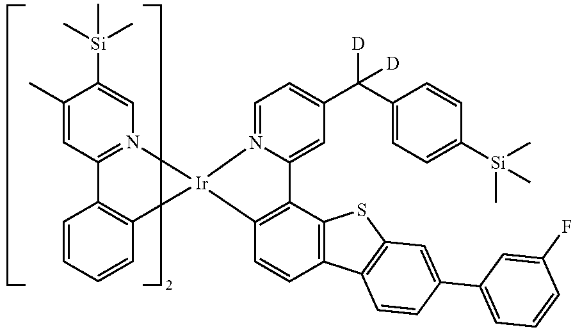

-continued
541
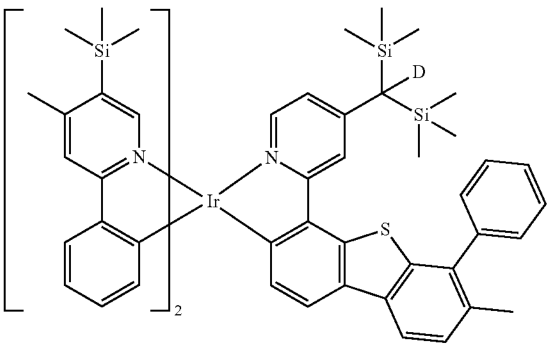
542
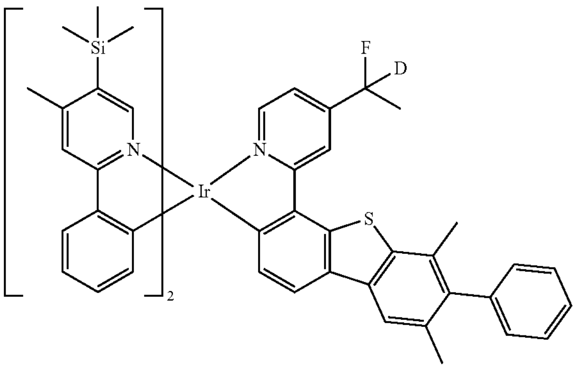
543
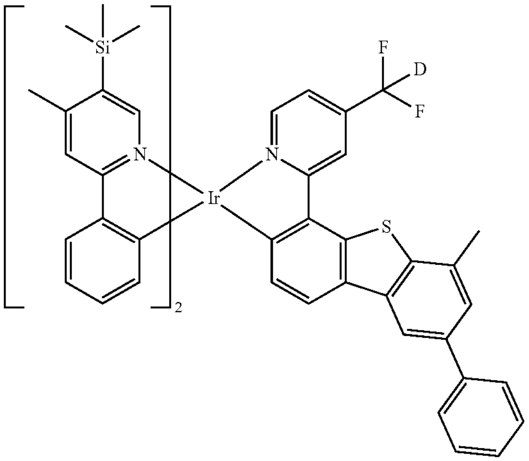
-continued
544
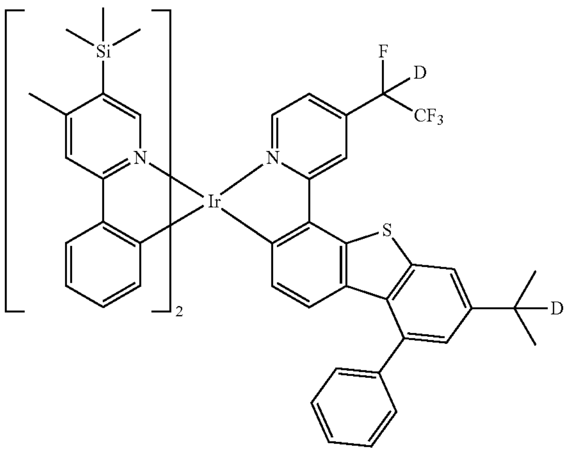
545
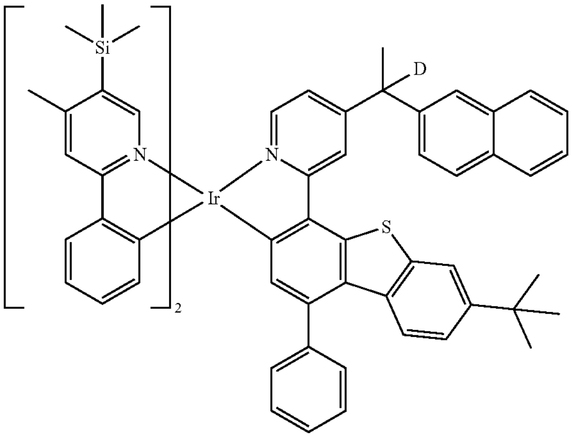
546
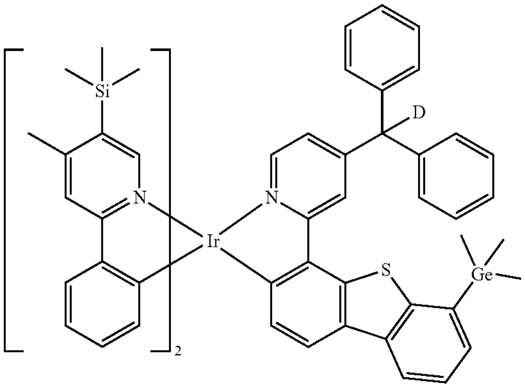

-continued
547
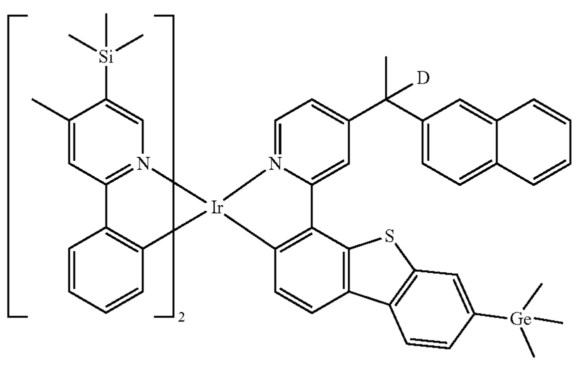
548
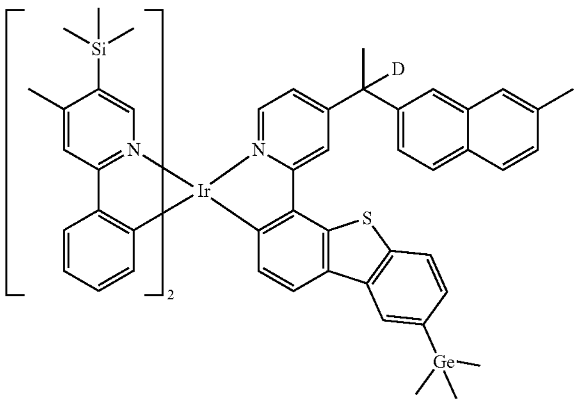
549
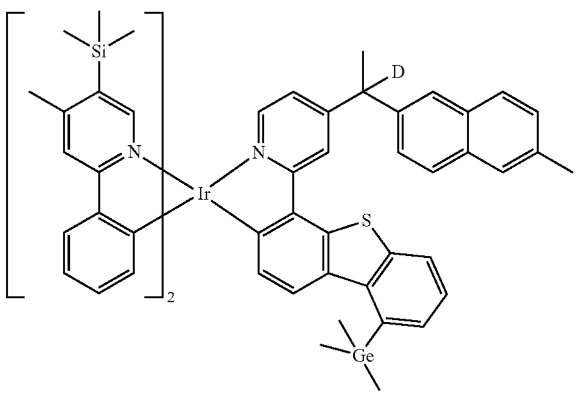
-continued
550
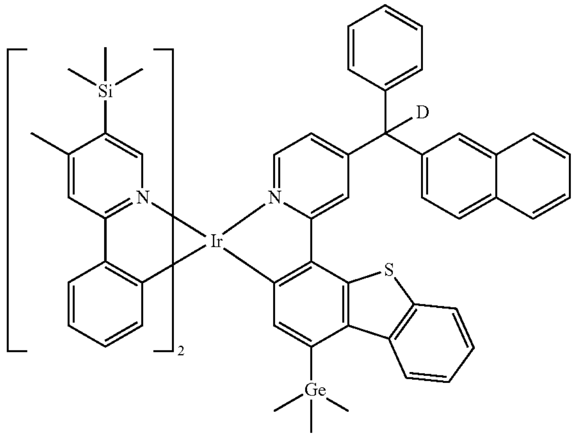
551
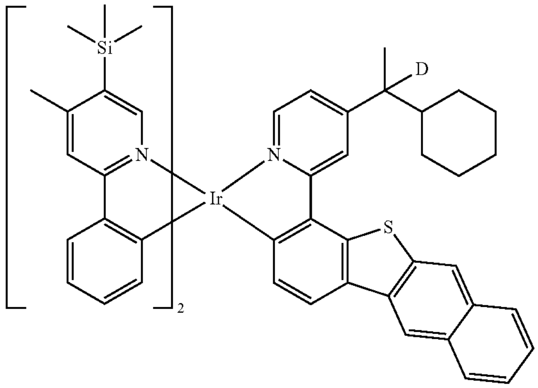
552
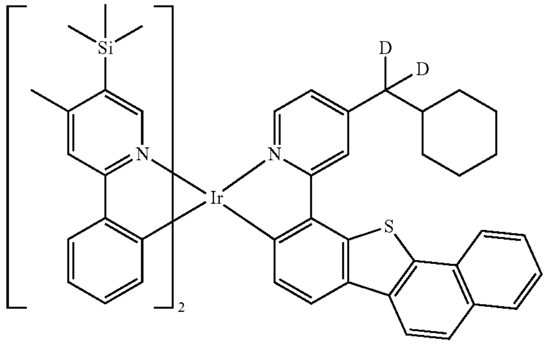

-continued
553
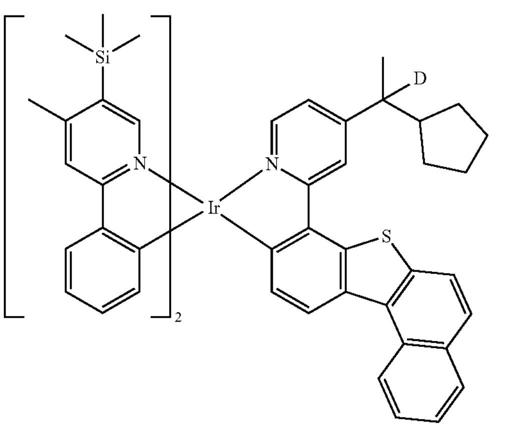
554
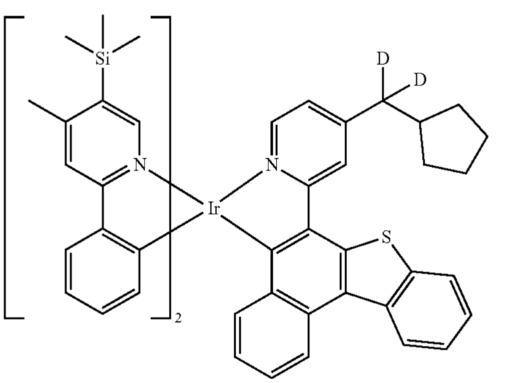
555
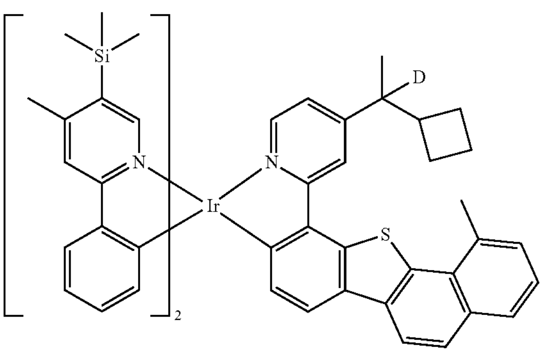
556
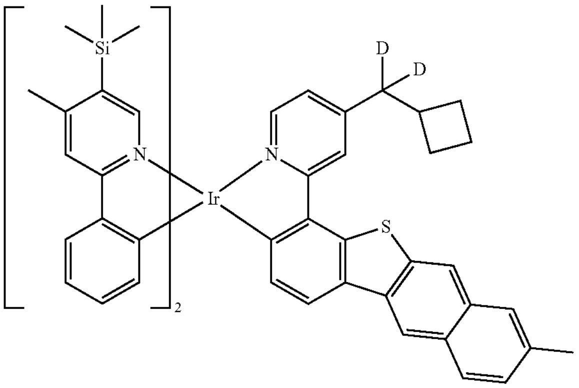
-continued
557
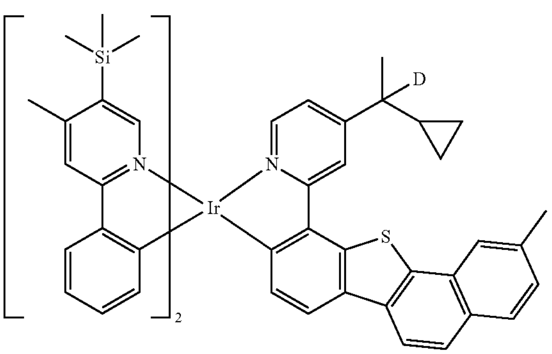
558
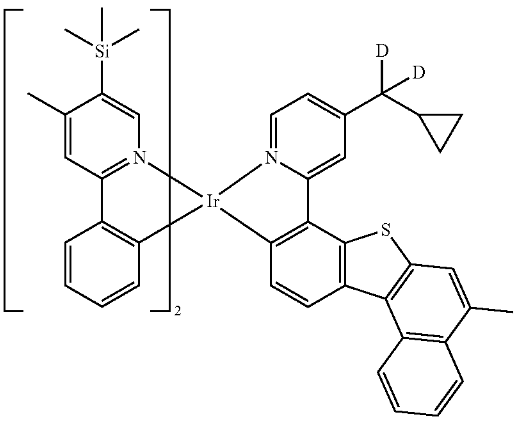
559
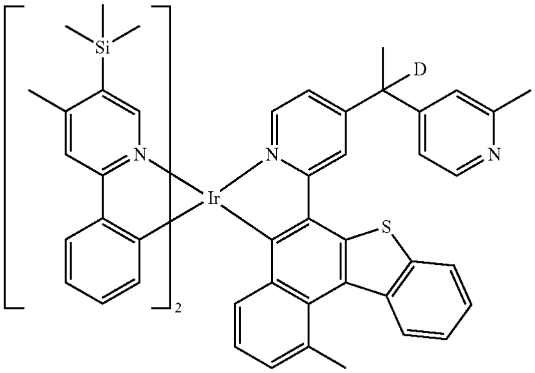
560
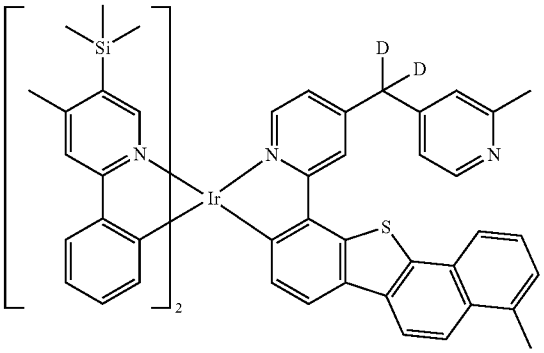

-continued
561
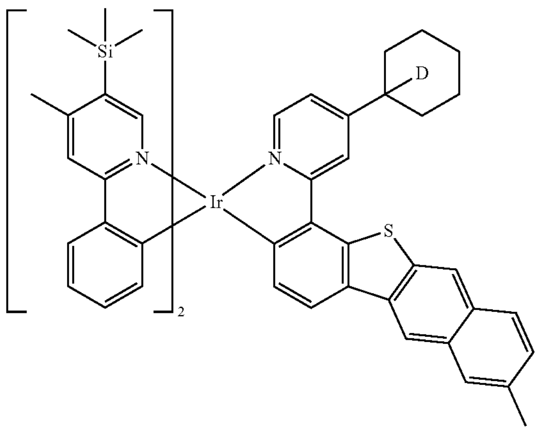
562
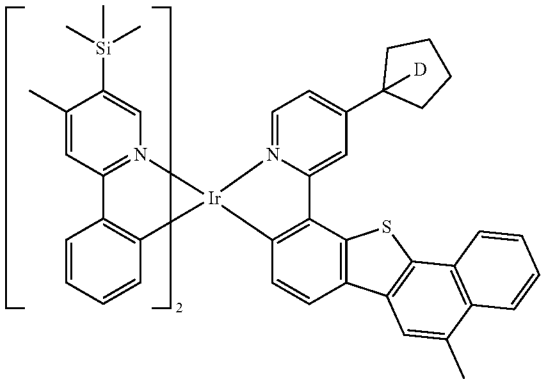
563
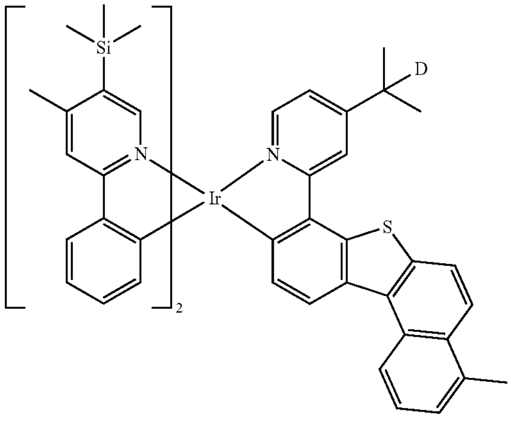
-continued
564
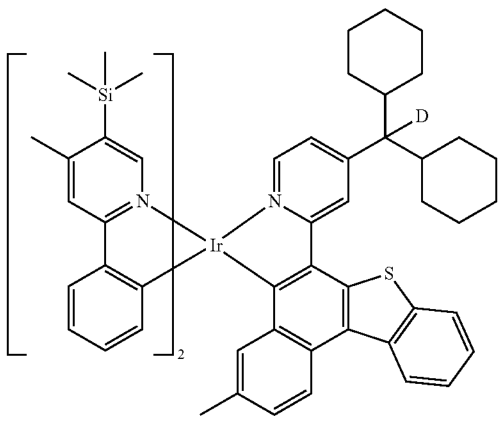
565
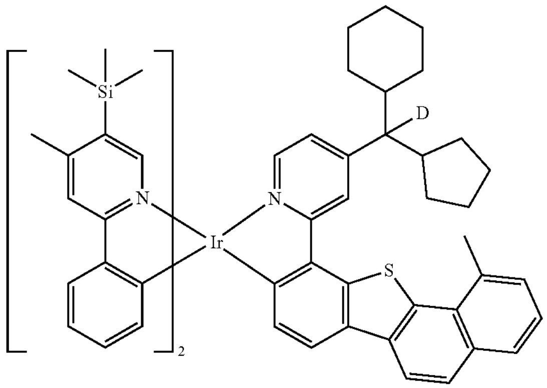
566
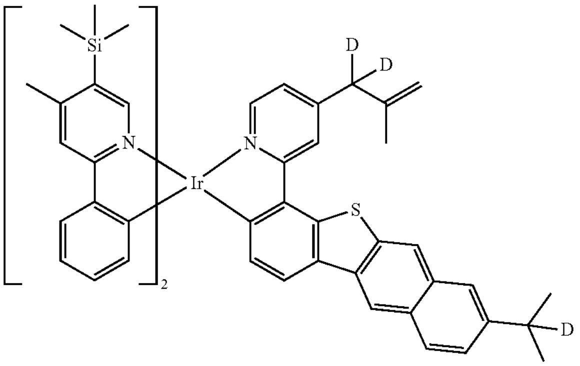
567
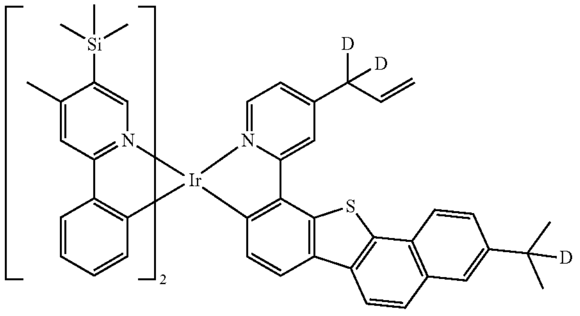

-continued
568
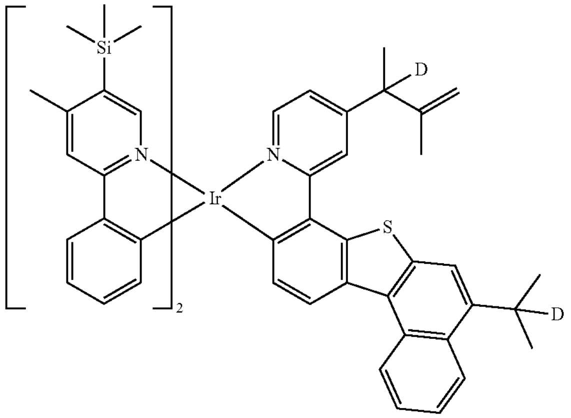
569
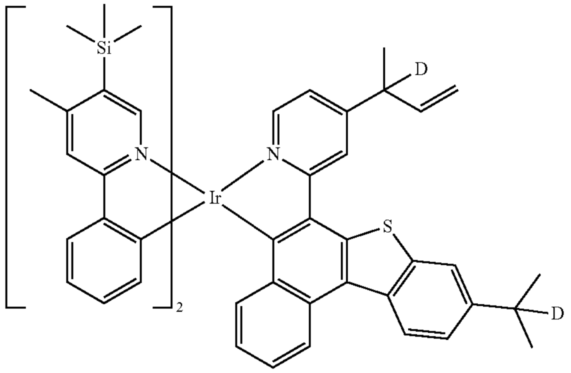
570
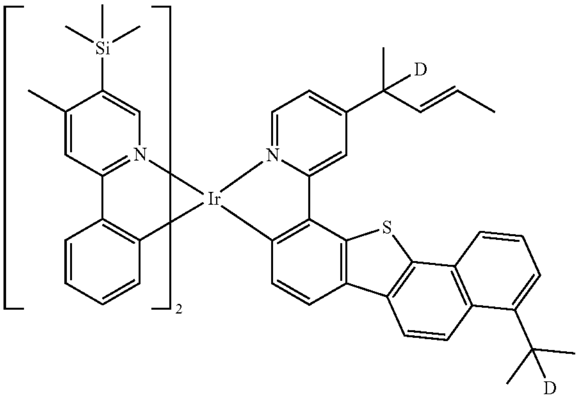
-continued
571
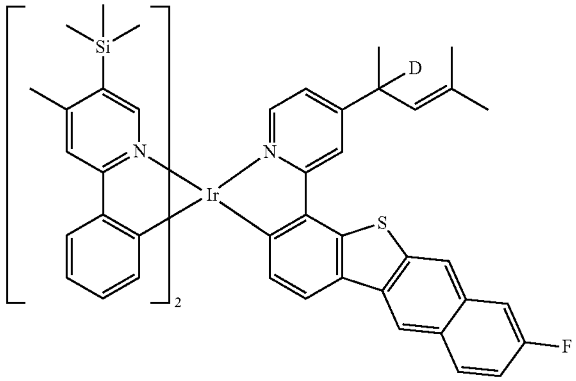
572
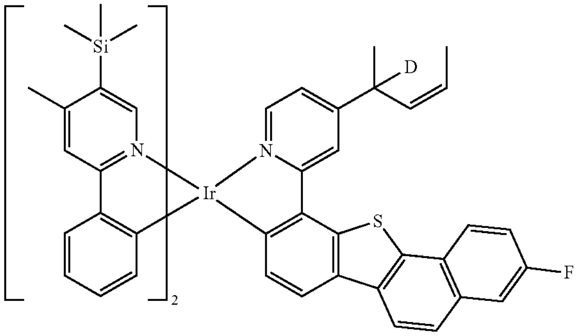
573
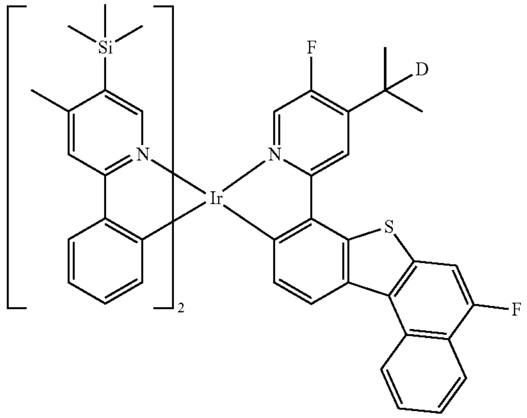
574
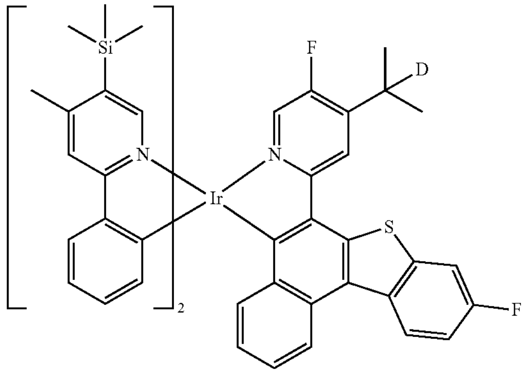

-continued
575
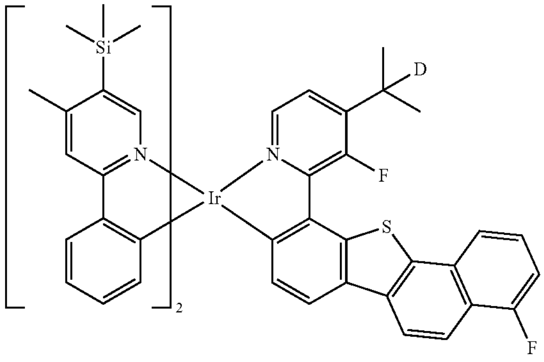
576
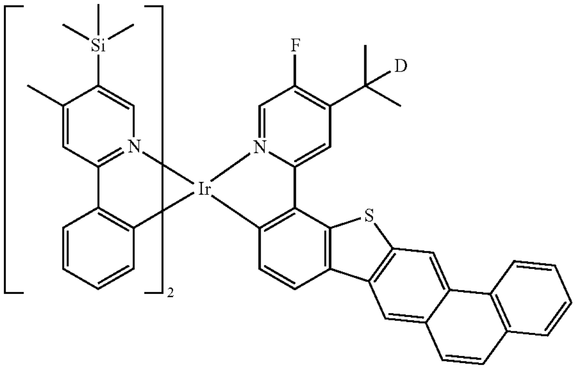
577
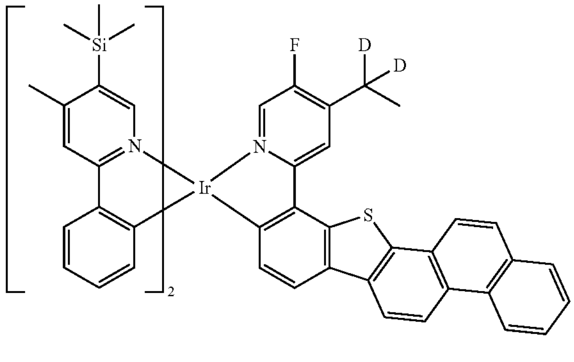
578
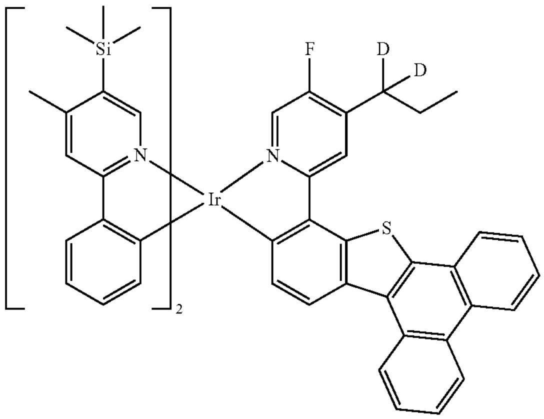
-continued
579
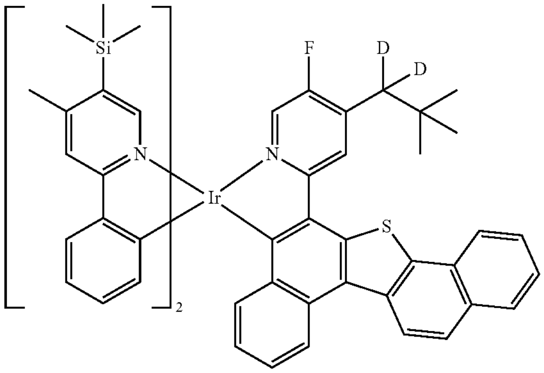
580
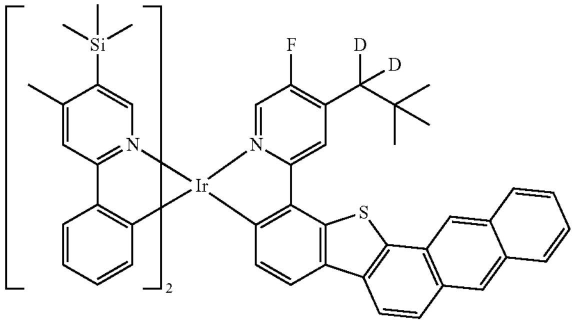
581
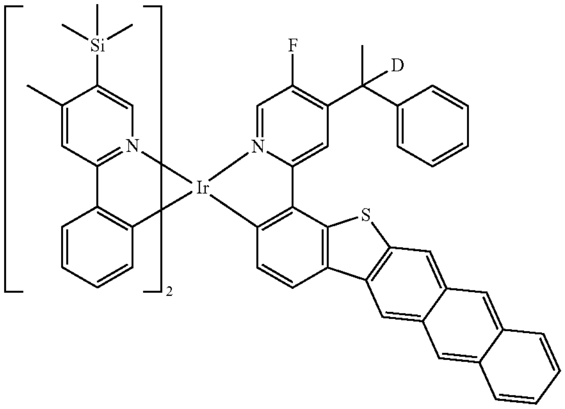
582
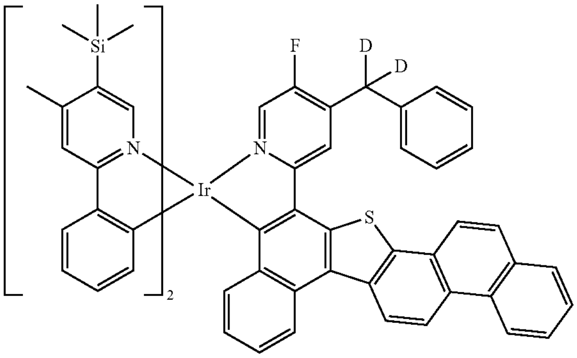

-continued
583
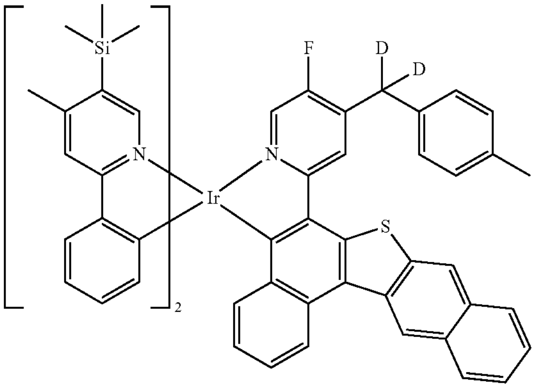
584
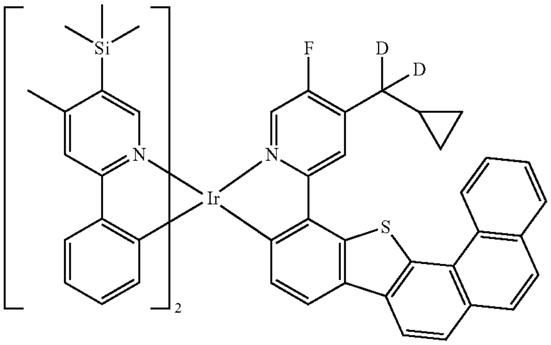
585
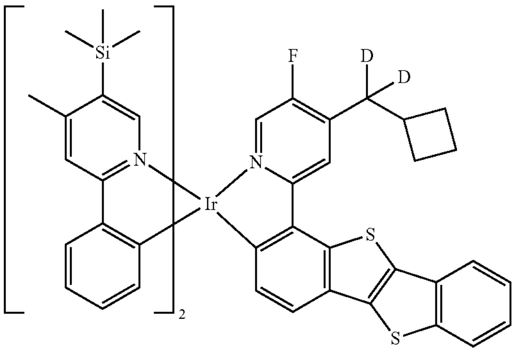
586
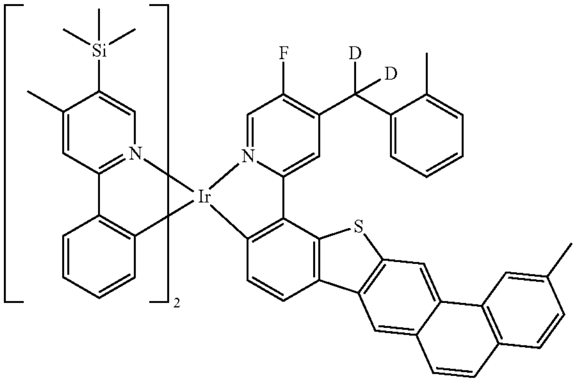
-continued
587
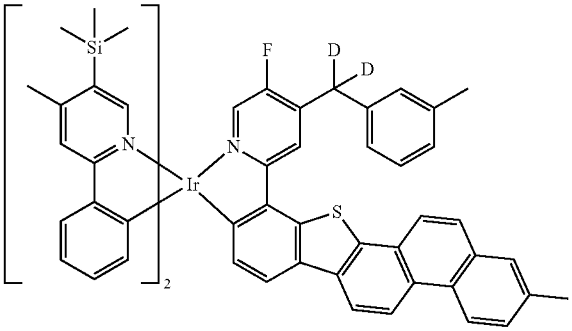
588
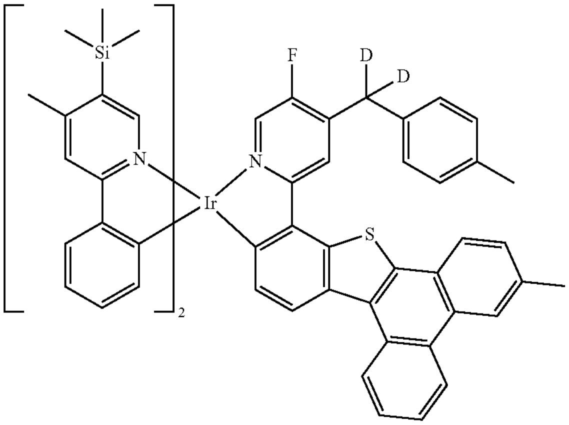
589
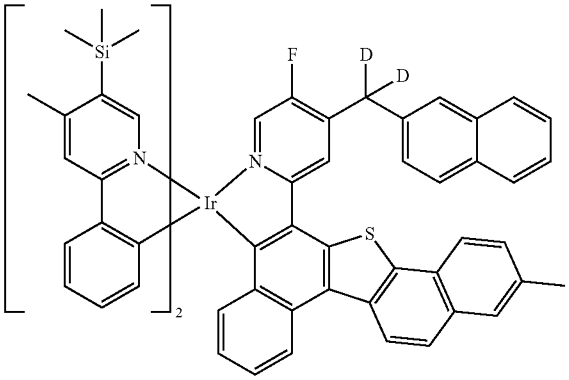
590
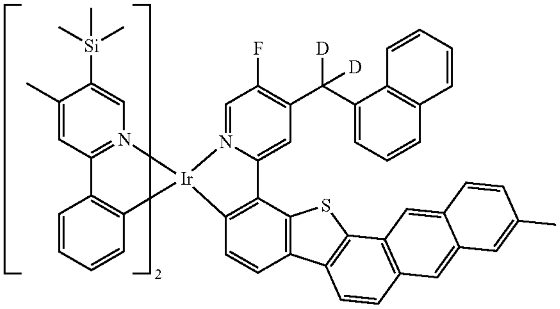

-continued
591
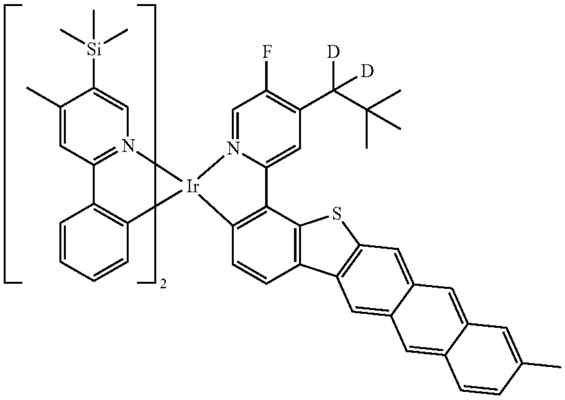
592
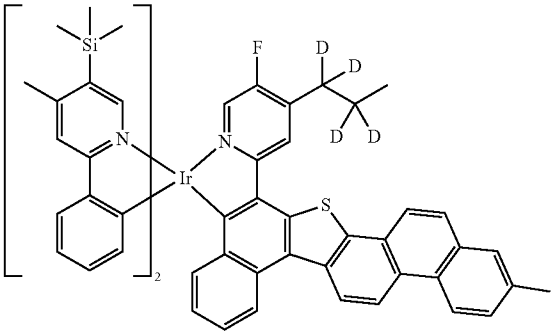
593
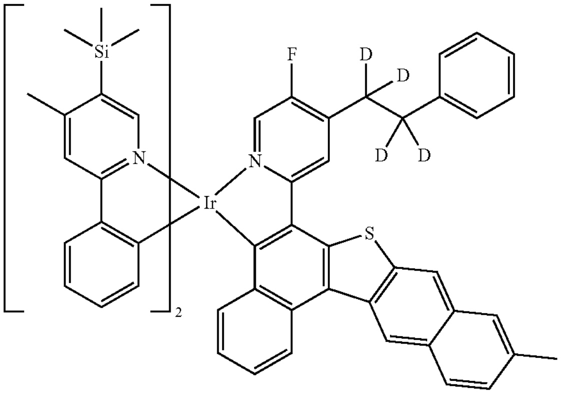
594
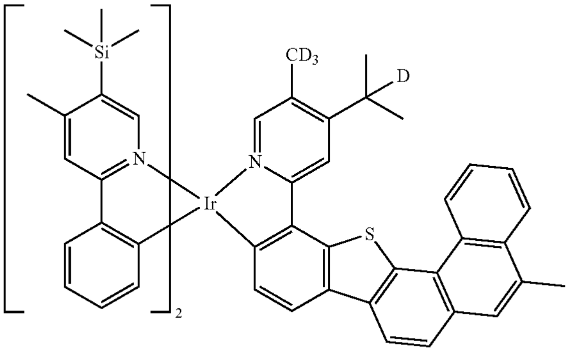
-continued
595
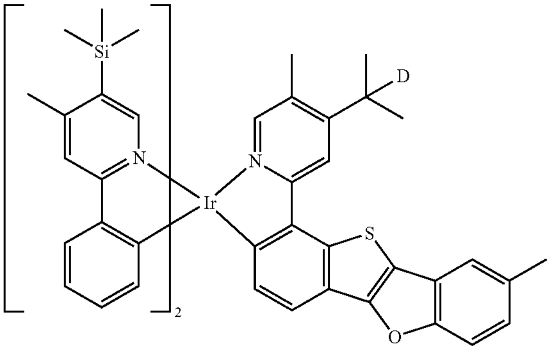
596
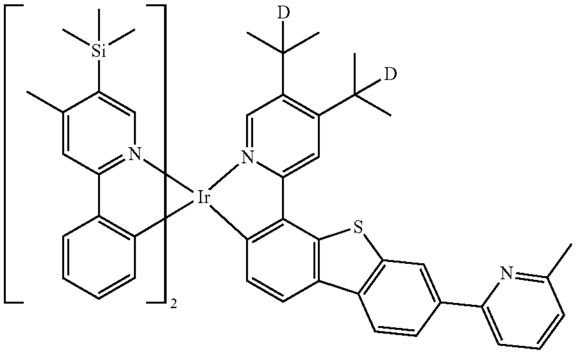
597
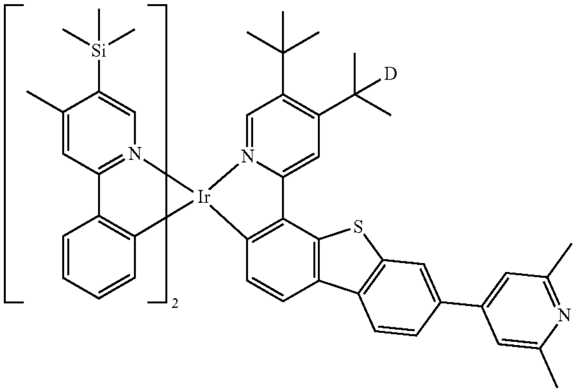
598
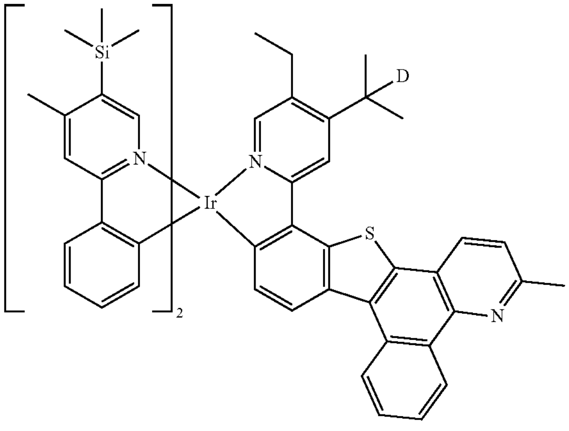

599
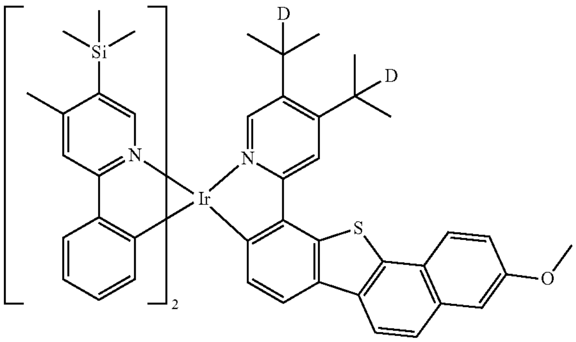
600
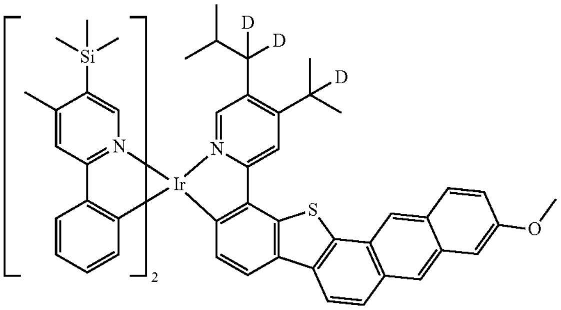
601
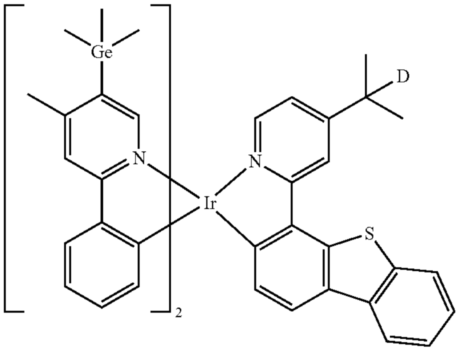
602
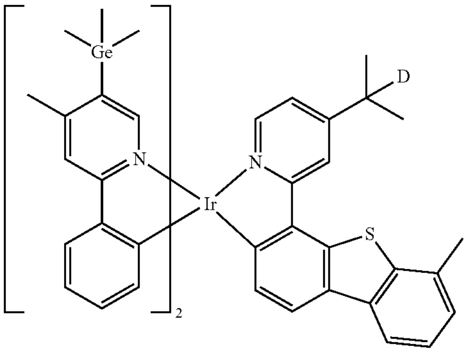
603
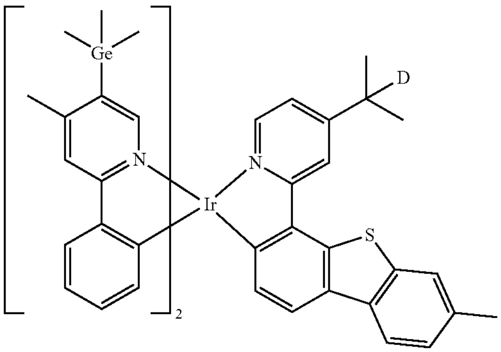
604
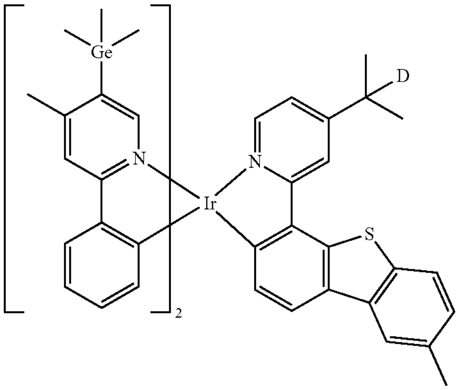
605
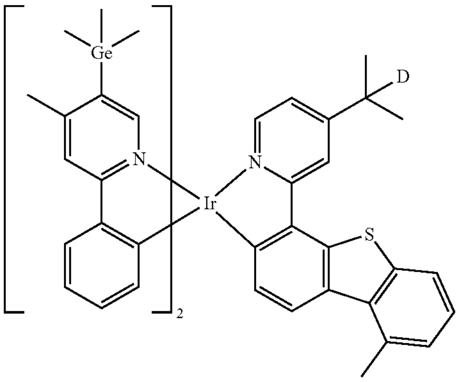
606
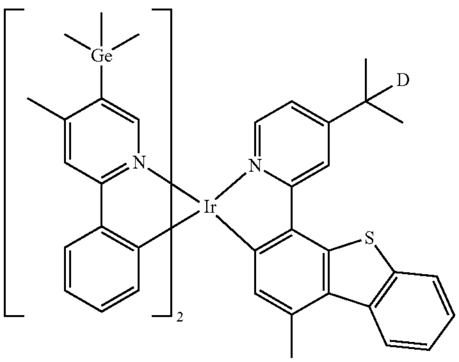

607
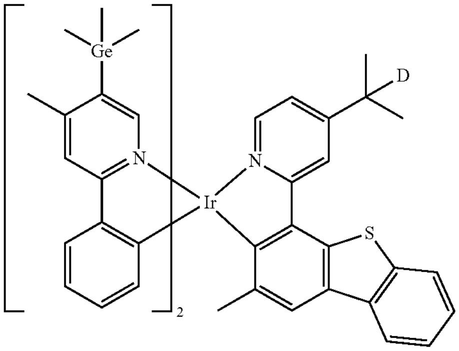
608
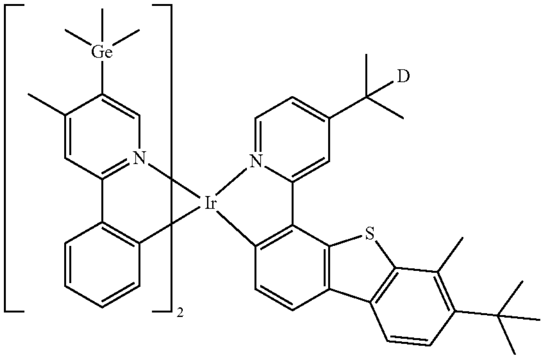
609
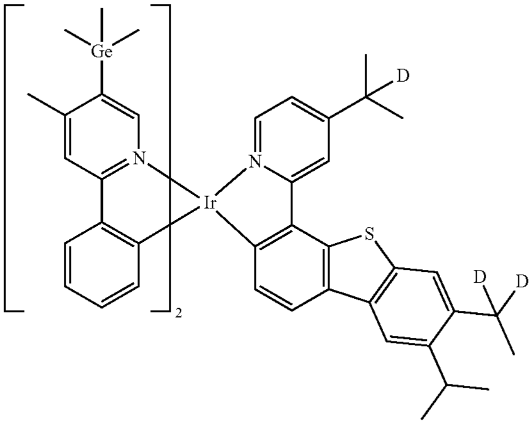
610
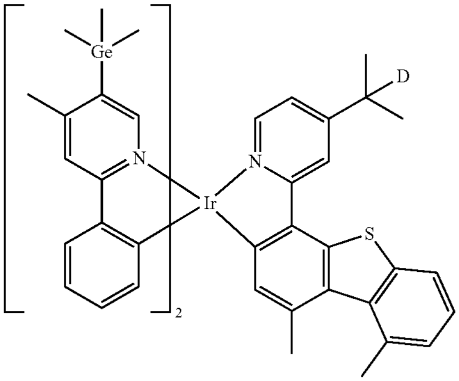
611
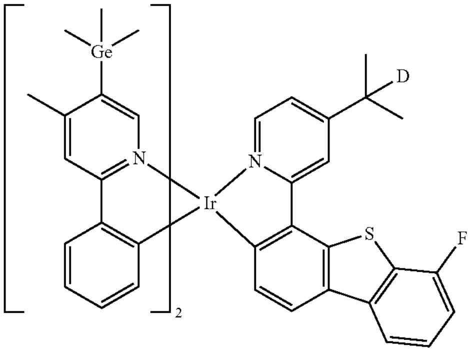
612
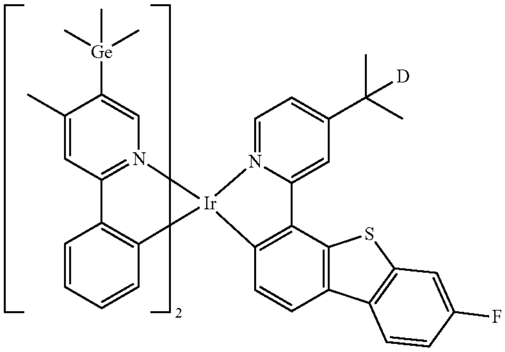
613
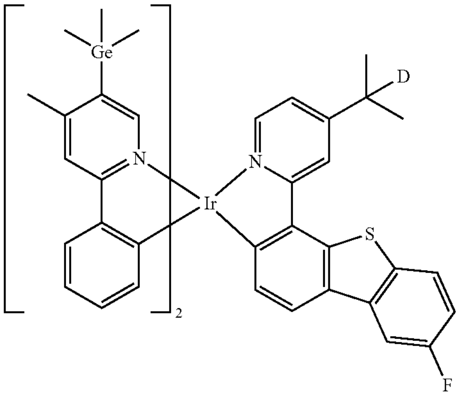
614
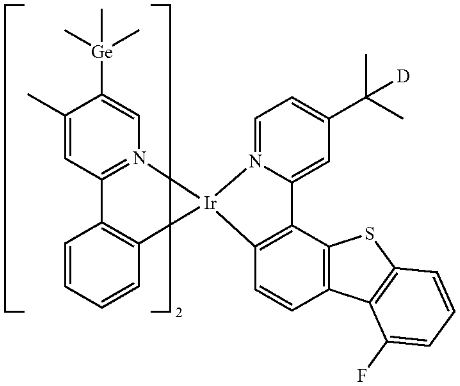

-continued
615
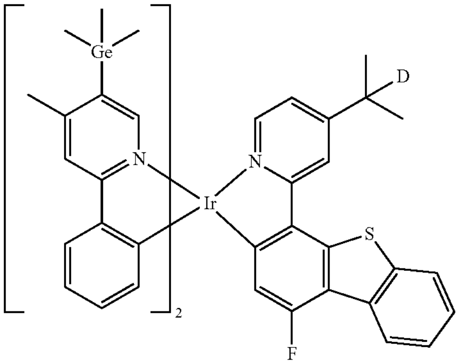
616
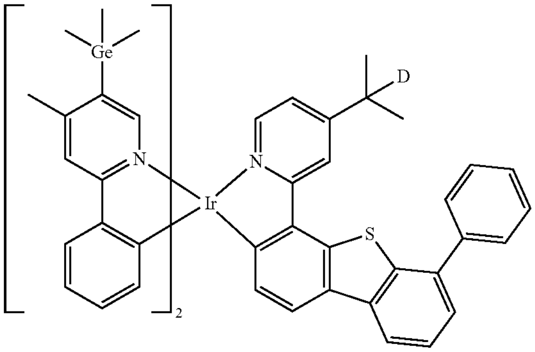
617
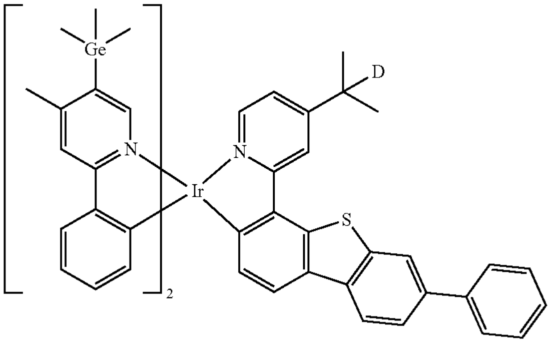
618
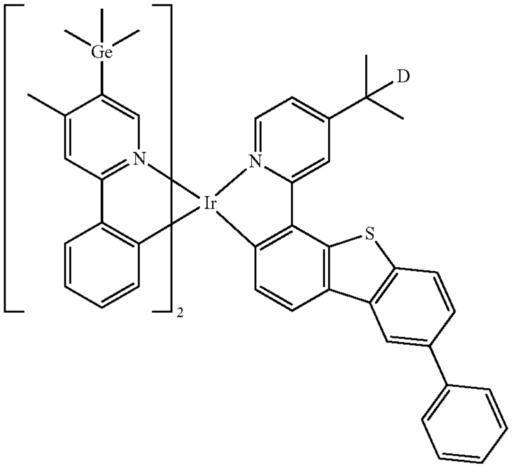
-continued
619
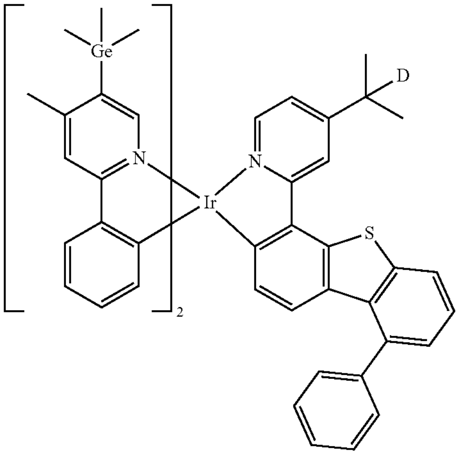
620
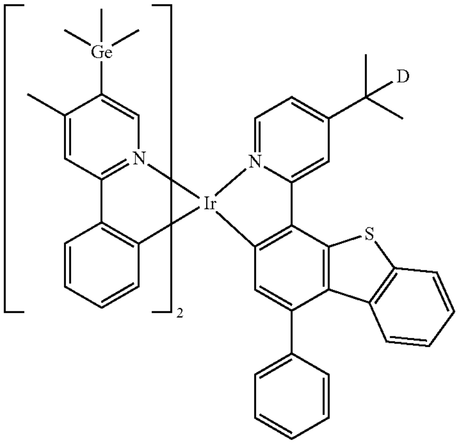
621
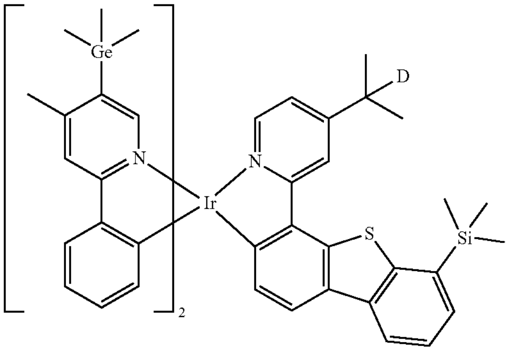

-continued
622
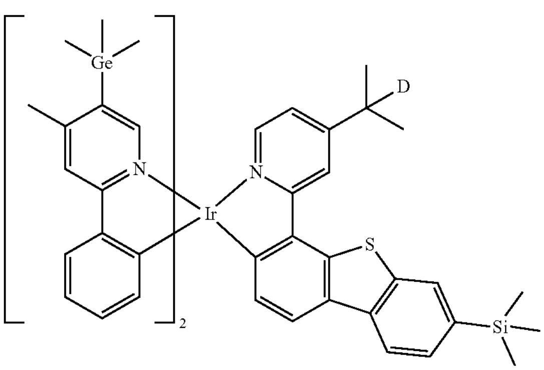
623
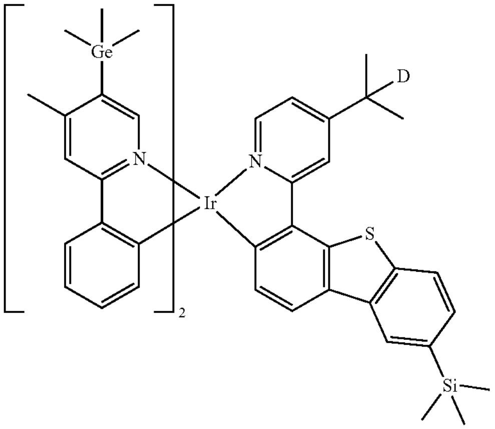
624
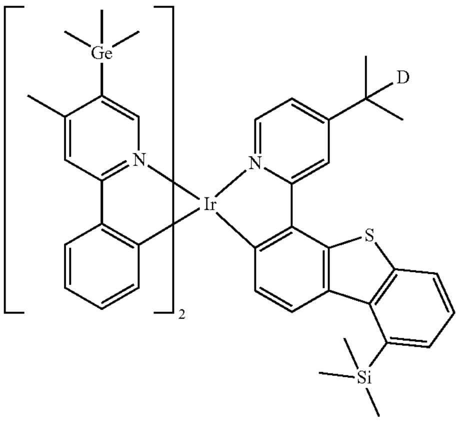
-continued
625
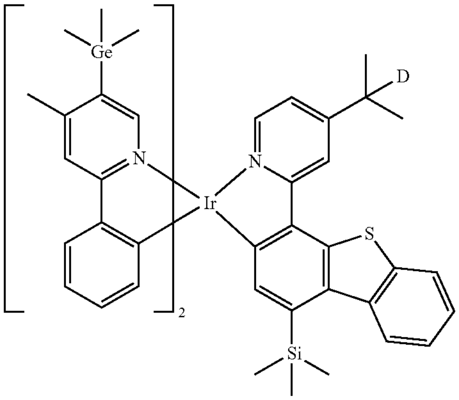
626
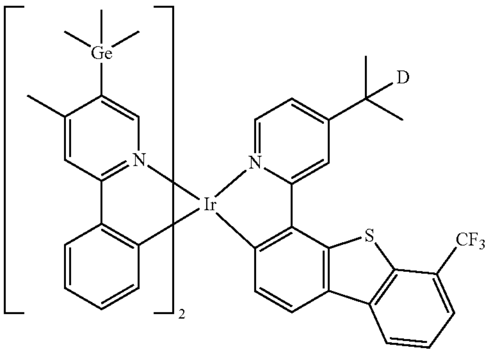
627
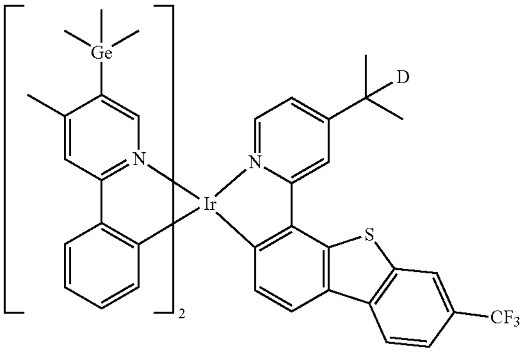
628
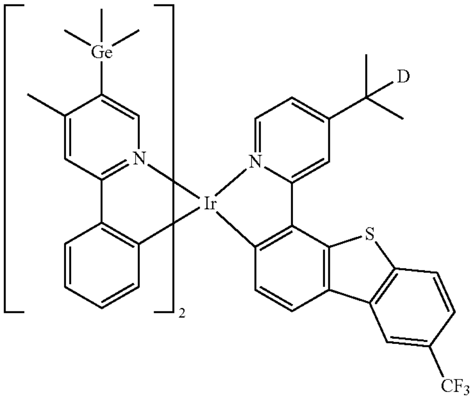

-continued
629
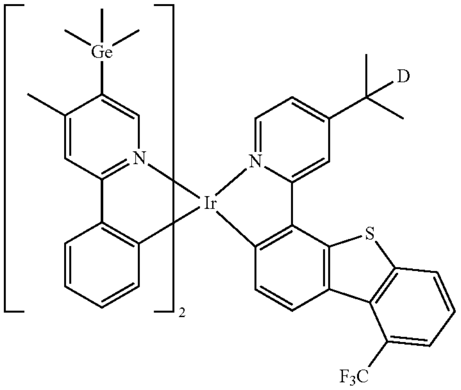
630
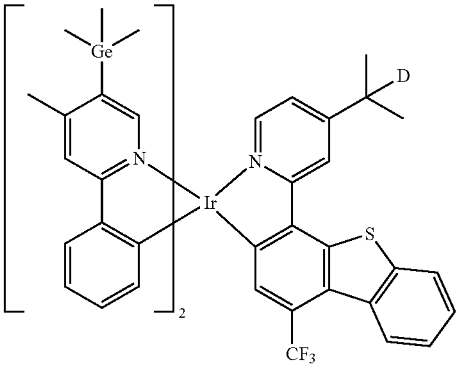
631
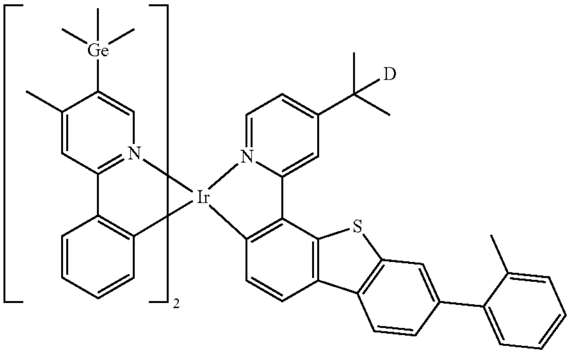
632
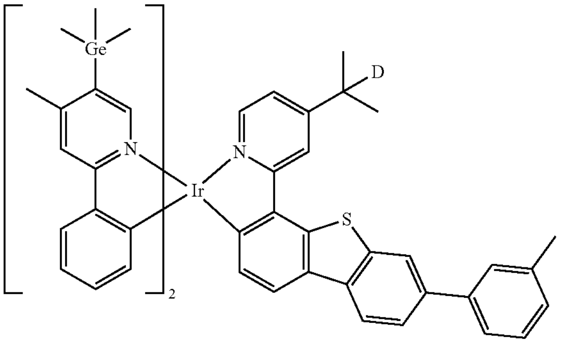
-continued
633
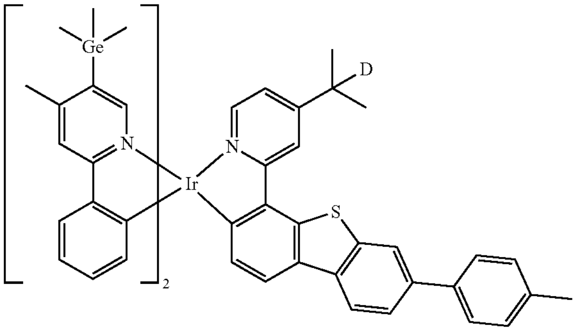
634
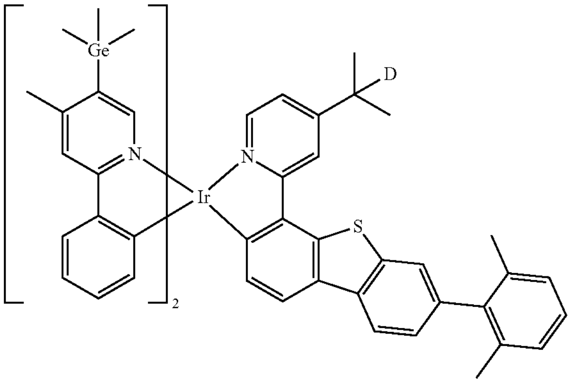
635
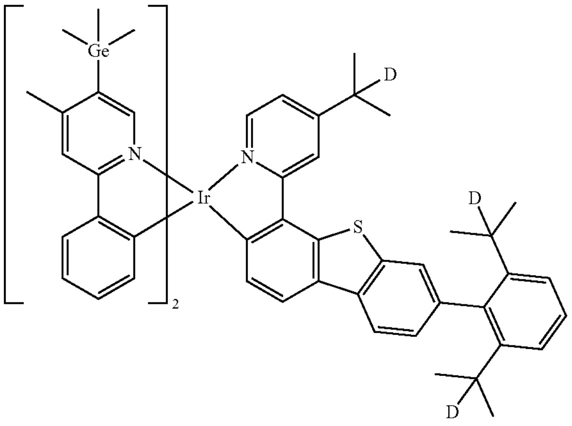
636
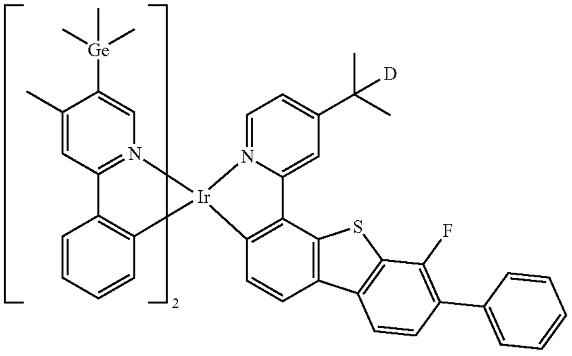

-continued
637
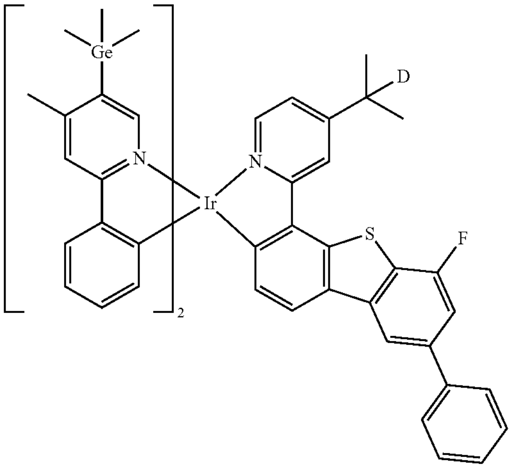
638
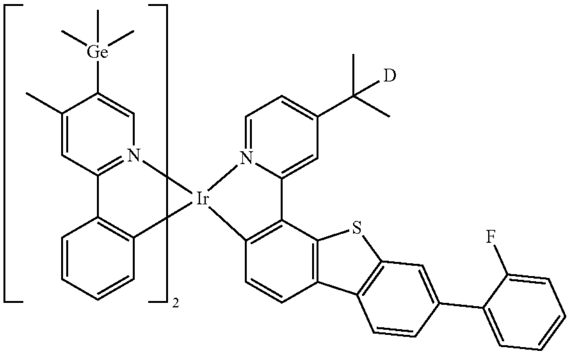
639
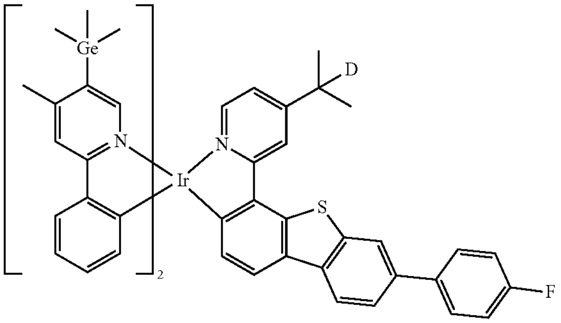
640
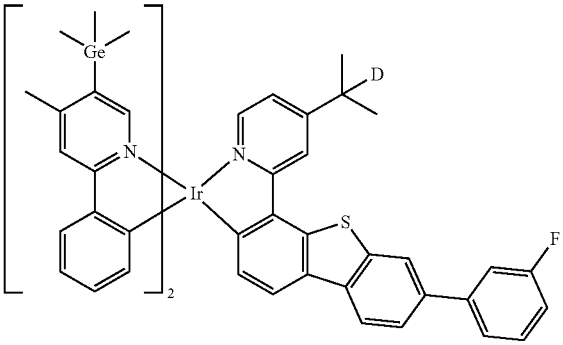
-continued
641
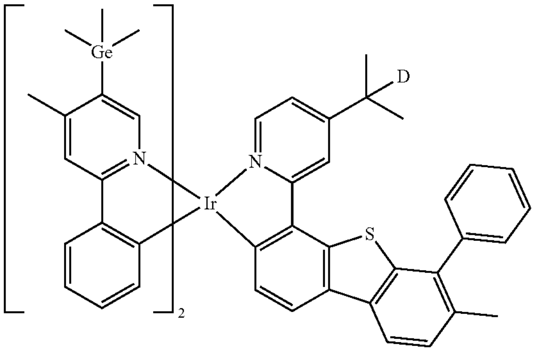
642
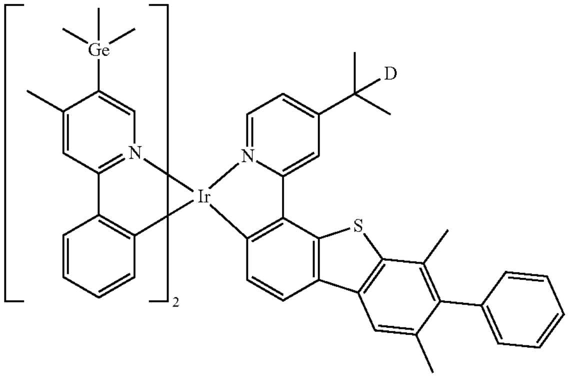
643
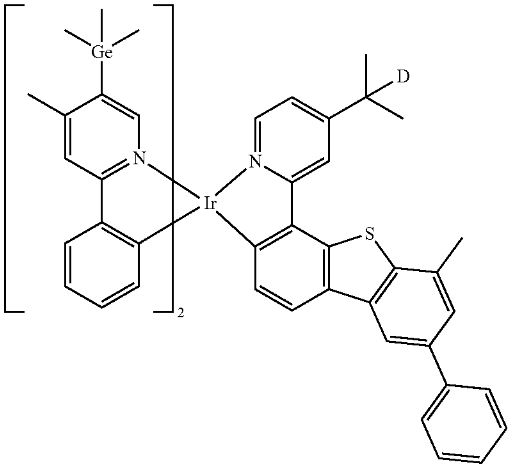

-continued
644
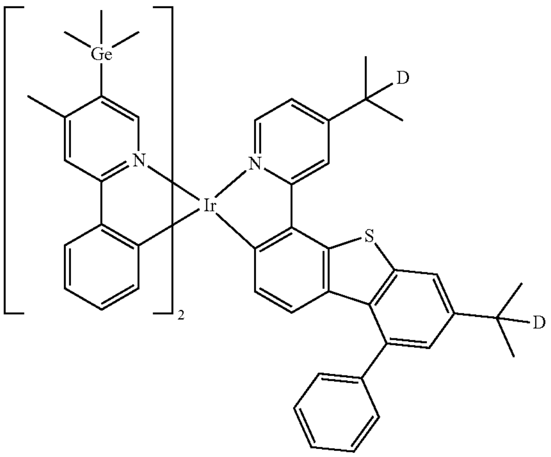
645
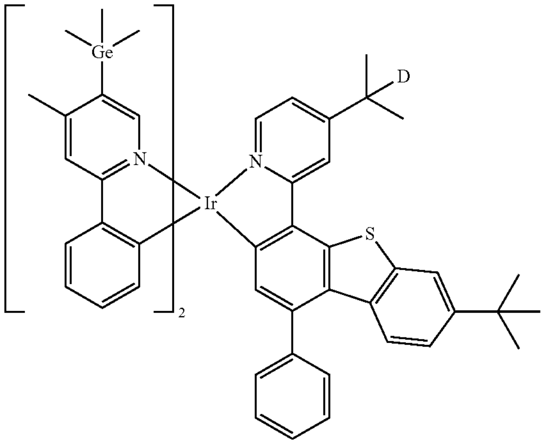
646
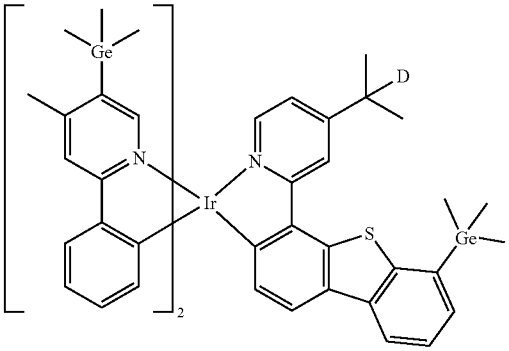
-continued
647
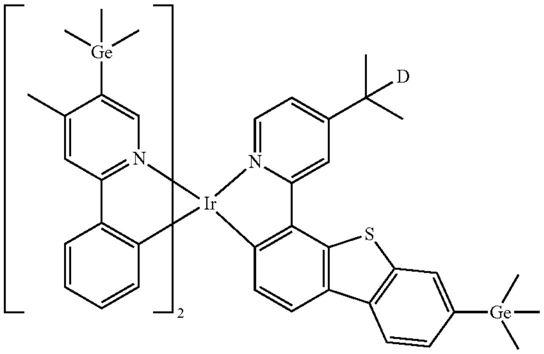
648
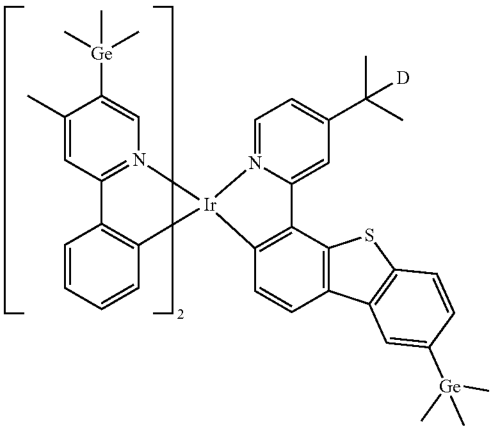
649
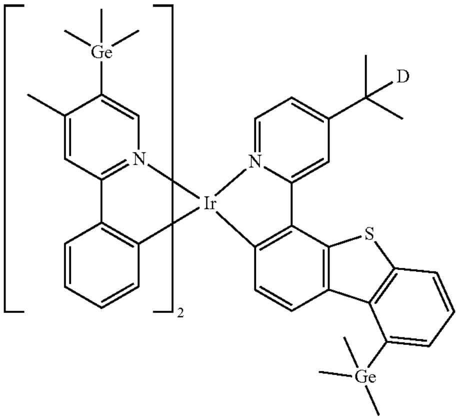
650
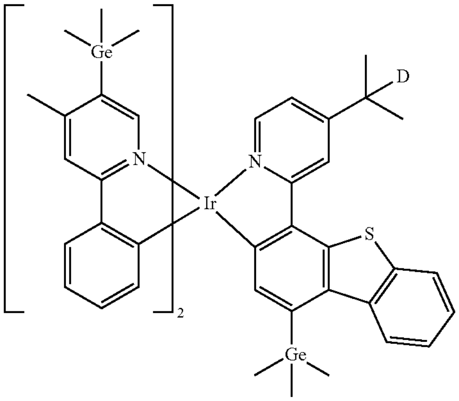

-continued
651
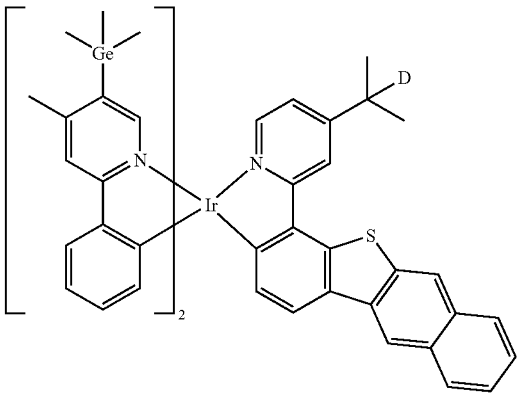
652
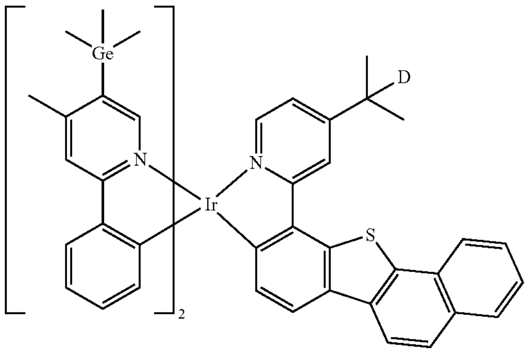
653
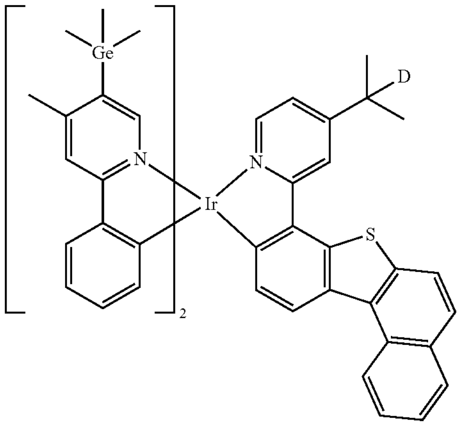
654
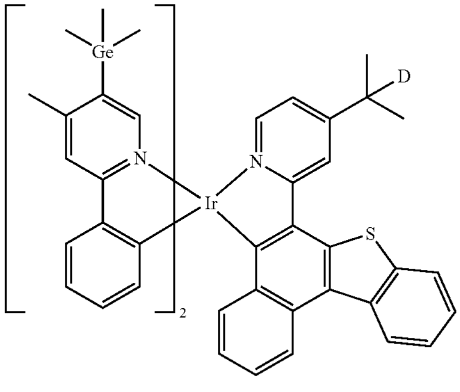
-continued
655
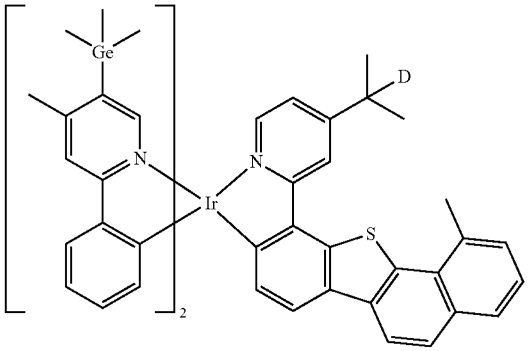
656
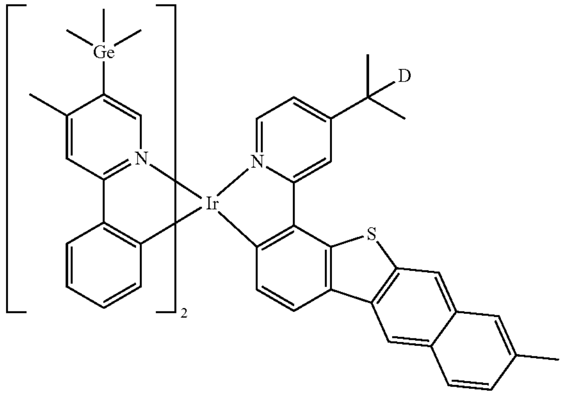
657
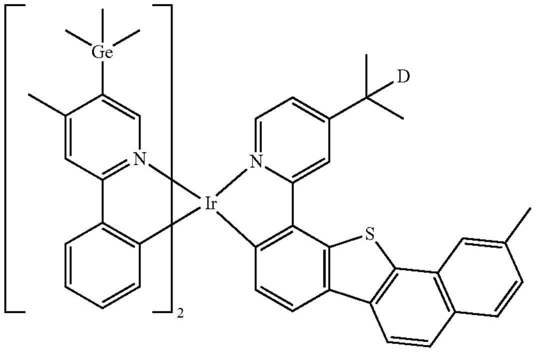
658
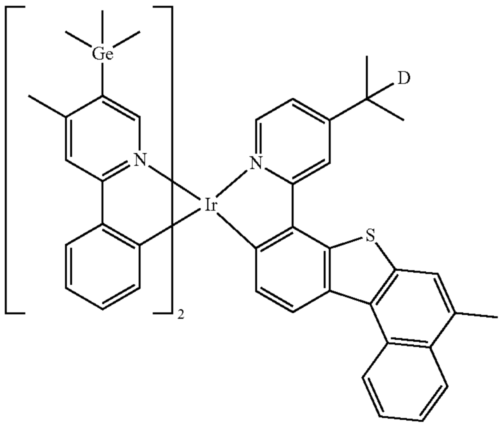

-continued
659
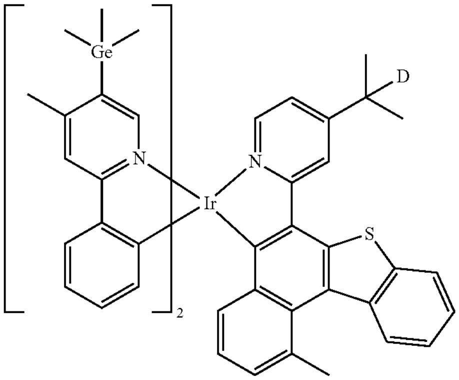
660
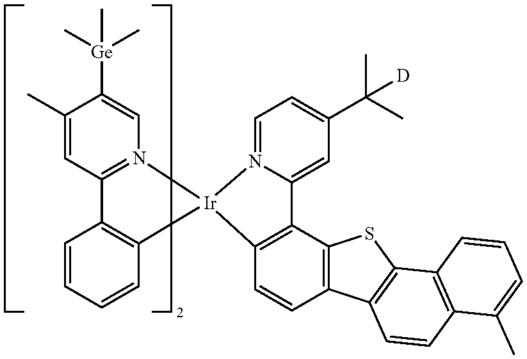
661
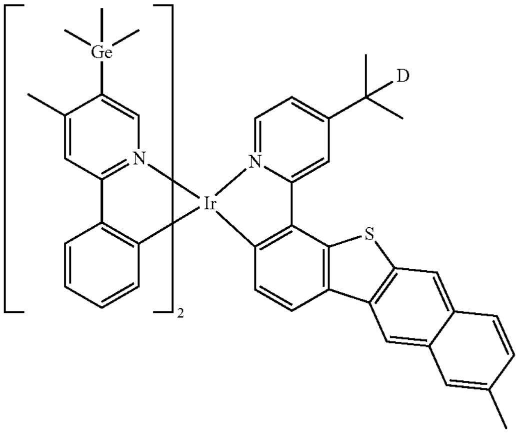
662
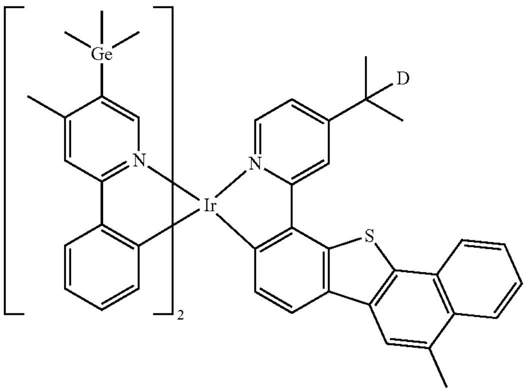
-continued
663
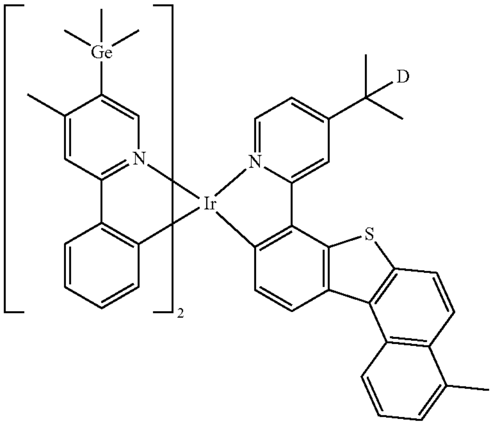
664
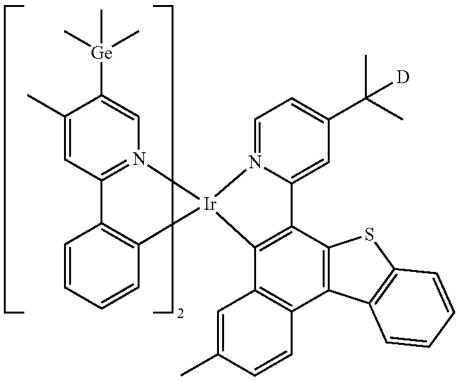
665
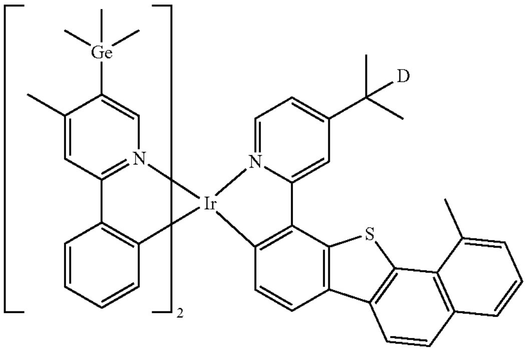
666
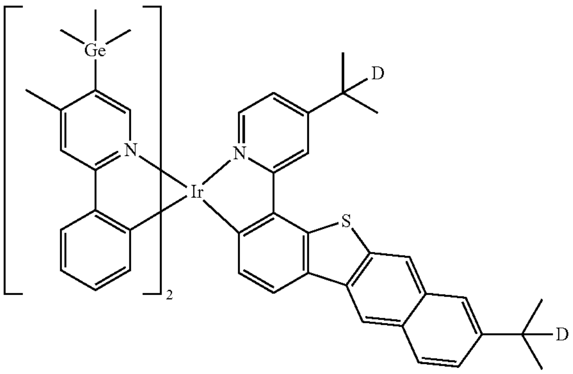

-continued
667
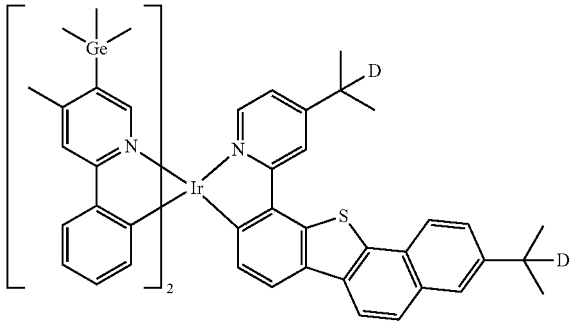
668
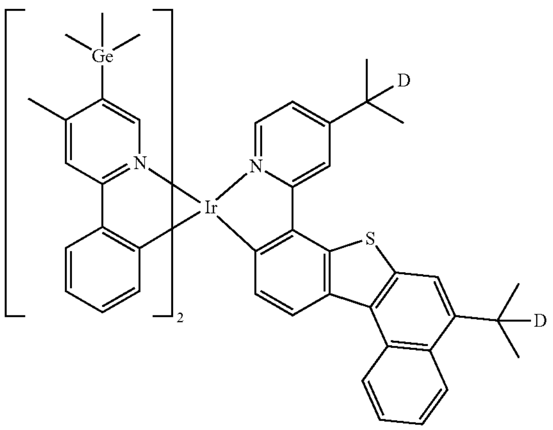
669
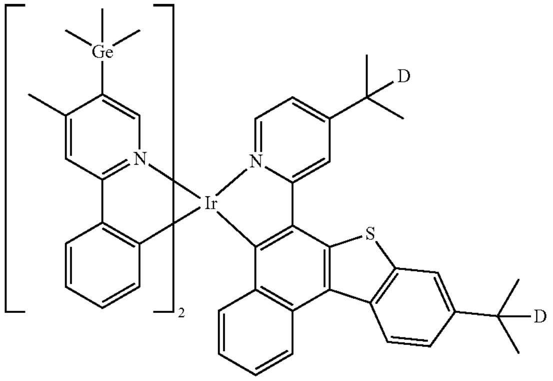
670
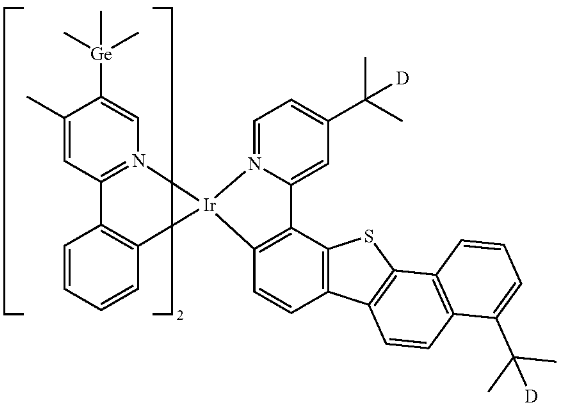
-continued
671
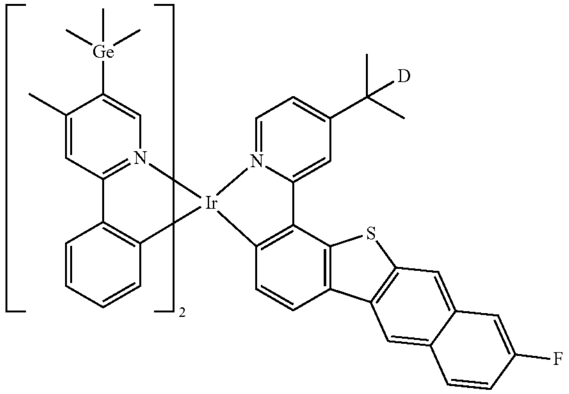
672
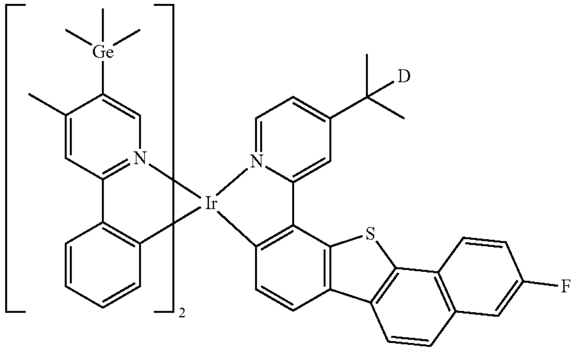
673
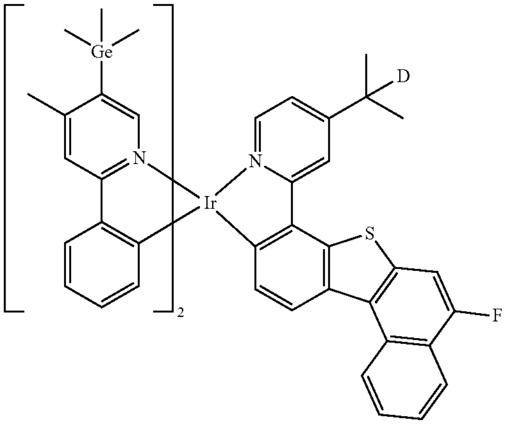
674
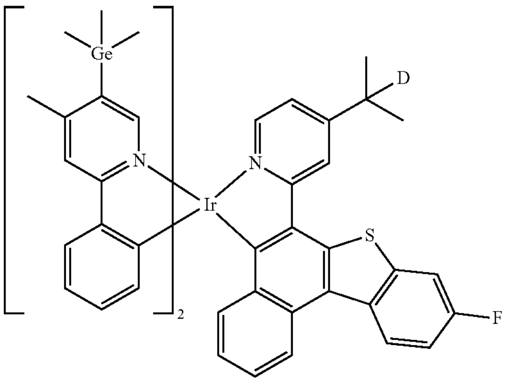

-continued
675
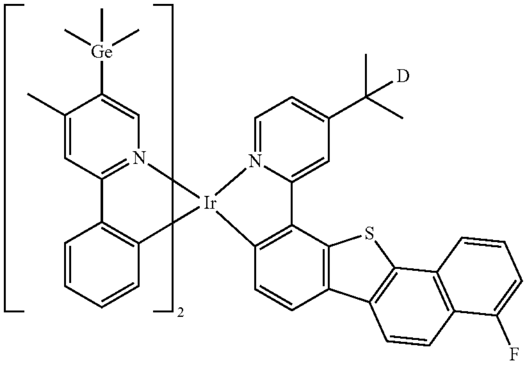
676
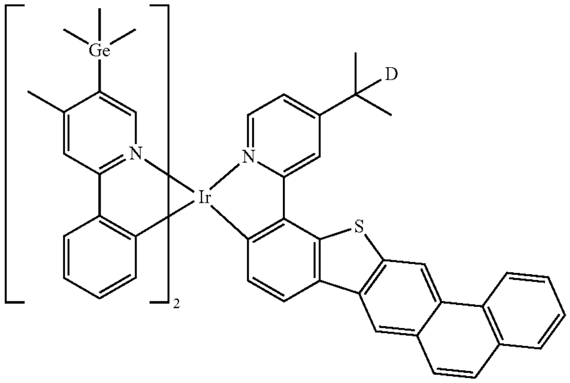
677
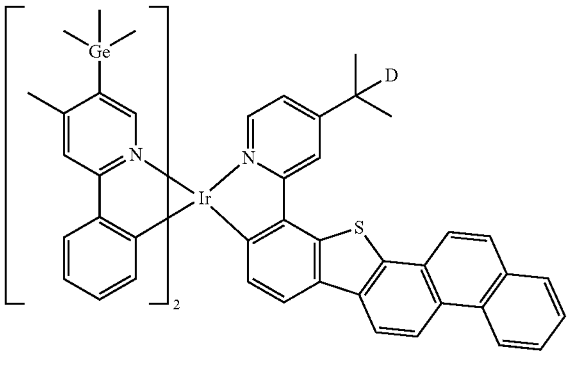
678
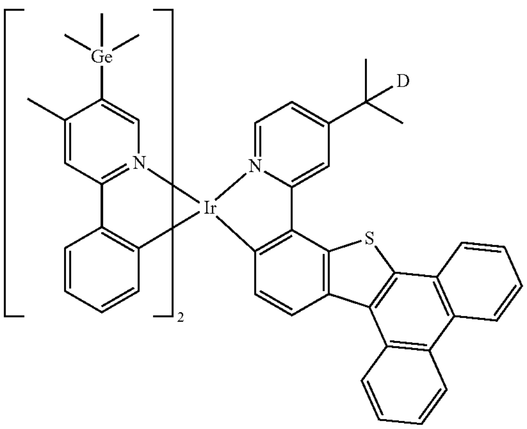
-continued
679
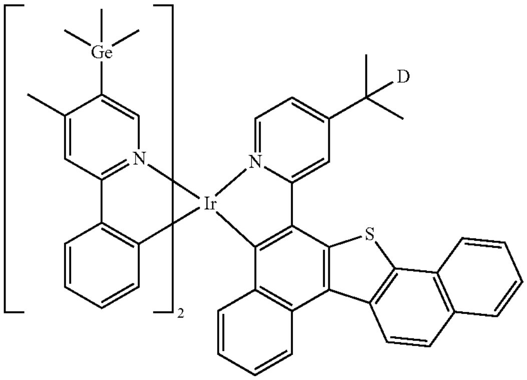
680
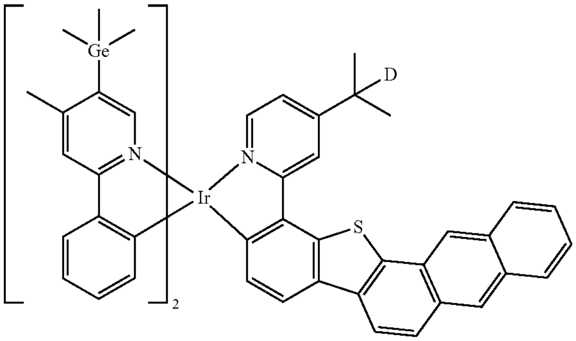
681
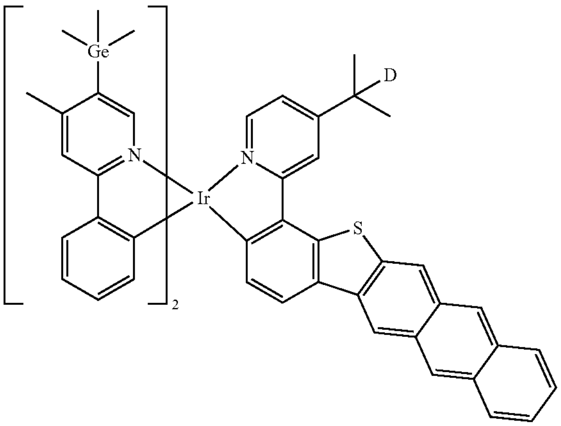
682
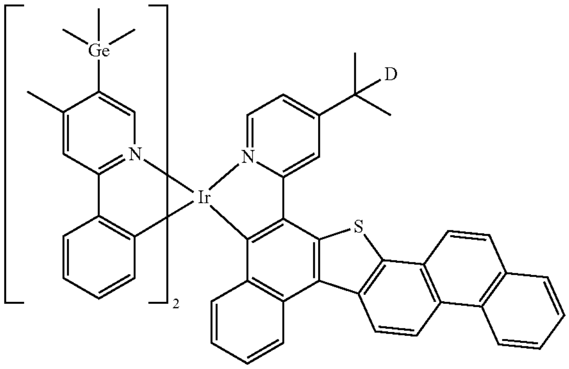

-continued
683
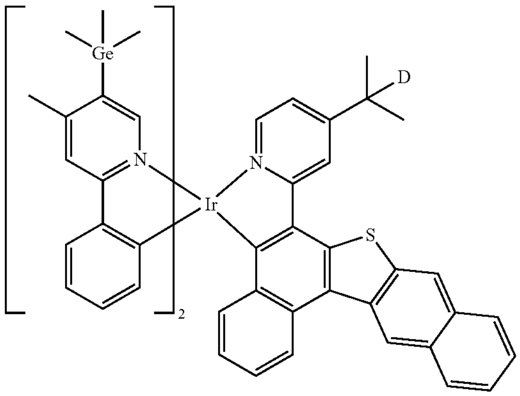
684
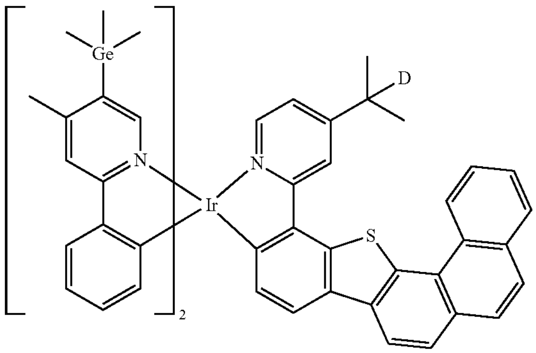
685
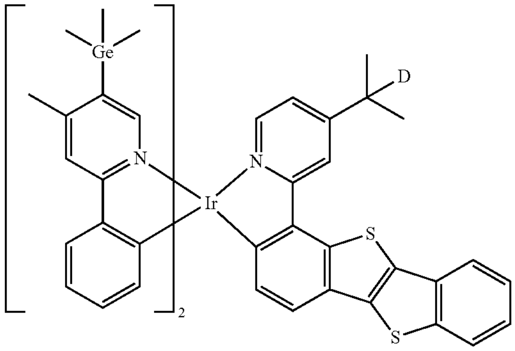
686
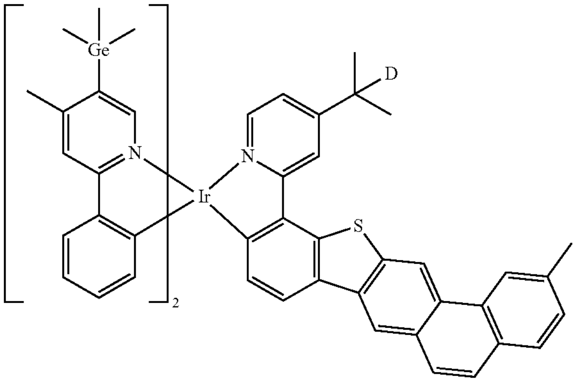
-continued
687
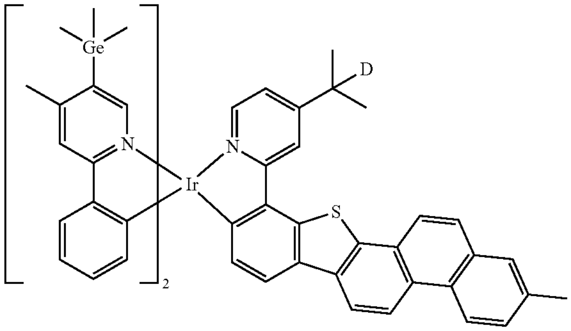
688
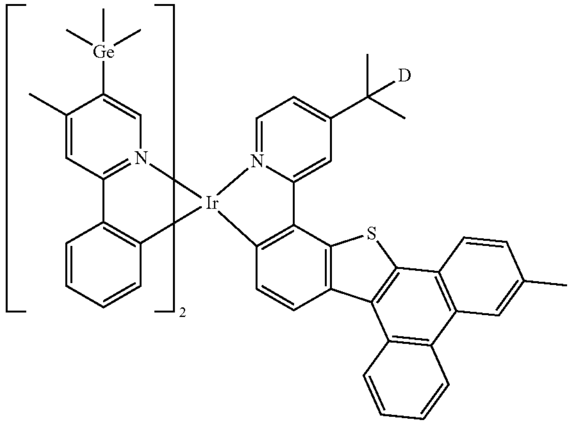
689
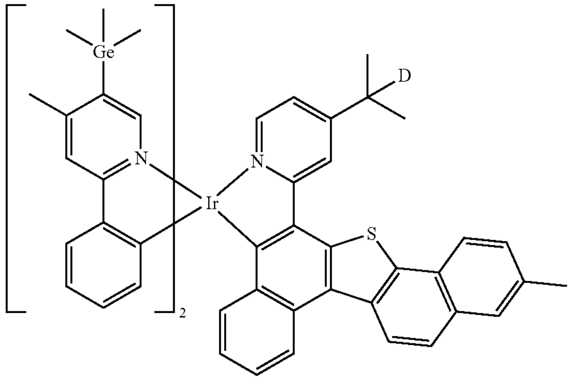
690
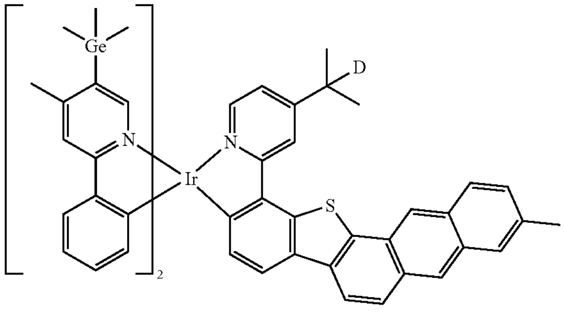

-continued
691
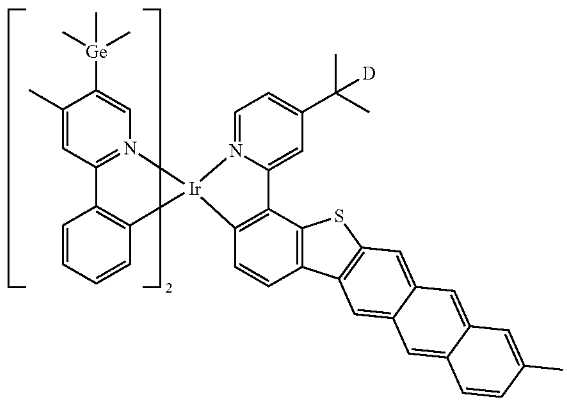
692
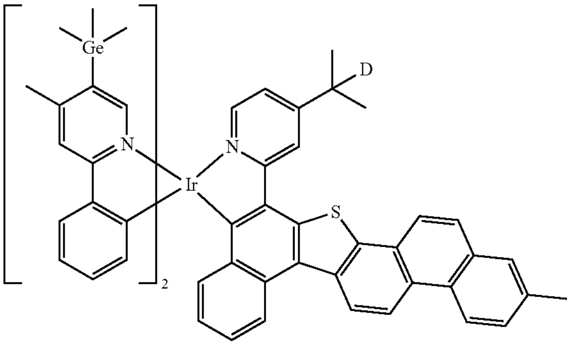
693
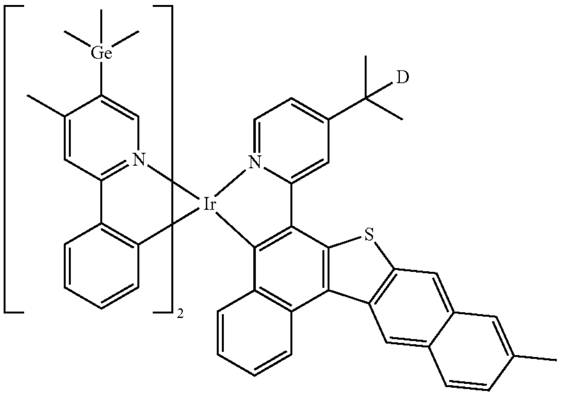
694
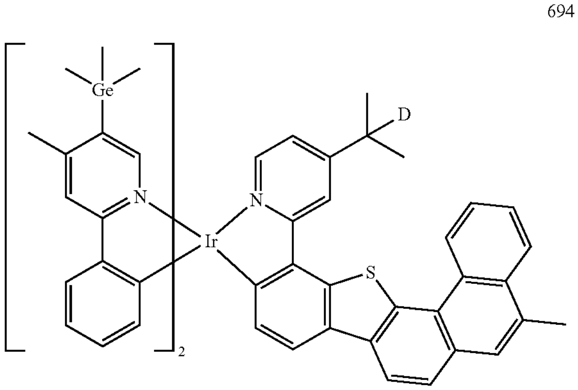
-continued
695
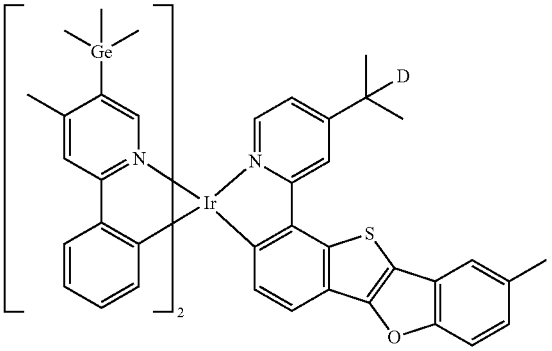
696
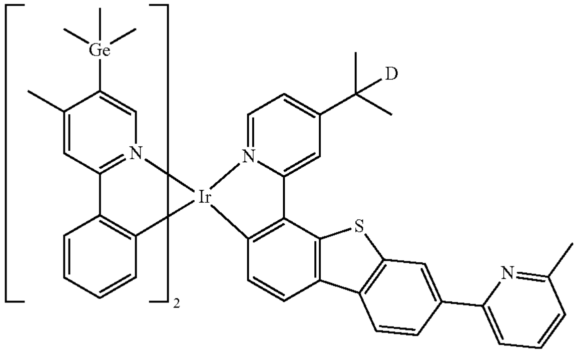
697
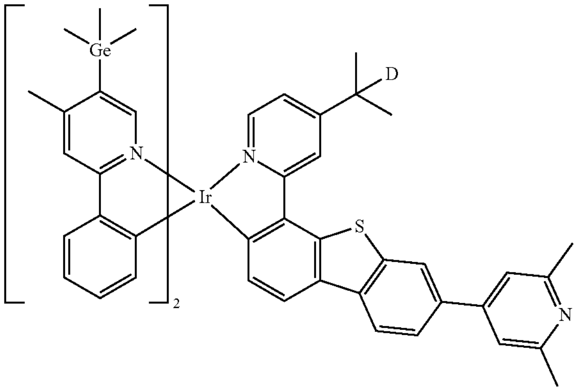
698
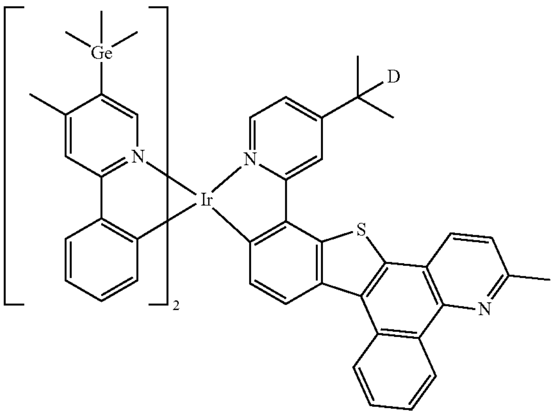

-continued
699
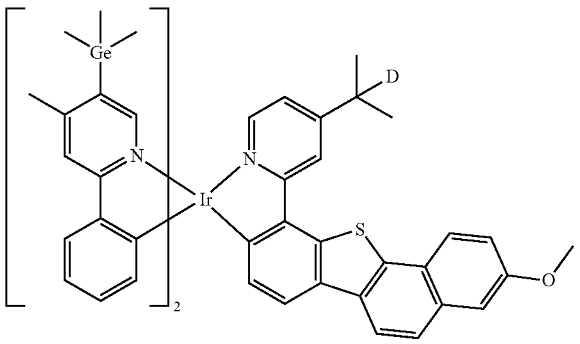
700
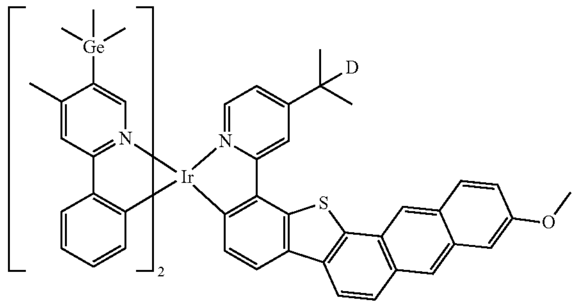
701
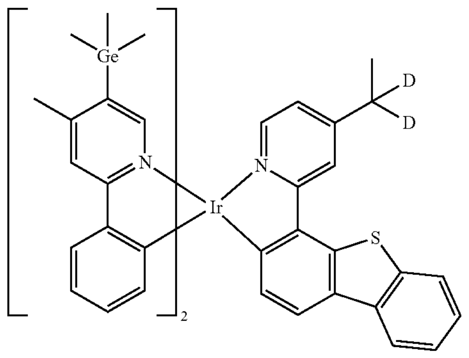
702
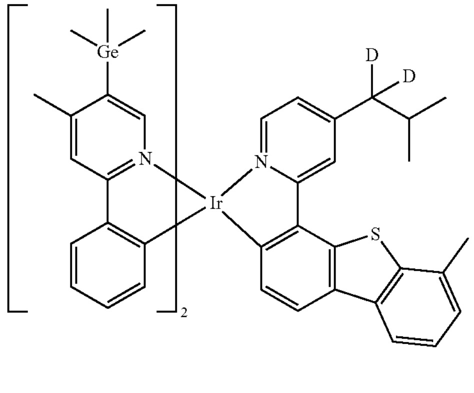
-continued
703
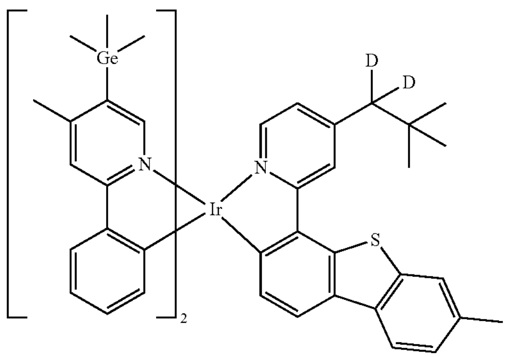
704
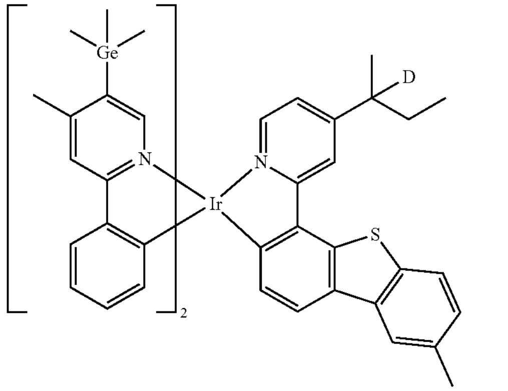
705
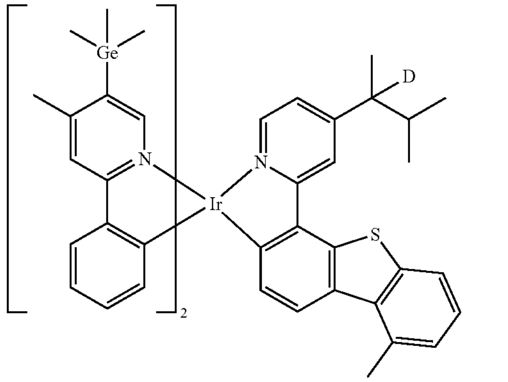
706
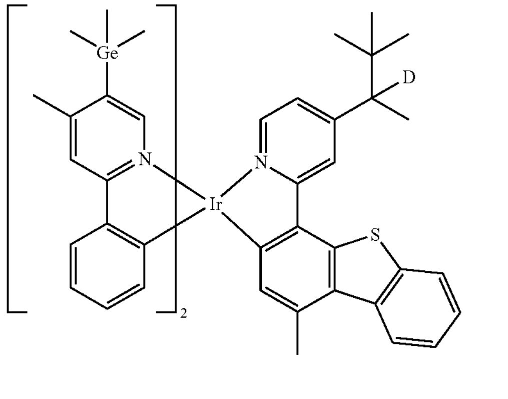

-continued
707
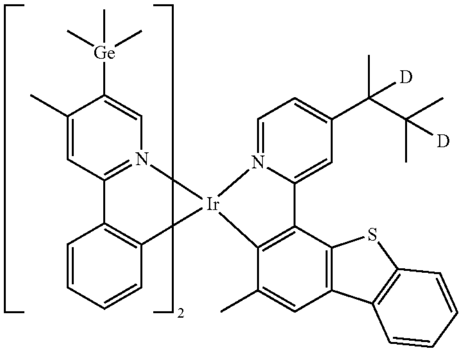
708
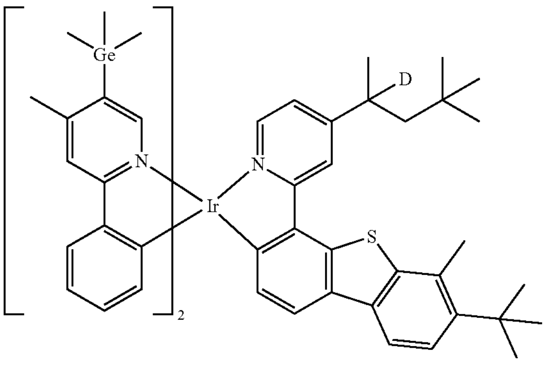
709
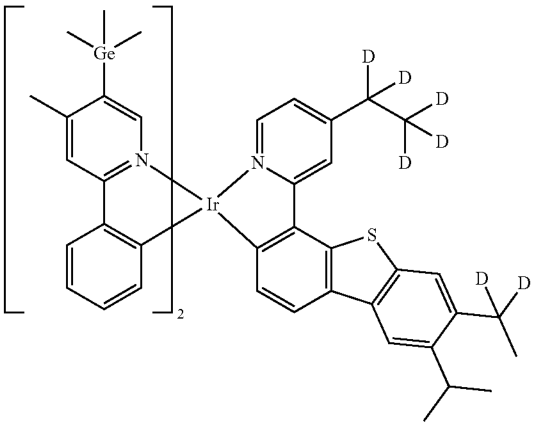
710
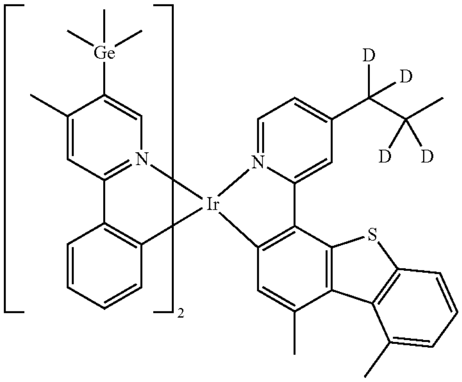
-continued
711
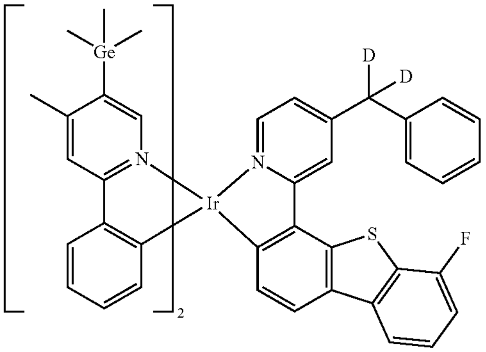
712
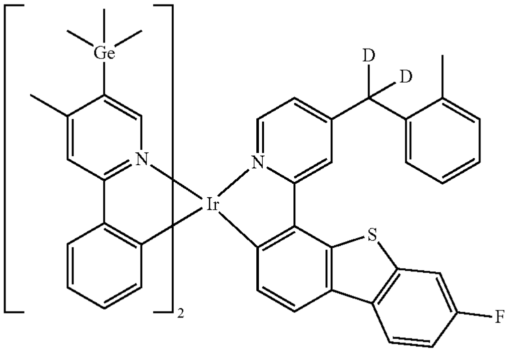
713
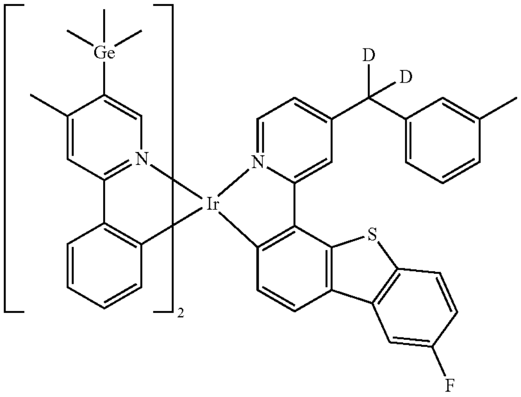
714
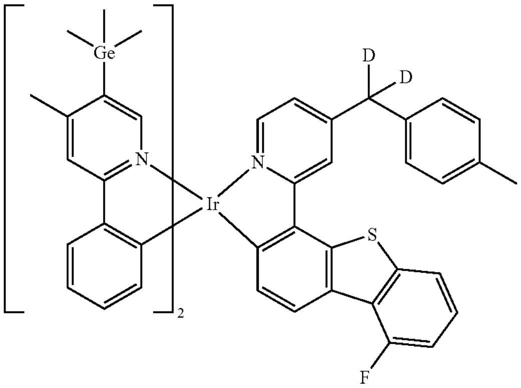

-continued
715
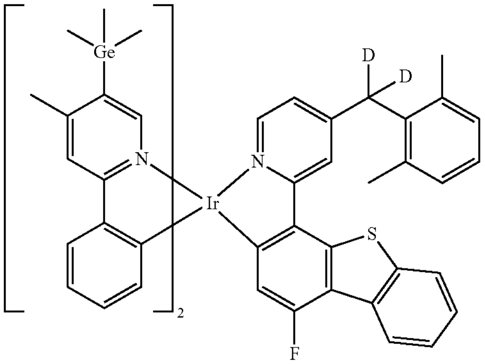
716
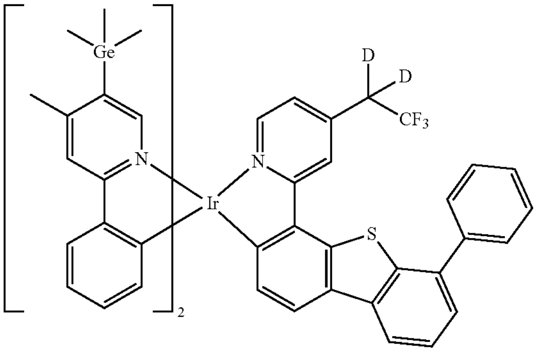
717
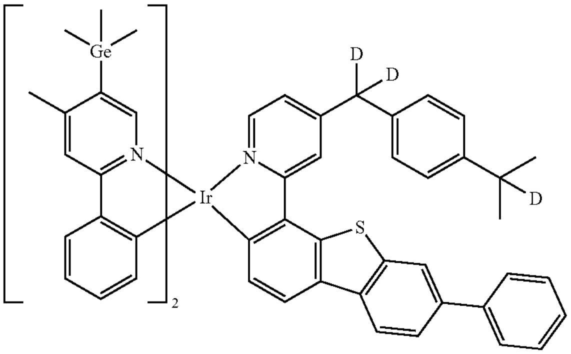
718
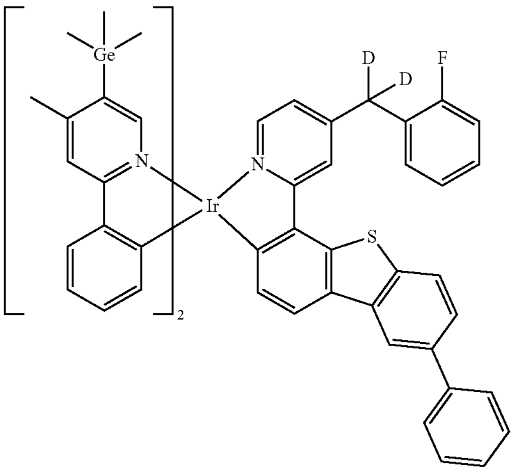
-continued
719
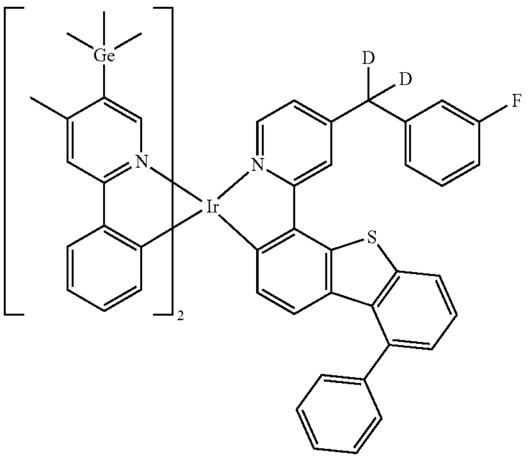
720
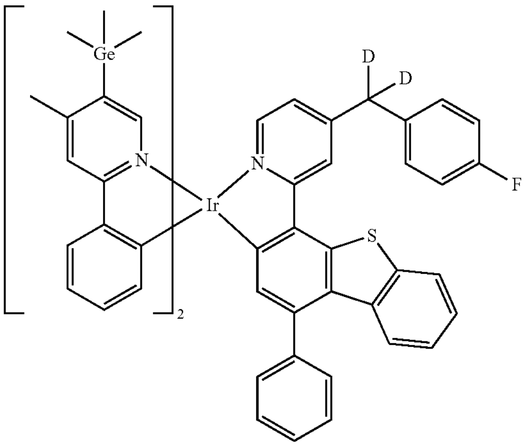
721
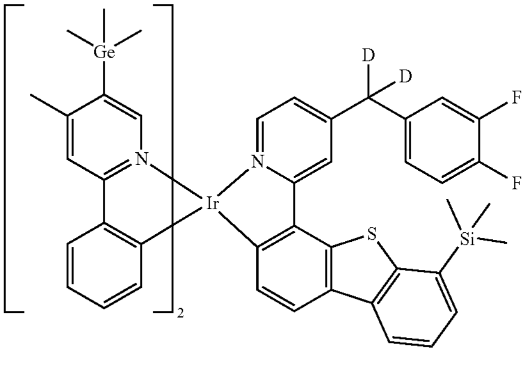

-continued
722
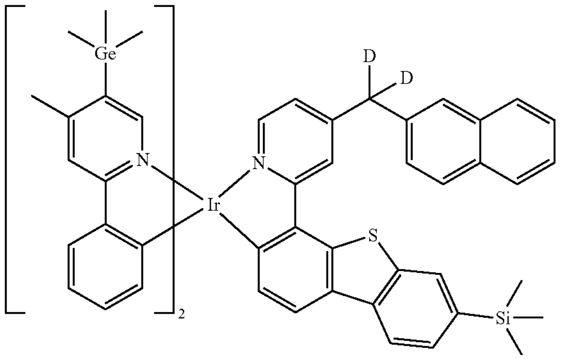
723
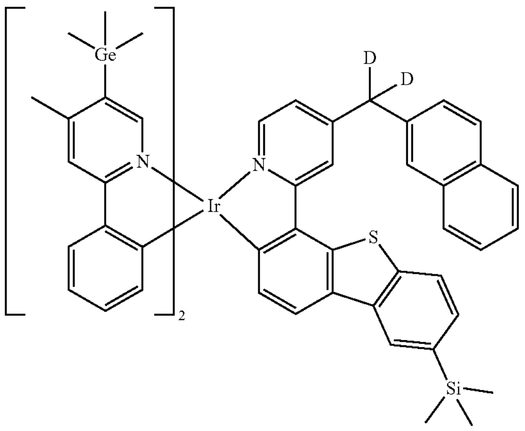
724
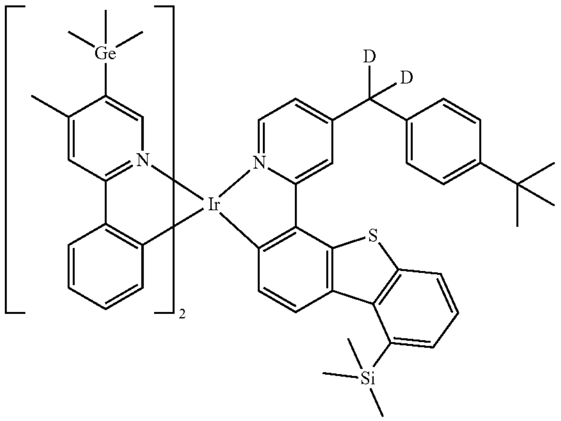
725
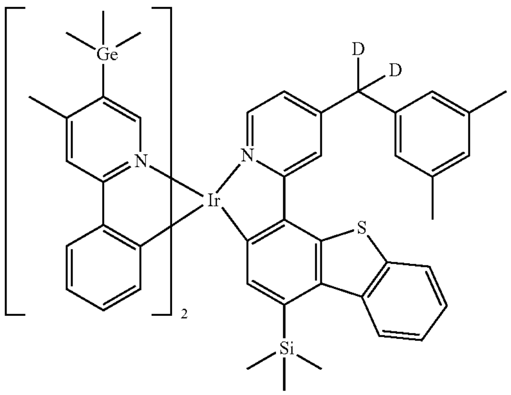
726
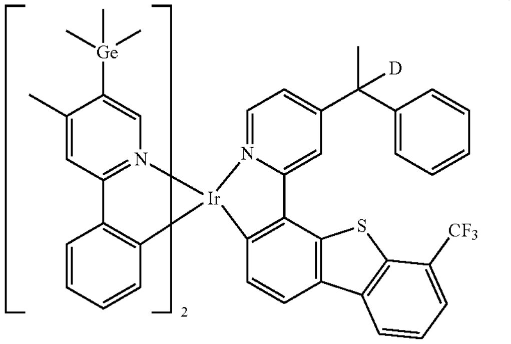
727
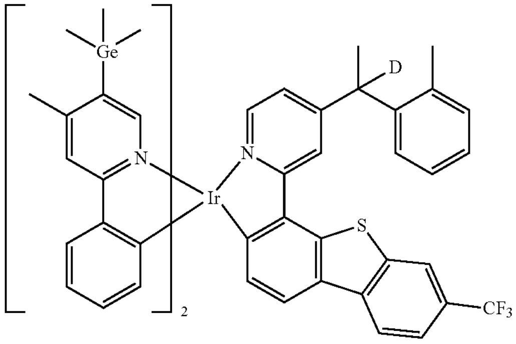
728
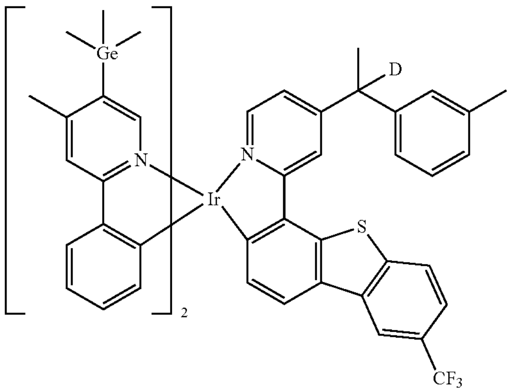

-continued
729
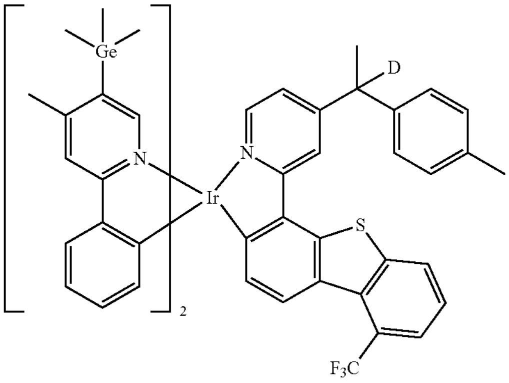
730
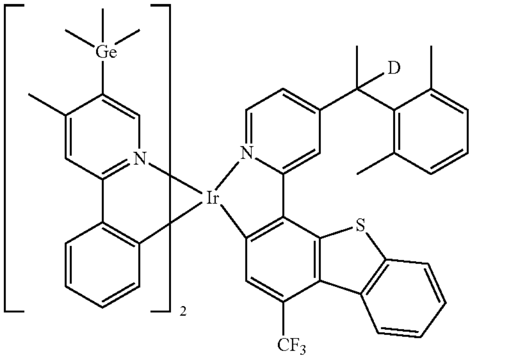
731
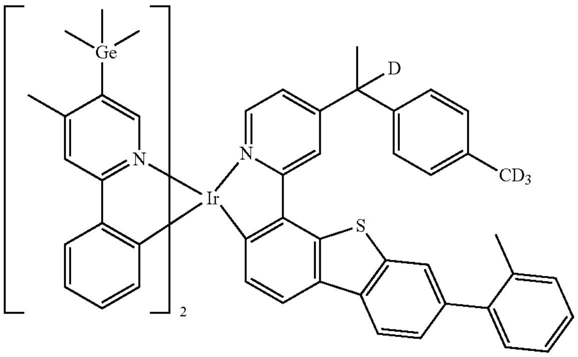
732
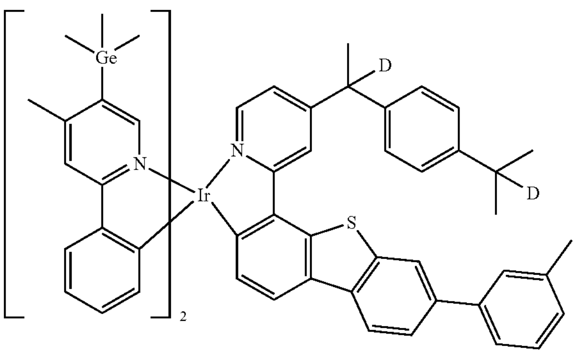
-continued
733
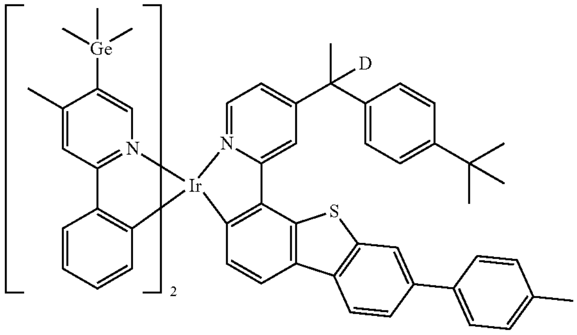
734
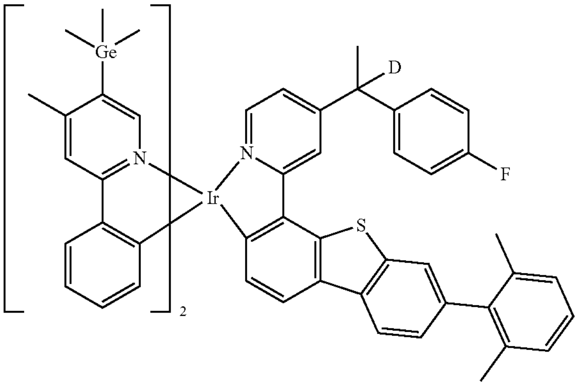
735
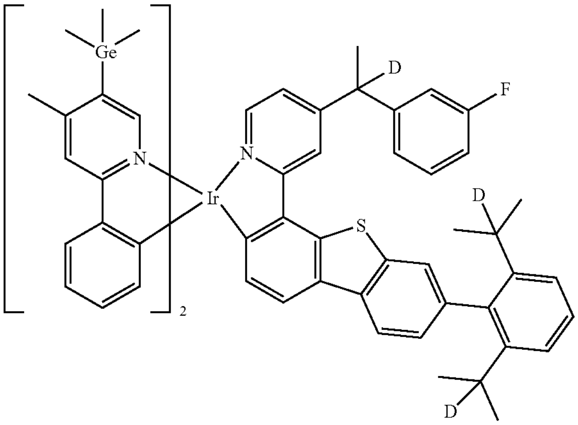
736
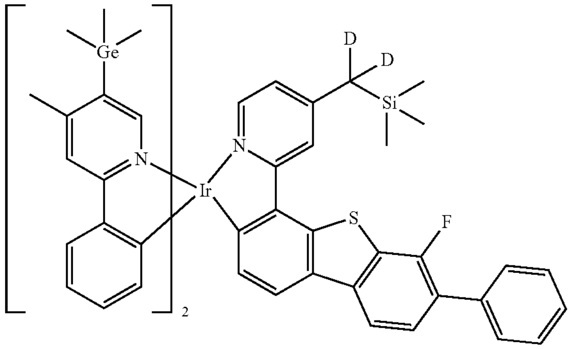

-continued
737
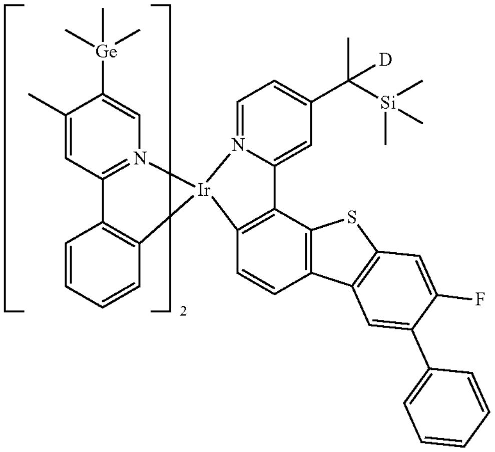
738
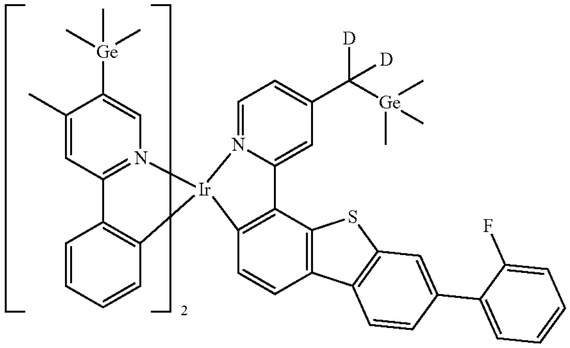
739
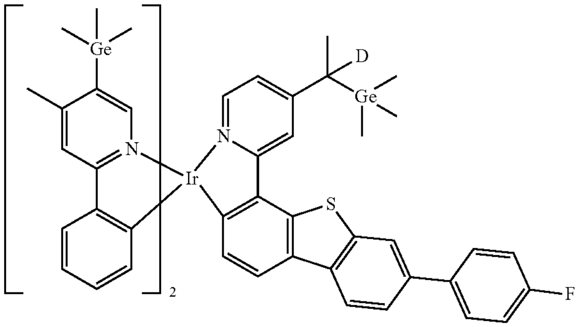
740
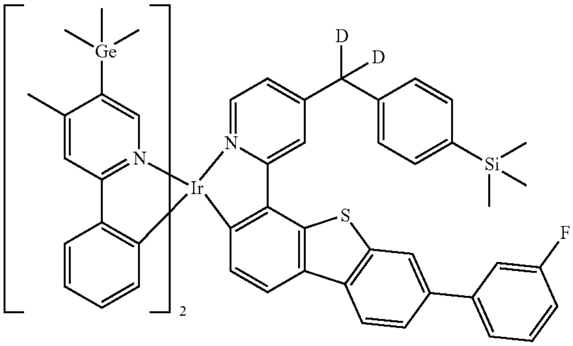
-continued
741
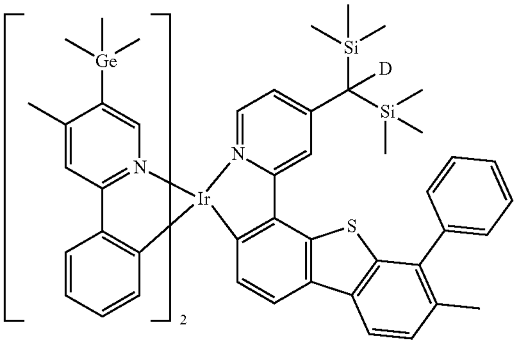
742
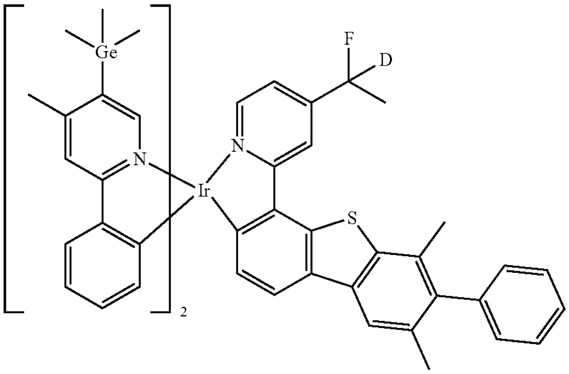
743
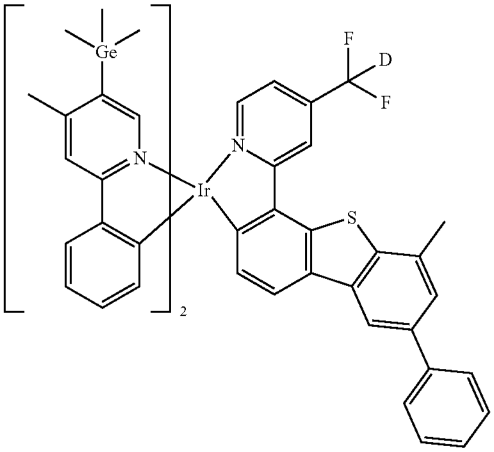

-continued
744
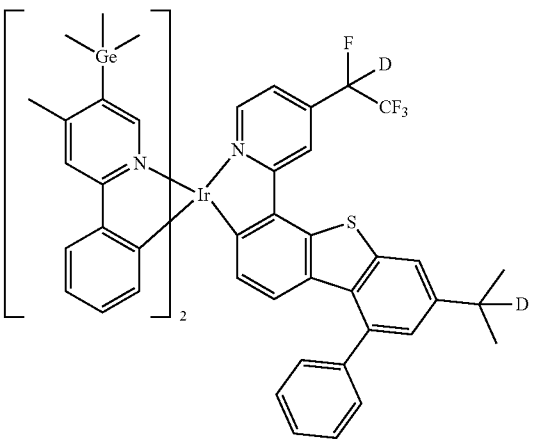
745
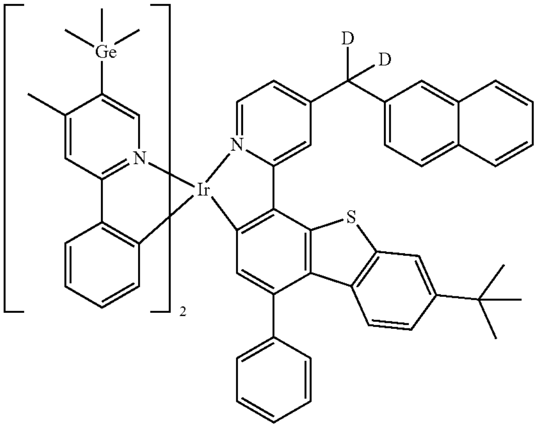
746
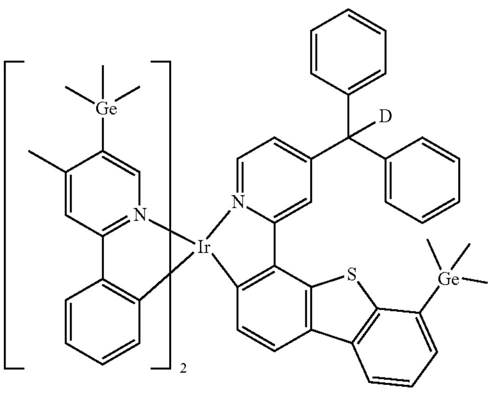
-continued
747
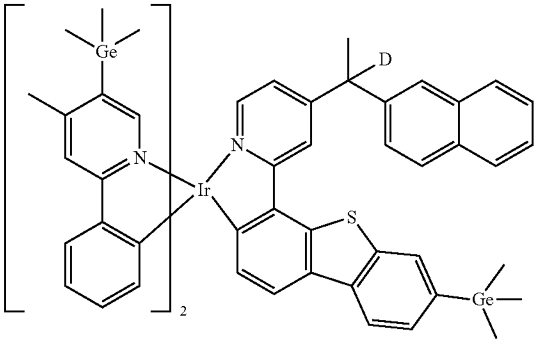
748
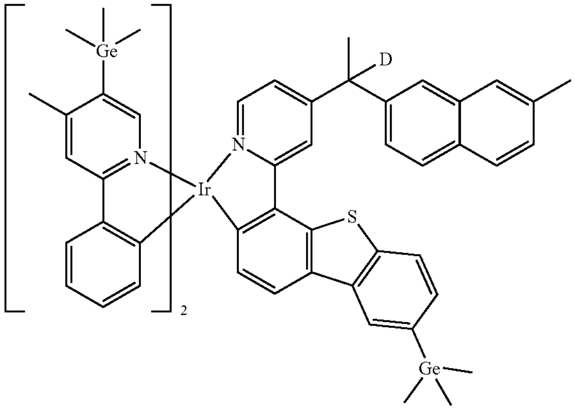
749
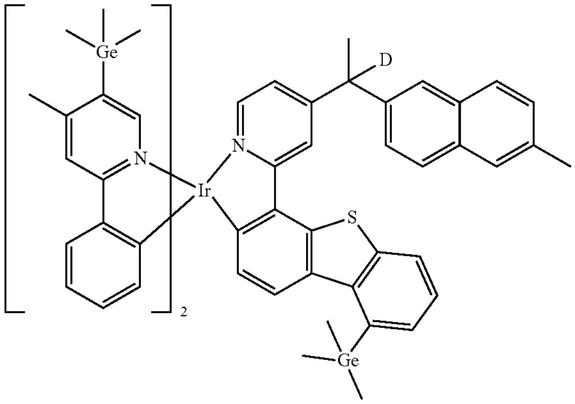

-continued
750
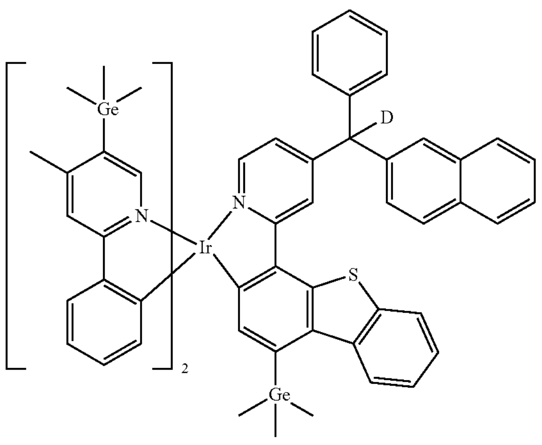
751
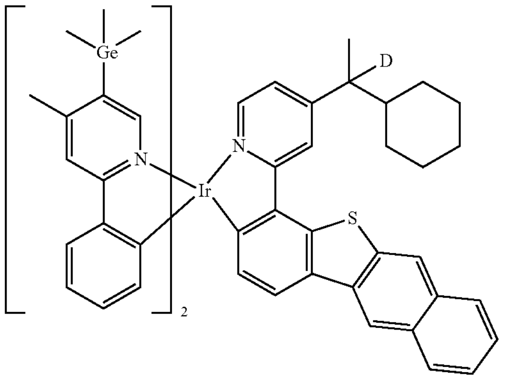
752
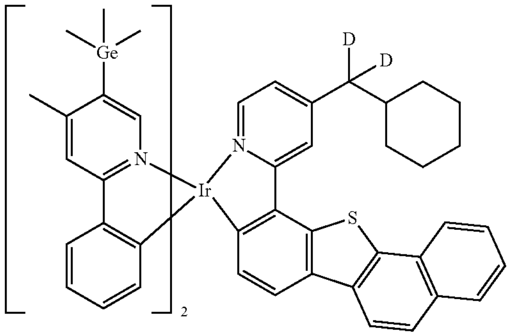
753
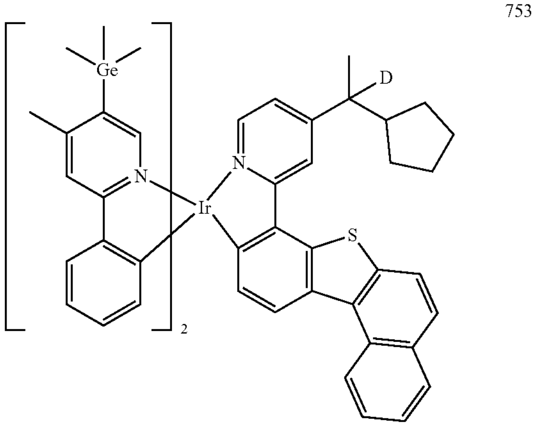
-continued
754
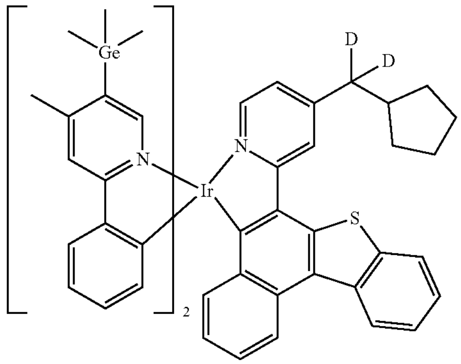
755
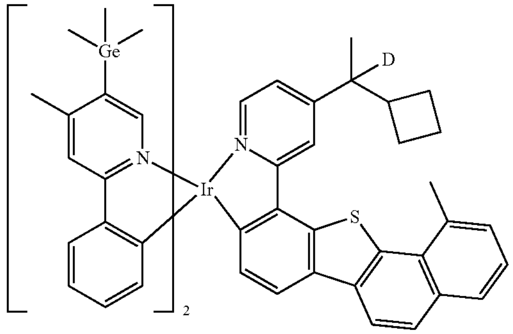
756
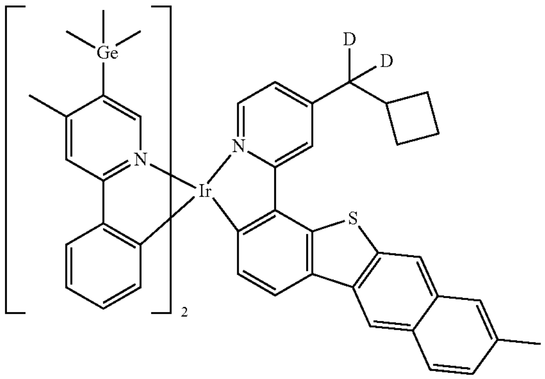
757
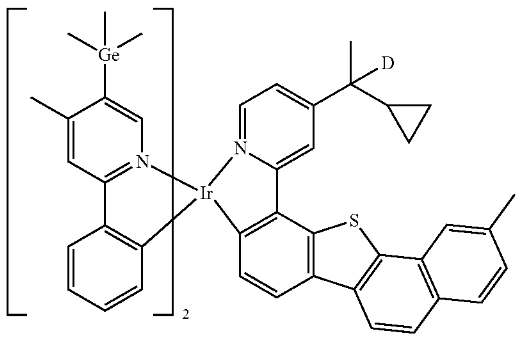

-continued
758
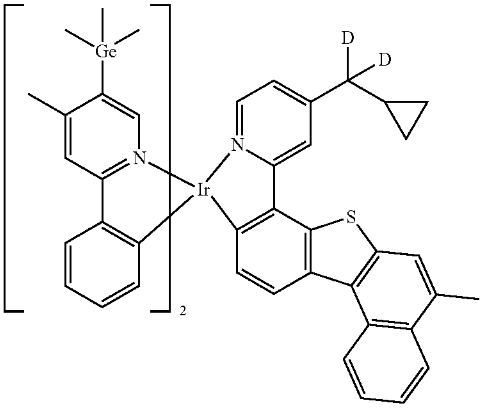
759
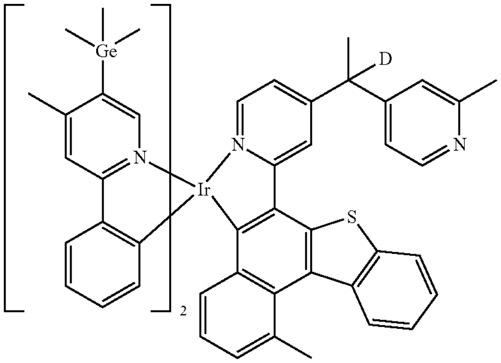
760
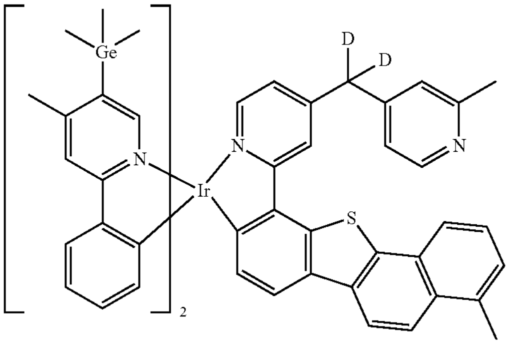
761
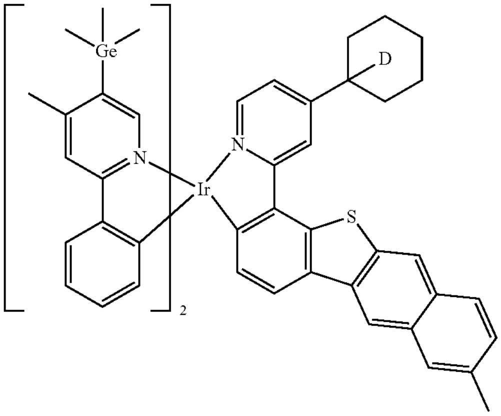
-continued
762
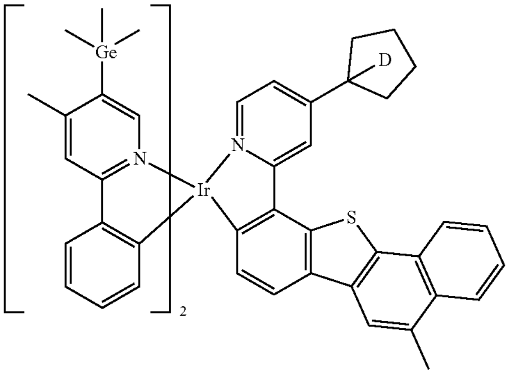
763
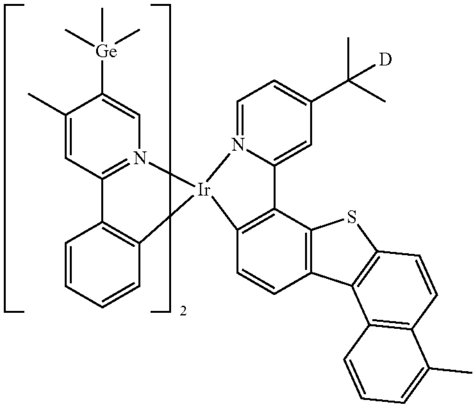
764
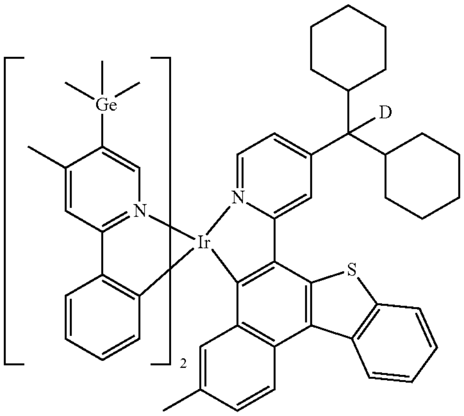
765
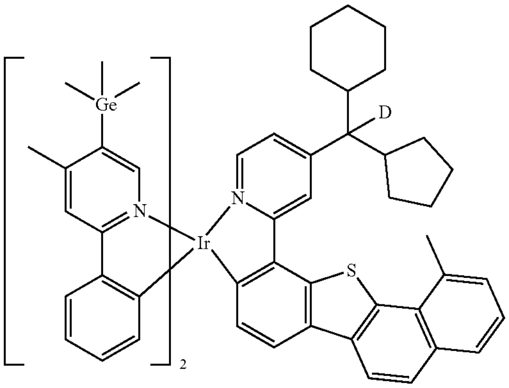

-continued
766
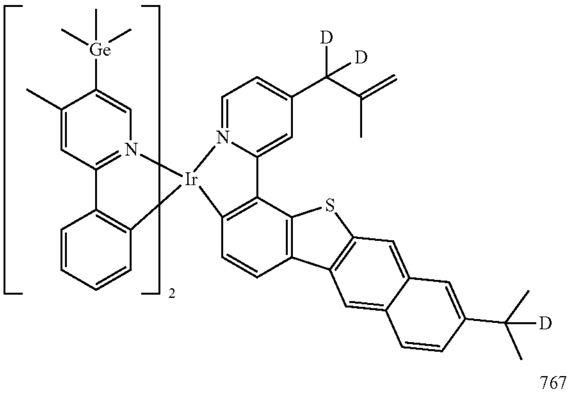
767
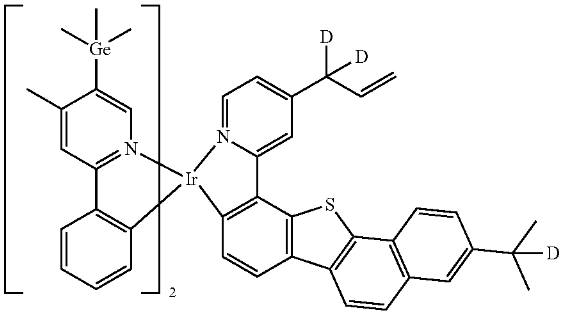
768
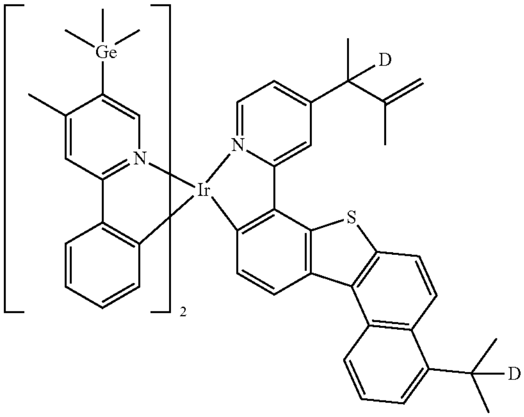
769
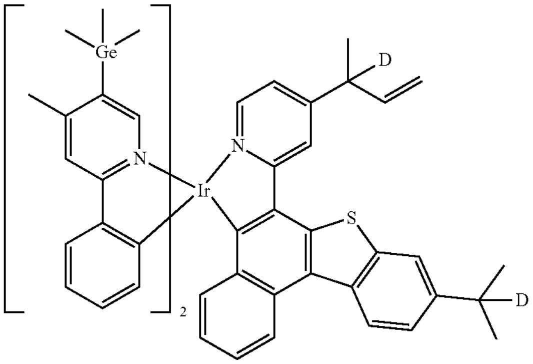
-continued
770
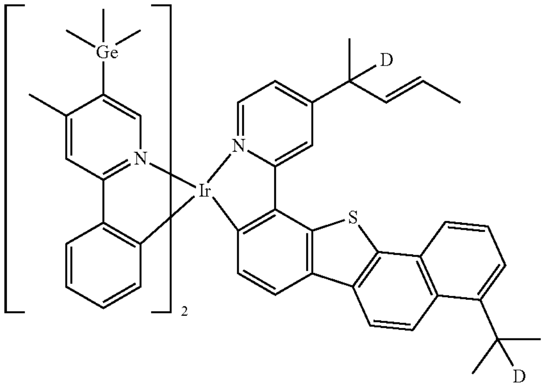
771
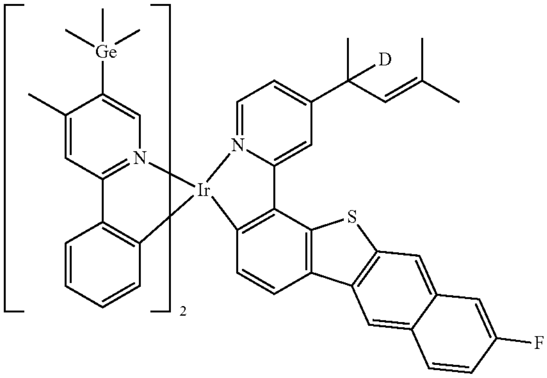
772
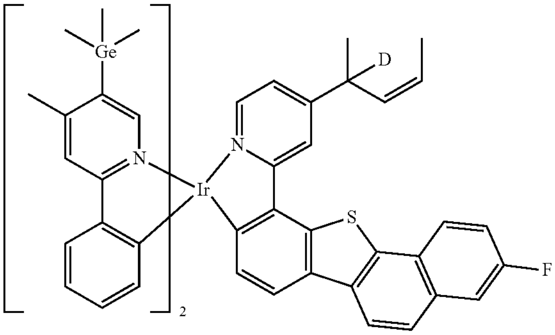
773
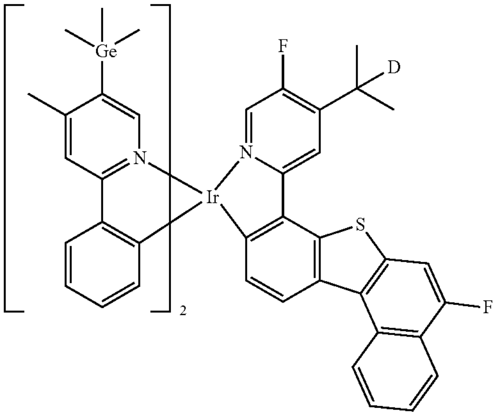

-continued
774
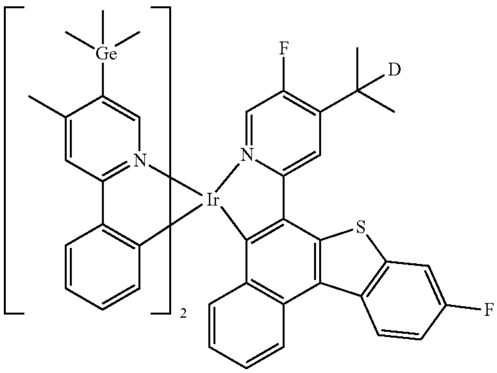
775
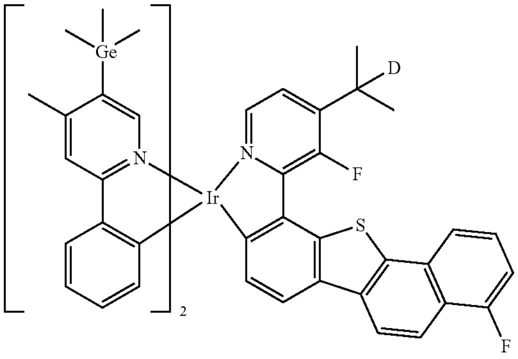
776
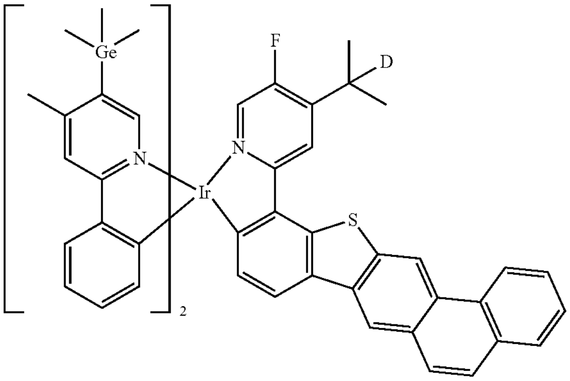
777
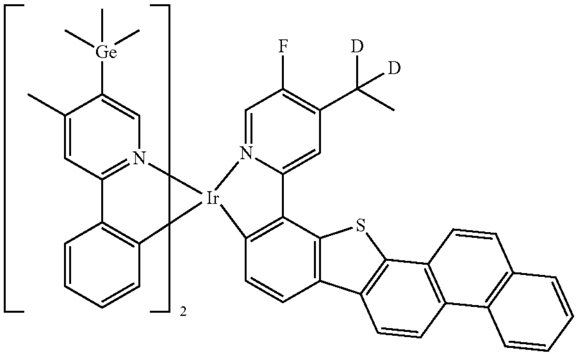
-continued
778
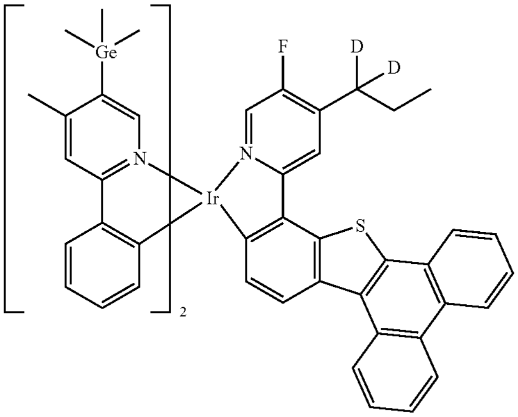
779
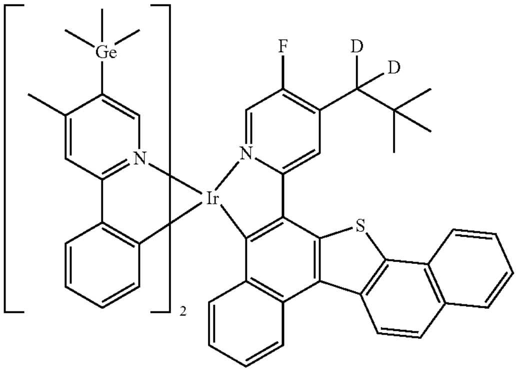
780
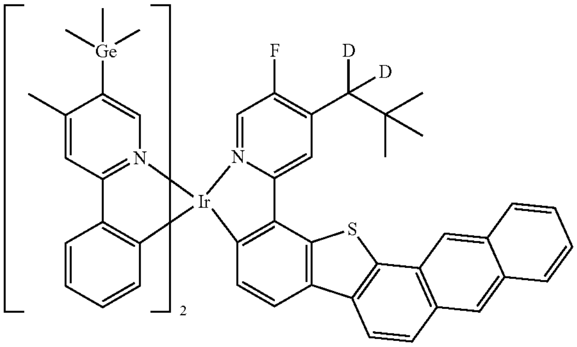
781
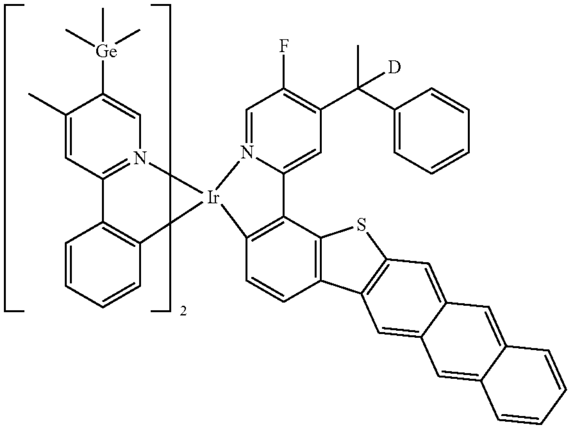

-continued
782
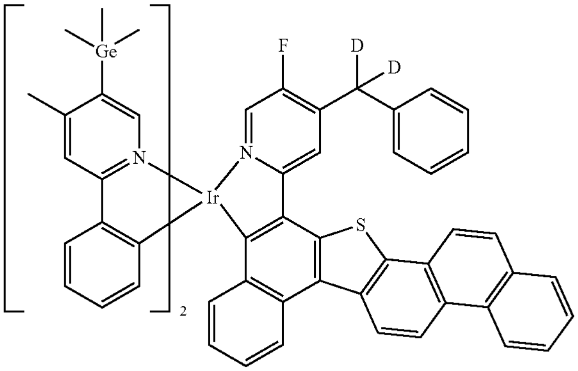
783
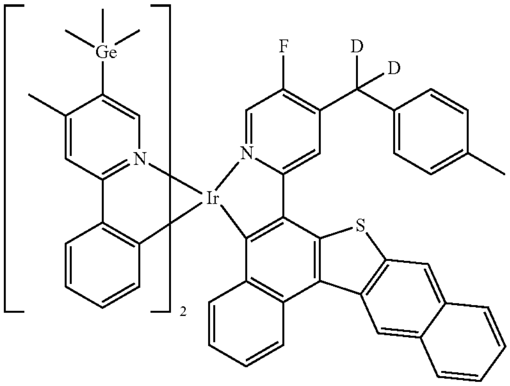
784
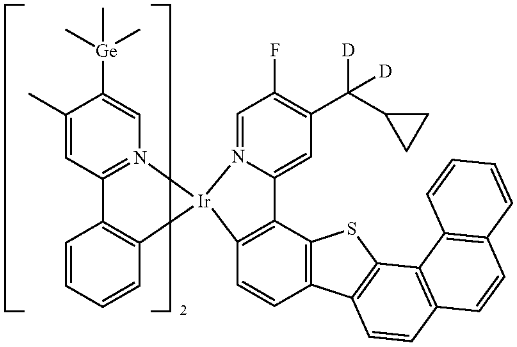
785
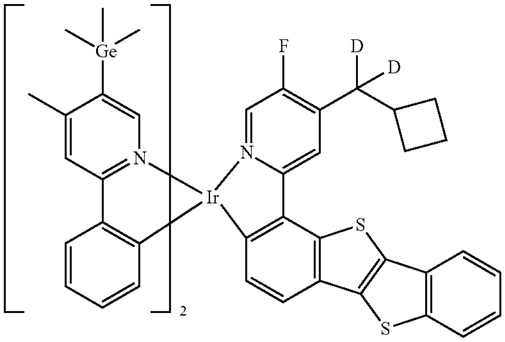
-continued
786
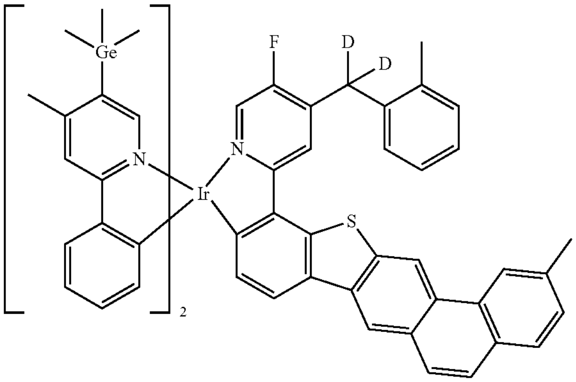
787
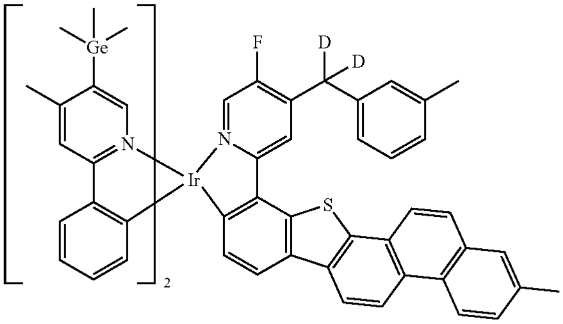
788
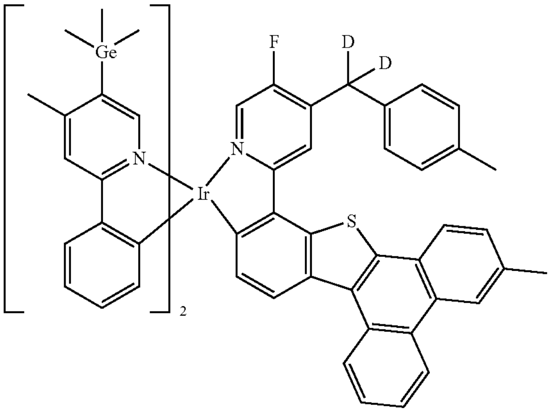
789
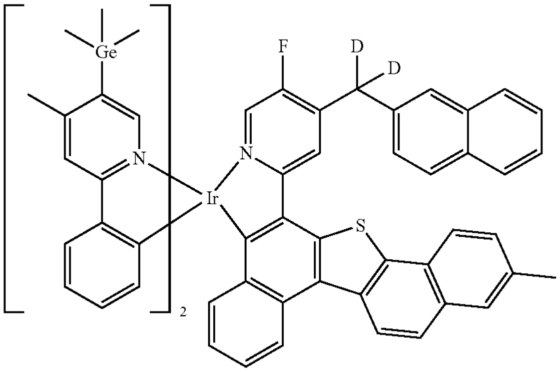

-continued
790
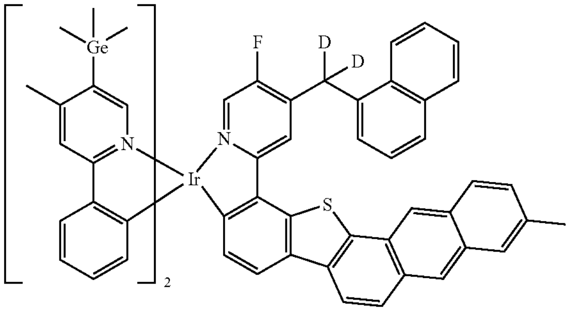
791
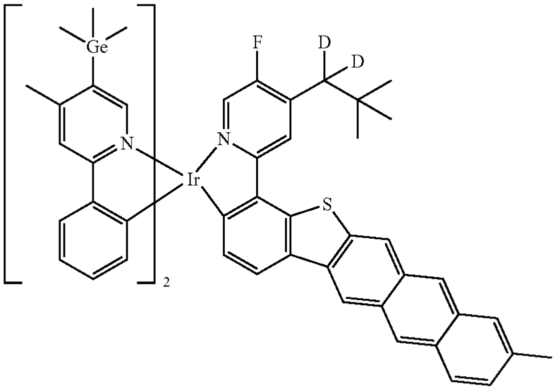
792
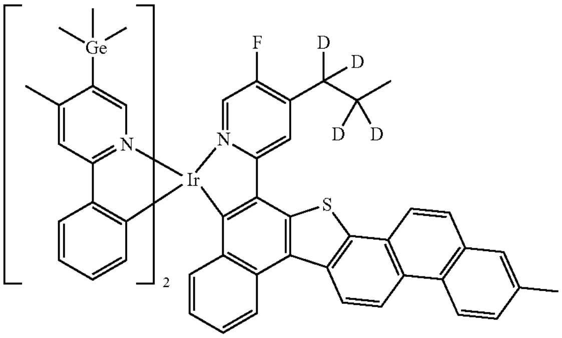
793
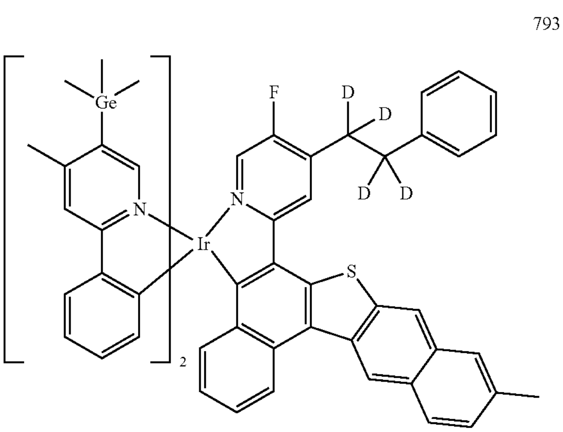
-continued
794
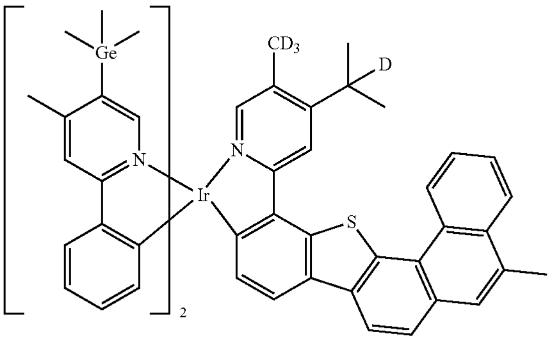
795
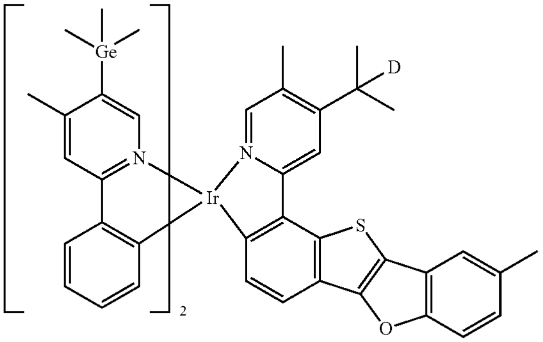
796
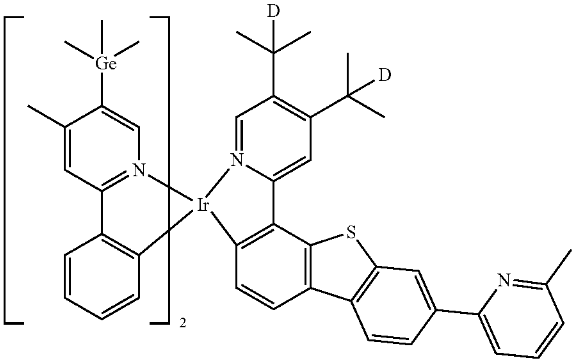
797
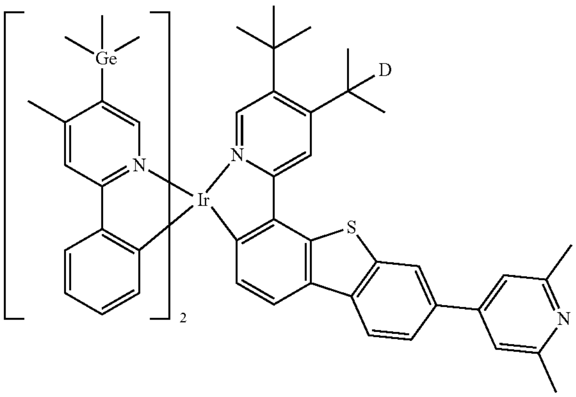

798
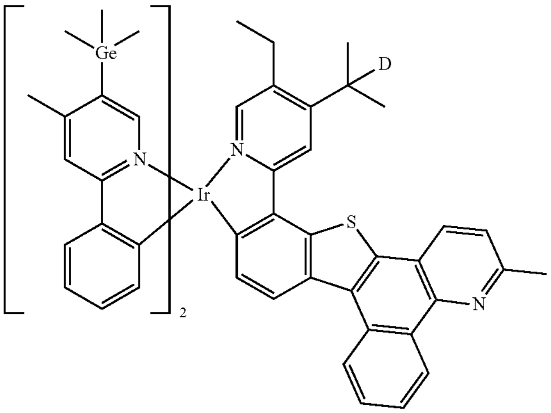
799
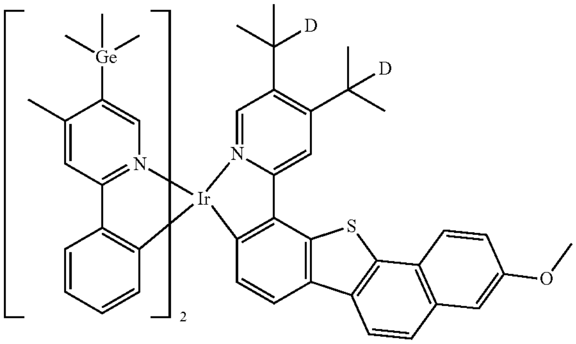
800
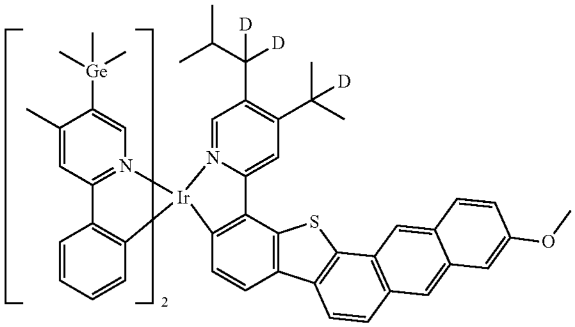
801
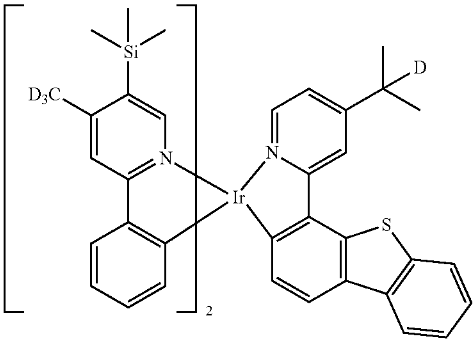
802
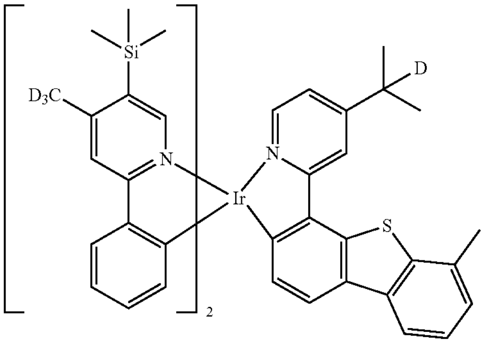
803
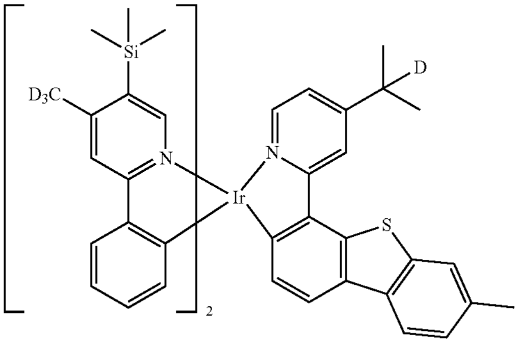
804
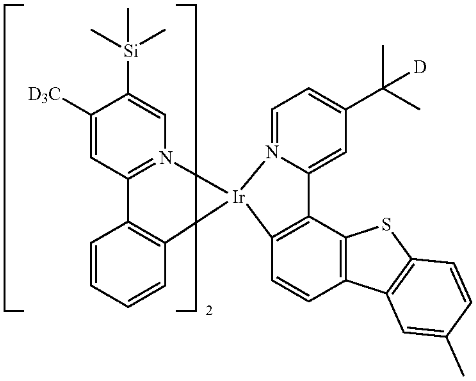
805
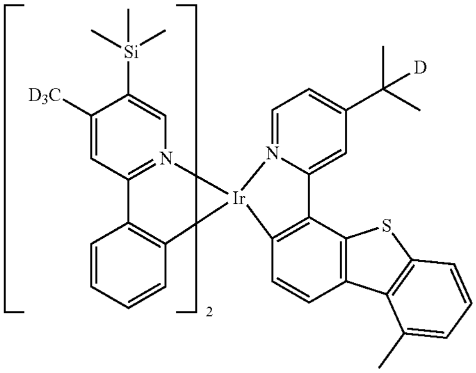

-continued
806
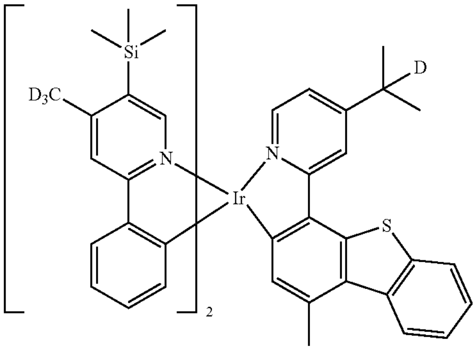
807
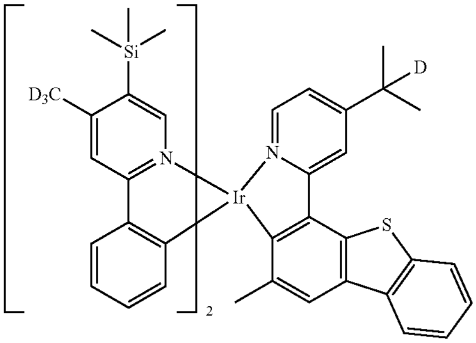
808
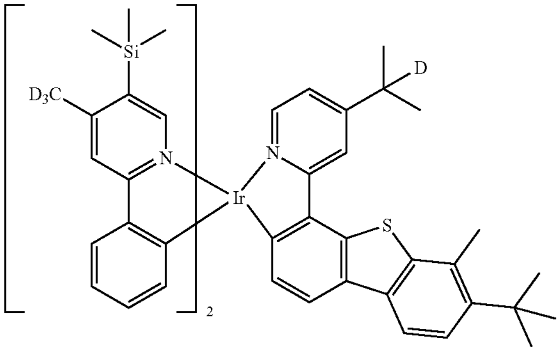
809
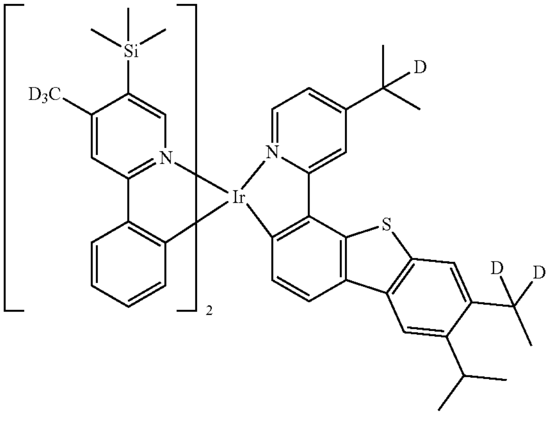
-continued
810
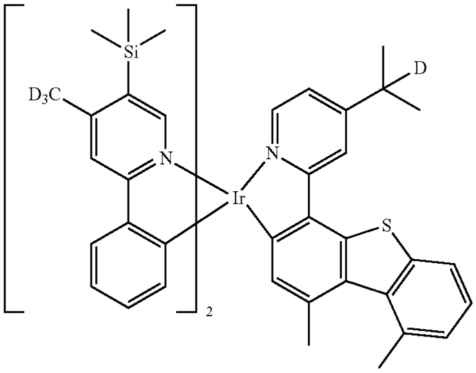
811
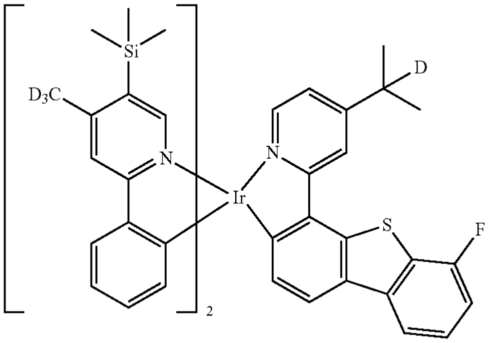
812
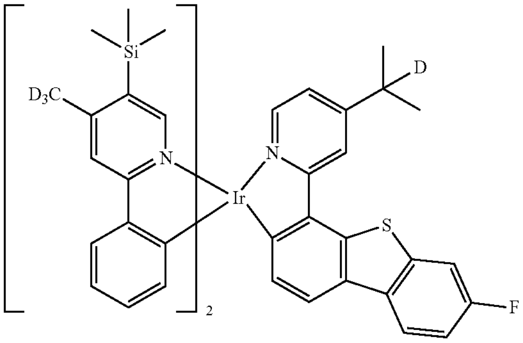
813
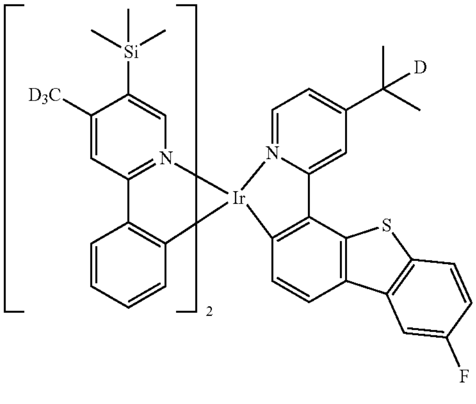

-continued
814
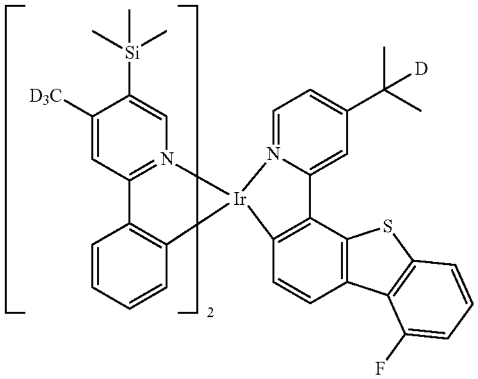
815
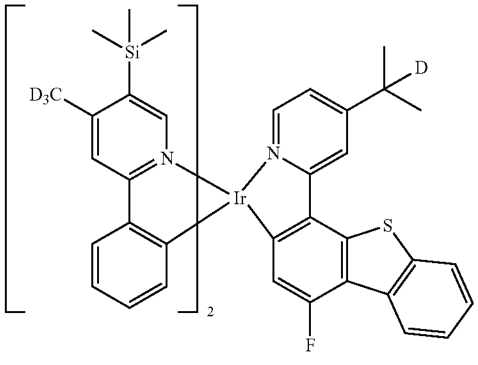
816
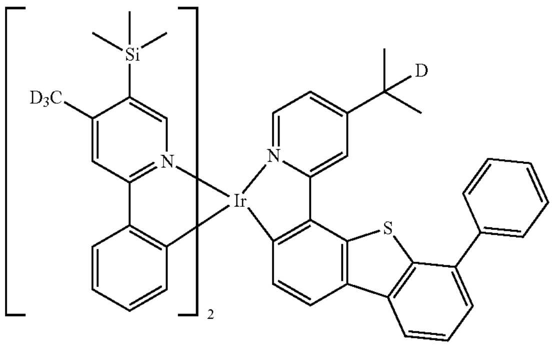
817
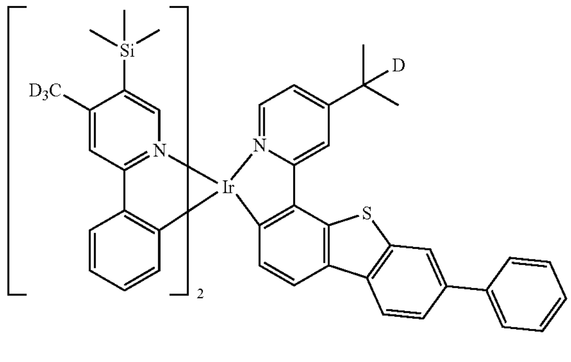
-continued
818
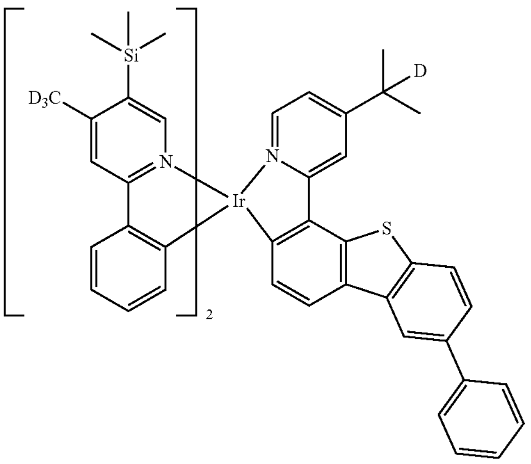
819
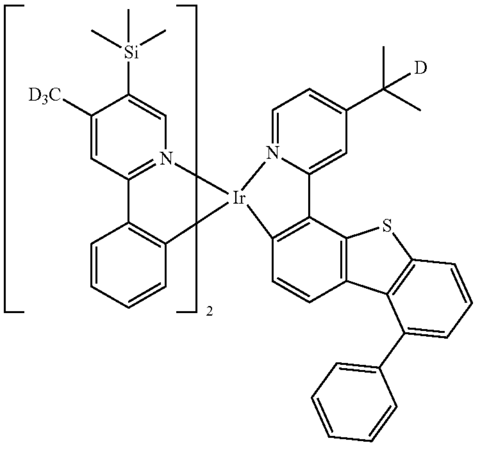
820
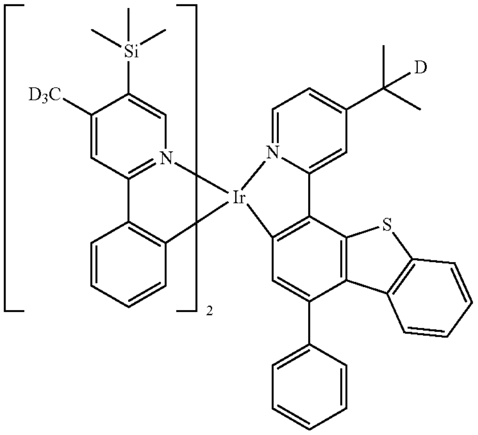

821
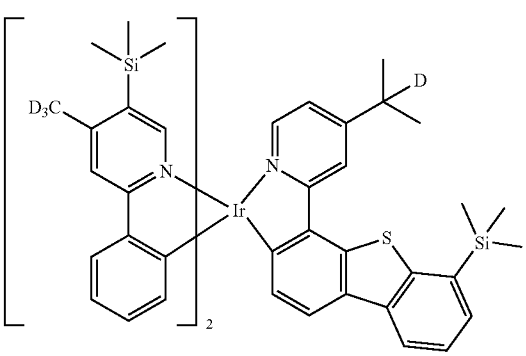
822
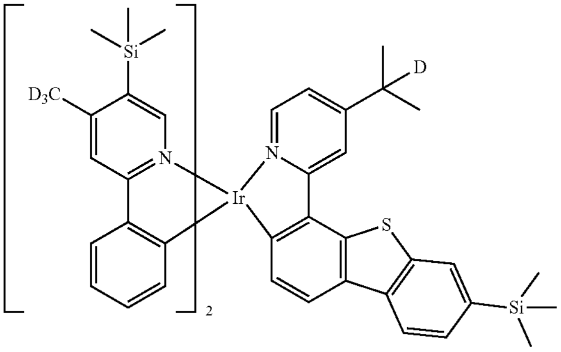
823
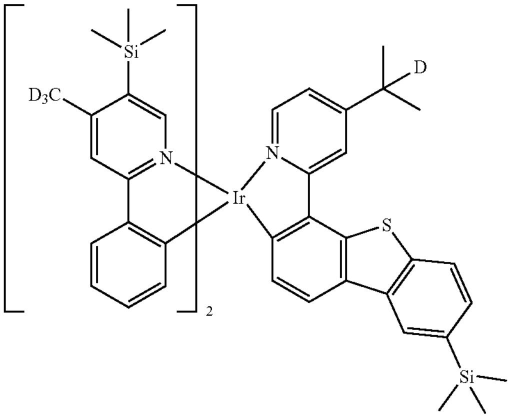
824
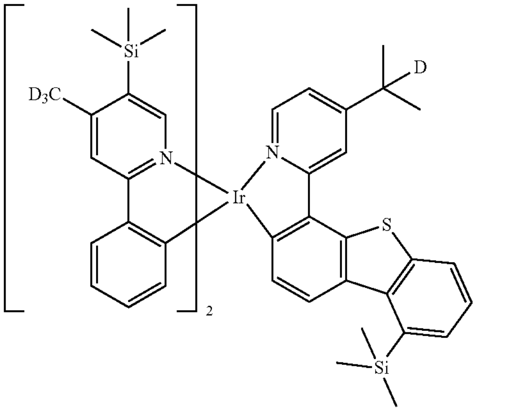
825
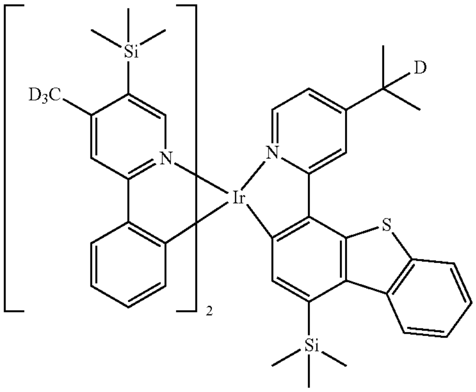
826
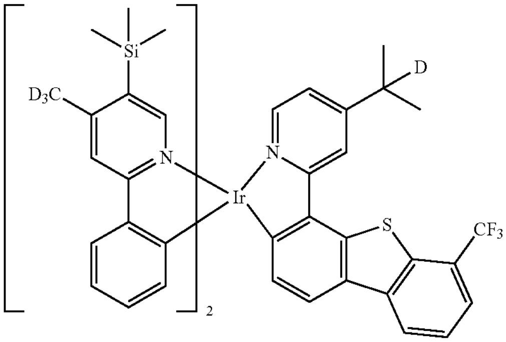
827
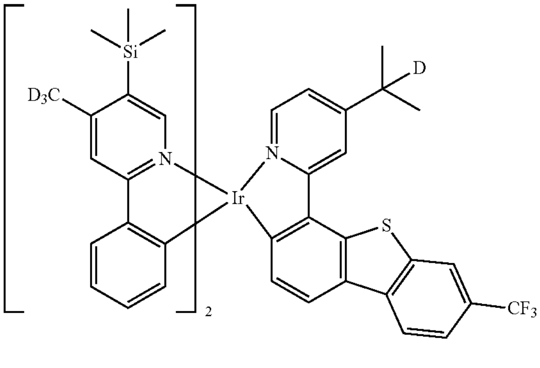
828
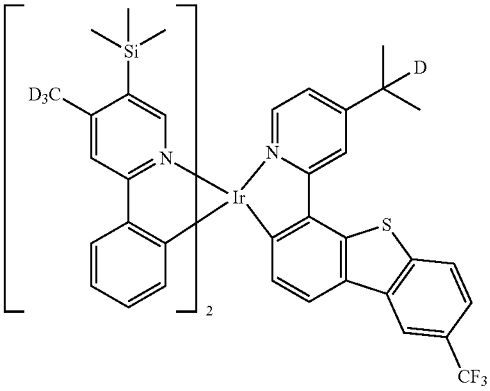

-continued
829
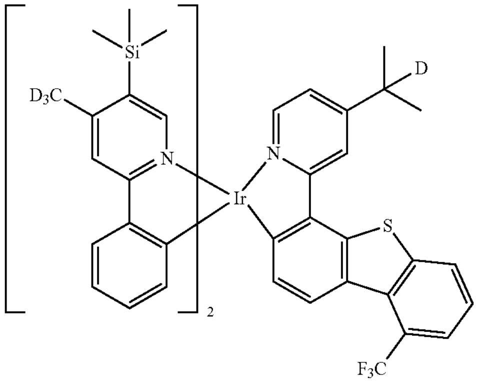
830
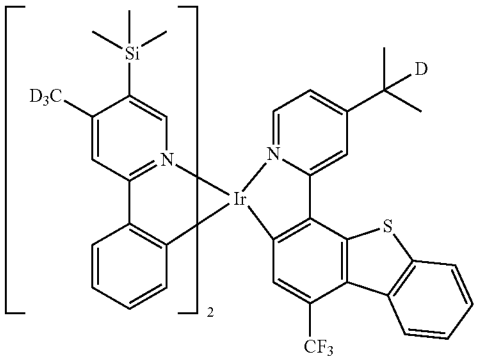
831
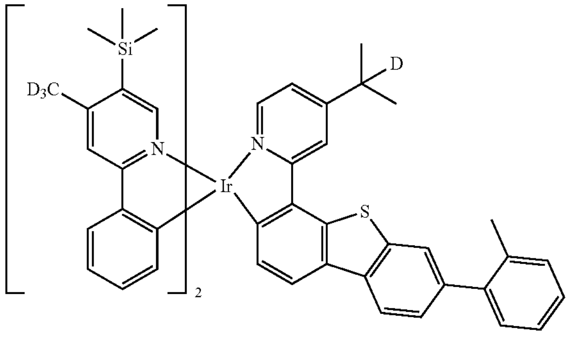
832
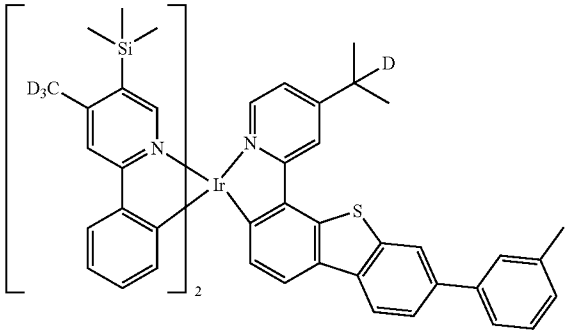
-continued
833
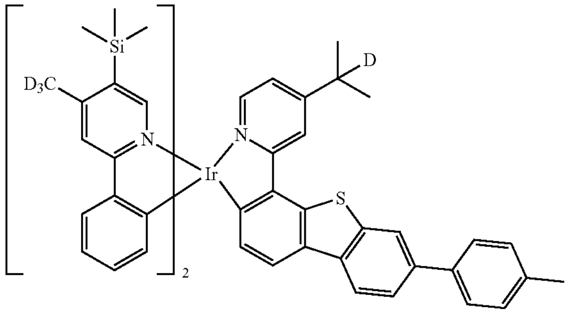
834
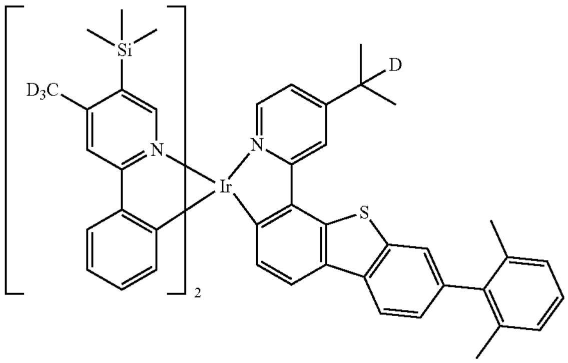
835
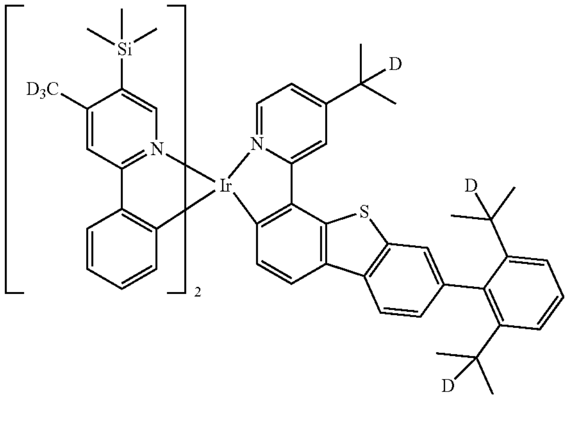
836
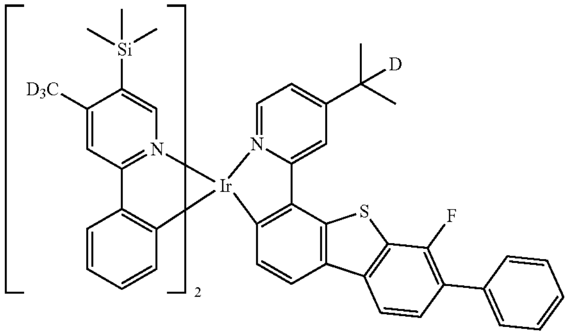

-continued
837
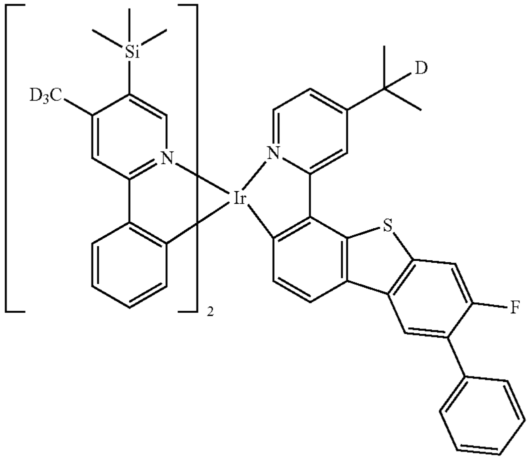
838
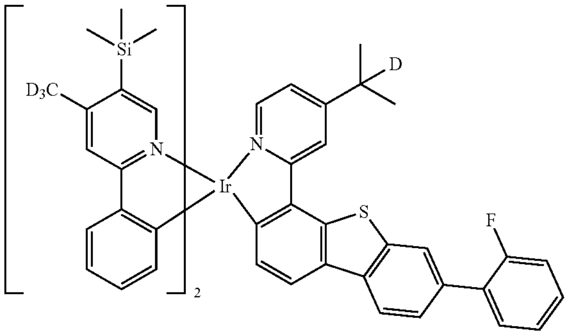
839
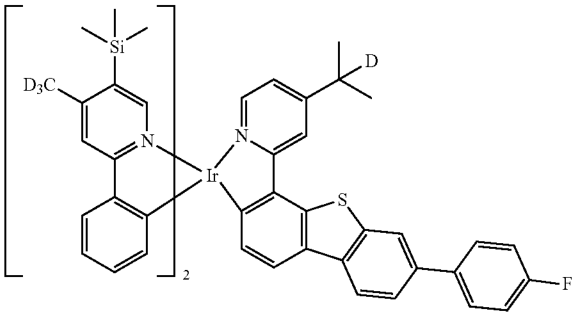
840
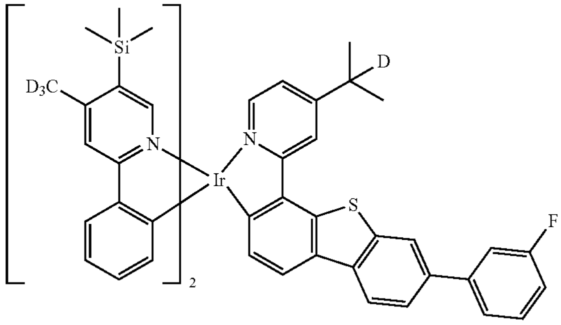
-continued
841
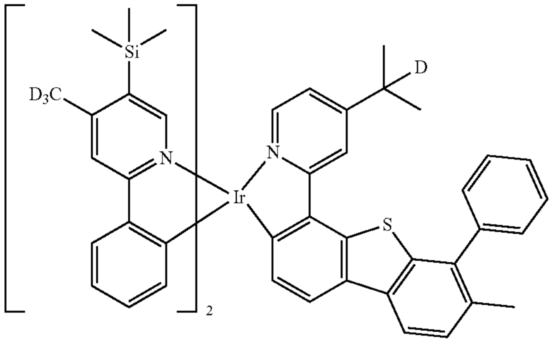
842
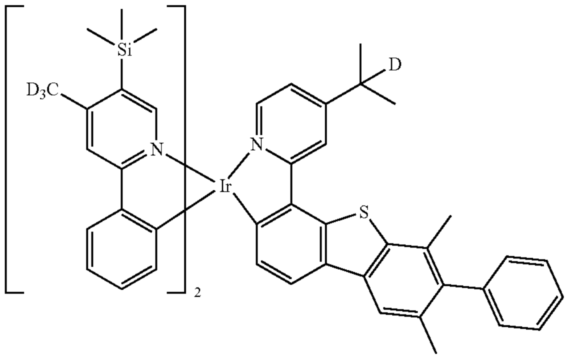
843
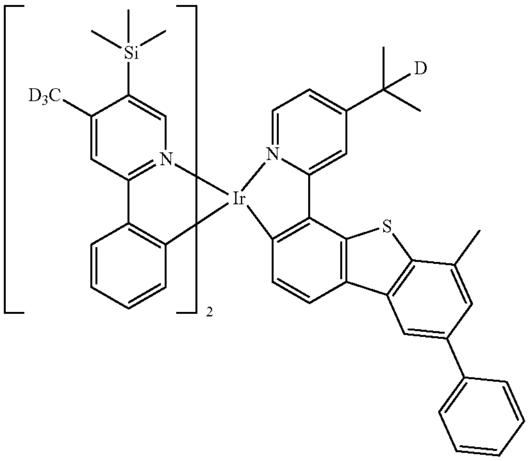

844
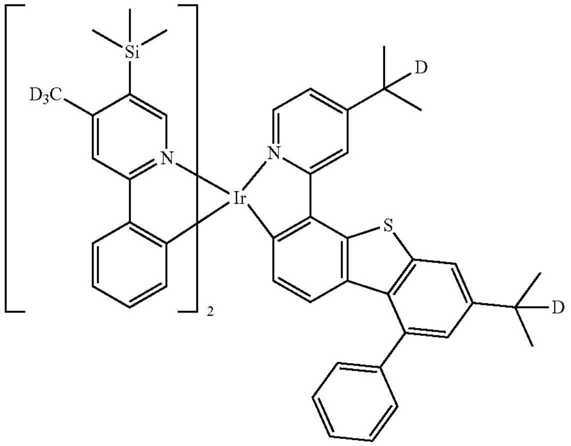
845
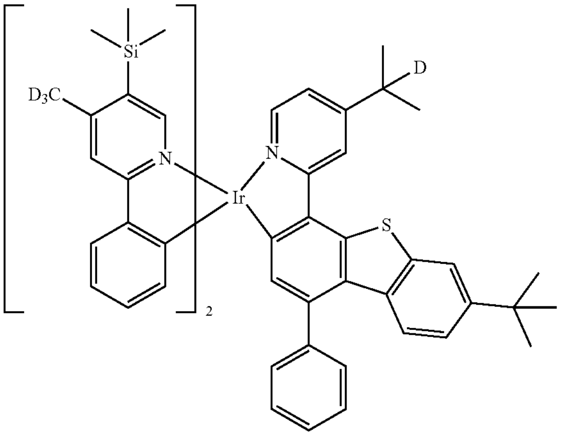
846
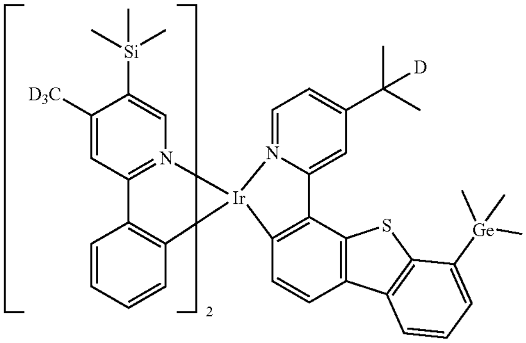
847
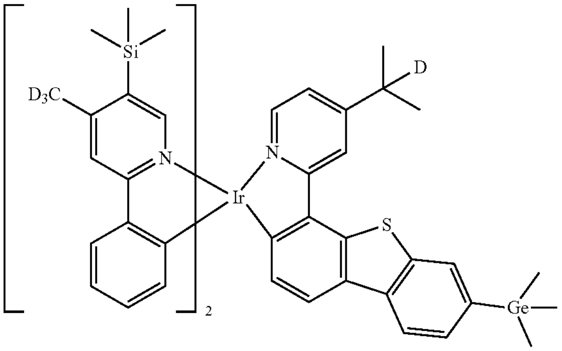
848
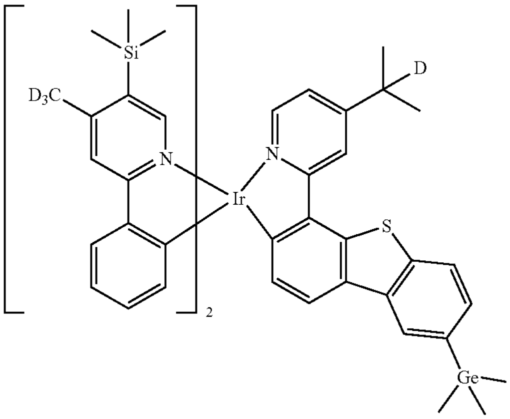
849
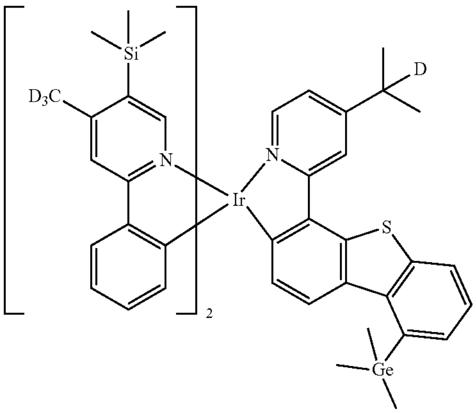
850
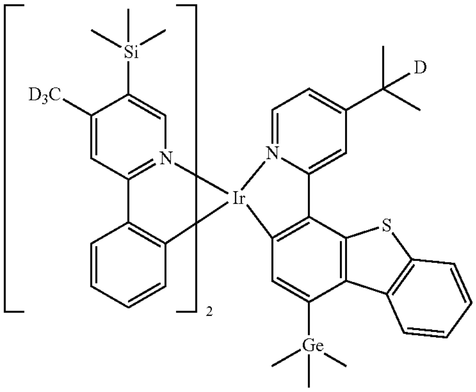

-continued
851
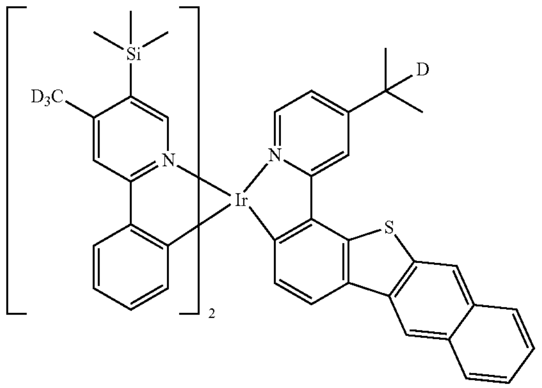
852
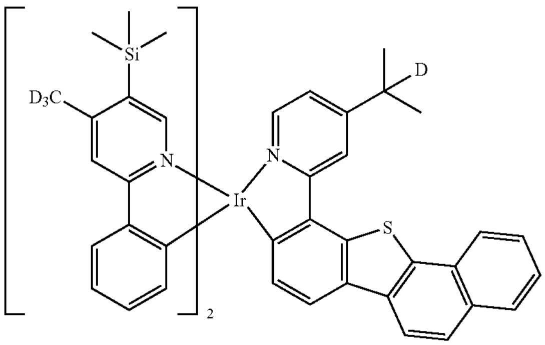
853
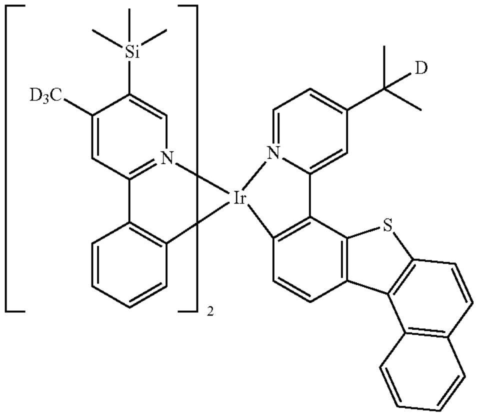
854
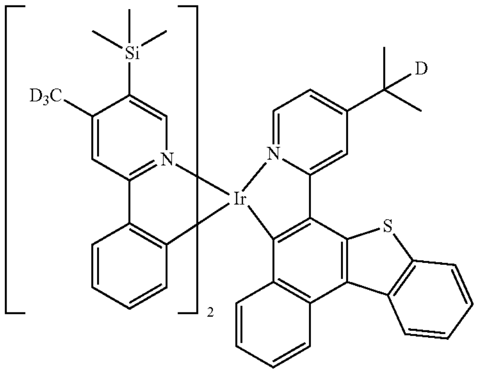
-continued
855
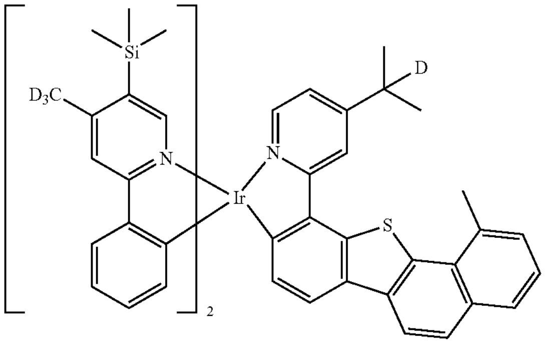
856
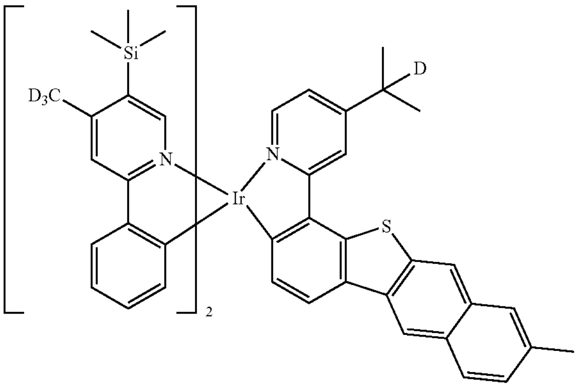
857
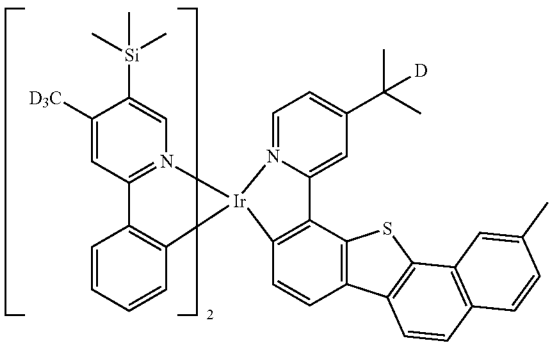
858
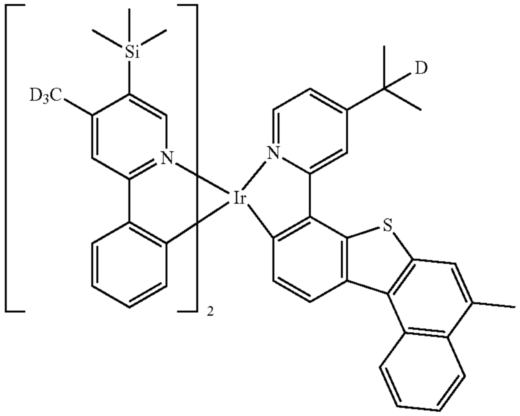

859
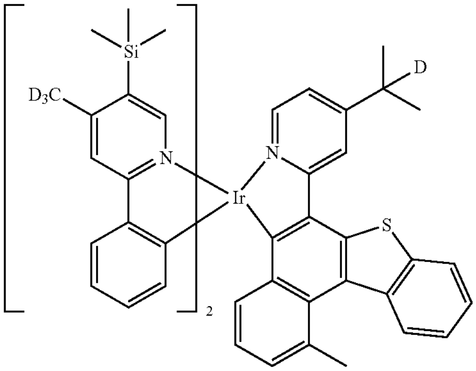
860
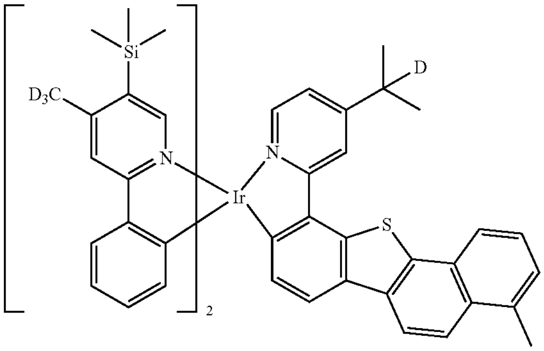
861
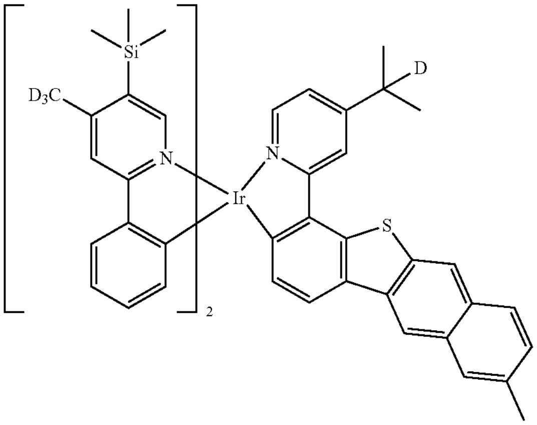
862
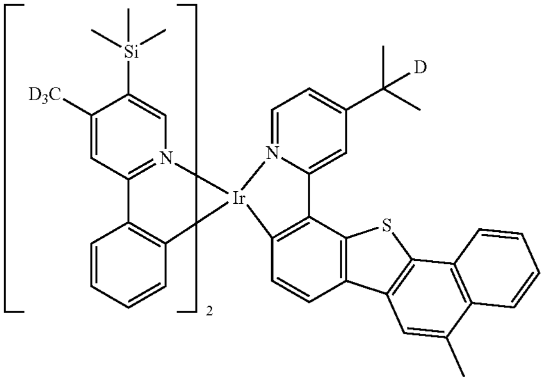
863
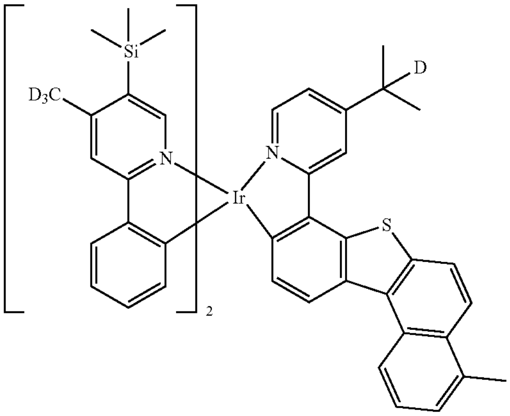
864
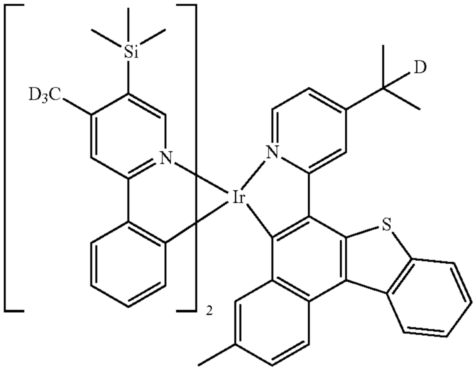
865
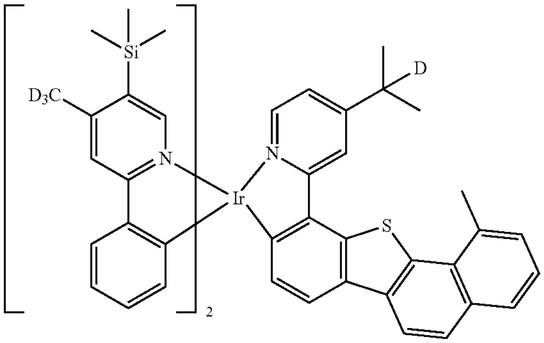
866
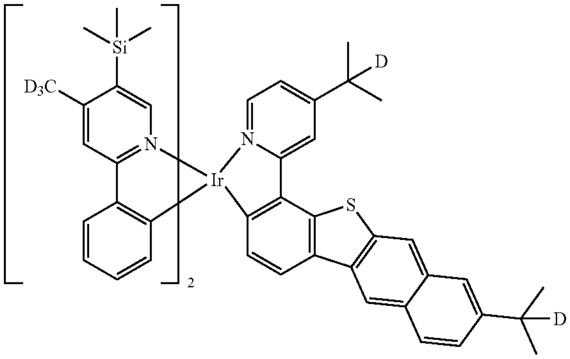

-continued
867
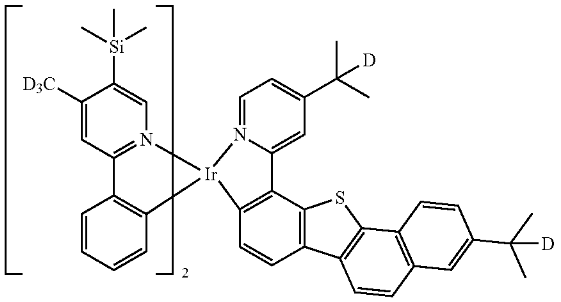
868
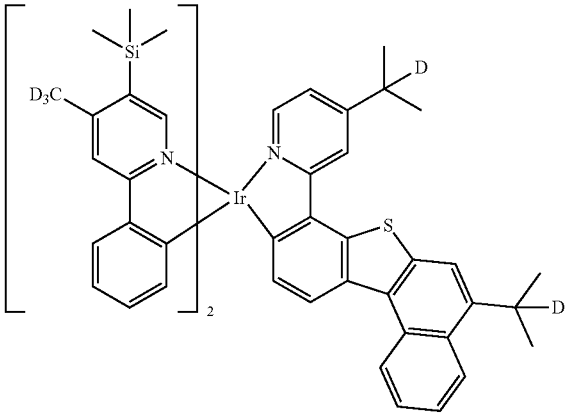
869
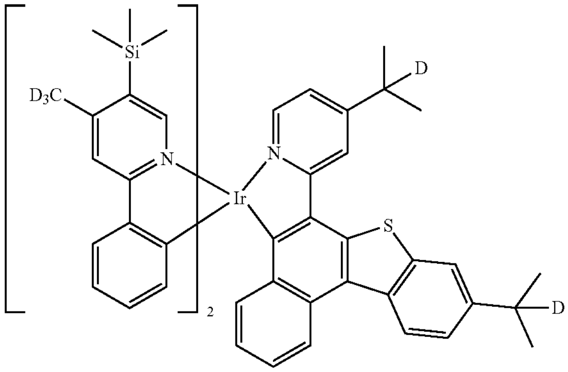
870
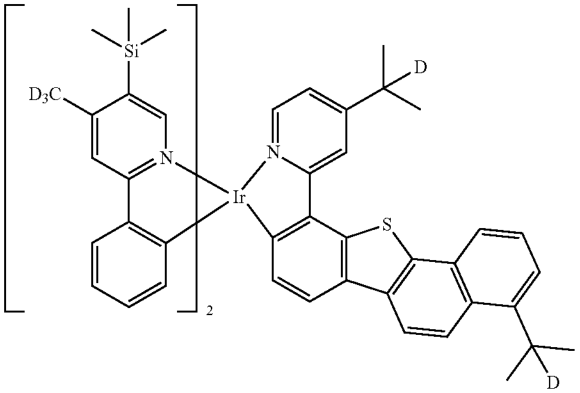
-continued
871
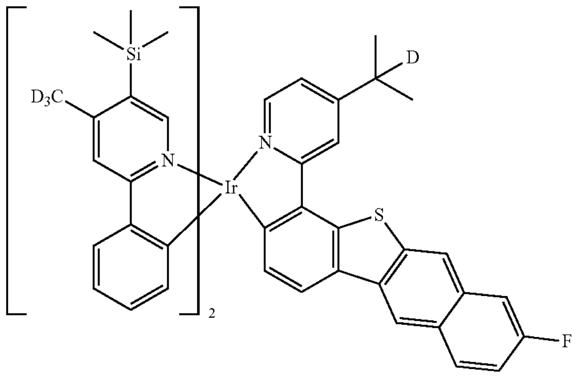
872
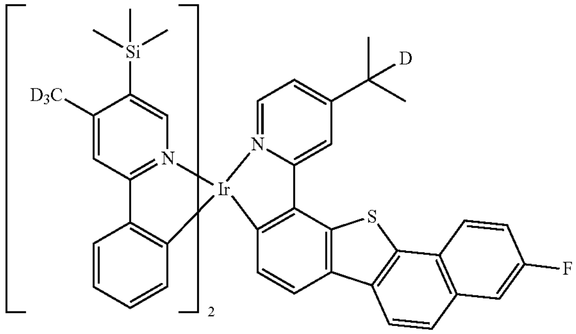
873
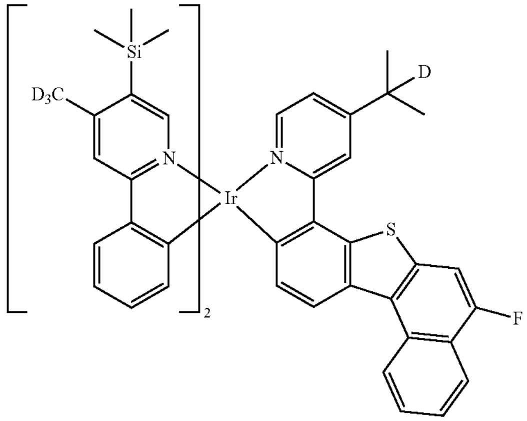

-continued
874
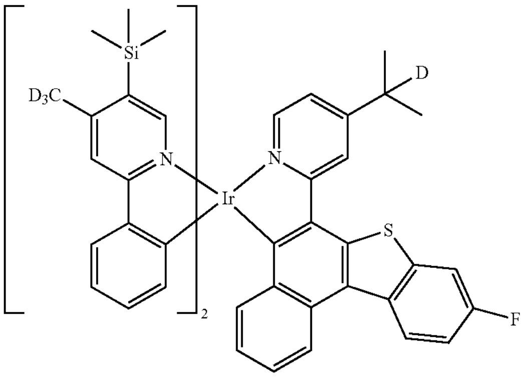
875
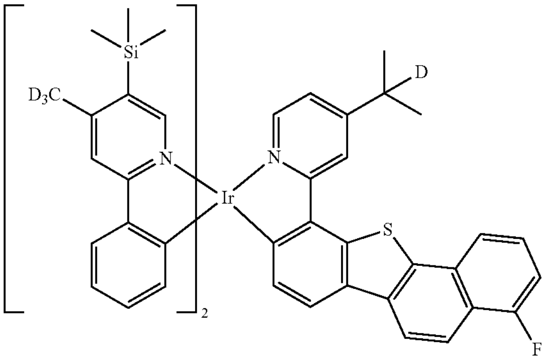
876
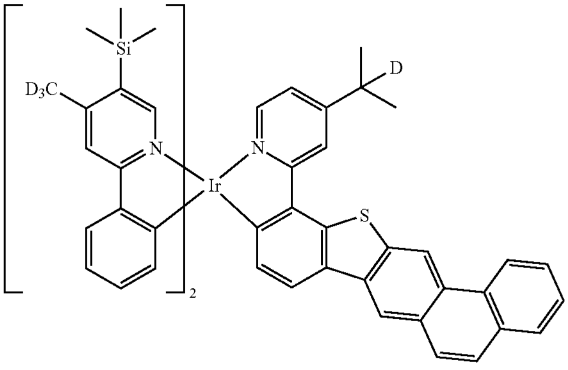
877
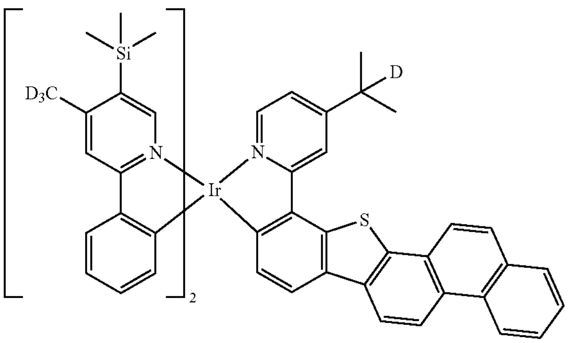
-continued
878
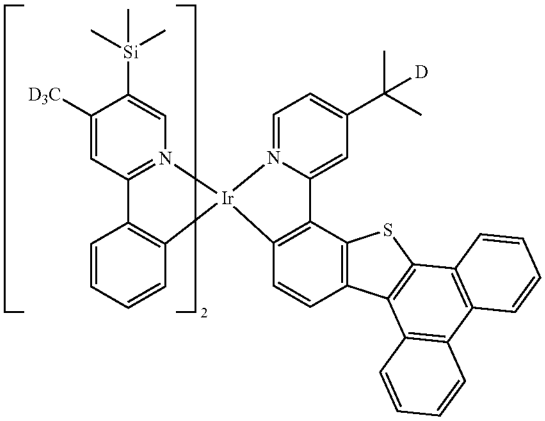
879
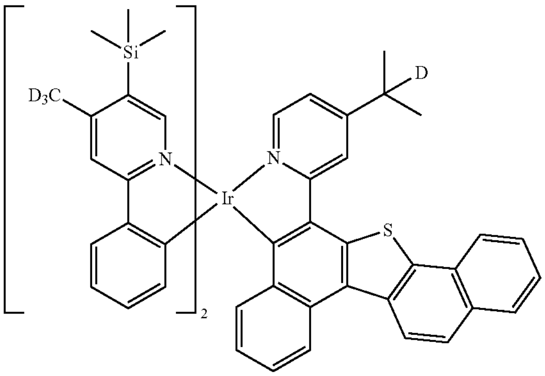
880
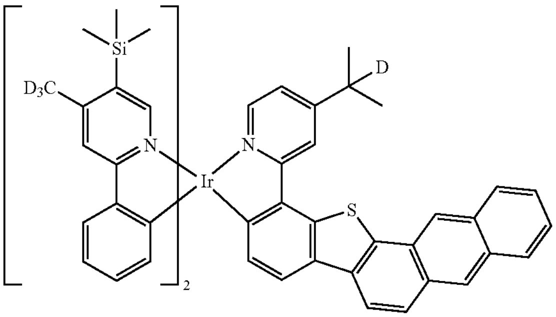
881
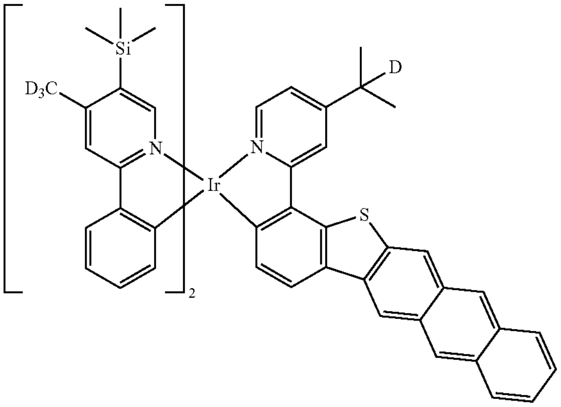

-continued
882
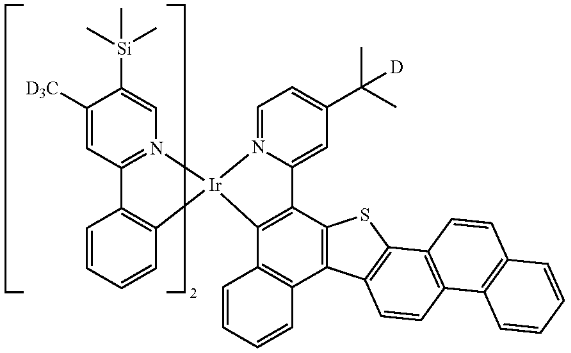
883
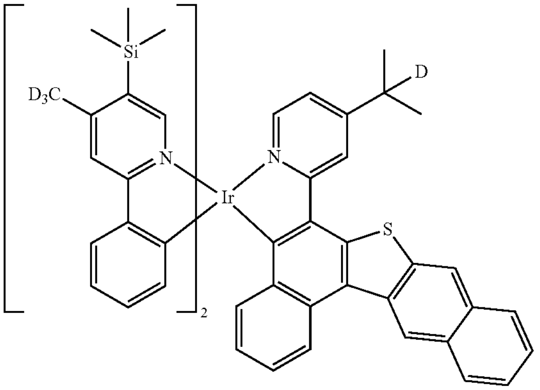
884
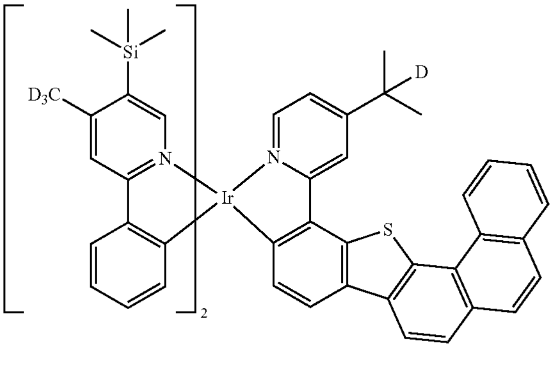
885
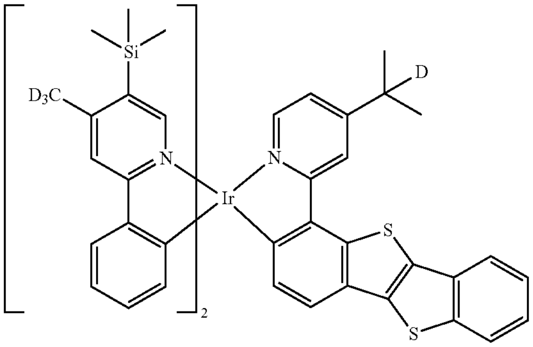
-continued
886
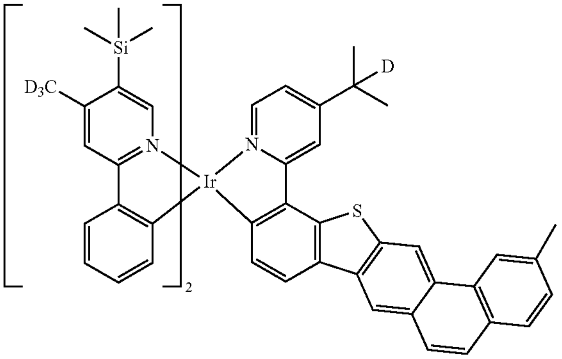
887
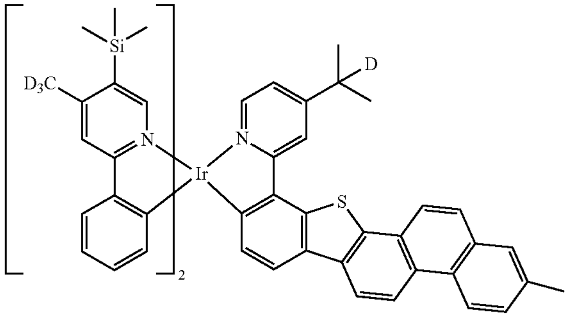
888
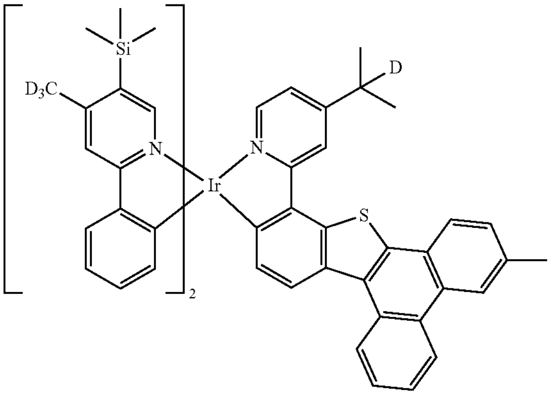
889
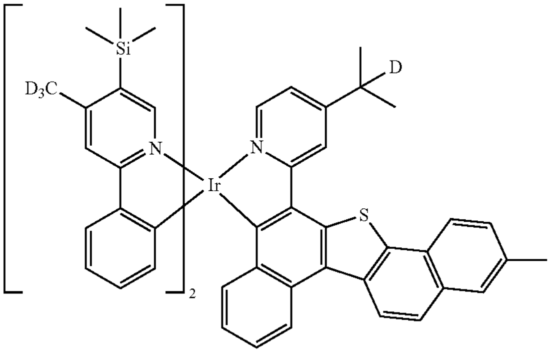

-continued
890
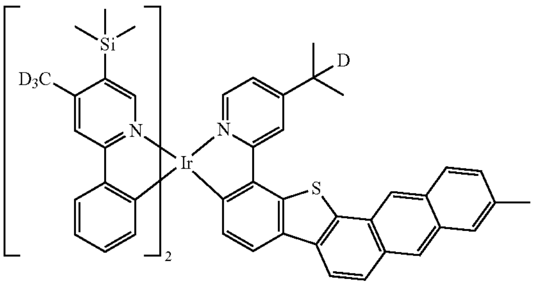
891
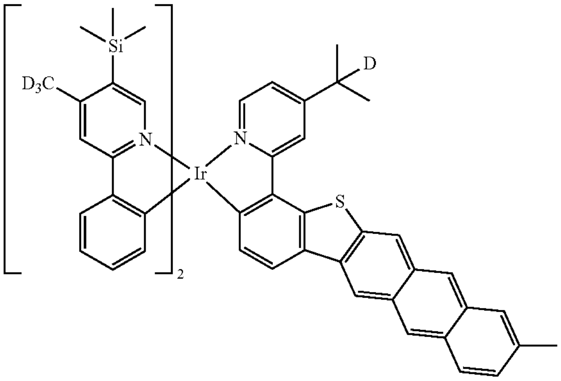
892
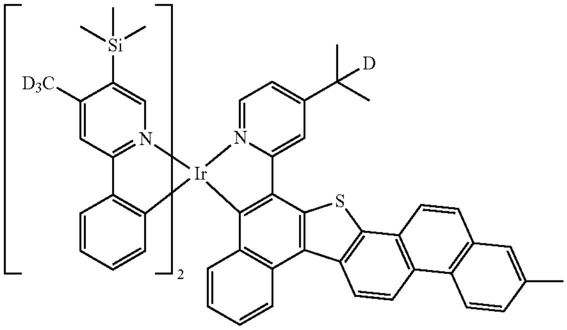
893
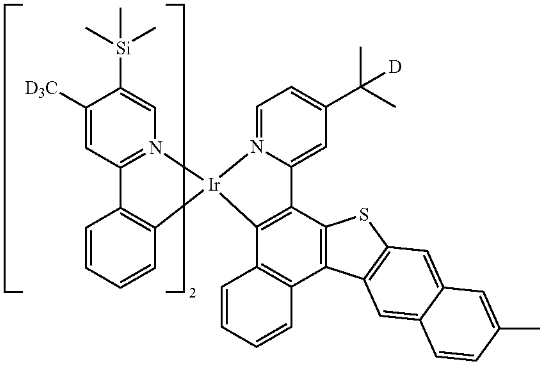
-continued
894
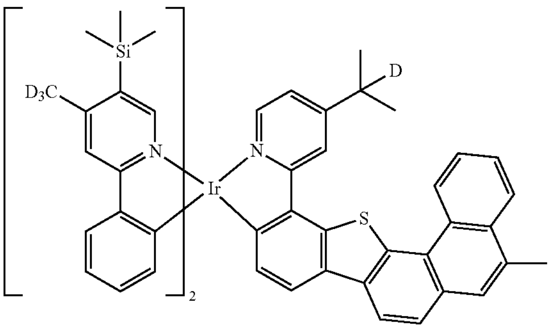
895
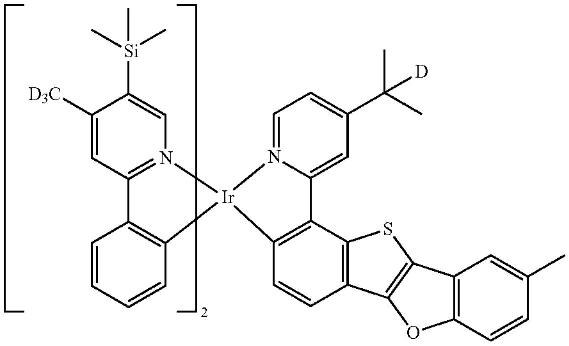
896
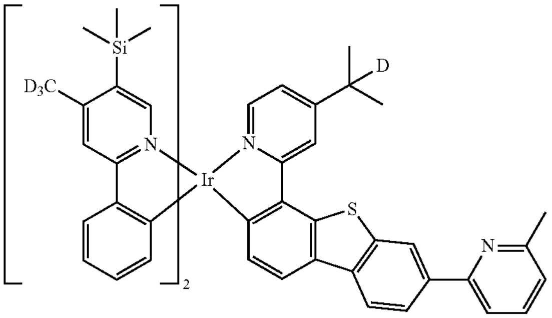
897
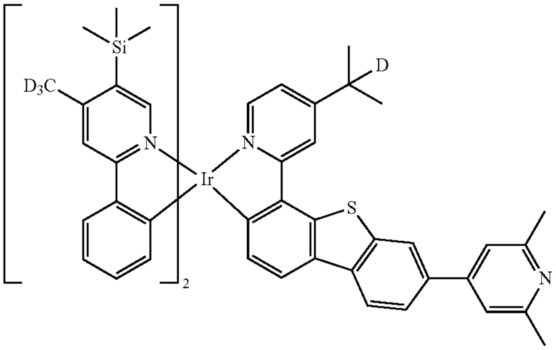

-continued
898
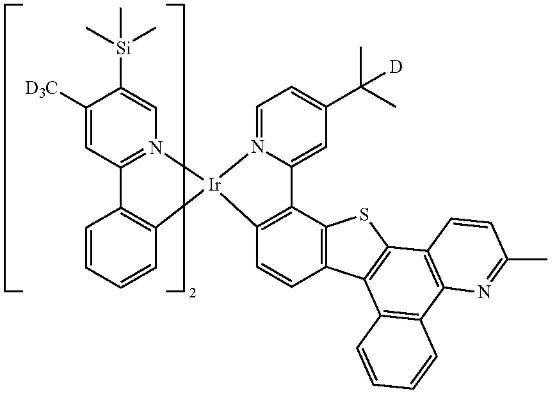
899
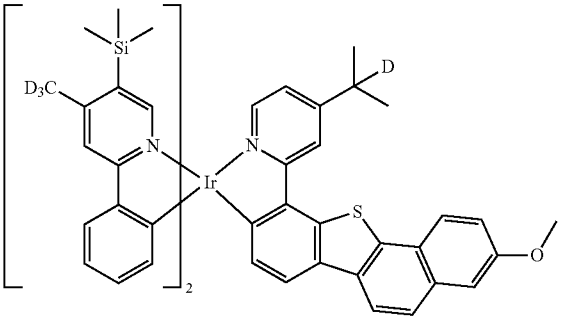
900
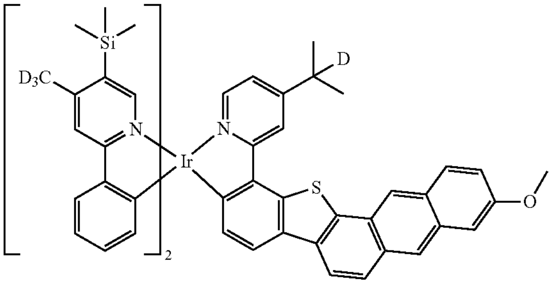
901
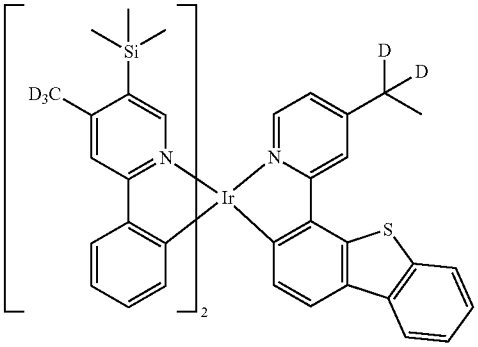
-continued
902
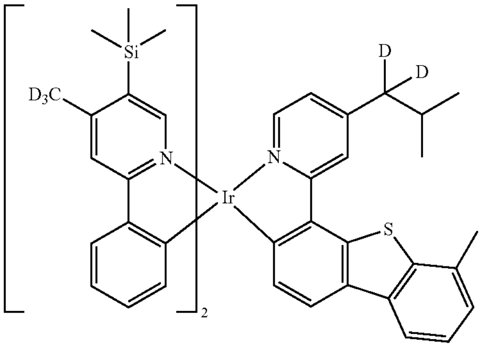
903
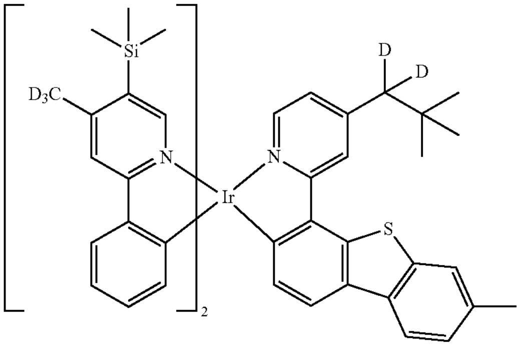
904
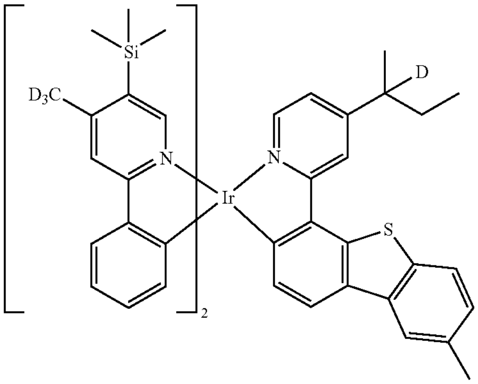
905
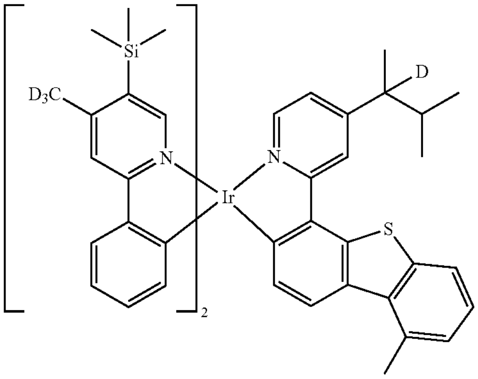

-continued
906
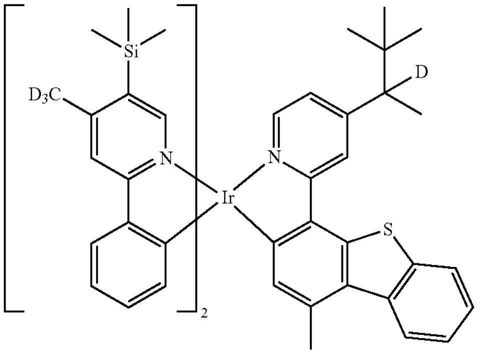
907
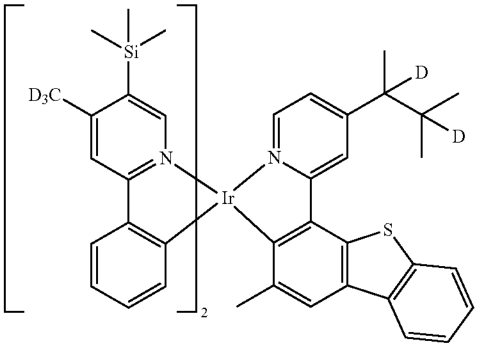
908
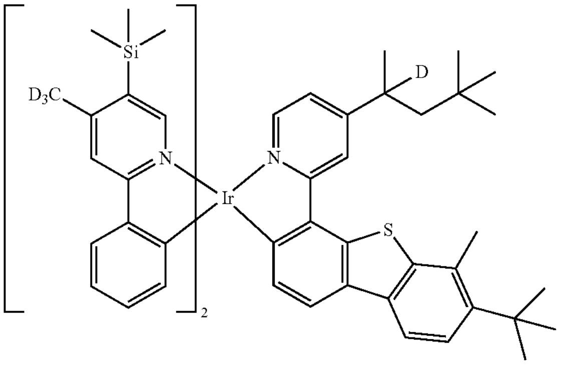
909
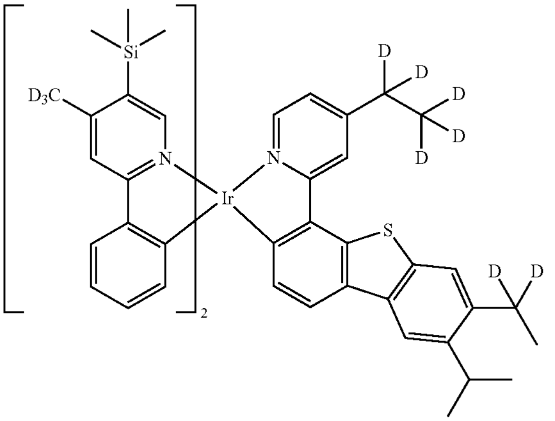
-continued
910
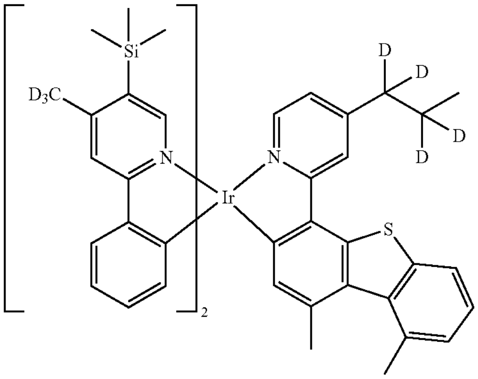
911
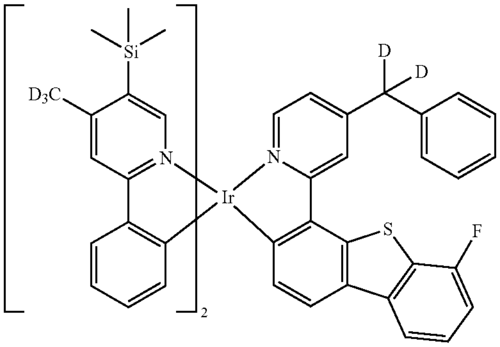
912
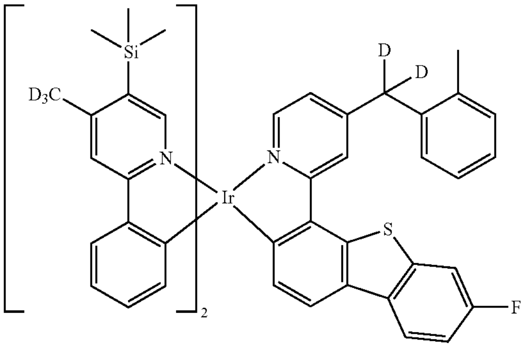
913
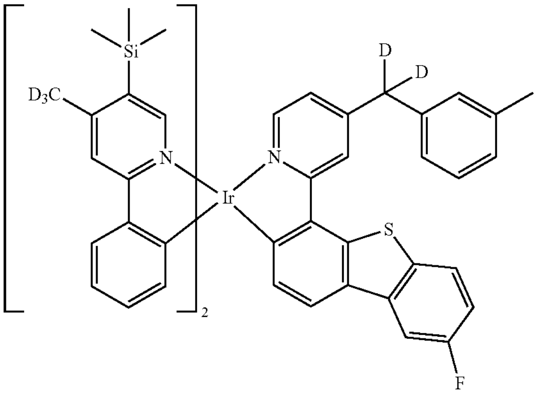

-continued
914
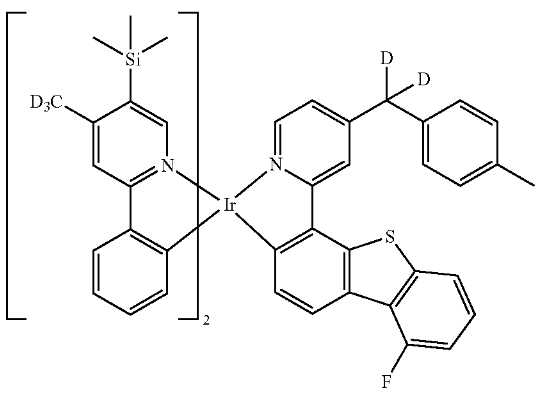
915
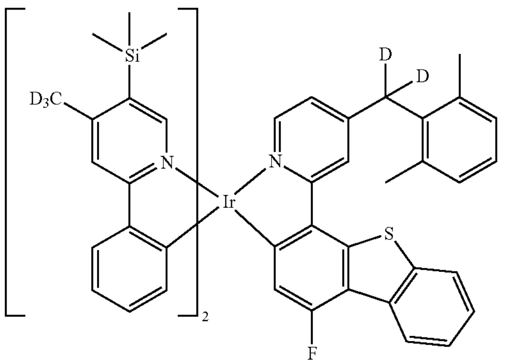
916
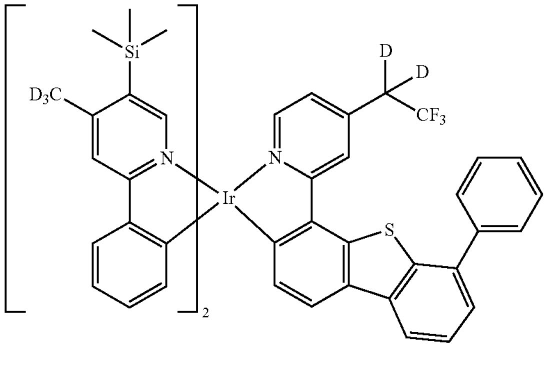
917
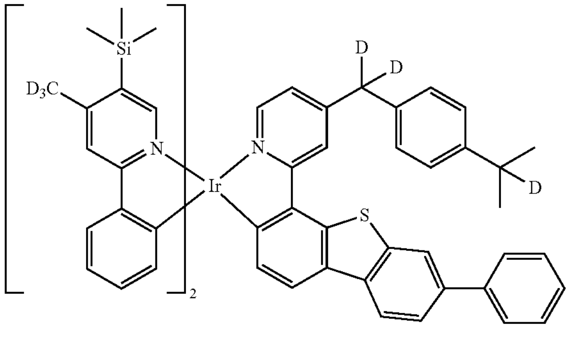
-continued
918
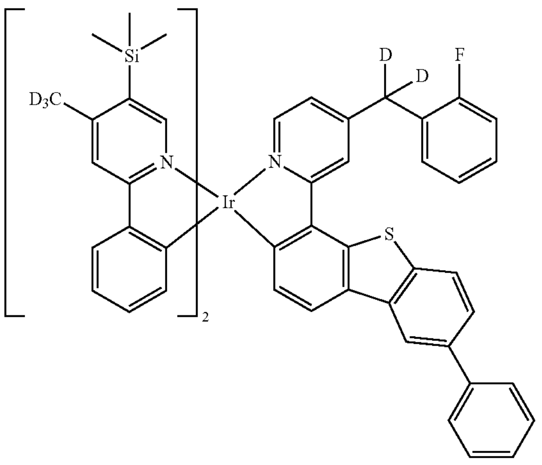
919
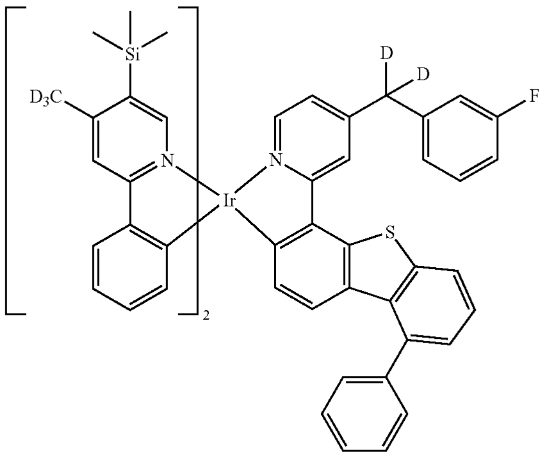
920
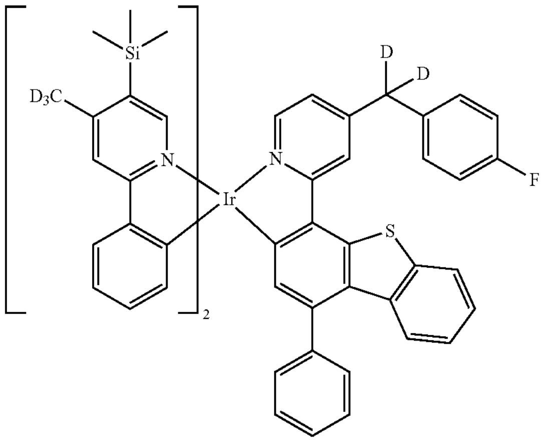

921
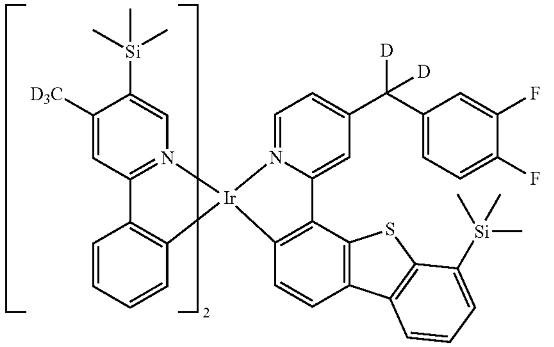
922
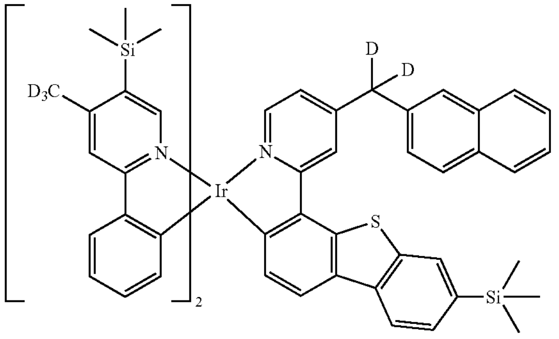
923
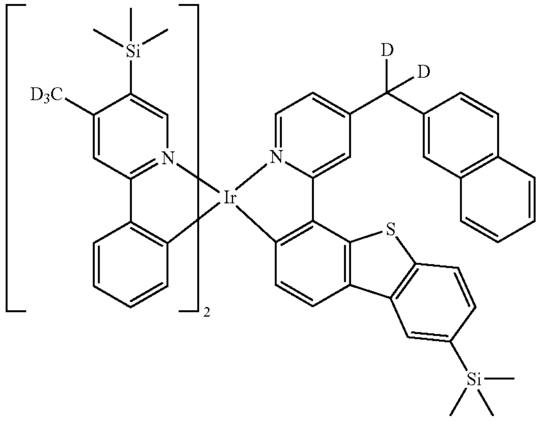
924
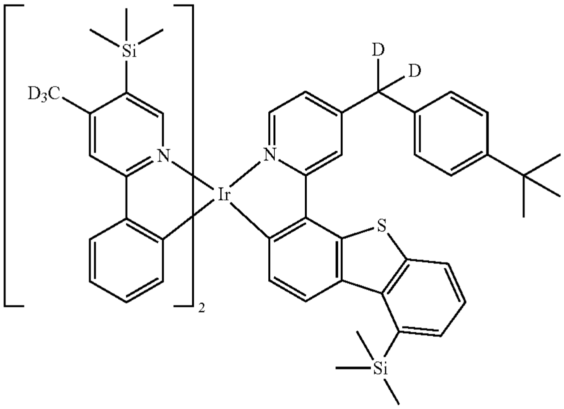
925
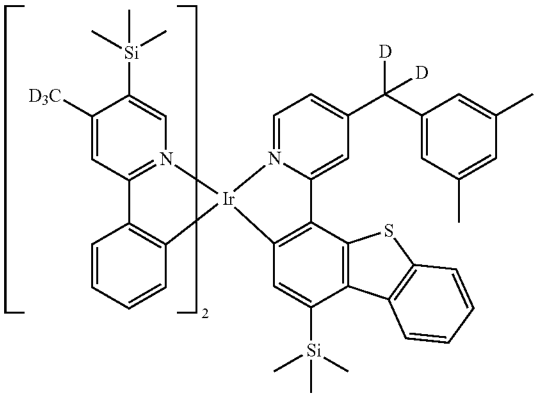
926
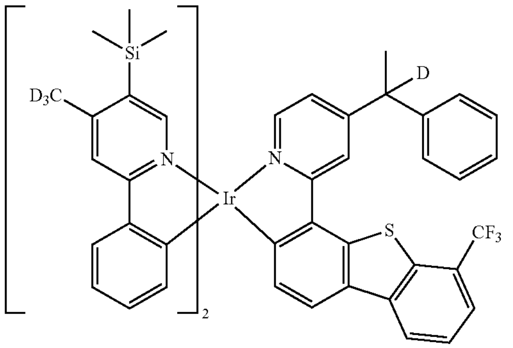
927
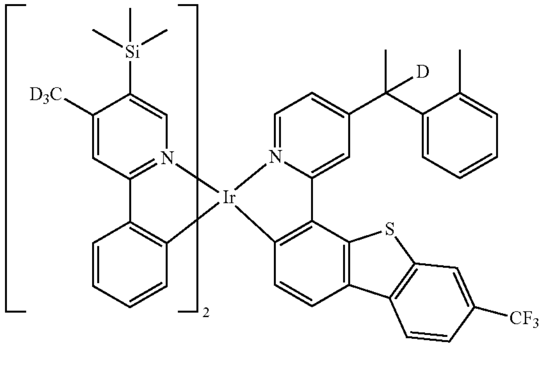
928
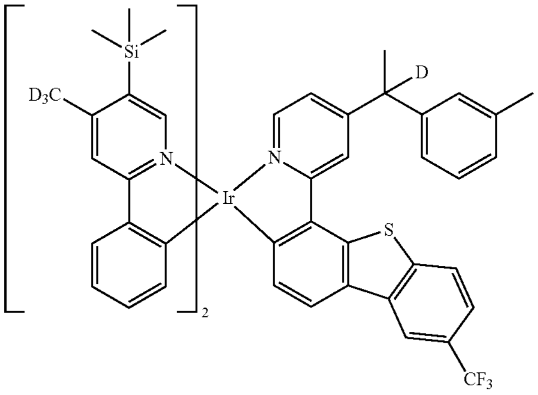

-continued
929
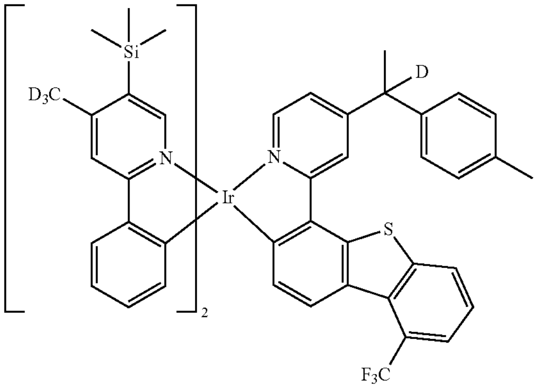
930
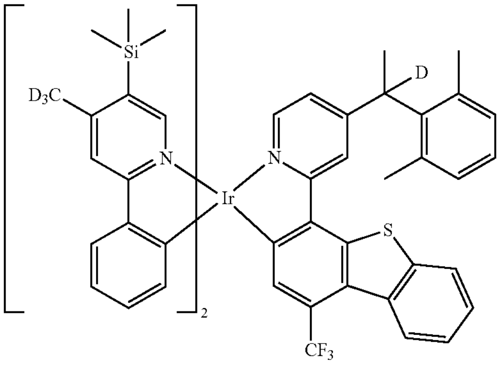
931
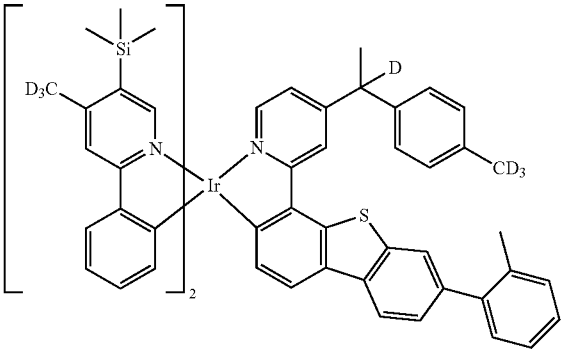
932
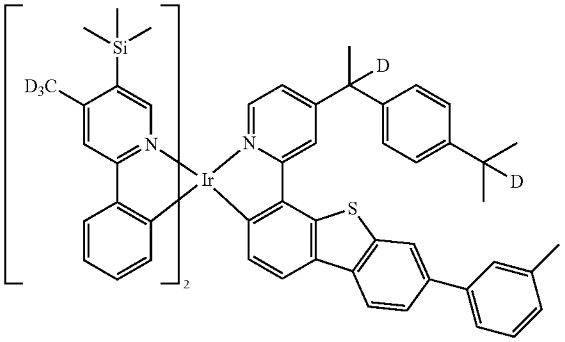
-continued
933
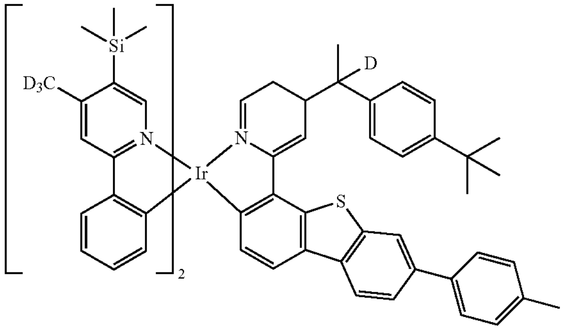
934
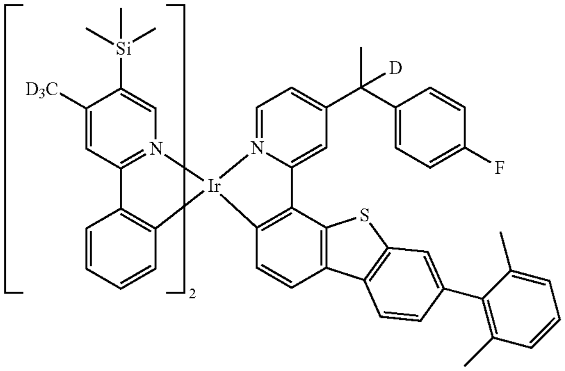
935
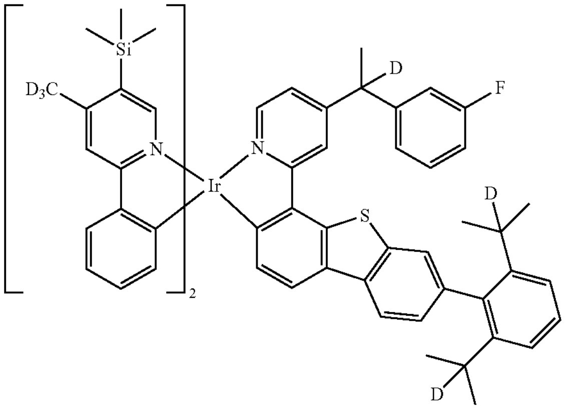
936
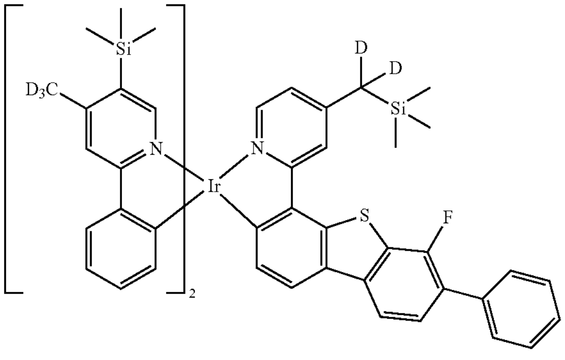

-continued
937
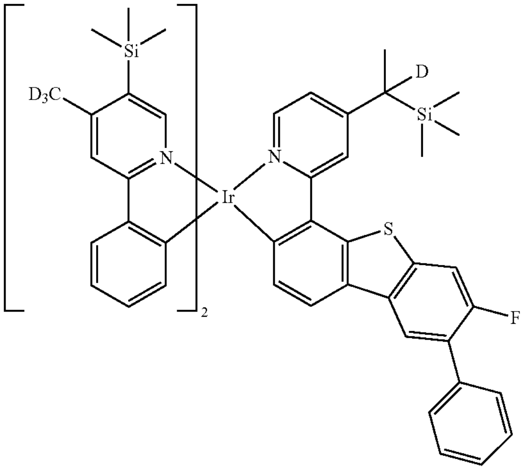
938
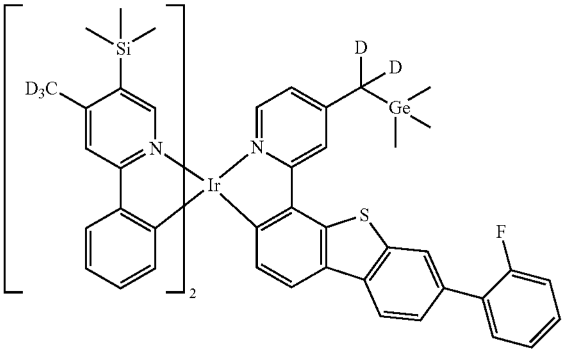
939
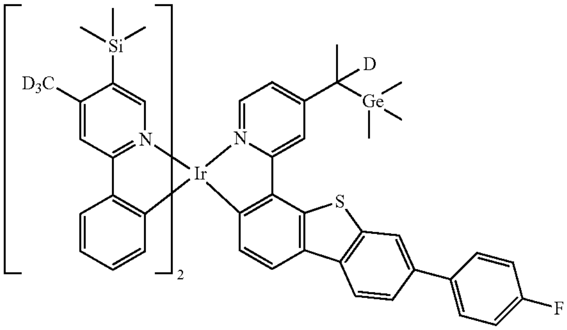
940
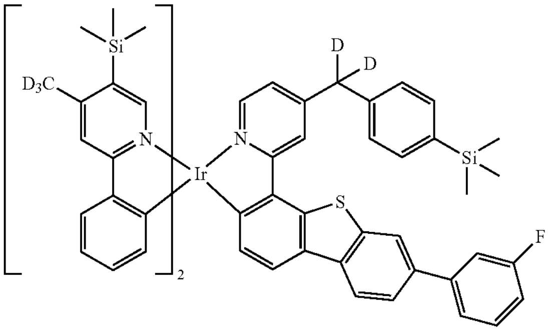
-continued
941
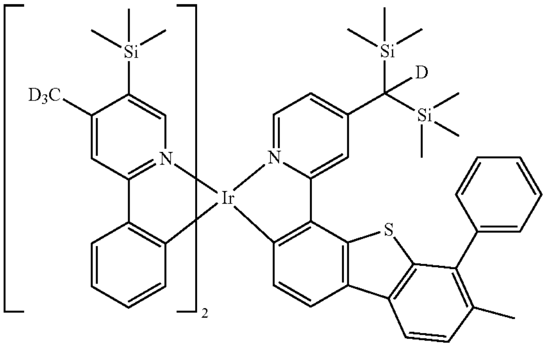
942
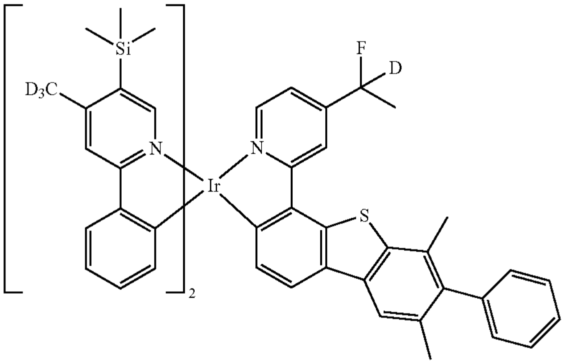
943
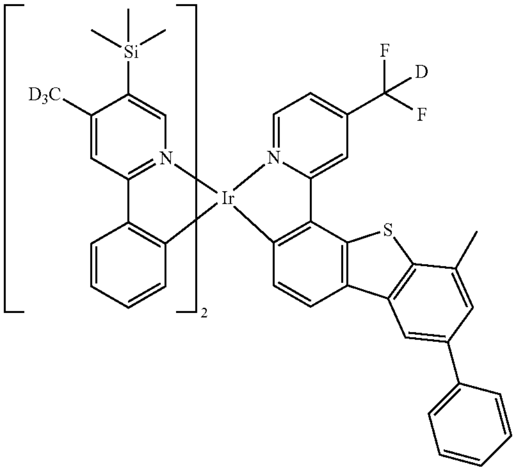

-continued
944
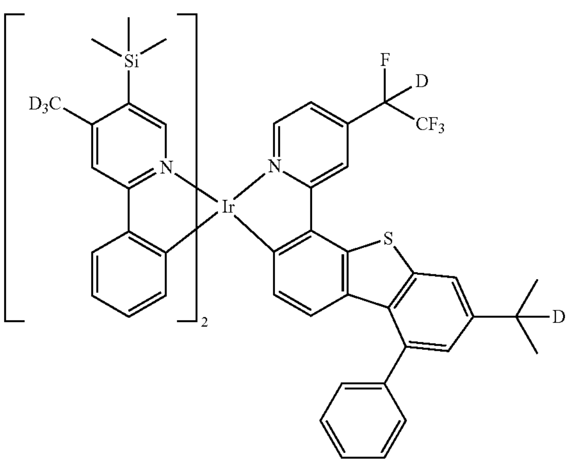
945
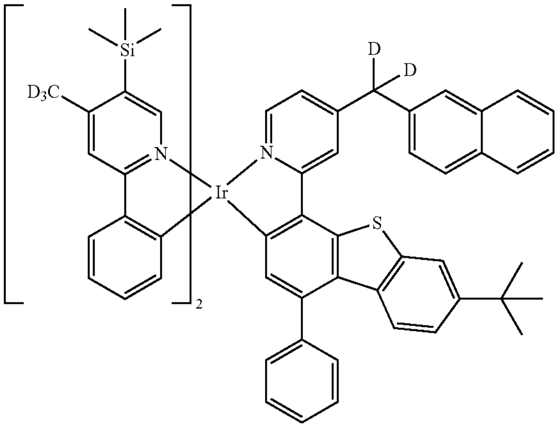
946
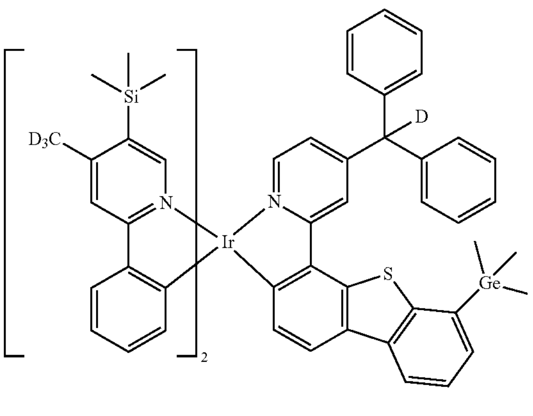
-continued
947
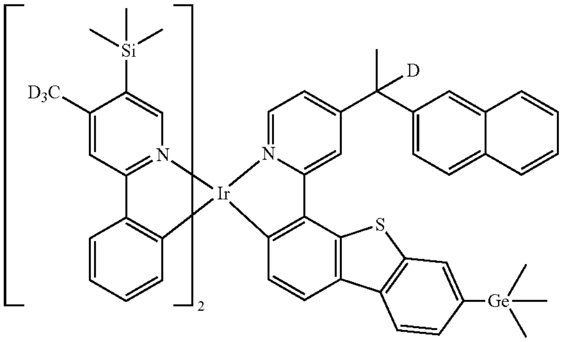
948
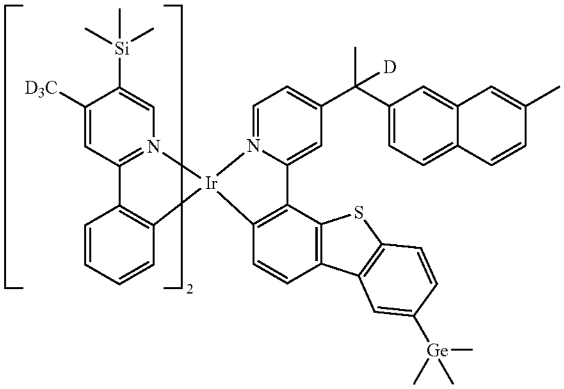
949
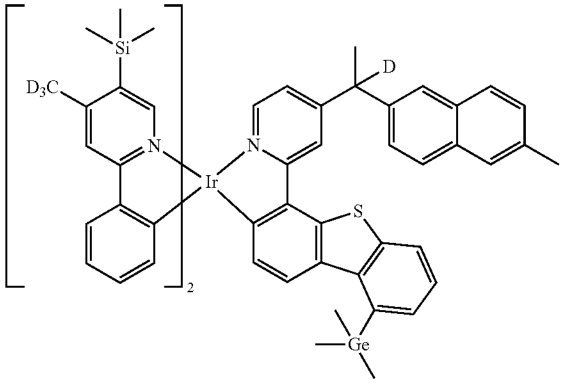
950
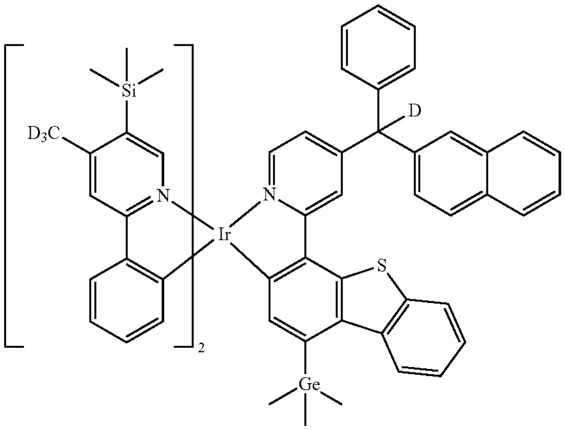

-continued
951
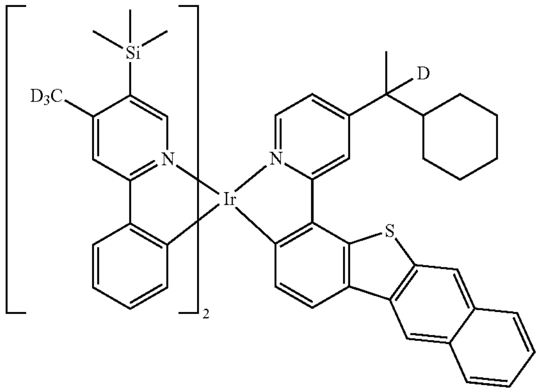
952
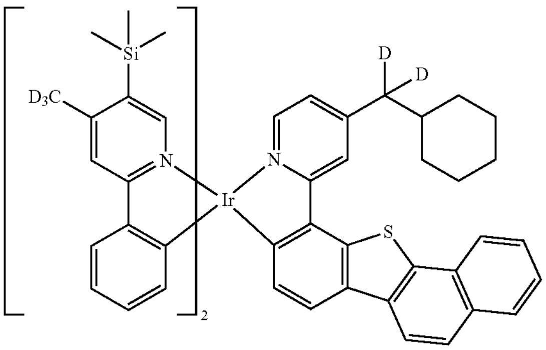
953
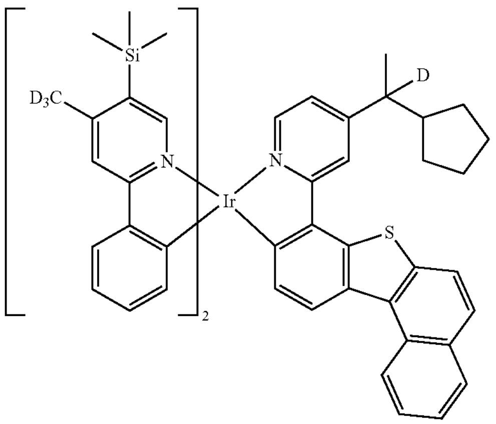
954
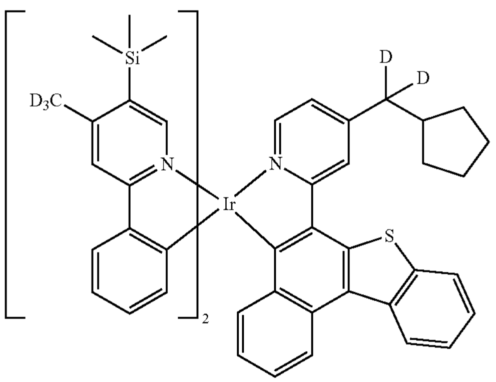
-continued
955
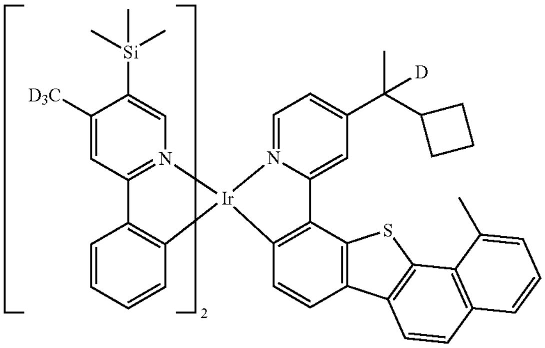
956
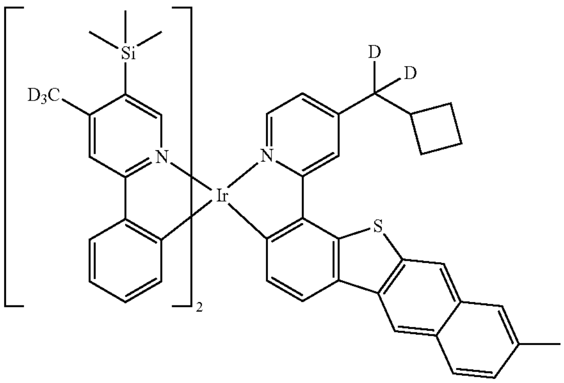
957
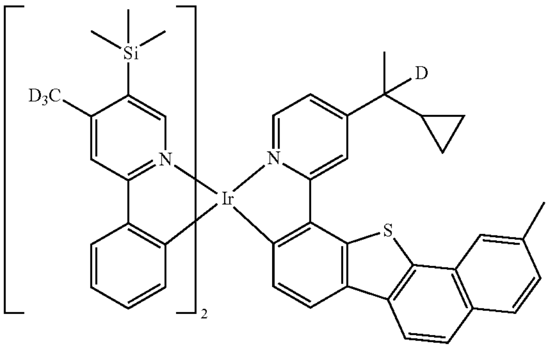
958
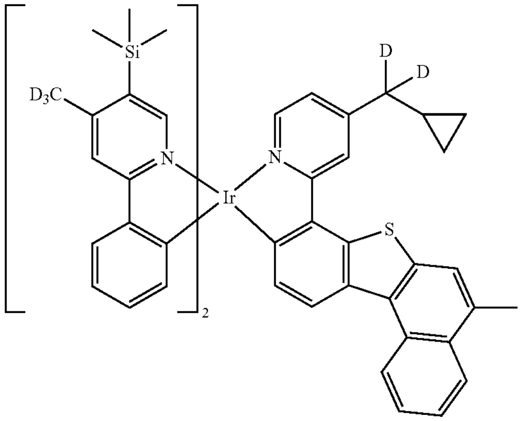

-continued
959
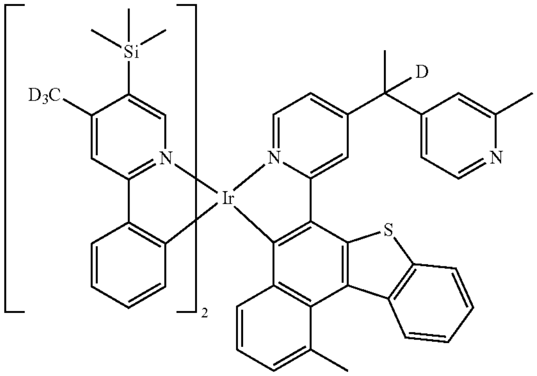
960
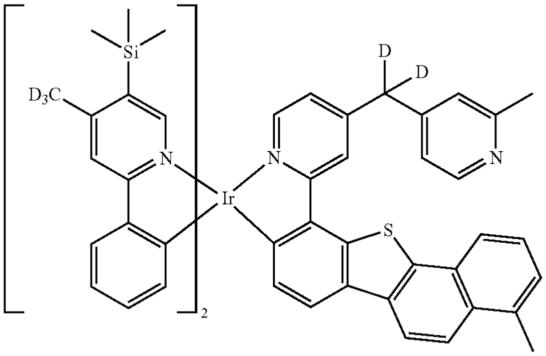
961
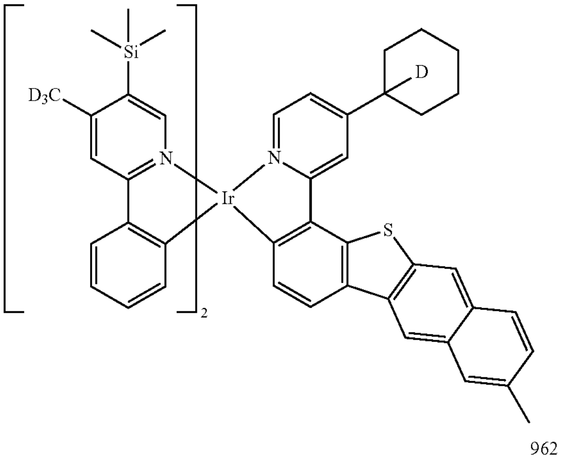
962
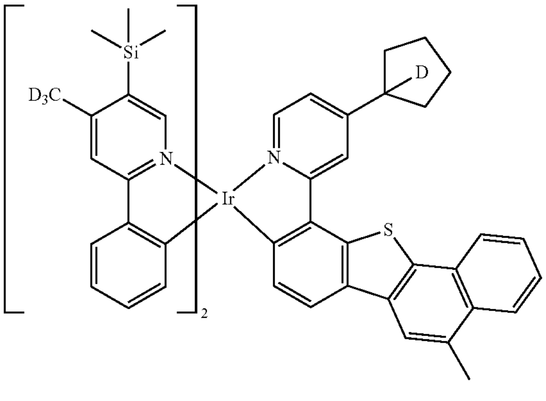
-continued
963
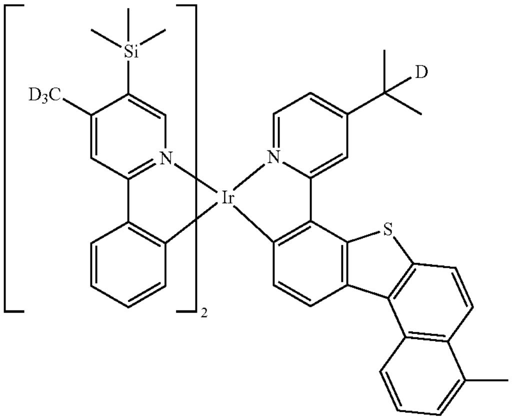
964
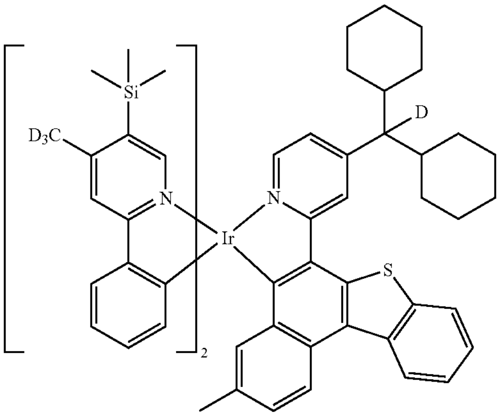
965
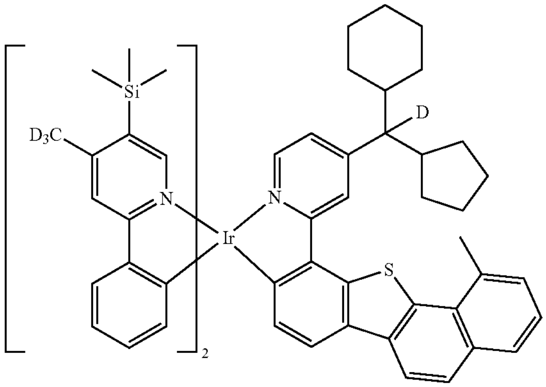
966
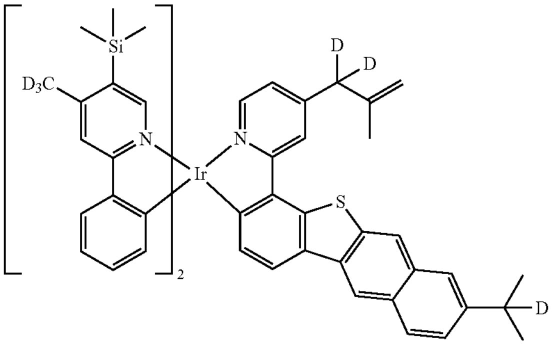

-continued
967
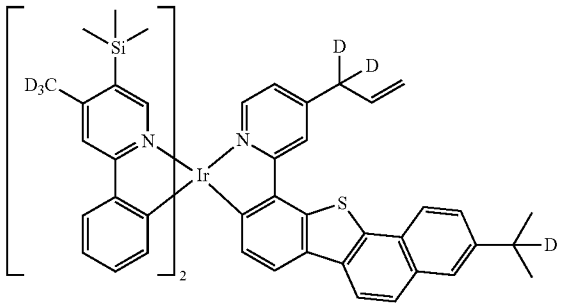
968
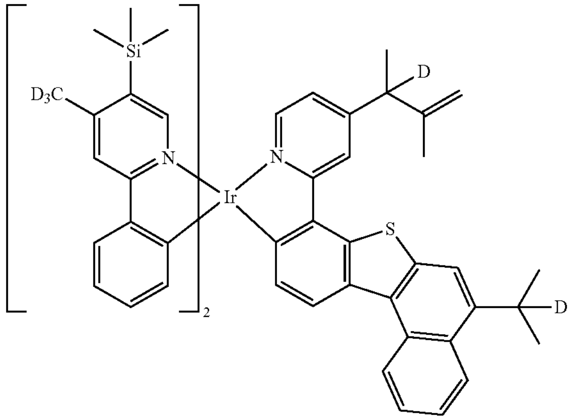
969
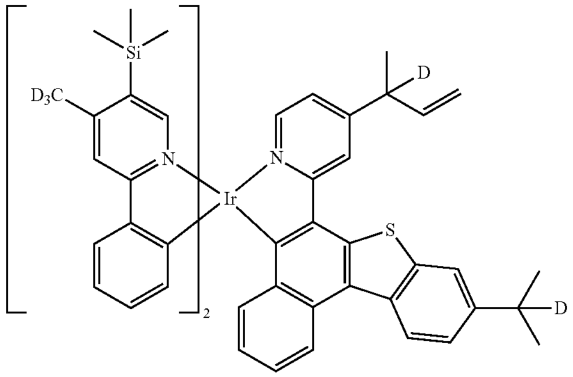
970
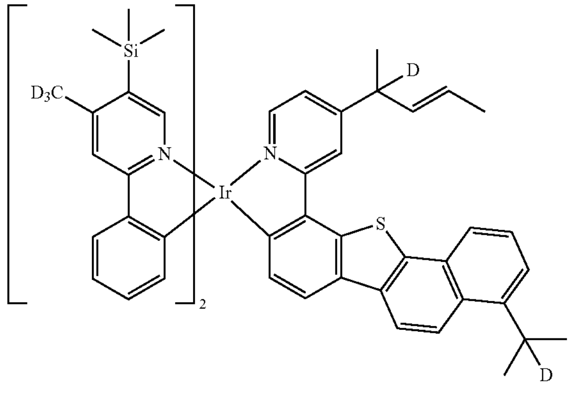
-continued
971
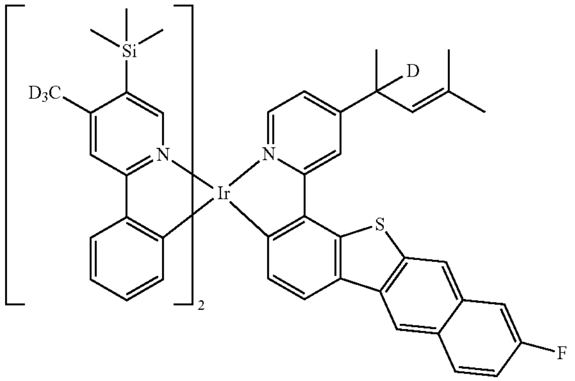
972
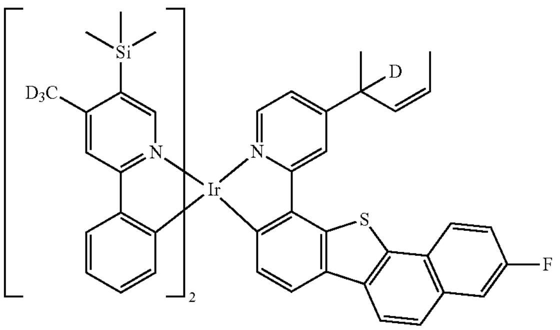
973
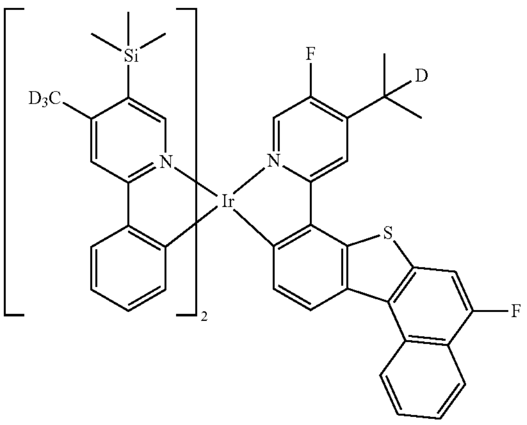
974
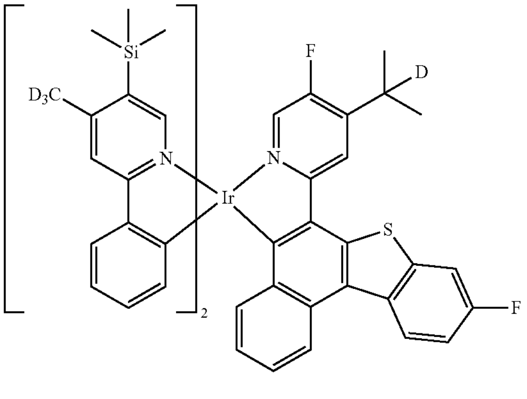

975
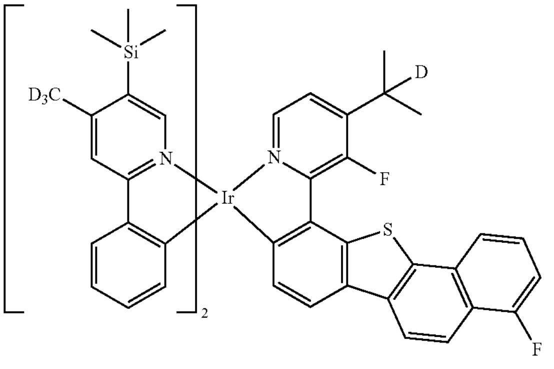
976
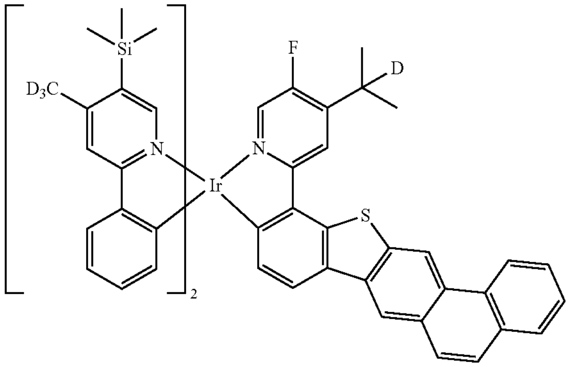
977
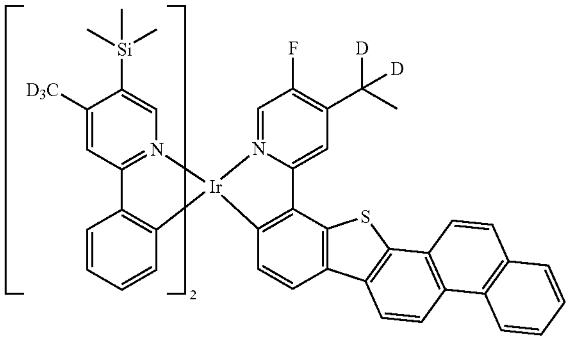
978
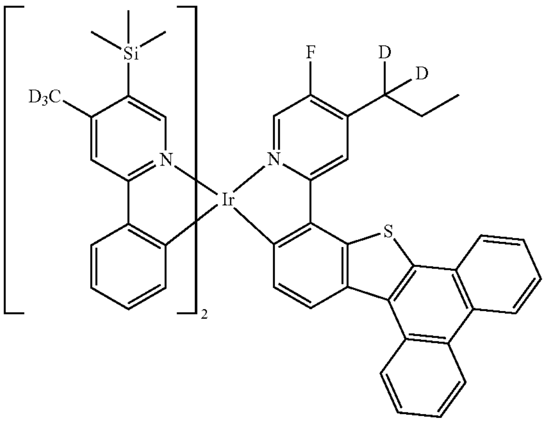
979
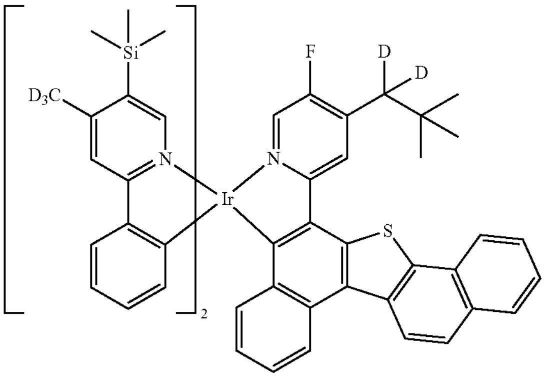
980
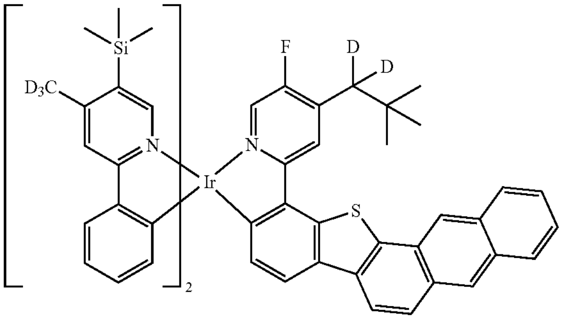
981
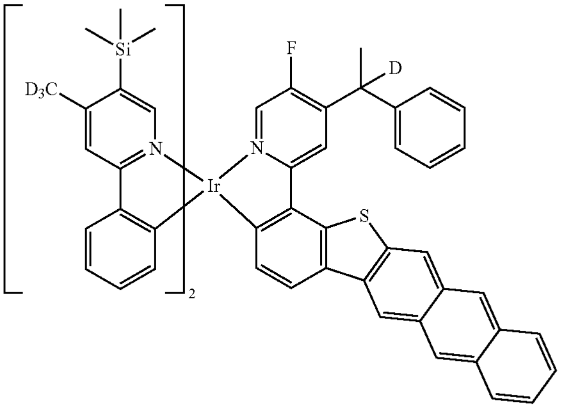
982
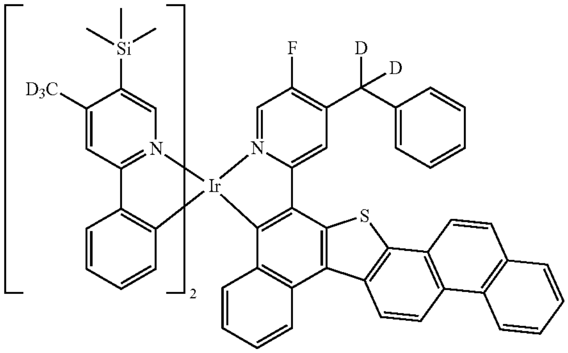

-continued
983
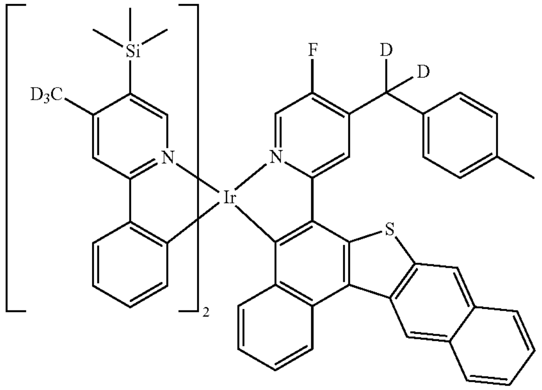
984
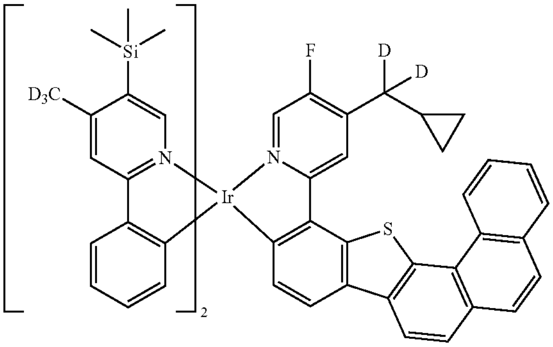
985
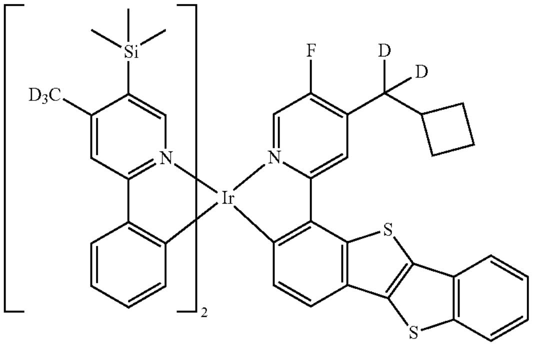
986
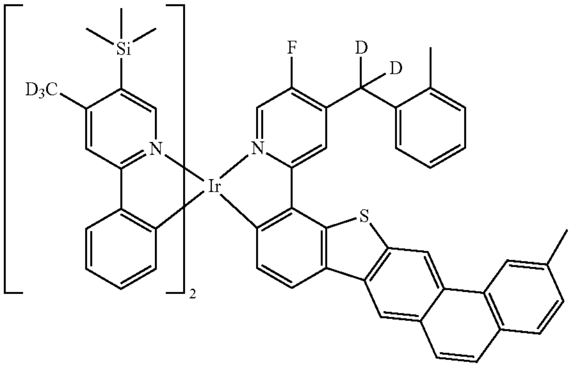
-continued
987
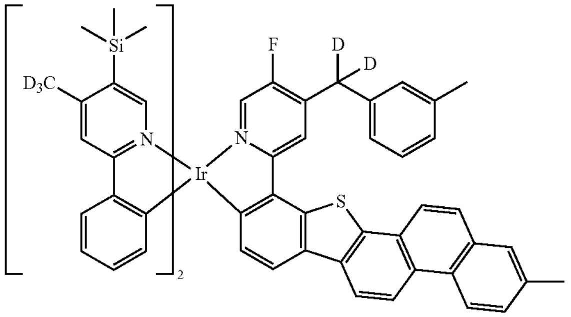
988
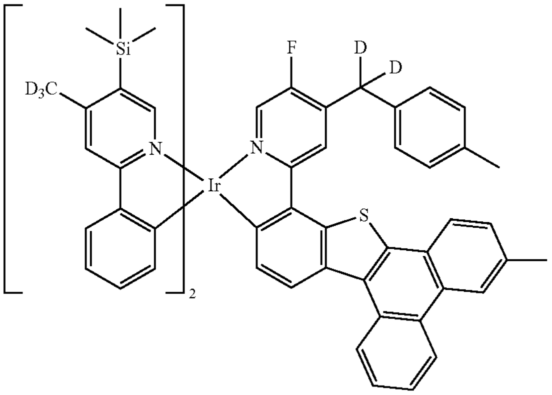
989
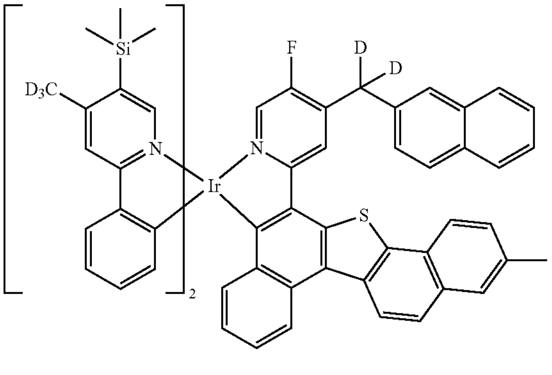
990
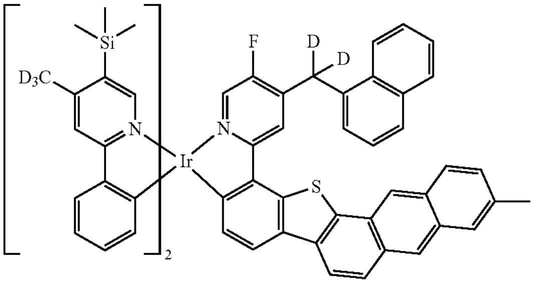

-continued
991
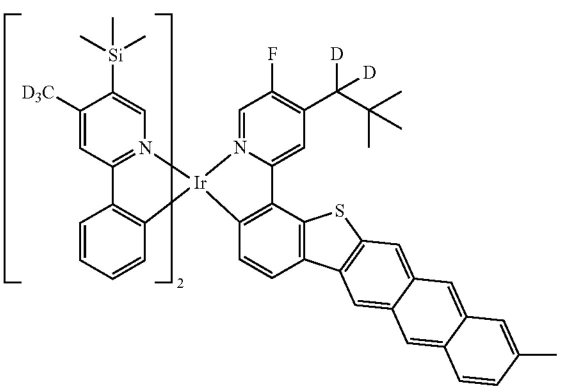
992
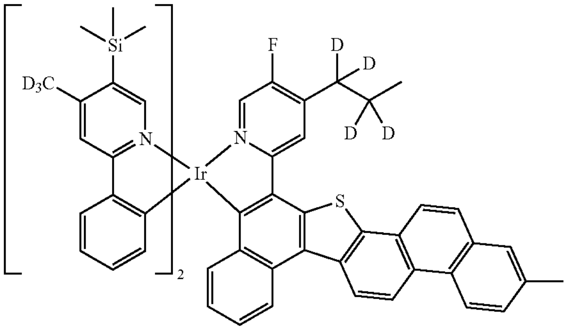
993
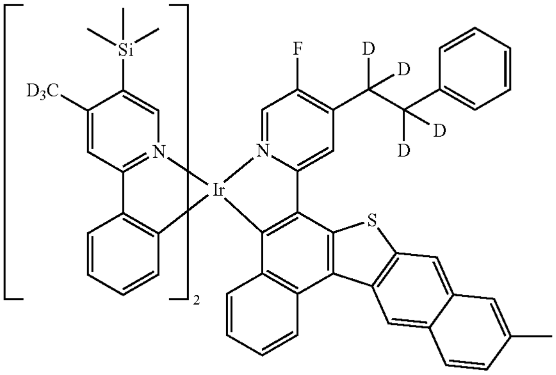
994
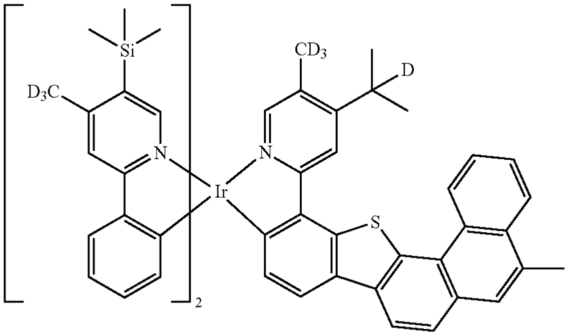
-continued
995
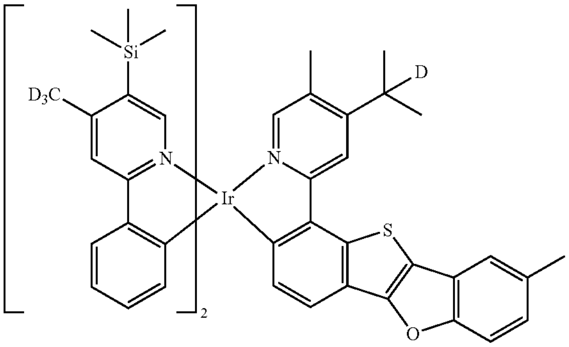
996
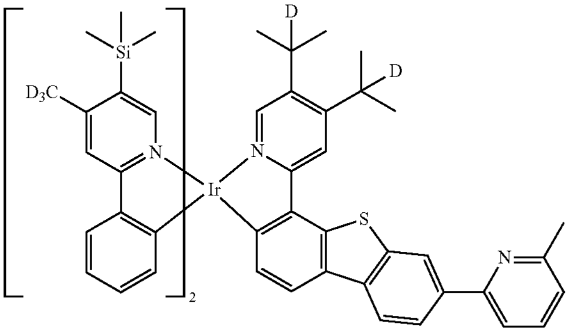
997
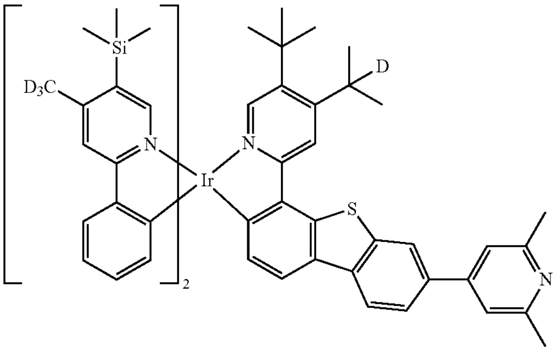
998
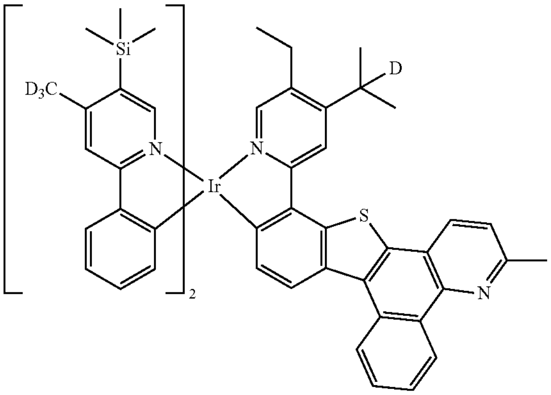

-continued
999
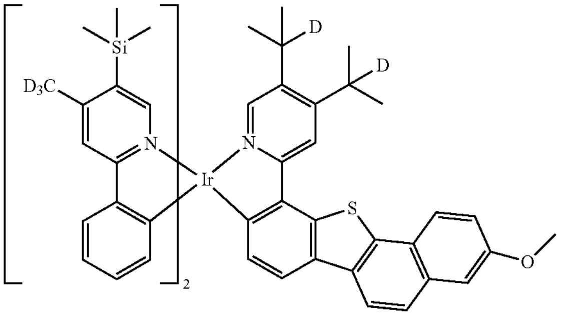
1000
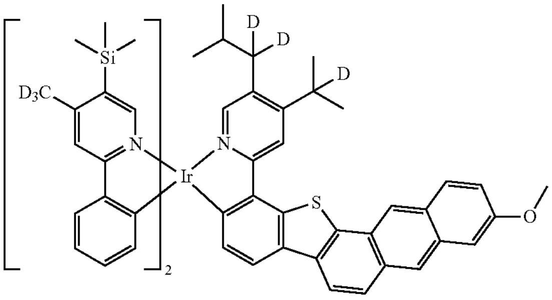
1001
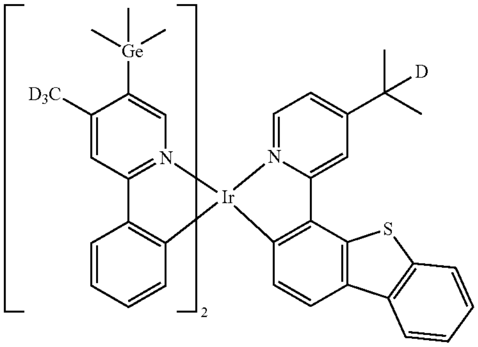
1002
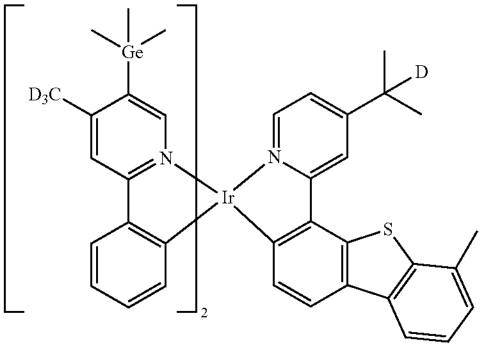
-continued
1003
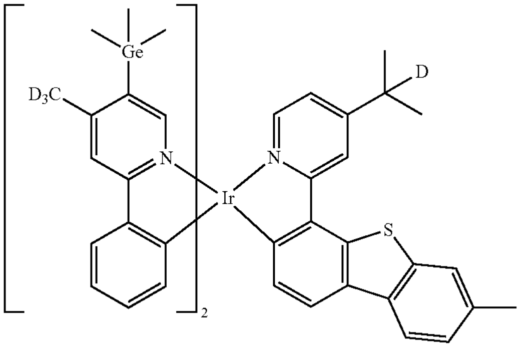
1004
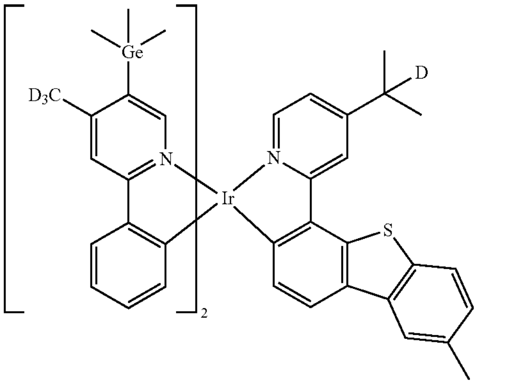
1005
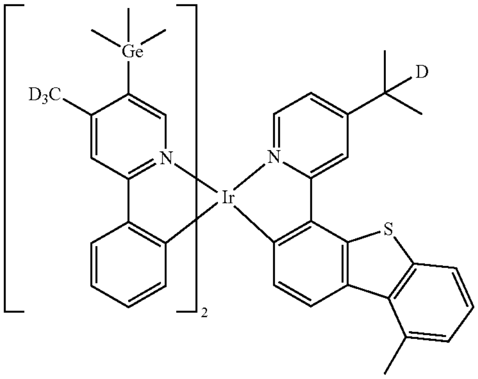
1006
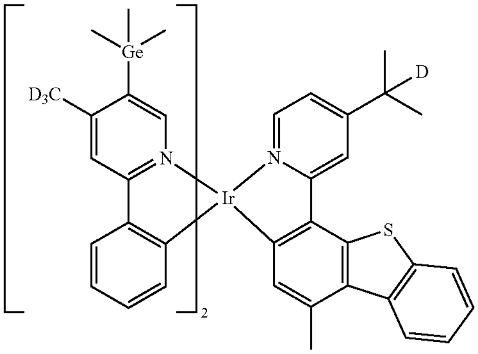

-continued
1007
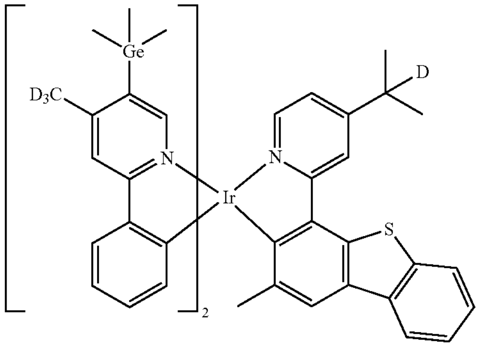
1008
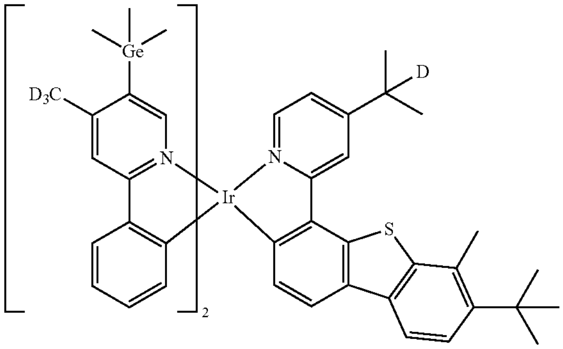
1009
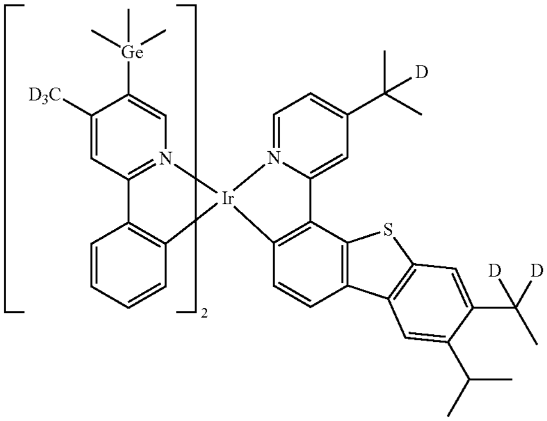
1010
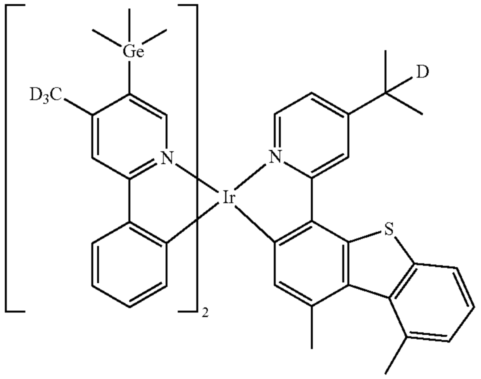
-continued
1011
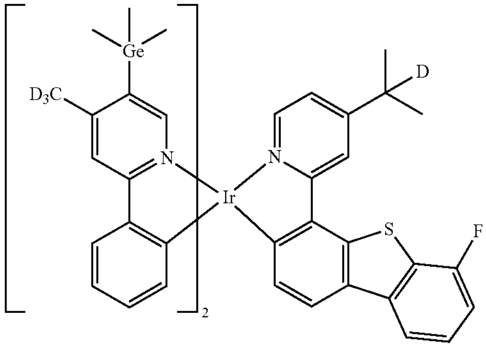
1012
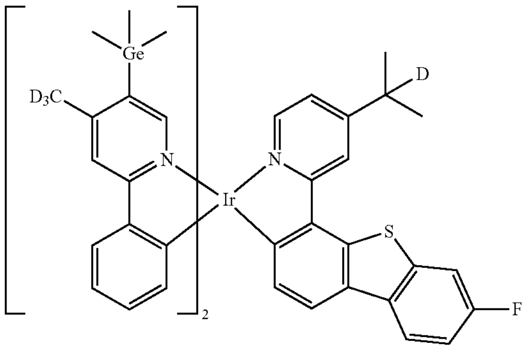
1013
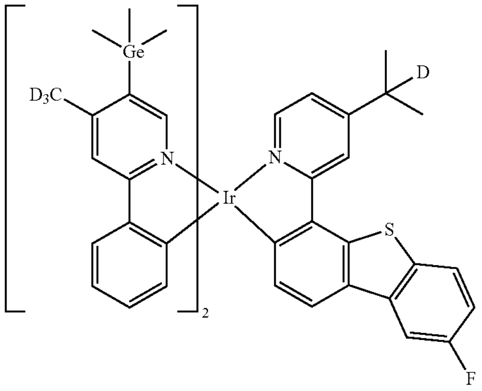
1014
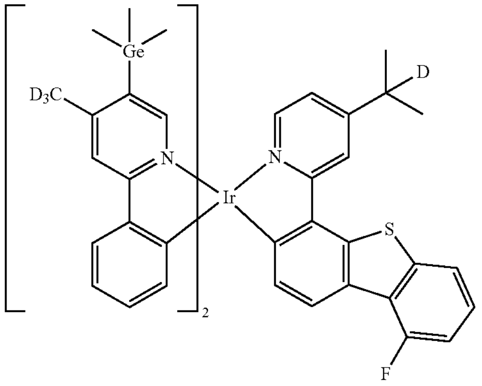

-continued
1015
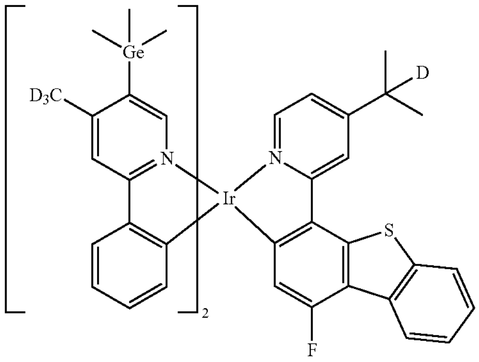
1016
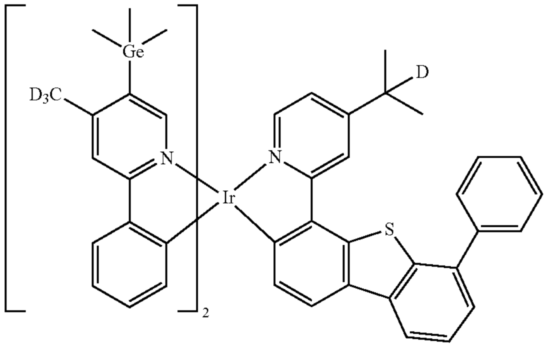
1017
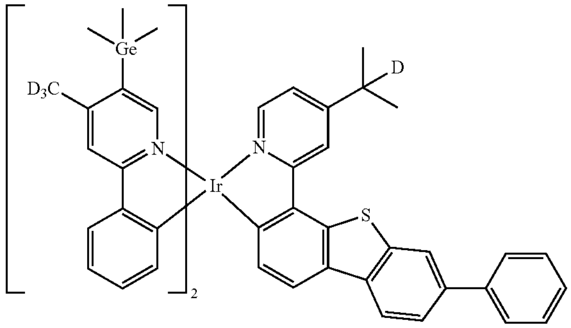
1018
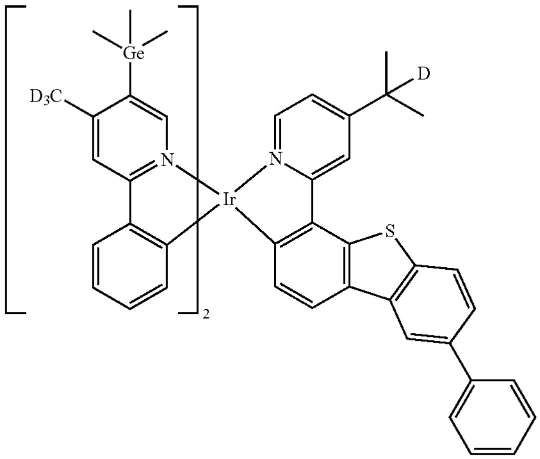
-continued
1019
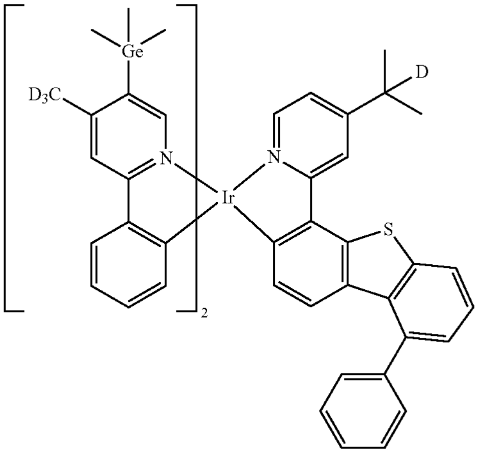
1020
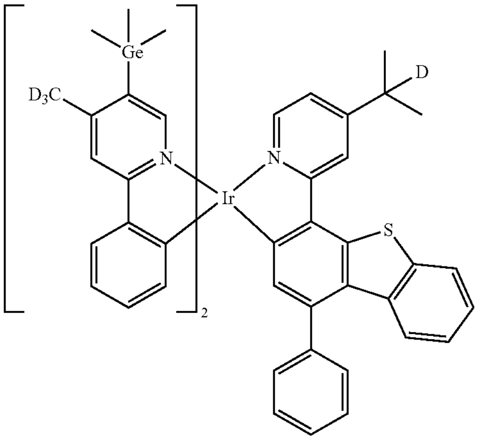
1021
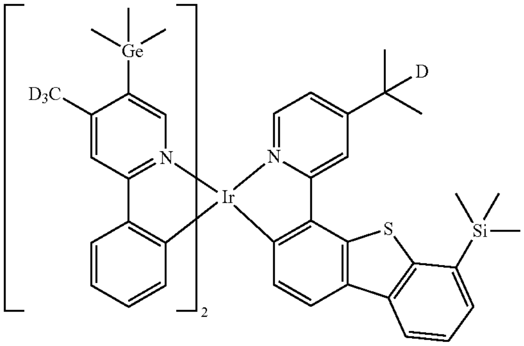
1022
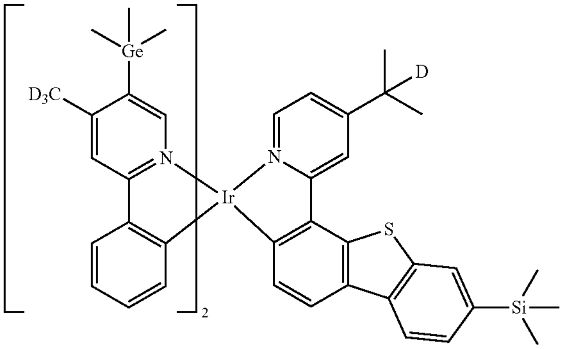

-continued
1023
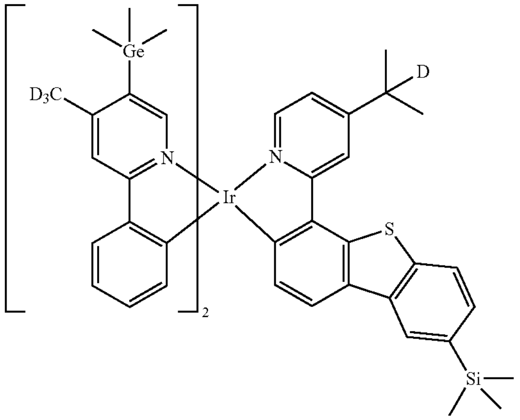
1024
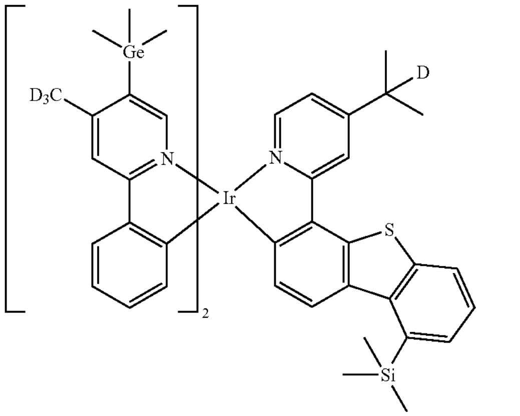
1025
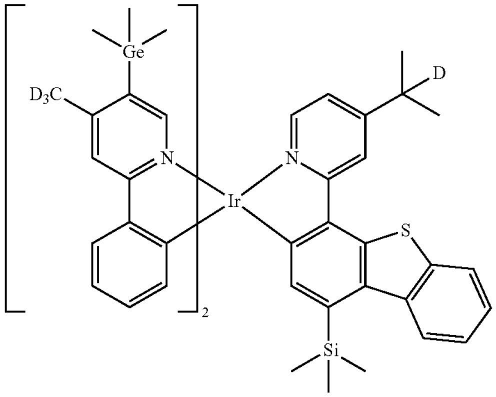
-continued
1026
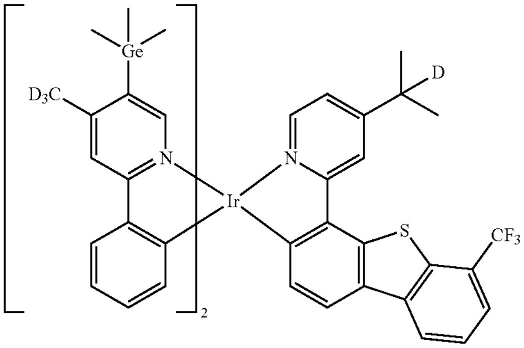
1027
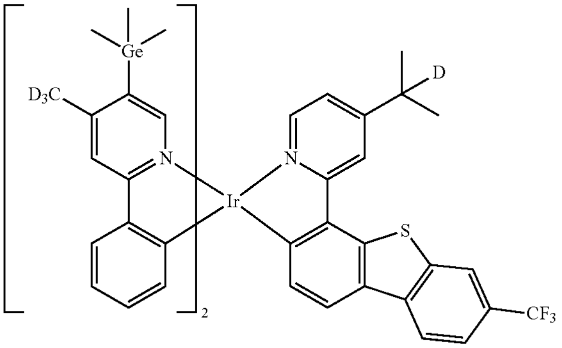
1028
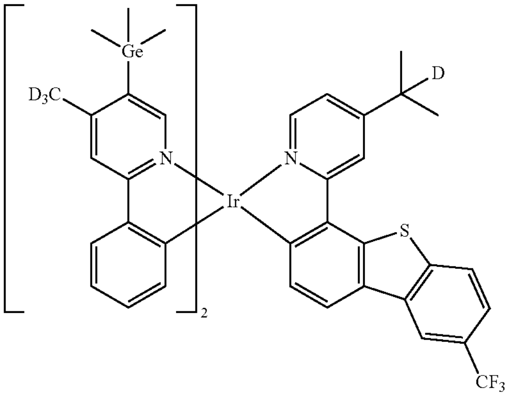
1029
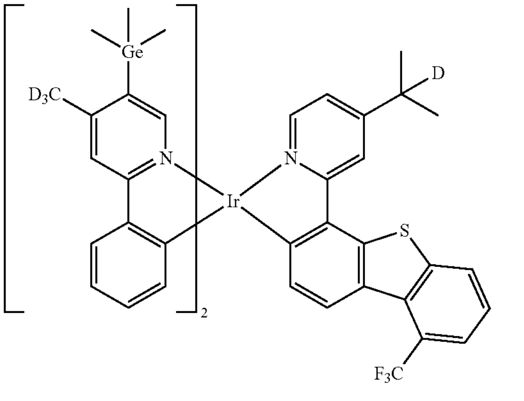

-continued
1030
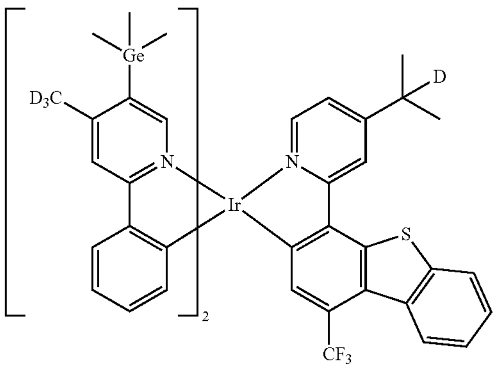
1031
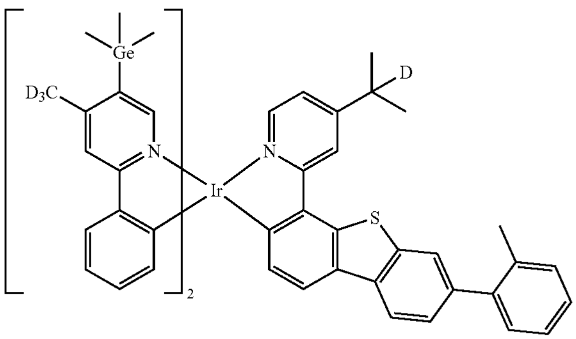
1032
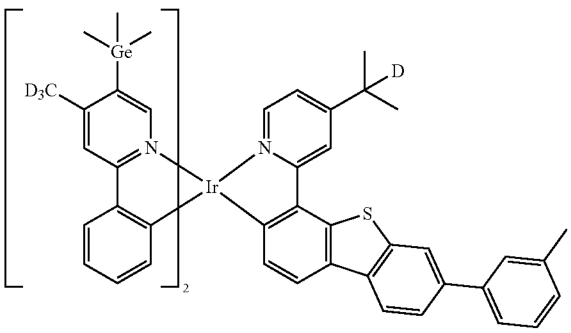
1033
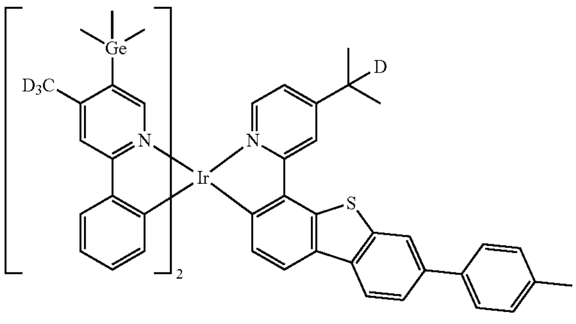
-continued
1034
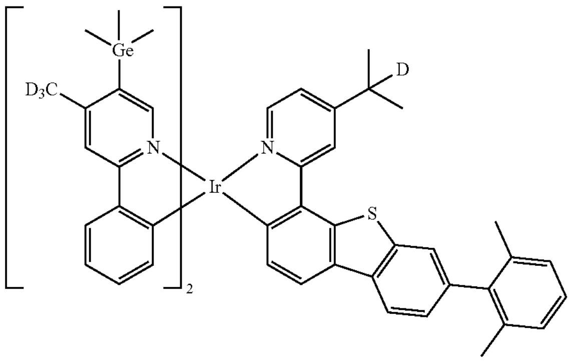
1035
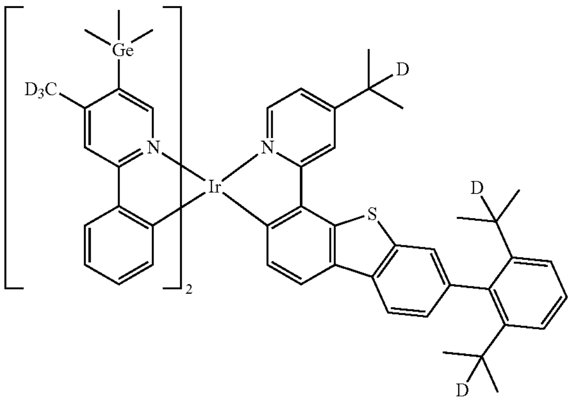
1036
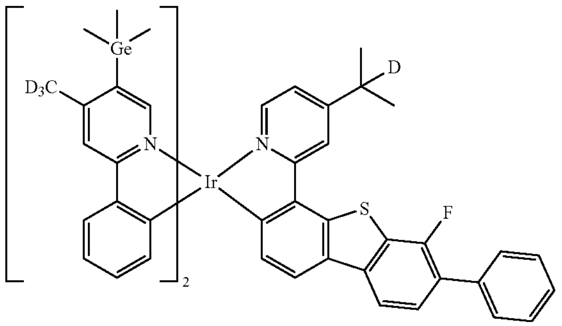
1037
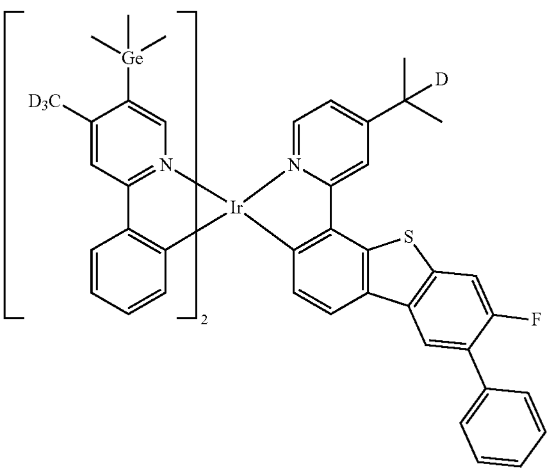

-continued
1038
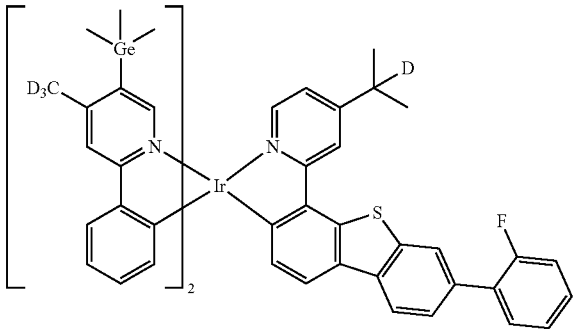
1039
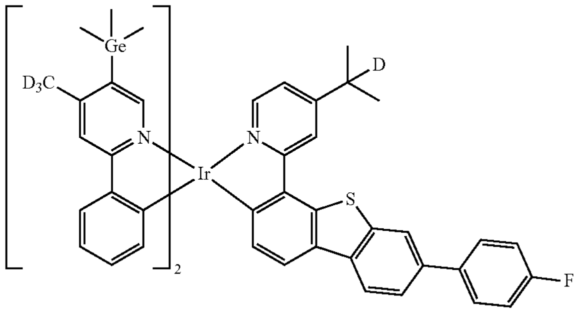
1040
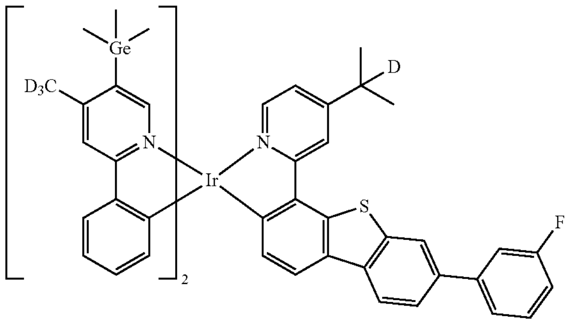
1041
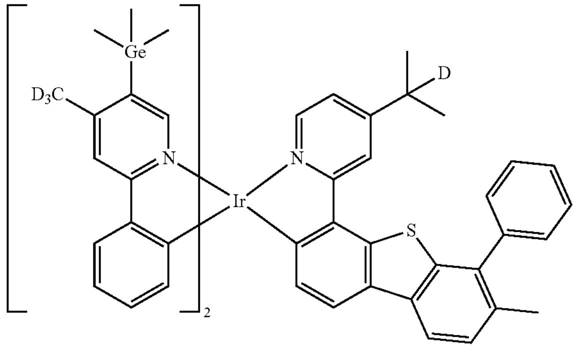
-continued
1042
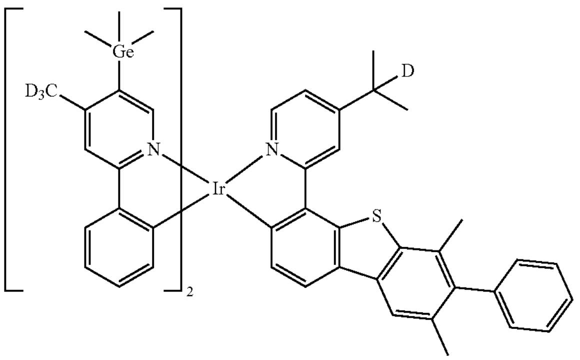
1043
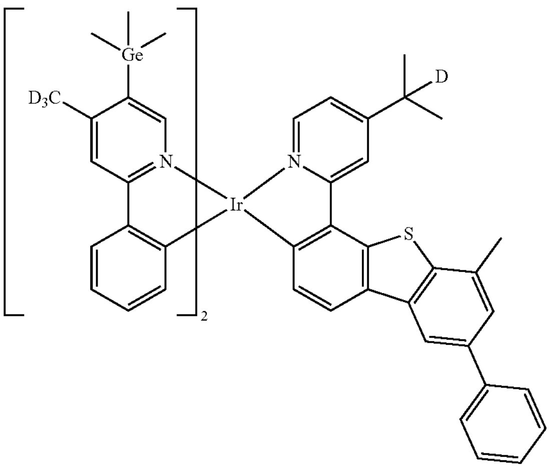
1044
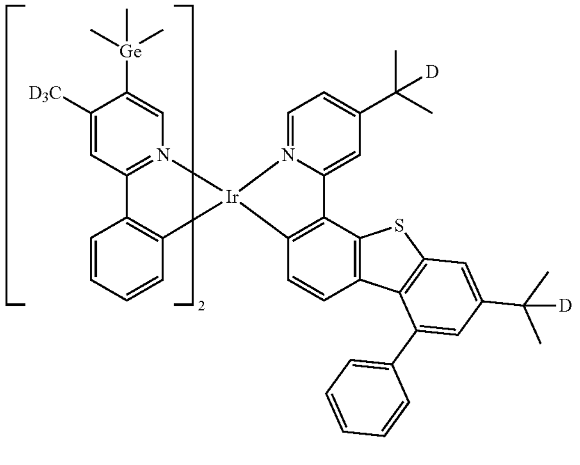

-continued
1045
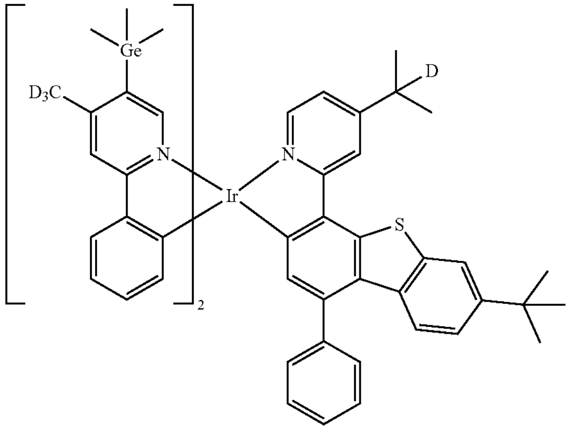
1046
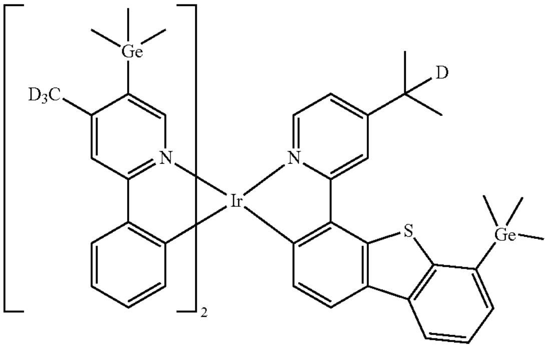
1047
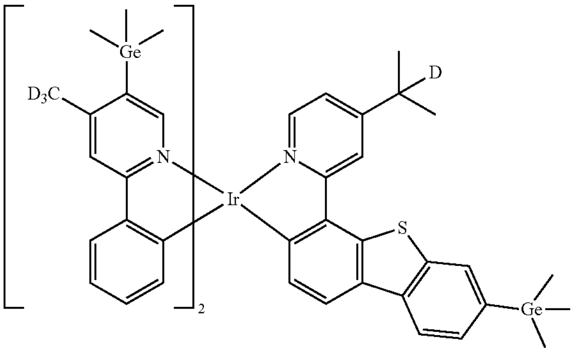
1048
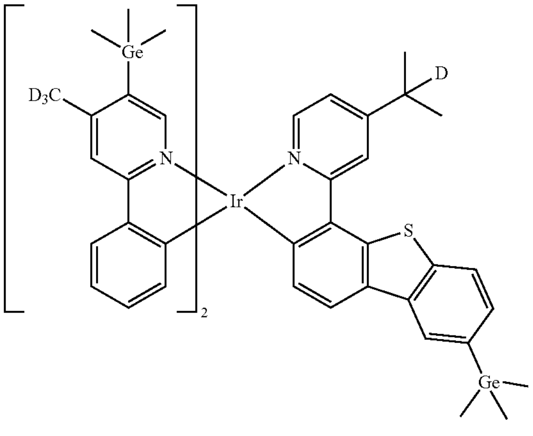
-continued
1049
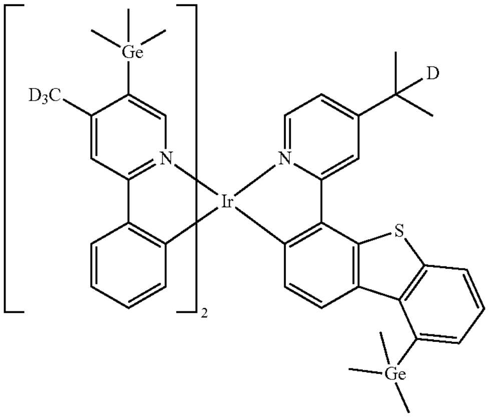
1050
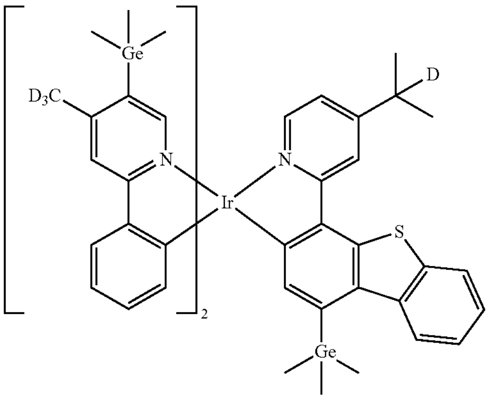
1051
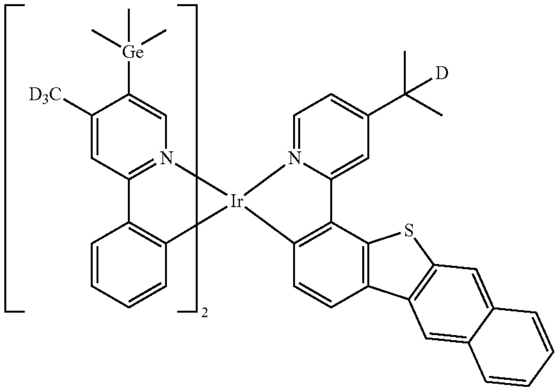
1052
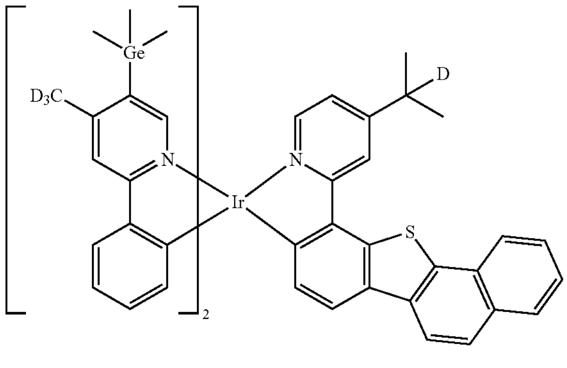

1053
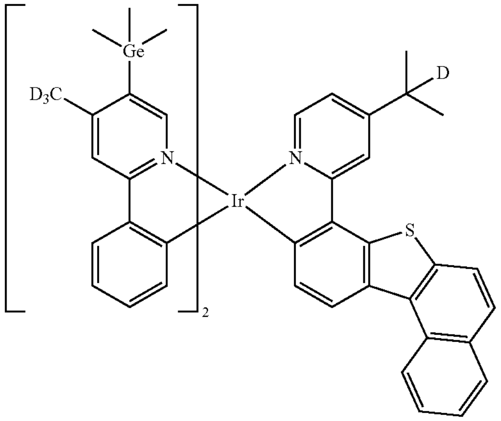
1054
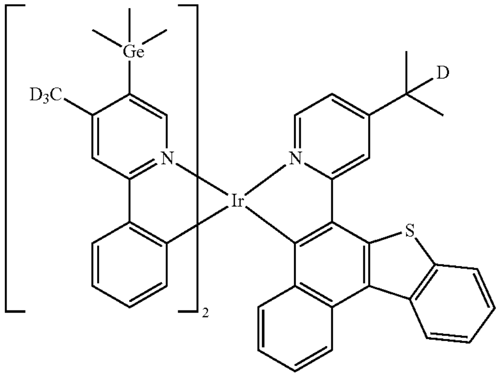
1055
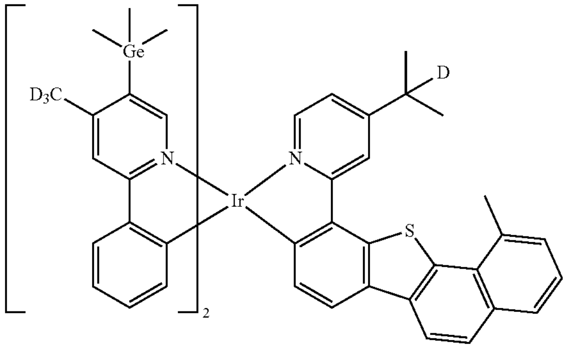
1056
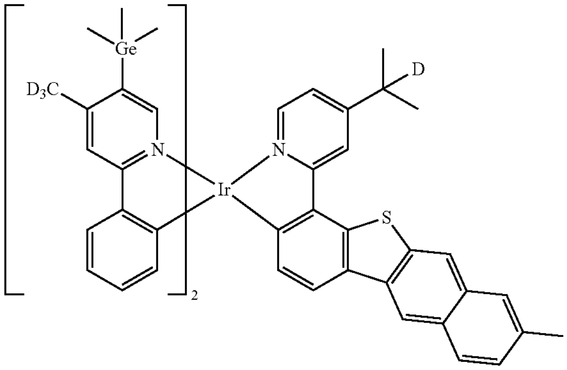
1057
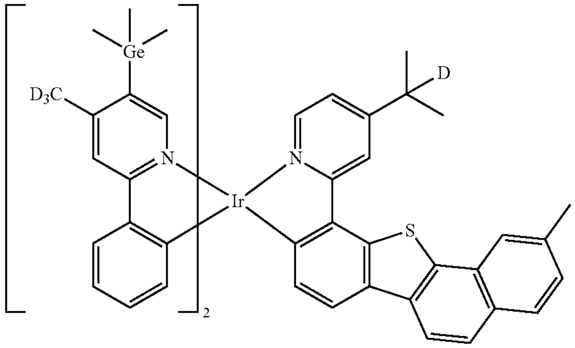
1058
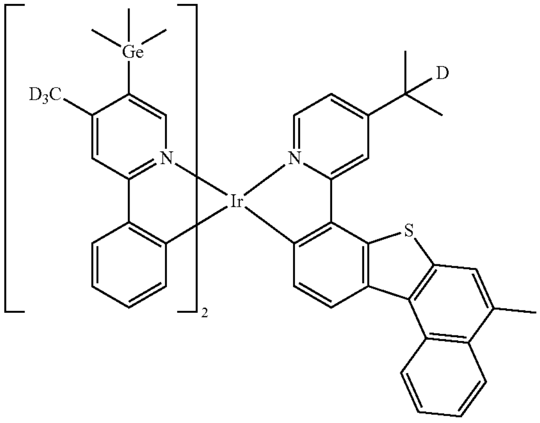
1059
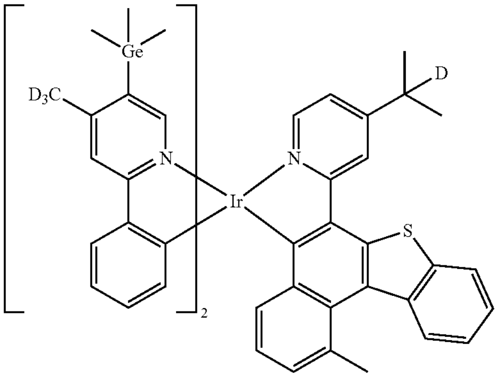
1060
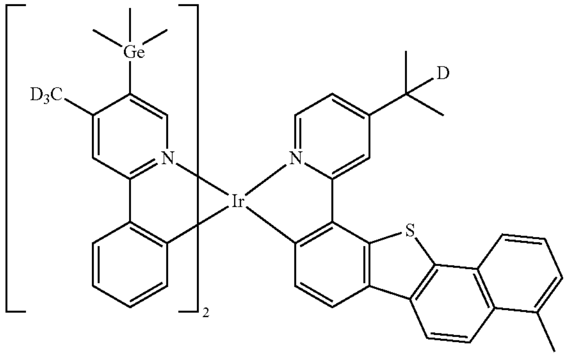

-continued
1061
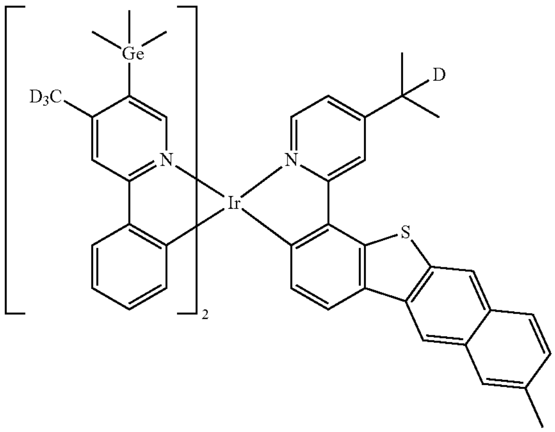
1062
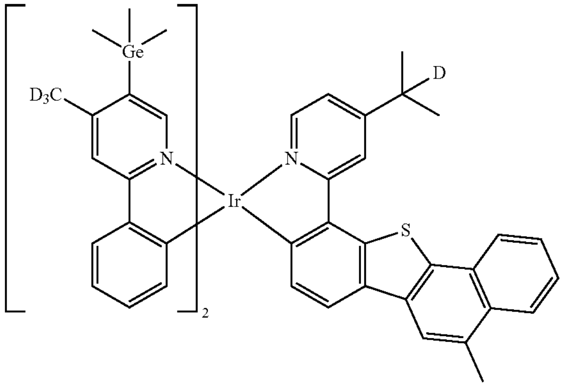
1063
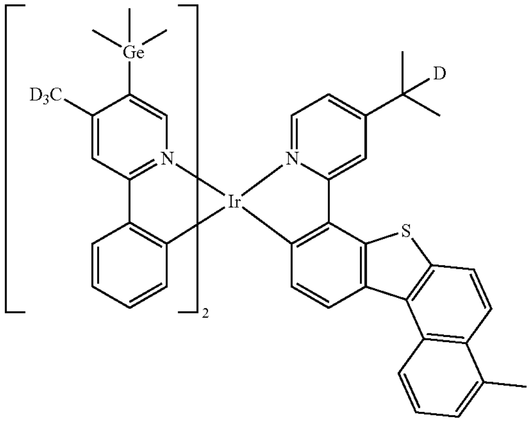
-continued
1064
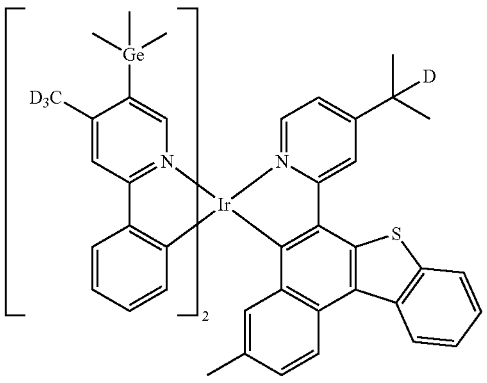
1065
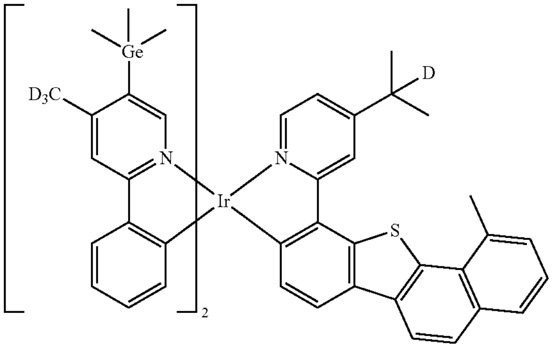
1066
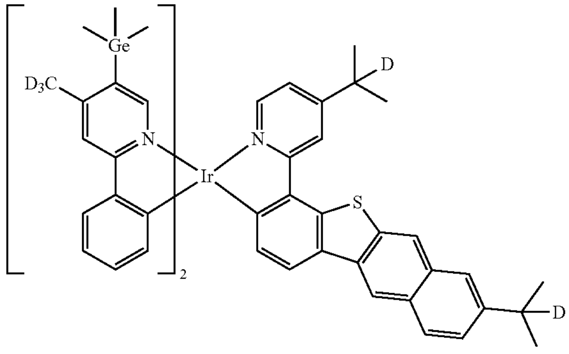
1067
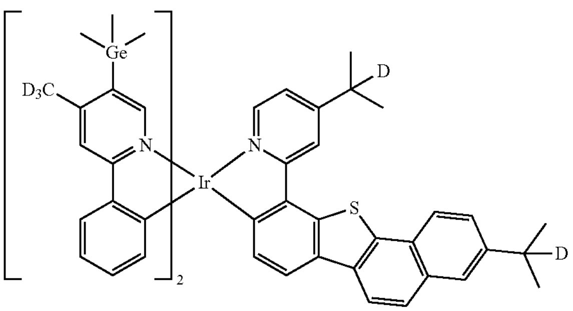

-continued
1068
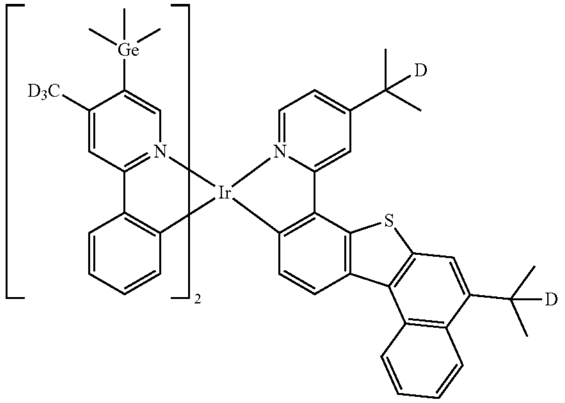
1069
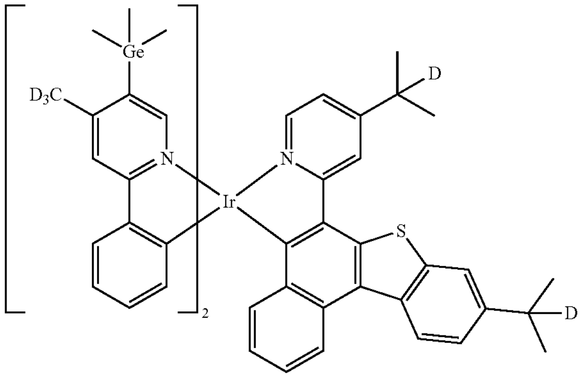
1070
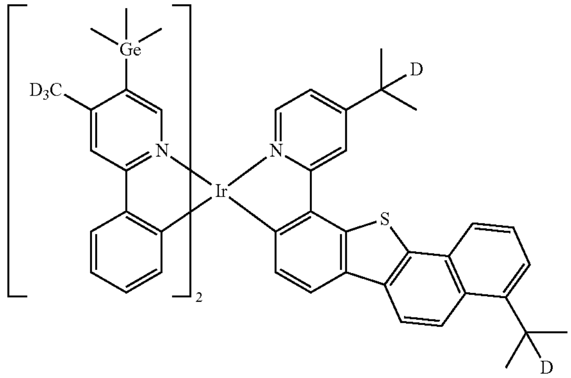
1071
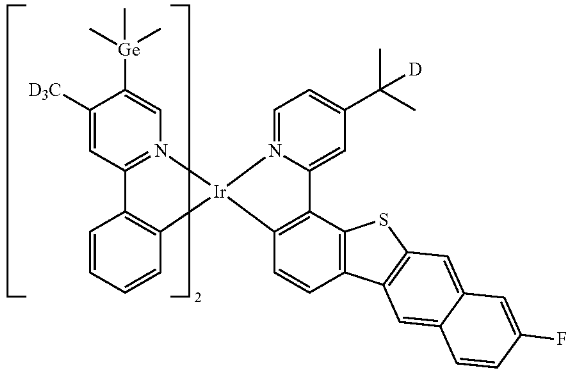
-continued
1072
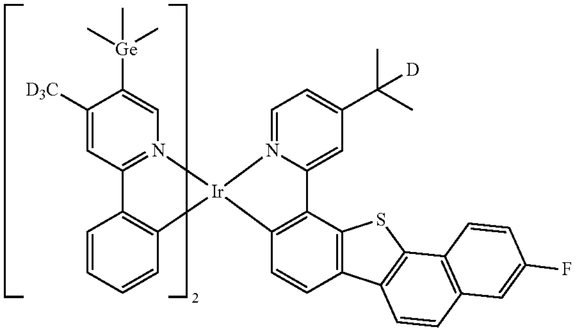
1073
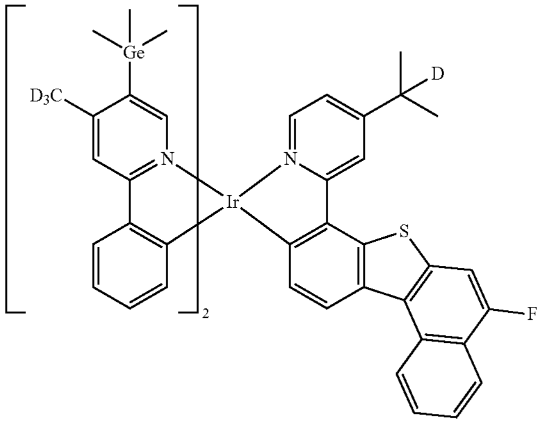
1074
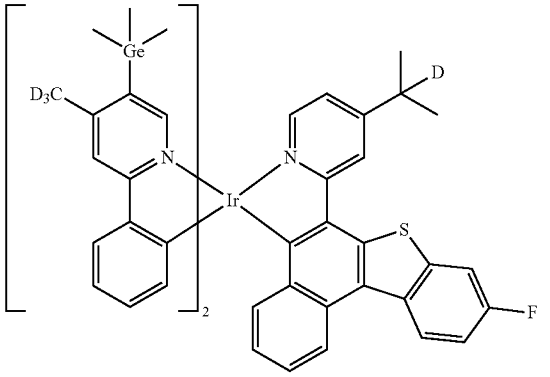
1075
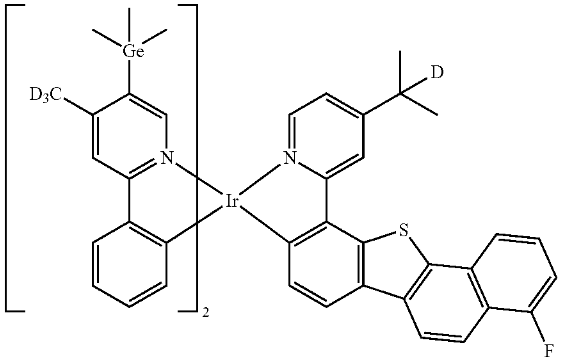

-continued
1076
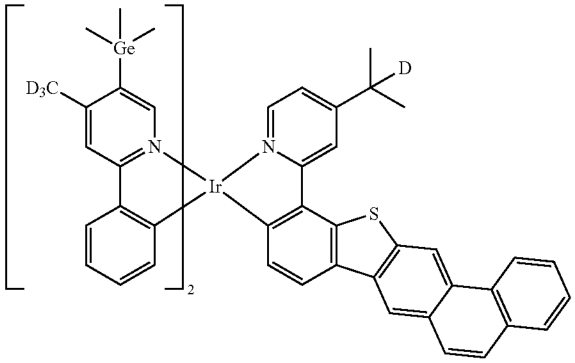
1077
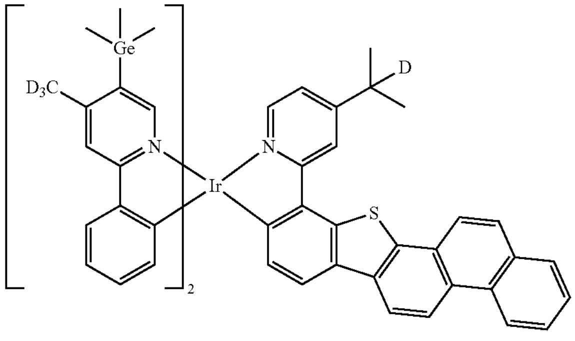
1078
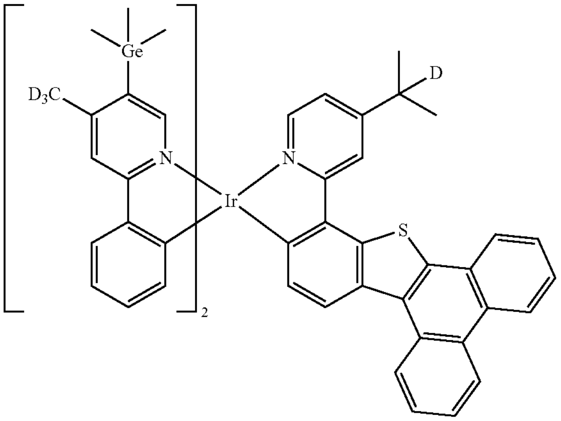
1079
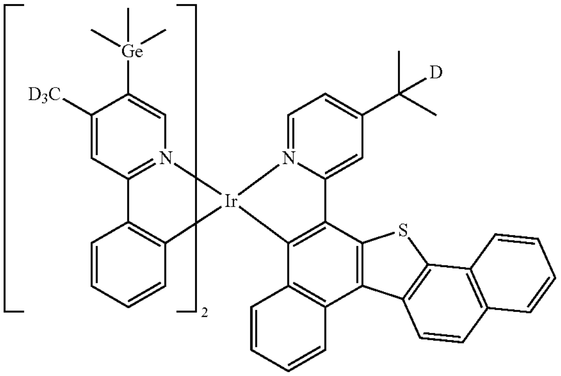
-continued
1080
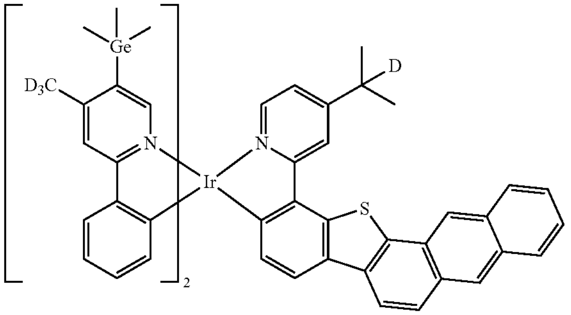
1081
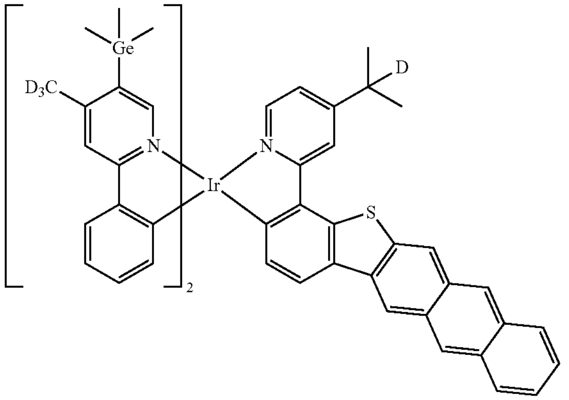
1082
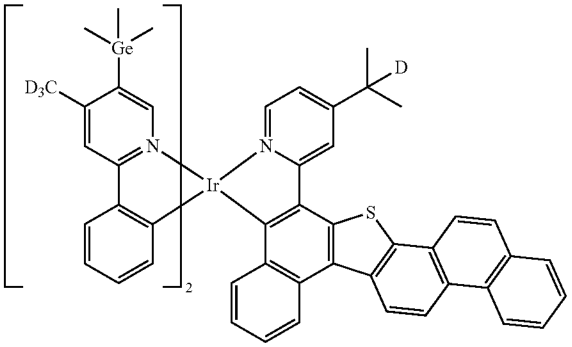
1083
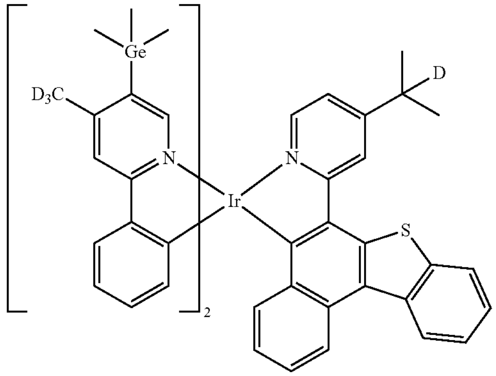

-continued
1084
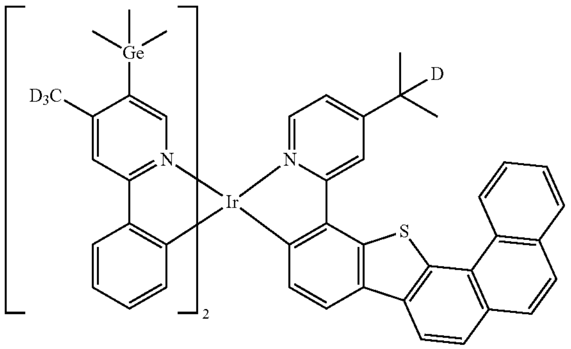
1085
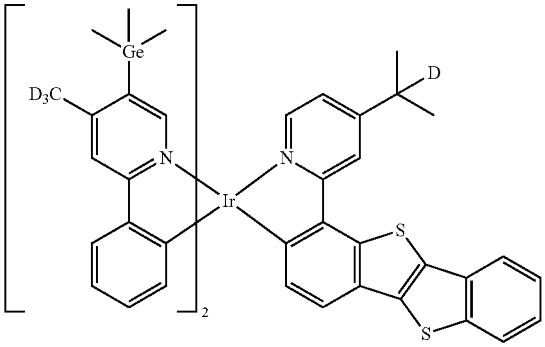
1086
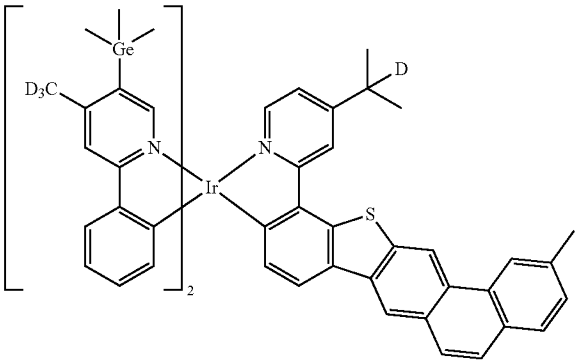
1087
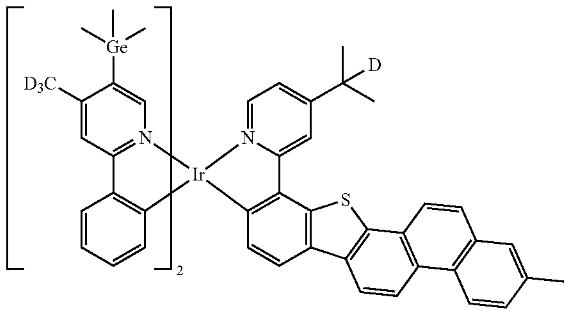
-continued
1086
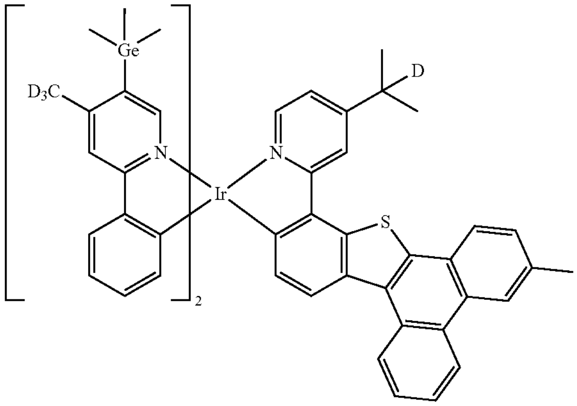
1089
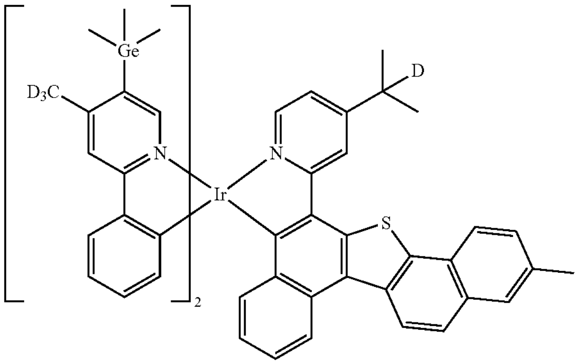
1090
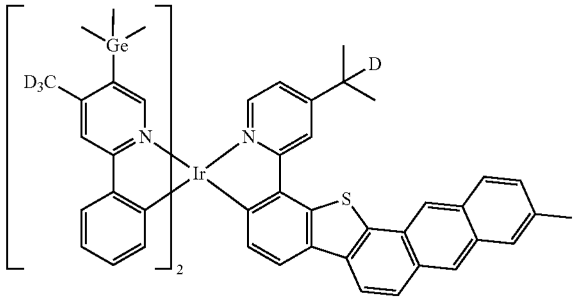
1091
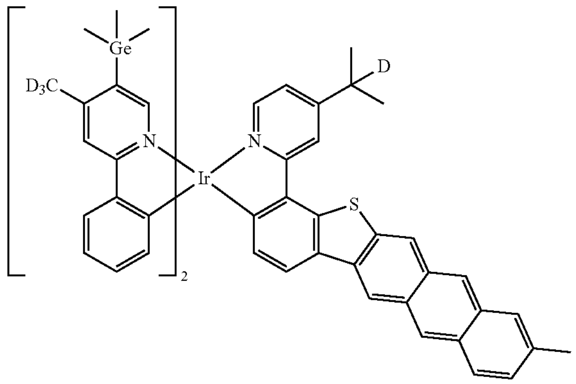

-continued
1092
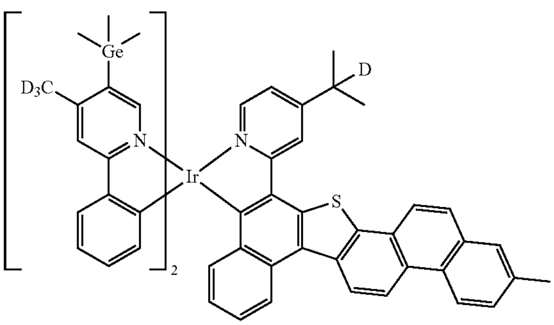
1093
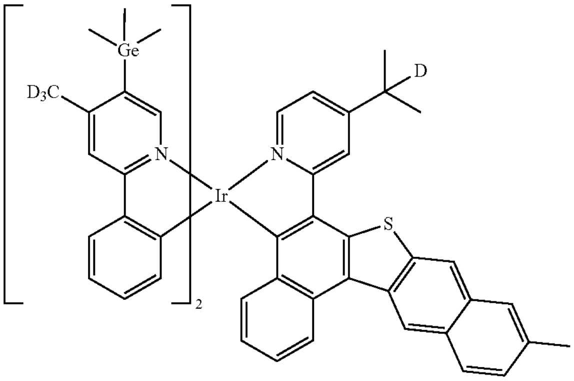
1094
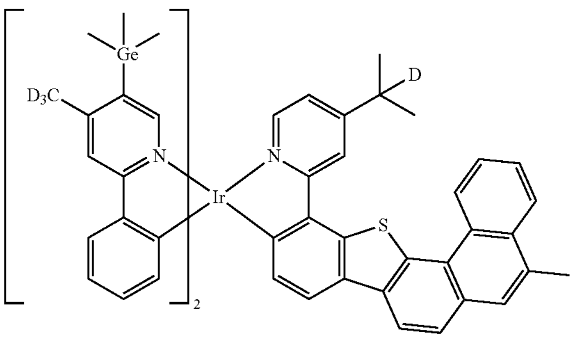
1095
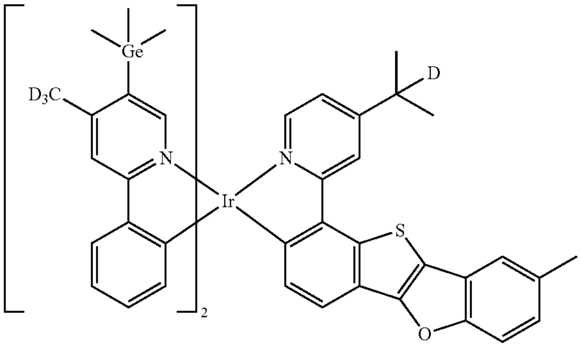
-continued
1096
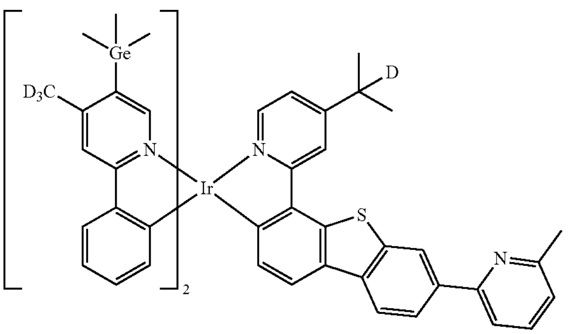
1097
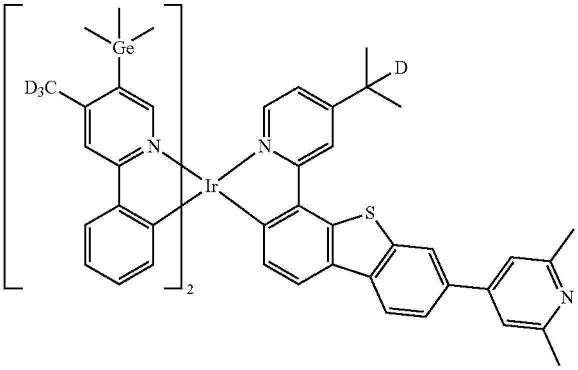
1098
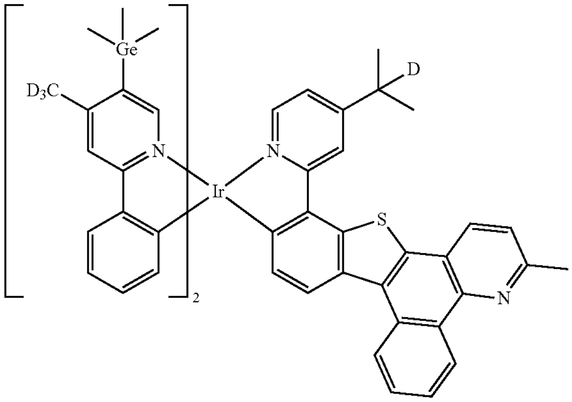
1099
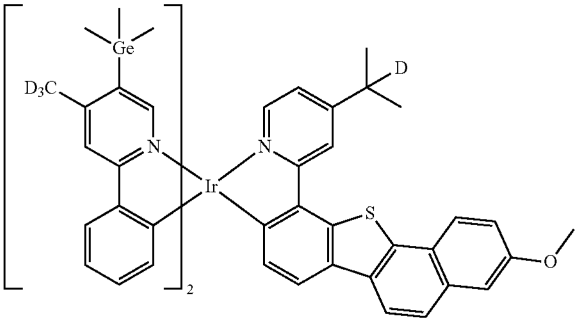

-continued
1100
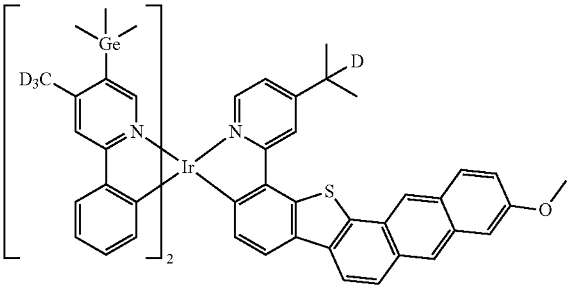
1101
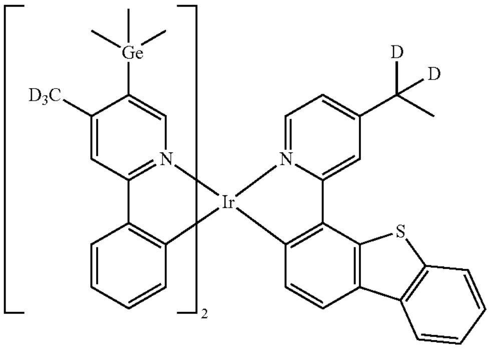
1102
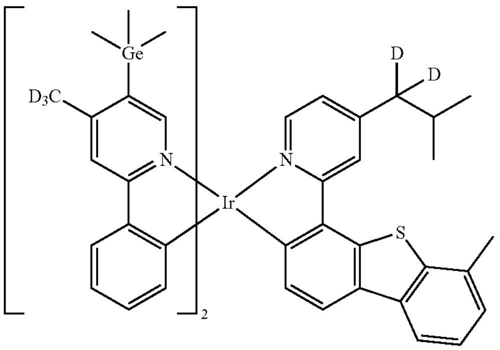
1103
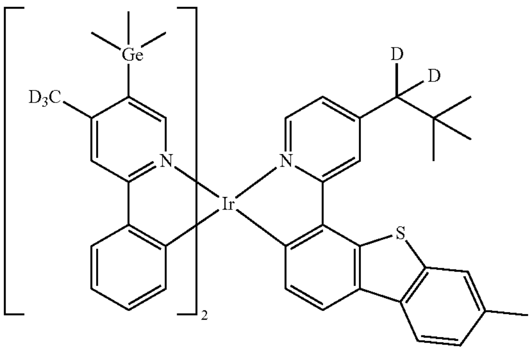
-continued
1104
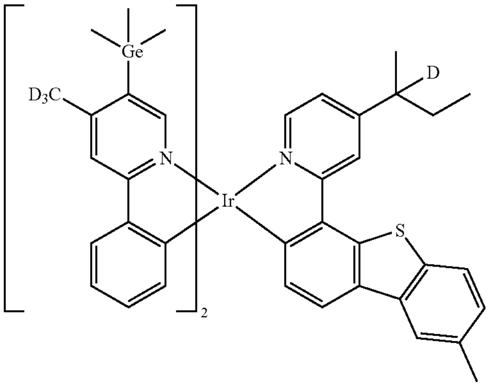
1105
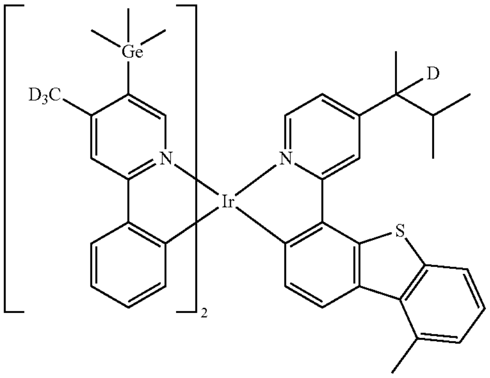
1106
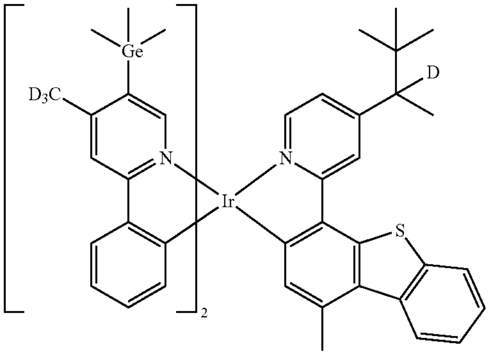
1107
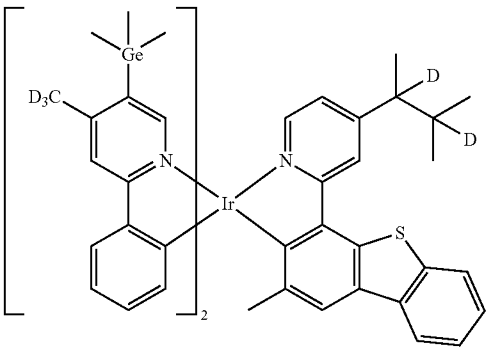

-continued
1108
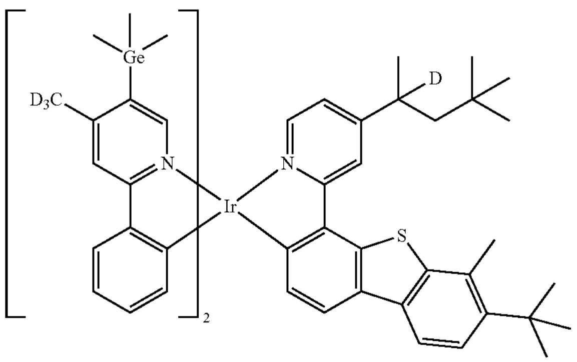
1109
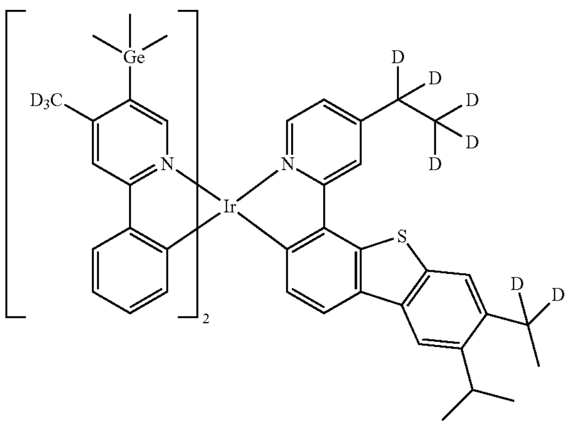
1110
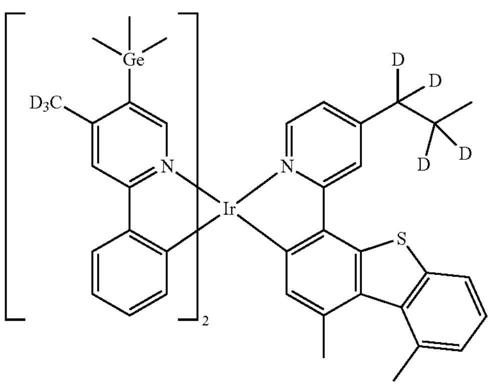
1111
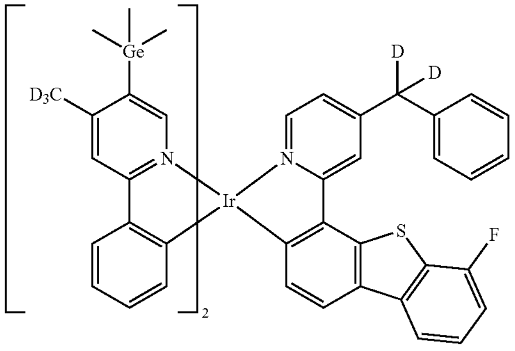
-continued
1112
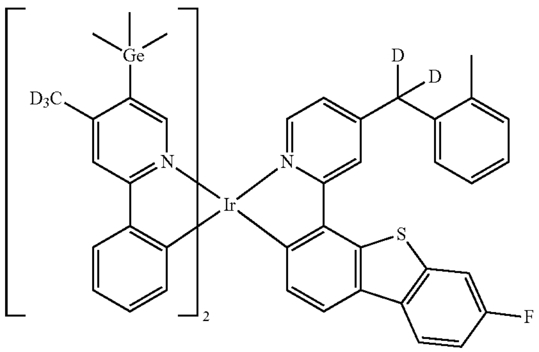
1113
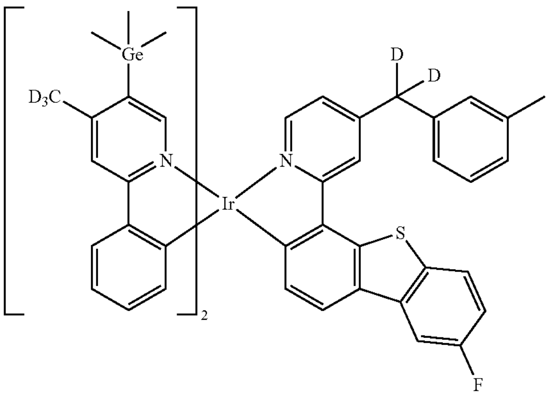
1114
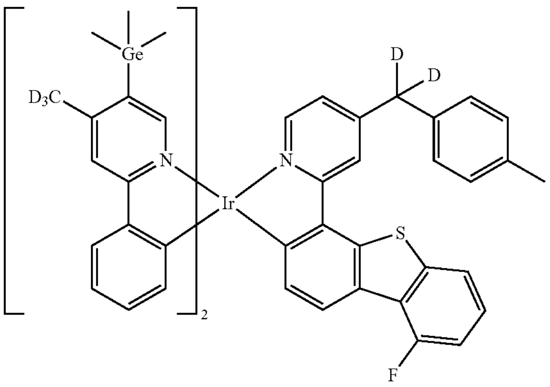
1115
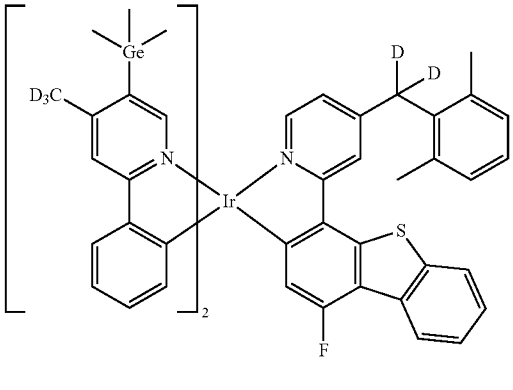

-continued
1116
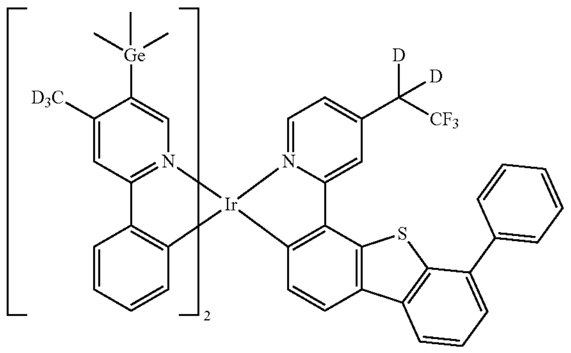
1117
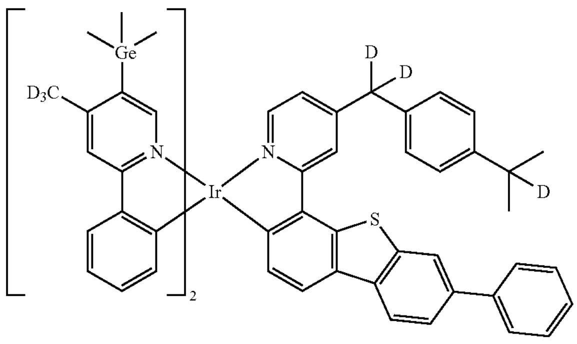
1118
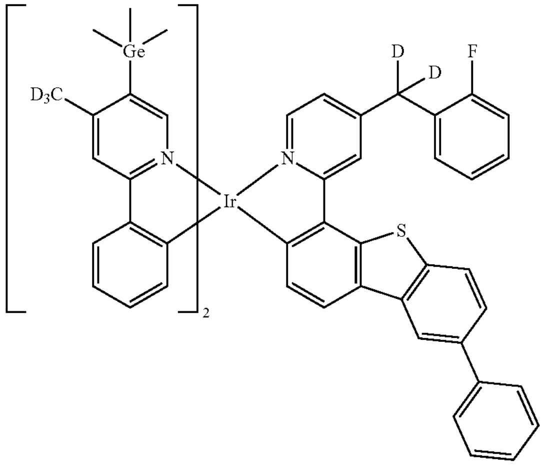
-continued
1119
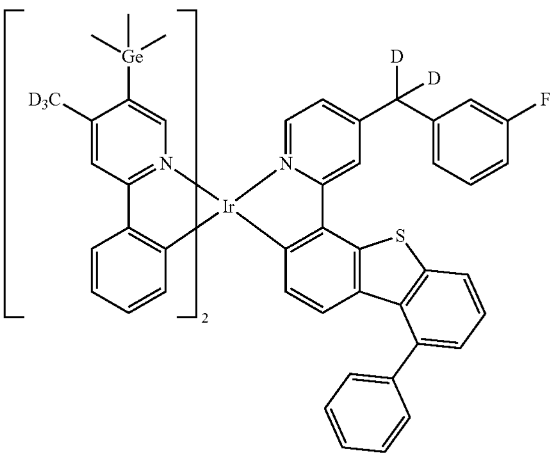
1120
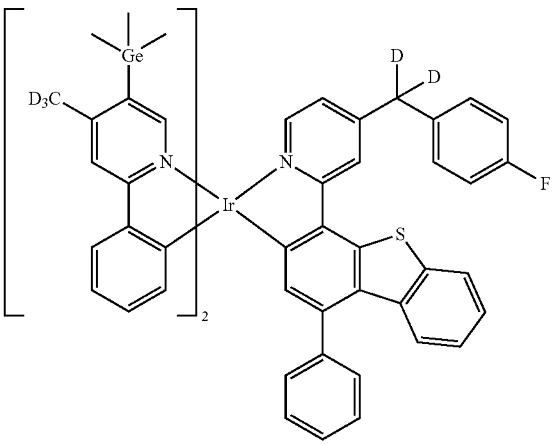
1121
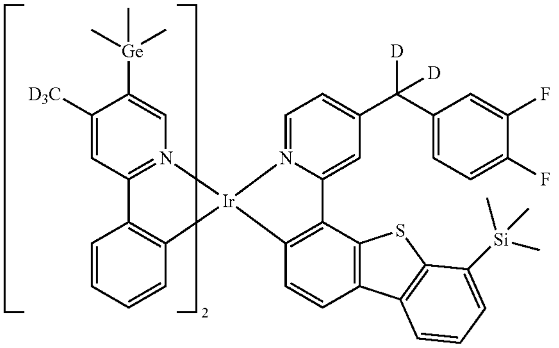

-continued
1122
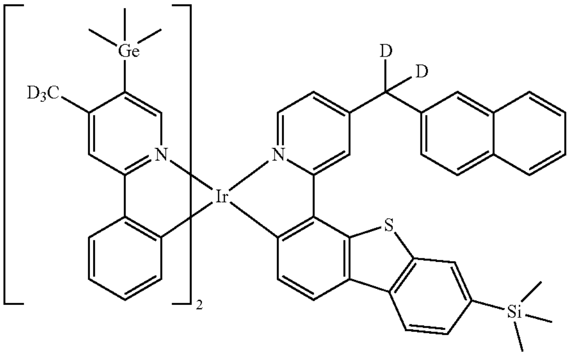
1123
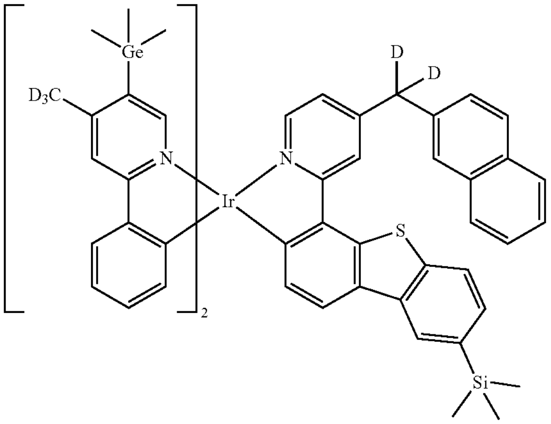
1124
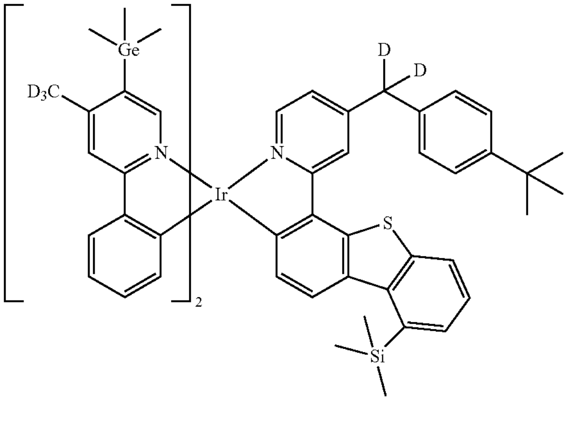
-continued
1125
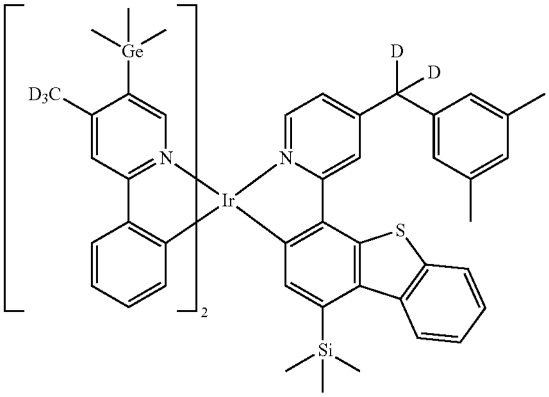
1126
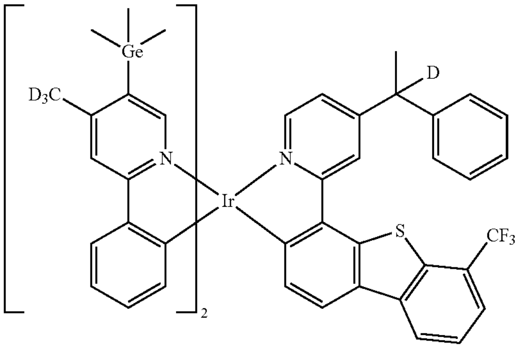
1127
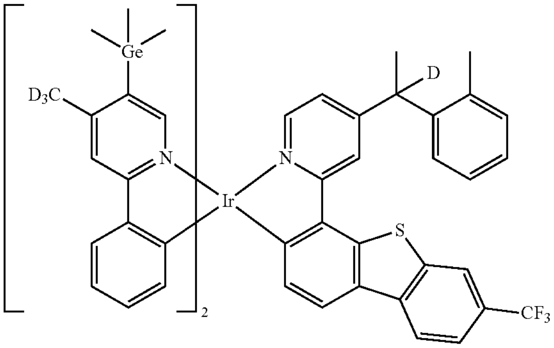
1128
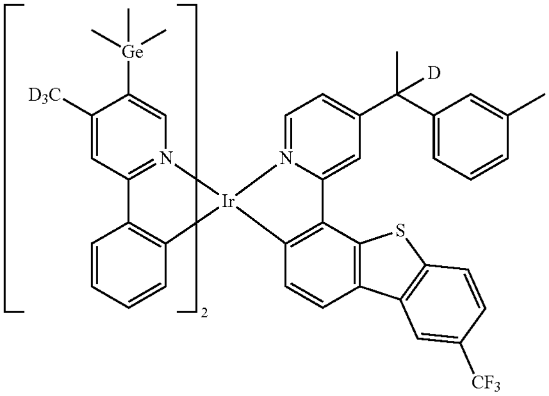

-continued
1129
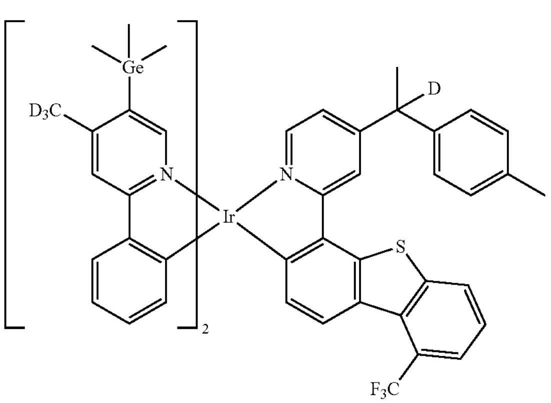
1130
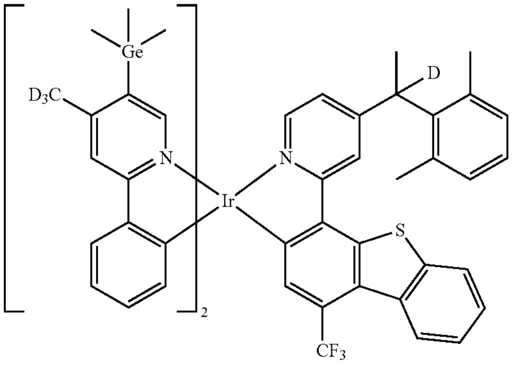
1131
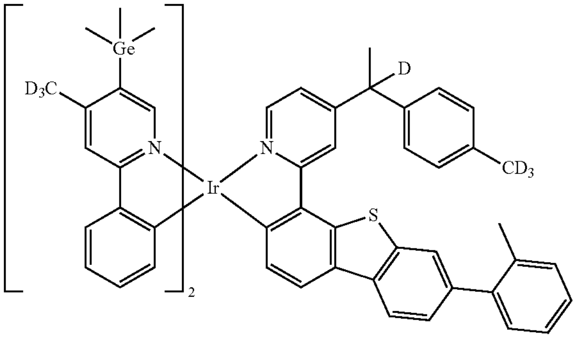
1132
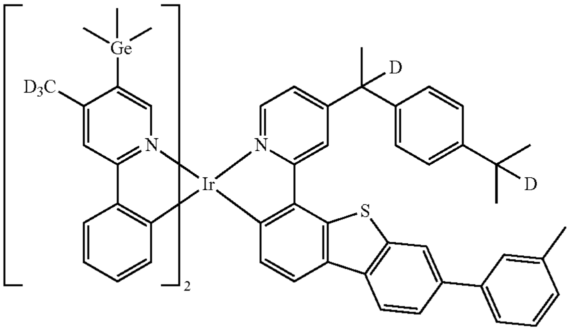
-continued
1133
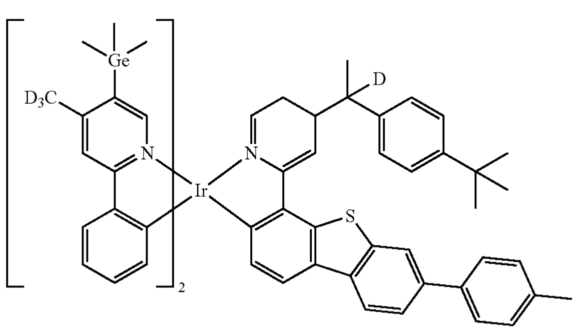
1134
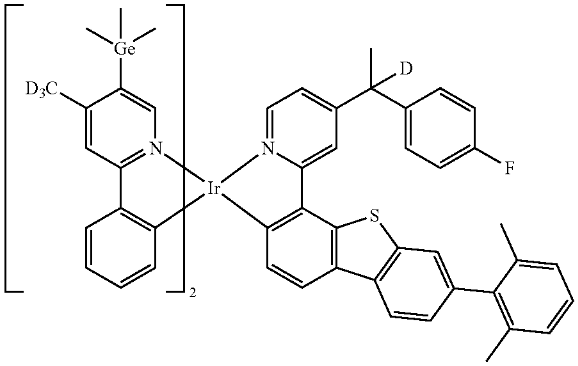
1135
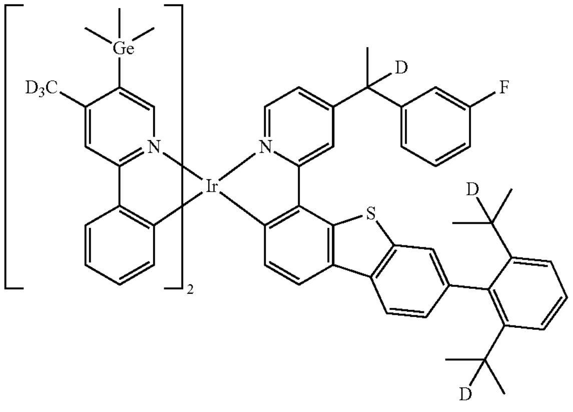
1136
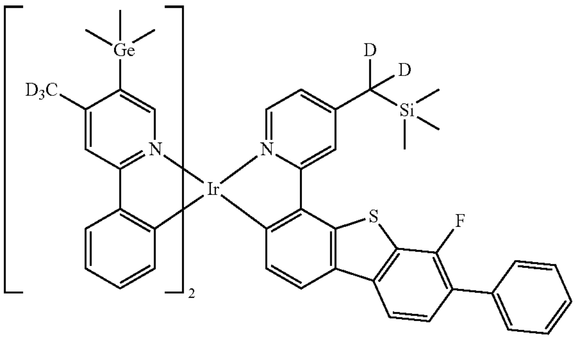

-continued
1137
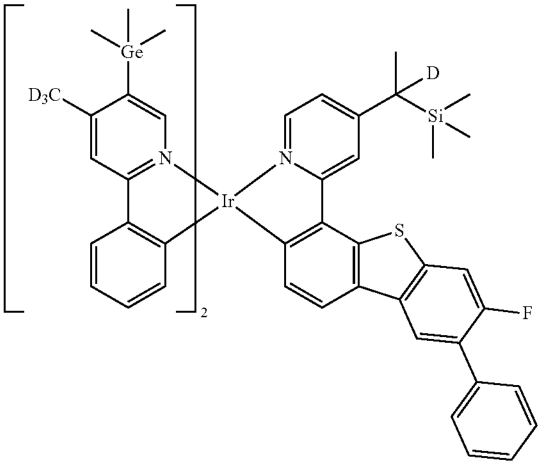
1138
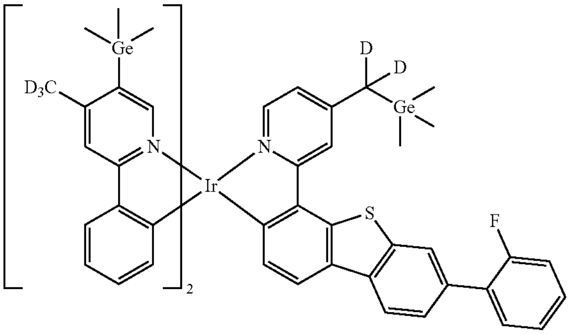
1139
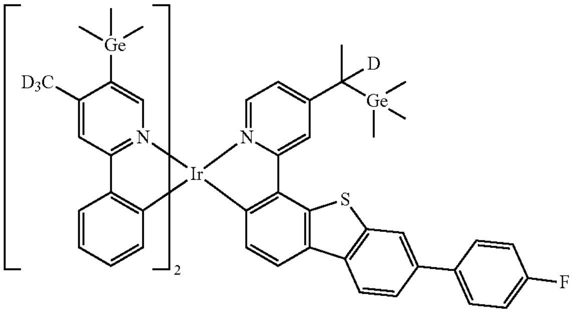
1140
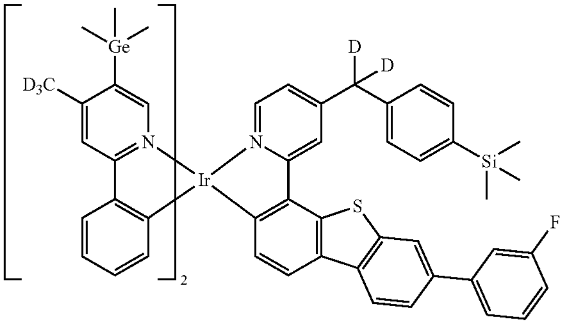
-continued
1141
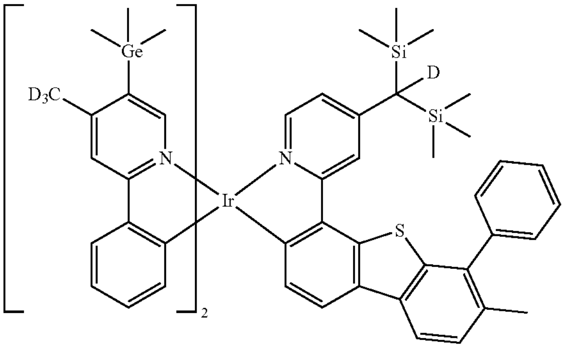
1142
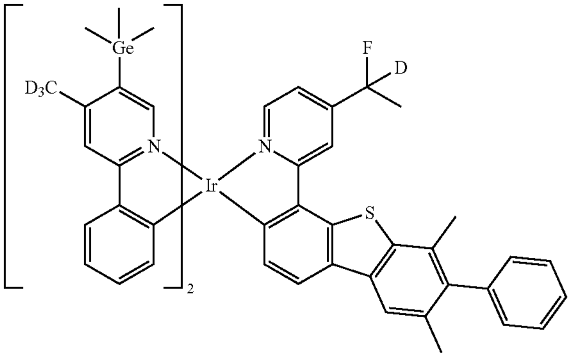
1143
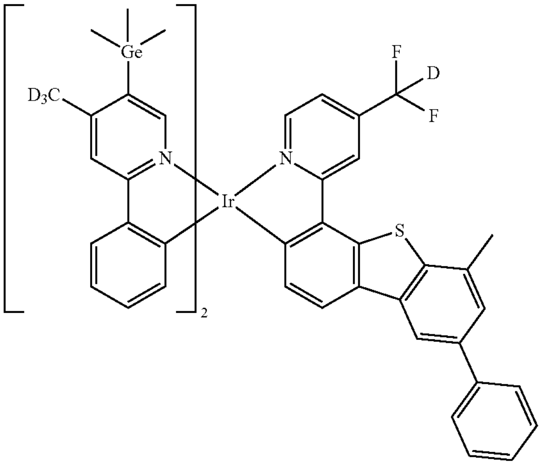

-continued
1144
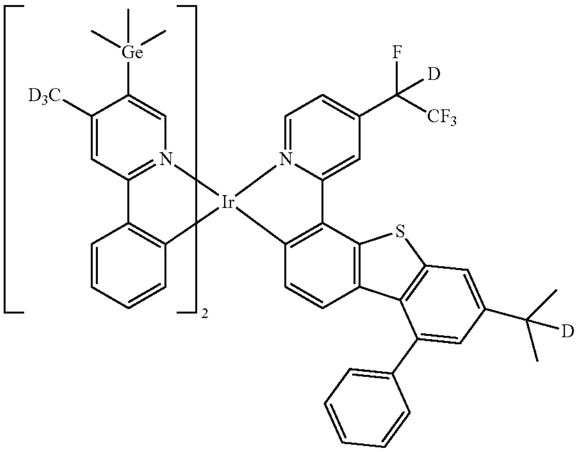
1145
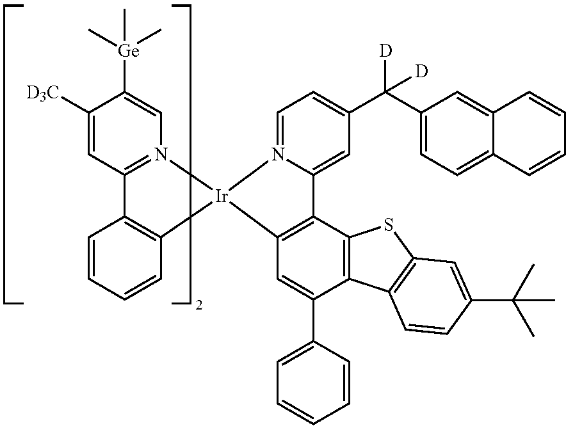
1146
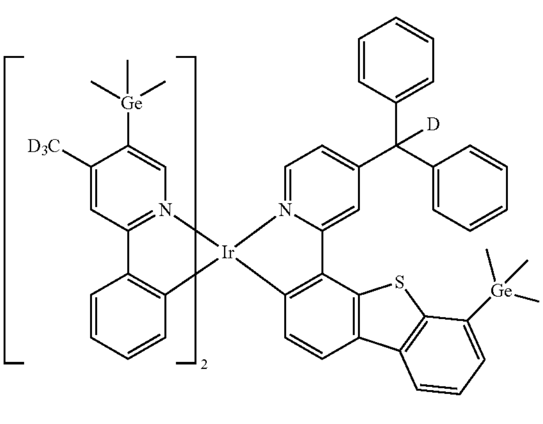
-continued
1147
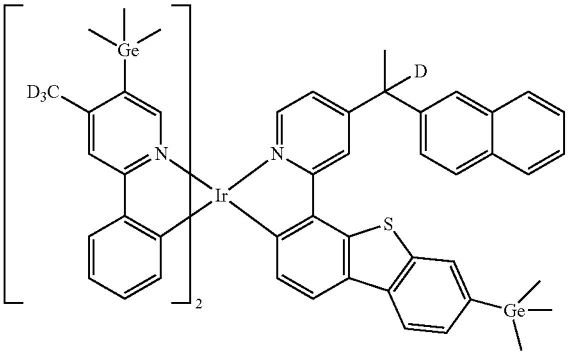
1148
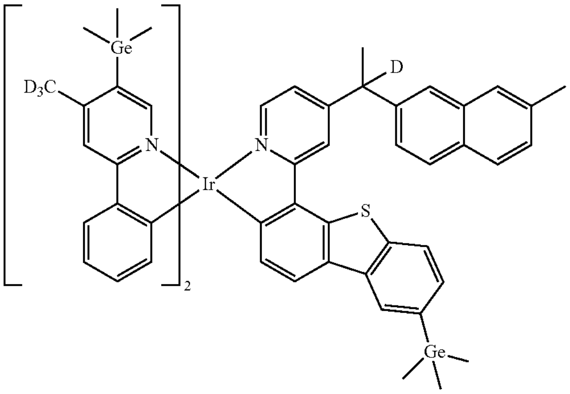
1149
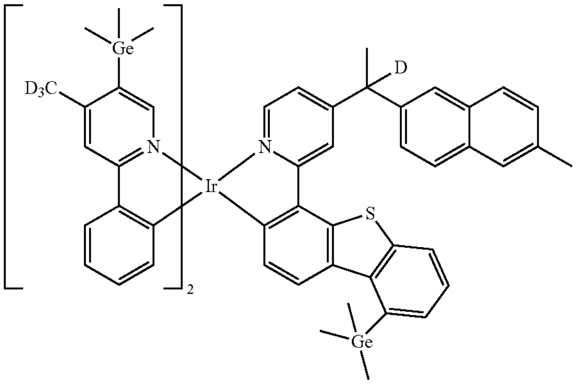
1150
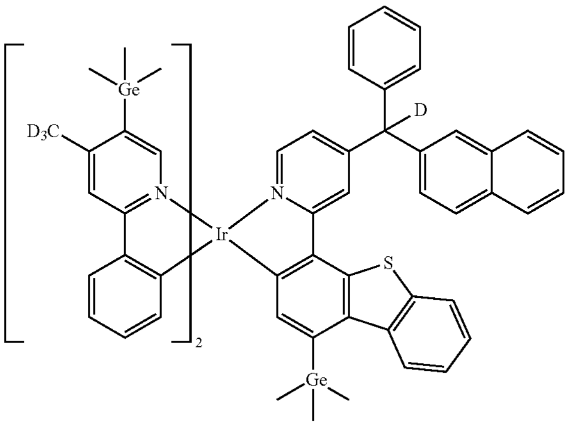

-continued
1151
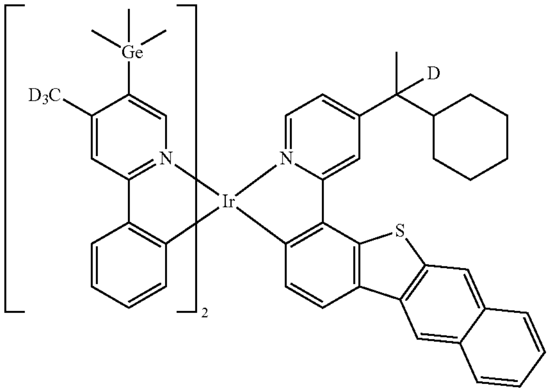
1152
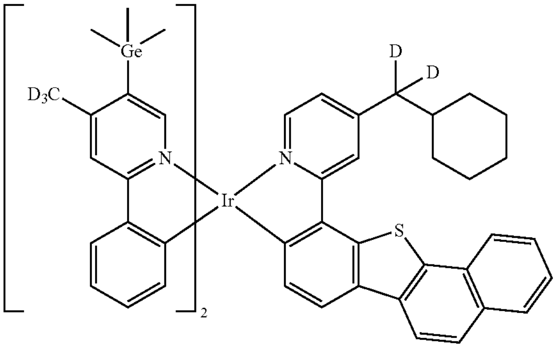
1153
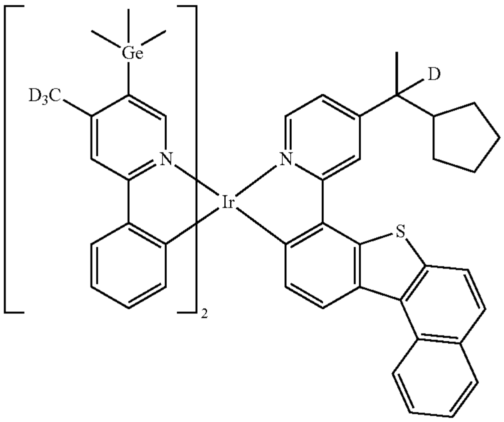
1154
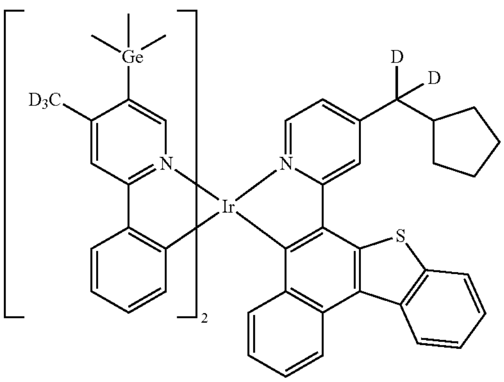
-continued
1155
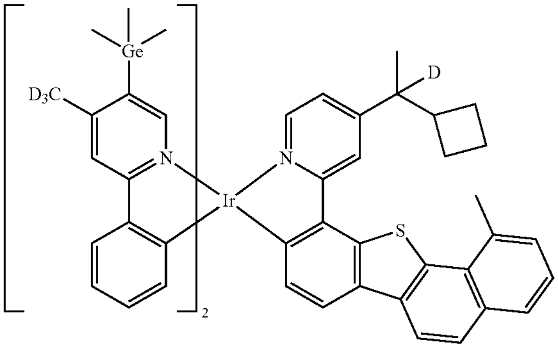
1156
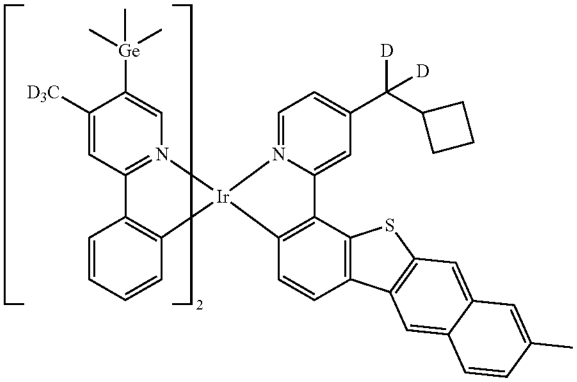
1157
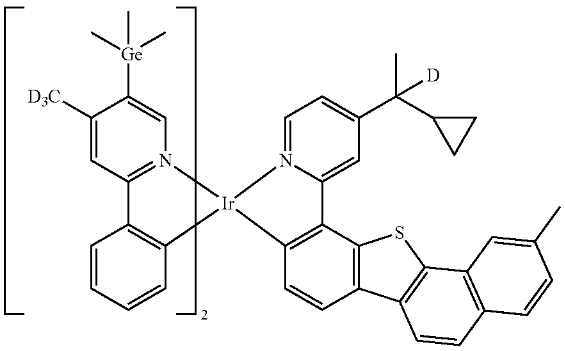
1158
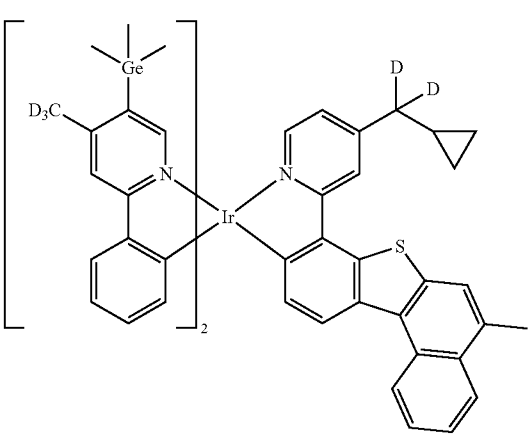

-continued
1159
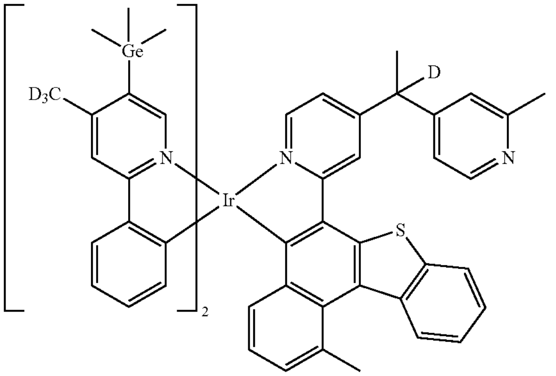
1160
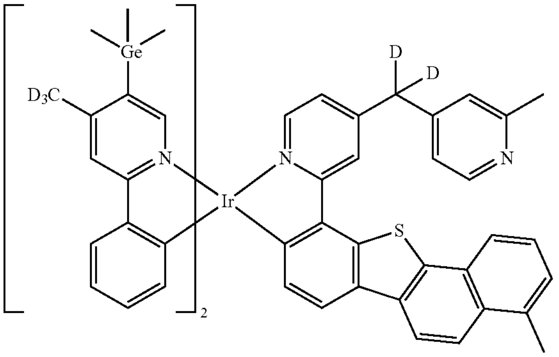
1161
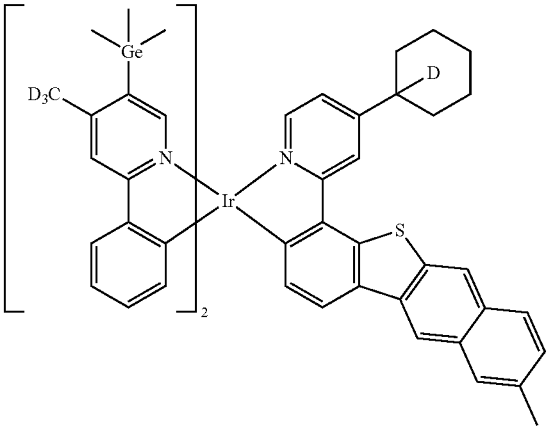
1162
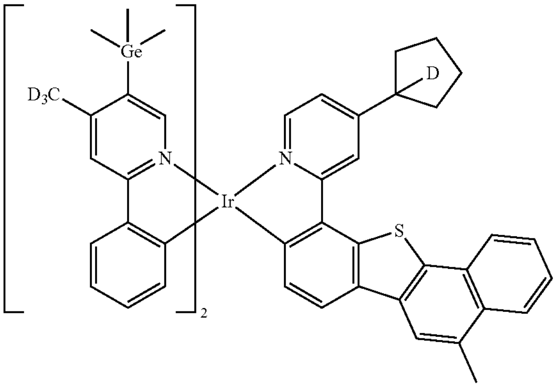
-continued
1163
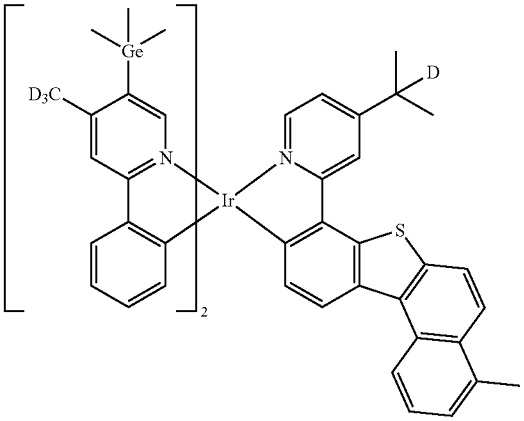
1164
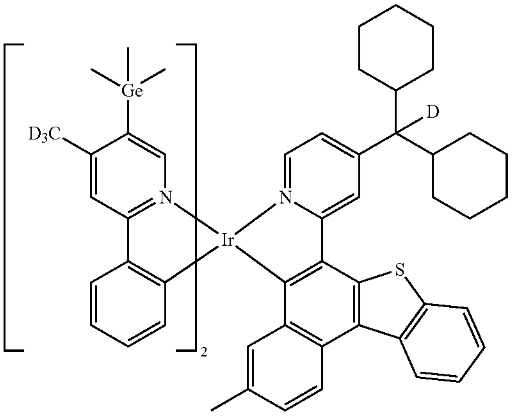
1165
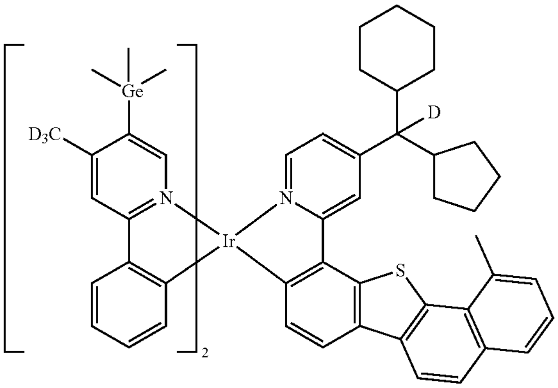

-continued
1166
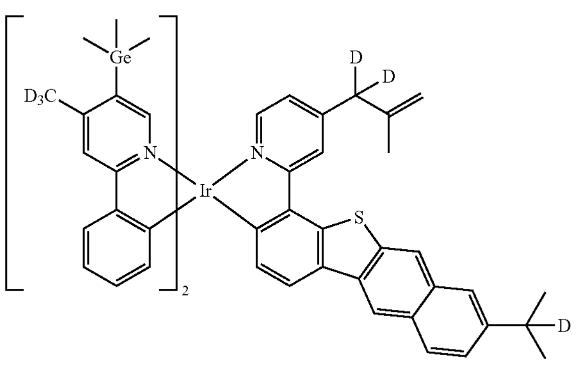
1167
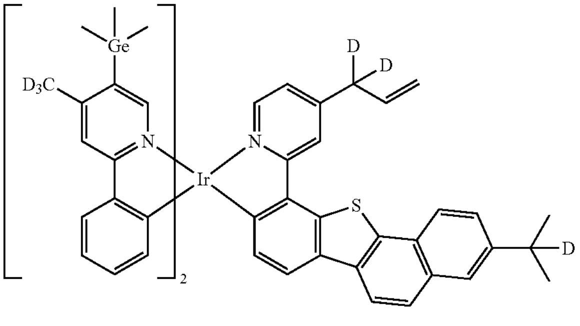
1168
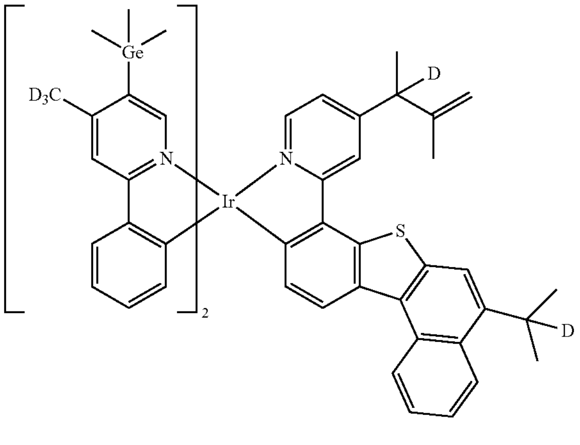
1169
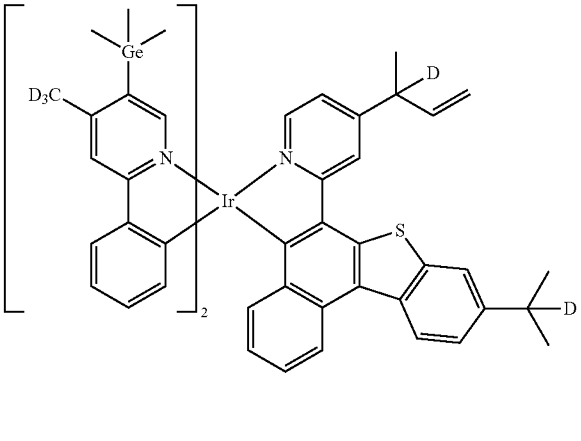
-continued
1170
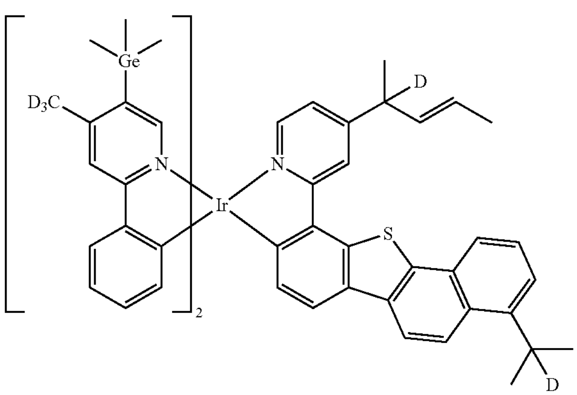
1171
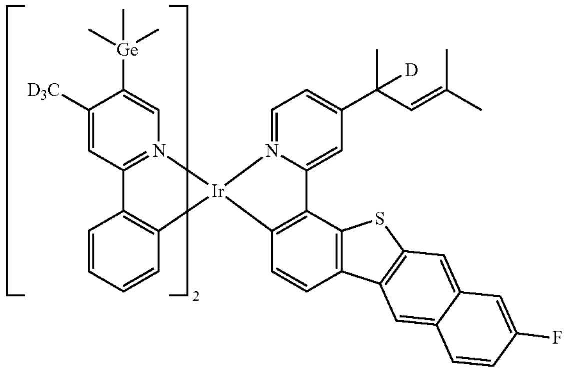
1172
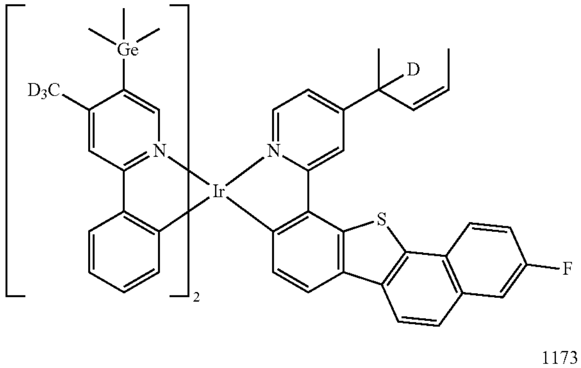
1173
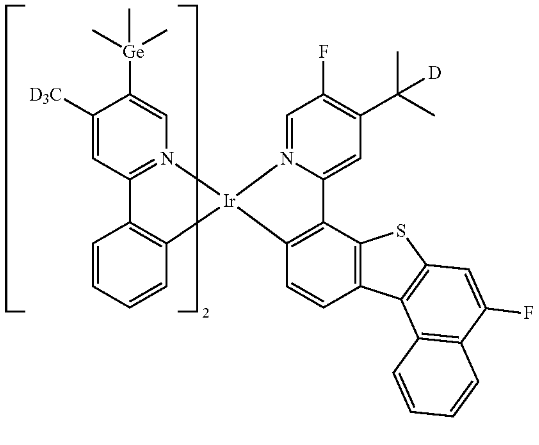

-continued
1174
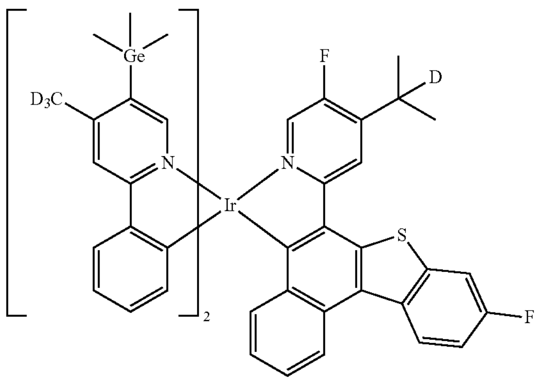
1175
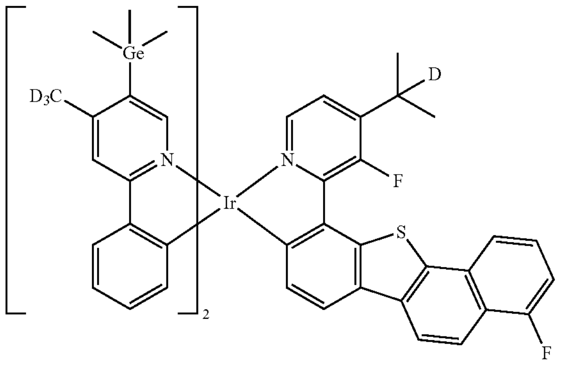
1176
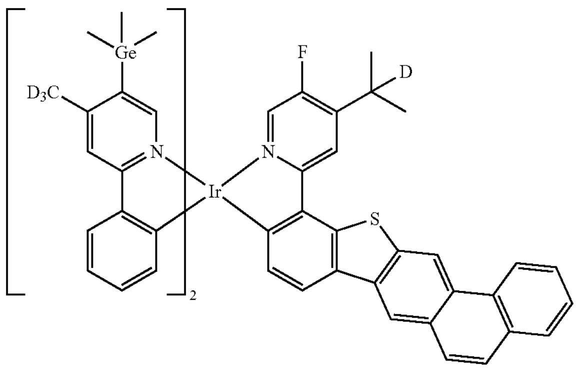
1177
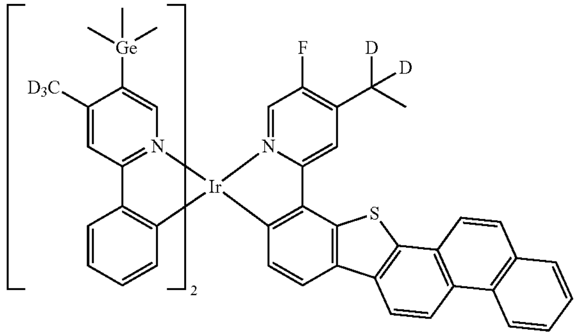
-continued
1178
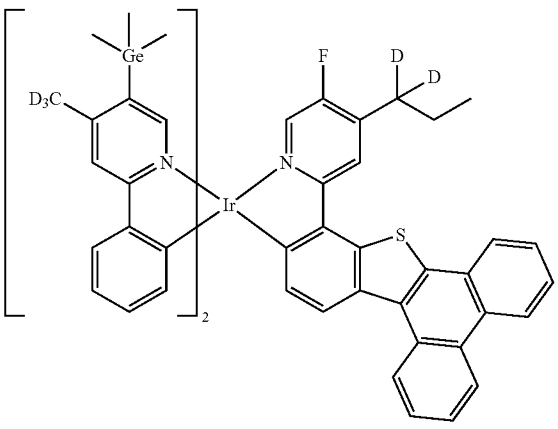
1179
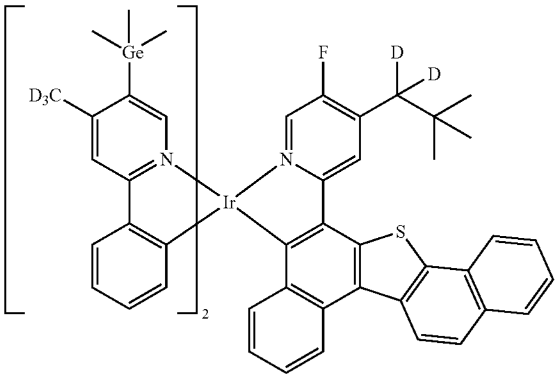
1180
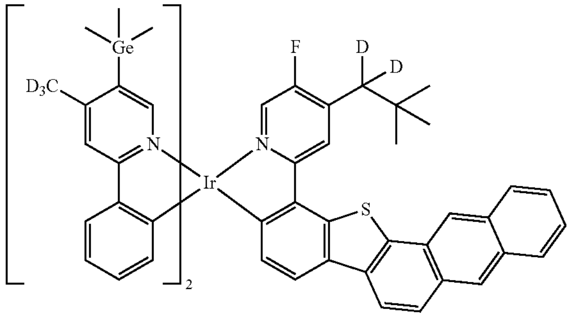
1181
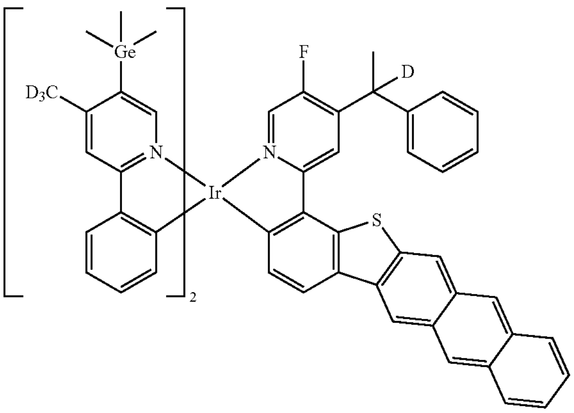

1182
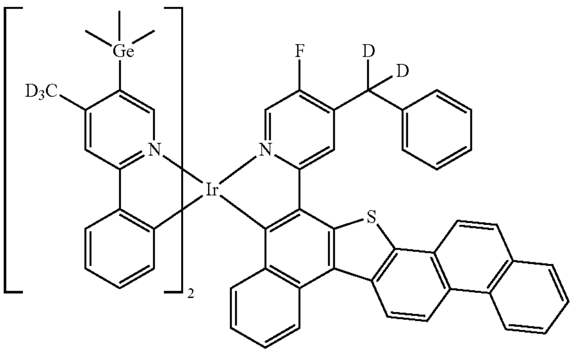
1183
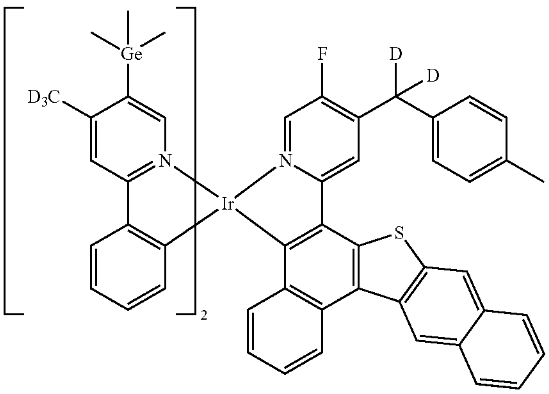
1184
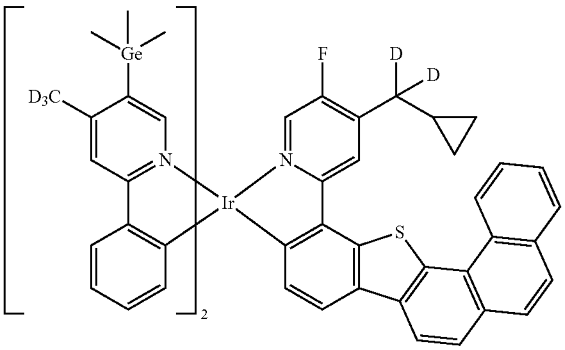
1185
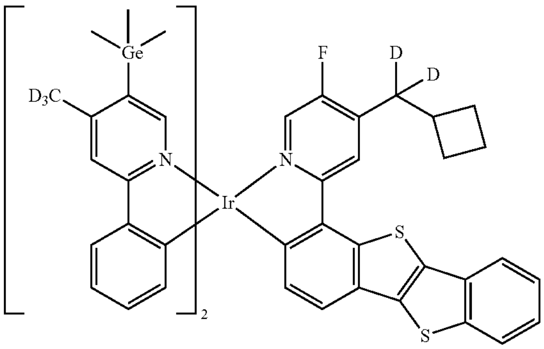
1186
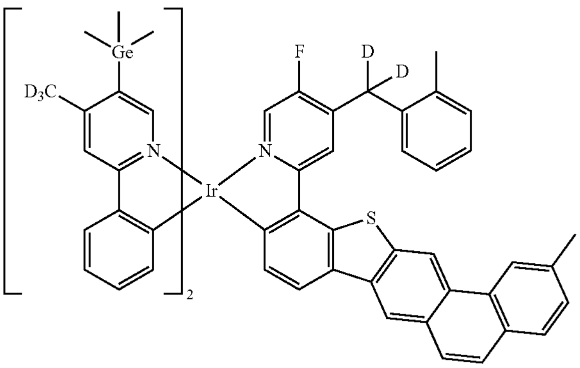
1187
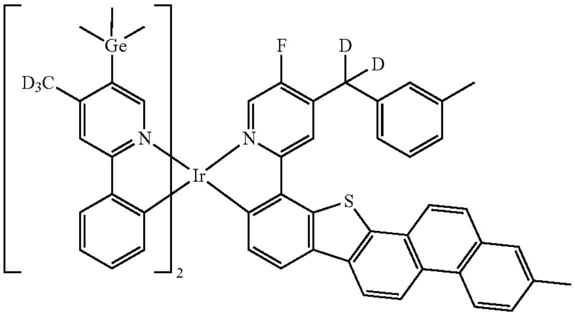
1188
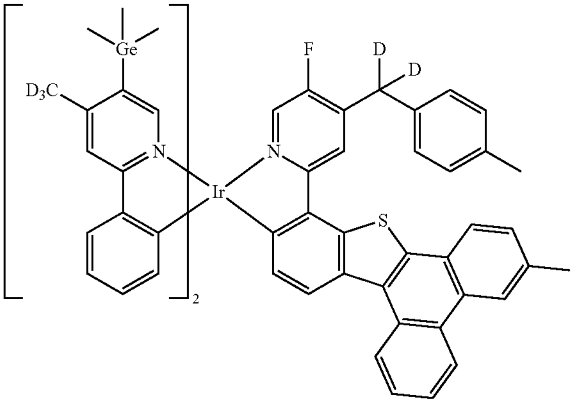
1189
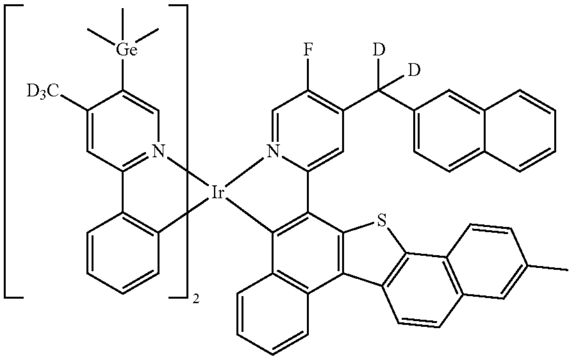

-continued
1190
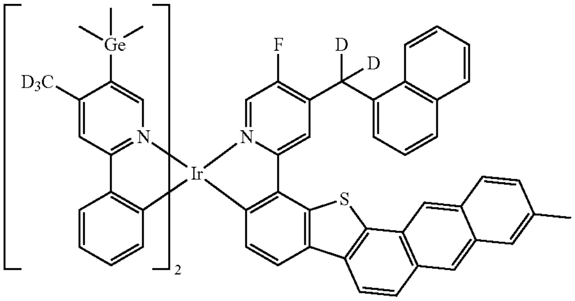
1191
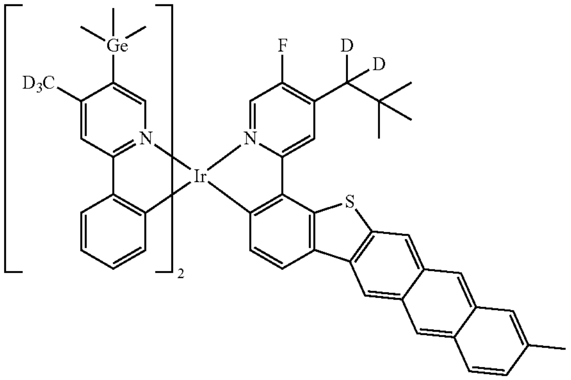
1192
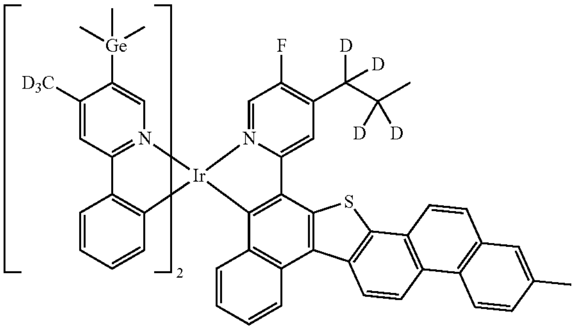
1193
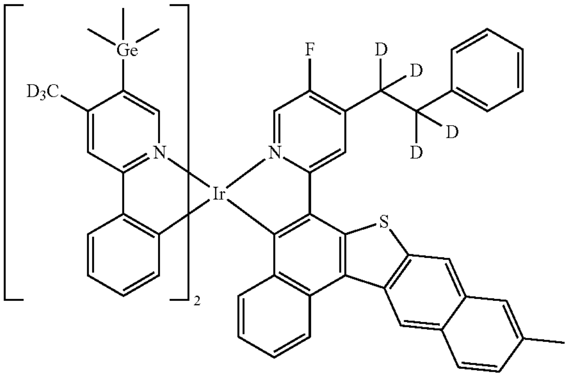
-continued
1194
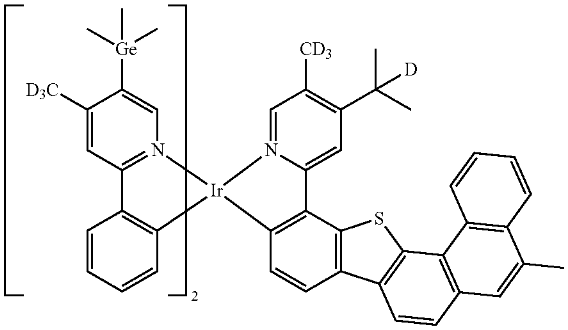
1195
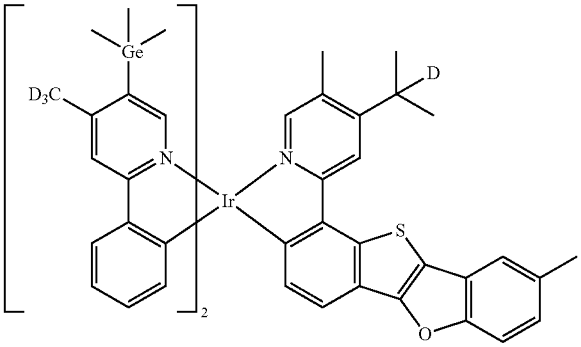
1196
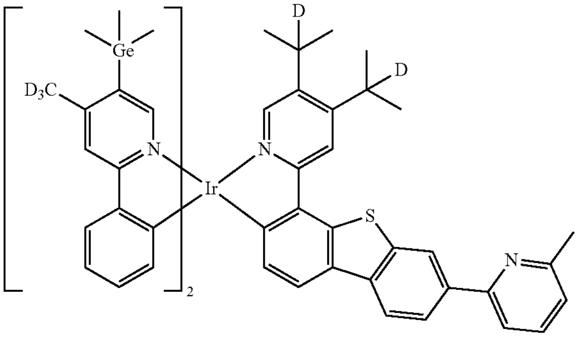
1197
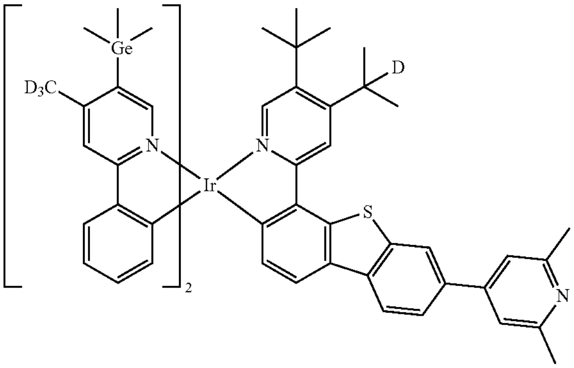

-continued

1198

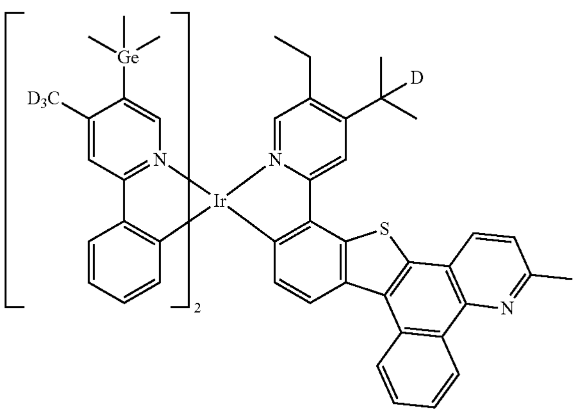

1199

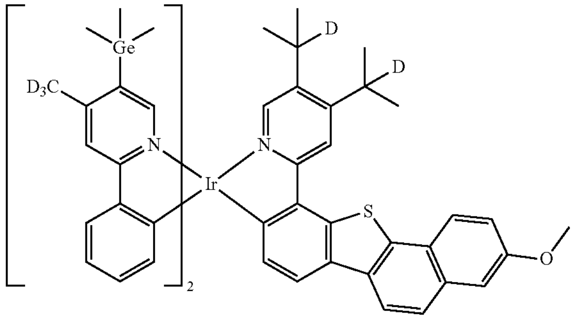

1200

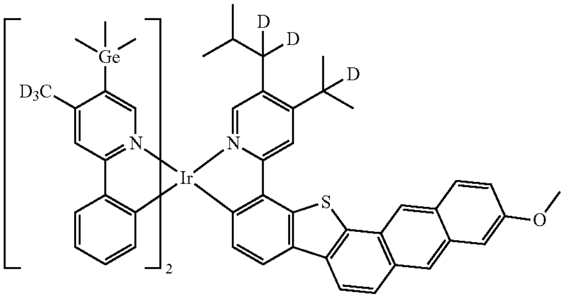

1201

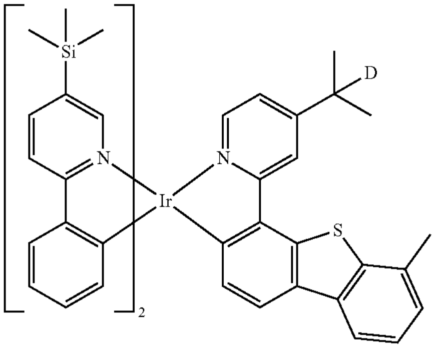

-continued

1202

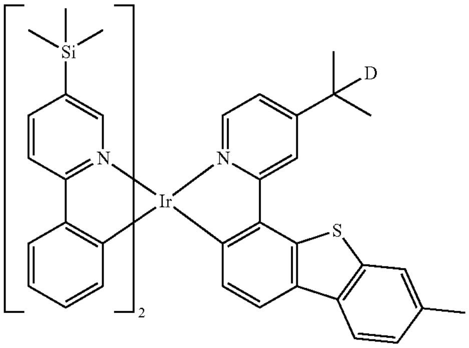

1203

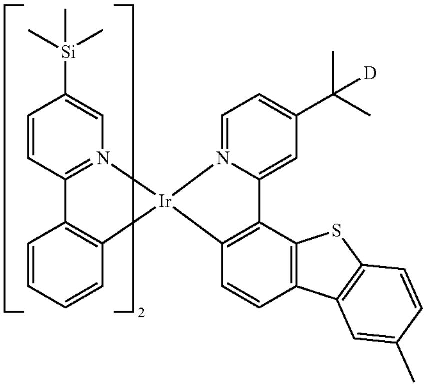

1204

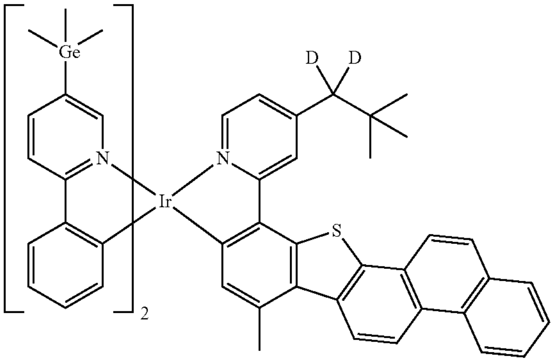

$L_1$ in the organometallic compound represented by Formula 1 is a ligand represented by Formula 2-1, n1, which is the number of $L_1$(s), is 1 or 2, $L_2$ is a ligand represented by Formula 2-2, n2, which is the number of $L_2$(s), is 1 or 2, and $L_1$ and $L_2$ are different from each other. That is, the organometallic compound is a heteroleptic complex essentially including (or consisting essentially of), as a ligand bonded to metal M, at least one ligand represented by Formula 2-1 and at least one ligand represented by Formula 2-2.

In relation to Formula 2-2, $R_{12}$ is hydrogen, deuterium, a methyl group, or a deuterated methyl group; or $R_{12}$ and $R_{13}$ are linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$. Accordingly, the organometallic compound represented by Formula 1 may have excellent heat resistance, and an electronic device, for example, an organic light-emitting device using the organometallic compound may have a long lifespan.

$A_1$ in Formula 2-1 is a group represented by Formula 3 (at least one of $Z_3$ to $Z_5$ in Formula 3 is deuterium, or a deuterated group), and is not —$CD_3$ (that is, a case in which all of $Z_3$ to $Z_5$ in Formula 3 are deuterium simultaneously, may be excluded), and c1, which is the number of $A_1$(s), is an integer from 1 to 20. That is, ring $CY_1$ of Formula 2-1 is substituted with at least one $A_1$. As a result, the transition dipole moment of the organometallic compound represented by Formula 1 is increased, and the orientation characteristics of the organometallic compound are improved, and thus the luminescence efficiency of an electronic device, for example, an organic light-emitting device using the organometallic compound may be improved.

Furthermore, a group represented by $*—X_1(R_{21})(R_{22})(R_{23})$ in Formula 2-2 may be bonded at position 5 of the pyridine ring in the ligand represented by Formula 2-2 (see Formula 2-2). Since the organometallic compound including the ligand represented by Formula 2-2 has excellent heat resistance and decomposition resistance, an electronic device, for example, an organic light-emitting device, including the organometallic compound may have high stability and long lifespan during manufacture, storage, and/or operation.

The highest occupied molecular orbital (HOMO) energy level, lowest unoccupied molecular orbital (LUMO) energy level, single ($S_1$) energy level, and triple ($T_1$) energy level of organometallic compounds represented by Formula 1 were evaluated by density functional theory (DFT) using the Gaussian 09 program with the molecular structure optimization obtained at the B3LYP basis level, and results thereof are shown in Table 1, where the energy levels are in electron volts (eV).

TABLE 1

| Compound No. | HOMO (eV) | LUMO (eV) | $S_1$ (eV) | T1 (eV) |
|---|---|---|---|---|
| 1 | −4.8205 | −1.2759 | 2.8521 | 2.5521 |
| 2 | −4.9065 | −1.3363 | 2.9333 | 2.5594 |
| 3 | −4.7476 | −1.1943 | 2.8506 | 2.5161 |
| 4 | −4.8115 | −1.2715 | 2.8545 | 2.4444 |
| 1204 | −4.7761 | −1.2321 | 2.8706 | 2.4855 |

From Table 1, it was confirmed that the organometallic compound represented by Formula 1 has such electric characteristics that are suitable for use as a dopant for an electronic device, for example, an organic light-emitting device.

Synthesis methods of the organometallic compound represented by Formula 1 may be recognizable by one of ordinary skill in the art by referring to Synthesis Examples provided below.

Therefore, since the organometallic compound represented by Formula 1 may be suitable for use as a dopant of an organic layer of an organic light-emitting device, for example, an emission layer in the organic layer, according to another aspect, provided is an organic light-emitting device including a first electrode, a second electrode, and an organic layer which is located between the first electrode and the second electrode and includes an emission layer, wherein the organic layer includes at least one organometallic compounds represented by Formula 1.

The organic light-emitting device may have low driving voltage, high external quantum efficiency, and longer lifespan characteristics due to the inclusion of an organic layer including the organometallic compound represented by Formula 1 as described herein.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 in the emission layer is less than an amount of the host in the emission layer). The emission layer may emit, for example, green light or blue light.

The expression "(an organic layer) includes at least one of organometallic compound represented by Formula 1" used herein may include a case in which "(an organic layer) includes identical organometallic compounds represented by Formula 1" and a case in which "(an organic layer) includes two or more different organometallic compounds represented by Formula 1".

For example, the organic layer may include, as the organometallic compound, only Compound 1. In this embodiment, Compound 1 may be included in the emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the organic light-emitting device, the first electrode is an anode, and the second electrode is a cathode, and the organic layer may further include a hole transport region located between the first electrode and the emission layer, and an electron transport region located between the emission layer and the second electrode, and the hole transport region may include a hole injection layer, a hole transport layer, an electron-blocking layer, a buffer layer, or a combination thereof, and the electron transport region may include a hole-blocking layer, an electron transport layer, an electron injection layer, or a combination thereof.

The term "organic layer" used herein refers to a single layer and/or a plurality of layers between the first electrode and the second electrode of the organic light-emitting device. The "organic layer" may include, in addition to an organic compound, an organometallic complex including a metal.

The FIGURE is a schematic view of a cross-sectional view of an organic light-emitting device 10 according to one or more embodiments. Hereinafter, the structure and manufacturing method of an organic light-emitting device according to one or more embodiments will be described with reference to the FIGURE. In the FIGURE, the organic light-emitting device 10 includes a first electrode 11, an organic layer 15, and a second electrode 19, which are sequentially stacked.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and/or water repellency.

The first electrode 11 may be produced by depositing or sputtering, onto the substrate, a material for forming the first electrode 11. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal or metal alloy, such as magnesium (Mg), aluminum (Al), silver (Ag), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. For example, the first electrode 11 may have a three-layered structure of ITO/Ag/ITO.

The organic layer 15 is located on the first electrode 11.

The organic layer 15 may include a hole transport region, an emission layer, and an electron transport region.

The hole transport region may be located between the first electrode 11 and the emission layer.

The hole transport region may include a hole injection layer, a hole transport layer, an electron-blocking layer, a buffer layer, or a combination thereof.

The hole transport region may include only either a hole injection layer or a hole transport layer. In one or more embodiments, the hole transport region may have a hole injection layer/hole transport layer structure or a hole injection layer/hole transport layer/electron-blocking layer structure, wherein, for each structure, respective layers are sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary depending on a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 angstroms per second (Å/sec) to about 100 Å/sec.

When the hole injection layer is formed by spin coating, the coating conditions may vary depending on a material for forming the hole injection layer, and the structure and thermal characteristics of the hole injection layer. For example, the coating conditions may include a coating speed in a range of about 2,000 revolutions per minute (rpm) to about 5,000 rpm and a heat treatment temperature in a range of about 80° C. to about 200° C. for removing a solvent after coating.

The conditions for forming the hole transport layer and the electron-blocking layer may be similar to or the same as the conditions for forming the hole injection layer.

The hole transport region may include at least one of 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), N,N'-di(naphthalene-1-yl)-N,N'-diphenyl-benzidine (NPB), β-NPB, N,N'-bis(3-methylphenyl)-N,N'-diphenyl-[1,1-biphenyl]-4,4'-diamine (TPD), spiro-TPD, spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or a combination thereof:

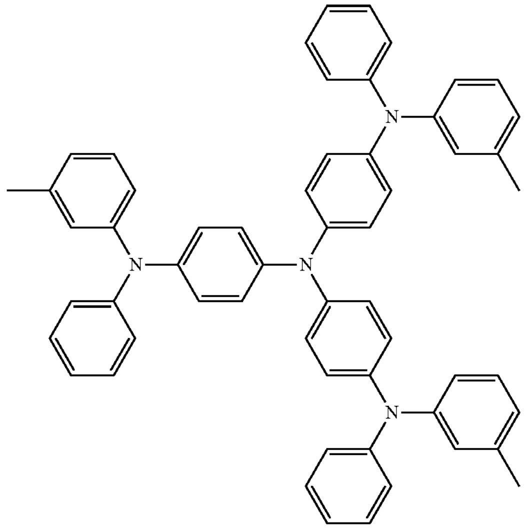

m-MTDATA

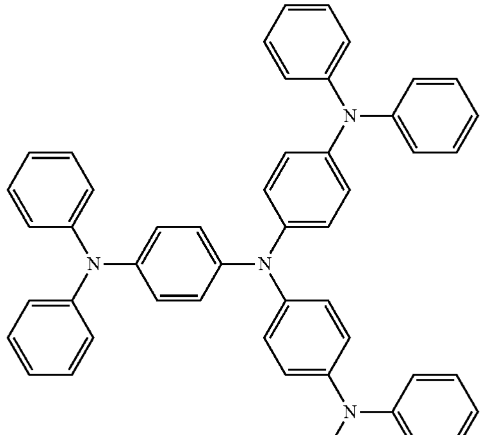

TDATA

-continued
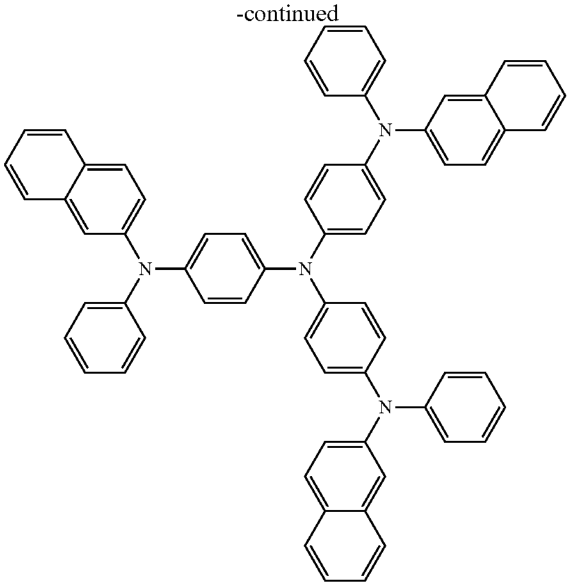
2-TNATA
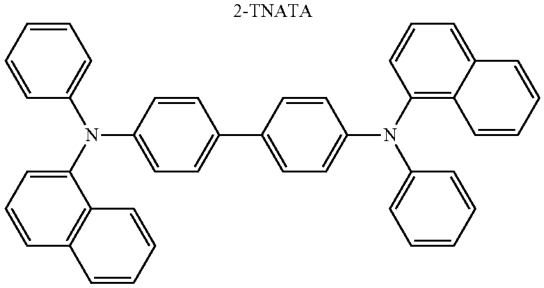
NPB
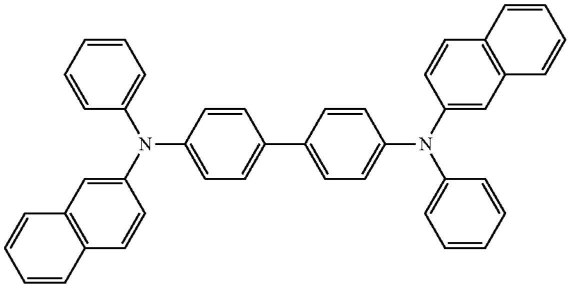
β-NPB
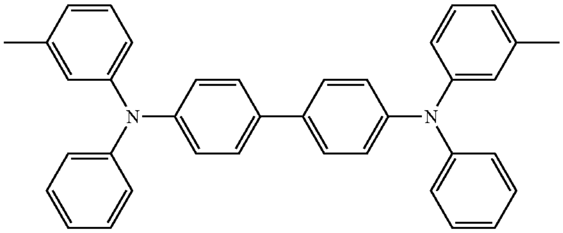
TPD
-continued
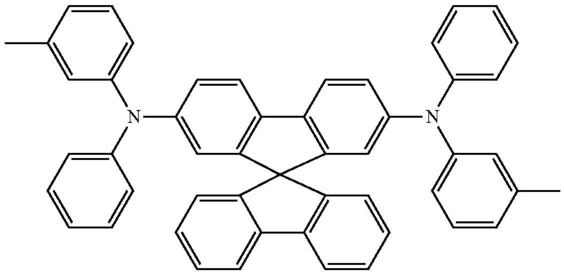
Spiro-TPD
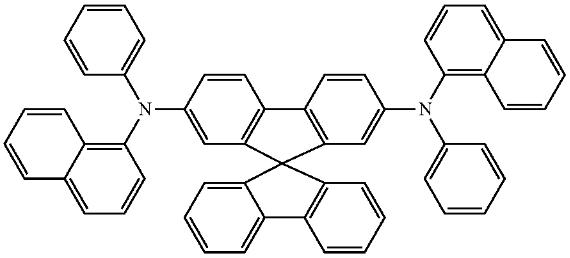
Spiro-NPB
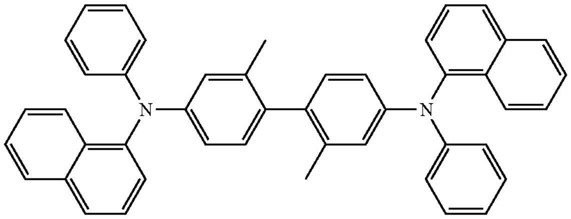
methylated NPB
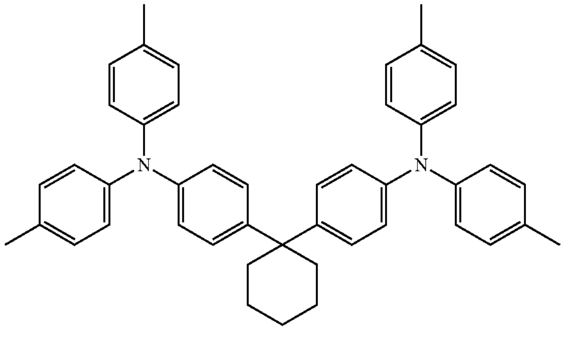
TAPC
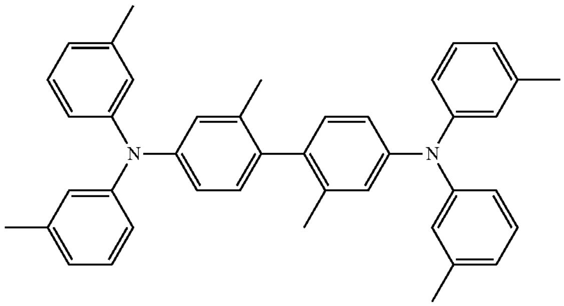
HMTPD -continued Formula 201

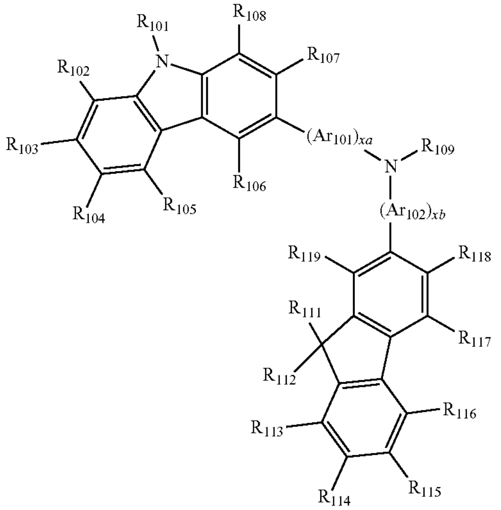

Formula 202

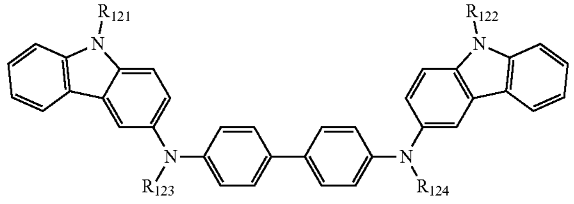

$Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

xa and xb in Formula 201 may each independently be an integer from 0 to 5, or 0, 1, or 2. For example, xa may be 1 and xb may be 0.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like), a $C_1$-$C_{10}$ alkoxy group (for example, a methoxy group, an ethoxy group, a propoxy group, a butoxy group, a pentoxy group, or the like), or a $C_1$-$C_{60}$ alkylthio group;

a $C_1$-$C_{10}$ alkyl group, a $C_1$-$C_{10}$ alkoxy group, or a $C_1$-$C_{10}$ alkylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group or a pyrenyl group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_1$-$C_{10}$ alkylthio group, or a combination thereof.

$R_{109}$ in Formula 201 may be a phenyl group, a naphthyl group, an anthracenyl group, or a pyridinyl group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a naphthyl group, an anthracenyl group, a pyridinyl group, or a combination thereof.

In one or more embodiments, the compound represented by Formula 201 may be represented by Formula 201A:

Formula 201A

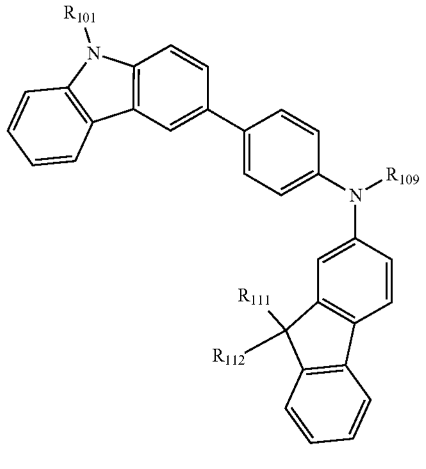

$R_{101}$, $R_{111}$, $R_{112}$, and $R_{109}$ in Formula 201A are each as described in the present specification.

For example, the hole transport region may include at least one of Compounds HT1 to HT20, or a combination thereof:
HT1
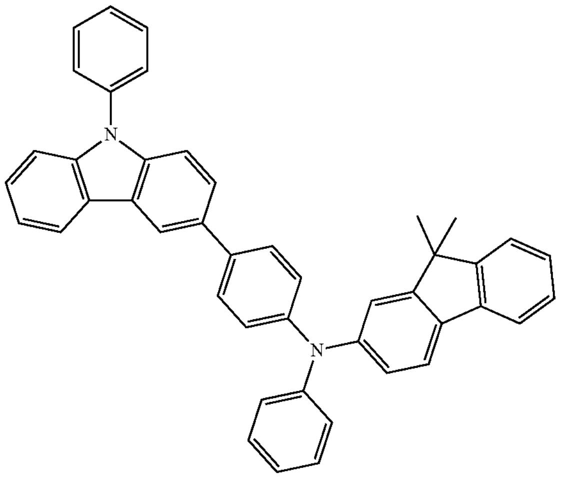
HT2
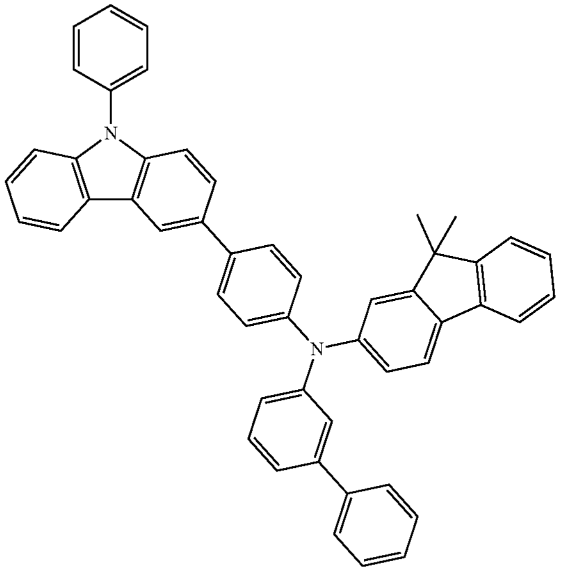
-continued
HT3
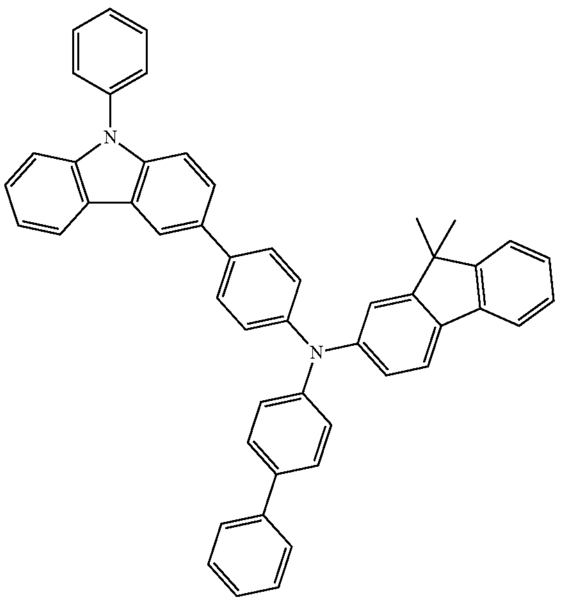
HT4
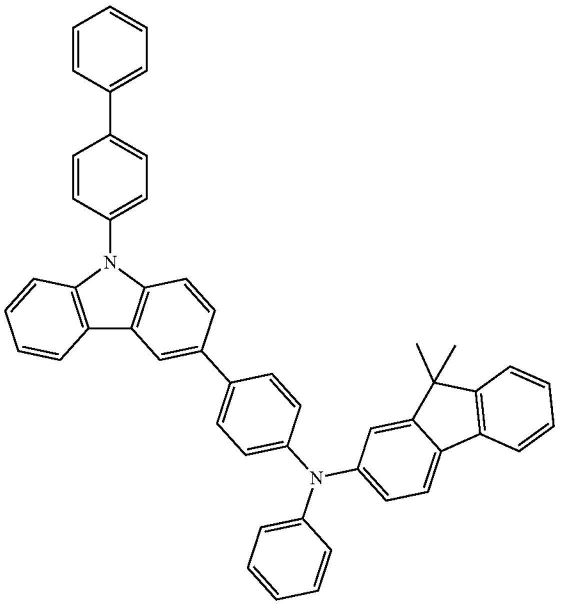

HT5
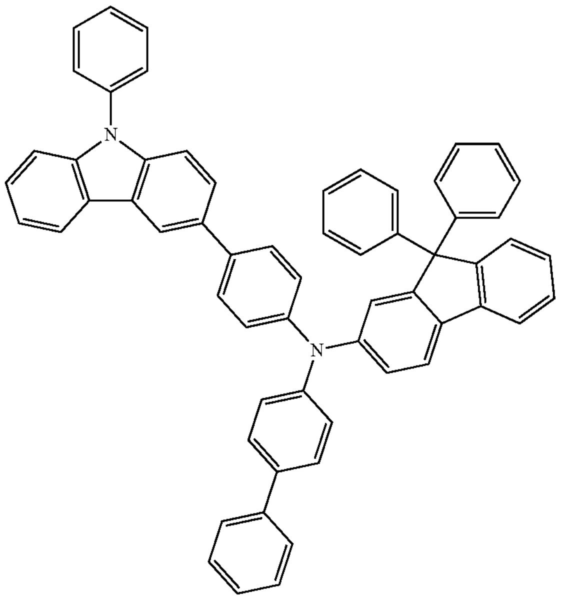
HT6
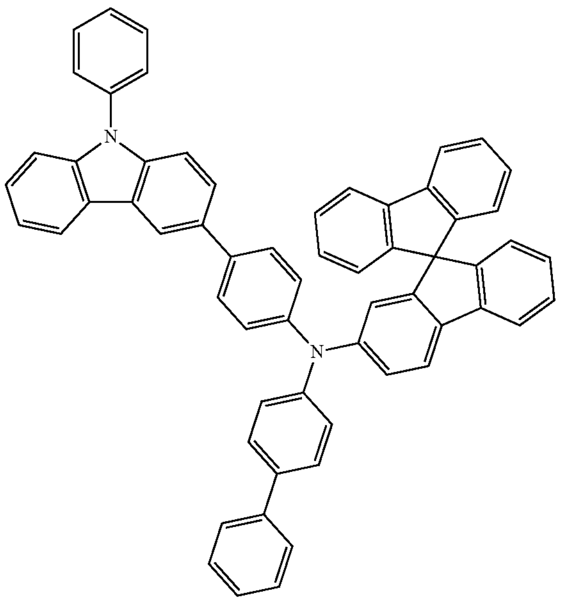
HT7
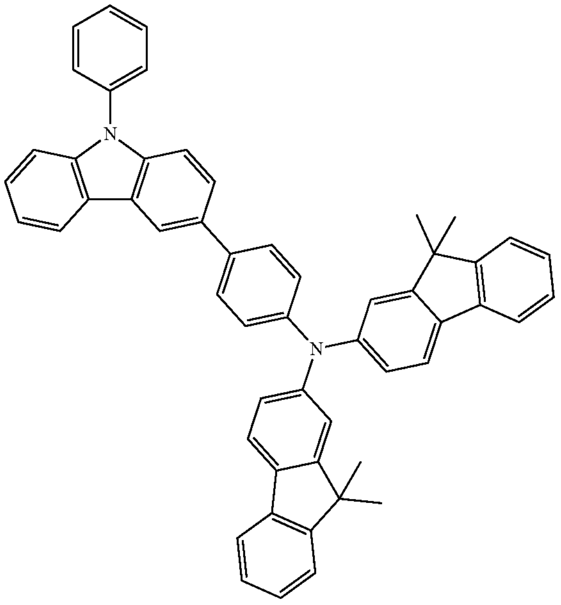
HT8
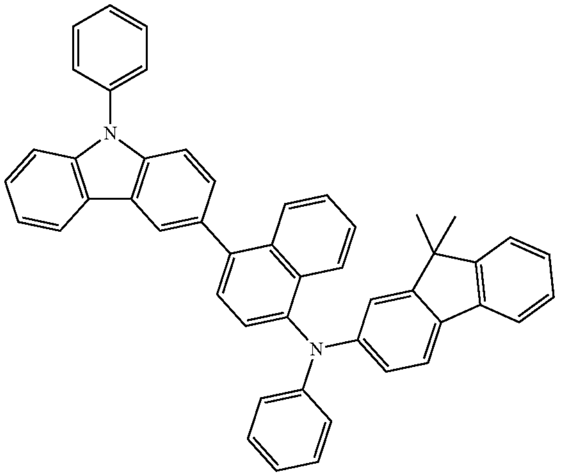
HT9
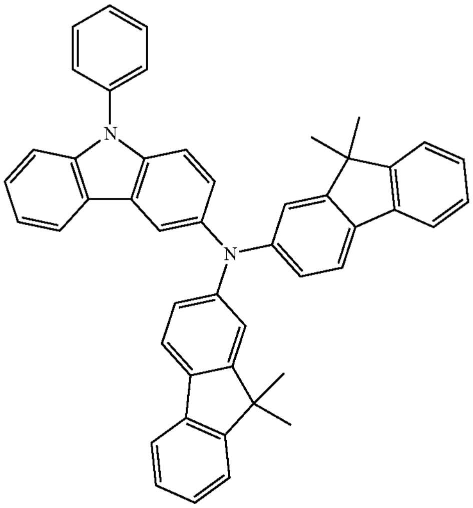

-continued
HT10
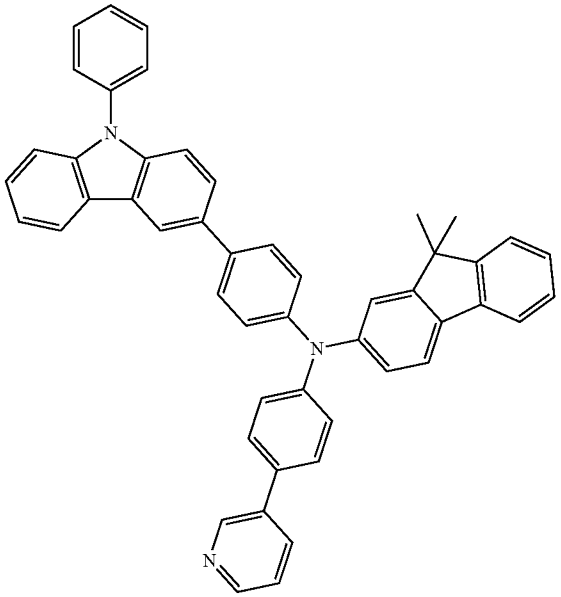
HT11
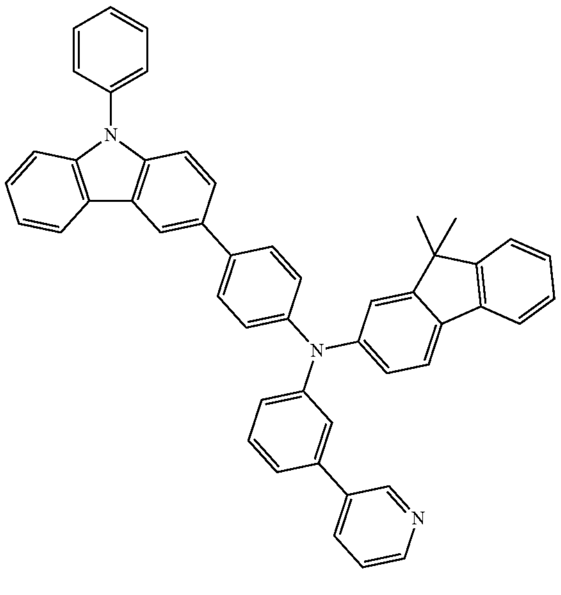
-continued
HT12
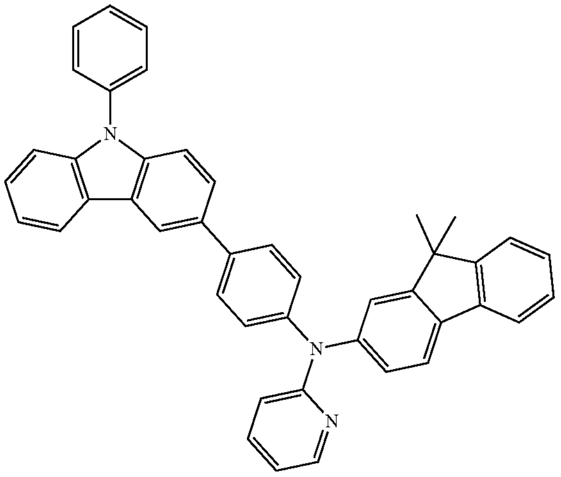
HT13
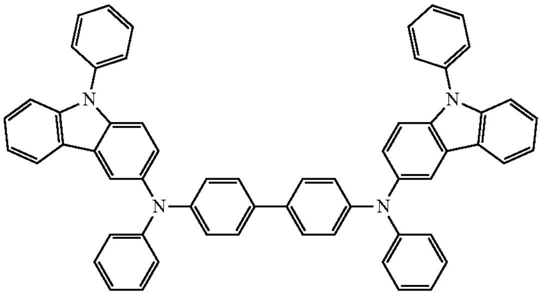
HT14
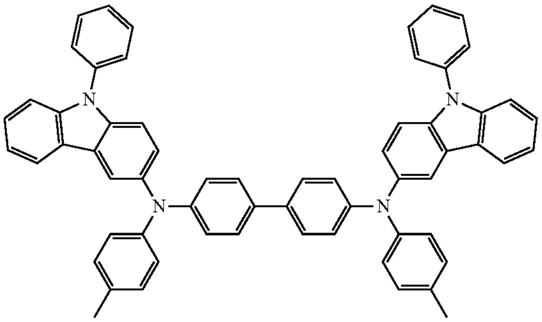
HT15
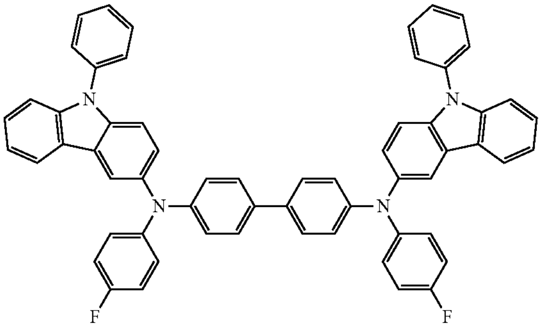

-continued

HT16

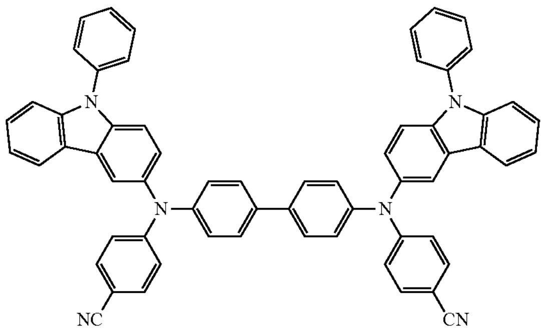

HT17

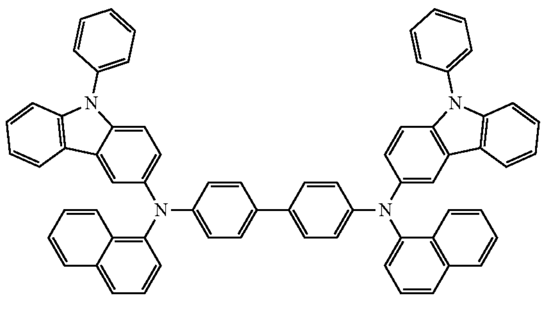

HT18

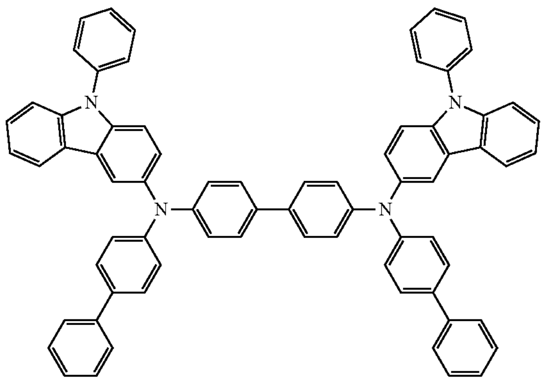

HT19

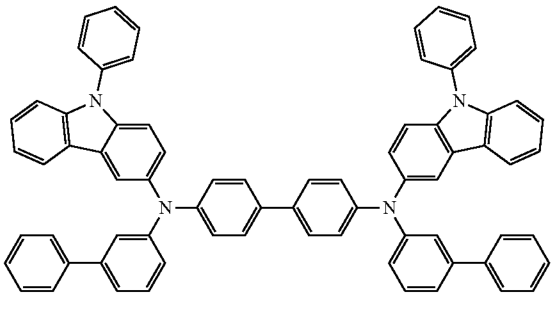

-continued

HT20

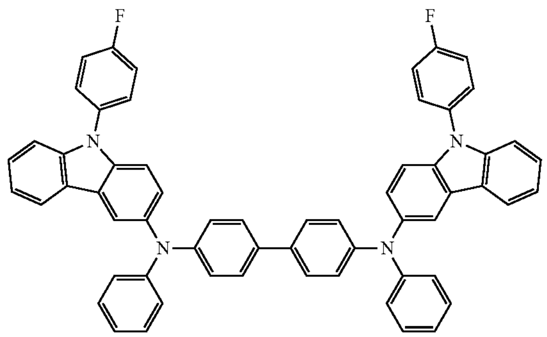

A thickness of the hole transport region may be in the range of about 100 Å to about 10,000 Å, for example, about 100 Å to about 1,000 Å. When the hole transport region includes a hole injection layer, a hole transport layer, an electron-blocking layer, or a combination thereof, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or a combination thereof. For example, the p-dopant may be: a quinone derivative such as tetracyanoquinodimethane (TCNQ), 2,3,5,6-tetrafluoro-tetracyano-1,4-benzoquinonedimethane (F4-TCNQ), or F6-TCNNQ; a metal oxide, such as tungsten oxide or molybdenum oxide; a cyano group-containing compound, such as Compound HT-D1; or a combination thereof.

HT-D1

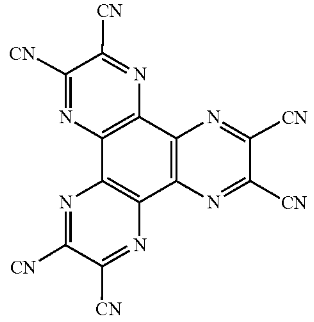

F4-TCNQ

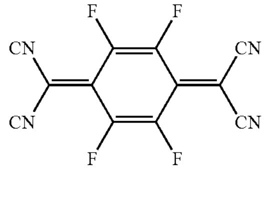

-continued

F6-TCNNQ

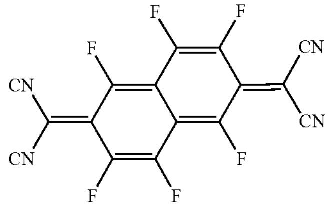

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron-blocking layer, a material for forming the electron-blocking layer may include a material that is used in the hole transport region as described above, a host material described below, or a combination thereof. In one or more embodiments, when the hole transport region includes an electron-blocking layer, mCP, which will be described later may be used as an electron-blocking layer material.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the emission layer.

The emission layer may include a host and a dopant, and the dopant may include the organometallic compound represented by Formula 1 as described herein.

The host may include 3-tert-butyl-9,10-di(naphth-2-yl) anthracene (TBADN), 9,10-di(naphthalen-2-yl)anthracene (ADN, also referred to as "DNA"), 4,4'-bis(N-carbazolyl)-1,1'-biphenyl (CBP), 4,4'-bis(9-carbazolyl)-2,2'-dimethyl-biphenyl (CDBP), N,N',N"-1,3,5-tricarbazoloylbenzene (TCP), 1,3-bis(carbazol-9-yl)benzene (mCP), Compound H50, Compound H51, Compound H52, or a combination thereof:

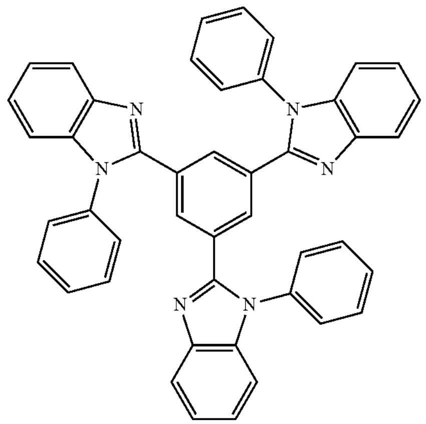

TPBi

-continued

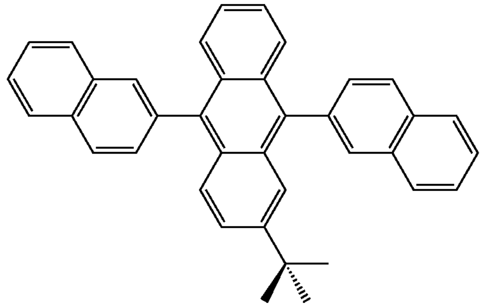

TBADN

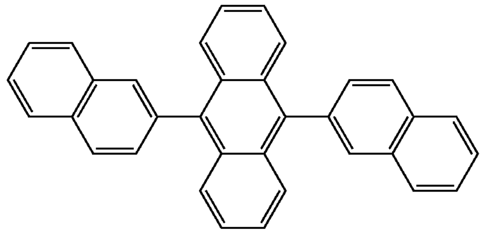

ADN

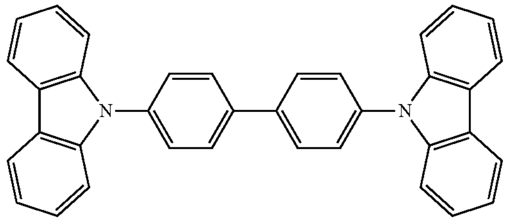

CBP

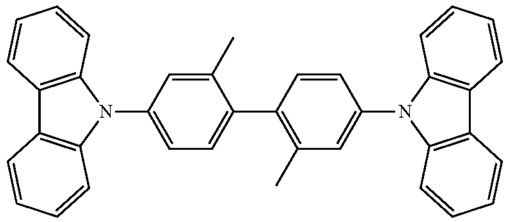

CDBP

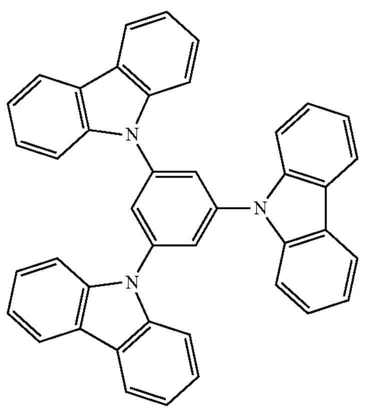

TCP

-continued

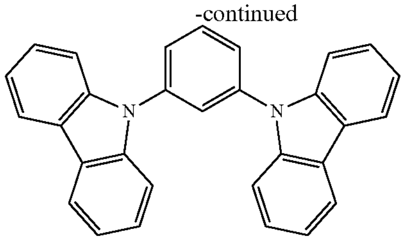

mCP

H50

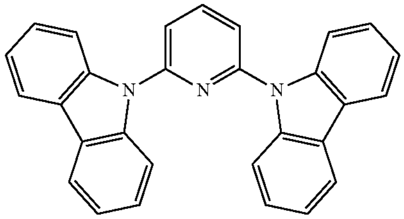

H51

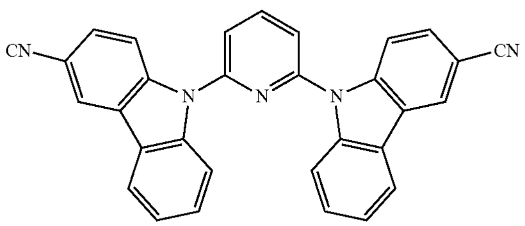

H52

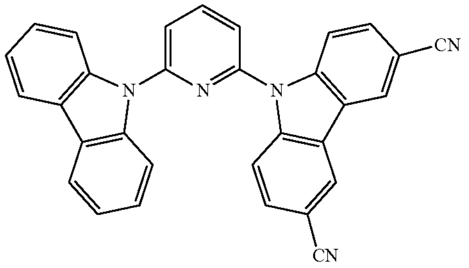

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host.

A thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

An electron transport region may be located on the emission layer.

The electron transport region may include a hole-blocking layer, an electron transport layer, an electron injection layer, or a combination thereof.

For example, the electron transport region may have a hole-blocking layer/electron transport layer/electron injection layer structure or an electron transport layer/electron injection layer structure. The electron transport layer may have a single-layered structure or a multi-layered structure including two or more different materials.

Conditions for forming the hole-blocking layer, the electron transport layer, and the electron injection layer which constitute the electron transport region may be understood by referring to the conditions for forming the hole injection layer.

When the electron transport region includes a hole-blocking layer, the hole-blocking layer may include, for example, 2,9-dimethyl-4,7-diphenyl-1,10-phenanthroline (BCP), 4,7-diphenyl-1,10-phenanthroline (Bphen), bis(2-methyl-8-quinolinolato-N1,08)-(1,1'-biphenyl-4-olato)aluminum (BAlq), or a combination thereof:

BCP

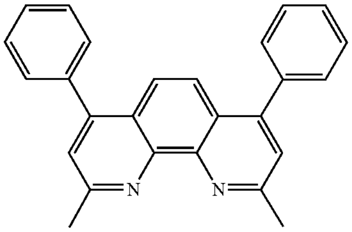

Bphen

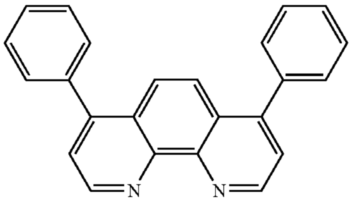

A thickness of the hole-blocking layer may be in a range of about 20 Å to about 1,000 Å, for example, about 30 Å to about 600 Å. When the thickness of the hole-blocking layer is within these ranges, excellent hole blocking characteristics may be obtained without a substantial increase in driving voltage.

The electron transport layer may include BCP, Bphen, 1,3,5-tris(N-phenylbenzimidazole-2-yl)benzene (TPBi), tris (8-hydroxyquinolinato)aluminum ($Alq_3$), bis(2-methyl-8-quinolinolato-N1,O8)-(1,1'-biphenyl-4-olato)aluminum (Balq), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), or a combination thereof:

$Alq_3$

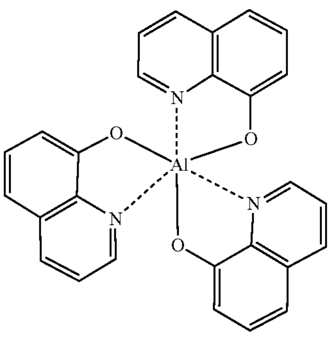

-continued
BAlq
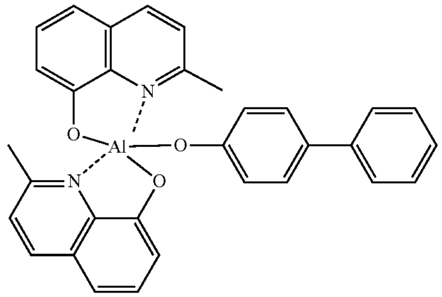
TAZ
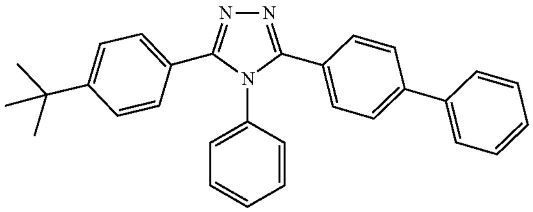
NTAZ
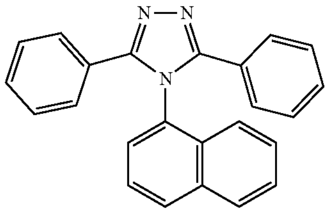
In one or more embodiments, the electron transport layer may include one of Compounds ET1 to ET25 or a combination thereof:
ET1
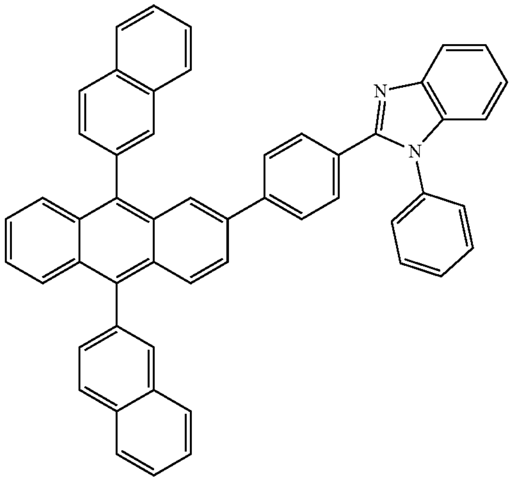
-continued
ET2
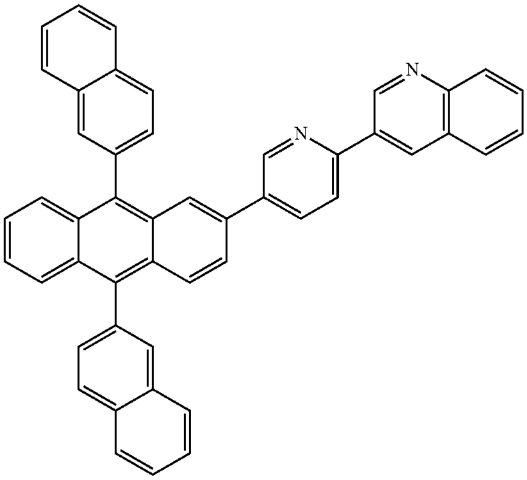
ET3
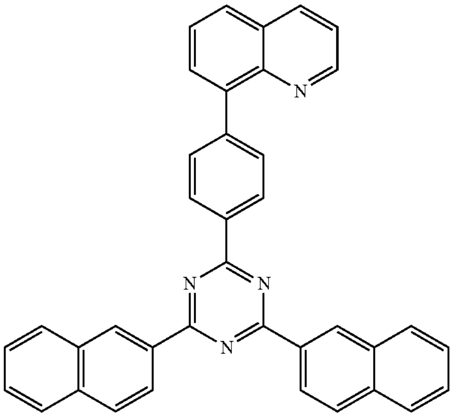
ET4
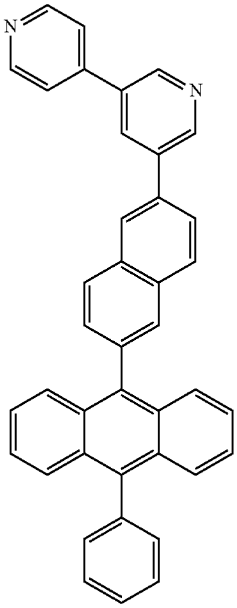

-continued
ET5
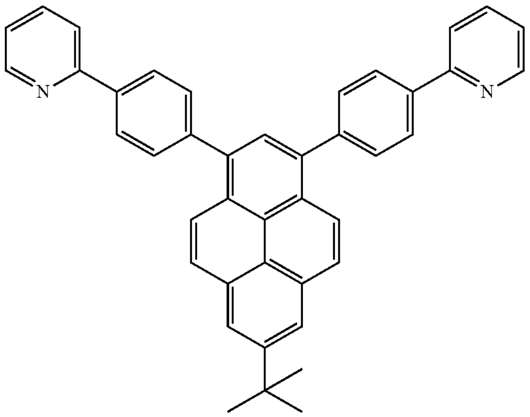
ET6
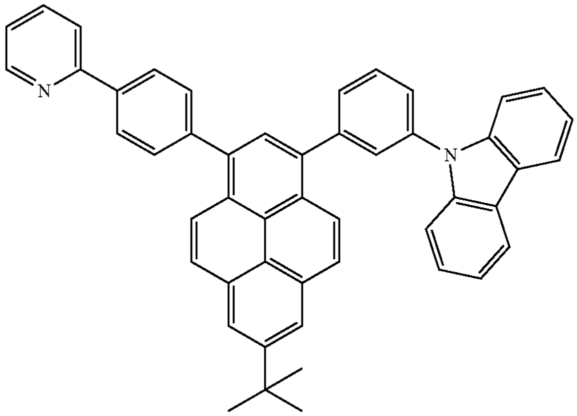
ET7
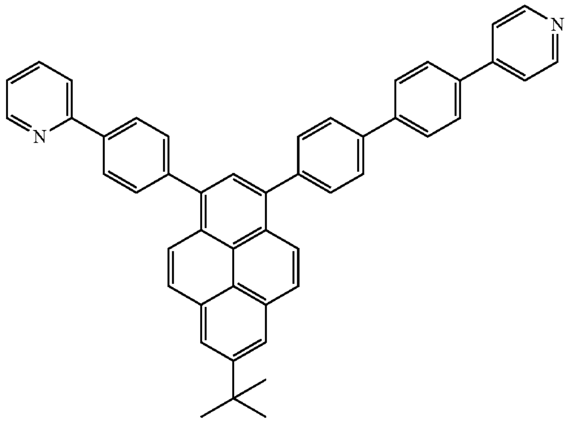
-continued
ET8
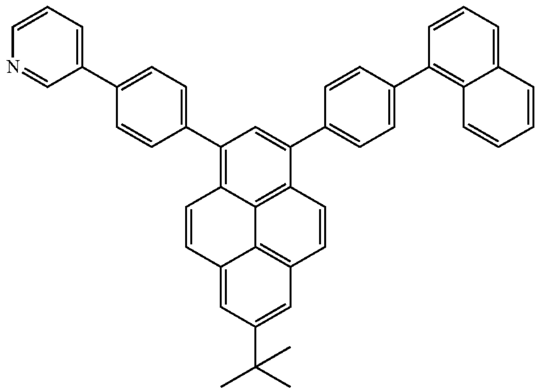
ET9
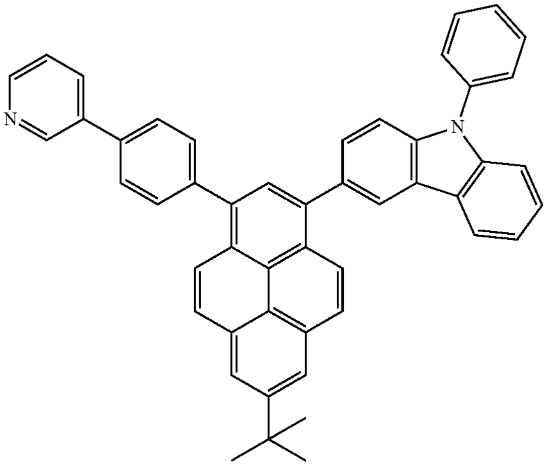
ET10
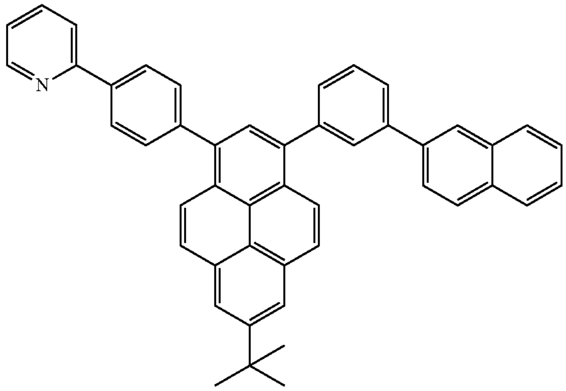
ET11
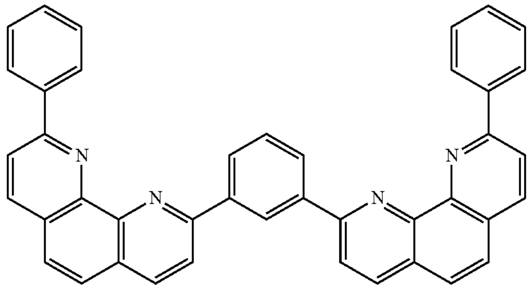

-continued
ET12
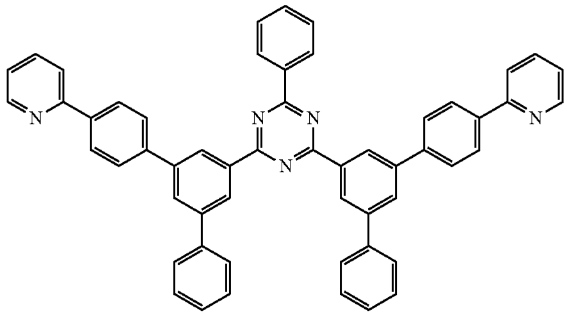
ET13
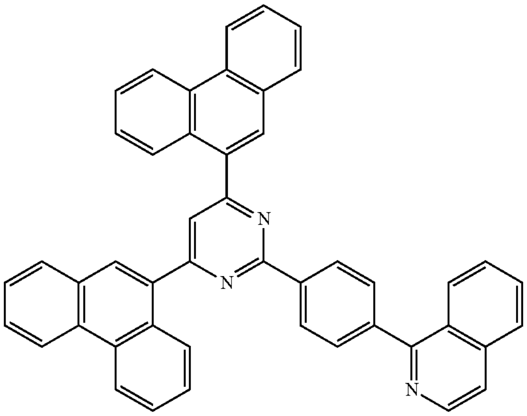
ET14
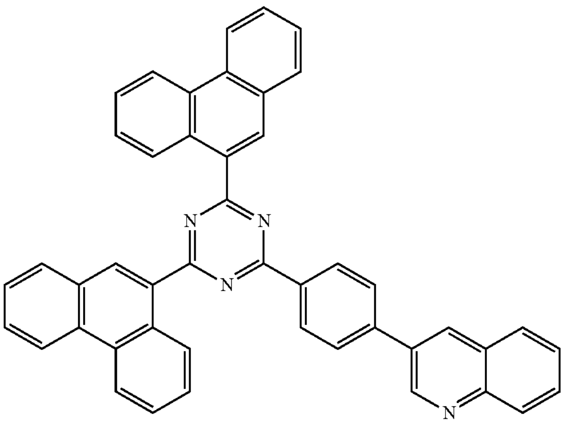
ET15
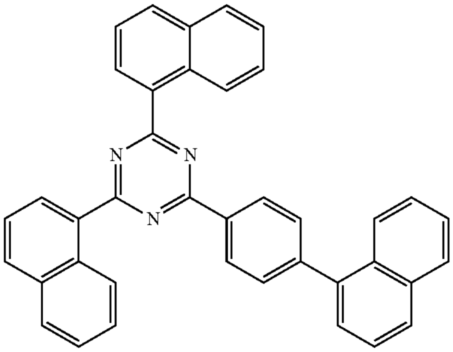
-continued
ET16
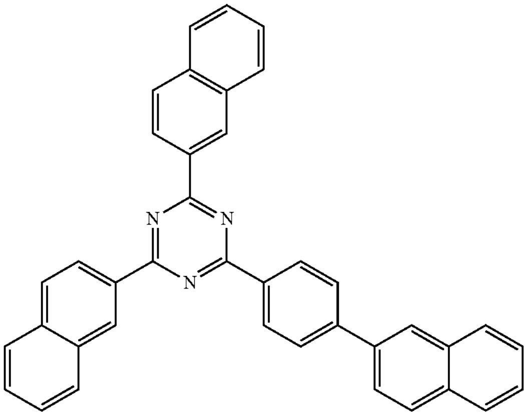
ET17
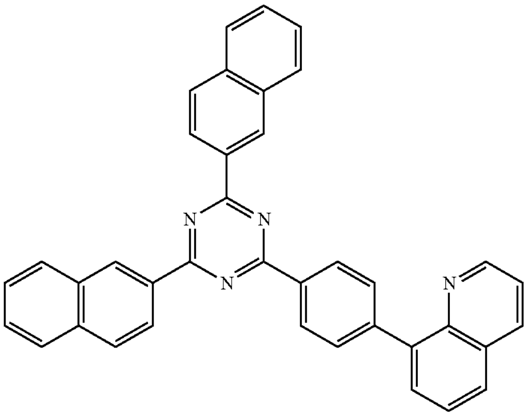
ET18
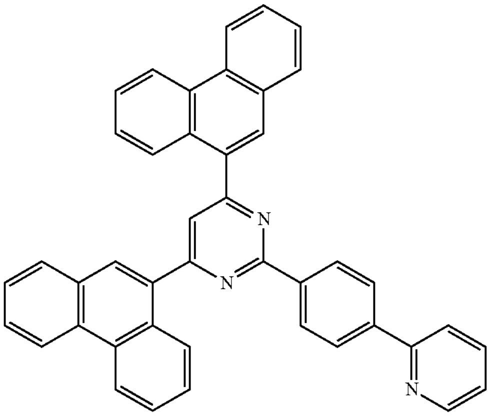

-continued
ET19
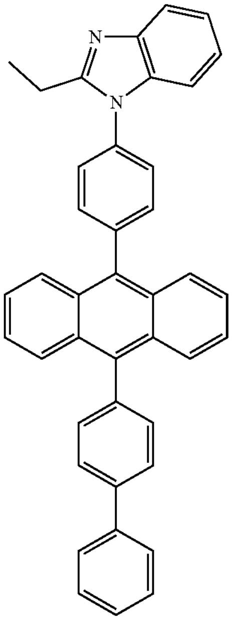
ET20
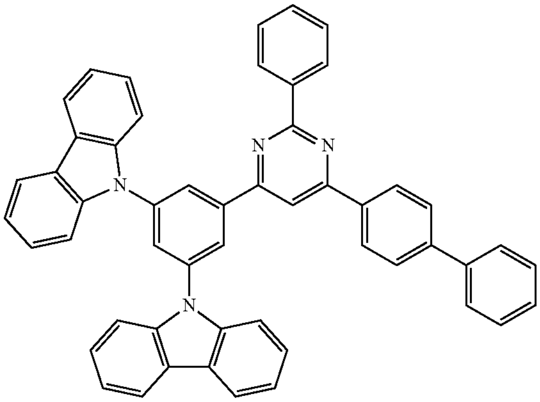
ET21
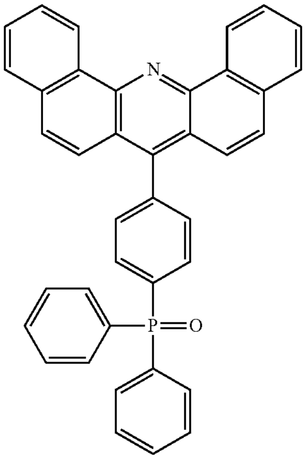
-continued
ET22
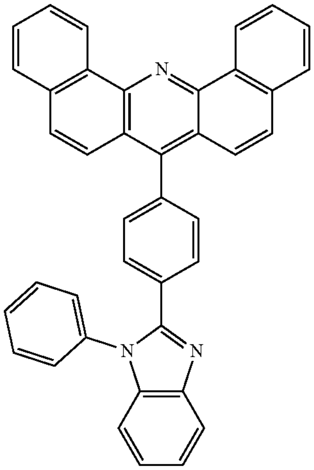
ET23
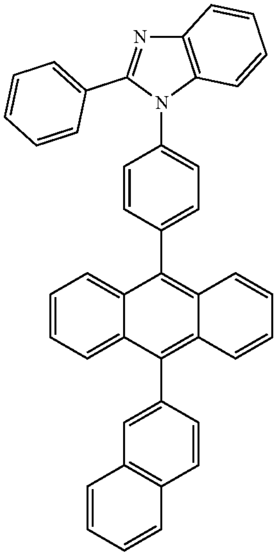
ET24
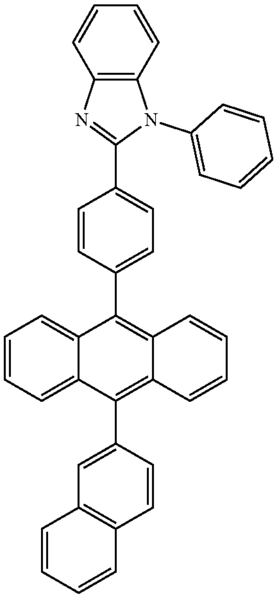

-continued

ET25

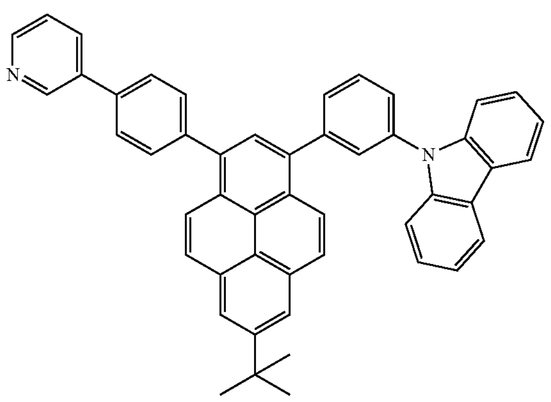

A thickness of the electron transport layer may be in the range of about 100 Å to about 1,000 Å, for example, about 150 Å to about 500 Å. When the thickness of the electron transport layer is within the range described above, the electron transport layer may have satisfactory electron transporting characteristics without a substantial increase in driving voltage.

The electron transport layer may include a metal-containing material in addition to the material as described above.

The metal-containing material may include a Li complex. The Li complex may include, for example, Compound ET-D1 or ET-D2:

ET-D1

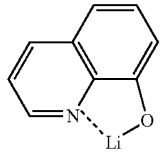

ET-D2

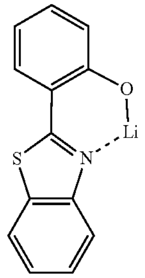

The electron transport region may include an electron injection layer that promotes the flow of electrons from the second electrode 19 thereinto.

The electron injection layer may include LiF, NaCl, CsF, $Li_2O$, BaO, or a combination thereof.

A thickness of the electron injection layer may be in a range of about 1 Å to about 100 Å, and, for example, about 3 Å to about 90 Å. When the thickness of the electron injection layer is within the ranges described above, satisfactory electron injection characteristics may be obtained without a substantial increase in driving voltage.

The second electrode 19 may be located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), silver (Ag), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device according to one or more embodiments has been described in connection with the FIGURE. However, embodiments of the present disclosure are not limited thereto.

According to another aspect, the organic light-emitting device may be included in an electronic apparatus. Thus, an electronic apparatus including the organic light-emitting device is provided. The electronic apparatus may include, for example, a display, an illumination, a sensor, and the like.

Another aspect provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group-as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with at least one of a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or a combination thereof. For example, Formula 9-33 is a branched $C_6$ alkyl group, for example, a tert-butyl group that is substituted with two methyl groups.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof are a methoxy group, an ethoxy group, a propoxy group, a butoxy group, and a pentoxy group.

The term "$C_1$-$C_{60}$ alkylthio group" as used herein refers to a monovalent group represented by —$SA_{101}$' (wherein $A_{101}$' is the $C_1$-$C_{60}$ alkyl group).

The term "$C_2$-$C_{60}$ alkenyl group" as used herein refers to a hydrocarbon group formed by substituting at least one carbon-carbon double bond in the middle or at the terminus of a $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of a $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group are a cyclopropyl group, a cyclobutyl group, a cyclopentyl, cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group.

The term "$C_1$-$C_{10}$ heterocycloalkyl group" as used herein refers to a monovalent saturated monocyclic group that includes at least one hetero atom selected from N, O, P, Si, S, Se, Ge, and B as a ring-forming atom and 1 to 10 carbon atoms. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group are a silolanyl group, a silinanyl group, tetrahydrofuranyl group, a tetrahydro-2H-pyranyl group, and a tetrahydrothiophenyl group.

The term "$C_3$-$C_{10}$ cycloalkenyl group" as used herein refers to a monovalent cyclic group that includes 3 to 10 carbon atoms and at least one carbon-carbon double bond in the ring thereof and has no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one hetero atom selected from N, O, P, Si, S, Se, Ge, and B as a ring-forming atom, 1 to 10 carbon atoms, and at least one double bond in its ring, and has no aromaticity. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_6o$ arylene group each include two or more rings, the rings may be fused to each other.

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_6o$ aryl group.

The term "$C_1$-$C_{60}$ heteroaryl group" as used herein refers to a monovalent group having at least one hetero atom selected from N, O, P, Si, S, Se, Ge, and B as a ring-forming atom and a cyclic aromatic system having 1 to 60 carbon atoms. The term "$C_1$-$C_{60}$ heteroarylene group" as used herein refers to a divalent group having at least one hetero atom selected from N, O, P, Si, S, Se, Ge, and B as a ring-forming atom and a carbocyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "$C_6$-$C_{60}$ aryloxy group" as used herein indicates —$OA_{102}$ (wherein $A_{102}$ indicates the $C_6$-$C_{60}$ aryl group). The term "$C_6$-$C_{60}$ arylthio group" as used herein indicates —$SA_{103}$(wherein $A_{103}$ indicates the $C_6$-$C_{60}$ aryl group).

The term "$C_1$-$C_{60}$ heteroaryloxy group" as used herein indicates —$OA_{102}$' (wherein $A_{102}$' indicates the $C_1$-$C_{60}$ heteroaryl group). The term "$C_1$-$C_{60}$ heteroarylthio group" as used herein indicates —$SA_{103}$' (wherein $A_{103}$' indicates the $C_1$-$C_{60}$ heteroaryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group (for example, having 1 to 60 carbon atoms) having two or more rings condensed to each other, at least one heteroatom selected from N, O, P, Si, S, Se, Ge, and B, other than carbon atoms, as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group described above.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the "$C_5$-$C_{30}$ carbocyclic group (unsubstituted or substituted with at least one $R_{10}a$)" used herein are an adamantane group, a norbornene group, a bicyclo[1.1.1]pentane group, a bicyclo[2.1.1]hexane group, a bicyclo[2.2.1]heptane (norbornane) group, a bicyclo[2.2.2]octane group, a cyclopentane group, a cyclohexane group, a cyclohexene group, a phenyl group, a naphthalene group, an anthracene group, a phenanthrene group, a triphenylene group, a pyrene group, a chrysene group, a 1,2,3,4-tetrahydronaphthalene group, a cyclopentadiene group, and a fluorene group (each unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, P, Si, S, Se, Ge, and B other than 1 to 30 carbon atoms. The $C_1$-$C_{30}$ heterocyclic group may be a monocyclic group or a polycyclic group. The "$C_1$-$C_{30}$ heterocyclic group (unsubstituted or substituted with at least one $R_{10a}$)" may be, for example, a thiophene group, a furan group, a pyrrole group, a silole group, borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (each unsubstituted or substituted with at least one $R_{10a}$).

Examples of the "$C_5$-$C_{30}$ carbocyclic group" and the "$C_1$-$C_{30}$ heterocyclic group" as used herein are i) a first ring, ii) a second ring, iii) a condensed ring in which two or more first rings are condensed with each other, iv) a condensed ring in which two or more second rings are condensed with each other, or v) a condensed ring in which at least one first ring is condensed with at least one second ring, wherein the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a phenyl group, a pyridine group, a pyrimidine group, a pyrazine group, a pyridazine group, or a triazine group.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" as used herein respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the term "fluorinated $C_1$ alkyl group (that is, a fluorinated methyl group)" includes —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated a phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or partially fluorinated phenyl group, wherein, in each group, not all hydrogen included therein is substituted with a fluoro group.

The term "deuterated group" as used herein refers to a substituent group having at least one hydrogen atom substituted with deuterium. The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group," and "deuterated phenyl group" as used herein respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" are, for example, Formula 10-501 and the like. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated $C_1$-$C_{10}$ heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen included therein are substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, not all hydrogen included therein are substituted with deuterium.

The term "deuterium-free group" as used herein refers to a substituent group that does not have at least one hydrogen atom substituted with deuterium. That is, the term "deuterium-free group" as used herein refers to a substituent group that does not have a deuterium.

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl) $C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl)phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, and a dibenzothiophene 5,5-dioxide group," in which, in each group, at least one carbon selected from ring-forming carbons is substituted with nitrogen.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_1$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may each independently be:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-Coo arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or a combination thereof.

$Q_1$ to $Q_9$, $Q_{11}$ to $Q_{19}$, $Q_{21}$ to $Q_{29}$, and $Q_{31}$ to $Q_{39}$ used herein may each independently be: hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

For example, $Q_1$ to $Q_9$, $Q_{11}$ to $Q_{19}$, $Q_{21}$ to $Q_{29}$ and $Q_{31}$ to $Q_{39}$ as described herein may each independently be:

$-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, $-CHDCD_2H$, $-CHDCDH_2$, $-CHDCD_3$, $-CD_2CD_3$, $-CD_2CD_{2H}$, or $-CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, a $C_1$-$C_{10}$ alkyl group, a phenyl group, or a combination thereof.

Hereinafter, a compound and an organic light-emitting device according to one or more exemplary embodiments are described in further detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 1)

Synthesis of Compound C1

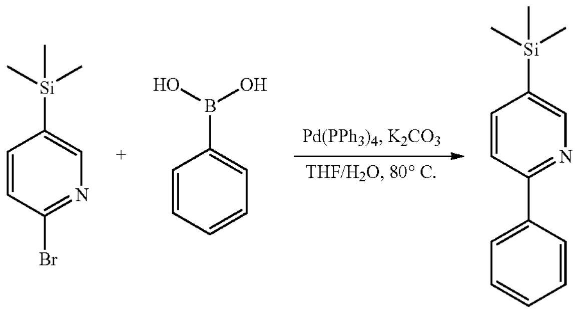

C1

80 milliliters (mL) of tetrahydrofuran (THF) and 30 ml of deionized (DI) water were mixed with 2-bromo-5-(trimethylsilyl)pyridine (10 grams (g), 43.44 millimoles (mmol)), phenylboronic acid (5.83 g mmol), 47.79 tetrakis(triphenylphosphine)palladium(0) ($Pd(PPh_3)_4$, 2.51 g, 2.17 mmol), and potassium carbonate ($K_2CO_3$, 18.01 g, 130.33 mmol), and then, the mixture was stirred and heated under reflux at 80° C. for 18 hours. After the temperature was allowed to lower to room temperature, the organic layer was extracted using methylene chloride (MC), anhydrous magnesium sulfate ($MgSO_4$) was added thereto to remove moisture, and the filtrate obtained by filtration was exposed to reduced pressure to obtain the residual product, which was then purified by column chromatography using ethyl acetate (EA) and hexane at a ratio of 1:4 (volume ratio, the same below), thereby obtaining 7.23 g (73%) of Compound C1.

Synthesis of Compound B1

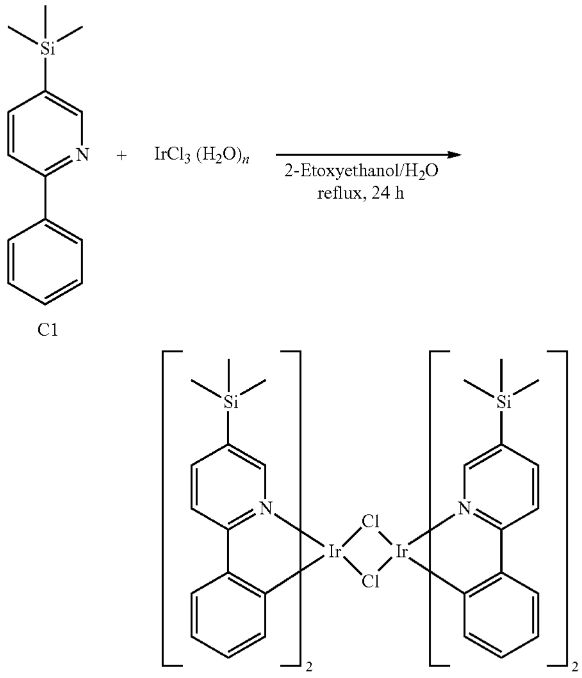

C1

B1

90 mL of 2-ethoxyethanol and 30 mL of DI water were mixed with Compound C1 (5.0 g, 22.04 mmol) and iridium chloride trihydrate ($IrCl_3(H_2O)_n$, n=3, 3.70 g, 10.49 mmol), and then, the mixture was stirred and heated under reflux for 24 hours, and then, the temperature was allowed to lower to room temperature. The resulting solid was separated by filtration, washed sufficiently with DI water, methanol (MeOH), and hexanes, in this stated order, and then dried in a vacuum oven to obtain 6.53 g (46%) of Compound B1.

Synthesis of Compound A1

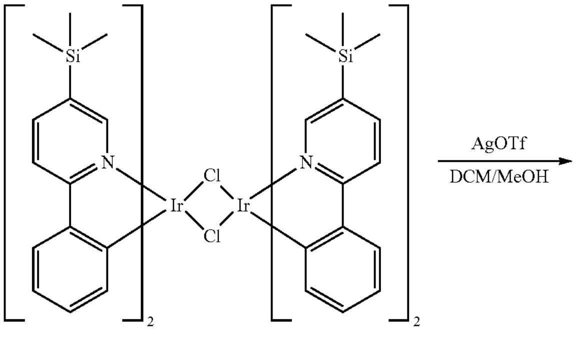

B1

-continued

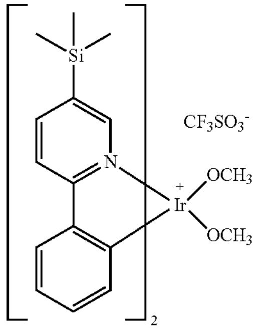

A1

Compound B1 (5.00 g, 3.67 mmol) was mixed with 90 mL of MC (i.e., DCM), and then, (trifluoromethanesulfonate) silver (I) (AgOTf, 2.03 g, 7.90 mmol) dissolved in 30 mL of methanol was added thereto. Afterwards, the resultant reaction solution was stirred to proceed a reaction for 18 hours at room temperature while light was blocked from the reaction solution with aluminum foil, and then filtered through CELITE to remove a solid produced therein. The filtrate was then subjected to reduced pressure to obtain a solid (Compound A1) that was used in the next reaction without an additional purification process.

Synthesis of Compound L1

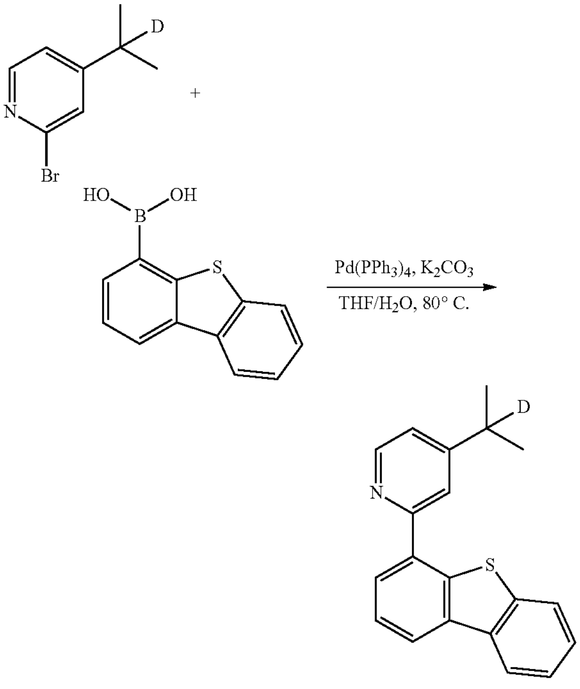

L1

2-bromo-4-(propan-2-yl-2-d)pyridine (4.44 g, 22.20 mmol), dibenzo[b,d]thiophen-4-ylboronic acid (5.06 g, 22.20 mmol), $Pd(PPh_3)_4$ (1.28 g, 1.11 mmol), and $K_2CO_3$ (9.20 g, 66.60 mmol) were mixed with 90 mL of THF and 30 mL of DI water, followed by stirring and heating under reflux for at 80° C. 18 hours. After the temperature was allowed to lower to room temperature, the organic layer was extracted using MC, anhydrous $MgSO_4$ was added thereto to remove residual water, and the filtrate obtained by filtration was subjected to reduced pressure to obtain the residual product, which was then purified by column chromatography using EA and hexane at a ratio of 1:2, thereby obtaining 4.93 g (73%) of Compound $L_1$.

Synthesis of Compound 1

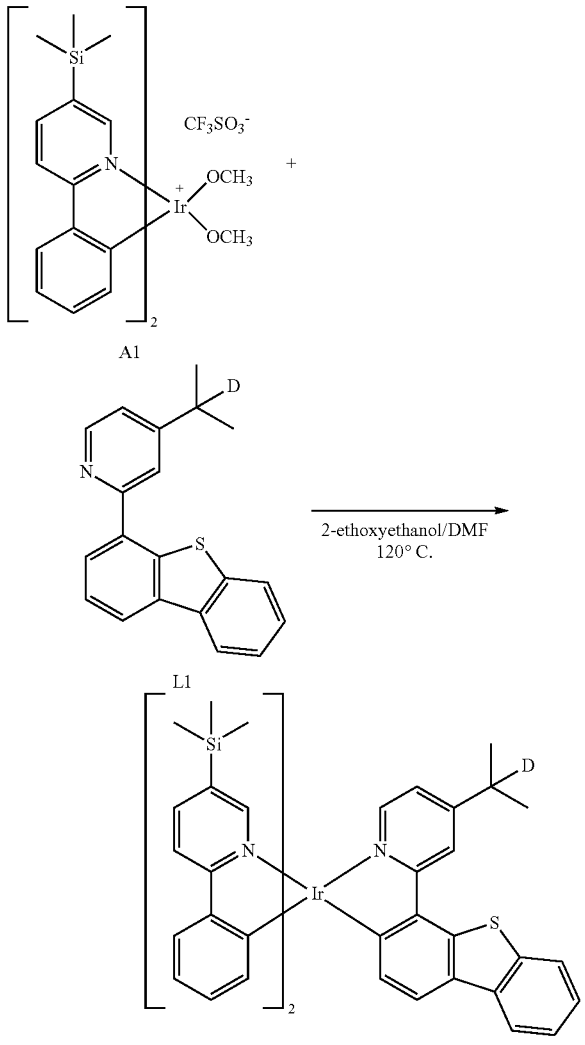

1

Compound A1 (5.15 g, 6.00 mmol) and Compound L1 (1.83 g, 6.00 mmol) were mixed with 50 mL of 2-ethoxyethanol and 50 ml of N,N-dimethylformamide (DMF), and then, the resultant solution was stirred and heated under reflux for 48 hours at a temperature of 120° C. Then, the temperature was allowed to lower to room temperature. After removing the solvents under reduced pressure, column chromatography was performed using EA and hexane at a ratio of 1:8 to obtain 1.42 g (25%) of Compound 1. The obtained compound was identified by high resolution mass spectrometry using matrix assisted laser desorption ionization (HRMS (MALDI)) and high-performance liquid chromatography (HPLC) analysis.

HRMS (MALDI) calculated for $C_{48}H_{47}DIrN_3SSi_2$: m/z: 948.2799, found: 948.2805.

Synthesis Example 2 (Compound 2)

Synthesis of Compound C2

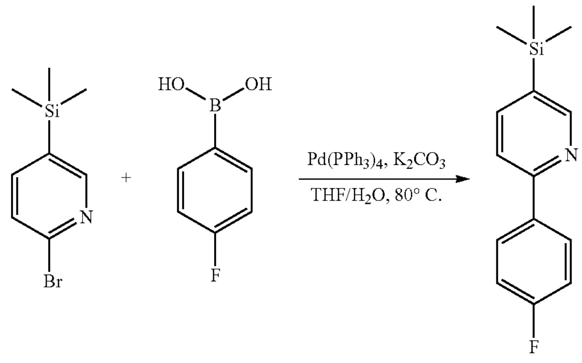

C2

2-bromo-5-(trimethylsilyl)pyridine (10 g, 43.44 mmol), 4-fluorophenylboronic acid (6.08 g, 43.44 mmol), $Pd(PPh_3)_4$ (2.51 g, 2.17 mmol), and $K_2CO_3$ (18.01 g, 130.33 mmol) were mixed with 90 mL of tetrahydrofuran (THF) and 30 mL of DI water, and then stirred and heated under reflux at 80° C. for 18 hours. After the temperature was allowed to lower to room temperature, the organic layer was extracted using MC, anhydrous $MgSO_4$ was added thereto to remove residual water, and the filtrate obtained by filtration was subjected to reduced pressure to obtain the residual product, which was then purified by column chromatography using EA and hexane at a ratio of 1:4, thereby obtaining 8.53 g (80%) of Compound $C_2$.

Synthesis of Compound B2

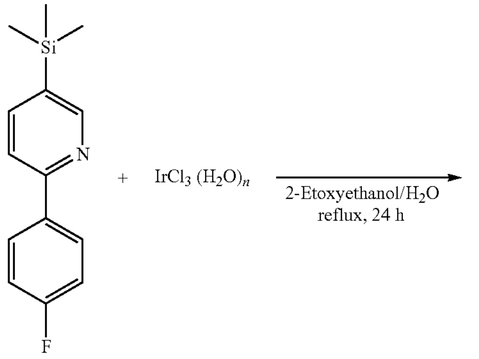

C2

-continued

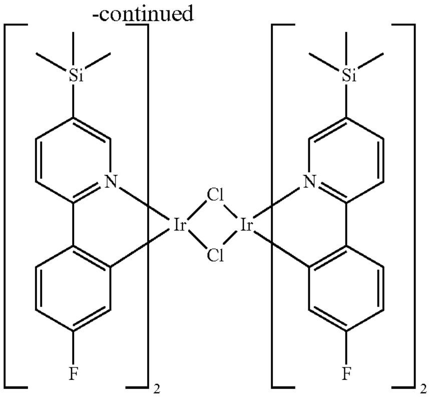

B2

Compound C2 (7.36 g, 30.00 mmol) and iridium chloride hydrate (8.66 g, 29.00 mmol) were mixed with 90 mL of 2-ethoxyethanol and 30 mL of DI water, and then, the mixture was stirred and heated under reflux for 24 hours, and then, the temperature was allowed to lower to room temperature. The resulting solid was separated by filtration, washed sufficiently with DI water, methanol, and hexanes, in this stated order, and then dried in a vacuum oven to obtain 8.60 g (80%) of Compound B2.

Synthesis of Compound A2

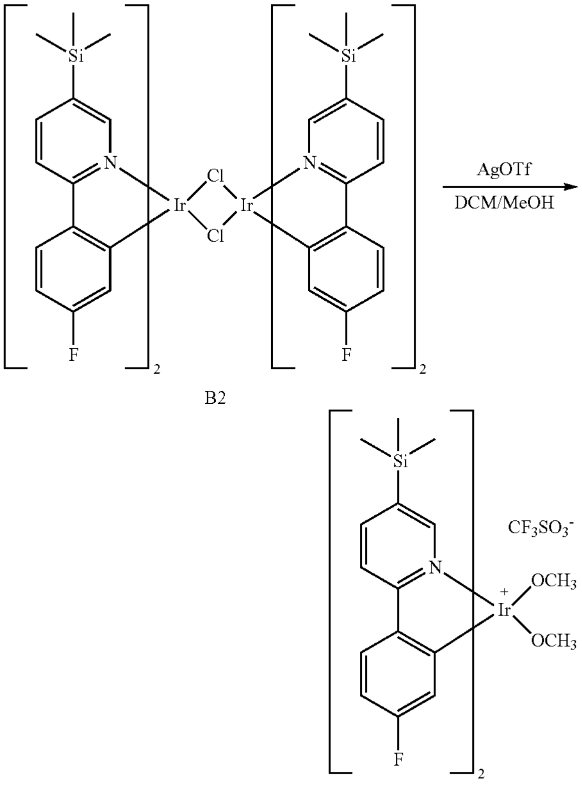

B2

A2

Compound B2 (5.26 g, 3.67 mmol) was mixed with 90 mL of MC, and then, AgOTf (1.13 g, 4.40 mmol) dissolved in 30 mL of methanol was added thereto. Afterwards, the resultant reaction solution was stirred to proceed a reaction for 18 hours at room temperature while light was blocked from the reaction solution with aluminum foil, and filtered through CELITE to remove a solid produced therein. The filtrate was then subjected to reduced pressure to obtain a solid (Compound A2) which was used in the next reaction without an additional purification process.

Synthesis of Compound L2

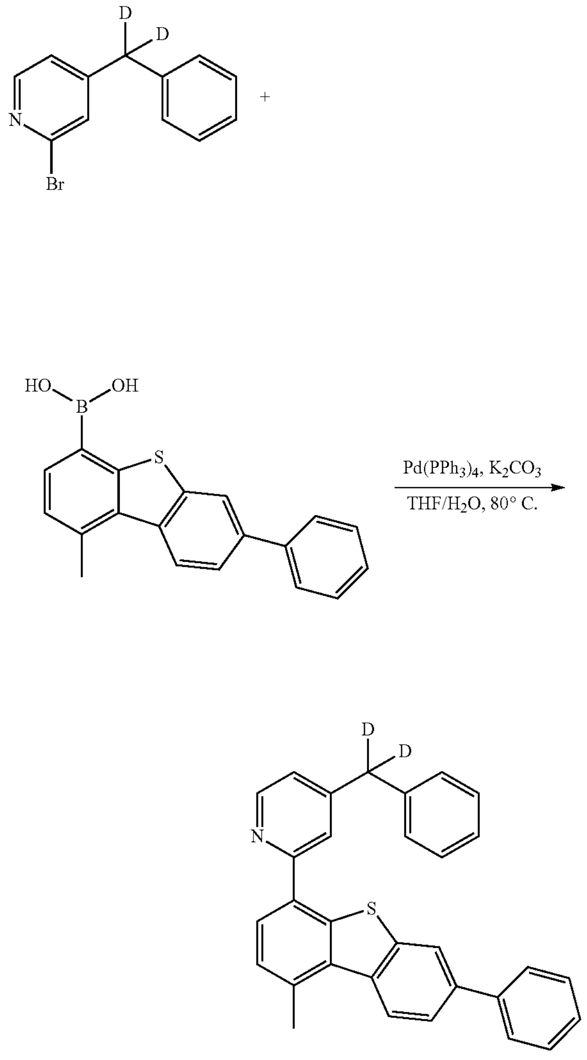

L2

2-bromo-4-(phenylmethyl-d2)pyridine (5.00 g, 20.00 mmol), (1-methyl-7-phenyldibenzo[b,d]thiophen-4-yl)boronic acid (6.36 g, 20.00 mmol), Pd(PPh$_3$)$_4$ (1.14 g, 1.00 mmol), and $K_2CO_3$ (8.29 g, 60.00 mmol) were mixed with 90 mL of THF and 30 ml of DI water, followed by stirring and heating under reflux at 80° C. for 18 hours. After the temperature was allowed to lower to room temperature, the organic layer was extracted using MC, anhydrous $MgSO_4$ was added thereto to remove residual water, and the filtrate obtained by filtration was subjected to reduced pressure to obtain the residual product, which was then purified by column chromatography using EA and hexane at a ratio of 1:2, thereby obtaining 7.72 g (87%) of Compound L2.

Synthesis of Compound 2

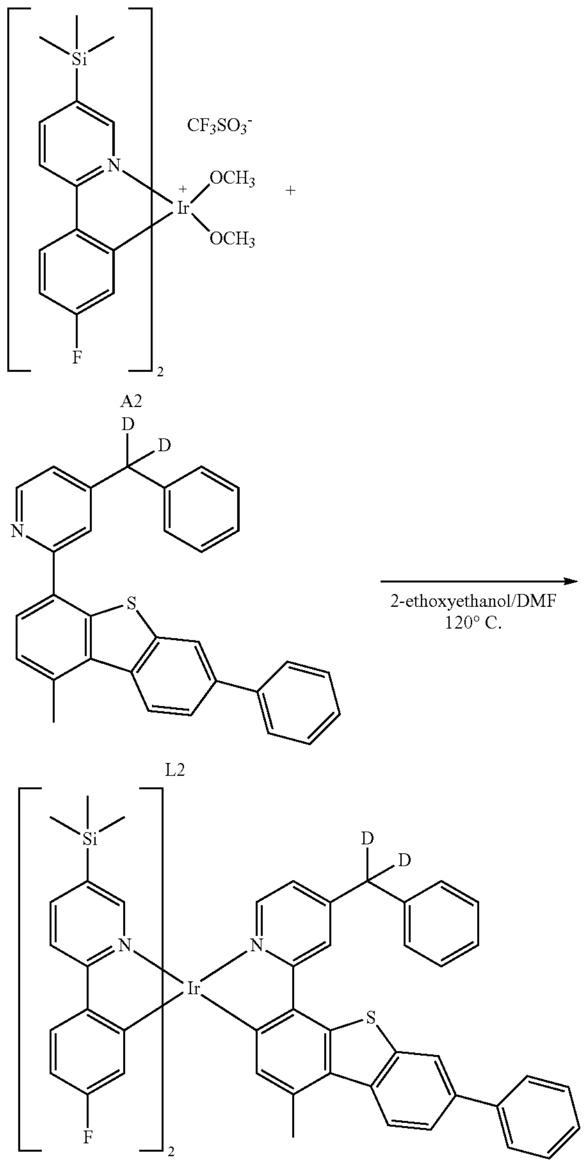

A2

L2

2

Compound A2 (3.00 g, 3.36 mmol) and Compound L2 (1.49 g, 3.36 mmol) were mixed with 50 mL of 2-ethoxyethanol and 50 mL of N,N-dimethylformamide, and then, the resultant solution was stirred under reflux for 48 hours at a temperature of 120° C. Then, the temperature was allowed to lower to room temperature. After removing the solvents under reduced pressure condition, column chromatography was performed using EA and hexane at a ratio of 1:10 to obtain 0.79 g (21%) of Compound 2. The obtained compound was identified by HRMS (MALDI) and HPLC analysis.

HRMS (MALDI) calculated for $C_{59}H_{50}D_2F_2IrN_3SSi_2$: m/z: 1123.3143, found: 1123.3102.

Synthesis Example 3 (Compound 3)

Synthesis of Compound C3

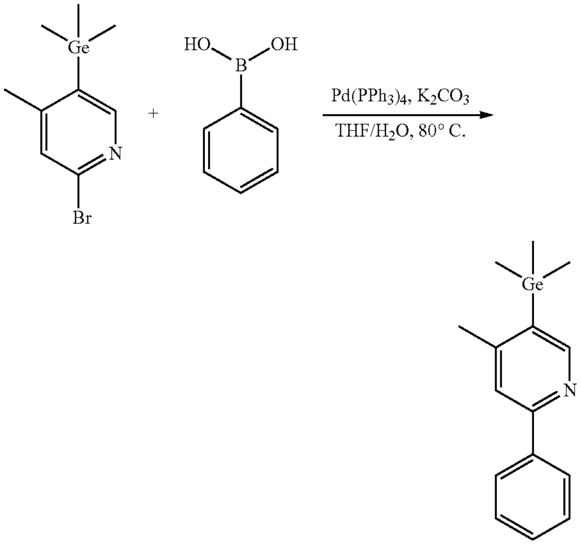

C3

2-bromo-4-methyl-5-(trimethylgermyl)pyridine (5 g, 17.32 mmol), phenylboronic acid (2.11 g, 17.32 mmol), $Pd(PPh_3)_4$ (1.20 g, 1.04 mmol), and $K_2CO_3$ (7.18 g, 51.96 mmol) were mixed with 90 mL of tetrahydrofuran (THF) and 30 mL of DI water, and then stirred and heated under reflux at 80° C. for 18 hours. After the temperature was allowed to lower to room temperature, the organic layer was extracted using MC, anhydrous $MgSO_4$ was added thereto to remove residual water, and the filtrate obtained by filtration was subjected to reduced pressure to obtain the residual product, which was then purified by column chromatography using EA and hexane at a ratio of 1:8, thereby obtaining 4.21 g (85%) of Compound C3.

Synthesis of Compound B3

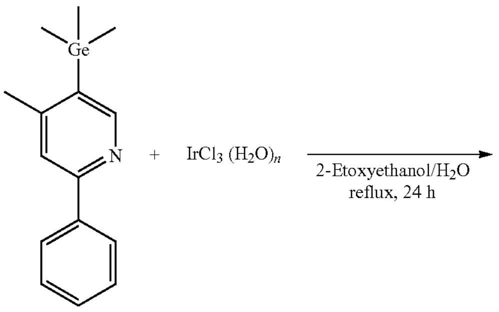

C3

-continued

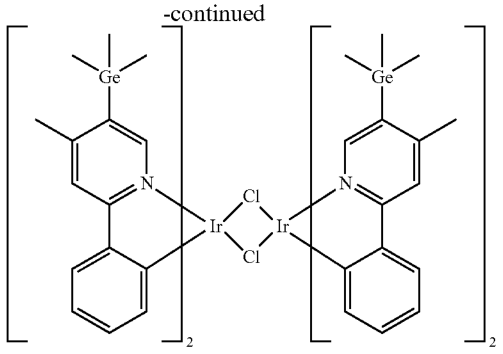

B3

Compound C3 (8.58 g, 30.00 mmol) and iridium chloride hydrate (4.48 g, 15.00 mmol) were mixed with 90 mL of 2-ethoxyethanol and 30 mL of DI water, and then, the mixture was stirred and heated under reflux for 24 hours, and then, the temperature was allowed to lower to room temperature. The resulting solid was separated by filtration, washed sufficiently with DI water, methanol, and hexane, in this stated order, and then dried in a vacuum oven to obtain 7.78 g (65%) of Compound B3.

Synthesis of Compound A3

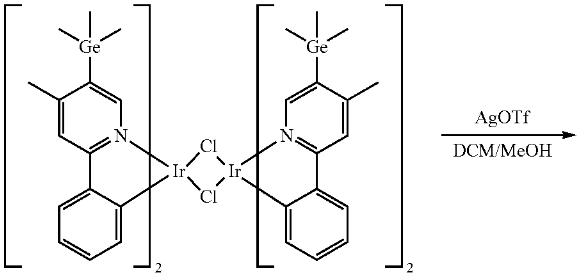

B3

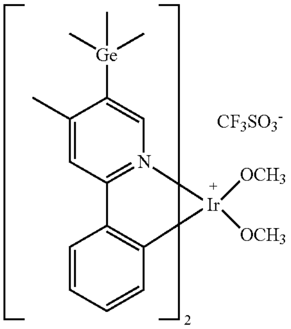

A3

Compound B3 (3.00 g, 1.88 mmol) was mixed with 90 mL of MC, and then, AgOTf (1.01 g, 3.95 mmol) dissolved in 30 mL of methanol was added thereto. Afterwards, the resultant reaction solution was stirred to proceed a reaction at 80° C. for 18 hours at room temperature while light was blocked from the reaction solution with aluminum foil, and filtered through CELITE to remove a solid produced therein. The filtrate was then subjected to reduced pressure to obtain a solid (Compound A3) which was used in the next reaction without an additional purification process.

Synthesis of Compound L3

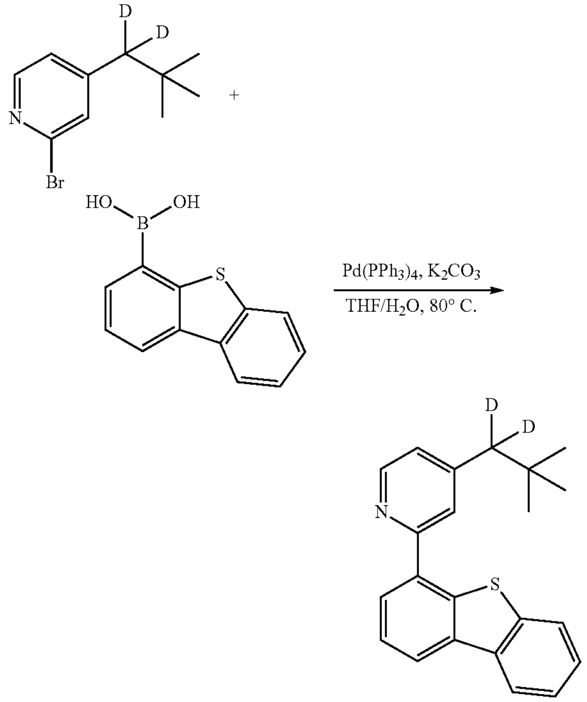

L3

2-bromo-4-(2,2-dimethylpropyl-1,1-$d_2$)pyridine (5.00 g, 21.73 mmol), dibenzo[b,d]thiophen-4-ylboronic acid (4.96 g, 21.73 mmol), $Pd(PPh_3)_4$ (1.24 g, 1.09 mmol), and $K_2CO_3$ (9.01 g, 60.00 mmol) were mixed with 90 mL of THF and 30 mL of DI water, followed by stirring and heating under reflux for 18 hours. After the temperature was allowed to lower to room temperature, the organic layer was extracted using MC, anhydrous $MgSO_4$ was added thereto to remove residual water, and the filtrate obtained by filtration was exposed to reduced pressure to obtain the residual product, which was then purified by column chromatography using EA and hexane at a ratio of 1:2, thereby obtaining 5.29 g (73%) of Compound L3.

Synthesis of Compound 3

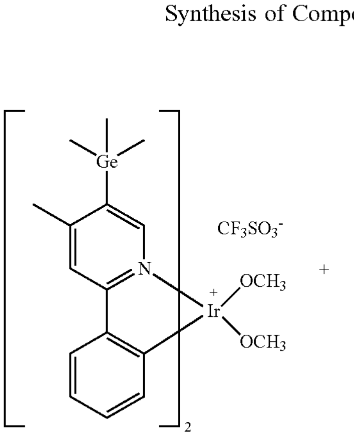

A3

-continued

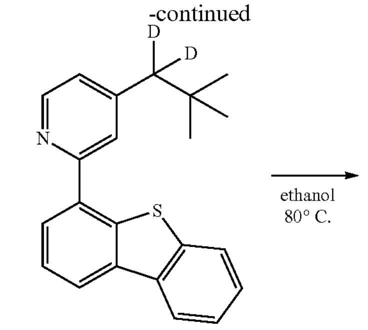

L3

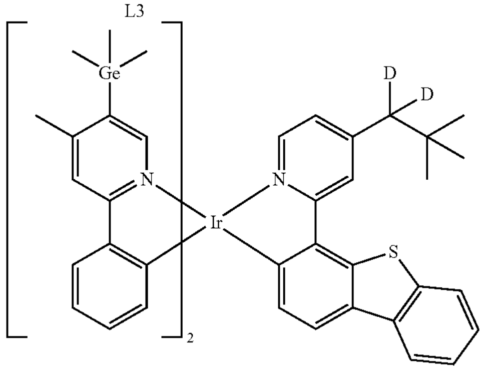

3

Compound A3 (3.00 g, 3.08 mmol) and Compound L3 (1.03 g, 3.08 mmol) were mixed with 100 ml of ethanol, and the temperature was lowered after the reaction was carried out by stirring under reflux at 80° C. for 48 hours. After removing all solvent under reduced pressure, column chromatography was performed using EA and hexanes at the ratio of 1:10 to obtain 1.18 g (35%) of Compound 3. The obtained compound was identified by HRMS (MALDI) and HPLC analysis.

HRMS (MALDI) calculated for $C_{52}H_{54}D_2Ge_2IrN_3S$: m/z: 1097.2373, found: 1097.2398.

Synthesis Example 4 (Compound 4)

Synthesis of Compound C4

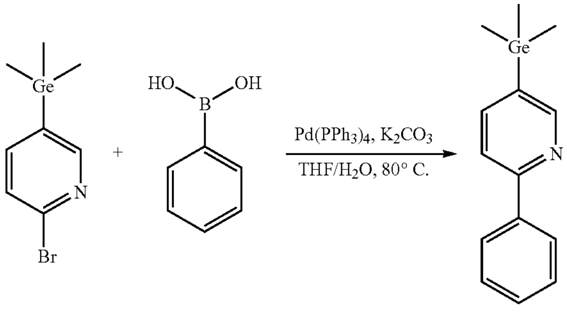

C4

2-bromo-5-(trimethylgermyl)pyridine (5 g, 18.20 mmol), phenylboronic acid (2.22 g, 18.20 mmol), $Pd(PPh_3)_4$ (1.05 g, 0.91 mmol), and $K_2CO_3$ (7.55 g, 54.60 mmol) were mixed with 90 mL of THF and 30 mL of DI water, and then stirred and heated under reflux at 80° C. for 18 hours. After the temperature was allowed to lower to room temperature, the organic layer was extracted using MC, anhydrous $MgSO_4$ was added thereto to remove residual water, and the filtrate obtained by filtration was subjected to reduced pressure to obtain the residual product, which was then purified by column chromatography using EA and hexane at a ratio of 1:8, thereby obtaining 4.06 g (82%) of Compound C4.

Synthesis of Compound B4

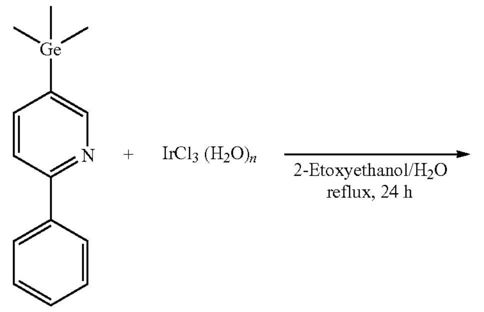

C4

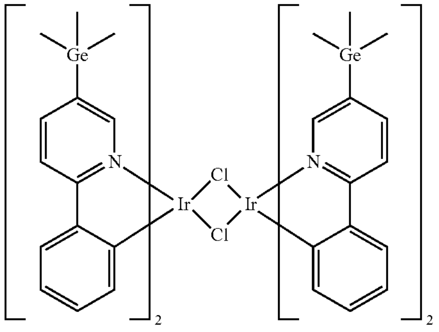

B4

Compound C4 (8.16 g, 30.00 mmol) and iridium chloride hydrate (4.48 g, 15.00 mmol) were mixed with 90 mL of 2-ethoxyethanol and 30 mL of DI water, and then, the mixture was stirred and heated under reflux for 24 hours, and then, the temperature was allowed to lower to room temperature. The resulting solid was separated by filtration, washed sufficiently with DI water, methanol, and hexanes, in this stated order, and then dried in a vacuum oven to obtain 8.43 g (73%) of Compound B4.

Synthesis of Compound A4

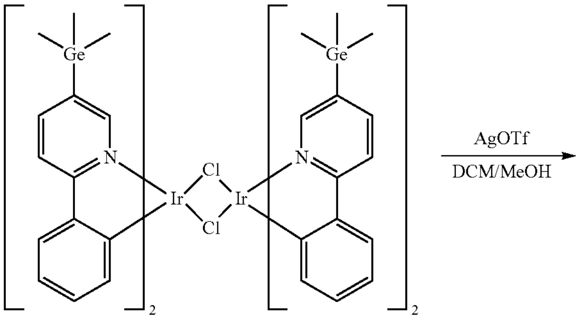

B4

-continued

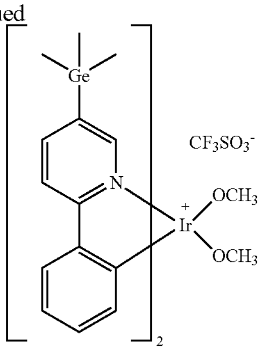

A4

Compound B4 (3.00 g, 1.95 mmol) was mixed with 90 mL of MC, and then, AgOTf (1.05 g, 4.10 mmol) dissolved in 30 mL of methanol was added thereto. Afterwards, the resultant reaction solution was stirred to proceed a reaction at 80° C. for 18 hours at room temperature while light was blocked from the reaction solution with aluminum foil, and filtered through CELITE to remove a solid produced therein. The filtrate was then subjected to reduced pressure to obtain a solid (Compound A4) which was used in the next reaction without an additional purification process.

Synthesis of Compound L4

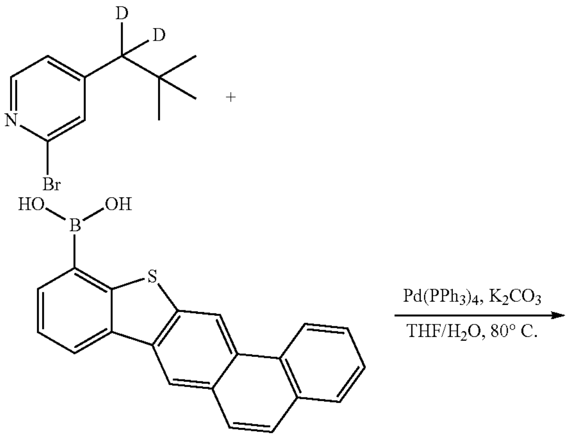

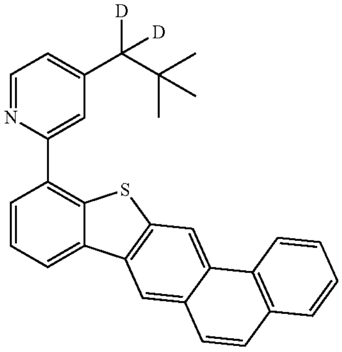

L4

2-bromo-4-(2,2-dimethylpropyl-1,1-$d_2$)pyridine (5.00 g, 21.73 mmol), benzo[b]phenanthro[2,3-d]thiophen-11-ylboronic acid (7.13 g, 21.73 mmol), $Pd(PPh_3)_4$ (1.26 g, 1.09 mmol), and $K_2CO_3$ (9.01 g, 65.19 mmol) were mixed with 90 mL of THF and 30 mL of DI water, followed by stirring and heating under reflux for 18 hours. After the temperature was allowed to lower to room temperature, the organic layer was extracted using MC, anhydrous $MgSO_4$ was added thereto to remove residual water, and the filtrate obtained by filtration was subjected to reduced pressure to obtain the residual product, which was then purified by column chromatography using EA and hexanes at the ratio of 1:10, thereby obtaining 8.29 g (88%) of Compound L4.

Synthesis of Compound 4

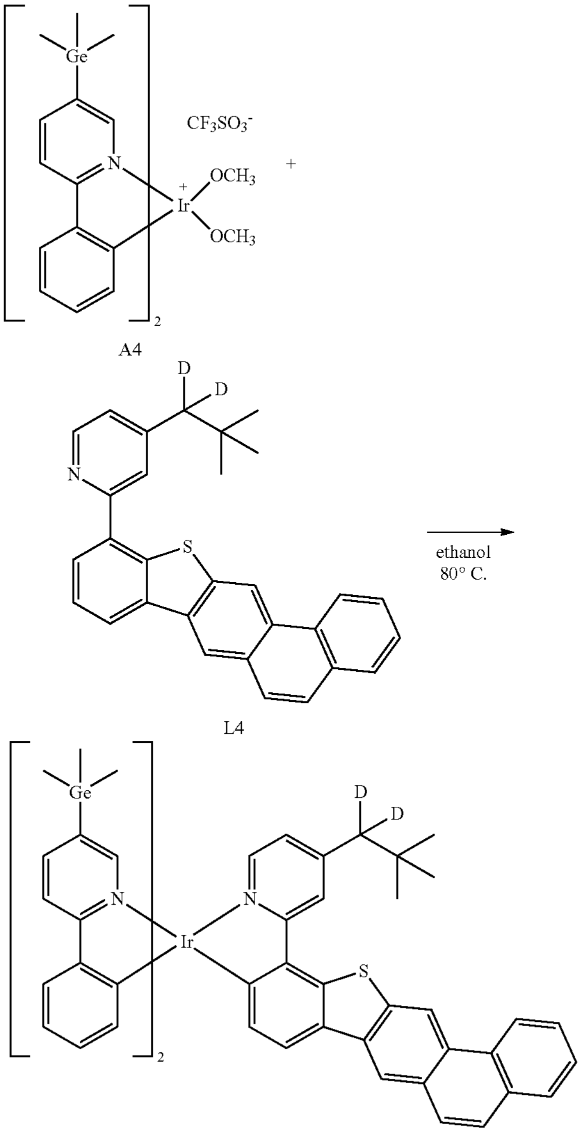

A4

L4

4

Compound A4 (3.00 g, 3.17 mmol) and Compound L4 (1.37 g, 3.17 mmol) were mixed with 100 ml of ethanol, and the reaction was carried out by stirring and heating under reflux at 80° C. for 48 hours, and then the temperature was allowed to lower to room temperature. After removing the solvent under reduced pressure, column chromatography was performed using EA and hexane at a ratio of 1:10 to obtain 1.11 g (30%) of Compound 4. The obtained compound was identified by HRMS (MALDI) and HPLC analysis.

HRMS (MALDI) calculated for $C_{58}H_{54}D_2Ge_2IrN_3S$: m/z: 1169.2373, found: 1169.2356.

Example 1

A coated glass substrate with ITO/Ag/ITO (as an anode) deposited thereon to a thickness of 70 Å/1000 Å/70 Å was cut to a size of 50 mm×50 mm×0.5 mm, sonicated with isopropyl alcohol and DI water each for 5 minutes, and then cleaned by exposure to ultraviolet (UV) rays and ozone for 30 minutes. Then the resultant coated glass substrate was loaded onto a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (hereinafter referred to as NPB) was vacuum-deposited on the hole injection layer to form a hole transport layer having a thickness of 1350 Å.

Next, CBP (host) and Compound 1 (dopant) were co-deposited at a weight ratio of 98:2 on the hole transport layer to form an emission layer having a thickness of 400 Å.

Thereafter, BCP was vacuum-deposited on the emission layer to form a hole-blocking layer having a thickness of 50 Å, $Alq_3$ was vacuum-deposited on the hole-blocking layer to form an electron transport layer having a thickness of 350 Å, LiF was vacuum-deposited on the electron transport layer to form an electron injection layer having a thickness of 10 Å, and Mg and Ag were co-deposited at a weight ratio of 90:10 on the electron injection layer to form a cathode having a thickness of 120 Å, thereby completing the manufacture of an organic light-emitting device.

2-TNATA

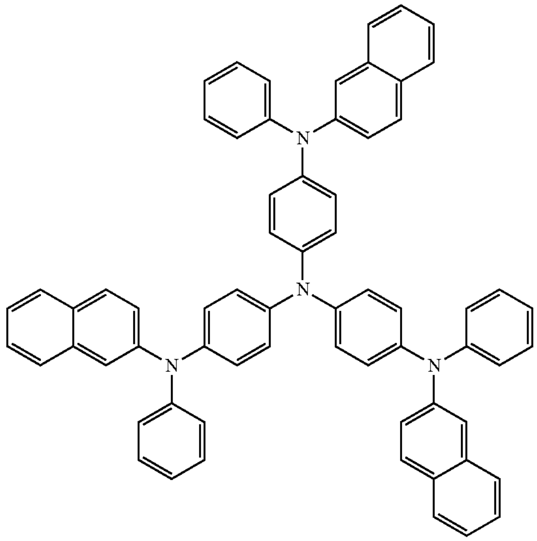

-continued

NPB

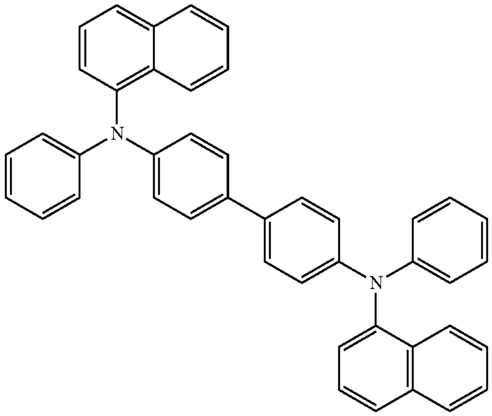

CBP

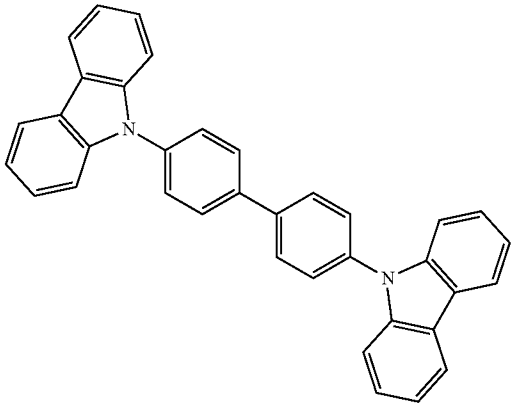

BCP

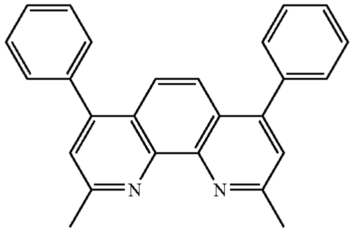

Examples 2 to 4

Organic light-emitting devices were manufactured in a similar manner as in Example 1, except that Compounds shown in Table 2 were each used instead of Compound 1 as a dopant in forming an emission layer.

Evaluation Example 1: Characterization of Organic Light-Emitting Device

For each of the organic light-emitting devices manufactured in Examples 1 to 4, the driving voltage (V), the maximum value of the external quantum efficiency (Max EQE) (%), and lifespan ($LT_{97}$) (hr) were evaluated. The results are shown in Table 2 as a relative value (%) with respect to the values of Example 1. A current-voltage meter (Keithley 2400) and a luminance meter (Minolta Cs-1000A) were used as an apparatus for evaluation, the lifespan ($LT_{97}$) (at 3500 candela per square meter, $cd/m^2$ or nits) was obtained by measuring the amount of time (hr) that elapsed until luminance was reduced to 97% of the initial brightness of 100%.

TABLE 2

| | Compound No. of dopant in emission layer | Driving voltage (relative value, %) | Max EQE (relative value, %) | $LT_{97}$ (relative value, %) (at 3500 nit) |
|---|---|---|---|---|
| Example 1 | 1 | 100% | 100% | 100% |
| Example 2 | 2 | 94% | 93% | 80% |
| Example 3 | 3 | 100% | 103% | 105% |
| Example 4 | 4 | 98% | 105% | 115% |

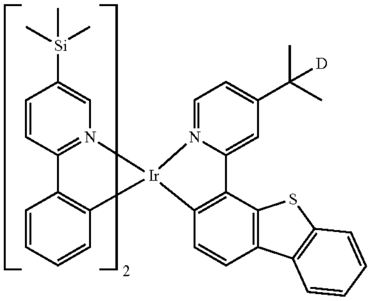

1

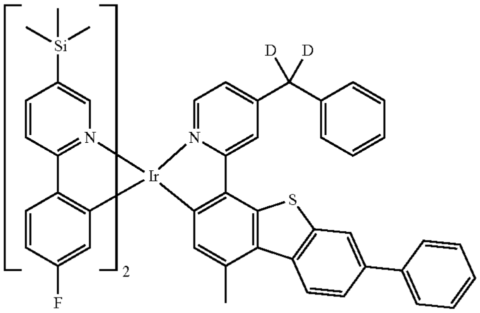

2

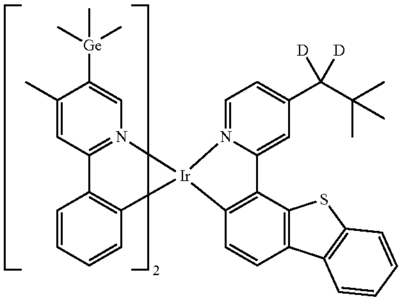

3

TABLE 2-continued

| Compound No. of dopant in emission layer | Driving voltage (relative value, %) | Max EQE (relative value, %) | $LT_{97}$ (relative value, %) (at 3500 nit) |
|---|---|---|---|
| 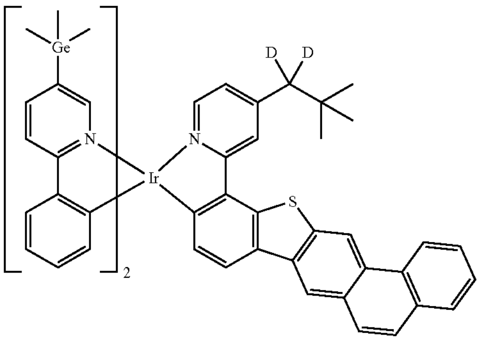<br>4 | | | |

From Table 2, it can be confirmed that the organic light-emitting devices of Examples 1 to 4 have excellent characteristics in terms of driving voltage, external quantum efficiency, and lifespan.

Since the organometallic compounds have excellent electrical characteristics and heat resistance, an electronic device, for example, an organic light-emitting device, using one or more of the organometallic compounds may have excellent characteristics in terms of driving voltage, external quantum efficiency (EQE), and lifespan. Therefore, the use of the organometallic compound(s) may provide a high-quality organic light-emitting device and an electron device including the same.

It should be understood that the exemplary embodiments described herein should be considered in a descriptive sense only and not for purposes of limitation. Descriptions of certain features or aspects within each exemplary embodiment should typically be considered as available for other similar features or aspects in other exemplary embodiments. While one or more embodiments have been described with reference to the FIGURE, it will be understood by those of ordinary skill in the art that various changes in form and details may be made therein without departing from the spirit and scope as defined by the following claims.

What is claimed is:

1. An organometallic compound, represented by Formula 1:

Formula 1

$M(L_1)_{n1}(L_2)_{n2}$ wherein, in Formula 1,

M is a transition metal, $L_1$ is a ligand represented by Formula 2-1, $L_2$ is a ligand represented by Formula 2-2, n1 and n2 are each independently 1 or 2, wherein, when n1 is 2, each $L_1$ is identical to or different from another, and when n2 is 2, each $L_2$ is identical to or different from another, a sum of n1 and n2 is 2 or 3, and $L_1$ and $L_2$ are different from each other, Formula 2-1

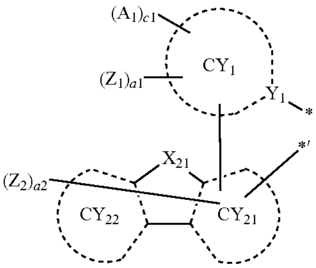

Formula 2-2

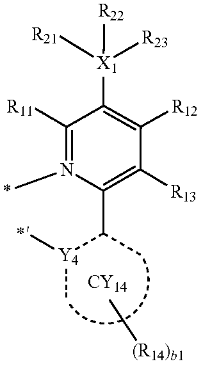

Formula 3

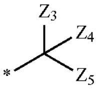

wherein, in Formulae 2-1, 2-2, and 3, $Y_1$ and $Y_4$ are each independently C or N, $X_1$ is Si or Ge, $X_{21}$ is O, S, S(═O), $N(Z_{29})$, $C(Z_{29})(Z_{30})$, or $Si(Z_{29})(Z_{30})$, ring $CY_1$, ring $CY_{21}$, ring $CY_{22}$, and ring $CY_{14}$ are each independently a $C_5$-$C_{30}$ carbocyclic group or a $C_1$-$C_{30}$ heterocyclic group, $A_1$ is a group represented by Formula 3, provided that $A_1$ is not —$CD_3$, c1 is an integer from 1 to 20, $R_{21}$ to $R_{23}$ are each independently a $C_1$-$C_{60}$ alkyl group or a $C_6$-$C_{60}$ aryl group, unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_3$-$C_{10}$ cycloalkyl group, a phenyl group, or a combination thereof, $Z_1$ to $Z_5$, $R_{11}$ to $R_{14}$, $Z_{29}$, and $Z_{30}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, provided that at least one of $Z_3$ to $Z_5$ of Formula 3 is deuterium or a deuterated group, provided that in Formula 2-2, $R_{12}$ is hydrogen, deuterium, a methyl group, or a deuterated methyl group, or $R_{12}$ and $R_{13}$ are linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, a1, a2, and b1 are each independently an integer from 0 to 20, and when a1 is 2 or more, two or more of $Z_1$(s) are identical to or different from each other, when a2 is 2 or more, two or more of $Z_2$(s) are identical to or different from each other, and when b1 is 2 or more, two or more of $R_{14}$(s) are identical to or different from each other, two or more of $R_{21}$ to $R_{23}$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $Z_1$(s) are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $Z_2$(s) are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $Z_3$ to $Z_5$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_{14}$(s) are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $Z_1$, $Z_2$, and $R_{11}$ to $R_{14}$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $R_{10a}$ is as defined in connection with $R_{14}$,

* and *' in Formulae 2-1 and 2-2 each indicates a binding site to M in Formula 1,

* in Formula 3 indicates a binding site to ring $CY_1$ in Formula 2-1, wherein the organometallic compound satisfies at least one of Condition (1) to Condition (4);

Condition (1)

in Formula 2-1, $Z_1$ is not hydrogen, and a1 is an integer from 1 to 20

Condition (2)

in Formula 2-2, $R_{14}$ is not hydrogen, and b1 is an integer from 1 to 20

Condition (3)

in Formula 2-1, $Z_2$ is not hydrogen, and a2 is an integer from 1 to 6

Condition (4)

in Formula 2-2, $X_1$ is Ge, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —Ge $(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or a combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

2. The organometallic compound of claim 1, wherein in Formula 1, M is Ir, and the sum of n1 and n2 is 3; or in Formula 1, M is Pt, and the sum of n1 and n2 is 2.

3. The organometallic compound of claim 1, wherein $X_{21}$ in Formula 2-1 is O or S.

4. The organometallic compound of claim 1, wherein c1 in Formula 2-1 is 1.

5. The organometallic compound of claim 1, wherein ring $CY_1$ in Formula 2-1 is a pyridine group, a 5,6,7,8-tetrahydroisoquinoline group, or a 5,6,7,8-tetrahydroquinoline group.

6. The organometallic compound of claim 1, wherein ring $CY_{21}$ in Formula 2-1 is a phenyl group, a naphthalene group, a 1,2,3,4-tetrahydronaphthalene group, a pyridine group, or a pyrimidine group.

7. The organometallic compound of claim 1, wherein ring $CY_{22}$ in Formula 2-1 is a phenyl group, a naphthalene group, a 1,2,3,4-tetrahydronaphthalene group, a phenanthrene group, an anthracene group, a pyridine group, a pyrimidine group, a benzofuran group, a benzothiophene group, a dibenzofuran group, a dibenzothiophene group, an azadibenzofuran group, an azadibenzothiophene group, a quinoline group, an isoquinoline group, a quinoxaline group, a quinazoline group, a benzoquinoline group, a benzoisoquinoline group, a benzoquinoxaline group, or a benzoquinazoline group.

8. The organometallic compound of claim 1, wherein ring $CY_{14}$ in Formula 2-2 is a phenyl group, a naphthalene group, a 1,2,3,4-tetrahydronaphthalene group, a dibenzothiophene group, a dibenzofuran group, or a pyridine group.

9. The organometallic compound of claim 1, wherein $Z_1$ to $Z_5$, $R_{11}$, $R_{13}$, $R_{14}$, $Z_{29}$, and $Z_{30}$ in Formulae 2-1 and 2-2 are each independently:

hydrogen, deuterium, —F, or a cyano group;

a $C_1$-$C_{20}$ alkyl group, a $C_1$-$C_{20}$ alkoxy group, a $C_1$-$C_{20}$ alkylthio group, a $C_2$-$C_{20}$ alkenyl group, a phenyl group, a naphthyl group, a pyridinyl group, a dibenzofuranyl group, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl) biphenyl group, —$Si(Q_{33})(Q_{34})(Q_{35})$, —$Ge(Q_{33})(Q_{34})(Q_{35})$, or a combination thereof; or —$Si(Q_3)(Q_4)(Q_5)$ or —$Ge(Q_3)(Q_4)(Q_5)$.

10. The organometallic compound of claim 1, wherein, in Formula 3, $Z_3$ is deuterium or a deuterated group, and each of $Z_4$ and $Z_5$ is a deuterium-free group;

each of $Z_3$ and $Z_4$ is deuterium or a deuterated group, and $Z_5$ is a deuterium-free group; or each of $Z_3$ to $Z_5$ is deuterium or a deuterated group, provided that at least one of $Z_3$ to $Z_5$ is not deuterium.

11. The organometallic compound of claim 1, wherein the organometallic compound satisfies at least one of Condition (1) to Condition (3).

12. The organometallic compound of claim 1, wherein, in Formula 2-1, $Z_2$ is not hydrogen, a2 is an integer from 1 to 3, and at least one of $Z_2$(s) in the number of a2 is each independently a substituted or unsubstituted $C_1$-$C_{60}$ alkyl group, a substituted or unsubstituted $C_1$-$C_{60}$ alkoxy group, a substituted or unsubstituted $C_1$-$C_{60}$ alkylthio group, a substituted or unsubstituted $C_2$-$C_{20}$ alkenyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted monovalent non-aromatic condensed polycyclic group, or a substituted or unsubstituted monovalent non-aromatic condensed heteropolycyclic group.

13. The organometallic compound of claim 1, wherein a group represented by

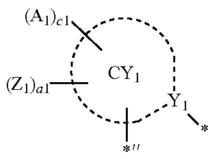

in Formula 2-1 is a group represented by one of Formulae CY1-1 to CY1-10:

CY1-1

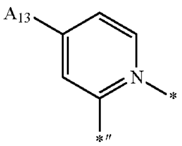

CY1-2

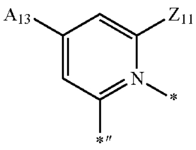

CY1-3

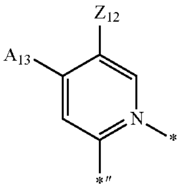

CY1-4

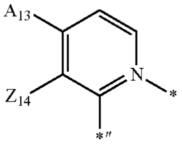

-continued

CY1-5

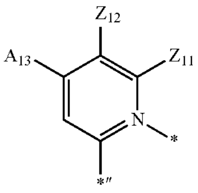

CY1-6

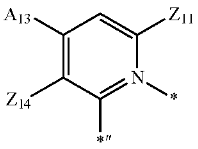

CY1-7

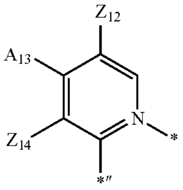

CY1-8

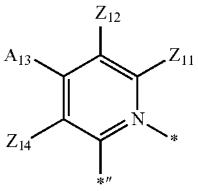

CY1-9

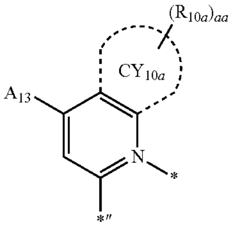

CY1-10

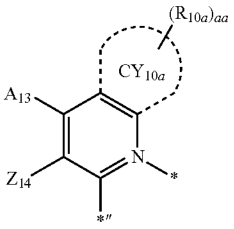

wherein, in Formulae CY1-1 to CY1-10, $Z_{11}$, $Z_{12}$, and $Z_{14}$ are as defined in connection with $Z_1$ of claim 1, provided that each of $Z_{11}$, $Z_{12}$, and $Z_{14}$ is not hydrogen, $A_{13}$ is as defined in connection with $A_1$ in claim 1, ring $CY_{10a}$ is a $C_5$-$C_{30}$ carbocyclic group or a $C_1$-$C_{30}$ heterocyclic group, $R_{10a}$ is as defined in connection with $R_{10a}$ in claim 1, aa is an integer from 0 to 10,

* indicates a binding site to M in Formula 1, and

*" indicates a binding site to ring $CY_{21}$ in Formula 2-1.

14. The organometallic compound of claim 1, wherein a group represented by

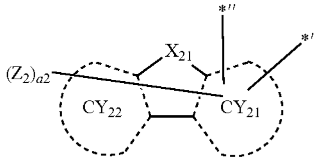

in Formula 2-1 is a group represented by one of Formulae CY2-1 to CY2-6:

CY2-1

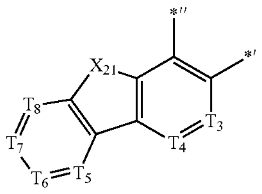

CYC-2

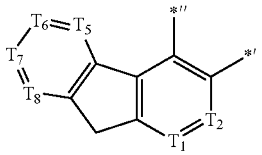

CY2-3

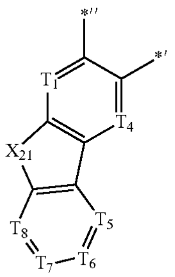

CY2-4

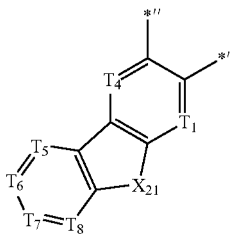

CY2-5

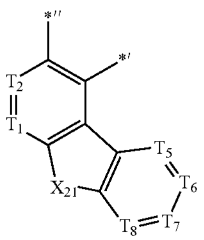

-continued

CY2-6

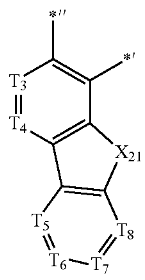

wherein, in Formulae CY2-1 to CY2-6, $T_1$ to $T_8$ are each independently C or N, $X_{21}$ is as defined in claim 1,

*" indicates a binding site to ring $CY_1$ in Formula 2-1, and

*' indicates a binding site to M in Formula 1.

15. The organometallic compound of claim 1, wherein a group represented by

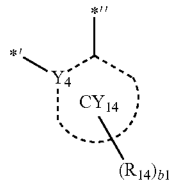

in Formula 2-2 is a group represented by one of Formulae CY14(1) to CY14(63):

CY14(1)

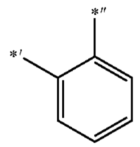

CY14(2)

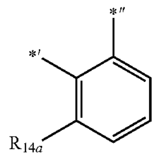

CY14(3)

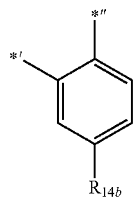

CY14(4)

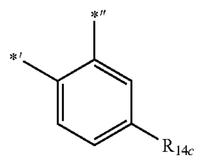

-continued
CY14(5)
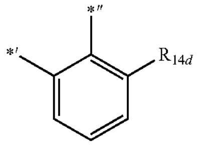
CY14(6)
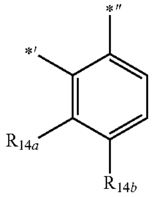
CY14(7)
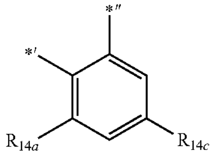
CY14(8)
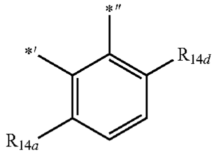
CY14(9)
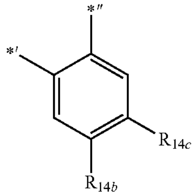
CY14(10)
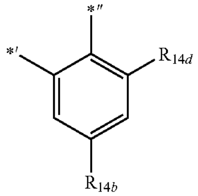
CY14(11)
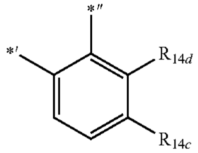
CY14(12)
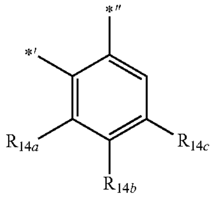
-continued
CY14(13)
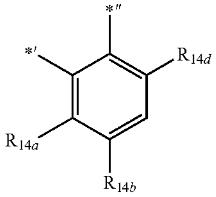
CY14(14)
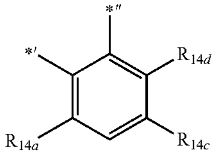
CY14(15)
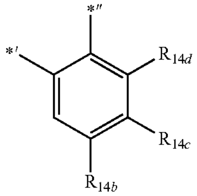
CY14(16)
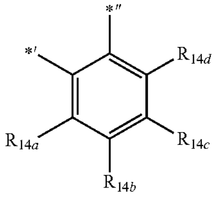
CY14(17)
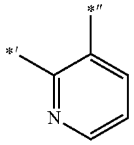
CY14(18)
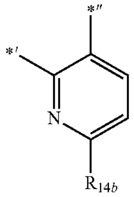
CY14(19)
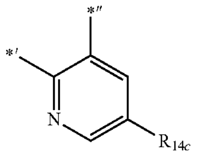
CY14(20)
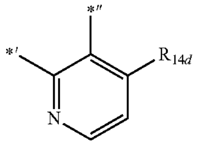

-continued
CY14(21)
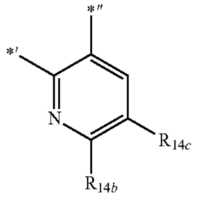
CY14(22)
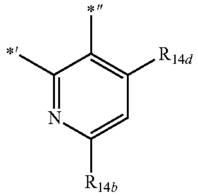
CY14(23)
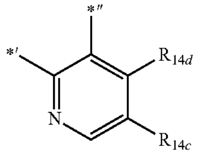
CY14(24)
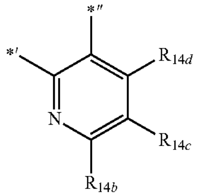
CY14(25)
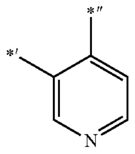
CY14(26)
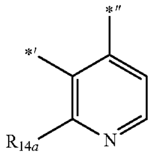
CY14(27)
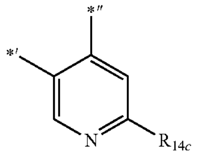
CY14(28)
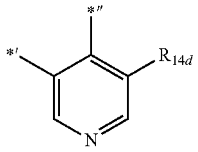
CY14(29)
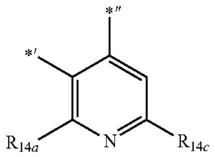
-continued
CY14(30)
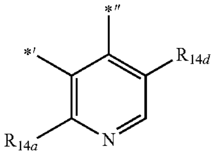
CY14(31)
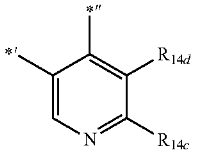
CY14(32)
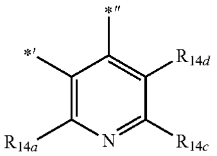
CY14(33)
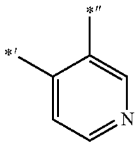
CY14(34)
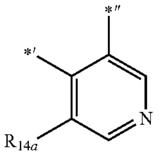
CY14(35)
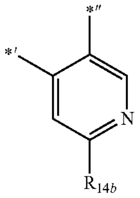
CY14(36)
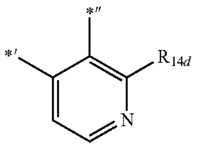
CY14(37)
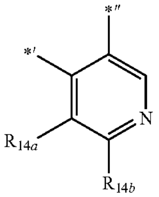
CY14(38)
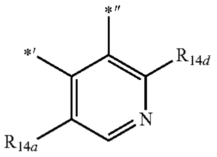

-continued
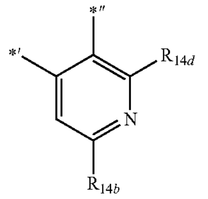
CY14(39)
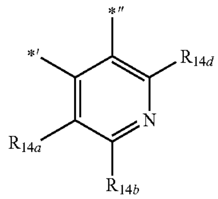
CY14(40)
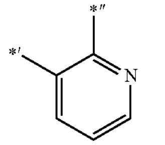
CY14(41)
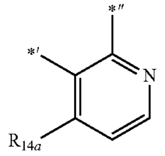
CY14(42)
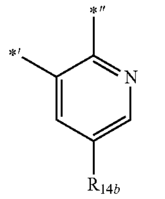
CY14(43)
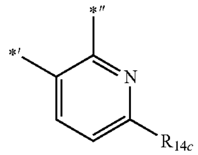
CY14(44)
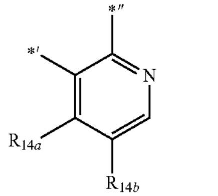
CY14(45)
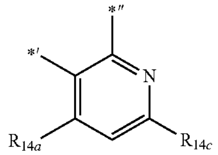
CY14(46)
-continued
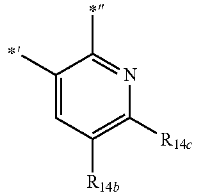
CY14(47)
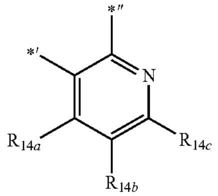
CY14(48)
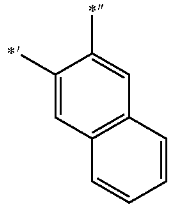
CY14(49)
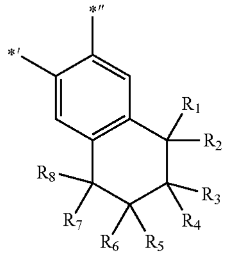
CY14(50)
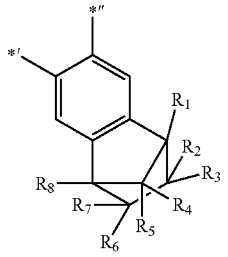
CY14(51)
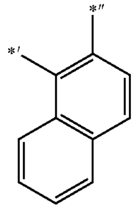
CY14(52)
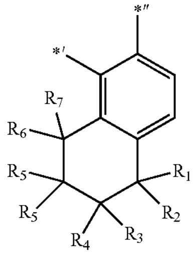
CY14(53)

-continued

CY14(54)

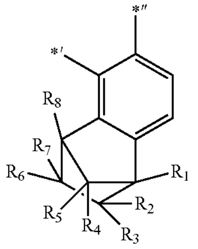

CY14(55)

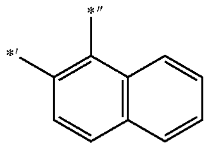

CY14(56)

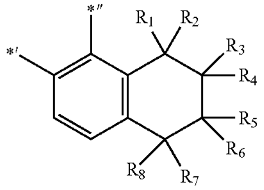

CY14(57)

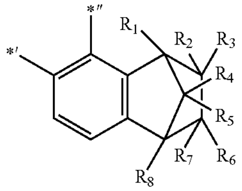

CY14(58)

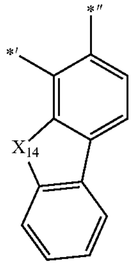

CY14(59)

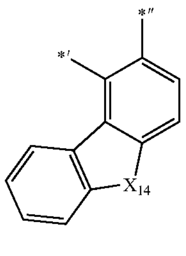

CY14(60)

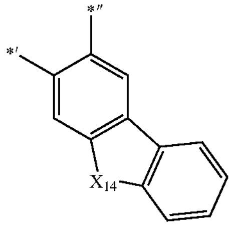

-continued

CY14(61)

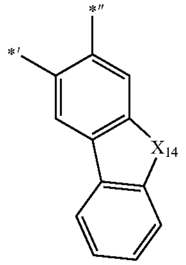

CY14(62)

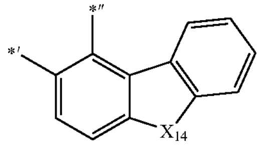

CY14(63)

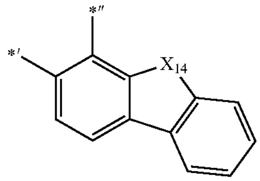

wherein, in Formulae CY14(1) to CY14(63), $R_{14a}$ to $R_{14a}$ are as defined in connection with $R_{14}$ in claim 1, provided that each of $R_{14a}$ to $R_{14d}$ is not hydrogen, $X_{14}$ is $C(R_1)(R_2)$, $N(R_1)$, O, S, or $Si(R_1)(R_2)$, $R_1$ to $R_8$ are as defined in connection with $R_{14}$ in claim 1,

*" indicates a binding site to a carbon atom of a neighboring pyridine ring in Formula 2-2, and

*' indicates a binding site to M in Formula 1.

16. An organic light-emitting device, comprising:

a first electrode;

a second electrode; and an organic layer located between the first electrode and the second electrode, wherein the organic layer comprises an emission layer, and wherein the organic layer further comprises at least one of the organometallic compound of claim 1.

17. The organic light-emitting device of claim 16, wherein the first electrode is an anode, the second electrode is a cathode, the organic layer further comprises a hole transport region located between the first electrode and the emission layer, and an electron transport region located between the emission layer and the second electrode, wherein the hole transport region comprises a hole injection layer, a hole transport layer, an electron-blocking layer, a buffer layer, or a combination thereof, and the electron transport region comprises a hole-blocking layer, an electron transport layer, an electron injection layer, or a combination thereof.

18. The organic light-emitting device of claim 16, wherein the emission layer comprises the at least one of the organometallic compound.

19. The organic light-emitting device of claim 18, wherein the emission layer further comprises a host, and an amount of the host in the emission layer is greater than an amount of the organometallic compound in the emission layer.

20. An electronic apparatus, comprising the organic light-emitting device of claim 16.

* * * * *